US012669080B2

(12) United States Patent
Mills

(10) Patent No.: US 12,669,080 B2
(45) Date of Patent: Jun. 30, 2026

(54) POWER GENERATION AND METHODS REGARDING SAME

(71) Applicant: Brilliant Light Power, Inc., Cranbury, NJ (US)

(72) Inventor: Randell L. Mills, Cranbury, NJ (US)

(73) Assignee: BRILLIANT LIGHT POWER, INC., Cranbury, NJ (US)

( * ) Notice: Subject to any disclaimer, the term of this patent is extended or adjusted under 35 U.S.C. 154(b) by 105 days.

(21) Appl. No.: 18/737,767

(22) Filed: Jun. 7, 2024

(65) Prior Publication Data

US 2024/0344481 A1     Oct. 17, 2024

Related U.S. Application Data

(63) Continuation of application No. 17/706,239, filed on Mar. 28, 2022, now Pat. No. 12,044,164, which is a
(Continued)

(51) Int. Cl.
*F02B 51/02*     (2006.01)
*C01B 3/00*     (2006.01)
(Continued)

(52) U.S. Cl.
CPC ............... *F02B 65/00* (2013.01); *C01B 3/00* (2013.01); *C10L 3/00* (2013.01); *C10L 5/40* (2013.01);
(Continued)

(58) Field of Classification Search
CPC .......... F02B 65/00; F02B 51/02; F02B 51/04; C01B 3/00; C10L 3/00; C10L 5/40;
(Continued)

(56) References Cited

U.S. PATENT DOCUMENTS 4,603,043 A     7/1986   Douglas et al.
7,559,494 B1    7/2009   Yadav et al.
(Continued)

FOREIGN PATENT DOCUMENTS

EP          2711342 A1    3/2014
JP        2001159372 A    6/2001
(Continued)

OTHER PUBLICATIONS

EarthTech International, Inc., "Replication of Mills Light water Calorimetry Experiment—Run 5-9MAR01", 2017, 9 pp.
(Continued)

*Primary Examiner* — Jacob M Amick
(74) *Attorney, Agent, or Firm* — Jonathan D. Ball; Greenberg Traurig, LLP

(57)          ABSTRACT

A power source that provides at least one of thermal and electrical power and method of use thereof such as direct electricity or thermal to electricity is provided that powers a power system comprising (i) at least one reaction cell comprising a fuel having atomic hydrogen, nascent $H_2O$; and a material to cause the fuel to be highly conductive, (iii) at least one set of electrodes that confine the fuel and an electrical power source that provides a short burst of low-voltage, high-current electrical energy to initiate a reaction and an energy gain, (iv) a product recovery systems such as a condenser, (v) a reloading system, (vi) at least one of hydration, thermal, chemical, and electrochemical systems to regenerate the fuel from the reaction products, (vii) a heat sink that accepts the heat from the power-producing reactions, (viii) a power conversion system.

19 Claims, 39 Drawing Sheets

Related U.S. Application Data continuation of application No. 16/925,892, filed on Jul. 10, 2020, now Pat. No. 11,333,069, which is a continuation of application No. 15/037,179, filed as application No. PCT/IB2014/058177 on Jan. 10, 2014, now Pat. No. 10,753,275.

(60) Provisional application No. 61/924,697, filed on Jan. 7, 2014, provisional application No. 61/919,496, filed on Dec. 20, 2013, provisional application No. 61/911,932, filed on Dec. 4, 2013, provisional application No. 61/909,216, filed on Nov. 26, 2013, provisional application No. 61/906,792, filed on Nov. 20, 2013.

(51) Int. Cl.

| | |
|---|---|
| *C10L 3/00* | (2006.01) |
| *C10L 5/40* | (2006.01) |
| *F02B 51/04* | (2006.01) |
| *F02B 65/00* | (2006.01) |
| *G21B 3/00* | (2006.01) |
| *H01J 37/32* | (2006.01) |
| *H01M 14/00* | (2006.01) |
| *H05H 1/46* | (2006.01) |

(52) U.S. Cl.
CPC .............. *F02B 51/02* (2013.01); *F02B 51/04* (2013.01); *G21B 3/00* (2013.01); *H01J 37/32* (2013.01); *H01M 14/00* (2013.01); *H05H 1/46* (2013.01); *C10L 2200/02* (2013.01); *C10L 2200/024* (2013.01); *C10L 2200/0254* (2013.01); *C10L 2200/0277* (2013.01); *C10L 2200/029* (2013.01); *C10L 2200/0295* (2013.01); *H05H 1/4637* (2021.05); *Y02E 30/10* (2013.01); *Y02E 50/30* (2013.01); *Y02E 60/32* (2013.01); *Y02P 20/129* (2015.11); *Y02T 10/12* (2013.01)

(58) Field of Classification Search
CPC .......... G21B 3/00; H01J 37/32; H01M 14/00; H05H 1/46
See application file for complete search history.

(56) References Cited

U.S. PATENT DOCUMENTS

| | | | | |
|---|---|---|---|---|
| 10,443,139 | B2 | 10/2019 | Mills | |
| 10,753,275 | B2 * | 8/2020 | Mills | F02M 27/042 |
| 11,333,069 | B2 * | 5/2022 | Mills | F02M 27/042 |
| 12,044,164 | B2 * | 7/2024 | Mills | G21B 3/00 |
| 2002/0150694 | A1 | 10/2002 | Ye et al. | |
| 2004/0118348 | A1 * | 6/2004 | Mills | G21K 1/00 |
| | | | | 118/723 MW |
| 2005/0031870 | A1 | 2/2005 | Liu et al. | |
| 2006/0267503 | A1 * | 11/2006 | Bystriskii | H05H 1/46 |
| | | | | 315/111.21 |
| 2007/0041897 | A1 | 2/2007 | Eickhoff et al. | |
| 2011/0114075 | A1 | 5/2011 | Mills | |
| 2012/0122017 | A1 | 5/2012 | Mills | |
| 2013/0084474 | A1 | 4/2013 | Mills | |
| 2014/0072836 | A1 | 3/2014 | Mills | |
| 2015/0171455 | A1 | 6/2015 | Mills | |
| 2016/0290223 | A1 | 10/2016 | Mills | |
| 2017/0070180 | A1 | 3/2017 | Mills | |
| 2018/0159459 | A1 | 6/2018 | Mills | |
| 2019/0372449 | A1 | 12/2019 | Mills | |
| 2020/0002828 | A1 | 1/2020 | Mills | |
| 2022/0275751 | A1 | 9/2022 | Mills | |

FOREIGN PATENT DOCUMENTS

| | | |
|---|---|---|
| JP | 2008272565 A | 11/2008 |
| JP | 2009509130 A | 3/2009 |
| JP | 2010082697 A1 | 4/2010 |
| JP | 2014515585 A | 6/2014 |
| WO | 2011116236 A2 | 9/2011 |
| WO | 2012138576 A1 | 10/2012 |
| WO | 2012157248 A1 | 7/2014 |
| WO | 2017210204 A1 | 12/2017 |
| WO | 2017127447 A9 | 8/2018 |
| WO | 2018222569 A1 | 12/2018 |

OTHER PUBLICATIONS

Wikipedia, "Brilliant Light Power", Dec. 1999, 7 pp.
Barth, Aaron J., "Bigger than Fire? A Scientific Examination of Randell Mills Hydrino Theory", Skeptic vol. 8, No. 4, 2001, pp. 41-46.
Connet, John E. et al., "Against Hydrinos", Physics World, Nov. 2005, p. 21.
Park, Robert L., "Fraud in Science", Social Research, An International Quaterly, vol. 74, No. 4, Winter 2008, pp. 1135-1150.
Lawler, J.E et al., "Comment on Time-resolved hydrino continuum transitions with cutoffs at 22.8 nm and 10.1 nm", The European Physical Journal D, vol. 66: 29, Jan. 31, 2012, 2 pp.
Phelps, A.V. et al., "Interpretation of EUV emissions observed by Mills et al.", The European Physical Journal D, vol. 66: 120, Feb. 15, 2012, pp. 1-4.
Holverstott, B., "Episode #8: Extraordinary Evidence", Profane Science Podcast, Jan. 25, 2025, 30 pp.
Barkhordarian et al. "Catalytic Mechanism of Transition-Metal Compounds on Mg Hydrogen Sorption Reaction," J_ Phys. Chem. B, vol. 110, (2006): 11020-11024.
Santjojo et al., "Ellipsometric characterization on multi-layered thin film systems during hydrogenation," Materials transactions, vol. 48, No. 6 (2007): 1380-1386.
Watkins et al. "Reaction of Alkali Metal hydrides with Zinc Halides with Zinc Halides in Tetrahydrofuran. A Convenient and Economical Preparation of Zinc Hydride," Inorganic Chemistry, vol. 13, No. 10, (1974): 2350-2354.
Wu et al. "Effect of carbon/noncarbon addition on hydrogen storage behaviors of magnesium hydride," Journal of Alloys and Compounds, 414 (2006) 259-264.
Mills et al., "Catalyst Induced Hydrino Transition {CIHT} electrochemical cell," International Journal of Energy Research, 2014, vol. 38, pp. 1741-1765.
Mills et al., "High-power-density catalyst induced hydrino transition {CIHT} electrochemical cell," International Journal of Hydrogen Energy, 2014, vol. 39, pp. 14512-14530.
Mills et al., "H2O-based solid fuel power source based on the catalysis of H by HOH catalyst," International Journal of Hydrogen Energy, 2015, vol. 40, pp. 25-37.
Mills et al., "Mechanism of Soft X-ray Continuum Radiation from Low-Energy Pinch Discharges of Hydrogen and Ultra-low Field Ignition of Solid Fuels," URL: http://www.blacklightpower.com/wp-content/uploads/papers/Cont_EUV HOH-031215.pdf.
Rathke et al., "A critical analysis of the hydrino model," New Journal of Physics, May 19, 2005, vol. 7, p. 127.
International Search Report issued in corresponding International Patent Application No. PCT/182014/058177, mailed Jan. 12, 2015 (5 pages).

* cited by examiner

700

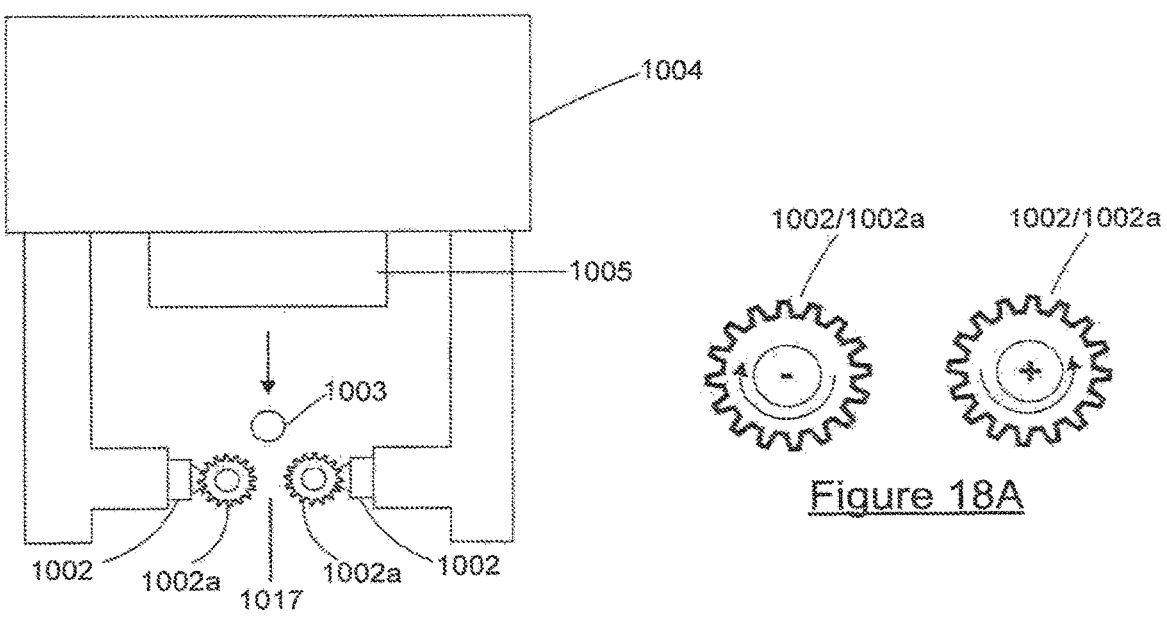
Figure 17A
Figure 18A
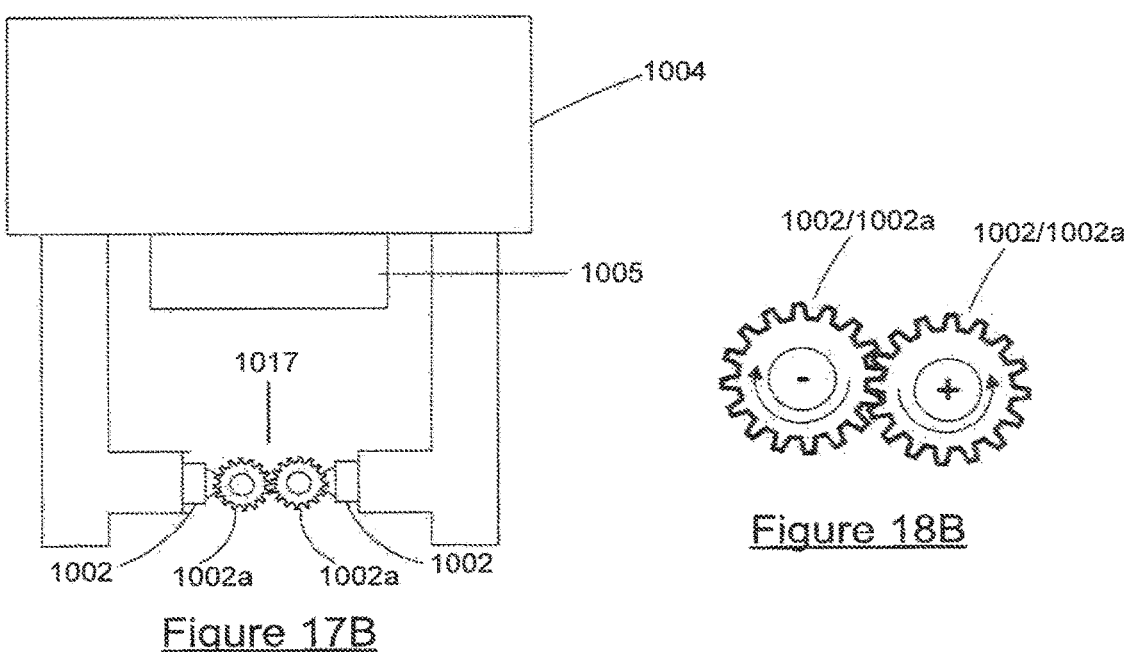
Figure 17B
Figure 18B

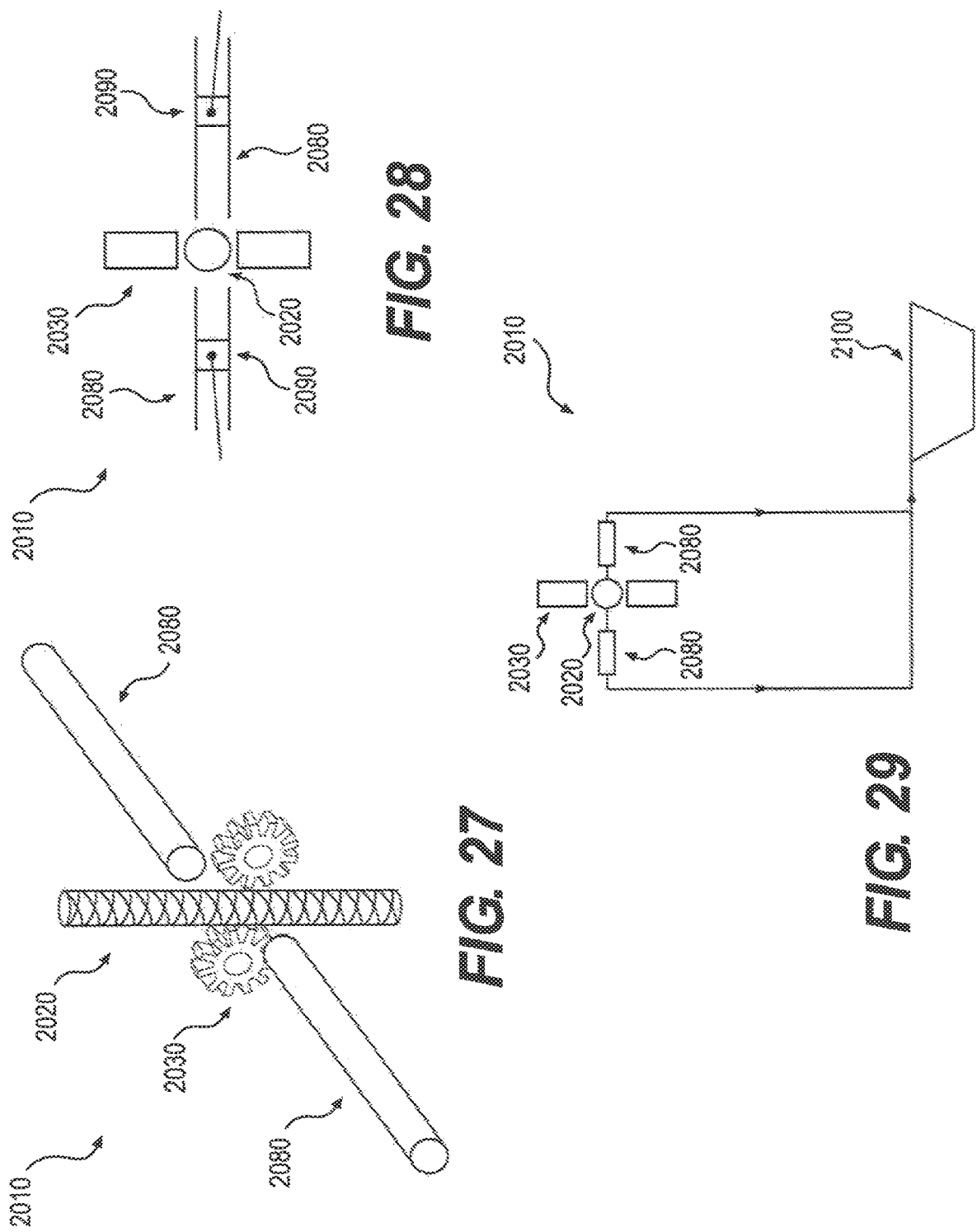

POWER GENERATION AND METHODS REGARDING SAME

CROSS REFERENCE TO RELATED APPLICATIONS

The present application is a continuation of U.S. application Ser. No. 17/706,239, filed Mar. 28, 2022, which is a continuation of U.S. application Ser. No. 16/925,892, filed Jul. 10, 2020, which is a continuation of U.S. application Ser. No. 15/037,179, filed May 17, 2016, which is a 371 US National Phase Application of PCT/IB2014/058177, filed Jan. 10, 2014, which claims priority to U.S. App. No. 61/924,697, filed Jan. 7, 2014, U.S. App. No. 61/919,496, filed Dec. 20, 2013, U.S. App. No. 61/911,932, filed Dec. 4, 2013, U.S. App. No. 61/909,216, filed Nov. 26, 2013, and U.S. App. No. 61/906,792, filed Nov. 20, 2013, each of which are hereby incorporated by reference herein in their entirety.

FIELD OF DISCLOSURE

The present disclosure relates to the field of power generation and, in particular, to systems, devices, and methods for the generation of power. More specifically, embodiments of the present disclosure are directed to power generation devices and systems, as well as related methods, which produce plasma and thermal power and produces electrical power via a plasma to electric power converter or a thermal to electric power converter. In addition, embodiments of the present disclosure describe systems, devices, and methods that use the ignition of a water or water-based fuel source to generate mechanical power and/or thermal energy. Furthermore, the present disclosure is directed to electrochemical power systems that generate electrical power and/or thermal energy. These and other related embodiments are described in detail in the present disclosure.

BACKGROUND

Power generation can take many forms, harnessing the power from plasma. Successful commercialization of plasma may depend on power generation systems capable of efficiently forming plasma and then capturing the power of the plasma produced.

Plasma may be formed during ignition of certain fuels. These fuels can include water or water-based fuel source. During ignition, a plasma cloud of super-heated electron-stripped atoms is formed, and high-energy particles are ejected outwards. The highest energy particles ejected are the hydrogen ions that can transfer kinetic energy to a plasma to electric converter of the present disclosure.

Power can also be generated through the use of a system or device that harnesses energy from the ignition of a fuel in a reaction vessel or combustion chamber. As above, these fuels can include water or water-based fuel source. Examples of such a system or device include internal combustion engines, which typically include one or more mechanisms for compressing a gas and mixing the gas with a fuel. The fuel and gas are then ignited in a combustion chamber. Expansion of the combustion gases applies a force to a moveable element, such as a piston or turbine blade. The high pressures and temperatures produced by the expanding combustion gases move the piston or blade, producing mechanical power.

Internal combustion engines can be classified by the form of the combustion process and by the type of engine using that combustion process. Combustion processes can include reciprocating, rotary, and continuous combustion. Different types of reciprocating combustion engines include two-stroke, four-stroke, six-stroke, diesel, Atkinson cycle, and Miller cycle. The Wankel engine is a type of rotary engine, and continuous combustion includes gas turbine and jet engines. Other types of these engines can share one or more features with the types of engines listed above, and other variants of engines are contemplated by those skilled in the art. These can include, for example, a motorjet engine.

Reciprocating engines usually operate cycles with multiple strokes. An intake stroke can draw one or more gases into a combustion chamber. A fuel is mixed with the gas and a compression stroke compresses the gas. The gas-fuel mixture is then ignited, which subsequently expands, producing mechanical power during a power stroke. The product gases are then expelled from the combustion chamber during an exhaust stroke. The whole cycle then repeats. By balancing a single piston or using multiple pistons, the process can provide continuous rotational power.

The different types of reciprocating engines generally operate with the above cycle, with some modifications. For example, instead of the four-stroke cycle described above, a two-stroke engine combines the intake and compression strokes into one stroke, and the expansion and exhaust processes into another stroke. Unlike a four or two stroke engine, the diesel engine does away with a spark plug and uses heat and pressure alone to ignite the air-fuel mixture. The Atkinson engine uses a modified crankshaft to provide more efficiency, while the Miller cycle operates with a supercharger and a modified compression stroke.

Instead of piston strokes, the Wankel engine uses a rotor that rotates asymmetrically within a combustion chamber. Rotation of the rotor, usually triangular in shape, past an intake port draws gas into the combustion chamber. As the rotor rotates, asymmetric movement compresses the gas, which is then ignited in a different section of the combustion chamber. The gases expand into a different section of the combustion chamber as the rotor continues its rotation. Finally the rotor expels the exhaust gases via an outlet port, and the cycle begins again.

Continuous combustion engines include gas turbines and jet engines that use turbine blades to produce mechanical power. As with the engines described above, a gas is initially compressed and fuel is then added to the compressed gas. The mixture is then combusted and allowed to expand as it passes through the turbine blades, which rotates a shaft. The shaft can drive a propeller, a compressor, or both. Different types of continuous combustion include, e.g., industrial gas turbines, auxiliary power units, compressed air storage, radial gas turbines, microturbines, turbojets, turbofans, turboprops, turboshafts, propfans, ramjet, and scramjet engines.

Other types of engines are also powered by an ignition process, as opposed to the engines described above that rely on deflagration. Deflagration releases heat energy via subsonic combustion, while detonation is a supersonic process. For example, pulsejet and pulse detonation engines use a detonation process. These types of engines often have few moving parts and are relatively simple in operation. Generally, a fuel and gas mixture is drawn into a combustion chamber via open valves, which are then shut, and the mixture is reacted, producing thrust. The valves then open and fresh fuel and gas displace the exhaust gases, and the process is repeated. Some engines use no valves, but rely instead on engine geometry to achieve the same effect. The repeated reactions cause a pulsatile force.

Power can also be generated through the use of an electrochemical power system, which can generate power in the form of electrical power and/or thermal energy. Such electrochemical power systems typically include electrodes and reactants that cause an electron flow, which is then harnessed.

SUMMARY

The present disclosure describes in detail many systems for generating various forms of power. In one embodiment, the present disclosure is directed to an electrochemical power system that generates at least one of electricity and thermal energy comprising a vessel, the vessel comprising at least one cathode;

at least one anode;

at least one bipolar plate, and reactants comprising at least two components chosen from:

a) at least one source of H2O;

b) a source of oxygen;

c) at least one source of catalyst or a catalyst comprising at least one of the group chosen from nH, O, O2, OH, OH−, and nascent H2O, wherein n is an integer, and d) at least one source of atomic hydrogen or atomic hydrogen;

one or more reactants to form at least one of the source of catalyst, the catalyst, the source of atomic hydrogen, and the atomic hydrogen, and one or more reactants to initiate the catalysis of atomic hydrogen, the electrochemical power system further comprising an electrolysis system and an anode regeneration system.

In another embodiment, the present disclosure is directed to a power system that generates at least one of direct electrical energy and thermal energy comprising:

at least one vessel;

reactants comprising:

a) at least one source of catalyst or a catalyst comprising nascent H2O;

b) at least one source of atomic hydrogen or atomic hydrogen;

c) at least one of a conductor and a conductive matrix; and at least one set of electrodes to confine the hydrino reactants, a source of electrical power to deliver a short burst of high-current electrical energy;

a reloading system;

at least one system to regenerate the initial reactants from the reaction products, and at least one direct plasma to electricity converter and at least one thermal to electric power converter.

In a further embodiment, the present disclosure is directed to an electrochemical power system comprising a vessel, the vessel comprising at least one cathode;

at least one anode;

at least one electrolyte;

at least two reactants chosen from:

a) at least one source of catalyst or a catalyst comprising nascent $H_2O$;

b) at least one source of atomic hydrogen or atomic hydrogen;

c) at least one of a source of a conductor, a source of a conductive matrix, a conductor, and a conductive matrix; and at least one current source to produce a current comprising at least one of a high ion and electron current chosen from an internal current source and an external current source;

wherein the electrochemical power system generates at least one of electricity and thermal energy.

In an additional embodiment, the present disclosure is directed to a water arc plasma power system comprising: at least one closed reaction vessel; reactants comprising at least one of source of $H_2O$ and $H_2O$; at least one set of electrodes; a source of electrical power to deliver an initial high breakdown voltage of the $H_2O$ and provide a subsequent high current, and a heat exchanger system, wherein the power system generates arc plasma, light, and thermal energy.

In further embodiments, the present disclosure is directed to a mechanical power system comprising:

at least one piston cylinder of an internal combustion-type engine;

a fuel comprising:

a) at least one source of catalyst or a catalyst comprising nascent $H_2O$;

b) at least one source of atomic hydrogen or atomic hydrogen;

c) at least one of a conductor and a conductive matrix;

at least one fuel inlet with at least one valve;

at least one exhaust outlet with at least one valve;

at least one piston;

at least one crankshaft;

a high current source, and at least two electrodes that confine and conduct a high current through the fuel.

Certain embodiments of the present disclosure are directed to a power generation system comprising: an electrical power source of at least about 2,000 A/cm²; a plurality of electrodes electrically coupled to the electrical power source; a fuel loading region configured to receive a solid fuel, wherein the plurality of electrodes is configured to deliver electrical power to the solid fuel to produce a plasma; and a plasma power converter positioned to receive at least a portion of the plasma. Other embodiments are directed to a power generation system, comprising: a plurality of electrodes; a fuel loading region located between the plurality of electrodes and configured to receive a conductive fuel, wherein the plurality of electrodes are configured to apply a current to the conductive fuel sufficient to ignite the conductive fuel and generate at least one of plasma and thermal power; a delivery mechanism for moving the conductive fuel into the fuel loading region; and a plasma-to-electric power converter configured to convert the plasma into a non-plasma form of power or a thermal to electric or mechanical converter to convert the thermal power into a nonthermal form of power comprising electricity or mechanical power. Further embodiments are directed to a method of generating power, comprising: delivering an amount of fuel to a fuel loading region, wherein the fuel loading region is located among a plurality of electrodes; igniting the fuel by flowing a current of at least about 2,000 A/cm² through the fuel by applying the current to the plurality of electrodes to produce at least one of plasma, light, and heat; receiving at least a portion of the plasma in a plasma-to-electric converter; converting the plasma to a different form of power using the plasma-to-electric converter; and outputting the different form of power.

Additional embodiments are directed to a power generation system, comprising: an electrical power source of at least about 5,000 kW; a plurality of spaced apart electrodes, wherein the plurality of electrodes at least partially surround a fuel, are electrically connected to the electrical power source, are configured to receive a current to ignite the fuel, and at least one of the plurality of electrodes is moveable; a delivery mechanism for moving the fuel; and a plasma-to-electric power converter configured to convert plasma generated from the ignition of the fuel into a non-plasma form of power. Additionally provided in the present disclosure is a power generation system, comprising: an electrical power source of at least about 2,000 A/cm$^2$; a plurality of spaced apart electrodes, wherein the plurality of electrodes at least partially surround a fuel, are electrically connected to the electrical power source, are configured to receive a current to ignite the fuel, and at least one of the plurality of electrodes is moveable; a delivery mechanism for moving the fuel; and a plasma-to-electric power converter configured to convert plasma generated from the ignition of the fuel into a non-plasma form of power.

Another embodiments is directed to a power generation system, comprising: an electrical power source of at least about 5,000 kW; a plurality of spaced apart electrodes, wherein at least one of the plurality of electrodes includes a compression mechanism; a fuel loading region configured to receive a fuel, wherein the fuel loading region is surrounded by the plurality of electrodes so that the compression mechanism of the at least one electrode is oriented towards the fuel loading region, and wherein the plurality of electrodes are electrically connected to the electrical power source and configured to supply power to the fuel received in the fuel loading region to ignite the fuel; a delivery mechanism for moving the fuel into the fuel loading region; and a plasma power converter configured to convert plasma generated from the ignition of the fuel into a non-plasma form of power. Other embodiments of the present disclosure are directed to a power generation system, comprising: an electrical power source of at least about 2,000 A/cm$^2$; a plurality of spaced apart electrodes, wherein at least one of the plurality of electrodes includes a compression mechanism; a fuel loading region configured to receive a fuel, wherein the fuel loading region is surrounded by the plurality of electrodes so that the compression mechanism of the at least one electrode is oriented towards the fuel loading region, and wherein the plurality of electrodes are electrically connected to the electrical power source and configured to supply power to the fuel received in the fuel loading region to ignite the fuel; a delivery mechanism for moving the fuel into the fuel loading region; and a plasma power converter configured to convert plasma generated from the ignition of the fuel into a non-plasma form of power.

Embodiments of the present disclosure are also directed to power generation system, comprising: a plurality of electrodes; a fuel loading region surrounded by the plurality of electrodes and configured to receive a fuel, wherein the plurality of electrodes is configured to ignite the fuel located in the fuel loading region; a delivery mechanism for moving the fuel into the fuel loading region; a plasma power converter configured to convert plasma generated from the ignition of the fuel into a non-plasma form of power; a removal system for removing a byproduct of the ignited fuel; and a regeneration system operably coupled to the removal system for recycling the removed byproduct of the ignited fuel into recycled fuel. Certain embodiments of the present disclosure are also directed to a power generation system, comprising: an electrical power source configured to output a current of at least about 2,000 A/cm$^2$; a plurality of spaced apart electrodes electrically connected to the electrical power source; a fuel loading region configured to receive a fuel, wherein the fuel loading region is surrounded by the plurality of electrodes, and wherein the plurality of electrodes is configured to supply power to the fuel to ignite the fuel when received in the fuel loading region; a delivery mechanism for moving the fuel into the fuel loading region; a plasma-to-electric power converter configured to convert plasma generated from the ignition of the fuel into electrical power; one or more output power terminals operably coupled to the plasma-to-electric power converter; and a power storage device.

Additional embodiments of the present disclosure are directed to a power generation system, comprising: an electrical power source of at least 5,000 kW; a plurality of spaced apart electrodes electrically connected to the electrical power source; a fuel loading region configured to receive a fuel, wherein the fuel loading region is surrounded by the plurality of electrodes, and wherein the plurality of electrodes is configured to supply power to the fuel to ignite the fuel when received in the fuel loading region; a delivery mechanism for moving the fuel into the fuel loading region; a plasma power converter configured to convert plasma generated from the ignition of the fuel into a non-plasma form of power; a sensor configured to measure at least one parameter associated with the power generation system; and a controller configured to control at least a process associated with the power generation system. Further embodiments are directed to a power generation system, comprising: an electrical power source of at least 2,000 A/cm$^2$; a plurality of spaced apart electrodes electrically connected to the electrical power source; a fuel loading region configured to receive a fuel, wherein the fuel loading region is surrounded by the plurality of electrodes, and wherein the plurality of electrodes is configured to supply power to the fuel to ignite the fuel when received in the fuel loading region; a delivery mechanism for moving the fuel into the fuel loading region; a plasma power converter configured to convert plasma generated from the ignition of the fuel into a non-plasma form of power; a sensor configured to measure at least one parameter associated with the power generation system; and a controller configured to control at least a process associated with the power generation system.

Certain embodiments of the present disclosure are directed to a power generation system, comprising: an electrical power source of at least about 5,000 kW; a plurality of spaced apart electrodes electrically connected to the electrical power source; a fuel loading region configured to receive a fuel, wherein the fuel loading region is surrounded by the plurality of electrodes, and wherein the plurality of electrodes is configured to supply power to the fuel to ignite the fuel when received in the fuel loading region, and wherein a pressure in the fuel loading region is a partial vacuum; a delivery mechanism for moving the fuel into the fuel loading region; and a plasma-to-electric power converter configured to convert plasma generated from the ignition of the fuel into a non-plasma form of power. Other embodiments are directed to a power generation system, comprising: an electrical power source of at least about 2,000 A/cm$^2$; a plurality of spaced apart electrodes electrically connected to the electrical power source; a fuel loading region configured to receive a fuel, wherein the fuel loading region is surrounded by the plurality of electrodes, and wherein the plurality of electrodes is configured to supply power to the fuel to ignite the fuel when received in the fuel loading region, and wherein a pressure in the fuel loading region is a partial vacuum; a delivery mechanism for moving the fuel into the fuel loading region; and a plasma-to-electric power converter configured to convert plasma generated from the ignition of the fuel into a non-plasma form of power.

Further embodiments are directed to a power generation cell, comprising: an outlet port coupled to a vacuum pump; a plurality of electrodes electrically coupled to an electrical power source of at least 5,000 kW; a fuel loading region configured to receive a water-based fuel comprising a majority $H_2O$, wherein the plurality of electrodes is configured to deliver power to the water-based fuel to produce at least one of an arc plasma and thermal power; and a power converter configured to convert at least a portion of at least one of the arc plasma and the thermal power into electrical power. Also disclosed is a power generation system, comprising: an electrical power source of at least 5,000 A/cm$^2$; a plurality of electrodes electrically coupled to the electrical power source; a fuel loading region configured to receive a water-based fuel comprising a majority $H_2O$, wherein the plurality of electrodes is configured to deliver power to the water-based fuel to produce at least one of an arc plasma and thermal power; and a power converter configured to convert at least a portion of at least one of the arc plasma and the thermal power into electrical power.

Additional embodiments are directed to a method of generating power, comprising: loading a fuel into a fuel loading region, wherein the fuel loading region includes a plurality of electrodes; applying a current of at least about 2,000 A/cm$^2$ to the plurality of electrodes to ignite the fuel to produce at least one of an arc plasma and thermal power; performing at least one of passing the arc plasma through a plasma-to-electric converter to generate electrical power; and passing the thermal power through a thermal-to-electric converter to generate electrical power; and outputting at least a portion of the generated electrical power. Also disclosed is a power generation system, comprising: an electrical power source of at least 5,000 kW; a plurality of electrodes electrically coupled to the power source, wherein the plurality of electrodes is configured to deliver electrical power to a water-based fuel comprising a majority H2O to produce a thermal power; and a heat exchanger configured to convert at least a portion of the thermal power into electrical power. In addition, another embodiment is directed to a power generation system, comprising: an electrical power source of at least 5,000 kW; a plurality of spaced apart electrodes, wherein at least one of the plurality of electrodes includes a compression mechanism; a fuel loading region configured to receive a water-based fuel comprising a majority H2O, wherein the fuel loading region is surrounded by the plurality of electrodes so that the compression mechanism of the at least one electrode is oriented towards the fuel loading region, and wherein the plurality of electrodes are electrically connected to the electrical power source and configured to supply power to the water-based fuel received in the fuel loading region to ignite the fuel; a delivery mechanism for moving the water-based fuel into the fuel loading region; and a plasma power converter configured to convert plasma generated from the ignition of the fuel into a non-plasma form of power.

Certain embodiments of the present disclosure are directed to a system for producing mechanical power comprising: an electrical power source of at least about 5,000 A; an ignition chamber configured to produce at least one of plasma and thermal power; a fuel delivery device configured to deliver a solid fuel to the ignition chamber; a pair of electrodes coupled to the electrical power source and configured to supply power to the solid fuel to produce the at least one of plasma and thermal power; and a piston located within the ignition chamber and configured to move relative to the ignition chamber to output mechanical power.

Additional embodiments are directed to a system for producing mechanical power, comprising: an electrical power source of at least about 5,000 A; an ignition chamber configured to produce at least one of plasma and thermal power, wherein the ignition chamber includes an outlet port; a fuel delivery device configured to deliver a solid fuel to the ignition chamber to produce at least one of the plasma and the thermal power; a pair of electrodes coupled to the electrical power source and configured to supply power to the ignition chamber; and a turbine in fluid communication with the outlet port and configured to rotate to output mechanical power.

Further embodiments are directed to a system for producing mechanical power, comprising: an electrical power source of at least about 5,000 A; an impeller configured to rotate to output mechanical power, wherein the impeller includes a hollow region configured to produce at least one of plasma and thermal power and the hollow region includes an intake port configured to receive a working fluid; a fuel delivery device configured to deliver a solid fuel to the hollow region; and a pair of electrodes coupled to the electrical power source and configured to supply power to the hollow region to ignite the solid fuel and produce at least one of the plasma and the thermal power.

Additional embodiments are directed to a system for producing mechanical power, comprising: an electrical power source of at least about 5,000 A; a moveable element configured to rotate to output mechanical power, wherein the moveable element at least partially defines an ignition chamber configured to produce at least one of plasma and thermal power; a fuel delivery device configured to deliver a solid fuel to the ignition chamber; and a pair of electrodes coupled to the electrical power source and configured to supply power to the solid fuel to produce at least one of the plasma and the thermal power.

Further embodiments are directed to a system for producing mechanical power comprising: an electrical power source of at least about 5,000 A; a plurality of ignition chambers, wherein each of the plurality of ignition chambers is configured to produce at least one of plasma and thermal power; a fuel delivery device configured to deliver a solid fuel to the plurality of ignition chambers; and a plurality of electrodes coupled to the electrical power source, wherein at least one of the plurality of electrodes is associated with at least one of the plurality of ignition chambers and configured to supply electrical power to the solid fuel to produce at least one of the plasma and the thermal power.

Embodiments of the present disclosure are directed to a system for producing mechanical power comprising: an electrical power source of at least about 5,000 A; an ignition chamber configured to produce at least one of arc plasma and thermal power; a fuel delivery device configured to deliver a water-based fuel to the ignition chamber; a pair of electrodes coupled to the electrical power source and configured to supply power to the fuel to produce at least one of the arc plasma and the thermal power; and a piston fluidly coupled to the ignition chamber and configured to move relative to the ignition chamber to output mechanical power.

In addition, the present disclosure in directed to a system for producing mechanical power comprising: an electrical power source of at least about 5,000 A; an ignition chamber configured to produce at least one of arc plasma and thermal power, wherein the ignition chamber includes an outlet port;

a fuel delivery device configured to deliver a water-based fuel to the ignition chamber; a pair of electrodes coupled to the electrical power source and configured to supply power to the fuel to produce at least one of the arc plasma and the thermal power; and a turbine in fluid communication with the outlet port and configured to rotate to output mechanical power.

Embodiments are also directed to a system for producing mechanical power, comprising: an electrical power source of at least about 5,000 A; an impeller configured to rotate to output mechanical power, wherein the impeller includes a hollow region configured to produce at least one of arc plasma and thermal power and the hollow region includes an intake port configured to receive a working fluid; a fuel delivery device configured to deliver a water-based fuel to the hollow region; and a pair of electrodes coupled to the electrical power source and configured to supply electrical power to the hollow region to ignite the water-based fuel and produce at least one of the arc plasma and thermal power.

The present disclosure is also directed to a system for producing mechanical power, comprising: an electrical power source of at least about 5,000 A; a plurality of ignition chambers, wherein each of the plurality of ignition chambers is configured to produce at least one of arc plasma and thermal power; a fuel delivery device configured to deliver a water-based fuel to the plurality of ignition chambers; and a plurality of electrodes coupled to the electrical power source, wherein at least one of the plurality of electrodes is associated with at least one of the plurality of ignition chambers and configured to supply electrical power to the water-based fuel to produce at least one of the arc plasma and the thermal power.

Also provided herein is an ignition chamber, comprising: a shell defining a hollow chamber configured to create at least one of plasma, arc plasma, and thermal power; a fuel receptacle in fluid communication with the hollow chamber, wherein the fuel receptacle is electrically coupled to a pair of electrodes; and a moveable element in fluid communication with the hollow chamber. Additionally disclosed is an ignition chamber, comprising: a shell defining a hollow chamber; an injection device in fluid communication with the hollow chamber, wherein the injection device is configured to inject a fuel into the hollow chamber; a pair of electrodes electrically coupled to the hollow chamber and configured to supply electrical power to the fuel sufficient to produce at least one of at least one of plasma, arc plasma, and thermal power in the hollow chamber; and a moveable element in fluid communication with the hollow chamber.

Embodiments of the present disclosure are directed to a method for producing mechanical power comprising: delivering a solid fuel to an ignition chamber; passing a current of at least about 5,000 A through the solid fuel and applying a voltage of less than about 10 V to the solid fuel to ignite the solid fuel and produce at least one of plasma and thermal power; mixing at least one of the plasma and the thermal power with a working fluid; and directing the working fluid toward a moveable element to move the moveable element and output mechanical power.

Further embodiments of the present disclosure are directed to a method for producing mechanical power, comprising: delivering a water-based fuel to an ignition chamber; passing a current of at least about 5,000 A through the water-based fuel and applying a voltage of at least about 2 kV to the water-based fuel to ignite the water-based fuel to produce at least one of arc plasma and thermal power; mixing at least one of the arc plasma and the thermal power with a working fluid; and directing the working fluid toward a moveable element to move the moveable element and output mechanical power.

A method for producing mechanical power is also disclosed comprising: supplying a solid fuel to an ignition chamber; supplying at least about 5,000 A to an electrode electrically coupled to the solid fuel; igniting the solid fuel to produce at least one of plasma and thermal power in the ignition chamber; and converting at least some of at least one of the plasma and the thermal power into mechanical power. An additional method for producing mechanical power is disclosed comprising: supplying a water-based fuel to an ignition chamber; supplying at least about 5,000 A to an electrode electrically coupled to the water-based fuel; igniting the water-based fuel to form at least one of arc plasma and thermal power in the ignition chamber; and converting at least some of at least one of the arc plasma and the thermal power into mechanical power.

An additional embodiment of the present disclosure is directed to a machine configured for land-based transportation, comprising: an electrical power source of at least about 5,000 A; an ignition chamber configured to produce at least one of at least one of plasma, arc plasma, and thermal power; a fuel delivery device configured to deliver a fuel to the ignition chamber; a pair of electrodes coupled to the electrical power source and configured to supply power to the fuel to produce the at least one of the plasma the arc plasma, and the thermal power; a moveable element fluidly coupled to the ignition chamber and configured to move relative to the ignition chamber; and a drive-shaft mechanically coupled to the moveable element and configured to provide mechanical power to a transportation element.

An additional embodiment of the present disclosure is directed to a machine configured for aviation transport, comprising: an electrical power source of at least about 5,000 A; an ignition chamber configured to produce at least one of at least one of plasma, arc plasma, and thermal power; a fuel delivery device configured to deliver a fuel to the ignition chamber; a pair of electrodes coupled to the electrical power source and configured to supply power to the fuel to produce the at least one of the plasma, the arc plasma, and thermal power; a moveable element fluidly coupled to the ignition chamber and configured to move relative to the ignition chamber; and an aviation element mechanically coupled to the moveable element and configured to provide propulsion in an aviation environment.

Embodiments of the present disclosure are also directed to a machine configured for marine transport, comprising: an electrical power source of at least about 5,000 A; an ignition chamber configured to produce at least one of at least one of plasma, arc plasma, and thermal power; a fuel delivery device configured to deliver a fuel to the ignition chamber; a pair of electrodes coupled to the electrical power source and configured to supply power to the fuel to produce the at least one of the plasma, the arc plasma, and the thermal power; a moveable element fluidly coupled to the ignition chamber and configured to move relative to the ignition chamber; and a marine element mechanically coupled to the moveable element and configured to provide propulsion in a marine environment.

Additional embodiments of the present disclosure re directed to work machines comprising: an electrical power source of at least about 5,000 A; an ignition chamber configured to produce at least one of at least one of plasma, arc plasma, and thermal power; a fuel delivery device configured to deliver a fuel to the ignition chamber; a pair of electrodes coupled to the electrical power source and configured to supply power to the fuel to produce the at least one of the plasma, the arc plasma, and the thermal power; a moveable element fluidly coupled to the ignition chamber and configured to move relative to the ignition chamber; and a work element mechanically coupled to the moveable element and configured to provide mechanical power.

BRIEF DESCRIPTION OF THE DRAWINGS

FIG. 17A depicts an exemplary power generation system, according to an embodiment of the present disclosure.

FIG. 17B depicts an alternative configuration of the components of the exemplary power generation system of FIG. 17A.

FIG. 18A depicts exemplary electrodes of a power generation system, according to an embodiment of the present disclosure.

FIG. 18B depicts an alternative configuration of the exemplary electrodes of FIG. 18A.

FIG. 27 is an illustration of an enlarged view of a portion of a mechanical power generation system, according to an embodiment of the present disclosure.

FIG. 28 is a schematic representation of a portion of a mechanical power generation system, according to an embodiment of the present disclosure.

FIG. 29 is a schematic representation of a portion of a mechanical power generation system, according to an embodiment of the present disclosure.

DETAILED DESCRIPTION

Figure 1:
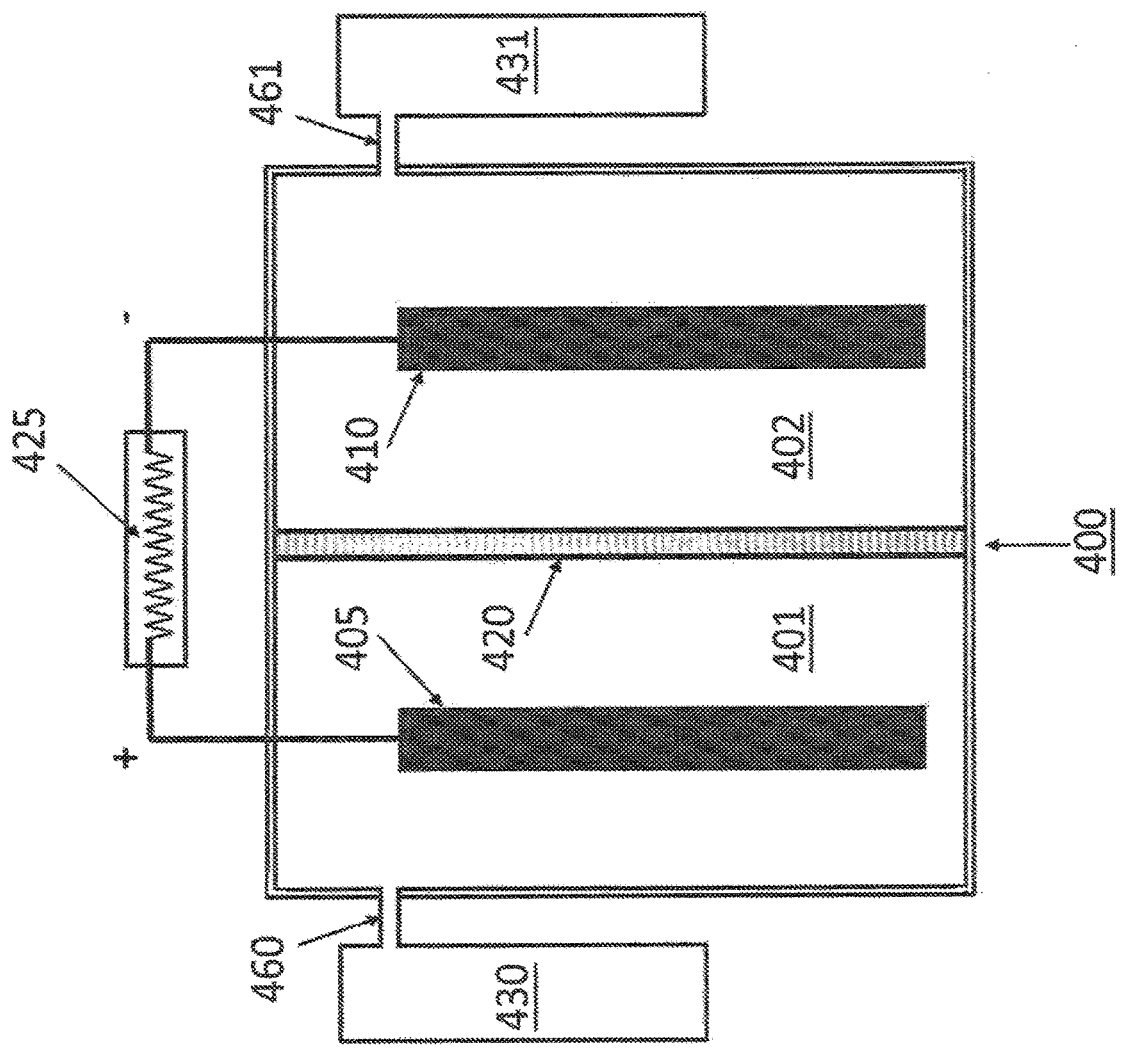
FIG. 1 is a schematic drawing of a CIHT cell in accordance with an embodiment of the present disclosure.

Disclosed here in are catalyst systems to release energy from atomic hydrogen to form lower energy states wherein the electron shell is at a closer position relative to the nucleus. The released power is harnessed for power generation and additionally new hydrogen species and compounds are desired products. These energy states are predicted by classical physical laws and require a catalyst to accept energy from the hydrogen in order to undergo the corresponding energy-releasing transition.

Classical physics gives closed-form solutions of the hydrogen atom, the hydride ion, the hydrogen molecular ion, and the hydrogen molecule and predicts corresponding species having fractional principal quantum numbers. Using Maxwell's equations, the structure of the electron was derived as a boundary-value problem wherein the electron comprises the source current of time-varying electromagnetic fields during transitions with the constraint that the bound n=1 state electron cannot radiate energy. A reaction predicted by the solution of the H atom involves a resonant, nonradiative energy transfer from otherwise stable atomic hydrogen to a catalyst capable of accepting the energy to form hydrogen in lower-energy states than previously thought possible. Specifically, classical physics predicts that atomic hydrogen may undergo a catalytic reaction with certain atoms, excimers, ions, and diatomic hydrides which provide a reaction with a net enthalpy of an integer multiple of the potential energy of atomic hydrogen, $E_h=27.2$ eV where $E_h$ is one Hartree. Specific species (e.g. $He^+$, $Ar^+$, $Sr^+$, K, Li, HCl, and NaH, OH, SH, SeH, nascent $H_2O$, nH (n=integer)) identifiable on the basis of their known electron energy levels are required to be present with atomic hydrogen to catalyze the process. The reaction involves a nonradiative energy transfer followed by q·13.6 eV continuum emission or q·13.6 eV transfer to H to form extraordinarily hot, excited-state H and a hydrogen atom that is lower in energy than unreacted atomic hydrogen that corresponds to a fractional principal quantum number. That is, in the formula for the principal energy levels of the hydrogen atom:

$$E_n = -\frac{e^2}{n^2 8\pi\varepsilon_0 a_H} = -\frac{13.598 \text{ eV}}{n^2}. \tag{1}$$

$$n = 1, 2, 3, \ldots \tag{2}$$

where $a_H$ is the Bohr radius for the hydrogen atom (52.947 pm), e is the magnitude of the charge of the electron, and $\varepsilon_o$ is the vacuum permittivity, fractional quantum numbers:

$$n = 1, \frac{1}{2}, \frac{1}{3}, \frac{1}{4}, \ldots, \frac{1}{p}; \text{ where } p \leq 137 \text{ is an integer} \tag{3}$$

replace the well known parameter n=integer in the Rydberg equation for hydrogen excited states and represent lower-energy-state hydrogen atoms called "hydrinos." Then, similar to an excited state having the analytical solution of Maxwell's equations, a hydrino atom also comprises an electron, a proton, and a photon. However, the electric field of the latter increases the binding corresponding to desorption of energy rather than decreasing the central field with the absorption of energy as in an excited state, and the resultant photon-electron interaction of the hydrino is stable rather than radiative.

The n=1 state of hydrogen and the $$n = \frac{1}{\text{integer}}$$

states of hydrogen are nonradiative, but a transition between two nonradiative states, say n=1 to n=½, is possible via a nonradiative energy transfer. Hydrogen is a special case of the stable states given by Eqs. (1) and (3) wherein the corresponding radius of the hydrogen or hydrino atom is given by $$r = \frac{a_H}{p}, \tag{4}$$

where p=1, 2, 3, . . . . In order to conserve energy, energy must be transferred from the hydrogen atom to the catalyst in units of $$m \cdot 27.2 \text{ eV}, m = 1, 2, 3, 4, \ldots. \tag{5}$$

and the radius transitions to $$\frac{a_H}{m + p}.$$

The catalyst reactions involve two steps of energy release: a nonradiative energy transfer to the catalyst followed by additional energy release as the radius decreases to the corresponding stable final state. It is believed that the rate of catalysis is increased as the net enthalpy of reaction is more closely matched to m·27.2 eV. It has been found that catalysts having a net enthalpy of reaction within ±10%, preferably ±5%, of m·27.2 eV are suitable for most applications. In the case of the catalysis of hydrino atoms to lower energy states, the enthalpy of reaction of m·27.2 eV (Eq. (5)) is relativistically corrected by the same factor as the potential energy of the hydrino atom.

Thus, the general reaction is given by $$m \cdot 27.2 \text{ eV} + \text{Cat}^{q+} + \tag{6}$$

$$H\left[\frac{a_H}{p}\right] \to \text{Cat}^{(q+r)+} + re^- + H*\left[\frac{a_H}{(m+p)}\right] + m \cdot 27.2 \text{ eV}$$

$$H*\left[\frac{a_H}{(m+p)}\right] \to H\left[\frac{a_H}{(m+p)}\right] + \left[(m+p)^2 - p^2\right] \cdot 13.6 \text{ eV} - m \cdot 27.2 \text{ eV} \tag{7}$$

$$\text{Cat}^{(q+r)+} + re^- \to \text{Cat}^{q+} + m \cdot 27.2 \text{ eV and} \tag{8}$$

the overall reaction is $$H\left[\frac{a_H}{p}\right] \rightarrow H\left[\frac{a_H}{(m+p)}\right] + \left[(m+p)^2 - p^2\right] \cdot 13.6 \text{ eV} \qquad (9)$$

q, r, m, and p are integers.

$$H*\left[\frac{a_H}{(m+p)}\right]$$

has the radius of the hydrogen atom (corresponding to 1 in the denominator) and a central field equivalent to (m+p) times that of a proton, and $$H\left[\frac{a_H}{(m+p)}\right]$$

is the corresponding stable state with the radius of $$\frac{1}{(m+p)}$$

that of H. As the electron undergoes radial acceleration from the radius of the hydrogen atom to a radius of $$\frac{1}{(m+p)}$$

this distance, energy is released as characteristic light emission or as third-body kinetic energy. The emission may be in the form of an extreme-ultraviolet continuum radiation having an edge at $[(p+m)^2-p^2-2m]\cdot 13.6$ eV or $$\frac{91.2}{\left[(m+p)^2 - p^2 - 2m\right]}$$

nm and extending to longer wavelengths. In addition to radiation, a resonant kinetic energy transfer to form fast H may occur. Subsequent excitation of these fast H(n=1) atoms by collisions with the background $H_2$ followed by emission of the corresponding H(n=3) fast atoms gives rise to broadened Balmer $\alpha$ emission. Alternatively, fast H is a direct product of H or hydrino serving as the catalyst wherein the acceptance of the resonant energy transfer regards the potential energy rather than the ionization energy. Conservation of energy gives a proton of the kinetic energy corresponding to one half the potential energy in the former case and a catalyst ion at essentially rest in the latter case. The H recombination radiation of the fast protons gives rise to broadened Balmer $\alpha$ emission that is disproportionate to the inventory of hot hydrogen consistent with the excess power balance.

In the present disclosure the terms such as hydrino reaction, H catalysis, H catalysis reaction, catalysis when referring to hydrogen, the reaction of hydrogen to form hydrinos, and hydrino formation reaction all refer to the reaction such as that of Eqs. (6-9)) of a catalyst defined by Eq. (5) with atomic H to form states of hydrogen having energy levels given by Eqs. (1) and (3). The corresponding terms such as hydrino reactants, hydrino reaction mixture, catalyst mixture, reactants for hydrino formation, reactants that produce or form lower-energy state hydrogen or hydrinos are also used interchangeably when referring to the reaction mixture that performs the catalysis of H to H states or hydrino states having energy levels given by Eqs. (1) and (3).

The catalytic lower-energy hydrogen transitions of the present disclosure require a catalyst that may be in the form of an endothermic chemical reaction of an integer m of the potential energy of uncatalyzed atomic hydrogen, 27.2 eV, that accepts the energy from atomic H to cause the transition. The endothermic catalyst reaction may be the ionization of one or more electrons from a species such as an atom or ion (e.g. m=3 for Li→$Li^{2+}$) and may further comprise the concerted reaction of a bond cleavage with ionization of one or more electrons from one or more of the partners of the initial bond (e.g. m=2 for NaH→$Na^{2+}$+H). $He^+$ fulfills the catalyst criterion—a chemical or physical process with an enthalpy change equal to an integer multiple of 27.2 eV since it ionizes at 54.417 eV, which is 2·27.2 eV. An integer number of hydrogen atoms may also serve as the catalyst of an integer multiple of 27.2 eV enthalpy. Hydrogen atoms H(1/p) p=1, 2, 3, . . . 137 can undergo further transitions to lower-energy states given by Eqs. (1) and (3) wherein the transition of one atom is catalyzed by one or more additional H atoms that resonantly and nonradiatively accepts m·27.2 eV with a concomitant opposite change in its potential energy. The overall general equation for the transition of H(1/p) to H(1/(m+p)) induced by a resonance transfer of m·27.2 eV to H(1/p') is represented by $$H(1/p') + H(1/p) \rightarrow H +$$  (10)

$$H(1/(m+p)) + \left[2pm + m^2 - p'^2 + 1\right] \cdot 13.6 \text{ eV}$$

Hydrogen atoms may serve as a catalyst wherein m=1, m=2, and m=3 for one, two, and three atoms, respectively, acting as a catalyst for another. The rate for the two-atom-catalyst, 2H, may be high when extraordinarily fast H collides with a molecule to form the 2H wherein two atoms resonantly and nonradiatively accept 54.4 eV from a third hydrogen atom of the collision partners. By the same mechanism, the collision of two hot $H_2$ provide 3H to serve as a catalyst of 3·27.2 eV for the fourth. The EUV continua at 22.8 nm and 10.1 nm, extraordinary (>100 eV) Balmer $\alpha$ line broadening, highly excited H states, the product gas $H_2(1/4)$, and large energy release is observed consistent with predictions.

H(1/4) is a preferred hydrino state based on its multipolarity and the selection rules for its formation. Thus, in the case that H(1/3) is formed, the transition to H(1/4) may occur rapidly catalyzed by H according to Eq. (10). Similarly, H(1/4) is a preferred state for a catalyst energy greater than or equal to 81.6 eV corresponding to m=3 in Eq. (5). In this case the energy transfer to the catalyst comprises the 81.6 eV that forms that H*(1/4) intermediate of Eq. (7) as well as an integer of 27.2 eV from the decay of the intermediate. For example, a catalyst having an enthalpy of 108.8 eV may form H*(1/4) by accepting 81.6 eV as well as 27.2 eV from the H*(1/4) decay energy of 122.4 eV. The remaining decay energy of 95.2 eV is released to the environment to form the preferred state H(1/4) that then reacts to form $H_2(1/4)$.

A suitable catalyst can therefore provide a net positive enthalpy of reaction of m·27.2 eV. That is, the catalyst resonantly accepts the nonradiative energy transfer from hydrogen atoms and releases the energy to the surroundings to affect electronic transitions to fractional quantum energy levels. As a consequence of the nonradiative energy transfer, the hydrogen atom becomes unstable and emits further energy until it achieves a lower-energy nonradiative state having a principal energy level given by Eqs. (1) and (3). Thus, the catalysis releases energy from the hydrogen atom with a commensurate decrease in size of the hydrogen atom, $r_n = na_H$ where n is given by Eq. (3). For example, the catalysis of H(n=1) to H(n=¼) releases 204 eV, and the hydrogen radius decreases from $a_H$ to $$\frac{1}{4}a_H.$$

The catalyst product, H(1/p), may also react with an electron to form a hydrino hydride ion H⁻(1/p), or two H(1/p) may react to form the corresponding molecular hydrino $H_2$(1/p). Specifically, the catalyst product, H(1/p), may also react with an electron to form a novel hydride ion H⁻(1/p) with a binding energy $E_B$:

$$E_B = \frac{\hbar^2 \sqrt{s(s+1)}}{8\mu_e a_0^2 \left[1 + \frac{\sqrt{s(s+1)}}{p}\right]^2} - \frac{\pi\mu_0 e^2 \hbar^2}{m_e^2} \left(\frac{1}{a_H^3} + \frac{2^2}{a_0^3 \left[1 + \frac{\sqrt{s(s+1)}}{p}\right]^3}\right) \quad (11)$$

where p=integer>1, s=½, $\hbar$ is Planck's constant bar, $\mu_o$ is the permeability of vacuum, $m_e$ is the mass of the electron, $\mu_e$ is the reduced electron mass given by $$\mu_e = \frac{m_e m_p}{\frac{m_e}{\sqrt{\frac{3}{4}}} + m_p}$$

wherein $m_p$ is the mass of the proton, $a_o$ is the Bohr radius, and the ionic radius is $$r_1 = \frac{a_0}{p}\left(1 + \sqrt{s(s+1)}\right).$$

From Eq. (11), the calculated ionization energy of the hydride ion is 0.75418 eV, and the experimental value is 6082.99±0.15 cm⁻¹ (0.75418 eV). The binding energies of hydrino hydride ions may be measured by X-ray photoelectron spectroscopy (XPS).

Upfield-shifted NMR peaks are direct evidence of the existence of lower-energy state hydrogen with a reduced radius relative to ordinary hydride ion and having an increase in diamagnetic shielding of the proton. The shift is given by the sum of the contributions of the diamagnetism of the two electrons and the photon field of magnitude p (Mills GUTCP Eq. (7.87)).

$$\frac{\Delta B_T}{B} = \quad (12)$$

$$-\mu_0 \frac{pe^2}{12 m_e a_0 \left(1 + \sqrt{s(s+1)}\right)}\left(1 + p\alpha^2\right) = -\left(p29.9 + p^2 1.59 \times 10^{-3}\right)ppm$$

where the first term applies to H⁻ with p=1 and p=integer>1 for H⁻(1/p) and $\alpha$ is the fine structure constant. The predicted hydrino hydride peaks are extraordinarily upfield shifted relative to ordinary hydride ion. In an embodiment, the peaks are upfield of TMS. The NMR shift relative to TMS may be greater than that known for at least one of ordinary H⁻, H, $H_2$, or H⁺ alone or comprising a compound. The shift may be greater than at least one of 0, −1, −2, −3, −4, −5, −6, −7, −8, −9, −10, −11, −12, −13, −14, −15, −16, −17, −18, −19, −20, −21, −22, −23, −24, −25, −26, −27, −28, −29, −30, −31, −32, −33, −34, −35, −36, −37, −38, −39, and −40 ppm. The range of the absolute shift relative to a bare proton, wherein the shift of TMS is about −31.5 relative to a bare proton, may be −(p29.9+p²2.74) ppm (Eq. (12)) within a range of about at least one of ±5 ppm, ±10 ppm, ±20 ppm, ±30 ppm, ±40 ppm, ±50 ppm, ±60 ppm, ±70 ppm, ±80 ppm, ±90 ppm, and ±100 ppm. The range of the absolute shift relative to a bare proton may be −(p29.9+p²1.59×10⁻³) ppm (Eq. (12)) within a range of about at least one of about 0.1% to 99%, 1% to 50%, and 1% to 10%. In another embodiment, the presence of a hydrino species such as a hydrino atom, hydride ion, or molecule in a solid matrix such as a matrix of a hydroxide such as NaOH or KOH causes the matrix protons to shift upfield. The matrix protons such as those of NaOH or KOH may exchange. In an embodiment, the shift may cause the matrix peak to be in the range of about −0.1 ppm to −5 ppm relative to TMS. The NMR determination may comprise magic angle spinning ¹H nuclear magnetic resonance spectroscopy (MAS ¹H NMR).

H(1/p) may react with a proton and two H(1/p) may react to form $H_2$(1/p)⁺ and $H_2$(1/p), respectively. The hydrogen molecular ion and molecular charge and current density functions, bond distances, and energies were solved from the Laplacian in ellipsoidal coordinates with the constraint of nonradiation.

$$(\eta - \zeta)R_\xi \frac{\partial}{\partial \xi}\left(R_\xi \frac{\partial \phi}{\partial \xi}\right) + (\zeta - \xi)R_\eta \frac{\partial}{\partial \eta}\left(R_\eta \frac{\partial \phi}{\partial \eta}\right) + \quad (13)$$

$$(\xi - \eta)R_\zeta \frac{\partial}{\partial \zeta}\left(R_\zeta \frac{\partial \phi}{\partial \zeta}\right) = 0$$

The total energy $E_T$ of the hydrogen molecular ion having a central field of +pe at each focus of the prolate spheroid molecular orbital is $$E_T = -p^2 \left\{ \frac{e^2}{8\pi\varepsilon_o a_H} \left(4\ln 3 - 1 - 2\ln 3\right)\left[1 + p\sqrt{\frac{2\hbar\sqrt{\frac{2e^2}{4\pi\varepsilon_o(2a_H)^3}}}{m_e c^2}}\right] - \frac{1}{2}\hbar\sqrt{\frac{\frac{pe^2}{4\pi\varepsilon_o\left(\frac{2a_H}{p}\right)^3} - \frac{pe^2}{8\pi\varepsilon_o\left(\frac{3a_H}{p}\right)^3}}{\mu}} \right\} \quad (14)$$

$$= -p^2 16.13392 \, eV - p^3 0.118755 \, eV$$

where p is an integer, c is the speed of light in vacuum, and $\mu$ is the reduced nuclear mass. The total energy of the hydrogen molecule having a central field of +pe at each focus of the prolate spheroid molecular orbital is $$E_T = -p^2 \left\{ \frac{\frac{e^2}{8\pi\varepsilon_o a_0}\left[\left(2\sqrt{2} - \sqrt{2} + \frac{\sqrt{2}}{2}\right)\ln\frac{\sqrt{2}+1}{\sqrt{2}-1} - \sqrt{2}\right]\left[1 + p\sqrt{\frac{2\hbar\sqrt{\frac{\frac{2e^2}{4\pi\varepsilon_o a_0^3}}{m_e}}}{m_e c^2}}\right] - }{\frac{1}{2}\hbar\sqrt{\frac{\sqrt{\frac{pe^2}{8\pi\varepsilon_o\left(\frac{a_0}{p}\right)^3} - \frac{pe^2}{8\pi\varepsilon_o\left(\frac{1+\frac{1}{\sqrt{2}}a_0}{p}\right)^3}}}{\mu}}} \right\} \tag{15}$$

$$= -p^2 31.351\ eV - p^3 0.326469\ eV$$

The bond dissociation energy, $E_D$, of the hydrogen molecule $H_2(1/p)$ is the difference between the total energy of the corresponding hydrogen atoms and $E_T$ $$E_D = E(2H(1/p)) - E_T \tag{16}$$

where $$E(2H(1/p)) = p^2 27.20\ eV \tag{17}$$

$E_D$ is given by Eqs. (16–17) and (15):

$$E_D = -p^2 27.20\ eV - E_T \tag{18}$$

$$= -p^2 27.20\ eV - (-p^2 31.351\ eV - p^3 0.326469\ eV)$$

$$= p^2 4.151\ eV + p^3 0.326469\ eV$$

$H_2(1/p)$ may be identified by X-ray photoelectron spectroscopy (XPS) wherein the ionization product in addition to the ionized electron may be at least one of the possibilities such as those comprising two protons and an electron, a H atom, a hydrino atom, a molecular ion, hydrogen molecular ion, and $H_2(1/p)^+$ wherein the energies may be shifted by the matrix.

The NMR of catalysis-product gas provides a definitive test of the theoretically predicted chemical shift of $H_2(1/p)$. In general, the $^1H$ NMR resonance of $H_2(1/p)$ is predicted to be upfield from that of $H_2$ due to the fractional radius in elliptic coordinates wherein the electrons are significantly closer to the nuclei. The predicted shift, $$\frac{\Delta B_T}{B},$$

for $H_6(1/p)$ is given by the sum of the contributions of the diamagnetism of the two electrons and the photon field of magnitude p (Mills GUTCP Eqs. (11.415-11.416)):

$$\frac{\Delta B_T}{B} = -\mu_0\left(4 - \sqrt{2}\ln\frac{\sqrt{2}+1}{\sqrt{2}-1}\right)\frac{pe^2}{36 a_0 m_e}(1 + p\alpha^2) \tag{19}$$

$$\frac{\Delta B_T}{B} = -(p28.01 + p^2 1.49\times10^{-3})ppm \tag{20}$$

where the first term applies to $H_2$ with p=1 and p=integer>1 for $H_2(1/p)$. The experimental absolute $H_2$ gas-phase resonance shift of −28.0 ppm is in excellent agreement with the predicted absolute gas-phase shift of −28.01 ppm (Eq. (20)). The predicted molecular hydrino peaks are extraordinarily upfield shifted relative to ordinary $H_2$. In an embodiment, the peaks are upfield of TMS. The NMR shift relative to TMS may be greater than that known for at least one of ordinary $H^-$, H, $H_2$, or $H^+$ alone or comprising a compound. The shift may be greater than at least one of 0, −1, −2, −3, −4, −5, −6, −7, −8, −9, −10, −11, −12, −13, −14, −15, −16, −17, −18, −19, −20, −21, −22, −23, −24, −25, −26, −27, −28, −29, −30, −31, −32, −33, −34, −35, −36, −37, −38, −39, and −40 ppm. The range of the absolute shift relative to a bare proton, wherein the shift of TMS is about −31.5 ppm relative to a bare proton, may be −(p28.01+p²2.56) ppm (Eq. (20)) within a range of about at least one of ±5 ppm, ±10 ppm, ±20 ppm, ±30 ppm, ±40 ppm, ±50 ppm, ±60 ppm, ±70 ppm, ±80 ppm, ±90 ppm, and +100 ppm. The range of the absolute shift relative to a bare proton may be −(p28.01+p²1.49×10⁻³) ppm (Eq. (20)) within a range of about at least one of about 0.1% to 99%, 1% to 50%, and 1% to 10%.

The vibrational energies, $E_{vib}$, for the v=0 to v=1 transition of hydrogen-type molecules $H_2(1/p)$ are $$E_{vib} = p^2 0.515902\ eV \tag{21}$$

where p is an integer.

The rotational energies, $E_{rot}$, for the J to J+1 transition of hydrogen-type molecules $H_2(1/p)$ are $$E_{rot} = E_{J+1} - E_J = \frac{\hbar^2}{I}[J + 1] = p^2(J + 1)0.01509\ eV \tag{22}$$

where p is an integer and I is the moment of inertia. Ro-vibrational emission of $H_2(\frac{1}{4})$ was observed on e-beam excited molecules in gases and trapped in solid matrix.

The p² dependence of the rotational energies results from an inverse p dependence of the internuclear distance and the corresponding impact on the moment of inertia I. The predicted internuclear distance 2c' for $H_2(1/p)$ is $$2c' = \frac{a_o\sqrt{2}}{p} \tag{23}$$

At least one of the rotational and vibration energies of $H_2(1/p)$ may be measured by at least one of electron-beam excitation emission spectroscopy, Raman spectroscopy, and Fourier transform infrared (FTIR) spectroscopy. $H_2(1/p)$ may be trapped in a matrix for measurement such as in at least one of MOH, MX, and $M_2CO_3$ (M=alkali; X=halide) matrix.

I. Catalysts $He^+$, $Ar^+$, $Sr^+$, Li, K, NaH, nH (n=integer), and $H_2O$ are predicted to serve as catalysts since they meet the catalyst criterion—a chemical or physical process with an enthalpy change equal to an integer multiple of the potential energy of atomic hydrogen, 27.2 eV. Specifically, a catalytic system is provided by the ionization of t electrons from an atom each to a continuum energy level such that the sum of the ionization energies of the t electrons is approximately m·27.2 eV where m is an integer. Moreover, further catalytic transitions may occur such as in the case wherein H(½) is first formed:

$$n = \frac{1}{2} \rightarrow \frac{1}{3}, \frac{1}{3} \rightarrow \frac{1}{4}, \frac{1}{4} \rightarrow \frac{1}{5},$$

and so on. Once catalysis begins, hydrinos autocatalyze further in a process called disproportionation wherein H or H(1/p) serves as the catalyst for another H or H(1/p') (p may equal p').

Hydrogen and hydrinos may serves as catalysts. Hydrogen atoms H(1/p) p=1, 2, 3, . . . 137 can undergo transitions to lower-energy states given by Eqs. (1) and (3) wherein the transition of one atom is catalyzed by a second that resonantly and nonradiatively accepts m·27.2 eV with a concomitant opposite change in its potential energy. The overall general equation for the transition of H(1/p) to H(1/(m+p)) induced by a resonance transfer of m·27.2 eV to H(1/p') is represented by Eq. (10). Thus, hydrogen atoms may serve as a catalyst wherein m=1, m=2, and m=3 for one, two, and three atoms, respectively, acting as a catalyst for another. The rate for the two- or three-atom-catalyst case would be appreciable only when the H density is high. But, high H densities are not uncommon. A high hydrogen atom concentration permissive of 2H or 3H serving as the energy acceptor for a third or fourth may be achieved under several circumstances such as on the surface of the Sun and stars due to the temperature and gravity driven density, on metal surfaces that support multiple monolayers, and in highly dissociated plasmas, especially pinched hydrogen plasmas. Additionally, a three-body H interaction is easily achieved when two H atoms arise with the collision of a hot H with $H_2$. This event can commonly occur in plasmas having a large population of extraordinarily fast H. This is evidenced by the unusual intensity of atomic H emission. In such cases, energy transfer can occur from a hydrogen atom to two others within sufficient proximity, being typically a few angstroms via multipole coupling. Then, the reaction between three hydrogen atoms whereby two atoms resonantly and nonradiatively accept 54.4 eV from the third hydrogen atom such that 2H serves as the catalyst is given by $$54.4 \text{ eV} + 2H + H \rightarrow 2H^+_{fast} + 2e^- + H * \left[\frac{a_H}{3}\right] + 54.4 \text{ eV} \quad (24)$$

$$H * \left[\frac{a_H}{3}\right] \rightarrow H * \left[\frac{a_H}{3}\right] + 54.4 \text{ eV} \quad (25)$$

$$2H^+_{fast} + 2e^- \rightarrow 2H + 54.4 \text{ eV} \quad (26)$$

And, the overall reaction is $$H \rightarrow H\left[\frac{a_H}{3}\right] + [3^2 - 1^2] \cdot 13.6 \text{ eV} \quad (27)$$

wherein $$H * \left[\frac{a_H}{3}\right]$$

has the radius of the hydrogen atom and a central field equivalent to 3 times that of a proton and $$H\left[\frac{a_H}{3}\right]$$

is the corresponding stable state with the radius of ⅓ that of H. As the electron undergoes radial acceleration from the radius of the hydrogen atom to a radius of ⅓ this distance, energy is released as characteristic light emission or as third-body kinetic energy.

In another H-atom catalyst reaction involving a direct transition to $$\left[\frac{a_H}{4}\right]$$

state, two hot $H_2$ molecules collide and dissociate such that three H atoms serve as a catalyst of 3·27.2 eV for the fourth. Then, the reaction between four hydrogen atoms whereby three atoms resonantly and nonradiatively accept 81.6 eV from the fourth hydrogen atom such that 3H serves as the catalyst is given by $$81.6 \text{ eV} + 3H + H \rightarrow 3H^+_{fast} + 3e^- + H * \left[\frac{a_H}{4}\right] + 81.6 \text{ eV} \quad (28)$$

$$H * \left[\frac{a_H}{4}\right] \rightarrow H\left[\frac{a_H}{4}\right] + 122.4 \text{ eV} \quad (29)$$

$$3H^+_{fast} + 3e^- \rightarrow 3H + 81.6 \text{ eV} \quad (30)$$

And, the overall reaction is $$H \rightarrow H\left[\frac{a_H}{4}\right] + [4^2 - 1^2] \cdot 13.6 \text{ eV} \quad (31)$$

The extreme-ultraviolet continuum radiation band due to the $$H * \left[\frac{a_H}{4}\right]$$

intermediate of Eq. (28) is predicted to have short wavelength cutoff at 122.4 eV (10.1 nm) and extend to longer wavelengths. This continuum band was confirmed experimentally. In general, the transition of H to $$H\left[\frac{a_H}{p=m+1}\right]$$

due by the acceptance of m·27.2 eV gives a continuum band with a short wavelength cutoff and energy $$E_{\left(H\to H\left[\frac{a_H}{p=m+1}\right]\right)}$$

given by $$E_{\left(H\to H\left[\frac{a_H}{p=m+1}\right]\right)} = m^2 \cdot 13.6 \text{ eV} \tag{32}$$

$$\lambda_{\left(H\to H\left[\frac{a_H}{p=m+1}\right]\right)} = \frac{91.2}{m^2}\text{nm} \tag{33}$$

and extending to longer wavelengths than the corresponding cutoff. The hydrogen emission series of 10.1 nm, 22.8 nm, and 91.2 nm continua were observed experimentally in interstellar medium, the Sun and white dwarf stars.

The potential energy of $H_2O$ is 81.6 eV (Eq. (43)) [Mills GUT]. Then, by the same mechanism, the nascent $H_2O$ molecule (not hydrogen bonded in solid, liquid, or gaseous state) may serve as a catalyst (Eqs. (44-47)). The continuum radiation band at 10.1 nm and going to longer wavelengths for theoretically predicted transitions of H to lower-energy, so called "hydrino" states, was observed only arising from pulsed pinched hydrogen discharges first at BlackLight Power, Inc. (BLP) and reproduced at the Harvard Center for Astrophysics (CfA). Continuum radiation in the 10 to 30 nm region that matched predicted transitions of H to hydrino states, were observed only arising from pulsed pinched hydrogen discharges with metal oxides that are thermodynamically favorable to undergo H reduction to form HOH catalyst; whereas, those that are unfavorable did not show any continuum even though the low-melting point metals tested are very favorable to forming metal ion plasmas with strong short-wavelength continua in more powerful plasma sources.

Alternatively, a resonant kinetic energy transfer to form fast H may occur consistent with the observation of extraordinary Balmer α line broadening corresponding to high-kinetic energy H. The energy transfer to two H also causes pumping of the catalyst excited states, and fast H is produced directly as given by exemplary Eqs. (24), (28), and (47) and by resonant kinetic energy transfer.

II. Hydrinos

A hydrogen atom having a binding energy given by $$\text{Binding Energy} = \frac{13.6 \text{ eV}}{\left(1/p\right)^2} \tag{34}$$

where p is an integer greater than 1, preferably from 2 to 137, is the product of the H catalysis reaction of the present disclosure. The binding energy of an atom, ion, or molecule, also known as the ionization energy, is the energy required to remove one electron from the atom, ion or molecule. A hydrogen atom having the binding energy given in Eq. (34) is hereafter referred to as a "hydrino atom" or "hydrino." The designation for a hydrino of radius $$\frac{a_H}{p},$$

where $a_H$ is the radius of an ordinary hydrogen atom and p is an integer, is $$H\left[\frac{a_H}{p}\right].$$

A hydrogen atom with a radius $a_H$ is hereinafter referred to as "ordinary hydrogen atom" or "normal hydrogen atom." Ordinary atomic hydrogen is characterized by its binding energy of 13.6 eV.

Hydrinos are formed by reacting an ordinary hydrogen atom with a suitable catalyst having a net enthalpy of reaction of $$m \cdot 27.2 \text{ eV} \tag{35}$$

where m is an integer. It is believed that the rate of catalysis is increased as the net enthalpy of reaction is more closely matched to m·27.2 eV. It has been found that catalysts having a net enthalpy of reaction within ±10%, preferably ±5%, of m·27.2 eV are suitable for most applications.

This catalysis releases energy from the hydrogen atom with a commensurate decrease in size of the hydrogen atom, $r_n=na_H$. For example, the catalysis of H(n=1) to H(n=½) releases 40.8 eV, and the hydrogen radius decreases from $a_H$ to $$\frac{1}{2}a_H.$$

A catalytic system is provided by the ionization of t electrons from an atom each to a continuum energy level such that the sum of the ionization energies of the t electrons is approximately m·27.2 eV where m is an integer. As a power source, the energy given off during catalysis is much greater than the energy lost to the catalyst. The energy released is large as compared to conventional chemical reactions. For example, when hydrogen and oxygen gases undergo combustion to form water $$H_2(g)+\frac{1}{2}O_2(g) \to H_2O(l) \tag{26}$$

the known enthalpy of formation of water is $\Delta H_f=-286$ kJ/mole or 1.48 eV per hydrogen atom. By contrast, each (n=1) ordinary hydrogen atom undergoing catalysis releases a net of 40.8 eV. Moreover, further catalytic transitions may occur:

$$n = \frac{1}{2} \to \frac{1}{3}, \frac{1}{3} \to \frac{1}{4}, \frac{1}{4} \to \frac{1}{5},$$

and so on. Once catalysis begins, hydrinos autocatalyze further in a process called disproportionation. This mechanism is similar to that of an inorganic ion catalysis. But, hydrino catalysis should have a higher reaction rate than that of the inorganic ion catalyst due to the better match of the enthalpy to m·27.2 eV.

III. Hydrino Catalysts and Hydrino Products

Hydrogen catalysts capable of providing a net enthalpy of reaction of approximately m·27.2 eV where m is an integer to produce a hydrino (whereby t electrons are ionized from an atom or ion) are given in TABLE 1. The atoms or ions given in the first column are ionized to provide the net enthalpy of reaction of m·27.2 eV given in the tenth column where m is given in the eleventh column. The electrons, that participate in ionization are given with the ionization potential (also called ionization energy or binding energy). The ionization potential of the nth electron of the atom or ion is designated by $IP_n$ and is given by the CRC. That is for example, $Li+5.39172$ eV$\rightarrow Li^{+}+e^{-}$ and $Li^{+}+75.6402$ eV$\rightarrow Li^{2+}+e^{-}$. The first ionization potential, $IP_1=5.39172$ eV, and the second ionization potential, $IP_2=75.6402$ eV, are given in the second and third columns, respectively. The net enthalpy of reaction for the double ionization of Li is 81.0319 eV as given in the tenth column, and m=3 in Eq. (5) as given in the eleventh column.

TABLE 1

| | | | | | Hydrogen Catalysts. | | | | | |
|---|---|---|---|---|---|---|---|---|---|---|
| Catalyst | IP1 | IP2 | IP3 | IP4 | IP5 | IP6 | IP7 | IP8 | Enthalpy | m |
| Li | 5.39172 | 75.6402 | | | | | | | 81.032 | 3 |
| Be | 9.32263 | 18.2112 | | | | | | | 27.534 | 1 |
| Mg | 7.646235 | 15.03527 | 80.1437 | 109.2655 | 141.27 | | | | 353.3607 | 13 |
| K | 4.34066 | 31.63 | 45.806 | | | | | | 81.777 | 3 |
| Ca | 6.11316 | 11.8717 | 50.9131 | 67.27 | | | | | 136.17 | 5 |
| Ti | 6.8282 | 13.5755 | 27.4917 | 43.267 | 99.3 | | | | 190.46 | 7 |
| V | 6.7463 | 14.66 | 29.311 | 46.709 | 65.2817 | | | | 162.71 | 6 |
| Cr | 6.76664 | 16.4857 | 30.96 | | | | | | 54.212 | 2 |
| Mn | 7.43402 | 15.64 | 33.668 | 51.2 | | | | | 107.94 | 4 |
| Fe | 7.9024 | 16.1878 | 30.652 | | | | | | 54.742 | 2 |
| Fe | 7.9024 | 16.1878 | 30.652 | 54.8 | | | | | 109.54 | 4 |
| Co | 7.881 | 17.083 | 33.5 | 51.3 | | | | | 109.76 | 4 |
| Co | 7.881 | 17.083 | 33.5 | 51.3 | 79.5 | | | | 189.26 | 7 |
| Ni | 7.6398 | 18.1688 | 35.19 | 54.9 | 76.06 | | | | 191.96 | 7 |
| Ni | 7.6398 | 18.1688 | 35.19 | 54.9 | 76.06 | 108 | | | 299.96 | 11 |
| Cu | 7.72638 | 20.2924 | | | | | | | 28.019 | 1 |
| Zn | 9.39405 | 17.9644 | | | | | | | 27.358 | 1 |
| Zn | 9.39405 | 17.9644 | 39.723 | 59.4 | 82.6 | 108 | 134 | 174 | 625.08 | 23 |
| Ga | 5.999301 | 20.51514 | | | | | | | 26.5144 | 1 |
| As | 9.8152 | 18.633 | 28.351 | 50.13 | 62.63 | 127.6 | | | 297.16 | 11 |
| Se | 9.75238 | 21.19 | 30.8204 | 42.945 | 68.3 | 81.7 | 155.4 | | 410.11 | 15 |
| Kr | 13.9996 | 24.3599 | 36.95 | 52.5 | 64.7 | 78.5 | | | 271.01 | 10 |
| Kr | 13.9996 | 24.3599 | 36.95 | 52.5 | 64.7 | 78.5 | 111 | | 382.01 | 14 |
| Rb | 4.17713 | 27.285 | 40 | 52.6 | 71 | 84.4 | 99.2 | | 378.66 | 14 |
| Rb | 4.17713 | 27.285 | 40 | 52.6 | 71 | 84.4 | 99.2 | 136 | 514.66 | 19 |
| Sr | 5.69484 | 11.0301 | 42.89 | 57 | 71.6 | | | | 188.21 | 7 |
| Nb | 6.75885 | 14.32 | 25.04 | 38.3 | 50.55 | | | | 134.97 | 5 |
| Mo | 7.09243 | 16.16 | 27.13 | 46.4 | 54.49 | 68.8276 | | | 220.10 | 8 |
| Mo | 7.09243 | 16.16 | 27.13 | 46.4 | 54.49 | 68.8276 | 125.664 | 143.6 | 489.36 | 18 |
| Ru | 7.3605 | 16.76 | 28.47 | 50 | 60 | | | | 162.5905 | 6 |
| Pd | 8.3369 | 19.43 | | | | | | | 27.767 | 1 |
| Sn | 7.34381 | 14.6323 | 30.5026 | 40.735 | 72.28 | | | | 165.49 | 6 |
| Te | 9.0096 | 18.6 | | | | | | | 27.61 | 1 |
| Te | 9.0096 | 18.6 | 27.96 | | | | | | 55.57 | 2 |
| Cs | 3.8939 | 23.1575 | | | | | | | 27.051 | 1 |
| Ba | 5.211664 | 10.00383 | 35.84 | 49 | 62 | | | | 162.0555 | 6 |
| Ba | 5.21 | 10 | 37.3 | | | | | | | |
| Ce | 5.5387 | 10.85 | 20.198 | 36.758 | 65.55 | | | | 138.89 | 5 |
| Ce | 5.5387 | 10.85 | 20.198 | 36.758 | 65.55 | 77.6 | | | 216.49 | 8 |
| Pr | 5.464 | 10.55 | 21.624 | 38.98 | 57.53 | | | | 134.15 | 5 |
| Sm | 5.6437 | 11.07 | 23.4 | 41.4 | | | | | 81.514 | 3 |
| Gd | 6.15 | 12.09 | 20.63 | 44 | | | | | 82.87 | 3 |
| Dy | 5.9389 | 11.67 | 22.8 | 41.47 | | | | | 81.879 | 3 |
| Pb | 7.41666 | 15.0322 | 31.9373 | | | | | | 54.386 | 2 |
| Pt | 8.9587 | 18.563 | | | | | | | 27.522 | 1 |
| He$^+$ | | 54.4178 | | | | | | | 54.418 | 2 |
| Na$^+$ | | 47.2864 | 71.6200 | 98.91 | | | | | 217.816 | 8 |
| Mg$^{2+}$ | | | 80.1437 | | | | | | 80.1437 | 3 |
| Rb$^+$ | | 27.285 | | | | | | | 27.285 | 1 |
| Fe$^{3+}$ | | | | | 54.8 | | | | 54.8 | 2 |
| Mo$^{2+}$ | | | 27.13 | | | | | | 27.13 | 1 |
| Mo$^{4+}$ | | | | | 54.49 | | | | 54.49 | 2 |
| In$^{3+}$ | | | | 54 | | | | | 54 | 2 |
| Ar$^+$ | | 27.62 | | | | | | | 27.62 | 1 |
| Sr$^+$ | | 11.03 | 42.89 | | | | | | 53.92 | 2 |

The hydrino hydride ion of the present disclosure can be formed by the reaction of an electron source with a hydrino, that is, a hydrogen atom having a binding energy of about $$\frac{13.6 \text{ eV}}{n^2},$$

where $$n = \frac{1}{p}$$

and p is an integer greater than 1. The hydrino hydride ion is represented by $$H^-\left(n = 1/p\right)$$

or $$H^-(1/p):$$

$$H\left[\frac{a_H}{p}\right] + e^- \rightarrow H^-\left(n = 1/p\right) \tag{37}$$

$$H\left[\frac{a_H}{p}\right] + e^- \rightarrow H^-(1/p). \tag{38}$$

The hydrino hydride ion is distinguished from an ordinary hydride ion comprising an ordinary hydrogen nucleus and two electrons having a binding energy of about 0.8 eV. The latter is hereafter referred to as "ordinary hydride ion" or "normal hydride ion." The hydrino hydride ion comprises a hydrogen nucleus including protium, deuterium, or tritium, and two indistinguishable electrons at a binding energy according to Eqs. (39) and (40).

The binding energy of a hydrino hydride ion can be represented by the following formula:

$$ \tag{39} $$

$$ \text{Binding Energy} = $$

$$ \frac{\hbar^2\sqrt{s(s+1)}}{8\mu_e a_0^2\left[\frac{1+\sqrt{s(s+1)}}{p}\right]^2} - \frac{\pi\mu_0 e^2\hbar^2}{m_e^2}\left(\frac{1}{a_H^3} + \frac{2^2}{a_0^3\left[\frac{1+\sqrt{s(s+1)}}{p}\right]^3}\right) $$

where p is an integer greater than one, s=½, π is pi, $\hbar$ is Planck's constant bar, $\mu_o$ is the permeability of vacuum, $m_e$ is the mass of the electron, $\mu_e$ is the reduced electron mass given by $$ \mu_e = \frac{m_e m_p}{\frac{m_e}{\sqrt{\frac{3}{4}}} + m_p} $$

where $m_p$ is the mass of the proton, $a_H$ is the radius of the hydrogen atom, $a_o$ is the Bohr radius, and e is the elementary charge. The radii are given by $$r_2 = r_1 = a_0\left(1 + \sqrt{s(s+1)}\right); \tag{40}$$

$$s = \frac{1}{2}.$$

The binding energies of the hydrino hydride ion, $H^-(n=1/p)$ as a function of p, where p is an integer, are shown in TABLE 2.

TABLE 2

| The representative binding energy of the hydrino hydride ion $H^-(n = 1/p)$ as a function of p, Eq. (39). | | | |
|---|---|---|---|
| Hydride Ion | $r_1(\alpha_o)^a$ | Binding Energy (eV)$^b$ | Wavelength (nm) |
| $H^-(n = 1)$ | 1.8660 | 0.7542 | 1644 |
| $H^-(n = 1/2)$ | 0.9330 | 3.047 | 406.9 |
| $H^-(n = 1/3)$ | 0.6220 | 6.610 | 187.6 |
| $H^-(n = 1/4)$ | 0.4665 | 11.23 | 110.4 |
| $H^-(n = 1/5)$ | 0.3732 | 16.70 | 74.23 |
| $H^-(n = 1/6)$ | 0.3110 | 22.81 | 54.35 |
| $H^-(n = 1/7)$ | 0.2666 | 29.34 | 42.25 |
| $H^-(n = 1/8)$ | 0.2333 | 36.09 | 34.46 |
| $H^-(n = 1/9)$ | 0.2073 | 42.84 | 28.94 |
| $H^-(n = 1/10)$ | 0.1866 | 49.38 | 25.11 |
| $H^-(n = 1/11)$ | 0.1696 | 55.50 | 22.34 |
| $H^-(n = 1/12)$ | 0.1555 | 60.98 | 20.33 |
| $H^-(n = 1/13)$ | 0.1435 | 65.63 | 18.89 |
| $H^-(n = 1/14)$ | 0.1333 | 69.22 | 17.91 |
| $H^-(n = 1/15)$ | 0.1244 | 71.55 | 17.33 |
| $H^-(n = 1/16)$ | 0.1166 | 72.40 | 17.12 |
| $H^-(n = 1/17)$ | 0.1098 | 71.56 | 17.33 |
| $H^-(n = 1/18)$ | 0.1037 | 68.83 | 18.01 |
| $H^-(n = 1/19)$ | 0.0982 | 63.98 | 19.38 |
| $H^-(n = 1/20)$ | 0.0933 | 56.81 | 21.82 |
| $H^-(n = 1/21)$ | 0.0889 | 47.11 | 26.32 |
| $H^-(n = 1/22)$ | 0.0848 | 34.66 | 35.76 |
| $H^-(n = 1/23)$ | 0.0811 | 19.26 | 64.36 |
| $H^-(n = 1/24)$ | 0.0778 | 0.6945 | 1785 |

$^a$Eq. (40)
$^b$Eq. (39)

According to the present disclosure, a hydrino hydride ion ($H^-$) having a binding energy according to Eqs. (39) and (40) that is greater than the binding of ordinary hydride ion (about 0.75 eV) for p=2 up to 23, and less for p=24 ($H^-$) is provided. For p=2 to p=24 of Eqs. (39) and (40), the hydride ion binding energies are respectively 3, 6.6, 11.2, 16.7, 22.8, 29.3, 36.1, 42.8, 49.4, 55.5, 61.0, 65.6, 69.2, 71.6, 72.4, 71.6, 68.8, 64.0, 56.8, 47.1, 34.7, 19.3, and 0.69 eV. Exemplary compositions comprising the novel hydride ion are also provided herein.

Exemplary compounds are also provided comprising one or more hydrino hydride ions and one or more other elements. Such a compound is referred to as a "hydrino hydride compound."

Ordinary hydrogen species are characterized by the following binding energies (a) hydride ion, 0.754 eV ("ordinary hydride ion"); (b) hydrogen atom ("ordinary hydrogen atom"), 13.6 eV; (c) diatomic hydrogen molecule, 15.3 eV ("ordinary hydrogen molecule"); (d) hydrogen molecular ion, 16.3 eV ("ordinary hydrogen molecular ion"); and (e) $H_3^+$, 22.6 eV ("ordinary trihydrogen molecular ion"). Herein, with reference to forms of hydrogen, "normal" and "ordinary" are synonymous.

According to a further embodiment of the present disclosure, a compound is provided comprising at least one increased binding energy hydrogen species such as (a) a hydrogen atom having a binding energy of about $$\frac{13.6 \text{ eV}}{\left(\frac{1}{p}\right)^2},$$

such as within a range of about 0.9 to 1.1 times $$\frac{13.6 \text{ eV}}{\left(\frac{1}{p}\right)^2}$$

where p is an integer from 2 to 137; (b) a hydride ion $(H^-)$ having a binding energy of about Binding Energy =

$$\frac{\hbar^2\sqrt{s(s+1)}}{8\mu_e a_0^2\left[1+\frac{\sqrt{s(s+1)}}{p}\right]^2} - \frac{\pi\mu_0 e^2 \hbar^2}{m_e^2}\left(\frac{1}{a_H^3} + \frac{2^2}{a_0^3\left[1+\frac{\sqrt{s(s+1)}}{p}\right]^3}\right),$$

such as within a range of about 0.9 to 1.1 times the binding energy, where p is an integer from 2 to 24;

(c) $H_4^+(1/p)$;

(d) a trihydrino molecular ion, $$H_3^+(1/p),$$

having a binding energy of about $$\frac{22.6 \text{ eV}}{\left(\frac{1}{p}\right)^2}$$

such as within a range of about 0.9 to 1.1 times $$\frac{22.6 \text{ eV}}{\left(\frac{1}{p}\right)^2}$$

where p is an integer from 2 to 137; (e) a dihydrino having a binding energy of about $$\frac{15.3 \text{ eV}}{\left(\frac{1}{p}\right)^2}$$

such as within a range of about 0.9 to 1.1 times $$\frac{15.3 \text{ eV}}{\left(\frac{1}{p}\right)^2}$$

where p is an integer from 2 to 137; (f) a dihydrino molecular ion with a binding energy of about 1p;-1p $$\frac{16.3 \text{ eV}}{\left(\frac{1}{p}\right)^2}$$

such as within a range of about 0.9 to 1.1 times $$\frac{16.3 \text{ eV}}{\left(\frac{1}{p}\right)^2}$$

where p is an integer, preferably an integer from 2 to 137.

According to a further embodiment of the present disclosure, a compound is provided comprising at least one increased binding energy hydrogen species such as (a) a dihydrino molecular ion having a total energy of about $$E_T = \tag{41}$$

$$-p^2\left\{\frac{e^2}{8\pi\varepsilon_o a_0}(4 \ln 3 - 1 - 2 \ln 3)\left[1 + p\sqrt{\frac{2\hbar\sqrt{\frac{2e^2}{4\pi\varepsilon_o(2a_H)^3}}}{m_e c^2}}\right]\right\} =$$

$$-\frac{1}{2}\hbar\sqrt{\frac{\frac{pe^2}{4\pi\varepsilon_o\left(\frac{2a_H}{p}\right)^3} - \frac{pe^2}{8\pi\varepsilon_o\left(\frac{3a_H}{p}\right)^3}}{\mu}}$$

$$-p^2 16.13392 \text{ eV} - p^3 0.118755 \text{ eV}$$

such as within a range of about 0.9 to 1.1 times the total energy $E_T$, where p is an integer, $\hbar$ is Planck's constant bar, $m_e$ is the mass of the electron, c is the speed of light in vacuum, and $\mu$ is the reduced nuclear mass, and (b) a dihydrino molecule having a total energy of about $$E_T = -p^2\left\{\frac{e^2}{8\pi\varepsilon_o a_0}\left[\left(2\sqrt{2} - \sqrt{2} + \frac{\sqrt{2}}{2}\right)\ln\frac{\sqrt{2}+1}{\sqrt{2}-1} - \sqrt{2}\right]\left[1 + p\sqrt{\frac{2\hbar\sqrt{\frac{e^2}{4\pi\varepsilon_o a_0^3}}}{m_e c^2}}\right]\right\} = \tag{42}$$

$$-\frac{1}{2}\hbar\sqrt{\frac{\frac{pe^2}{8\pi\varepsilon_o\left(\frac{a_0}{p}\right)^3} - \frac{pe^2}{8\pi\varepsilon_o\left(\frac{\left(1+\frac{1}{\sqrt{2}}\right)a_0}{p}\right)^3}}{\mu}}$$

$$-p^2 31.351 \text{ eV} - p^3 0.326469 \text{ eV}$$

such as within a range of about 0.9 to 1.1 times $E_T$, where p is an integer and $a_o$ is the Bohr radius.

According to one embodiment of the present disclosure wherein the compound comprises a negatively charged increased binding energy hydrogen species, the compound further comprises one or more cations, such as a proton, ordinary $$H_2^+,$$

or ordinary $$H_3^+.$$

A method is provided herein for preparing compounds comprising at least one hydrino hydride ion. Such compounds are hereinafter referred to as "hydrino hydride compounds." The method comprises reacting atomic hydrogen with a catalyst having a net enthalpy of reaction of about $$\frac{m}{2} \cdot 27 \text{ eV},$$

where m is an integer greater than 1, preferably an integer less than 400, to produce an increased binding energy hydrogen atom having a binding energy of about $$\frac{13.6 \text{ eV}}{\left(\frac{1}{p}\right)^2}$$

where p is an integer, preferably an integer from 2 to 137. A further product of the catalysis is energy. The increased binding energy hydrogen atom can be reacted with an electron source, to produce an increased binding energy hydride ion. The increased binding energy hydride ion can be reacted with one or more cations to produce a compound comprising at least one increased binding energy hydride ion.

The novel hydrogen compositions of matter can comprise:
(a) at least one neutral, positive, or negative hydrogen species (hereinafter "increased binding energy hydrogen species") having a binding energy
  (i) greater than the binding energy of the corresponding ordinary hydrogen species, or
  (ii) greater than the binding energy of any hydrogen species for which the corresponding ordinary hydrogen species is unstable or is not observed because the ordinary hydrogen species' binding energy is less than thermal energies at ambient conditions (standard temperature and pressure, STP), or is negative; and
(b) at least one other element. The compounds of the present disclosure are hereinafter referred to as "increased binding energy hydrogen compounds."

By "other element" in this context is meant an element other than an increased binding energy hydrogen species. Thus, the other element can be an ordinary hydrogen species, or any element other than hydrogen. In one group of compounds, the other element and the increased binding energy hydrogen species are neutral. In another group of compounds, the other element and increased binding energy hydrogen species are charged such that the other element provides the balancing charge to form a neutral compound. The former group of compounds is characterized by molecular and coordinate bonding; the latter group is characterized by ionic bonding.

Also provided are novel compounds and molecular ions comprising
(a) at least one neutral, positive, or negative hydrogen species (hereinafter "increased binding energy hydrogen species") having a total energy
  (i) greater than the total energy of the corresponding ordinary hydrogen species, or
  (ii) greater than the total energy of any hydrogen species for which the corresponding ordinary hydrogen species is unstable or is not observed because the ordinary hydrogen species' total energy is less than thermal energies at ambient conditions, or is negative; and
(b) at least one other element.

The total energy of the hydrogen species is the sum of the energies to remove all of the electrons from the hydrogen species. The hydrogen species according to the present disclosure has a total energy greater than the total energy of the corresponding ordinary hydrogen species. The hydrogen species having an increased total energy according to the present disclosure is also referred to as an "increased binding energy hydrogen species" even though some embodiments of the hydrogen species having an increased total energy may have a first electron binding energy less that the first electron binding energy of the corresponding ordinary hydrogen species. For example, the hydride ion of Eqs. (39) and (40) for p=24 has a first binding energy that is less than the first binding energy of ordinary hydride ion, while the total energy of the hydride ion of Eqs. (39) and (40) for p=24 is much greater than the total energy of the corresponding ordinary hydride ion.

Also provided herein are novel compounds and molecular ions comprising
(a) a plurality of neutral, positive, or negative hydrogen species (hereinafter "increased binding energy hydrogen species") having a binding energy
  (i) greater than the binding energy of the corresponding ordinary hydrogen species, or
  (ii) greater than the binding energy of any hydrogen species for which the corresponding ordinary hydrogen species is unstable or is not observed because the ordinary hydrogen species' binding energy is less than thermal energies at ambient conditions or is negative; and
(b) optionally one other element. The compounds of the present disclosure are hereinafter referred to as "increased binding energy hydrogen compounds."

The increased binding energy hydrogen species can be formed by reacting one or more hydrino atoms with one or more of an electron, hydrino atom, a compound containing at least one of said increased binding energy hydrogen species, and at least one other atom, molecule, or ion other than an increased binding energy hydrogen species.

Also provided are novel compounds and molecular ions comprising
(a) a plurality of neutral, positive, or negative hydrogen species (hereinafter "increased binding energy hydrogen species") having a total energy
  (i) greater than the total energy of ordinary molecular hydrogen, or (ii) greater than the total energy of any hydrogen species for which the corresponding ordinary hydrogen species is unstable or is not observed because the ordinary hydrogen species' total energy is less than thermal energies at ambient conditions or is negative; and (b) optionally one other element. The compounds of the present disclosure are hereinafter referred to as "increased binding energy hydrogen compounds."

In an embodiment, a compound is provided comprising at least one increased binding energy hydrogen species chosen from (a) hydride ion having a binding energy according to Eqs. (39) and (40) that is greater than the binding of ordinary hydride ion (about 0.8 eV) for p=2 up to 23, and less for p=24 ("increased binding energy hydride ion" or "hydrino hydride ion"); (b) hydrogen atom having a binding energy greater than the binding energy of ordinary hydrogen atom (about 13.6 eV) ("increased binding energy hydrogen atom" or "hydrino"); (c) hydrogen molecule having a first binding energy greater than about 15.3 eV ("increased binding energy hydrogen molecule" or "dihydrino"); and (d) molecular hydrogen ion having a binding energy greater than about 16.3 eV ("increased binding energy molecular hydrogen ion" or "dihydrino molecular ion"). In the present disclosure, increased binding energy hydrogen species and compounds is also referred to as lower-energy hydrogen species and compounds. Hydrinos comprise an increased binding energy hydrogen species or equivalently a lower-energy hydrogen species.

IV. Additional MH-Type Catalysts and Reactions

In general, MH type hydrogen catalysts to produce hydrinos provided by the breakage of the M-H bond plus the $m \cdot 27.2$ eV where m is an integer are given in TABLE 3A. Each MH catalyst is given in the first column and the corresponding M-H bond energy is given in column two. The atom M of the MH species given in the first column is ionized to provide the net enthalpy of reaction of $m \cdot 27.2$ eV with the addition of the bond energy in column two. The enthalpy of the catalyst is given in the eighth column where m is given in the ninth column. The electrons that participate in ionization are given with the ionization potential (also called ionization energy or binding energy). For example, the bond energy of NaH, 1.9245 eV, is given in column two. The ionization potential of the nth electron of the atom or ion is designated by $IP_n$ and is given by the CRC. That is for example, $Na + 5.13908$ eV $\rightarrow Na^+ + e^-$ and $Na^+ + 47.2864$ eV $\rightarrow Na^{2+} + e^-$. The first ionization potential, $IP_1 = 5.13908$ eV, and the second ionization potential, $IP_2 = 47.2864$ eV, are given in the second and third columns, respectively. The net enthalpy of reaction for the breakage of the NaH bond and the double ionization of Na is 54.35 eV as given in the eighth column, and m=2 in Eq. (35) as given in the ninth column. The bond energy of BaH is 1.98991 eV and $IP_1$, $IP_2$, and $IP_3$ are 5.2117 eV, 10.00390 eV, and 37.3 eV, respectively. The net enthalpy of reaction for the breakage of the BaH bond and the triple ionization of Ba is 54.5 eV as given in the eighth column, and m=2 in Eq. (35) as given in the ninth column. The bond energy of SrH is 1.70 eV and $IP_1$, $IP_2$, $IP_3$, $IP_4$, and $IP_5$ are 5.69484 eV, 11.03013 eV, 42.89 eV, 57 eV, and 71.6 eV, respectively. The net enthalpy of reaction for the breakage of the SrH bond and the ionization of Sr to $Sr^{5+}$ is 190 eV as given in the eighth column, and m=7 in Eq. (35) as given in the ninth column.

TABLE 3A

| | MH type hydrogen catalysts capable of providing a net enthalpy of reaction of approximately $m \cdot 27.2$ eV. Energies are in eV. | | | | | | | |
|---|---|---|---|---|---|---|---|---|
| Catalyst | M-H Bond Energy | $IP_1$ | $IP_2$ | $IP_3$ | $IP_4$ | $IP_5$ | Enthalpy | m |
| AlH | 2.98 | 5.985768 | 18.82855 | | | | 27.79 | 1 |
| AsH | 2.84 | 9.8152 | 18.633 | 28.351 | 50.13 | | 109.77 | 4 |
| BaH | 1.99 | 5.21170 | 10.00390 | 37.3 | | | 54.50 | 2 |
| BiH | 2.936 | 7.2855 | 16.703 | | | | 26.92 | 1 |
| CdH | 0.72 | 8.99367 | 16.90832 | | | | 26.62 | 1 |
| ClH | 4.4703 | 12.96763 | 23.8136 | 39.61 | | | 80.86 | 3 |
| CoH | 2.538 | 7.88101 | 17.084 | | | | 27.50 | 1 |
| GeH | 2.728 | 7.89943 | 15.93461 | | | | 26.56 | 1 |
| InH | 2.520 | 5.78636 | 18.8703 | | | | 27.18 | 1 |
| NaH | 1.925 | 5.139076 | 47.2864 | | | | 54.35 | 2 |
| NbH | 2.30 | 6.75885 | 14.32 | 25.04 | 38.3 | 50.55 | 137.26 | 5 |
| OH | 4.4556 | 13.61806 | 35.11730 | | | | 53.3 | 2 |
| OH | 4.4556 | 13.61806 | 35.11730 | 54.9355 | | | 108.1 | 4 |
| OH | 4.4556 | 13.61806 + 13.6 KE | 35.11730 + 13.6 KE | | | | 80.39 | 3 |
| RhH | 2.50 | 7.4589 | 18.08 | | | | 28.0 | 1 |
| RuH | 2.311 | 7.36050 | 16.76 | | | | 26.43 | 1 |
| SH | 3.67 | 10.36001 | 23.3379 | 34.79 | 47.222 | 72.5945 | 191.97 | 7 |
| SbH | 2.484 | 8.60839 | 16.63 | | | | 27.72 | 1 |
| SeH | 3.239 | 9.75239 | 21.19 | 30.8204 | 42.9450 | | 107.95 | 4 |
| SiH | 3.040 | 8.15168 | 16.34584 | | | | 27.54 | 1 |
| SnH | 2.736 | 7.34392 | 14.6322 | 30.50260 | | | 55.21 | 2 |
| SrH | 1.70 | 5.69484 | 11.03013 | 42.89 | 57 | 71.6 | 190 | 7 |
| TlH | 2.02 | 6.10829 | 20.428 | | | | 28.56 | 1 | ionization of t electrons from the atom M each to a continuum energy level such that the sum of the bond energy and ionization energies of the t electrons is approximately In other embodiments, MH⁻ type hydrogen catalysts to produce hydrinos provided by the transfer of an electron to an acceptor A, the breakage of the M-H bond plus the ionization of t electrons from the atom M each to a continuum energy level such that the sum of the electron transfer energy comprising the difference of electron affinity (EA) of MH and A, M-H bond energy, and ionization energies of the t electrons from M is approximately m·27.2 eV where m is an integer are given in TABLE 3B. Each MH⁻ catalyst, the acceptor A, the electron affinity of MH, the electron affinity of A, and the M-H bond energy, are is given in the first, second, third and fourth columns, respectively. The electrons of the corresponding atom M of MH that participate in ionization are given with the ionization potential (also called ionization energy or binding energy) in the subsequent columns and the enthalpy of the catalyst and the corresponding integer m are given in the last column. For example, the electron affinities of OH and H are 1.82765 eV and 0.7542 eV, respectively, such that the electron transfer energy is 1.07345 eV as given in the fifth column. The bond energy of OH is 4.4556 eV is given in column six. The ionization potential of the nth electron of the atom or ion is designated by $IP_n$. That is for example, O+13.61806 eV→O⁺+e⁻ and O⁺+35.11730 eV→O²⁺+e⁻. The first ionization potential, $IP_1=13.61806$ eV, and the second ionization potential, $IP_2=35.11730$ eV, are given in the seventh and eighth columns, respectively. The net enthalpy of the electron transfer reaction, the breakage of the OH bond, and the double ionization of O is 54.27 eV as given in the eleventh column, and m=2 in Eq. (35) as given in the twelfth column. In other embodiments, the catalyst for H to form hydrinos is provided by the ionization of a negative ion such that the sum of its EA plus the ionization energy of one or more electrons is approximately m·27.2 eV where m is an integer. Alternatively, the first electron of the negative ion may be transferred to an acceptor followed by ionization of at least one more electron such that the sum of the electron transfer energy plus the ionization energy of one or more electrons is approximately m·27.2 eV where m is an integer. The electron acceptor may be H.

rate of catalysis is increased as the net enthalpy of reaction is more closely matched to m·27.2 eV. It has been found that catalysts having a net enthalpy of reaction within ±10%, preferably ±5%, of m 27.2 eV are suitable for most applications. In the case of the catalysis of hydrino atoms to lower energy states, the enthalpy of reaction of m·27.2 eV (Eq. (5)) is relativistically corrected by the same factor as the potential energy of the hydrino atom. In an embodiment, the catalyst resonantly and radiationless accepts energy from atomic hydrogen. In an embodiment, the accepted energy decreases the magnitude of the potential energy of the catalyst by about the amount transferred from atomic hydrogen. Energetic ions or electrons may result due to the conservation of the kinetic energy of the initially bound electrons. At least one atomic H serves as a catalyst for at least one other wherein the 27.2 eV potential energy of the acceptor is cancelled by the transfer or 27.2 eV from the donor H atom being catalyzed. The kinetic energy of the acceptor catalyst H may be conserved as fast protons or electrons. Additionally, the intermediate state (Eq. (7)) formed in the catalyzed H decays with the emission of continuum energy in the form of radiation or induced kinetic energy in a third body. These energy releases may result in current flow in the CIHT cell of the present disclosure.

In an embodiment, at least one of a molecule or positively or negatively charged molecular ion serves as a catalyst that accepts about m27.2 eV from atomic H with a decrease in the magnitude of the potential energy of the molecule or positively or negatively charged molecular ion by about m27.2 eV. For example, the potential energy of $H_2O$ given in Mills GUTCP is $$V_e = \left(\frac{3}{2}\right)\frac{-2e^2}{8\pi\varepsilon_0\sqrt{a^2-b^2}}\ln\frac{a+\sqrt{a^2-b^2}}{a-\sqrt{a^2-b^2}} = -81.8715 \text{ eV} \qquad (43)$$

TABLE 3B

| | | | | | M-H | | | | | | |
| Catalyst | Acceptor (A) | EA (MH) | EA (A) | Electron Transfer | Bond Energy | $IP_1$ | $IP_2$ | $IP_3$ | $IP_4$ | Enthalpy | m |
|---|---|---|---|---|---|---|---|---|---|---|---|
| OH⁻ | H | 1.82765 | 0.7542 | 1.07345 | 4.4556 | 13.61806 | 35.11730 | | | 54.27 | 2 |
| SiH⁻ | H | 1.277 | 0.7542 | 0.5228 | 3.040 | 8.15168 | 16.34584 | | | 28.06 | 1 |
| CoH⁻ | H | 0.671 | 0.7542 | −0.0832 | 2.538 | 7.88101 | 17.084 | | | 27.42 | 1 |
| NiH⁻ | H | 0.481 | 0.7542 | −0.2732 | 2.487 | 7.6398 | 18.16884 | | | 28.02 | 1 |
| SeH⁻ | H | 2.2125 | 0.7542 | 1.4583 | 3.239 | 9.75239 | 21.19 | 30.8204 | 42.9450 | 109.40 | 4 |

TABLE 3B caption: MH⁻ type hydrogen catalysts capable of providing a net enthalpy of reaction of approximately m · 27.2 eV. Energies are in eV.

In other embodiments, MH⁺ type hydrogen catalysts to produce hydrinos are provided by the transfer of an electron from an donor A which may be negatively charged, the breakage of the M-H bond, and the ionization of t electrons from the atom M each to a continuum energy level such that the sum of the electron transfer energy comprising the difference of ionization energies of MH and A, bond M-H energy, and ionization energies of the t electrons from M is approximately m·27.2 eV where m is an integer.

In an embodiment, the catalyst comprises any species such as an atom, positively or negatively charged ion, positively or negatively charged molecular ion, molecule, excimer, compound, or any combination thereof in the ground or excited state that is capable of accepting energy of m·27.2 eV, m=1, 2, 3, 4, . . . (Eq. (5)). It is believed that the A molecule that accepts m·27.2 eV from atomic H with a decrease in the magnitude of the potential energy of the molecule by the same energy may serve as a catalyst. For example, the catalysis reaction (m=3) regarding the potential energy of $H_2O$ is $$81.6 \text{ eV} + H_2O + H[a_H] \rightarrow 2H_{fast}^+ + O^- + e^- + H*\left[\frac{a_H}{4}\right] + 81.6 \text{ eV} \qquad (44)$$

$$H*\left[\frac{a_H}{4}\right] \rightarrow H\left[\frac{a_H}{4}\right] + 122.4 \text{ eV} \qquad (45)$$

$$2H_{fast}^+ + O^- + e^- \rightarrow H_2O + 81.6 \text{ eV} \qquad (46)$$

And, the overall reaction is $$H[a_H] \rightarrow H\left[\frac{a_H}{4}\right] + 81.6 \text{ eV} + 122.4 \text{ eV} \qquad (47)$$

wherein $$H * \left[\frac{a_H}{4}\right]$$

has the radius of the hydrogen atom and a central field equivalent to 4 times that of a proton and $$H\left[\frac{a_H}{4}\right]$$

is the corresponding stable state with the radius of ¼ that of H. As the electron undergoes radial acceleration from the radius of the hydrogen atom to a radius of ¼ this distance, energy is released as characteristic light emission or as third-body kinetic energy. Based on the 10% energy change in the heat of vaporization in going from ice at 0° C. to water at 100° C., the average number of H bonds per water molecule in boiling water is 3.6. Thus, in an embodiment, $H_2O$ must be formed chemically as isolated molecules with suitable activation energy in order to serve as a catalyst to form hydrinos. In an embodiment, the $H_2O$ catalyst is nascent $H_2O$.

In an embodiment, at least one of nH, O, nO, $O_2$, OH, and $H_2O$ (n=integer) may serve as the catalyst. The product of H and OH as the catalyst may be H(⅕) wherein the catalyst enthalpy is about 108.8 eV. The product of the reaction of H and $H_2O$ as the catalyst may be H(¼). The hydrino product may further react to lower states. The product of H(¼) and H as the catalyst may be H(⅕) wherein the catalyst enthalpy is about 27.2 eV. The product of H(¼) and OH as the catalyst may be H(⅙) wherein the catalyst enthalpy is about 54.4 eV. The product of H(⅕) and H as the catalyst may be H(⅙) wherein the catalyst enthalpy is about 27.2 eV.

Additionally, OH may serve as a catalyst since the potential energy of OH is $$V_e = \left(\frac{3}{4}\right)\frac{-2e^2}{8\pi\varepsilon_0\sqrt{a^2-b^2}}\ln\frac{a+\sqrt{a^2-b^2}}{a-\sqrt{a^2-b^2}} = -40.92709 \text{ eV} \qquad (48)$$

The difference in energy between the H states p=1 and p=2 is 40.8 eV. Thus, OH may accept about 40.8 eV from H to serve as a catalyst to form H(½).

Similarly to $H_2O$, the potential energy of the amide functional group $NH_2$ given in Mills GUTCP is −78.77719 eV. From the CRC, $\Delta H$ for the reaction of $NH_2$ to form $KNH_2$ calculated from each corresponding $\Delta H_f$ is (−128.9-184.9) kJ/mole=−313.8 kJ/mole (3.25 eV). From the CRC, $\Delta H$ for the reaction of $NH_2$ to form $NaNH_2$ calculated from each corresponding $\Delta H_f$ is (−123.8-184.9) kJ/mole=−308.7 kJ/mole (3.20 eV). From the CRC, $\Delta H$ for the reaction of $NH_2$ to form $LiNH_2$ calculated from each corresponding $\Delta H_f$ is (−179.5-184.9) kJ/mole=−364.4 kJ/mole (3.78 eV). Thus, the net enthalpy that may be accepted by alkali amides $MNH_2$ (M=K, Na, Li) serving as H catalysts to form hydrinos are about 82.03 eV, 81.98 eV, and 82.56 eV (m=3 in Eq. (5)), respectively, corresponding to the sum of the potential energy of the amide group and the energy to form the amide from the amide group. The hydrino product such as molecular hydrino may cause an upfield matrix shift observed by means such as MAS NMR.

Similarly to $H_2O$, the potential energy of the $H_2S$ functional group given in Mills GUTCP is −72.81 eV. The cancellation of this potential energy also eliminates the energy associated with the hybridization of the 3p shell. This hybridization energy of 7.49 eV is given by the ratio of the hydride orbital radius and the initial atomic orbital radius times the total energy of the shell. Additionally, the energy change of the S3p shell due to forming the two S—H bonds of 1.10 eV is included in the catalyst energy. Thus, the net enthalpy of $H_2S$ catalyst is 81.40 eV (m=3 in Eq. (5)). $H_2S$ catalyst may be formed from MHS (M=alkali) by the reaction $$2MHS \text{ to } M_2S + H_2S \qquad (49)$$

This reversible reaction may form $H_2S$ in an active catalytic state in the transition state to product $H_2S$ that may catalyze H to hydrino. The reaction mixture may comprise reactants that form $H_2S$ and a source of atomic H. The hydrino product such as molecular hydrino may cause an upfield matrix shift observed by means such as MAS NMR.

Furthermore, atomic oxygen is a special atom with two unpaired electrons at the same radius equal to the Bohr radius of atomic hydrogen. When atomic H serves as the catalyst, 27.2 eV of energy is accepted such that the kinetic energy of each ionized H serving as a catalyst for another is 13.6 eV. Similarly, each of the two electrons of O can be ionized with 13.6 eV of kinetic energy transferred to the O ion such that the net enthalpy for the breakage of the O—H bond of OH with the subsequent ionization of the two outer unpaired electrons is 80.4 eV as given in TABLE 3. During the ionization of OH⁻ to OH, the energy match for the further reaction to H(¼) and $O^{2+}$+2e⁻ may occur wherein the 204 eV of energy released contributes to the CIHT cell's electrical power. The reaction is given as follows:

$$80.4 \text{ eV} + OH + H\left[\frac{a_H}{p}\right] \rightarrow O^{2+}_{fast} + 2e^- + \qquad (50)$$

$$H\left[\frac{a_H}{(p+3)}\right] + [(p+3)^2 - p^2]\cdot 13.6 \text{ eV}$$

$$O^{2+}_{fast} + 2e^- \rightarrow O + 80.4 \text{ eV} \qquad (51)$$

And, the overall reaction is $$H\left[\frac{a_H}{p}\right] \rightarrow H\left[\frac{a_H}{(p+3)}\right] + [(p+3)^2 - p^2]\cdot 13.6 \text{ eV} \qquad (52)$$

where m=3 in Eq. (5). The kinetic energy could also be conserved in hot electrons. The observation of H population inversion in water vapor plasmas is evidence of this mechanism. The hydrino product such as molecular hydrino may cause an upfield matrix shift observed by means such as MAS NMR. Other methods of identifying the molecular hydrino product such as FTIR, Raman, and XPS are given in the present disclosure.

In an embodiment wherein oxygen or a compound comprising oxygen participates in the oxidation or reduction reaction, $O_2$ may serve as a catalyst or a source of a catalyst. The bond energy of the oxygen molecule is 5.165 eV, and the first, second, and third ionization energies of an oxygen atom are 13.61806 eV, 35.11730 eV, and 54.9355 eV, respectively. The reactions $O_2 \rightarrow O + O^{2+}$, $O_2 \rightarrow O + O^3$, and $2O \rightarrow 2O^+$ provide a net enthalpy of about 2, 4, and 1 times $E_h$, respectively, and comprise catalyst reactions to form hydrino by accepting these energies from H to cause the formation of hydrinos.

In an embodiment, the molecular hydrino product is observed as an inverse Raman effect (IRE) peak at about 1950 cm$^{-1}$. The peak is enhanced by using a conductive material comprising roughness features or particle size comparable to that of the Raman laser wavelength that supports a Surface Enhanced Raman Scattering (SERS) to show the IRE peak.

V. Catalyst Induced Hydrino Transition (CIHT) Cell

A catalyst-induced-hydrino-transition (CIHT) cell 400 shown in FIG. 1 comprises a cathode compartment 401 with a cathode 405, an anode compartment 402 with an anode 410, optionally a salt bridge 420, and reactants that comprise at least one bipolar plate. The reactants constitute hydrino reactants during cell operation with separate electron flow and ion mass transport to generate at least one of electricity and thermal energy. The reactants comprise at least two components chosen from: (a) at least one source of $H_2O$; (b) a source of oxygen, (c) at least one source of catalyst or a catalyst comprising at least one of the group chosen from nH, O, $O_2$, OH, OH$^-$, and nascent $H_2O$, wherein n is an integer; and (d) at least one source of atomic hydrogen or atomic hydrogen; one or more reactants to form at least one of the source of catalyst, the catalyst, the source of atomic hydrogen, and the atomic hydrogen; and one or more reactants to initiate the catalysis of atomic hydrogen, wherein the combination of the cathode, anode, reactants, and bipolar plate permit the catalysis of atomic hydrogen to form hydrinos to propagate that maintains a chemical potential or voltage between each cathode and corresponding anode to cause a external current to flow through the load 425, and the system further comprising an electrolysis system. In another embodiment, the CIHT cell produces at least one of electrical and thermal power gain over that of an applied electrolysis power through the electrodes 405 and 410. In an embodiment, electrochemical power system comprises at least one of a porous electrode capable of gas sparging, a gas diffusion electrode, and a hydrogen permeable anode wherein at least one of oxygen and $H_2O$ is supplied form source 430 through passage 430 to the cathode 405 and $H_2$ is supplied from source 431 through passage 461 to the anode 420.

In certain embodiments, an electrochemical power system that generates at least one of electricity and thermal energy comprising a vessel, the vessel comprises at least one cathode; at least one anode; at least one bipolar plate; and reactants comprising at least two components chosen from: (a) at least one source of $H_2O$; (b) a source of oxygen; (c) at least one source of catalyst or a catalyst comprising at least one of the group chosen from nH, O, $O_2$, OH, OH$-$, and nascent $H_2O$, wherein n is an integer, and (d) at least one source of atomic hydrogen or atomic hydrogen; one or more reactants to form at least one of the source of catalyst, the catalyst, the source of atomic hydrogen, and the atomic hydrogen, and one or more reactants to initiate the catalysis of atomic hydrogen, the electrochemical power system further comprising an electrolysis system and an anode regeneration system.

In other embodiments, an electrochemical power system that generates at least one of a voltage and electricity and thermal energy comprises a vessel, the vessel comprising at least one cathode; at least one anode, at least one bipolar plate, and reactants comprising at least two components chosen from: (a) at least one source of $H_2O$; (b) a source of oxygen, (c) at least one source of catalyst or a catalyst comprising at least one of the group chosen from nH, O, $O_2$, OH, OH$-$, and nascent $H_2O$, wherein n is an integer; and (d) at least one source of atomic hydrogen or atomic hydrogen; one or more reactants to form at least one of the source of catalyst, the catalyst, the source of atomic hydrogen, and the atomic hydrogen; and one or more reactants to initiate the catalysis of atomic hydrogen.

In an embodiment, at least one reactant is formed during cell operation with separate electron flow and ion mass transport. In an embodiment, the combination of the cathode, anode, reactants, and bipolar plate permit the catalysis of atomic hydrogen to form hydrinos to propagate that maintains a chemical potential or voltage between each cathode and corresponding anode. In addition, the system can further comprising an electrolysis system, if not already present. In an embodiment, electrochemical power system comprises at least one of a porous electrode, a gas diffusion electrode, and a hydrogen permeable anode wherein at least one of oxygen and $H_2O$ is supplied to the cathode and $H_2$ is supplied to the anode. The electrochemical power system may comprise at least one of a hydrided anode and a closed hydrogen reservoir having at least one surface comprising a hydrogen permeable anode. The electrochemical power system may comprise back-to-back hydrogen permeable anodes with counter cathodes comprising a unit of a stack of cells that are electrically connected in at least one manner of series and parallel. In an embodiment, the electrochemical power system further comprises at least one gas supply system each comprising a manifold, gas line, and gas channels connected to the electrode. In an embodiment, the anode comprises Mo that is regenerated during the charging phase from electrolyte reactants performing the regeneration reaction steps of:

$$MoO_3 + 3MgBr_2 \text{ to } 2MoBr_3 + 3MgO \ (-54 \text{ kJ/mole (298K)} - 46 \text{ (600K)})$$

$$MoBr_3 \text{ to } Mo + 3/2Br_2 \ (284 \text{ kJ/mole } 0.95 \text{ V/3 electrons})$$

$$MoBr_3 + Ni \text{ to } MoNi + 3/2Br_2 \ (283 \text{ kJ/mole } 0.95 \text{ V/3 electrons})$$

$$MgO + Br_2 + H_2 \text{ to } MgBr_2 +$$

$$H_2O \ (-208 \text{ kJ/mole (298K)} - 194 \text{ kJ/mole (600K)}).$$

In an embodiment, the anode comprises Mo that is regenerated during the charging phase from electrolyte reactants comprising at least one of $MoO_2$, $MoO_3$, $Li_2O$, and $Li_2MoO_4$.

The electrochemical power systems of the present disclosure may comprise a closed hydrogen reservoir having at least one surface comprising a hydrogen permeable anode. The electrochemical power systems of the present disclosure may comprise back-to-back hydrogen permeable anodes with counter cathodes comprising a unit of a stack of cells that are electrically connected in at least one manner of series and parallel. In an embodiment, the electrochemical power system cathode comprises at least one of a capillary system and radial gas channels with circumferential perforations, a porous electrode, and a porous layer to transport at least one of $H_2O$ and $O_2$ towards the center of the cell relative to the periphery. The hydrogen permeable anode may comprise at least one of Mo, a Mo alloy, MoNi, MoCu, TZM, HAYNES® 242® alloy, Ni, Co, a Ni alloy, NiCo, and other transition metals and alloys, and inner transition metals and alloys, and CuCo. In embodiments, the membrane thickness is in at least one range chosen from about 0.0001 cm to 0.25 cm, 0.001 cm to 0.1 cm, and 0.005 cm to 0.05 cm. The hydrogen pressure supplied to the permeable or gas sparging anode may be maintained in the range of at least one of about 1 Torr to 500 atm, 10 Torr to 100 atm, and 100 Torr to 5 atm, and the hydrogen permeation or sparging rate may be in the range of at least one of about $1\times10^{-13}$ mole $s^{-1}$ $cm^{-2}$ to $1\times10^{-4}$ mole $s^{-1}$ $cm^{-2}$, $1\times10^{-12}$ mole $s^{-1}$ $cm^{-2}$ to $1\times10^{-5}$ mole $s^{-1}$ $cm^{-2}$, $1\times10^{-11}$ mole $s^{-1}$ $cm^{-2}$ to $1\times10^{-6}$ mole $s^{-1}$ $cm^{-2}$, $1\times10^{-10}$ mole $s^{-1}$ $cm^{-2}$ to $1\times10^{-7}$ mole $s^{-1}$ $cm^{-2}$, and $1\times10^{-9}$ mole $s^{-1}$ $cm^{-2}$ to $1\times10^{-8}$ mole $s^{-1}$ $cm^{-2}$. In an embodiment, the hydrogen permeable anode comprises a highly permeable membrane coated with a material that is effective at facilitating the catalysis of atomic hydrogen to form hydrinos. The coating material of the hydrogen permeable anode may comprise at least one of Mo, a Mo alloy, MoNi, MoCu, MoCo, MoB, MoC, MoSi, MoCuB, MoNiB, MoSiB, Co, CoCu, CoNi, and Ni and the H permeable material may comprise at least one of $Ni(H_2)$, $V(H_2)$, $Ti(H_2)$, $Nb(H_2)$, $Pd(H_2)$, $PdAg(H_2)$, $Fe(H_2)$, $Ta(H_2)$, stainless steel (SS), and 430 SS $(H_2)$. In an embodiment, the electrolysis system of the electrochemical power system intermittently electrolyzes $H_2O$ to provide a source of atomic hydrogen or atomic hydrogen and discharges the cell such that there is a gain in the net energy balance of the cycle.

In an embodiment, the reactants of the cell comprise at least one electrolyte chosen from: at least one molten hydroxide; at least one eutectic salt mixture; at least one mixture of a molten hydroxide and at least one other compound; at least one mixture of a molten hydroxide and a salt; at least one mixture of a molten hydroxide and halide salt; at least one mixture of an alkaline hydroxide and an alkaline halide; LiOH—LiBr, LiOH—NaOH, LiOH—LiBr—NaOH, LiOH—LiX—NaOH, LiOH—LiX, NaOH—NaBr, NaOH—NaI, NaOH—NaX, and KOH—KX, wherein X represents a halide), at least one matrix, and at least one additive. The additive may comprise a compound that is a source of a common ion of at least one anode corrosion product wherein the corresponding common ion effect at least partially prevents the anode from corroding. The source of a common ion may prevent the formation of at least one of CoO, NiO, and MoO2. In an embodiment, the additive comprises at least one of a compound comprising a metal cation of the anode and an anion, hydroxide, a halide, oxide, sulfate, phosphate, nitrate, carbonate, chromate, perchlorate, and periodate and a compound comprising the matrix and an oxide, cobalt magnesium oxide, nickel magnesium oxide, copper magnesium oxide, CuO, $CrO_4$, ZnO, MgO, CaO, $MoO_2$, $TiO_2$, $ZrO_2$, $SiO_2$, $Al_2O_3$, NiO, FeO or $Fe_2O_3$, $TaO_2$, $Ta_2O_5$, VO, $VO_2$, $V_2O_3$, $V_2O_5$, $P_2O_3$, $P_2O_5$, $B_2O_3$, NbO, $NbO_2$, $Nb_2O_5$, $SeO_2$, $SeO_3$, $TeO_2$, $TeO_3$, $WO_2$, $WO_3$, $Cr_3O_4$, $Cr_2O_3$, $CrO_2$, and $CrO_3$. In embodiments, the cell temperature that maintains at least one of a molten state of the electrolyte and the membrane in a hydrogen permeable state is in at least one range chosen from about 25° C. to 2000° C., about 100° C. to 1000° C., about 200° C. to 750° C., and about 250° C. to 500° C., the cell temperature above the electrolyte melting point in at least one range of about 0° C. to 1500° C. higher than the melting point, 0° C. to 1000° C. higher than the melting point, 0° C. to 500° C. higher than the melting point, 0° C. to 250° C. higher than the melting point, and 0° C. to 100° C. higher than the melting point. In an embodiment, the electrolyte is aqueous and alkaline and at least one of the pH of the electrolyte and the cell voltage are controlled to achieved stability of the anode. The cell voltage per cell during the intermittent electrolysis and discharge may be maintained above the potential that prevents the anode from substantially oxidizing.

In an embodiment, the cell is intermittently switched between charge and discharge phases, wherein (i) the charging phase comprises at least the electrolysis of water at electrodes of opposite voltage polarity, and (ii) the discharge phase comprises at least the formation of $H_2O$ catalyst at one or both of the electrodes; wherein (i) the role of each electrode of each cell as the cathode or anode reverses in switching back and forth between the charge and discharge phases, and (ii) the current polarity reverses in switching back and forth between the charge and discharge phases, and wherein the charging comprises at least one of the application of an applied current and voltage. In embodiments, at least one of the applied current and voltage has a waveform comprising a duty cycle in the range of about 0.001% to about 95%; a peak voltage per cell within the range of about 0.1 V to 10 V; a peak power density of about 0.001 $W/cm^2$ to 1000 $W/cm^2$, and an average power within the range of about 0.0001 $W/cm^2$ to 100 $W/cm^2$ wherein the applied current and voltage further comprises at least one of direct voltage, direct current, and at least one of alternating current and voltage waveforms, wherein the waveform comprises frequencies within the range of about 1 Hz to about 1000 Hz. The waveform of the intermittent cycle may comprise at least one of constant current, power, voltage, and resistance, and variable current, power, voltage, and resistance for at least one of the electrolysis and discharging phases of the intermittent cycle. In embodiments, the parameters for at least one phase of the cycle comprises: the frequency of the intermittent phase is in at least one range chosen from about 0.001 Hz to 10 MHz, about 0.01 Hz to 100 kHz, and about 0.01 Hz to 10 kHz; the voltage per cell is in at least one range chosen from about 0.1 V to 100 V, about 0.3 V to 5 V, about 0.5 V to 2 V, and about 0.5 V to 1.5 V; the current per electrode area active to form hydrinos is in at least one range chosen from about 1 microamp $cm^{-2}$ to 10 A $cm^{-2}$, about 0.1 milliamp $cm^{-2}$ to 5 A $cm^{-2}$, and about 1 milliamp $cm^{-2}$ to 1 A $cm^{-2}$; the power per electrode area active to form hydrinos is in at least one range chosen from about 1 microW $cm^{-2}$ to 10 W $cm^{-2}$, about 0.1 milliW $cm^{-2}$ to 5 W $cm^{-2}$, and about 1 milliW $cm^{-2}$ to 1 W $cm^{-2}$; the constant current per electrode area active to form hydrinos is in the range of about 1 microamp $cm^{-2}$ to 1 A $cm^{-2}$; the constant power per electrode area active to form hydrinos is in the range of about 1 milliW $cm^{-2}$ to 1 W $cm^{-2}$; the time interval is in at least one range chosen from about $10^{-4}$ s to 10,000 s, $10^{-3}$ s to 1000 s, and $10^{-2}$ s to 100 s, and $10^{-1}$ s to 10 s; the resistance per cell is in at least one range chosen from about 1 milliohm to 100 Mohm, about 1 ohm to 1 Mohm, and 10 ohm to 1 kohm; conductivity of a suitable load per electrode area active to form hydrinos is in at least one range chosen from about $10^{-5}$ $ohm^{-1}$ $cm^{-2}$ to 1000 $ohm^{-1}$ $cm^{-2}$, $10^{-4}$ $ohm^{-1}$ $cm^{-2}$ to 100 $ohm^{-1}$ $cm^{-2}$, $10^{-3}$ $ohm^{-1}$ $cm^{-2}$ to 10 $ohm^{-1}$ $cm^{-2}$, and $10^{-2}$ $ohm^{-1}$ $cm^{-2}$ to 1 $ohm^{-1}$ $cm^{-2}$, and at least one of the discharge current, voltage, power, or time interval is larger than that of the electrolysis phase to give rise to at least one of power or energy gain over the cycle. The voltage during discharge may be maintained above that which prevents the anode from excessively corroding.

In an embodiment, the CIHT cell comprises an anode comprising Mo such as Mo, MoPt, MoCu, MoNi, MoC, MoB, and MoSi. The electrolyte may comprise a molten salt or alkaline aqueous electrolyte such as aqueous hydroxide or carbonate. The molten salt may comprise a hydroxide and may further comprise a salt mixture such as a eutectic salt mixture or a mixture having a composition of approximately that of a eutectic salt mixture, or other mixture that lowers the melting point from that of the highest melting point compound. The hydroxide may comprise at least one of an alkali or alkaline earth hydroxide. The mixture may comprise a halide compound such as an alkaline or alkaline earth halide. A suitable exemplary molten electrolyte comprises a LiOH—LiBr mixture. Additional suitable electrolytes that may be molten mixtures such as molten eutectic mixtures are given in TABLE 4. The molten salt may be run in the temperature range of about the melting point to a temperature up to 500° C. higher. The anode may be protected by supplying $H_2$ to the surface by means such as permeation or sparging. The hydrogen may be supplied in the pressure range of about 1 to 100 atm. The supply rate may be in the range of 0.001 nmoles per sq cm anode surface to 1,000,000 nmoles per sq cm anode surface. In an embodiment, the pressure controls at least one of the permeation and sparge rate. The rate is selected to protect the anode from corrosion such as oxidative corrosion while minimizing the corresponding $H_2$ consumption so that a net electrical energy may be generated by the cell.

TABLE 4

| Molten Salt Electrolytes. | | | | |
|---|---|---|---|---|
| AlCl3—CaCl2 | AlCl3—CoCl2 | AlCl3—FeCl2 | AlCl3—KCl | AlCl3—LiCl |
| AlCl3—MgCl2 | AlCl3—MnCl2 | AlCl3—NaCl | AlCl3—NiCl2 | AlCl3—ZnCl2 |
| BaCl2—CaCl2 | BaCl2—CsCl | BaCl2—KCl | BaCl2—LiCl | BaCl2—MgCl2 |
| BaCl2—NaCl | BaCl2—RbCl | BaCl2—SrCl2 | CaCl2—CaF2 | CaCl2—CaO |
| CaCl2—CoCl2 | CaCl2—CsCl | CaCl2—FeCl2 | CaCl2—FeCl3 | CaCl2—KCl |
| CaCl2—LiCl | CaCl2—MgCl2 | CaCl2—MgF2 | CaCl2—MnCl2 | CaCl2—NaAlCl4 |
| CaCl2—NaCl | CaCl2—NiCl2 | CaCl2—PbCl2 | CaCl2—RbCl | CaCl2—SrCl2 |
| CaCl2—ZnCl2 | CaF2—KCaCl3 | CaF2—KF | CaF2—LiF | CaF2—MgF2 |
| CaF2—NaF | CeCl3—CsCl | CeCl3—KCl | CeCl3—LiCl | CeCl3—NaCl |
| CeCl3—RbCl | CoCl2—FeCl2 | CoCl2—FeCl3 | CoCl2—KCl | CoCl2—LiCl |
| CoCl2—MgCl2 | CoCl2—MnCl2 | CoCl2—NaCl | CoCl2—NiCl2 | CsBr—CsCl |
| CsBr—CsF | CsBr—CsI | CsBr—CsNO3 | CsBr—KBr | CsBr—LiBr |
| CsBr—NaBr | CsBr—RbBr | CsCl—CsF | CsCl—CsI | CsCl—CsNO3 |
| CsCl—KCl | CsCl—LaCl3 | CsCl—LiCl | CsCl—MgCl2 | CsCl—NaCl |
| CsCl—RbCl | CsCl—SrCl2 | CsF—CsI | CsF—CsNO3 | CsF—KF |
| CsF—LiF | CsF—NaF | CsF—RbF | CsI—KI | CsI—LiI |
| CsI—NaI | CsI—RbI | CsNO3—CsOH | CsNO3—KNO3 | CsNO3—LiNO3 |
| CsNO3—NaNO3 | CsNO3—RbNO3 | CsOH—KOH | CsOH—LiOH | CsOH—NaOH |
| CsOH—RbOH | FeCl2—FeCl3 | FeCl2—KCl | FeCl2—LiCl | FeCl2—MgCl2 |
| FeCl2—MnCl2 | FeCl2—NaCl | FeCl2—NiCl2 | FeCl3—LiCl | FeCl3—MgCl2 |
| FeCl3—MnCl2 | FeCl3—NiCl2 | K2CO3—K2SO4 | K2CO3—KF | K2CO3—KNO3 |
| K2CO3—KOH | K2CO3—Li2CO3 | K2CO3—Na2CO3 | K2SO4—Li2SO4 | K2SO4—Na2SO4 |
| KAlCl4—NaAlCl4 | KAlCl4—NaCl | KBr—KCl | KBr—KF | KBr—KI |
| KBr—KNO3 | KBr—KOH | KBr—LiBr | KBr—NaBr | KBr—RbBr |
| KCl—K2CO3 | KCl—K2SO4 | KCl—KF | KCl—KI | KCl—KNO3 |
| KCl—KOH | KCl—LiCl | KCl—LiF | KCl—MgCl2 | KCl—MnCl2 |
| KCl—NaAlCl4 | KCl—NaCl | KCl—NiCl2 | KCl—PbCl2 | KCl—RbCl |
| KCl—SrCl2 | KCl—ZnCl2 | KF—K2SO4 | KF—KI | KF—KNO3 |
| KF—KOH | KF—LiF | KF—MgF2 | KF—NaF | KF—RbF |
| KFeCl3—NaCl | KI—KNO3 | KI—KOH | KI—LiI | KI—NaI |
| KI—RbI | KMgCl3—LiCl | KMgCl3—NaCl | KMnCl3—NaCl | KNO3—K2SO4 |
| KNO3—KOH | KNO3—LiNO3 | KNO3—NaNO3 | KNO3—RbNO3 | KOH—K2SO4 |
| KOH—LiOH | KOH—NaOH | KOH—RbOH | LaCl3—KCl | LaCl3—LiCl |
| LaCl3—NaCl | LaCl3—RbCl | Li2CO3—Li2SO4 | Li2CO3—LiF | Li2CO3—LiNO3 |
| Li2CO3—LiOH | Li2CO3—Na2CO3 | Li2SO4—Na2SO4 | LiAlCl4—NaAlCl4 | LiBr—LiCl |
| LiBr—LiF | LiBr—LiI | LiBr—LiNO3 | LiBr—LiOH | LiBr—NaBr |
| LiBr—RbBr | LiCl—Li2CO3 | LiCl—Li2SO4 | LiCl—LiF | LiCl—LiI |
| LiCl—LiNO3 | LiCl—LiOH | LiCl—MgCl2 | LiCl—MnCl2 | LiCl—NaCl |
| LiCl—NiCl2 | LiCl—RbCl | LiCl—SrCl2 | LiF—Li2SO4 | LiF—LiI |
| LiF—LiNO3 | LiF—LiOH | LiF—MgF2 | LiF—NaF | LiF—NaF |
| LiF—RbF | LiI—LiOH | LiI—NaI | LiI—RbI | LiNO3—Li2SO4 |
| LiNO3—LiOH | LiNO3—NaNO3 | LiNO3—RbNO3 | LiOH—Li2SO4 | LiOH—NaOH |
| LiOH—RbOH | MgCl2—MgF2 | MgCl2—MgO | MgCl2—MnCl2 | MgCl2—NaCl |
| MgCl2—NiCl2 | MgCl2—RbCl | MgCl2—SrCl2 | MgCl2—ZnCl2 | MgF2—MgO |
| MgF2—NaF | MnCl2—NaCl | MnCl2—NiCl2 | Na2CO3—Na2SO4 | Na2CO3—NaF |
| Na2CO3—NaNO3 | Na2CO3—NaOH | NaBr—NaCl | NaBr—NaF | NaBr—NaI |
| NaBr—NaNO3 | NaBr—NaOH | NaBr—RbBr | NaCl—Na2CO3 | NaCl—Na2SO4 |
| NaCl—NaF | NaCl—NaI | NaCl—NaNO3 | NaCl—NaOH | NaCl—NiCl2 |
| NaCl—PbCl2 | NaCl—RbCl | NaCl—SrCl2 | NaCl—ZnCl2 | NaF—Na2SO4 |
| NaF—NaI | NaF—NaNO3 | NaF—NaOH | NaF—RbF | NaI—NaNO3 |
| NaI—NaOH | NaI—RbI | NaNO3—Na2SO4 | NaNO3—NaOH | NaNO3—RbNO3 |
| NaOH—Na2SO4 | NaOH—RbOH | RbBr—RbCl | RbBr—RbF | RbBr—RbI |
| RbBr—RbNO3 | RbCl—RbF | RbCl—RbI | RbCl—RbOH | RbCl—SrCl2 |
| RbF—RbI | RbNO3—RbOH | CaCl2—CaH2 | | |

Figure 2:
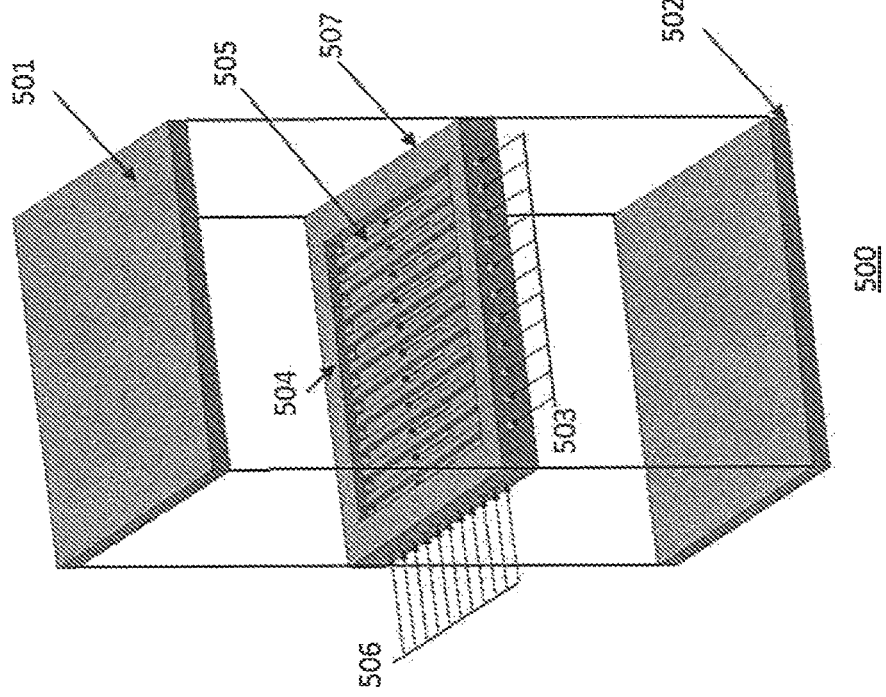
FIG. 2 is a schematic drawing of a CIHT cell dipolar plate in accordance with an embodiment of the present disclosure.

In an embodiment, the hydrogen electrode, and optionally the oxygen electrode, is replaced by an element of a bipolar plate 507 as shown in FIG. 2. The cell design may be based on a planar square geometrical configuration wherein the cells may be stacked to build voltage. Each cell may form a repeating unit comprising an anode current collector, porous anode, electrolyte matrix, porous cathode, and cathode current collector. One cell may be separated from the next by a separator that may comprise a bipolar plate that serves as both the gas separator and series current collector. The plate may have a cross-flow gas configuration or internal mani-folding. As shown in FIG. 2, interconnections or bipolar plates 507 separate the anode 501 from the adjacent cathode 502 in a CIHT cell stack 500 comprising a plurality of individual CIHT cells. The anode or $H_2$ plate 504 may be corrugated or comprise channels 505 that distribute hydro-gen supplied through a manifold with ports 503. The plate 504 with channels 505 substitutes for the hydrogen perme-able membrane or intermittent electrolysis cathode (dis-charge anode) of other embodiments. The ports may receive hydrogen from a manifold along the ports 503 that are in turn is supplied by a hydrogen source such as a tank. The plate 504 may further ideally evenly distribute hydrogen to bubble or sparge into active areas wherein electrochemical reactions occur. The bipolar plate may further comprise an oxygen plate of the bipolar plate having a similar structure as that of the $H_2$ plate to distribute oxygen to active areas wherein an oxygen manifold supplies oxygen from a supply along oxygen manifold and ports 506. These corrugated or channeled plates are electrically conducting and are con-nected with anode and cathode current collectors in the active areas and maintain electrical contact. In an embodi-ment, all the interconnection or bipolar plates constitute the gas distribution network allowing separation of anodic and cathodic gasses. Wet seals may be formed by extension of the electrolyte/matrix such as LiOH—LiBr—$Li_2AlO_3$ or MgO tile pressed between two individual plates. The seals may prevent leakage of the reactant gases. The electrolyte may comprise a pressed pellet of the present disclosure. The pressure to form an electrolyte pellet such as one comprising a hydroxide such as an alkali hydroxide such as LiOH and a halide such an alkali halide such as LiBr and a matrix such as MgO is in the range of about 1 ton to 500 tons per square inch. The stack may further comprise tie rods that hold pressure plates at the ends of the stack to apply pressure to the cells to maintain a desire contact between the electrolyte such as a pellet electrolyte and the electrodes. In an embodi-ment wherein the electrolyte or a component such as a hydroxide such as LiOH migrates by means such as evapo-ration, the electrolyte may be collected and recycled. The migrating species may be collected in a structure such as a collecting structure or a wicking structure that absorbs the electrolyte, and the recycling may be achieved thermally by means such as heating the collecting or wicking structure to cause a reverse migration.

The CIHT cell system may comprise a modified conven-tional fuel cell such as a modified alkaline or molten carbonate-type. In an embodiment, the CIHT cell comprises a stack of bipolar plates such as shown in FIG. 2 wherein at least one of oxygen and $H_2O$ is supplied to the cathode and $H_2$ is supplied to the anode. The gases may be provided by diffusion through a porous or diffusion electrode, and $H_2$ may also be provided by permeation through a suitable hydrogen permeable electrode. The hydrogen permeable electrode may comprise at least one of Mo, a Mo alloy such as MoNi, MoCu, TZM, and HAYNES® 242® alloy, Ni, Co, a Ni alloy such as NiCo, and other transition and inner transition metals and alloys such as CuCo. The application of $H_2$ is in an amount sufficient to retard anode corrosion while maintaining electrical power gain. The permeation anode may be run at increasing current densities with proportional increases in hydrogen permeation rate. The hydrogen permeation rate may be controlled by at least one of increasing the hydrogen pressure to the membrane, increasing the cell temperature, decreasing the membrane thickness, and changing the membrane composition such as the wt % s of metals of an the alloy such as a Mo alloy. In an embodiment, a hydrogen dissociator such as a noble metal such as Pt or Pd is coated on the interior of the permeation anode such as a Mo or MoCu anode to increase the amount of atomic H to increase the permeation rate. The gas pressure may be any desired to maintain at least one of the desired power output from each cell, $H_2$ permeation rate, $H_2$ protection of the anode, oxygen reduction rate at the cathode. At least one of the hydrogen and oxygen pressure may be in the range of at least one of about 0.01 atm to 1000 atm, 0.1 atm to 100 atm, and 1 atm to 10 atm.

In the event that the anode undergoes corrosion, the metal may be electroplated from the electrolyte. The Mo corrosion product may be soluble in the electrolyte. In an embodiment, the electrolyte further comprises a regeneration compound that facilitates electrodepositing of the Mo corrosion product from the electrolyte to the anode and permits a thermody-namic cycle to reform the regeneration compound. The regeneration compound may react with the Mo corrosion product to form an electrodepositing compound that is soluble in the electrolyte and capable of being electroplated onto the anode. The reaction may involve an anion exchange reaction such as an oxide-halide exchange reaction to addi-tionally form an oxide product. The electrodepositing com-pound may facilitate a favorable thermodynamic cycle of in situ regeneration of the anode. Hydrogen may be added to the anode to make the cycle thermodynamically favorable. In an embodiment, the steps comprise (1) the reaction of the corrosion product, a metal oxide of the anode metal, with a regeneration compound of the electrolyte to form an elec-trodepositing compound comprising a cation of the anode metal and a counter ion capable of being oxidized to form an oxidant reactant to regenerate the regeneration compound. The reaction may additionally form the oxide product. Exemplary anode metals are Mo and Mo alloys. Exemplary regeneration compounds are $MgBr_2$ and $MgI_2$. (2) the reduc-tion of the cation causing electrodepositing of the anode metal and the oxidation of the counterion to form the oxidant reactant by applying a suitable voltage and current; exem-plary oxidant reactants are $Br_2$ and $I_2$, and (3) the reaction of at least the oxidant reactant and optionally $H_2$ where ther-modynamically necessary with the oxide product to form the regeneration compound and additionally $H_2O$ wherein required to cause the reaction to be thermodynamically favorable. In an embodiment, the regeneration compound such as at least one of $MgBr_2$ and $MgI_2$ is maintained in the concentration range of about 0.001 mole % to 50 mole %. The $H_2$ supply rate may be in the range of 0.001 nmoles per sq cm anode surface to 1,000,000 nmoles per sq cm anode surface.

In an embodiment, the molten electrolyte such as LiOH—LiBr comprises $MgBr_2$ as an additive to electro-deposit Mo to anode of the cell having a Mo anode wherein the in situ regeneration reactions are:

$$MoO_3 + 3MgBr_2 \text{ to } 2MoBr_3 + \tag{53}$$

$$3MgO \; (-54 \text{ kJ/mole } (298K) - 46 \; (600K))$$

$$MoBr_3 \text{ to } Mo + 3/2Br_2 \; (284 \text{ kJ/mole } 0.95 \text{ V/3 electrons}) \tag{54}$$

$$MoBr_3 + Ni \text{ to } MoNi + 3/2Br_2 \; (283 \text{ kJ/mole } 0.95 \text{ V/3 electrons}) \tag{55}$$

$$MgO + Br_2 + H_2 \text{ to } MgBr_2 + \tag{56}$$

$$H_2O \; (-208 \text{ kJ/mole } (298K) - 194 \text{ kJ/mole } (600K)).$$

In an embodiment, the maximum charge voltage is above that which results in the electroplating on Mo or other anode metal back onto the anode. The voltage may be in the range of at least or of about 0.4 V to 10 V, 0.5 V to 2 V, and 0.8 V to 1.3 V. The anode may comprise Mo in the form of an alloy or metal mixture such as MoPt, MoNi, MoCo, and MoCu. The alloy or mixture may enhance the electro-deposition of Mo. In an embodiment, the reaction of Mo with $H_2O$ generates $H_2$ in addition to that from $OH^-$ of the electrolyte; so, the charge voltage is operated above that which predominantly electrodeposits Mo onto the anode from Mo ions in the electrolyte. In an embodiment, separate long duration periods of continuous discharge and continuous charge are maintained such that more energy is released during discharge than charge. The charge time may be in the range of at least one of about 0.1 s to 10 days, 60 s to 5 days, and 10 mins to 1 day. The discharge time is longer than the corresponding charge time. In an embodiment, sufficient anode metal such as Mo is deposited during charge to replace that lost by corrosion such that the electrode is maintained with a constant Mo content at steady state of the electrode with the electrolyte concentration of Mo compounds.

In an embodiment, the molten electrolyte such as LiOH—LiBr comprises $MgI_2$ as an additive to electro-deposit Mo to anode of the cell having a Mo anode wherein the in situ regeneration reactions are:

$$MoO_2 + 2MgI_2 \text{ to } MoI_2 + I_2 + \tag{57}$$

$$2MgO \; (16 \text{ kJ/mole } (298K) - 0.35 \text{ kJ/mole } (600K))$$

$$MoI_2 \text{ to } Mo + I_2 \; (103 \text{ kJ/mole } 0.515 \text{ V/2 electrons}) \tag{58}$$

$$MoI_2 + Ni \text{ to } MoNi + I_2 \; (102 \text{ kJ/mole } 0.515 \text{ V/2 electrons}) \tag{59}$$

$$MgO + I_2 + H_2 \text{ to } MgI_2 + \tag{60}$$

$$H_2O \; (-51 \text{ kJ/mole } (298K) \; 5 \text{ kJ/mole } (600K))$$

The anode may comprise Mo in the form of an alloy or metal mixture such as MoPt, MoNi, MoCo, and MoCu. The alloy or mixture may enhance the electro-deposition of Mo.

In an embodiment, the molten electrolyte such as LiOH—LiBr comprises $MgSO_4$ as an additive to electro-deposit Mo to anode of the cell having a Mo anode. The sulfate undergoes an exchange reaction with the oxide of molybdenum oxide to form molybdenum sulfate that is permissive of Mo being electrodeposited on the anode.

In an embodiment, the molten electrolyte such as LiOH—LiBr comprises at least one of $MoS_2$, $MoSe_2$, and $Li_2MoO_4$ as an additive to electro-deposit Mo to anode of the cell having a Mo anode. In an embodiment, at least one of sulfide and selenide undergoes an exchange reaction with the oxide of molybdenum oxide to form molybdenum sulfide or molybdenum selenide that is permissive of Mo being electrodeposited on the anode. To prevent oxidation of sulfide to sulfate or selenide to selenate, the oxygen reduction cathode may be replaced by a molten-hydroxide-electrolyte-stable cathode that participates in oxidation-reduction chemistry involving hydroxide that does not require oxygen such as an oxyhydroxide cathode such as a FeOOH or NiOOH cathode. Exemplary cells are $[Mo/LiOH—LiBr—MoS_2/FeOOH]$, $[Mo/LiOH—LiBr—MoSe_2/FeOOH]$, $[Mo/LiOH—LiBr—MoS_2—MoSe_2/FeOOH]$, $[Mo/LiOH—LiBr—Li_2MoO_4—MoS_2/FeOOH]$, and $[Mo/LiOH—LiBr—Li_2MoO_4—MoSe_2—MoS_2/FeOOH]$ that are sealed or one that has an inert atmosphere such as an argon atmosphere.

In another embodiment, a compound is added to the electrolyte that reacts with the anode metal oxide corrosion product to form a compound that is soluble in the electrolyte and capable of being electrodeposited on to the anode. In an embodiment of a cell having an anode comprising Mo, $Li_2O$ is to LiOH—LiBr electrolyte. The $Li_2O$ reacts with $MoO_3$ corrosion product to form $Li_2MoO_4$ that is soluble in the electrolyte and is replated onto the anode. In an embodiment, a sealed cell is supplied with dry source of oxygen such as $O_2$ gas or dry air such that $Li_2O$ remains unhydrated to LiOH. $H_2O$ is formed in the cell during operation; so, dry the flow rate of the dry $O_2$ source is maintained to achieve a concentration of $H_2O$ in the cell to permit $Li_2O$ to be available for the reaction to form $Li_2MoO_4$. In an embodiment, the $Li_2O$ concentration is maintained in the range of about 0.001 mole % to 50 mole %. $H_2O$ may be added to the cell to replenish consumed $H_2O$ by cooling the cell to a temperature below that at which $H_2O$ reacts with Mo, adding the desired amount of $H_2O$, and then elevating the cell temperature again. Exemplary cells are $[Mo/LiOH—LiBr—Li_2MoO_4/NiO \; (O_2)]$ and $[Mo/LiOH—LiBr—Li_2MoO_4—MoS_2/NiO \; (O_2)]$.

In an embodiment, the cell comprises an anode comprising nickel and a molten electrolyte such as LiOH—LiBr and additionally a metal halide electrolyte additive such as a transition metal halide such as a halide of the anode such as a nickel halide such as $NiBr_2$. In an embodiment, the cell is sealed without addition of oxygen. The cell is maintained with addition of $H_2O$ with an $H_2O$ source such as a heated reservoir. The cathode reaction may be reduction of $H_2O$ to hydroxide and oxygen from internal electrolysis reactions. The absence of additional externally supplied oxygen will prevent anode corrosion. The formation of oxygen anions may in turn result in the formation of oxyhydroxide to promote the hydrino reaction.

Consider the catalyst forming reaction and the counter half-cell reaction that occurred during discharge are given by Anode:

$$OH^- + H_2 \rightarrow H_2O + e^- + H(1/p) \tag{61}$$

Cathode:

$$O_2 + 2H_2O + 4e^- \rightarrow 4OH^- \tag{62}$$

The overall reaction may be $$2H_2 + 1/2O_2 \rightarrow H_2O + 2H(1/p) \tag{63}$$

wherein $H_2O$ served as the catalyst. Exemplary ion-carrying, electrolyte-$H_2O$ reactions that also result in $H_2O$ electrolysis are Anode:

$$2OH^- \rightarrow 2H + O_2^- + e^- \tag{64}$$

Cathode:

$$O_2^- + H_2O + e^- \rightarrow 1/2O_2 + 2OH^- \tag{65}$$

Anode:

$$2OH^- \rightarrow H + HOO^- + e^- \tag{66}$$

Cathode:

$$HOO^- + 1/2H_2O + e^- \rightarrow 2OH^- + 1/4O_2 \tag{67}$$

Anode:

$$3OH^- \rightarrow O_2 + H_2O + H + 3e^- \tag{68}$$

Cathode:

$$3/4O_2 + 3/2H_2O + 3e^- \rightarrow 3H^- \tag{69}$$

wherein the hydrogen of Eqs. (64), (66), and (68) may react to form hydrinos:

$$2H \rightarrow 2H(1/4) \tag{70}$$

The overall reactions are $$H_2O \rightarrow 1/2O_2 + 2H(1/4) \tag{71}$$

$$H_2O \rightarrow 1/2O_2 + H_2 \tag{72}$$

wherein the hydrogen of Eqs. (64), (66), and (68) may additionally react to form $H_2O$ catalyst, and the oxygen of Eqs. (65), (67), and (69) may react and form $OH^-$ according to Eqs. (61) and (62) respectively. Other oxygen species such as oxide, peroxide, superoxide, and $HOO^-$ and corresponding oxidation-reduction reactions may be involved in the spontaneous electrolysis of $H_2O$ to form at least one of H, catalyst, and hydrinos while carrying the excess current produced by the energy evolved from hydrino formation. In another embodiment, the anode comprises Mo and the electrolyte additive comprises a molybdenum halide.

In an embodiment, at least one of the electrolyte, anode, and cathode comprise materials and compounds that cause the formation of HOH catalyst and H through a metal oxyhydroxide intermediate. The cell may comprise a molten salt electrolyte such as LiOH—LiBr or an aqueous electrolyte such as KOH. Exemplary reactions of hydroxides and oxyhydroxides such as those of Ni or Co at the anode to form HOH catalyst are $$Ni(OH)_2 + OH^- \text{ to } NiOOH + H_2O + e^- \text{ and} \tag{73}$$

$$NiO(OH)_2 \text{ to } NiO + H_2O \tag{74}$$

The reaction or reactions may be at least partially thermally driven. In an embodiment, the surface of the anode is maintained in a partially oxidized state. The oxidized state comprises at least one of hydroxl, oxyhydroxyl, and oxide groups. The groups of the oxidized surface may participate in the formation of at least one of the catalyst to form hydrinos such as HOH and atomic hydrogen wherein the atomic hydrogen may react with a species of at least one of the anode and the electrolyte to form at least one of the hydrino catalyst and hydrinos. In an embodiment, at least one of the anode and the electrolyte comprises a species or material that supports the partial oxidation. The anode may comprise a metal, alloy, or mixture that forms the oxidized surface wherein the oxidized surface may not substantially corrode. The anode may comprise at least one of a precious metal, noble metal, Pt, Pd, Au, Ir, Ru, Ag, Co, Cu, and Ni that form an oxide coat reversibly. Other suitable materials are those that oxidize, and the oxidized form is readily reduced with hydrogen. In an embodiment, at least one compound or species is added to the electrolyte to maintain an oxidized state of the anode. Exemplary additives are alkali and alkaline earth halides such as LiF and KX (X=F, Cl, Br, I). In an embodiment, the cell is operated in a voltage range that maintains the anode in a suitable oxidized state to propagate the hydrino reaction. The voltage range may further permit operation without significant anode corrosion. The intermittent electrolysis waveform may maintain the suitable voltage range. The range may be at least one of about 0.5 V to 2V, about 0.6 V to 1.5 V, about 0.7 V to 1.2 V, about 0.75 V to 1.1 V, about 0.8 V to 0.9 V, and about 0.8 V to 0.85 V. The waveform during each of charge and discharge phases of the intermittent cycle may be at least one of voltage limited or voltage controlled, time limit controlled, and current controlled. In an embodiment, oxygen ions formed at the cathode by oxygen reduction carry the ion current of the cell. The oxygen ion current is controlled to maintain a desired state of oxidation of the anode. The oxygen ion current may be increased by at least one of increasing the cell current and increasing the rate of oxygen reduction by means such as increasing at least one of the cathode and anode oxygen pressure. The oxygen flow may be increased by increasing the oxygen reduction rate at the cathode by using cathodic oxygen reaction catalysts such as NiO, lithiated NiO, CoO, Pt, and rare earth oxides wherein the increased oxygen current supports formation of oxyhydroxide at the anode. In an embodiment, the CIHT cell temperature is adjusted to maximize the hydrino reaction kinetics that favors a high temperature while avoiding oxyhydroxide decomposition that favors lower temperature.

In an embodiment, the temperature is in the range of at least one of about $25°$ C. to $1000°$ C., $300°$ C. to $800°$ C., and $400°$ C. to $500°$ C.

In an embodiment, the current density of at least one of charge and discharge of an intermittent or continuous discharge cycle is very high to cause an increase in the kinetics of hydrinos formation. The peak current density may be in the range of at least one $0.001$ mA/cm$^2$ to $100,000$ A/cm$^2$, $0.1$ mA/cm$^2$ to $10,000$ A/cm$^2$, $1$ mA/cm$^2$ to $1000$ A/cm$^2$, $10$ mA/cm$^2$ to $100$ A/cm$^2$, and $100$ mA/cm$^2$ to $1$ A/cm$^2$. The cell may be intermittently charged and discharged at high current with short time durations for each phase of the cycle in order to maintain a tolerable difference between the charge and discharge voltage range such that net power is generated by the cell. The time interval is in at least one range chosen from about $10^{-6}$ s to $10$ s and $10^{-3}$ s to $1$ s. The current may be AC, DC or an AC-DC mixture. In an embodiment, comprising a magnetohydrodynamic plasma to electric power converter, the current is DC such that a DC magnetic field is produced by the current. In an embodiment, at least one of the charge and discharge current comprises an AC modulation. The AC frequency may be in the range of about $0.1$ Hz to $10$ GHz, $1$ Hz to $1$ MHz, $10$ Hz to $100$ kHz, and $100$ Hz to $10$ kHz. The peak voltage of the modulation may be in at least one range chosen from about $0.001$ V to $10$ V, $0.01$ V to $5$V, $0.1$ V to $3$ V, $0.2$ V to $2$ V, $0.3$ V to $1.5$ V, and $0.5$ V to $1$ V. In an embodiment, the current pulse is delivered along a transmission line to achieve at least one of a higher voltage or current. In an exemplary case wherein the applied high-current pulse is AC, the most rapid kinetics may be achieved when the current is changing at it maximum rate at about $0$ A, corresponding to the maximum ability to draw charge from the sample. The electrode separation may be minimized to decrease the cell resistance to permit a high current density. The separation distance may be dynamically controlled by monitoring the current density, cell resistance, voltage and other electrical parameters and using one or more of those values to adjust the separation. The electrode may be designed to concentrate the current at specific regions of the surface such as at sharp edges or points. In an embodiment, the electrode comprises a cube or needle or other geometrical shape with sharp edges to concentrate the field and the current density to achieved high current density such as about $500$ mA/cm$^2$ or greater.

In an embodiment, the anode comprises a material such as a metal such as at least one of a precious, transition, and inner transition metal that forms at least one of a hydride and bonds to hydrogen. The material may increase the effective atomic hydrogen on the surface of the anode. The increased surface hydrogen may permit a decreased hydrogen sparge or permeation rate to maintain at least one of a desired rate of the hydrino reaction and protection from anode corrosion. Exemplary metals are Pt, Pd, Au, Ir, Ru, Co, Cu, Ni, V, and Nb and mixtures that may be present in any desired amount, alone or as a mixture or alloy. The material such as a metal may serve as a hydrogen dissociator. The increased atomic hydrogen may serve to provide at least one of an increase in the hydrino reaction rate and an enhancement of the effectiveness of the hydrogen present to prevent corrosion. Exemplary dissociative metals are Pt, Pd, Ir, Ru, Co, Ni, V, and Nb. In an embodiment, a compound or material is added to at least one of the anode and electrolyte that increases the cell voltage. The increase may be due to a change in at least one of electrode overpotential, the hydrino reaction rate, and the Fermi level of the anode. The dissociative metal may increase the rate of flow of hydrogen across a hydrogen permeable anode. Exemplary anode metal additives are Pt and Au wherein the additive may be to a predominantly Ni anode to form an alloy or mixture. Exemplary electrolyte additives are MgI$_2$, CaI$_2$, MgO, and ZrO$_2$. In an embodiment, the anode comprising an noble metal or a metal doped with a noble metal as a mixture or alloy such as PtNi or PtAuPd has a higher operating voltage than the base metal such as Ni in the absence of the noble metal since it has a lower overpotential and gives a higher yield of hydrogen from electrolysis during the charging phase. The H$_2$ to maintain a flat high voltage band may have due to electrolysis stored in the reservoir that permeates out during discharge. In an embodiment, the H$_2$ supplied to the anode surface is only from electrolysis.

In an embodiment a compound may be added to the electrolyte such as LiOH—LiBr to increase the reaction rate at the cathode surface and stabilize the anode. Suitable additives are at least one of an alkaline hydroxide such as at least one of CsOH and NaOH, an alkaline earth hydroxide, an alkaline or alkaline earth halide, and oxide such as CoO, NiO, LiNiO$_2$, CoO, LiCoO$_2$, and a rare earth oxide such as ZrO, MgO, other compounds that increase the basicity, CeO$_2$, La$_2$O$_3$, MoOOH, MoCl$_4$, CuCl$_2$, CoCl$_2$, oxyhydroxides such as TiOOH, GdOOH, COOH, InOOH, FeOOH, GaOOH, NiOOH, AlOOH, CrOOH, MoOOH, CuOOH, MnOOH, ZnOOH, and SmOOH, an Fe compound such as an oxide such as Fe$_2$O$_3$ or a halide such as FeBr$_2$, a sulfate such as Li$_2$SO$_4$, a phosphate such as Li$_3$PO$_4$, a tungstate such as Li$_2$WO$_4$, a carbonate such as Li$_2$CO$_3$, NiO or Ni(OH)$_2$ that may form LiNiO$_2$ at the anode, an iron compound such as Fe$_2$O$_3$ to form LiFeO$_2$ at the anode, MgO to form MgNiOx at the anode, a compound with a large cation such as one with a large stable molecular cation or a stable metal complex such as 1-butyl-3-methylimidazol-3-ium hexafluorophosphate, betaine bis(trifluoromethanesulfonyl) imide, or N-Butyl-N-Methyl pyrrolidinium bis(trifluoromethanesulfonyl)imide, and a compound comprising HS$^-$ such as LiHS. In an embodiment, the additive comprises a compound having a large cation such as the Cs$^+$ ion of CsOH or one having a higher charge such as that of an alkaline earth compound or the Bi$^{3+}$ cation of a bismuth compound. The concentration is adjusted to avoid excessive corrosion. An exemplary low concentration is about <1 mole % or <5 mole %. In an embodiment, an additive is added that may be reduced at the cathode, migrate to the anode and be oxidized at the anode. The compound thus causes a parasitic current in addition to the current from the reactions given by Eqs. (61-63). The additive may have multiple stable oxidation states. An exemplary suitable additive is an iron compound such as FeBr$_2$, FeBr$_3$, FeO, Fe$_2$O$_3$, Fe(OH)$_2$, and Fe(OH)$_3$, and other metals such as a transition metal substituting for Fe. The additive may cause a high current to increase the rate of the hydrino reaction.

In an embodiment, the anode comprises a primary metal and an additive such as at least one of Ag, a rare earth oxide such as CeO$_2$ or La$_2$O$_3$, and a noble metal or a mixture or alloy of noble metals such as Pt, Ir, Re, Pd, or AuPdPt. One of Li$_2$CO$_3$, Li$_2$O, NiO, or Ni(OH)$_2$ may serve as an additive to form LiNiO$_2$ in the anode. LiNiO$_2$ may alter conductivity, promote oxide-hydroxide interconversion during cell electrochemical operation, or Li$^+$+electron reaction to facilitate the hydrino reaction. The additive may lower the over potential for at least one of H$_2$ or H$_2$O evolution at the anode during charge and discharge, respectively. In embodiments, cells comprising Pt anode additive and a CsOH electrolyte additive are [NiPt(H2)/LiOH—LiBr—CsOH)/NiO], [CoPt (H2)/LiOH—LiBr—CsOH)/NiO], and [MoPt(H2)/LiOH— LiBr—CsOH)/NiO]. In an embodiment, an additive to at least one of the anode such as a tape cast one and the electrolyte comprises a solid-oxide fuel cell electrolyte, an oxide conductor, yttria-stabilized zirconia (YSZ) which may also comprise Sr, (such as the common 8% form Y8SZ), scandia stabilized zirconia (ScSZ) (such as the common 9 mol % Sc2O3-9ScSZ), gadolinium doped ceria (GDC) or gadolinia doped ceria (CGO), lanthanum gallate, bismuth copper vanadium oxide such as $BiCuVO_x$), MgO, $ZrO_2$, $La_2O_3$, $CeO_2$, perovskite materials such as $La_{1-x}Sr_xCo_yO_{3-}$, proton conductors, doped barium cerates and zirconates, and $SrCeO_3$-type proton conductors such as strontium cerium yttrium niobium oxide and $H_xWO_3$. Additionally, the additive may comprise a metal such as Al, Mo, transition, inner transition metal, or rare earth metal.

In an embodiment, at least one of the anode, cathode, or electrolyte comprises an additive that achieves the same function of increasing the hydrino catalyst reaction rate as a high current. The additive may remove electrons formed during H catalysis. The additive may undergo an electron exchange reaction. In an exemplary embodiment, the additive comprises carbon that may be added to the anode or cathode, or example. Electrons react with carbon to form $C_x^-$ that intercalates $Li^+$ from the electrolyte to maintain neutrality. Thus, carbon serves as a sink to remove electrons in a similar manner as a high current.

In an embodiment of the CHIT cell, the anode comprises an $H_2$ reservoir to provide $H_2$ by permeation or sparging, wherein the outside wall is in contact with the electrolyte and comprises the anode surface. The anode further comprises an additive comprising a compound or material that is added inside of the reservoir. The additive may change the voltage at the anode to facilitate the hydrino reaction at a higher rate and/or maintain the voltage to essentially prevent anode corrosion. The additive may comprise a compound that may reversibly react with H wherein the H may undergo transport across the wall of the reservoir. The transport may be into the reservoir during charge and out of the reservoir during discharge. An additive comprising a hydride or hydrogen storage material inside of anode may serve as a hydrogen source during discharge that is regenerative by charging. A hydrogen dissociator such as a noble metal such as Pt may increase the hydrogen dissociation and the hydrogen flux across the hydrogen permeable anode. The additive may comprise a hydrogen storage material such as LiH, titanium hydride, $MgH_2$, $ZrH_2$, VH, NbH, $LaNi_6H_x$, LiH+ $LiNH_2$, or $Li_3N$ or mixture such as a eutectic mixture of alkali nitrides or other metal nitrides such as aluminum or magnesium to make a conductive liquid inside the anode. The additive that reacts with H transported across the H permeable anode may give rise to an anode voltage contribution. The voltage may be due to the dependency of the reaction of the additive with H on the transport of H across the anode wherein the external electrochemical reaction at the anode surface produces or consumes the H. Additional suitable additives are $MoO_2$, $MoS_2$, a metal such as a transition metal such as Co, and a noble metal such as Pd. Exemplary reactions of an additive that contributes to the voltage by the interaction of the internal additive with the external are $$4OH^-_{(external)} + Li_3N_{(internal)} \text{ to } LiNH_{2(internal)} + \tag{75}$$

$$2LiH_{(internal)} + 4e- + 2O_{2(external)}$$

$$OH^-_{(external)} + Li_{(internal)} \text{ to } LiH_{(internal)} + e- + 1/2O_{2(external)} \text{ and} \tag{76}$$

$$6OH^-_{(external)} + LaNi_{5(internal)} \text{ to } LaNi_5H_{6(internal)} + e- + 1/2O_{2(external)} \tag{77}$$

In an embodiment, $NH_2^-$ catalyst and H are formed inside of the anode such that hydrinos are formed inside of the anode as well as outside. The catalyst in the latter case may be HOH. The formation of $NH_2^-$ catalyst and H inside of the anode may be due to H transport across the hydrogen permeable anode. The formation of H that undergoes transport may be due to oxidation of $OH^-$ or from $H_2O$ electrolyzed from the energy released in the formation of hydrino. The H may be due to oxidation at the anode and reduction at the cathode, and the ensuing formation of hydrinos with a large energy release comprises another embodiment the CIHT cell that uses at least one of HOH and $NH_2^-$ as the catalyst. The reactants to form the $NH_2^-$ catalyst may comprise Li—N—H system of the present disclosure.

In an embodiment of the CIHT cell such as one comprising an aqueous electrolyte, the anode comprises base-etched NiAl. The anode may comprise tape cast NiAl alloy. The base etched alloy may comprise R—Ni. Alternatively, the anode may comprise a metalized polymer that serves as the $H_2$ permeable anode, such as for the aqueous cell. In an embodiment, the metalized polymer anode comprises at least one of Ni, Co, and Mo. A molten salt electrolytic cell as well as an aqueous electrolytic cell may comprise a metalized anode polymer having a high melting point such as Teflon.

In an embodiment of the CIHT cell, the hydrino reaction rate is dependent on the application or development of a high current. The CIHT cell may be charged and then discharged at a high current to increase the rate of the hydrino reaction. The cell may be charged and discharged intermittently such that a gain in electrical energy is achieved due to the contribution from the hydrino reaction. In an embodiment capable of at least one of high charge and discharge currents, a nickel-metal-hydride-battery-type (NiMH-type cell) CIHT cell comprises a vessel, a positive plate containing nickel hydroxide that is at least partially charged to nickel oxyhydroxide as its active material, a negative plate comprising hydrogen-absorbing alloys such as NiFe, MgNi, and $LaNi_5$ that is charged to the corresponding hydride as the active material, a separator such as Celgard or other fine fibers such as a polyolefin that may be non-woven or woven, and an alkaline electrolyte. Suitable electrolytes are an aqueous hydroxide salt such as an alkali hydroxide such as KOH, NaOH, or LiGH. Another salt such as an alkali halide such as LiBr may be added to improve the conductivity. In an embodiment, the electrolyte for high conductivity to carry high current such as LiOH—LiBr is selected to limit any oxygen reduction reaction and limit corrosion.

In an embodiment, the catalyst HOH is formed at the negative electrode in the presence of a source of H or H such that the catalysis of H to form hydrinos occurs. In an embodiment, the active anode material is a source of H and the active material of the cathode is a source of oxygen or a compound comprising O such as $OH^-$. For a NiMH-type cell, a suitable active anode material is nickel metal hydride, and a suitable active cathode material is nickel oxyhydroxide, NiO(OH). The reactions occurring in this NiMH type cell are:

Anode reaction (negative electrode):

$$OH^- + MH \text{ to } H_2O + M + e^- \tag{78}$$

Cathode reaction (positive electrode):

$$NiO(OH) + H_2O + e^- \text{ to } Ni(OH)_2 + OH^- \tag{79}$$

The "metal" M in the negative electrode of a NiMH-type cell comprises at least one compound that serves the role of reversibly forming a mixture of metal hydride compounds. M may comprise an intermetallic compound such as at least one of $AB_5$, where A is a rare earth mixture of lanthanum, cerium, neodymium, praseodymium and B is nickel, cobalt, manganese, and/or aluminum; and the higher-capacity negative electrode materials based on $AB_2$ compounds, where A is titanium and/or vanadium and B is zirconium or nickel, modified with chromium, cobalt, iron, and/or manganese. M may comprise other suitable hydrides such as those of the present disclosure.

In an embodiment, the hydrogen absorbing alloys combine metal (A) whose hydrides generate heat exothermically with metal (B) whose hydrides generate heat endothermically to produce a suitable binding energy so that hydrogen can be absorbed and released at or near normal pressure and temperature levels. Depending on how the metals are combined, the alloys comprise the following types: AB such as TiFe, $AB_2$ such as ZnMn, $AB_5$ such as $LaNi_5$, and $A_2B$ such as $Mg_2Ni$. Exemplary suitable anode alloys are metals of the lanthanum group wherein nickel serves as the host metal and $AB_2$ type alloys in which titanium and nickel serve as the host metal.

In an embodiment, in addition to the passive internal discharge reactions such as those of Eqs. (78-79), the discharge is driven with an external current or power source to force a high current through the CIHT cell to achieve a high hydrino reaction rate. The high discharge current density may be in the range of at least one of 0.1 A/cm$^2$ to 100,000 A/cm$^2$, 1 A/cm$^2$ to 10,000 A/cm$^2$, 1 A/cm$^2$ to 1000 A/cm$^2$, 10 A/cm$^2$ to 1000 A/cm$^2$, and 10 A/cm$^2$ to 100 A/cm$^2$. The hydrino reaction then provides a contribution to the discharge power such that power and energy gain is achieved in the net of the output minus the input required to recharge the cell and any external current source. In an embodiment, the external current source may comprise another CIHT cell. As given in Eq. (71), the reaction to form hydrinos produces oxygen in the cell as a product. The hydrino gas may diffuse out of the cell, and the oxygen may be converted back to water by the addition of hydrogen gas that may be supplied at the anode as given in FIGS. 1 and 2.

In an embodiment, the electrolyte comprises a molten salt such as one of the present disclosure such as LiOH—LiBr, and the anode H source and cathode oxygen source are stable at the operating temperature exposed to the molten salt electrolyte. An exemplary high-current driven cell is [MH/LiOH—LiBr/FeOOH] wherein MH is a metal hydride that is stable at the operating temperature and conditions. The hydride may comprise a hydrogen storage material such as a metal such as titanium, vanadium, niobium, tantalum, zirconium and hafnium hydrides, rare earth hydrides, yttrium and scandium hydrides, transition element hydrides, intermetallic hydrides, and their alloys known in the art as given by W. M. Mueller, J. P. Blackledge, and G. G. Libowitz, *Metal Hydrides*, Academic Press, New York, (1968), *Hydrogen in Intermetallic Compounds I*, Edited by L. Schlapbach, Springer-Verlag, Berlin, and *Hydrogen in Intermetallic Compounds II*, Edited by L. Schlapbach, Springer-Verlag, Berlin, which are incorporated by reference herein. The metal hydride may comprise a rare earth hydride such as one of lanthanum, gadolinium, ytterbium, cerium, and praseodymium, an inner transition metal hydride such as one of yttrium and neodymium, a transition metal hydride such as one of scandium and titanium, and an alloy hydride such as one of zirconium-titanium (50%/50%). In an embodiment, $H_2$ gas is the source of H at the anode. An exemplary cell is [Ni($H_2$)/LiOH—LiBr/FeOOH].

The present disclosure is further directed to a power system that generates thermal energy comprising: at least one vessel capable of a pressure of at least one of atmospheric, above atmospheric, and below atmospheric; at least one heater, reactants that constitute hydrino reactants comprising: (a) a source of catalyst or a catalyst comprising nascent $H_2O$; (b) a source of atomic hydrogen or atomic hydrogen; (c) reactants comprising a hydroxide compound and a halide compound to form at least one of the source of catalyst, the catalyst, the source of atomic hydrogen, and the atomic hydrogen; and one or more reactants to initiate the catalysis of atomic hydrogen wherein the reaction occurs upon at least one of mixing and heating the reactants. At least one of the hydroxide compound and the halide compound comprise at least one of alkaline, alkaline earth, transition, inner transition, and rare earth metals, and Al, Ga, In, Sn, Pb, Bi, Cd, Cu, Co, Mo, and Ni, Sb, Ge, Au, Ir, Fe, Hg, Mo, Os, Pd, Re, Rh, Ru, Se, Ag, Tc, Te, Tl, Sn, W, and Zn. In an embodiment, the reactants further comprise a source of $H_2O$ that is reacted with the products to regenerate the reactants.

The present disclosure is directed to an electrochemical power system that generates at least one of electricity and thermal energy comprising a vessel closed to atmosphere, the vessel comprising at least one cathode; at least one anode, at least one bipolar plate, and reactants that constitute hydrino reactants during cell operation with separate electron flow and ion mass transport, the reactants comprising at least two components chosen from: (a) at least one source of $H_2O$; (b) at least one source of catalyst or a catalyst comprising at least one of the group chosen from nH, OH, OH–, nascent $H_2O$, $H_2S$, or $MNH_2$, wherein n is an integer and M is alkali metal; and (c) at least one source of atomic hydrogen or atomic hydrogen, one or more reactants to form at least one of the source of catalyst, the catalyst, the source of atomic hydrogen, and the atomic hydrogen; one or more reactants to initiate the catalysis of atomic hydrogen; and a support, wherein the combination of the cathode, anode, reactants, and bipolar plate maintains a chemical potential between each cathode and corresponding anode to permit the catalysis of atomic hydrogen to propagate, and the system further comprising an electrolysis system. In an embodiment, the electrolysis system of the electrochemical power system intermittently electrolyzes H2O to provide the source of atomic hydrogen or atomic hydrogen and discharges the cell such that there is a gain in the net energy balance of the cycle. The reactants may comprise at least one electrolyte chosen from: at least one molten hydroxide; at least one eutectic salt mixture; at least one mixture of a molten hydroxide and at least one other compound; at least one mixture of a molten hydroxide and a salt; at least one mixture of a molten hydroxide and halide salt; at least one mixture of an alkaline hydroxide and an alkaline halide; LiOH—LiBr, LiOH—LiX, NaOH—NaBr, NaOH—NaI, NaOH—NaX, and KOH—KX, wherein X represents a halide), at least one matrix, and at least one additive. The electrochemical power system may further comprise a heater. The cell temperature of the electrochemical power system above the electrolyte melting point may be in at least one range chosen from about 0° C. to 1500° C. higher than the melting point, from about 0° C. to 1000° C. higher than the melting point, from about 0° C. to 500° C. higher than the melting point, 0° C. to about 250° C. higher than the melting point, and from about 0° C. to 100° C. higher than the melting point. In embodiments, the matrix of the electrochemical power system comprises at least one of oxyanion compounds, aluminate, tungstate, zirconate, titanate, sulfate, phosphate, carbonate, nitrate, chromate, and manganate, oxides, nitrides, borides, chalcogenides, silicides, phosphides, and carbides, metals, metal oxides, nonmetals, and nonmetal oxides; oxides of alkali, alkaline earth, transition, inner transition, and earth metals, and Al, Ga, In, Sn, Pb, S, Te, Se, N, P, As, Sb, Bi, C, Si, Ge, and B, and other elements that form oxides or oxyanions; at least one oxide such as one of an alkaline, alkaline earth, transition, inner transition, and rare earth metal, and Al, Ga, In, Sn, Pb, S, Te, Se, N, P, As, Sb, Bi, C, Si, Ge, and B, and other elements that form oxides, and one oxyanion and further comprise at least one cation from the group of alkaline, alkaline earth, transition, inner transition, and rare earth metal, and Al, Ga, In, Sn, and Pb cations; $LiAlO_2$, MgO, $Li_2TiO_3$, or $SrTiO_3$; an oxide of the anode materials and a compound of the electrolyte; at least one of a cation and an oxide of the electrolyte; an oxide of the electrolyte MOH (M=alkali); an oxide of the electrolyte comprising an element, metal, alloy, or mixture of the group of Mo, Ti, Zr, Si, Al, Ni, Fe, Ta, V, B, Nb, Se, Te, W, Cr, Mn, Hf, Co, and M', wherein M' represents an alkaline earth metal; $MoO_2$, $TiO2$, $ZrO_2$, $SiO_2$, $Al_2O_3$, NiO, FeO or $Fe_2O_3$, $TaO_2$, $Ta_2O_5$, VO, $VO_2$, $V_2O_3$, $V_2O_5$, $B_2O_3$, NbO, $NbO_2$, $Nb_2O_5$, $SeO_2$, $SeO_3$, $TeO_2$, $TeO_3$, $WO_2$, $WO_3$, $Cr_3O_4$, $Cr_2O_3$, $CrO_2$, $CrO_3$, MnO, $Mn_3O_4$, $Mn_2O_3$, $MnO_2$, $Mn_2O_7$, $HfO_2$, CoO, $Co_2O_3$, $Co_3O_4$, and MgO; an oxide of the cathode material and optionally an oxide of the electrolyte; $Li_2MoO_3$ or $Li_2MoO_4$, $Li_2TiO_3$, $Li_2ZrO_3$, $Li_2SiO_3$, $LiAlO_2$, $LiNiO_2$, $LiFeO_2$, $LiTaO_3$, $LiVO_3$, $Li_2B_4O_7$, $Li_2NbO_3$, $Li_2PO_4$, $Li_2SeO_3$, $Li_2SeO_4$, $Li_2TeO_3$, $Li_2TeO_4$, $Li_2WO_4$, $Li_2CrO_4$, $Li_2Cr_2O_7$, $Li_2MnO_4$, $Li_2HfO_3$, $LiCoO_2$, and M'O, wherein M' represents an alkaline earth metal, and MgO; an oxide of an element of the anode or an element of the same group, and $Li_2MoO_4$, $MoO_2$, $Li_2WO_4$, $Li_2CrO_4$, and $Li_2Cr_2O_7$ with a Mo anode, and the additive comprises at least one of S, $Li_2S$, oxides, $MoO_2$, $TiO_2$, $ZrO_2$, $SiO_2$, $Al_2O_3$, NiO, FeO or $Fe_2O_3$, $TaO_2$, $Ta_2O_5$, VO, $VO_2$, $V_2O_3$, $V_2O_5$, $P_2O_3$, $P_2O_5$, $B_2O_3$, NbO, $NbO_2$, $Nb_2O_5$, $SeO_2$, $SeO_3$, $TeO_2$, $TeO_3$, $WO_2$, $WO_3$, $Cr_3O_4$, $Cr_2O_3$, $CrO_2$, $CrO_3$, MgO, $Li_2TiO_3$, $LiAlO_2$, $Li_2MoO_3$ or $Li_2MoO_4$, $Li_2ZrO_3$, $Li_2SiO_3$, $LiNiO_2$, $LiFeO_2$, $LiTaO_3$, $LiVO_3$, $Li_2B_4O_7$, $Li_2NbO_3$, $Li_2SeO_3$, $Li_2SeO_4$, $Li_2TeO_3$, $Li_2TeO_4$, $Li_2WO_4$, $Li_2CrO_4$, $Li_2Cr_2O_7$, $Li_2MnO_3$, or $LiCoO_2$, MnO, and $CeO_2$. At least one of the following reactions may occur during the operation of the electrochemical power system: (a) at least one of H and $H_2$ is formed at the discharge anode from electrolysis of $H_2O$; (b) at least one of O and $O_2$ is formed at the discharge cathode from electrolysis of $H_2O$; (c) the hydrogen catalyst is formed by a reaction of the reaction mixture; (d) hydrinos are formed during discharge to produce at least one of electrical power and thermal power; (e) OH− is oxidized and reacts with H to form nascent $H_2O$ that serves as a hydrino catalyst; (f) OH− is oxidized to oxygen ions and H; (g) at least one of oxygen ions, oxygen, and $H_2O$ are reduced at the discharge cathode; (h) H and nascent $H_2O$ catalyst react to form hydrinos; and (i) hydrinos are formed during discharge to produce at least one of electrical power and thermal power. In an embodiment of the electrochemical power system the at least one reaction of the oxidation of OH− and the reduction of at least one of oxygen ions, oxygen, and H2O occur during cell discharge to produce an energy that exceeds the energy during the electrolysis phase of the intermittent electrolysis. The discharge current over time may exceed the current over time during the electrolysis phase of the intermittent electrolysis. In an embodiment, the anode half-cell reaction may be $$OH- + 2H \text{ to } H_2O + e- + H(1/4)$$

wherein the reaction of a first H with OH− to form $H_2O$ catalyst and e− is concerted with the $H_2O$ catalysis of a second H to hydrino. In embodiments, the discharge anode half-cell reaction has a voltage of at least one of about 1.2 volts thermodynamically corrected for the operating temperature relative to the standard hydrogen electrode, and a voltage in at least one of the ranges of about 1.5V to 0.75V, 1.3V to 0.9V, and 1.25V to 1.1V relative to a standard hydrogen electrode and 25° C., and the cathode half-cell reactions has a voltage of at least one of about 0 V thermodynamically corrected for the operating temperature, and a voltage in at least one of the ranges of about −0.5V to +0.5V, −0.2V to +0.2V, and −0.1V to +0.1V relative to the standard hydrogen electrode and 25° C.

In an embodiment of the electrochemical power system of the present disclosure, the cathode comprises NiO, the anode comprises at least one of Ni, Mo, HAYNES® 242® alloy, and carbon, and the bimetallic junction comprises at least one of Hastelloy, Ni, Mo, and H HAYNES® 242@ alloy that is a different metal than that of the anode. The electrochemical power system may comprise at least one stack of cells wherein the bipolar plate comprises a bimetallic junction separating the anode and cathode. In an embodiment, the cell is supplied with H2O, wherein the H2O vapor pressure is in at least one range chosen from about 0.001 Torr to 100 atm, about 0.001 Torr to 0.1 Torr, about 0.1 Torr to 1 Torr, about 1 Torr to 10 Torr, about 10 Torr to 100 Torr, about 100 Torr to 1000 Torr, and about 1000 Torr to 100 atm, and the balance of pressure to achieve at least atmospheric pressure is provided by a supplied inert gas comprising at least one of a noble gas and N2. In an embodiment, the electrochemical power system may comprise a water vapor generator to supply H2O to the system. In an embodiment, the cell is intermittently switched between charge and discharge phases, wherein (i) the charging phase comprises at least the electrolysis of water at electrodes of opposite voltage polarity, and (ii) the discharge phase comprises at least the formation of $H_2O$ catalyst at one or both of the electrodes; wherein (i) the role of each electrode of each cell as the cathode or anode reverses in switching back and forth between the charge and discharge phases, and (ii) the current polarity reverses in switching back and forth between the charge and discharge phases, and wherein the charging comprises at least one of the application of an applied current and voltage. In embodiments, at least one of the applied current and voltage has a waveform comprising a duty cycle in the range of about 0.001% to about 95%; a peak voltage per cell within the range of about 0.1 V to 10 V; a peak power density of about 0.001 $W/cm^2$ to 1000 $W/cm^2$, and an average power within the range of about 0.0001 $W/cm^2$ to 100 $W/cm^2$ wherein the applied current and voltage further comprises at least one of direct voltage, direct current, and at least one of alternating current and voltage waveforms, wherein the waveform comprises frequencies within the range of about 1 Hz to about 1000 Hz. The waveform of the intermittent cycle may comprise at least one of constant current, power, voltage, and resistance, and variable current, power, voltage, and resistance for at least one of the electrolysis and discharging phases of the intermittent cycle. In embodiments, the parameters for at least one phase of the cycle comprises: the frequency of the intermittent phase is in at least one range chosen from about 0.001 Hz to 10 MHz, about 0.01 Hz to 100 kHz, and about 0.01 Hz to 10 kHz; the voltage per cell is in at least one range chosen from about 0.1 V to 100 V, about 0.3 V to 5 V, about 0.5 V to 2 V, and about 0.5 V to 1.5 V; the current per electrode area active to form hydrinos is in at least one range chosen from about 1 microamp cm$^{-2}$ to 10 A cm$^{-2}$, about 0.1 milliamp cm$^{-2}$ to 5 A cm$^{-2}$, and about 1 milliamp cm$^{-2}$ to 1 A cm$^{-2}$; the power per electrode area active to form hydrinos is in at least one range chosen from about 1 microW cm$^{-2}$ to 10 W cm$^{-2}$, about 0.1 milliW cm$^{-2}$ to 5 W cm$^{-2}$, and about 1 milliW cm$^{-2}$ to 1 W cm$^{-2}$; the constant current per electrode area active to form hydrinos is in the range of about 1 microamp cm$^{-2}$ to 1 A cm$^{-2}$; the constant power per electrode area active to form hydrinos is in the range of about 1 milliW cm$^{-2}$ to 1 W cm$^{-2}$; the time interval is in at least one range chosen from about 10$^{-4}$ s to 10,000 s, 10$^{-3}$ s to 1000 s, and 10$^{-2}$ s to 100 s, and 10$^{-1}$ s to 10 s; the resistance per cell is in at least one range chosen from about 1 milliohm to 100 Mohm, about 1 ohm to 1 Mohm, and 10 ohm to 1 kohm; conductivity of a suitable load per electrode area active to form hydrinos is in at least one range chosen from about 10$^{-5}$ to 1000 ohm$^{-1}$ cm$^{-2}$, 10$^{-4}$ to 100 ohm$^{-1}$ cm$^{-2}$, 10$^{-3}$ to 10 ohm$^{-1}$ cm$^{-2}$, and 10$^{-2}$ to 1 ohm$^{-1}$ cm$^{-2}$, and at least one of the discharge current, voltage, power, or time interval is larger than that of the electrolysis phase to give rise to at least one of power or energy gain over the cycle. The voltage during discharge may be maintained above that which prevents the anode from excessively corroding.

In an embodiment of the electrochemical power system, the catalyst-forming reaction is given by $$O_2+5H^++5e^-\ \text{to}\ 2H_2O+H(1/p);$$

the counter half-cell reaction is given by $$H_2\ \text{to}\ 2H^++2e^-;\ \text{and}$$

the overall reaction is given by $$3/2H_2+1/2O_2\ \text{to}\ H_2O+H(1/p).$$

At least one of the following products may be formed from hydrogen during the operation of the electrochemical power system: (a) a hydrogen product with a Raman peak at integer multiple of 0.23 to 0.25 cm$^{-1}$ plus a matrix shift in the range of 0 cm$^{-1}$ to 2000 cm$^{-1}$; (b) a hydrogen product with a infrared peak at integer multiple of 0.23 cm$^{-1}$ to 0.25 cm$^{-1}$ plus a matrix shift in the range of 0 cm$^{-1}$ to 2000 cm$^{-1}$; (c) a hydrogen product with a X-ray photoelectron spectroscopy peak at an energy in the range of 475 eV to 525 eV or 257 eV, 509 eV, 506 eV, 305 eV, 490 eV, 400 eV, or 468 eV, plus a matrix shift in the range of 0 eV to 10 eV; (d) a hydrogen product that causes an upfield MAS NMR matrix shift; (e) a hydrogen product that has an upfield MAS NMR or liquid NMR shift of greater than −5 ppm relative to TMS; (f) a hydrogen product with at least two electron-beam emission spectral peaks in the range of 200 nm to 300 nm having a spacing at an integer multiple of 0.23 cm$^{-1}$ to 0.3 cm$^{-1}$ plus a matrix shift in the range of 0 cm$^{-1}$ to 5000 cm$^{-1}$; and (g) a hydrogen product with at least two UV fluorescence emission spectral peaks in the range of 200 nm to 300 nm having a spacing at an integer multiple of 0.23 cm$^{-1}$ to 0.3 cm$^{-1}$ plus a matrix shift in the range of 0 cm$^{-1}$ to 5000 cm$^{-1}$.

The present disclosure is further directed to an electrochemical power system comprising a hydrogen anode comprising a hydrogen permeable electrode; a molten salt electrolyte comprising a hydroxide; and at least one of an O$_2$ and a H$_2$O cathode. In embodiments, the cell temperature that maintains at least one of a molten state of the electrolyte and the membrane in a hydrogen permeable state is in at least one range chosen from about 25° C. to 2000° C., about 100° C. to 1000° C., about 200° C. to 750° C., and about 250° C. to 500° C., the cell temperature above the electrolyte melting point in at least one range of about 0° C. to 1500° C. higher than the melting point, 0° C. to 1000° C. higher than the melting point, 0° C. to 500° C. higher than the melting point, 0° C. to 250° C. higher than the melting point, and 0° C. to 100° C. higher than the melting point; the membrane thickness is in at least one range chosen from about 0.0001 cm to 0.25 cm, 0.001 cm to 0.1 cm, and 0.005 cm to 0.05 cm; the hydrogen pressure is maintained in at least one range chosen from about 1 Torr to 500 atm, 10 Torr to 100 atm, and 100 Torr to 5 atm; the hydrogen permeation rate is in at least one range chosen from about 1×10$^{-13}$ mole s$^{-1}$ cm$^{-2}$ to 1×10$^{-4}$ mole s$^{-1}$ cm$^{-2}$, 1×10$^{-12}$ mole s$^{-1}$ cm$^{-2}$ to 1×10$^{-5}$ mole s$^{-1}$ cm$^{-2}$, 1×10$^{-11}$ mole s$^{-1}$ cm$^{-2}$ to 1×10$^{-6}$ mole s$^{-1}$ cm$^{-2}$, 1×10$^{-10}$ mole s$^{-1}$ cm$^{-2}$ to 1×10$^{-7}$ mole s$^{-1}$ cm$^{-2}$, and 1×10$^{-9}$ mole s$^{-1}$ cm$^{-2}$ to 1×10$^{-8}$ mole s$^{-1}$ cm$^{-2}$. In an embodiment, the electrochemical power system comprises a hydrogen anode comprising a hydrogen-sparging electrode; a molten salt electrolyte comprising a hydroxide, and at least one of an O2 and a H2O cathode. In embodiments, the cell temperature that maintains a molten state of the electrolyte is in at least one range chosen from about 0° C. to 1500° C. higher than the electrolyte melting point, 0° C. to 1000° C. higher than the electrolyte melting point, 0° C. to 500° C. higher than the electrolyte melting point, 0° C. to 250° C. higher than the electrolyte melting point, and 0° C. to 100° C. higher than the electrolyte melting point; the hydrogen flow rate per geometric area of the H2 bubbling or sparging electrode is in at least one range chosen from about 1×10$^{-13}$ mole s$^{-1}$ cm$^{-2}$ to 1×10$^{-4}$ mole s$^{-1}$ cm$^{-2}$, 1×10$^{-12}$ mole s$^{-1}$ cm$^{-2}$ to 1×10$^{-5}$ mole s$^{-1}$ cm$^{-2}$, 1×10$^{-11}$ mole s$^{-1}$ cm$^{-2}$ to 1×10$^{-6}$ mole s$^{-1}$ cm$^{-2}$, 1×10$^{-10}$ mole s$^{-1}$ cm$^{-2}$ to 1×10$^{-7}$ mole s$^{-1}$ cm$^{-2}$, and 1×10$^{-9}$ mole s$^{-1}$ cm$^{-2}$ to 1×10$^{-8}$ mole s$^{-1}$ cm$^{-2}$; the rate of reaction at the counter electrode matches or exceeds that at the electrode at which hydrogen reacts; the reduction rate of at least one of H$_2$O and O$_2$ is sufficient to maintain the reaction rate of H or H$_2$, and the counter electrode has a surface area and a material sufficient to support the sufficient rate.

The present disclosure is further directed to a power system that generates thermal energy comprising: at least one vessel capable of a pressure of at least one of atmospheric, above atmospheric, and below atmospheric; at least one heater, reactants that constitute hydrino reactants comprising: (a) a source of catalyst or a catalyst comprising nascent H2O; (b) a source of atomic hydrogen or atomic hydrogen; (c) reactants to form at least one of the source of catalyst, the catalyst, the source of atomic hydrogen, and the atomic hydrogen; and one or more reactants to initiate the catalysis of atomic hydrogen wherein the reaction occurs upon at least one of mixing and heating the reactants. In embodiments, the reaction of the power system to form at least one of the source of catalyst, the catalyst, the source of atomic hydrogen, and the atomic hydrogen comprise at least one reaction chosen from a dehydration reaction; a combustion reaction; a reaction of a Lewis acid or base and a Bronsted-Lowry acid or base; an oxide-base reaction; an acid anhydride-base reaction; an acid-base reaction; a base-active metal reaction; an oxidation-reduction reaction; a decomposition reaction; an exchange reaction, and an exchange reaction of a halide, O, S, Se, Te, NH3, with compound having at least one OH; a hydrogen reduction reaction of a compound comprising O, and the source of H is at least one of nascent H formed when the reactants undergo reaction and hydrogen from a hydride or gas source and a dissociator.

VI. Chemical Reactor

The present disclosure is also directed to other reactors for producing increased binding energy hydrogen species and compounds of the present disclosure, such as dihydrino molecules and hydrino hydride compounds. Further products of the catalysis are power and optionally plasma and light depending on the cell type. Such a reactor is hereinafter referred to as a "hydrogen reactor" or "hydrogen cell." The hydrogen reactor comprises a cell for making hydrinos. The cell for making hydrinos may take the form of a chemical reactor or gas fuel cell such as a gas discharge cell, a plasma torch cell, or microwave power cell, and an electrochemical cell. Exemplary embodiments of the cell for making hydrinos may take the form of a liquid-fuel cell, a solid-fuel cell, a heterogeneous-fuel cell, a CIHT cell, and an SF-CIHT cell. Each of these cells comprises: (i) a source of atomic hydrogen; (ii) at least one catalyst chosen from a solid catalyst, a molten catalyst, a liquid catalyst, a gaseous catalyst, or mixtures thereof for making hydrinos; and (iii) a vessel for reacting hydrogen and the catalyst for making hydrinos. As used herein and as contemplated by the present disclosure, the term "hydrogen," unless specified otherwise, includes not only proteum ($^1H$), but also deuterium ($^2H$) and tritium ($^3H$). Exemplary chemical reaction mixtures and reactors may comprise SF-CIHT, CIHT, or thermal cell embodiments of the present disclosure. Additional exemplary embodiments are given in this Chemical Reactor section. Examples of reaction mixtures having $H_2O$ as catalyst formed during the reaction of the mixture are given in the present disclosure. Other catalysts such as those given in TABLES 1 and 3 may serve to form increased binding energy hydrogen species and compounds. An exemplary M-H type catalyst of TABLE 3A is NaH. The reactions and conditions may be adjusted from these exemplary cases in the parameters such as the reactants, reactant wt %'s, $H_2$ pressure, and reaction temperature. Suitable reactants, conditions, and parameter ranges are those of the present disclosure. Hydrinos and molecular hydrino are shown to be products of the reactors of the present disclosure by predicted continuum radiation bands of an integer times 13.6 eV, otherwise unexplainable extraordinarily high H kinetic energies measured by Doppler line broadening of H lines, inversion of H lines, formation of plasma without a breakdown fields, and anomalously plasma afterglow duration as reported in Mills Prior Publications. The data such as that regarding the CIHT cell and solid fuels has been validated independently, off site by other researchers. The formation of hydrinos by cells of the present disclosure was also confirmed by electrical energies that were continuously output over long-duration, that were multiples of the electrical input that in most cases exceed the input by a factor of greater than 10 with no alternative source. The predicted molecular hydrino $H_2(1/4)$ was identified as a product of CIHT cells and solid fuels by MAS H NMR that showed a predicted upfield shifted matrix peak of about −4.4 ppm, ToF-SIMS and ESI-ToFMS that showed $H_2(1/4)$ complexed to a getter matrix as m/e=M+n2 peaks wherein M is the mass of a parent ion and n is an integer, electron-beam excitation emission spectroscopy and photoluminescence emission spectroscopy that showed the predicted rotational and vibration spectrum of $H_2(1/4)$ having 16 or quantum number p=4 squared times the energies of $H_2$, Raman and FTIR spectroscopy that showed the rotational energy of $H_2(1/4)$ of 1950 cm$^{-1}$, being 16 or quantum number p=4 squared times the rotational energy of $H_2$, XPS that showed the predicted total binding energy of $H_2(1/4)$ of 500 eV, and a ToF-SIMS peak with an arrival time before the m/e=1 peak that corresponded to H with a kinetic energy of about 204 eV that matched the predicted energy release for H to H(1/4) with the energy transferred to a third body H as reported in Mills Prior Publications and in R. Mills X Yu, Y. Lu, G Chu, J. He, J. Lotoski, "Catalyst Induced Hydrino Transition (CIHT) Electrochemical Cell", International Journal of Energy Research, (2013) and R. Mills, J. Lotoski, J. Kong, G Chu, J. He, J. Trevey, "High-Power-Density Catalyst Induced Hydrino Transition (CIHT) Electrochemical Cell" (2014) which are herein incorporated by reference in their entirety.

Using both a water flow calorimeter and a Setaram DSC 131 differential scanning calorimeter (DSC), the formation of hydrinos by cells of the present disclosure such as ones comprising a solid fuel to generate thermal power was confirmed by the observation of thermal energy from hydrino-forming solid fuels that exceed the maximum theoretical energy by a factor of 60 times. The MAS H NMR showed a predicted $H_2(1/4)$ upfield matrix shift of about −4.4 ppm. A Raman peak starting at 1950 cm$^{-1}$ matched the free space rotational energy of $H_2(1/4)$ (0.2414 eV). These results are reported in Mills Prior Publications and in R. Mills, J. Lotoski, W. Good, J. He, "Solid Fuels that Form HOH Catalyst", (2014) which is herein incorporated by reference in its entirety.

In an embodiment, a solid fuel reaction forms $H_2O$ and H as products or intermediate reaction products. The $H_2O$ may serve as a catalyst to form hydrinos. The reactants comprise at least one oxidant and one reductant, and the reaction comprises at least one oxidation-reduction reaction. The reductant may comprise a metal such as an alkali metal. The reaction mixture may further comprise a source of hydrogen, and a source of $H_2O$, and may optionally comprise a support such as carbon, carbide, boride, nitride, carbonitrile such as TiCN, or nitrile. The support may comprise a metal powder. In an embodiment, a hydrogen support comprises Mo or a Mo alloy such as those of the present disclosure such as MoPt, MoNi, MoCu, and MoCo. In an embodiment, oxidation of the support is avoided by methods such as selecting the other components of the reaction mixture that do not oxidize the support, selecting a non-oxidizing reaction temperature and conditions, and maintaining a reducing atmosphere such as a $H_2$ atmosphere as known by one skilled in the art. The source of H may be selected from the group of alkali, alkaline earth, transition, inner transition, rare earth hydrides, and hydrides of the present disclosure. The source of hydrogen may be hydrogen gas that may further comprise a dissociator such as those of the present disclosure such as a noble metal on a support such as carbon or alumina and others of the present disclosure. The source of water may comprise a compound that dehydrates such as a hydroxide or a hydroxide complex such as those of Al, Zn, Sn, Cr, Sb, and Pb. The source of water may comprise a source of hydrogen and a source of oxygen. The oxygen source may comprise a compound comprising oxygen. Exemplary compounds or molecules are $O_2$, alkali or alkali earth oxide, peroxide, or superoxide, $TeO_2$, $SeO_2$, $PO_2$, $P_2O_5$, $SO_2$, $SO_3$, $M_2SO_4$, $MHSO_4$, $CO_2$, $M_2S_2O_8$, $MMnO_4$, $M_2Mn_2O_4$, $M_xH_yPO_4$ (x, y=integer), $POBr_2$, $MClO_4$, $MNO_3$, $NO$, $N_2O$, $NO_2$, $N_2O_3$, $Cl_2O_7$, and $O_2$ (M=alkali; and alkali earth or other cation may substitute for M). Other exemplary reactants comprise reagents selected from the group of Li, LiH, $LiNO_3$, LiNO, $LiNO_2$, $Li_3N$, $Li_2NH$, $LiNH_2$, LiX, $NH_3$, $LiBH_4$, $LiAlH_4$, $Li_3AlH_6$, LiOH, $Li_2S$, LiHS, LiFeSi, $Li_2CO_3$, $LiHCO_3$, $Li_2SO_4$, $LiHSO_4$, $Li_3PO_4$, $Li_2HPO_4$, $LiH_2PO_4$, $Li_2MoO_4$, $LiNbO_3$, $Li_2B_4O_7$ (lithium tetraborate), $LiBO_2$, $Li_2WO_4$, $LiAlCl_4$, $LiGaCl_4$, $Li_2CrO_4$, $Li_2Cr_2O_7$, $Li_2TiO_3$, $LiZrO_3$, $LiAlO_2$, $LiCoO_2$, $LiGaO_2$, $Li_2GeO_3$, $LiMn_2O_4$, $Li_4SiO_4$, $Li_2SiO_3$, $LiTaO_3$, $LiCuCl_4$, $LiPdCl_4$, $LiVO_3$, $LiIO_3$, $LiBrO_3$, $LiXO_3$ (X=F, Br, Cl, I), $LiFeO_2$, $LiIO_4$, $LiBrO_4$, $LiIO_4$, $LiXO_4$ (X=F, Br, Cl, I), $LiScO_n$, $LiTiO_n$, $LiVO_n$, $LiCrO_n$, $LiCr_2O_n$, $LiMn_2O_n$, $LiFeO_n$, $LiCoO_n$, $LiNiO_n$, $LiNi_2O_n$, $LiCuO_n$, and $LiZnO_n$, where n=1, 2, 3, or 4, an oxyanion, an oxyanion of a strong acid, an oxidant, a molecular oxidant such as $V_2O_3$, $I_2O_5$, $MnO_2$, $Re_2O_7$, $CrO_3$, $RuO_2$, AgO, PdO, $PdO_2$, PtO, $PtO_2$, and $NH_4X$ wherein X is a nitrate or other suitable anion given in the CRC, and a reductant. Another alkali metal or other cation may substitute for Li. Additional sources of oxygen may be selected from the group of $MCoO_2$, $MGaO_2$, $M_2GeO_3$, $MMn_2O_4$, $M_4SiO_4$, $M_2SiO_3$, $MTaO_3$, $MVO_3$, $MIO_3$, $MFeO_2$, $MIO_4$, $MClO_4$, $MScO_n$, $MTiO_n$, $MVO_n$, $MCrO_n$, $MCr_2O_n$, $MMn_2O_n$, $MFeO_n$, $MCoO_n$, $MNiO_n$, $MNi_2O_n$, $MCuO_n$, and $MZnO_n$, where M is alkali and n=1, 2, 3, or 4, an oxyanion, an oxyanion of a strong acid, an oxidant, a molecular oxidant such as $V_2O_3$, $I_2O_5$, $MnO_2$, $Re_2O_7$, $CrO_3$, $RuO_2$, AgO, PdO, $PdO_2$, PtO, $PtO_2$, $I_2O_4$, $I_2O_5$, $I_2O_9$, $SO_2$, $SO_3$, $CO_2$, $N_2O$, NO, $NO_2$, $N_2O_3$, $N_2O_4$, $N_2O_5$, $Cl_2O$, $ClO_2$, $Cl_2O_3$, $Cl_2O_6$, $Cl_2O_7$, $PO_2$, $P_2O_3$, and $P_2O_5$. The reactants may be in any desired ratio that forms hydrinos. An exemplary reaction mixture is 0.33 g of LiH, 1.7 g of $LiNO_3$ and the mixture of 1 g of MgH2 and 4 g of activated C powder. Another exemplary reaction mixture is that of gun powder such as $KNO_3$ (75 wt %), softwood charcoal (that may comprise about the formulation $C_7H_4O$) (15 wt %), and S (10 wt %); $KNO_3$ (70.5 wt %) and softwood charcoal (29.5 wt %) or these ratios within the range of about ±1-30 wt %. The source of hydrogen may be charcoal comprising about the formulation $C_7H_4O$.

In an embodiment, the reaction mixture comprises reactants that form nitrogen, carbon dioxide, and $H_2O$ wherein the latter serves as the hydrino catalyst for H also formed in the reaction. In an embodiment, the reaction mixture comprises a source of hydrogen and a source of $H_2O$ that may comprise a nitrate, sulfate, perchlorate, a peroxide such as hydrogen peroxide, peroxy compound such as triacetone-triperoxide (TATP) or diacetone-diperoxide (DADP) that may also serve as a source of H especially with the addition of $O_2$ or another oxygen source such as a nitro compound such as nitrocellulose (APNC), oxygen or other compound comprising oxygen or oxyanion compound. The reaction mixture may comprise a source of a compound or a compound, or a source of a functional group or a functional group comprising at least two of hydrogen, carbon, hydrocarbon, and oxygen bound to nitrogen. The reactants may comprise a nitrate, nitrite, nitro group, and nitramine. The nitrate may comprise a metal such as alkali nitrate, may comprise ammonium nitrate, or other nitrates known to those skilled in the art such as alkali, alkaline earth, transition, inner transition, or rare earth metal, or Al, Ga, In, Sn, or Pb nitrates. The nitro group may comprise a functional group of an organic compound such as nitromethane, nitroglycerin, trinitrotoluene or a similar compound known to those skilled in the art. An exemplary reaction mixture is $NH_4NO_3$ and a carbon source such as a long chain hydrocarbon ($C_nH_{2n+2}$) such as heating oil, diesel fuel, kerosene that may comprise oxygen such as molasses or sugar or nitro such as nitromethane or a carbon source such as coal dust. The H source may also comprise the $NH_4$, the hydrocarbon such as fuel oil, or the sugar wherein the H bound to carbon provides a controlled release of H. The H release may be by a free radical reaction. The C may react with O to release H and form carbon-oxygen compounds such as CO, $CO_2$, and formate. In an embodiment, a single compound may comprise the functionalities to form nitrogen, carbon dioxide, and $H_2O$. A nitramine that further comprises a hydrocarbon functionality is cyclotrimethylene-trinitramine, commonly referred to as Cyclonite or by the code designation RDX. Other exemplary compounds that may serve as at least one of the source of H and the source of $H_2O$ catalyst such as a source of at least one of a source of O and a source of H are at least one selected from the group of ammonium nitrate (AN), black powder (75% $KNO_3$+15% charcoal+10% S), ammonium nitrate/fuel oil (ANFO) (94.3% AN+5.7% fuel oil), erythritol tetranitrate, trinitrotoluene (TNT), amatol (80% TNT+20% AN), tetrytol (70% tetryl+30% TNT), tetryl (2,4,6-trinitrophenylmethylnitramine ($C_7H_5N_5O_8$)), C-4 (91% RDX), C-3 (RDX based), composition B (63% RDX+36% TNT), nitroglycerin, RDX (cyclotrimethylen-etrinitramine), Semtex (94.3% PETN+5.7% RDX), PETN (pentaerythritol tetranitrate), HMX or octogen (octahydro-1,3,5,7-tetranitro-1,3,5,7-tetrazocine), HNIW (CL-20) (2,4,6,8,10,12-hexanitro-2,4,6,8,10,12-hexaazaisowurtzitane), DDF, (4,4'-dinitro-3,3'-diazenofuroxan), heptanitrocubane, octanitrocubane, 2,4,6-tris(trinitromethyl)-1,3,5-triazine, TATNB (1,3,5-trinitrobenzene, 3,5-triazido-2,4,6-trinitrobenzene), trinitroanaline, TNP (2,4,6-trinitrophenol or picric acid), dunnite (ammonium picrate), methyl picrate, ethyl picrate, picrate chloride (2-chloro-1,3,5-trinitrobenzene), trinitrocresol, lead styphnate (lead 2,4,6-trinitroresorcinate, $C_6HN_3O_8Pb$), TATB (triaminotrinitrobenzene), methyl nitrate, nitroglycol, mannitol hexanitrate, ethylenedinitramine, nitroguanidine, tetranitroglycoluril, nitrocellulose, urea nitrate, and hexamethylene triperoxide diamine (HMTD). The ratio of hydrogen, carbon, oxygen, and nitrogen may be in any desired ratio. In an embodiment of a reaction mixture of ammonium nitrate (AN) and fuel oil (FO) known as ammonium nitrate/fuel oil (ANFO), a suitable stoichiometry to give about a balanced reaction is about 94.3 wt % AN and 5.7 wt % FO, but the FO may be in excess. An exemplary balanced reaction of AN and nitromethane is $$3NH_4NO_3 + 2CH_3NO_2 \text{ to } 4N_2 + 2CO_2 + 9H_2O \tag{80}$$

wherein some of the H is also converted to lower energy hydrogen species such as $H_2(1/p)$ and $H^-(1/p)$ such as p=4. In an embodiment, the molar ratios of hydrogen, nitrogen, and oxygen are similar such as in RDX having the formula $C_3H_6N_6O_6$.

In an embodiment, the energetics is increased by using an addition source of atomic hydrogen such as $H_2$ gas or a hydride such as alkali, alkaline earth, transition, inner transition, and rare earth metal hydrides and a dissociator such as Ni, Nb, or a noble metal on a support such as carbon, carbide, boride, or nitride or silica or alumina. The reaction mixture may produce a compression or shock wave during reaction to form H₂O catalyst and atomic H to increase the kinetics to form hydrinos. The reaction mixture may comprise at least one reactant to increase the heat during the reaction to form H and H₂O catalyst. The reaction mixture may comprise a source of oxygen such as air that may be dispersed between granules or prills of the solid fuel. For example AN prills may comprise about 20% air. The reaction mixture may further comprise a sensitizer such as air-filled glass beads. In an exemplary embodiment, a powdered metal such as Al is added to increase the heat and kinetics of reaction. For example, Al metal powder may be added to ANFO. Other reaction mixtures comprise pyrotechnic materials that also have a source of H and a source of catalyst such as H₂O. In an embodiment, the formation of hydrinos has a high activation energy that can be provided by an energetic reaction such as that of energetic or pyrotechnic materials wherein the formation of hydrinos contributes to the self-heating of the reaction mixture. Alternatively, the activation energy can be provided by an electrochemical reaction such as that of the CIHT cell that has a high equivalent temperature corresponding to 11,600 K/eV.

Another exemplary reaction mixture is H₂ gas that may be in the pressure range of about 0.01 atm to 100 atm, a nitrate such as an alkali nitrate such as KNO₃, and hydrogen dissociator such as Pt/C, Pd/C, Pt/Al₂O₃, or Pd/Al₂O₃. The mixture may further comprise carbon such as graphite or Grade GTA Grafoil (Union Carbide). The reaction ratios may be any desired such as about 1 to 10% Pt or Pd on carbon at about 0.1 to 10 wt % of the mixture mixed with the nitrate at about 50 wt %, and the balance carbon; though the ratios could be altered by a factor of about 5 to 10 in exemplary embodiments. In the case that carbon is used as a support, the temperature is maintained below that which results in a C reaction to form a compound such as a carbonate such as an alkali carbonate. In an embodiment, the temperature is maintained in a range such as about 50° C.-300° C. or about 100° C.-250° C. such that NH₃ is formed over N₂.

The reactants and regeneration reaction and systems may comprise those of the present disclosure or in my prior US patent applications such as Hydrogen Catalyst Reactor, PCT/US08/61455, filed PCT Apr. 24, 2008; Heterogeneous Hydrogen Catalyst Reactor, PCT/US09/052072, filed PCT Jul. 29, 2009; Heterogeneous Hydrogen Catalyst Power System, PCT/US10/27828, PCT filed Mar. 18, 2010; Electrochemical Hydrogen Catalyst Power System, PCT/US11/28889, filed PCT Mar. 17, 2011; H₂O-Based Electrochemical Hydrogen-Catalyst Power System, PCT/US12/31369 filed Mar. 30, 2012, and CHIT Power System, PCT/US13/041938 filed May 21, 2013 ("Mills Prior Applications") herein incorporated by reference in their entirety.

In an embodiment, the reaction may comprise a nitrogen oxide such as N₂O, NO₂, or NO rather than a nitrate. Alternatively the gas is also added to the reaction mixture. NO, NO₂, and N₂O and alkali nitrates can be generated by known industrial methods such as by the Haber process followed by the Ostwald process. In one embodiment, the exemplary sequence of steps is:

$$N_2 \xrightarrow[\text{process}]{H_2 \text{ Haber}} NH_3 \xrightarrow[\text{process}]{O_2 \text{ Ostwald}} NO, N_2O, NO_2. \quad (81)$$

Specifically, the Haber process may be used to produce NH₃ from N₂ and H₂ at elevated temperature and pressure using a catalyst such as α-iron containing some oxide. The Ostwald process may be used to oxidize the ammonia to NO, NO₂, and N₂O at a catalyst such as a hot platinum or platinum-rhodium catalyst. In an embodiment, the products are at least one of ammonia and an alkali compound. NO₂ may be formed from NH₃ by oxidation. NO₂ may be dissolved in water to form nitric acid that is reacted with the alkali compound such as M₂O, MOH, M₂CO₃, or MHCO₃ to form M nitrate wherein M is alkali.

In an embodiment, at least one reaction of a source of oxygen such as MNO₃ (M=alkali) to form H₂O catalyst, (ii) the formation of atomic H from a source such as H₂, and (iii) the reaction to form hydrinos occurs by or an on a conventional catalyst such as a noble metal such as Pt that may be heated. The heated catalyst may comprise a hot filament. The filament may comprise a hot Pt filament. The source of oxygen such as MNO₃ may be at least partially gaseous. The gaseous state and its vapor pressure may be controlled by heating the MNO₃ such as KNO₃. The source of oxygen such as MNO₃ may be in an open boat that is heated to release gaseous MNO₃. The heating may be with a heater such as the hot filament. In an exemplary embodiment, MNO₃ is placed in a quartz boat and a Pt filament is wrapped around the boat to serve as the heater. The vapor pressure of the MNO₃ may be maintained in the pressure range of about 0.1 Torr to 1000 Torr or about 1 Torr to 100 Torr. The hydrogen source may be gaseous hydrogen that is maintained in the pressure range of about 1 Torr to 100 atm, about 10 Torr to 10 atm, or about 100 Torr to 1 atm. The filament also serves to dissociate hydrogen gas that may be supplied to the cell through a gas line. The cell may also comprise a vacuum line. The cell reactions give rise to H₂O catalyst and atomic H that react to form hydrinos. The reaction may be maintained in a vessel capable of maintaining at least one of a vacuum, ambient pressure, or a pressure greater than atmospheric. The products such as NH₃ and MOH may be removed from the cell and regenerated. In an exemplary embodiment, MNO₃ reacts with the hydrogen source to form H₂O catalyst and NH₃ that is regenerated in a separate reaction vessel or as a separate step by oxidation. In an embodiment, the source of hydrogen such as H₂ gas is generated from water by at least one of electrolysis or thermally. Exemplary thermal methods are the iron oxide cycle, cerium(IV) oxide-cerium(III) oxide cycle, zinc zinc-oxide cycle, sulfur-iodine cycle, copper-chlorine cycle and hybrid sulfur cycle and others known to those skilled in the art. Exemplary cell reactions to form H₂O catalyst that reacts further with H to form hydrinos are $$KNO_3 + 9/2H_2 \rightarrow K + NH_3 + 3H_2O. \quad (82)$$

$$KNO_3 + 5H_2 \rightarrow KH + NH_3 + 3H_2O. \quad (83)$$

$$KNO_3 + 4H_2 \rightarrow KOH + NH_3 + 2H_2O. \quad (84)$$

$$KNO_3 + C + 2H_2 \rightarrow KOH + NH_3 + CO_2. \quad (85)$$

$$2KNO_3 + C + 3H_2 \rightarrow K_2CO_3 + 1/2N_2 + 3H_2O. \quad (86)$$

An exemplary regeneration reaction to form nitrogen oxides is given by Eq. (81). Products such a K, KH, KOH, and K₂CO₃ may be reacted with nitric acid formed by addition of nitrogen oxide to water to form $KNO_2$ or $KNO_3$. Additional suitable exemplary reactions to form at least one of the reacts $H_2O$ catalyst and $H_2$ are given in TABLES 5, 6, and 7.

TABLE 5

Thermally reversible reaction cycles regarding $H_2O$ catalyst and $H_2$. [L. C. Brown, G. E. Besenbruch, K. R. Schultz, A. C. Marshall, S. K. Showalter, P. S. Pickard and J. F. Funk, Nuclear Production of Hydrogen Using Thermochemical Water-Splitting Cycles, a preprint of a paper to be presented at the International Congress on Advanced Nuclear Power preprint of a paper to be presented at the International Congress on Advanced Nuclear Power Plants (ICAPP) in Hollywood, Florida, Jun. 19-13, 2002, and published in the Proceedings.]

| | Cycle Name | T/E* | T (° C.) | Reaction |
|---|---|---|---|---|
| 1 | Westinghouse | T | 850 | $2H_2SO_4(g) \rightarrow 2SO_2(g) + 2H_2O(g) + O_2(g)$ |
| | | E | 77 | $SO_2(g) + 2H_2O(a) \rightarrow\rightarrow H_2SO_4(a) + H_2(g)$ |
| 2 | Ispra Mark 13 | T | 850 | $2H_2SO_4(g) \rightarrow 2SO_2(g) + 2H_2O(g) + O_2(g)$ |
| | | E | 77 | $2HBr(a) \rightarrow Br_2(a) + H_2(g)$ |
| | | T | 77 | $Br_2(1) + SO_2(g) + 2H_2O(l) \rightarrow 2HBr(g) + H_2SO_4(a)$ |
| 3 | UT-3 Univ. of Tokyo | T | 600 | $2Br_2(g) + 2CaO \rightarrow 2CaBr_2 + O_2(g)$ |
| | | T | 600 | $3FeBr_2 + 4H_2O \rightarrow Fe_3O_4 + 6HBr + H_2(g)$ |
| | | T | 750 | $CaBr_2 + H_2O \rightarrow CaO + 2HBr$ |
| | | T | 300 | $Fe_3O4 + 8HBr \rightarrow Br_2 + 3FeBr_2 + 4H_2O$ |
| 4 | Sulfur-Iodine | T | 850 | $2H_2SO_4(g) \rightarrow 2SO_2(g) + 2H_2O(g) + O_2(g)$ |
| | | T | 450 | $2HI \rightarrow I_2(g) + H_2(g)$ |
| | | T | 120 | $I_2 + SO_2(a) + 2H_2O \rightarrow 2HI(a) + H_2SO_4(a)$ |
| 5 | Julich Center EOS | T | 800 | $2Fe_3O_4 + 6FeSO_4 \rightarrow 6Fe_2O_3 + 6SO_2 + O_2(g)$ |
| | | T | 700 | $3FeO + H_2O \rightarrow Fe_3O_4 + H_2(g)$ |
| | | T | 200 | $Fe_2O_3 + SO_2 \rightarrow FeO + FeSO_3$ |
| 6 | Tokyo Inst. Tech. Ferrite | T | 1000 | $2MnFe_2O_4 + 3Na_2CO_3 + H_2O \rightarrow 2Na_3MnFe_2O_6 + 3CO_2(g) + H_2(g)$ |
| | | T | 600 | $4Na_3MnFe_2O_6 + 6CO_2(g) \rightarrow 4MnFe_2O_4 + 6Na_2CO_3 + O_2(g)$ |
| 7 | Hallett Air Products 1965 | T | 800 | $2Cl_2(g) + 2H_2O(g) \rightarrow 4HCl(g) + O_2(g)$ |
| | | E | 25 | $2HCl \rightarrow Cl_2(g) + H_2(g)$ |
| 8 | Gaz de France | T | 725 | $2K + 2KOH \rightarrow 2K_2O + H_2(g)$ |
| | | T | 825 | $2K_2O \rightarrow 2K + K_2O_2$ |
| | | T | 125 | $2K_2O_2 + 2H_2O \rightarrow 4KOH + O_2(g)$ |
| 9 | Nickel Ferrite | T | 800 | $NiMnFe_4O_6 + 2H_2O \rightarrow NiMnFe_4O_8 + 2H_2(g)$ |
| | | T | 800 | $NiMnFe_4O_8 \rightarrow NiMnFe_4O_6 + O_2(g)$ |
| 10 | Aachen Univ Julich 1972 | T | 850 | $2Cl_2(g) + 2H_2O(g) \rightarrow 4HCl(g) + O_2(g)$ |
| | | T | 170 | $2CrCl_2 + 2HCl \rightarrow 2CrCl_3 + H_2(g)$ |
| | | T | 800 | $2CrCl_3 \rightarrow 2CrCl_2 + Cl_2(g)$ |
| 11 | Ispra Mark 1C | T | 100 | $2CuBr_2 + Ca(OH)_2 \rightarrow 2CuO + 2CaBr_2 + H_2O$ |
| | | T | 900 | $4CuO(s) \rightarrow 2Cu_2O(s) + O_2(g)$ |
| | | T | 730 | $CaBr_2 + 2H_2O \rightarrow Ca(OH)_2 + 2HBr$ |
| | | T | 100 | $Cu_2O + 4HBr \rightarrow 2CuBr_2 + H_2(g) + H_2O$ |
| 12 | LASL-U | T | 25 | $3CO_2 + U_3O_8 + H_2O \rightarrow 3UO_2CO_3 + H_2(g)$ |
| | | T | 250 | $3UO_2CO_3 \rightarrow 3CO_2(g) + 3UO_3$ |
| | | T | 700 | $6UO_3(s) \rightarrow 2U_3O_8(s) + O_2(g)$ |
| 13 | Ispra Mark 8 | T | 700 | $3MnCl_2 + 4H_2O \rightarrow Mn_3O_4 + 6HCl + H_2(g)$ |
| | | T | 900 | $3MnO_2 \rightarrow Mn_3O_4 + O_2(g)$ |
| | | T | 100 | $4HCl + Mn_3O_4 \rightarrow 2MnCl_2(a) + MnO_2 + 2H_2O$ |
| 14 | Ispra Mark 6 | T | 850 | $2Cl_2(g) + 2H_2O(g) \rightarrow 4HCl(g) + O_2(g)$ |
| | | T | 170 | $2CrCl_2 + 2HCl \rightarrow 2CrCl_3 + H_2(g)$ |
| | | T | 700 | $2CrCl_3 + 2FeCl_2 \rightarrow 2CrCl_2 + 2FeCl_3$ |
| | | T | 420 | $2FeCl_3 \rightarrow Cl_2(g) + 2FeCl_2$ |
| 15 | Ispra Mark 4 | T | 850 | $2Cl_2(g) + 2H_2O(g) \rightarrow 4HCl(g) + O_2(g)$ |
| | | T | 100 | $2FeCl_2 + 2HCl + S \rightarrow 2FeCl_3 + H_2S$ |
| | | T | 420 | $2FeCl_3 \rightarrow Cl_2(g) + 2FeCl_2$ |
| | | T | 800 | $H_2S \rightarrow S + H_2(g)$ |
| 16 | Ispra Mark 3 | T | 850 | $2Cl_2(g) + 2H_2O(g) \rightarrow 4HCl(g) + O_2(g)$ |
| | | T | 170 | $2VOCl_2 + 2HCl \rightarrow 2VOCl_3 + H_2(g)$ |
| | | T | 200 | $2VOCl_3 \rightarrow Cl_2(g) + 2VOCl_2$ |
| 17 | Ispra Mark 2 (1972) | T | 100 | $Na_2O \bullet MnO_2 + H_2O \rightarrow 2NaOH(a) + MnO_2$ |
| | | T | 487 | $4MnO_2(s) \rightarrow 2Mn_2O_3(s) + O_2(g)$ |
| | | T | 800 | $Mn_2O_3 + 4NaOH \rightarrow 2Na_2O \bullet MnO_2 + H_2(g) + H_2O$ |
| 18 | Ispra CO/Mn3O4 | T | 977 | $6Mn_2O_3 \rightarrow 4Mn_3O_4 + O_2(g)$ |
| | | T | 700 | $C(s) + H_2O(g) \rightarrow CO(g) + H_2(g)$ |
| | | T | 700 | $CO(g) + 2Mn_3O_4 \rightarrow C + 3Mn_2O_3$ |
| 19 | Ispra Mark 7B | T | 1000 | $2Fe_2O_3 + 6Cl_2(g) \rightarrow 4FeCl_3 + 3O_2(g)$ |
| | | T | 420 | $2FeCl_3 \rightarrow Cl_2(g) + 2FeCl_2$ |
| | | T | 650 | $3FeCl_2 + 4H_2O \rightarrow Fe_3O_4 + 6HCl + H_2(g)$ |
| | | T | 350 | $4Fe_3O_4 + O_2(g) \rightarrow 6Fe_2O_3$ |
| | | T | 400 | $4HCl + O_2(g) \rightarrow 2Cl_2(g) + 2H_2O$ |
| 20 | Vanadium Chloride | T | 850 | $2Cl_2(g) + 2H_2O(g) \rightarrow 4HCl(g) + O_2(g)$ |
| | | T | 25 | $2HCl + 2VCl_2 \rightarrow 2VCl_3 + H_2(g)$ |
| | | T | 700 | $2VCl_3 \rightarrow VCl_4 + VCl_2$ |
| | | T | 25 | $2VCl_4 \rightarrow Cl_2(g) + 2VCl_3$ |
| 21 | Ispra Mark 7A | T | 420 | $2FeCl_3(l) \rightarrow Cl_2(g) + 2FeCl_2$ |
| | | T | 650 | $3FeCl_2 + 4H_2O(g) \rightarrow Fe_3O_4 + 6HCl(g) + H_2(g)$ |
| | | T | 350 | $4Fe_3O_4 + O_2(g) \rightarrow 6Fe_2O_3$ |
| | | T | 1000 | $6Cl_2(g) + 2Fe_2O_3 \rightarrow 4FeCl_3(g) + 3O_2(g)$ |
| | | T | 120 | $Fe_2O_3 + 6HCl(a) \rightarrow 2FeCl_3(a) + 3H_2O(l)$ |

TABLE 5-continued

Thermally reversible reaction cycles regarding $H_2O$ catalyst and $H_2$. [L. C. Brown, G. E.
Besenbruch, K. R. Schultz, A. C. Marshall, S. K. Showalter, P. S. Pickard and J. F. Funk,
Nuclear Production of Hydrogen Using Thermochemical Water-Splitting Cycles, a preprint
of a paper to be presented at the International Congress on Advanced Nuclear Power preprint
of a paper to be presented at the International Congress on Advanced Nuclear Power Plants
(ICAPP) in Hollywood, Florida, Jun. 19-13, 2002, and published in the Proceedings.]

| | Cycle Name | T/E* | T (° C.) | Reaction |
|---|---|---|---|---|
| 22 | GA Cycle 23 | T | 800 | $H_2S(g) \rightarrow S(g) + H_2(g)$ |
| | | T | 850 | $2H_2SO_4(g) \rightarrow 2SO_2(g) + 2H_2O(g) + O_2(g)$ |
| | | T | 700 | $3S + 2H_2O(g) \rightarrow 2H_2S(g) + SO_2(g)$ |
| | | T | 25 | $3SO_2(g) + 2H_2O(l) \rightarrow 2H_2SO_4(a) + S$ |
| | | T | 25 | $S(g) + O_2(g) \rightarrow SO_2(g)$ |
| 23 | US -Chlorine | T | 850 | $2Cl_2(g) + 2H_2O(g) \rightarrow 4HCl(g) + O_2(g)$ |
| | | T | 200 | $2CuCl + 2HCl \rightarrow 2CuCl_2 + H_2(g)$ |
| | | T | 500 | $2CuCl_2 \rightarrow 2CuCl + Cl_2(g)$ |
| 24 | Ispra Mark | T | 420 | $2FeCl_3 \rightarrow Cl_2(g) + 2FeCl_2$ |
| | | T | 150 | $3Cl_2(g) + 2Fe_3O_4 + 12HCl \rightarrow 6FeCl_3 + 6H_2O + O_2(g)$ |
| | | T | 650 | $3FeCl_2 + 4H_2O \rightarrow Fe_3O_4 + 6HCl + H_2(g)$ |
| 25 | Ispra Mark 6C | T | 850 | $2Cl_2(g) + 2H_2O(g) \rightarrow 4HCl(g) + O_2(g)$ |
| | | T | 170 | $2CrCl_2 + 2HCl \rightarrow 2CrCl_3 + H_2(g)$ |
| | | T | 700 | $2CrCl_3 + 2FeCl_2 \rightarrow 2CrCl_2 + 2FeCl_3$ |
| | | T | 500 | $2CuCl_2 \rightarrow 2CuCl + Cl_2(g)$ |
| | | T | 300 | $CuCl + FeCl_3 \rightarrow CuCl_2 + FeCl_2$ |

*T = thermochemical, E = electrochemical.

TABLE 6

Thermally reversible reaction cycles regarding $H_2O$ catalyst and $H_2$. [C. Perkins
and A. W. Weimer, Solar-Thermal Production of Renewable Hydrogen, AIChE Journal, 55
(2), (2009), pp. 286-293.]

| Cycle | Reaction Steps |
|---|---|
| | High Temperature Cycles |

Zn/ZnO $$ZnO \xrightarrow{1600\text{-}1800° \text{ C.}} Zn + \frac{1}{2}O_2$$

$$Zn + H_2O \xrightarrow{400° \text{ C.}} ZnO + H_2$$

FeO/Fe₃O₄

$$Fe_3O_4 \xrightarrow{2000\text{-}2300° \text{ C.}} 3FeO + \frac{1}{2}O_2$$

$$3FeO + H_2O \xrightarrow{400° \text{ C.}} Fe_3O_4 + H_2$$

Cadmium carbonate $$CdO \xrightarrow{1450\text{-}1500° \text{ C.}} Cd + \frac{1}{2}O_2$$

$$Cd + H_2O + CO_2 \xrightarrow{350° \text{ C.}} CdCO_3 + H_2$$

$$CdCO_3 \xrightarrow{500° \text{ C.}} CO_2 + CdO$$

Hybrid cadmium $$CdO \xrightarrow{1450\text{-}1500° \text{ C.}} Cd + \frac{1}{2}O_2$$

$$Cd + 2H_2O \xrightarrow{25° \text{ C., electrochemical}} Cd(OH)_2 + H_2$$

$$Cd(OH)_2 \xrightarrow{375° \text{ C.}} CdO + H_2O$$

Sodium manganese $$Mn_2O_3 \xrightarrow{1400\text{-}1600° \text{ C.}} 2MnO + \frac{1}{2}O_2$$

TABLE 6-continued

Thermally reversible reaction cycles regarding $H_2O$ catalyst and $H_2$. [C. Perkins and A. W. Weimer, Solar-Thermal Production of Renewable Hydrogen, AIChE Journal, 55 (2), (2009), pp. 286-293.]

| Cycle | Reaction Steps |
|---|---|
| | $2MnO + 2NaOH \xrightarrow{627°\ C.} 2NaMnO_2 + H_2$ |
| | $2NaMnO_2 + H_2O \xrightarrow{25°\ C.} Mn_2O_3 + 2NaOH$ |
| M-Ferrite (M = Co, Ni, Zn) | $Fe_{3-x}M_xO_4 \xrightarrow{1200-1400°\ C.} Fe_{3-x}M_xO_{4-\delta} + \frac{\delta}{2}O_2$ |
| | $Fe_{3-x}M_xO_{4-\delta} + \delta H_2O \xrightarrow{1000-1200°\ C.} Fe_{3-x}M_xO_4 + \delta H_2$ |

Low Temperature Cycles

| | |
|---|---|
| Sulfur-Iodine | $H_2SO_4 \xrightarrow{850°\ C.} SO_2 + H_2O + \frac{1}{2}O_2$ |
| | $I_2 + SO_4 + 2H_2O \xrightarrow{100°\ C.} 2HI + H_2SO_4$ |
| | $2HI \xrightarrow{300°\ C.} I_2 + H_2$ |
| Hybrid sulfur | $H_2SO_4 \xrightarrow{850°\ C.} SO_2 + H_2O + \frac{1}{2}O_2$ |
| | $SO_2 + 2H_2O \xrightarrow{77°\ C.,\ electrochemical} H_2SO_4 + H_2$ |
| Hybrid copper chloride | $Cu_2OCl_2 \xrightarrow{550°\ C.} 2CuCl + \frac{1}{2}O_2$ |
| | $2Cu + 2HCl \xrightarrow{425°\ C.} H_2 + 2CuCl$ |
| | $4CuCl \xrightarrow{25°\ C.,\ electrochemical} 2Cu + 2CuCl_2$ |
| | $2CuCl_2 + H_2O \xrightarrow{325°\ C.} Cu_2OCl_2 + 2HCl$ |

TABLE 7

Thermally reversible reaction cycles regarding $H_2O$ catalyst and $H_2$. [S. Ahanades, P. Charvin, G. Flamant, P. Neveu, Screening of Water-Splitting Thermochemical Cycles Potentially Attractive for Hydrogen Production by Concentrated Solar Energy, Energy, 31, (2006), pp. 2805-2822.]

| No ID | Name of the cycle | List of elements | Number of chemical steps | Maximum temperature (° C.) | Reactions | |
|---|---|---|---|---|---|---|
| 6 | ZnO/Zn | Zn | 2 | 2000 | $ZnO \rightarrow Zn + 1/2O_2$ | (2000° C.) |
| | | | | | $Zn + H_2O \rightarrow ZnO + H_2$ | (1100° C.) |
| 7 | $Fe_3O_4$/FeO | Fe | 2 | 2200 | $Fe_3O_4 \rightarrow 3FeO + 1/2O_2$ | (2200° C.) |
| | | | | | $3FeO + H_2O \rightarrow Fe_3O_4 + H_2$ | (400° C.) |
| 194 | $In_2O_3/In_2O$ | In | 2 | 2200 | $In_2O_3 \rightarrow In_2O + O_2$ | (2200° C.) |
| | | | | | $In2O + 2H_2O \rightarrow In_2O_3 + 2H_2$ | (800° C.) |
| 194 | $SnO_2$/Sn | Sn | 2 | 2650 | $SnO_2 \rightarrow Sn + O_2$ | (2650° C.) |
| | | | | | $Sn + 2H_2O \rightarrow SnO_2 + 2H_2$ | (600° C.) |
| 83 | $MnO/MnSO_4$ | Mn, S | 2 | 1100 | $MnSO_4 \rightarrow MnO + SO_2 + 1/2O_2$ | (1100° C.) |
| | | | | | $MnO + H_2O + SO_2 \rightarrow MnSO_4 + H_2$ | (250° C.) |
| 84 | $FeO/FeSO_4$ | Fe, S | 2 | 1100 | $FeSO_4 \rightarrow FeO + SO_2 + 1/2O_2$ | (1100° C.) |
| | | | | | $FeO + H_2O + SO_2 \rightarrow FeSO_4 + H_2$ | (250° C.) |
| 86 | $CoO/CoSO_4$ | Co, S | 2 | 1100 | $CoSO_4 \rightarrow CoO + SO_2 + 1/2O_2$ | (1100° C.) |
| | | | | | $CoO + H_2O + SO_2 \rightarrow CoSO_4 + H_2$ | (200° C.) |

TABLE 7-continued

Thermally reversible reaction cycles regarding H$_2$O catalyst and H$_2$. [S. Ahanades, P. Charvin, G. Flamant, P. Neveu, Screening of Water-Splitting Thermochemical Cycles Potentially Attractive for Hydrogen Production by Concentrated Solar Energy, Energy, 31, (2006), pp. 2805-2822.]

| No ID | Name of the cycle | List of elements | Number of chemical steps | Maximum temperature (° C.) | Reactions | |
|-------|-------------------|------------------|--------------------------|----------------------------|-----------|---|
| 200 | Fe$_3$O$_4$/FeCl$_2$ | Fe, Cl | 2 | 1500 | Fe$_3$O$_4$ + 6HCl → 3FeCl$_2$ + 3H$_2$O + 1/2O$_2$ | (1500° C.) |
| | | | | | 3FeCl$_2$ + 4H$_2$O → Fe$_3$O$_4$ + 6HCl + H$_2$ | (700° C.) |
| 14 | FeSO$_4$ Julich | Fe, S | 3 | 1800 | 3FeO(s) + H$_2$O → Fe$_3$O$_4$(s) + H$_2$ | (200° C.) |
| | | | | | Fe$_3$O$_4$(s) + FeSO$_4$ → 3Fe$_2$O$_3$(s) + 3SO$_2$(g) + 1/2O$_2$ | (800° C.) |
| | | | | | 3Fe$_2$O$_3$(s) + 3SO$_2$ → 3FeSO$_4$ + 3FeO(s) | (1800° C.) |
| 85 | FeSO$_4$ | Fe, S | 3 | 2300 | 3FeO(s) + H$_2$O → Fe$_3$O$_4$(s) + H$_2$ | (200° C.) |
| | | | | | Fe$_3$O$_4$(s) + 3SO$_3$(g) → 3FeSO$_4$ + 1/2O$_2$ | (300° C.) |
| | | | | | FeSO$_4$ → FeO + SO$_3$ | (2300° C.) |
| 109 | C7 IGT | Fe, S | 3 | 1000 | Fe$_2$O$_3$(s) + 2SO$_2$(g) + H$_2$O → 2FeSO$_4$(s) + H$_2$ | (125° C.) |
| | | | | | 2FeSO$_4$(s) → Fe$_2$O$_3$(s) + SO$_2$(g) + SO$_3$(g) | (700° C.) |
| | | | | | SO$_3$(g) → SO$_2$(g) + 1/2O$_2$(g) | (1000° C.) |
| 21 | Shell Process | Cu, S | 3 | 1750 | 6Cu(s) + 3H$_2$O → 3Cu$_2$O(s) + 3H$_2$ | (500° C.) |
| | | | | | Cu$_2$O(s) + 2SO$_2$ + 3/2O$_2$ → 2CuSO$_4$ | (300° C.) |
| | | | | | 2Cu$_2$O(s) + 2CuSO$_4$ → 6Cu + 2SO$_2$ + 3O$_2$ | (1750° C.) |
| 87 | CuSO$_4$ | Cu, S | 3 | 1500 | Cu$_2$O(s) + H$_2$O(g) → Cu(s) + Cu(OH)$_2$ | (1500° C.) |
| | | | | | Cu(OH)$_2$ + SO$_2$(g) → CuSO$_4$ + H$_2$ | (100° C.) |
| | | | | | CuSO$_4$ + Cu(s) → Cu$_2$O(s) + SO$_2$ + 1/2O$_2$ | (1500° C.) |
| 110 | LASL BaSO$_4$ | Ba, Mo, S | 3 | 1300 | SO$_2$ + H$_2$O + BaMoO$_4$ → BaSO$_3$ + MoO$_3$ + H$_2$O | (300° C.) |
| | | | | | BaSO$_3$ + H$_2$O → BaSO$_4$ + H$_2$ | |
| | | | | | BaSO$_4$(s) + MoO$_3$(s) → BaMoO$_4$(s) + SO$_2$(g) + 1/2O$_2$ | (1300° C.) |
| 4 | Mark 9 | Fe, Cl | 3 | 900 | 3FeCl$_2$ + 4H$_2$O → Fe$_3$O$_4$ + 6HCl + H$_2$ | (680° C.) |
| | | | | | Fe$_3$O$_4$ + 3/2Cl$_2$ + 6HCl → 3FeCl$_3$ + 3H$_2$O + 1/2O$_2$ | (900° C.) |
| | | | | | 3FeCl$_3$ → 3FeCl$_2$ + 3/2Cl$_2$ | (420° C.) |
| 16 | Euratom 1972 | Fe, Cl | 3 | 1000 | H$_2$O + Cl$_2$ → 2HCl + 1/2O$_2$ | (1000° C.) |
| | | | | | 2HCl + 2FeCl$_2$ → 2FeCl$_3$ + H$_2$ | (600° C.) |
| | | | | | 2FeCl$_3$ → 2FeCl$_2$ + Cl$_2$ | (350° C.) |
| 20 | Cr, Cl Julich | Cr, Cl | 3 | 1600 | 2CrCl$_2$(s, T$_f$ = 815° C.) + 2HCl → 2CrCl$_3$(s) + H$_2$ | (200° C.) |
| | | | | | 2CrCl$_3$(s, T$_f$ = 1150° C.) → 2CrCl$_2$(s) + Cl$_2$ | (1600° C.) |
| | | | | | H$_2$O + Cl$_2$ → 2HCl + 1/2O$_2$ | (1000° C.) |
| 27 | Mark 8 | Mn, Cl | 3 | 1000 | 6MnCl$_2$(l) + 8H$_2$O → 2Mn$_3$O$_4$ + 12HCl + 2H$_2$ | (700° C.) |
| | | | | | 3Mn$_3$O$_4$(s) + 12HCl → 6MnCl$_2$(s) + 3MnO$_2$(s) + 6H$_2$O | (100° C.) |
| | | | | | 3MnO$_2$(s) → Mn$_3$O$_4$(s) + O$_2$ | (1000° C.) |
| 37 | Ta Funk | Ta, Cl | 3 | 2200 | H$_2$O + Cl$_2$ → 2HCl + 1/2O$_2$ | (1000° C.) |
| | | | | | 2TaCl$_2$ + 2HCl → 2TaCl$_3$ + H$_2$ | (100° C.) |
| | | | | | 2TaCl$_3$ → 2TaCl$_2$ + Cl$_2$ | (2200° C.) |
| 78 | Mark 3 Euratom JRC Ispra (Italy) | V, Cl | 3 | 1000 | Cl$_2$(g) + H$_2$O(g) → 2HCl(g) + 1/2O$_2$(g) | (1000° C.) |
| | | | | | 2VOCl$_2$(s) + 2HCl(g) → 2VOCl$_3$(g) + H$_2$(g) | (170° C.) |
| | | | | | 2VOCl$_3$(g) → Cl$_2$(g) + 2VOCl$_2$(s) | (200° C.) |
| 144 | Bi, Cl | Bi, Cl | 3 | 1700 | H$_2$O + Cl$_2$ → 2HCl + 1/2O$_2$ | (1000° C.) |
| | | | | | 2BiCl$_2$ + 2HCl → 2BiCl$_3$ + H$_2$ | (300° C.) |
| | | | | | 2BiCl$_3$(T$_f$ = 233° C., T$_{eb}$ = 441° C.) → 2BiCl$_2$ + Cl$_2$ | (1700° C.) |
| 146 | Fe, Cl Julich | Fe, Cl | 3 | 1800 | 3Fe(s) + 4H$_2$O → Fe$_3$O4(s) + 4H$_2$ | (700° C.) |
| | | | | | Fe$_3$O$_4$ + 6HCl → 3FeCl$_2$(g) + 3H$_2$O + 1/2O$_2$ | (1800° C.) |
| | | | | | 3FeCl$_2$ + 3H$_2$ → 3Fe(s) + 6HCl | (1300° C.) |
| 147 | Fe, Cl Cologne | Fe, Cl | 3 | 1800 | 3/2FeO(s) + 3/2Fe(s) + 2.5H$_2$O → Fe$_3$O$_4$(s) + 2.5H$_2$ | (1000° C.) |
| | | | | | Fe$_3$O$_4$ + 6HCl → 3FeCl$_2$(g) + 3H$_2$O + 1/2O$_2$ | (1800° C.) |
| | | | | | 3FeCl$_2$ + H$_2$O + 3/2H$_2$ → $_{3/2}$FeO(s) + 3/2Fe(s) + 6HCl | (700° C.) |
| 25 | Mark 2 | Mn, Na | 3 | 900 | Mn$_2$O$_3$(s) + 4NaOH → MnO$_2$ + H$_2$O + H$_2$ | (900° C.) |
| | | | | | 2Na$_2$O•MnO$_2$ + 2H$_2$O → 4NaOH + 2MnO$_2$(s) | (100° C.) |
| | | | | | 2MnO$_2$(s) → Mn$_2$O$_3$(s) + 1/2O$_2$ | (600° C.) |
| 28 | Li, Mn LASL | Mn, Li | 3 | 1000 | 6LiOH + 2Mn$_3$O$_4$ → 3Li$_2$O•Mn$_2$O$_3$ + 2H$_2$O + H$_2$ | (700° C.) |
| | | | | | 3Li$_2$O•Mn$_2$O$_3$ + 3H$_2$O → 6LiOH + 3Mn$_2$O$_3$ | (80° C.) |
| | | | | | 3Mn$_2$O$_3$ → 2Mn$_3$O$_4$ + 1/2O$_2$ | (1000° C.) |
| 199 | Mn PSI | Mn, Na | 3 | 1500 | 2MnO + 2NaOH → 2NaMnO$_2$ + H$_2$ | (800° C.) |
| | | | | | 2NaMnO$_2$ + H$_2$O → Mn$_2$O$_3$ + 2NaOH | (100° C.) |
| | | | | | Mn$_2$O$_3$(l) → 2MnO(s) + 1/2O$_2$ | (1500° C.) |
| 178 | Fe, M ORNL | Fe, (M = Li, K, Na) | 3 | 1300 | 2Fe$_3$O$_4$ + 6MOH → 3MFeO$_2$ + 2H$_2$O + H$_2$ | (500° C.) |
| | | | | | 3MFeO$_2$ + 3H$_2$O → 6MOH + 3Fe$_2$O$_3$ | (100° C.) |
| | | | | | 3Fe$_2$O$_3$(s) → 2Fe$_3$O$_4$ + 1/2O$_2$ | (1300° C.) |
| 33 | Sn Souriau | Sn | 3 | 1700 | Sn(l) + 2H$_2$O → SnO$_2$ + 2H$_2$ | (400° C.) |
| | | | | | 2SnO$_2$(s) → 2SnO + O$_2$ | (1700° C.) |
| | | | | | 2SnO(s) → SnO$_2$ + Sn(l) | (700° C.) |
| 177 | Co ORNL | Co, Ba | 3 | 1000 | CoO(s) + xBa(OH)$_2$(s) → Ba$_x$CoO$_y$(s) + (y − x − 1)H$_2$ + (1 + 2x − y) H$_2$O | (850° C.) |
| | | | | | Ba$_x$CoO$_y$(s) + xH$_2$O → xBa(OH)$_2$(s) + CoO(y − x)(s) | (100° C.) |
| | | | | | CoO(y − x)(s) → CoO(s) + (y − x − 1)/2O$_2$ | (1000° C.) |
| 183 | Ce, Ti ORNL | Ce, Ti, Na | 3 | 1300 | 2CeO$_2$(s) + 3TiO$_2$(s) → 3TiO$_2$ + 1/2O$_2$ | (800-1300° C.) |
| | | | | | Ce$_2$O$_3$•3TiO$_2$ + 6NaOH → 2CeO$_2$ + 3Na$_2$TiO$_3$ + 2H$_2$O + H$_2$ | (800° C.) |
| | | | | | CeO$_2$ + 3NaTiO$_3$ + 3H$_2$O → CeO$_2$(s) + 3TiO$_2$(s) + 6NaOH | (150° C.) |

TABLE 7-continued

Thermally reversible reaction cycles regarding $H_2O$ catalyst and $H_2$. [S. Ahanades, P. Charvin, G. Flamant, P. Neveu, Screening of Water-Splitting Thermochemical Cycles Potentially Attractive for Hydrogen Production by Concentrated Solar Energy, Energy, 31, (2006), pp. 2805-2822.]

| No ID | Name of the cycle | List of elements | Number of chemical steps | Maximum temperature (° C.) | Reactions | |
|-------|-------------------|------------------|--------------------------|----------------------------|-----------|---|
| 269 | Ce, Cl GA | Ce, Cl | 3 | 1000 | $H_2O + Cl_2 \rightarrow 2HCl + 1/2O_2$ | (1000° C.) |
| | | | | | $2CeO_2 + 8HCl \rightarrow 2CeCl_3 + 4H_2O + Cl_2$ | (250° C.) |
| | | | | | $2CeCl_3 + 4H_2O \rightarrow 2CeO_2 + 6HCl + H_2$ | (800° C.) |

Reactants to form $H_2O$ catalyst may comprise a source of O such as an O species and a source of H. The source of the O species may comprise at least one of $O_2$, air, and a compound or admixture of compounds comprising O. The compound comprising oxygen may comprise an oxidant. The compound comprising oxygen may comprise at least one of an oxide, oxyhydroxide, hydroxide, peroxide, and a superoxide. Suitable exemplary metal oxides are alkali oxides such as $Li_2O$, $Na_2O$, and $K_2O$, alkaline earth oxides such as MgO, CaO, SrO, and BaO, transition oxides such as NiO, $Ni_2O_3$, FeO, $Fe_2O_3$, and CoO, and inner transition and rare earth metals oxides, and those of other metals and metalloids such as those of Al, Ga, In, Si, Ge, Sn, Pb, As, Sb, Bi, Se, and Te, and mixtures of these and other elements comprising oxygen. The oxides may comprise a oxide anion such as those of the present disclosure such as a metal oxide anion and a cation such as an alkali, alkaline earth, transition, inner transition and rare earth metal cation, and those of other metals and metalloids such as those of Al, Ga, In, Si, Ge, Sn, Pb, As, Sb, Bi, Se, and Te such as $MM'_{2x}O_{3x+1}$ or $MM'_{2x}O_4$ (M=alkaline earth, M'=transition metal such as Fe or Ni or Mn, x=integer) and $M_2M'_{2x}O_{3x+1}$ or $M_2M'_{2x}O_4$ (M=alkali, M'=transition metal such as Fe or Ni or Mn, x=integer). Suitable exemplary metal oxyhydroxides are AlO(OH), ScO(OH), YO(OH), VO(OH), CrO(OH), MnO (OH) ($\alpha$-MnO(OH) groutite and $\gamma$-MnO(OH) manganite), FeO(OH), CoO(OH), NiO(OH), RhO(OH), GaO(OH), InO (OH), $Ni_{1/2}Co_{1/2}O(OH)$, and $Ni_{1/3}Co_{1/3}Mn_{1/3}O(OH)$. Suitable exemplary hydroxides are those of metals such as alkali, alkaline earth, transition, inner transition, and rare earth metals and those of other metals and metalloids such as such as Al, Ga, In, Si, Ge, Sn, Pb, As, Sb, Bi, Se, and Te, and mixtures. Suitable complex ion hydroxides are $Li_2Zn$ $(OH)_4$, $Na_2Zn(OH)_4$, $Li_2Sn(OH)_4$, $Na_2Sn(OH)_4$, $Li_2Pb$ $(OH)_4$, $Na_2Pb(OH)_4$, $LiSb(OH)_4$, $NaSb(OH)_4$, $LiAl(OH)_4$, $NaAl(OH)_4$, $LiCr(OH)_4$, $NaCr(OH)_4$, $Li_2Sn(OH)_6$, and $Na_2Sn(OH)_6$. Additional exemplary suitable hydroxides are at least one from $Co(OH)_2$, $Zn(OH)_2$, $Ni(OH)_2$, other transition metal hydroxides, $Cd(OH)_2$, $Sn(OH)_2$, and $Pb(OH)$. Suitable exemplary peroxides are $H_2O_2$, those of organic compounds, and those of metals such as $M_2O_2$ where M is an alkali metal such as $Li_2O_2$, $Na_2O_2$, $K_2O_2$, other ionic peroxides such as those of alkaline earth peroxides such as Ca, Sr, or Ba peroxides, those of other electropositive metals such as those of lanthanides, and covalent metal peroxides such as those of Zn, Cd, and Hg. Suitable exemplary superoxides are those of metals $MO_2$ where M is an alkali metal such as $NaO_2$, $KO_2$, $RbO_2$, and $CsO_2$, and alkaline earth metal superoxides. In an embodiment, the solid fuel comprises an alkali peroxide and hydrogen source such as a hydride, hydrocarbon, or hydrogen storage material such as $BH_3NH_3$. The reaction mixture may comprise a hydroxide such as those of alkaline, alkaline earth, transition, inner transition, and rare earth metals, and Al, Ga, In, Sn, Pb, and other elements that form hydroxides and a source of oxygen such as a compound comprising at least one an oxyanion such as a carbonate such as one comprising alkaline, alkaline earth, transition, inner transition, and rare earth metals, and Al, Ga, In, Sn, Pb, and others of the present disclosure. Other suitable compounds comprising oxygen are at least one of oxyanion compound of the group of aluminate, tungstate, zirconate, titanate, sulfate, phosphate, carbonate, nitrate, chromate, dichromate, and manganate, oxide, oxyhydroxide, peroxide, superoxide, silicate, titanate, tungstate, and others of the present disclosure. An exemplary reaction of a hydroxide and a carbonate is given by $$Ca(OH)_2 + Li_2CO_3 \text{ to } CaO + H_2O + Li_2 + CO_2 \qquad (87)$$

In other embodiments, the oxygen source is gaseous or readily forms a gas such as $NO_2$, NO, $N_2O$, $CO_2$, $P_2O_3$, $P_2O_5$, and $SO_2$. The reduced oxide product from the formation of $H_2O$ catalyst such as C, N, $NH_3$, P, or S may be converted back to the oxide again by combustion with oxygen or a source thereof as given in Mills Prior Applications. The cell may produce excess heat that may be used for heating applications, or the heat may be converted to electricity by means such as a Rankine or Brayton system. Alternatively, the cell may be used to synthesize lower-energy hydrogen species such as molecular hydrino and hydrino hydride ions and corresponding compounds.

In an embodiment, the reaction mixture to form hydrinos for at least one of production of lower-energy hydrogen species and compounds and production of energy comprises a source of atomic hydrogen and a source of catalyst comprising at least one of H and O such those of the present disclosure such as $H_2O$ catalyst. The reaction mixture may further comprise an acid such as $H_2SO_3$, $H_2SO_4$, $H_2CO_3$, $HNO_2$, $HNO_3$, $HClO_4$, $H_3PO_3$, and $H_3PO_4$ or a source of an acid such as an acid anhydride or anhydrous acid. The latter may comprise at least one of the group of $SO_2$, $SO_3$, $CO_2$, $NO_2$, $N_2O_3$, $N_2O_5$, $Cl_2O_7$, $PO_2$, $P_2O_3$, and $P_2O_5$. The reaction mixture may comprise at least one of a base and a basic anhydride such as $M_2O$ (M=alkali), M'O (M'=alkaline earth), ZnO or other transition metal oxide, CdO, CoO, SnO, AgO, HgO, or $Al_2O_3$. Further exemplary anhydrides comprise metals that are stable to $H_2O$ such as Cu, Ni, Pb, Sb, Bi, Co, Cd, Ge, Au, Ir, Fe, Hg, Mo, Os, Pd, Re, Rh, Ru, Se, Ag, Tc, Te, Tl, Sn, W, Al, V, Zr, Ti, Mn, Zn, Cr, and In. The anhydride may be an alkali metal or alkaline earth metal oxide, and the hydrated compound may comprise a hydroxide. The reaction mixture may comprise an oxyhydroxide such as FeOOH, NiOOH, or CoOOH. The reaction mixture may comprise at least one of a source of $H_2O$ and $H_2O$. The $H_2O$ may be formed reversibly by hydration and dehydration reactions in the presence of atomic hydrogen. Exemplary reactions to form $H_2O$ catalyst are $$Mg(OH)_2 \text{ to } MgO + H_2O \qquad (88)$$

$$2LiOH \text{ to } Li_2O + H_2O \qquad (89)$$

$$H_2CO_3 \text{ to } CO_2 + H_2O \qquad (90)$$

$$2FeOOH \text{ to } Fe_2O_3 + H_2O \qquad (91)$$

In an embodiment, $H_2O$ catalyst is formed by dehydration of at least one compound comprising phosphate such as salts of phosphate, hydrogen phosphate, and dihydrogen phosphate such as those of cations such as cations comprising metals such as alkali, alkaline earth, transition, inner transition, and rare earth metals, and those of other metals and metalloids such as those of Al, Ga, In, Si, Ge, Sn, Pb, As, Sb, Bi, Se, and Te, and mixtures to form a condensed phosphate such as at least one of polyphosphates such as $[P_n O_{3n+1}]^{(n+2)-}$, long chain metaphosphates such as $[(PO_3)_n]^{n-}$, cyclic metaphosphates such as $[(PO_3)_n]^{n-}$ with n≥3, and ultraphosphates such as $P_4O_{10}$. Exemplary reactions are $$(92)$$

$$(n\text{-}2)NaH_2PO_4 + 2Na_2HPO_4 \xrightarrow{\text{heat}} Na_{n+2}P_nO_{3n+1} \text{ (polyphosphate)} + (n\text{-}1)H_2O$$

$$(93)$$

$$nNaH_2PO_4 \xrightarrow{\text{heat}} (NaPO_3)_n \text{ (metaphosphate)} + nH_2O$$

The reactants of the dehydration reaction may comprise R—Ni that may comprise at least one of $Al(OH)_3$, and $Al_2O_3$. The reactants may further comprise a metal M such as those of the present disclosure such as an alkali metal, a metal hydride MH, a metal hydroxide such as those of the present disclosure such as an alkali hydroxide and a source of hydrogen such as $H_2$ as well as intrinsic hydrogen. Exemplary reactions are $$2Al(OH)_3 + \text{to } Al_2O_3 + 3H_2O \qquad (94)$$

$$Al_2O_3 + 2NaOH \text{ to } 2NaAlO_2 + H_2O \qquad (95)$$

$$3MH + Al(OH)_3 + \text{ to } M_3Al + 3H_2O \qquad (96)$$

$$MoCu + 2MOH + 4O_2 \text{ to } M_2MoO_4 + \qquad (97)$$
$$CuO + H_2O \text{ (M = Li, Na, K, Rb, Cs)}$$

The reaction product may comprise an alloy. The R—Ni may be regenerated by rehydration. The reaction mixture and dehydration reaction to form $H_2O$ catalyst may comprise and involve an oxyhydroxide such as those of the present disclosure as given in the exemplary reaction:

$$3Co(OH)_2 \text{ to } 2CoOOH + Co + 2H_2O \qquad (98)$$

The atomic hydrogen may be formed from $H_2$ gas by dissociation. The hydrogen dissociator may be one of those of the present disclosure such as R—Ni or a noble metal or transition metal on a support such as Ni or Pt or Pd on carbon or $Al_2O_3$. Alternatively, the atomic H may be from H permeation through a membrane such as those of the present disclosure. In an embodiment, the cell comprises a membrane such as a ceramic membrane to allow $H_2$ to diffuse through selectively while preventing $H_2O$ diffusion. In an embodiment, at least one of $H_2$ and atomic H are supplied to the cell by electrolysis of an electrolyte comprising a source of hydrogen such as an aqueous or molten electrolyte comprising $H_2O$. In an embodiment, $H_2O$ catalyst is formed reversibly by dehydration of an acid or base to the anhydride form. In an embodiment, the reaction to form the catalyst $H_2O$ and hydrinos is propagated by changing at least one of the cell pH or activity, temperature, and pressure wherein the pressure may be changed by changing the temperature. The activity of a species such as the acid, base, or anhydride may be changed by adding a salt as known by those skilled in the art. In an embodiment, the reaction mixture may comprise a material such as carbon that may absorb or be a source of a gas such as $H_2$ or acid anhydride gas to the reaction to form hydrinos. The reactants may be in any desired concentrations and ratios. The reaction mixture may be molten or comprise an aqueous slurry.

In another embodiment, the source of the $H_2O$ catalyst is the reaction between an acid and a base such as the reaction between at least one of a hydrohalic acid, sulfuric, nitric, and nitrous, and a base. Other suitable acid reactants are aqueous solutions of $H_2SO_4$, HCl, HX (X-halide), $H_3PO_4$, $HClO_4$, $HNO_3$, HNO, $HNO_2$, $H_2S$, $H_2CO_3$, $H_2MoO_4$, $HNbO_3$, $H_2B_4O_7$ (M tetraborate), $HBO_2$, $H_2WO_4$, $H_2CrO_4$, $H_2Cr_2O_7$, $H_2TiO_3$, $HZrO_3$, $MAlO_2$, $HMn_2O_4$, $HIO_3$, $HIO_4$, $HClO_4$, or an organic acidic such as formic or acetic acid. Suitable exemplary bases are a hydroxide, oxyhydroxide, or oxide comprising an alkali, alkaline earth, transition, inner transition, or rare earth metal, or Al, Ga, In, Sn, or Pb.

In an embodiment, the reactants may comprise an acid or base that reacts with base or acid anhydride, respectively, to form $H_2O$ catalyst and the compound of the cation of the base and the anion of the acid anhydride or the cation of the basic anhydride and the anion of the acid, respectively. The exemplary reaction of the acidic anhydride $SiO_2$ with the base NaOH is $$4NaOH + SiO_2 \text{ to } Na_4SiO_4 + 2H_2O \qquad (99)$$

wherein the dehydration reaction of the corresponding acid is $$H_4SiO_4 \text{ to } 2H_2O + SiO_2 \qquad (100)$$

Other suitable exemplary anhydrides may comprise an element, metal, alloy, or mixture such as one from the group of Mo, Ti, Zr, Si, Al, Ni, Fe, Ta, V, B, Nb, Se, Te, W, Cr, Mn, Hf, Co, and Mg. The corresponding oxide may comprise at least one of $MoO_2$, $TiO_2$, $ZrO_2$, $SiO_2$, $Al_2O_3$, NiO, $Ni_2O_3$, FeO, $Fe_2O_3$, $TaO_2$, $Ta_2O_5$, VO, $VO_2$, $V_2O_3$, $V_2O_5$, $B_2O_3$, NbO, $NbO_2$, $Nb_2O_5$, $SeO_2$, $SeO_3$, $TeO_2$, $TeO_3$, $WO_2$, $WO_3$, $Cr_3O_4$, $Cr_2O_3$, $CrO_2$, $CrO_3$, MnO, $Mn_3O_4$, $Mn_2O_3$, $MnO_2$, $Mn_2O_7$, $HfO_2$, $Co_2O_3$, CoO, $Co_3O_4$, $Co_2O_3$, and MgO. In an exemplary embodiment, the base comprises a hydroxide such as an alkali hydroxide such as MOH (M=alkali) such as LiGH that may form the corresponding basic oxide such as $M_2O$ such as $Li_2O$, and H2O. The basic oxide may react with the anhydride oxide to form a product oxide. In an exemplary reaction of LiGH with the anhydride oxide with the release of $H_2O$, the product oxide compound may comprise $Li_2MoO_3$ or $Li_2MoO_4$, $Li_2TiO_3$, $Li_2ZrO_3$, $Li_2SiO_3$, $LiAlO_2$, $LiNiO_2$, $LiFeO_2$, $LiTaO_3$, $LiVO_3$, $Li_2B_4O_7$, $Li_2NbO_3$, $Li_2SeO_3$, $Li_3PO_4$, $Li_2SeO_4$, $Li_2TeO_3$, $Li_2TeO_4$, $Li_2WO_4$, $Li_2CrO_4$, $Li_2Cr_2O_7$, $Li_2MnO_4$, $Li_2HfO_3$, $LiCoO_2$, and $MgO$. Other suitable exemplary oxides are at least one of the group of $As_2O_3$, $As_2O_5$, $Sb_2O_3$, $Sb_2O_4$, $Sb_2O_5$, $Bi_2O_3$, $SO_2$, $SO_3$, $CO_2$, $NO_2$, $N_2O_3$, $N_2O_5$, $Cl_2O_7$, $PO_2$, $P_2O_3$, and $P_2O_5$, and other similar oxides known to those skilled in the art. Another example is given by Eq. (91). Suitable reactions of metal oxides are $$2LiOH + NiO \text{ to } Li_2NiO_2 + H_2O \qquad (101)$$

$$3LiOH + NiO \text{ to } LiNiO_2 + H_2O + Li_2O + 1/2H_2 \qquad (102)$$

$$4LiOH + Ni_2O_3 \text{ to } 2Li_2NiO_2 + 2H_2O + 1/2O_2 \qquad (103)$$

$$2LiOH + Ni_2O_3 \text{ to } 2LiNiO_2 + H_2O \qquad (104)$$

Other transition metals such as Fe, Cr, and Ti, inner transition, and rare earth metals and other metals or metalloids such as Al, Ga, In, Si, Ge, Sn, Pb, As, Sb, Bi, Se, and Te may substitute for Ni, and other alkali metal such as Li, Na, Rb, and Cs may substitute for K. In an embodiment, the oxide may comprise Mo wherein during the reaction to form $H_2O$, nascent $H_2O$ catalyst and H may form that further react to form hydrinos. Exemplary solid fuel reactions and possible oxidation reduction pathways are $$3MoO_2 + 4LiOH \rightarrow 2Li_2MoO_4 + Mo + 2H_2O \qquad (105)$$

$$2MoO_2 + 4LiOH \rightarrow 2Li_2MoO_4 + 2H_2 \qquad (106)$$

$$O^{2-} \rightarrow 1/2O_2 + 2e^- \qquad (107)$$

$$2H_2O + 2e^- \rightarrow 2OH^- + H_2 \qquad (108)$$

$$2H_2O + 2e^- \rightarrow 2OH^- + H + H(1/4) \qquad (109)$$

$$Mo^{4+} + 4e^- \rightarrow Mo \qquad (110)$$

The reaction may further comprise a source of hydrogen such as hydrogen gas and a dissociator such as $Pd/Al_2O_3$. The hydrogen may be any of proteium, deuterium, or tritium or combinations thereof. The reaction to form $H_2O$ catalyst may comprise the reaction of two hydroxides to form water. The cations of the hydroxides may have different oxidation states such as those of the reaction of an alkali metal hydroxide with a transition metal or alkaline earth hydroxide. The reaction mixture and reaction may further comprise and involve $H_2$ from a source as given in the exemplary reaction:

$$LiOH + 2Co(OH)_2 + 1/2H_2 \text{ to } LiCoO_2 + 3H_2O + Co \qquad (111)$$

The reaction mixture and reaction may further comprise and involve a metal M such as an alkali or an alkaline earth metal as given in the exemplary reaction:

$$M + LiOH + Co(OH)_2 LiCoO_2 + H_2O + MH \qquad (112)$$

In an embodiment, the reaction mixture comprises a metal oxide and a hydroxide that may serve as a source of H and optionally another source of H wherein the metal such as Fe of the metal oxide can have multiple oxidation states such that it undergoes an oxidation-reduction reaction during the reaction to form $H_2O$ to serve as the catalyst to react with H to form hydrinos. An example is FeO wherein $Fe^{2+}$ can undergo oxidation to $Fe^{3+}$ during the reaction to form the catalyst. An exemplary reaction is $$FeO + 3LiOH \text{ to } H2O + LiFeO_2 + H(1/p) + Li_2O \qquad (113)$$

In an embodiment, at least one reactant such as a metal oxide, hydroxide, or oxyhydroxide serves as an oxidant wherein the metal atom such as Fe, Ni, Mo, or Mn may be in an oxidation state that is higher than another possible oxidation state. The reaction to form the catalyst and hydrinos may cause the atom to undergo a reduction to at least one lower oxidation state. Exemplary reactions of metal oxides, hydroxides, and oxyhydroxides to form $H_2O$ catalyst are $$2KOH + NiO \text{ to } K_2NiO_2 + H_2O \qquad (114)$$

$$3KOH + NiO \text{ to } KNiO_2 + H_2O + K_2O + 1/2H_2 \qquad (115)$$

$$2KOH + Ni_2O_3 \text{ to } 2KNiO_2 + H_2O \qquad (116)$$

$$4KOH + Ni_2O_3 \text{ to } 2K_2NiO_2 + 2H_2O + 1/2O_2 \qquad (117)$$

$$2KOH + Ni(OH)_2 \text{ to } K_2NiO_2 + 2H_2O \qquad (118)$$

$$2LiOH + MoO_3 \text{ to } Li_2MoO_4 + H_2O \qquad (119)$$

$$3KOH + Ni(OH)_2 \text{ to } KNiO_2 + 2H_2O + K_2O + 1/2H_2 \qquad (120)$$

$$2KOH + 2NiOOH \text{ to } K_2NiO_2 + 2H_2O + NiO + 1/2O_2 \qquad (121)$$

$$KOH + NiOOH \text{ to } KNiO_2 + H_2O \qquad (122)$$

$$2NaOH + Fe_2O_3 \text{ to } 2NaFeO_2 + H_2O \qquad (123)$$

Other transition metals such as Ni, Fe, Cr, and Ti, inner transition, and rare earth metals and other metals or metalloids such as Al, Ga, In, Si, Ge, Sn, Pb, As, Sb, Bi, Se, and Te may substitute for Ni or Fe, and other alkali metals such as Li, Na, K, Rb, and Cs may substitute for K or Na. In an embodiment, the reaction mixture comprises at least one of an oxide and a hydroxide of metals that are stable to $H_2O$ such as Cu, Ni, Pb, Sb, Bi, Co, Cd, Ge, Au, Ir, Fe, Hg, Mo, Os, Pd, Re, Rh, Ru, Se, Ag, Tc, Te, Tl, Sn, W, Al, V, Zr, Ti, Mn, Zn, Cr, and In. Additionally, the reaction mixture comprises a source of hydrogen such as $H_2$ gas and optionally a dissociator such as a noble metal on a support. In an embodiment, the solid fuel or energetic material comprises mixture of at least one of a metal halide such as at least one of a transition metal halide such as a bromide such as $FeBr_2$ and a metal that forms a oxyhydroxide, hydroxide, or oxide and $H_2O$. In an embodiment, the solid fuel or energetic material comprises a mixture of at least one of a metal oxide, hydroxide, and an oxyhydroxide such as at least one of a transition metal oxide such as $Ni_2O_3$ and $H_2O$.

The exemplary reaction of the basic anhydride NiO with acid HCl is $$2HCl + NiO \text{ to } H_2O + NiCl_2 \qquad (124)$$

wherein the dehydration reaction of the corresponding base is $$Ni(OH)_2 \text{ to } H_2O + NiO \qquad (125)$$

The reactants may comprise at least one of a Lewis acid or base and a Bronsted-Lowry acid or base. The reaction mixture and reaction may further comprise and involve a compound comprising oxygen wherein the acid reacts with the compound comprising oxygen to form water as given in the exemplary reaction:

$$2HX + POX_3 \text{ to } H_2O + PX_5 \qquad (126)$$

(X=halide). Similar compounds as $POX_3$ are suitable such as those with P replaced by S. Other suitable exemplary anhydrides may comprise an oxide of an element, metal, alloy, or mixture that is soluble in acid such as an a hydroxide, oxyhydroxide, or oxide comprising an alkali, alkaline earth, transition, inner transition, or rare earth metal, or Al, Ga, In, Sn, or Pb such as one from the group of Mo, Ti, Zr, Si, Al, Ni, Fe, Ta, V, B, Nb, Se, Te, W, Cr, Mn, Hf, Co, and Mg. The corresponding oxide may comprise $MoO_2$, $TiO_2$, $ZrO_2$, $SiO_2$, $Al_2O_3$, $NiO$, $FeO$ or $Fe_2O_3$, $TaO_2$, $Ta_2O_5$, $VO$, $VO_2$, $V_2O_3$, $V_2O_5$, $B_2O_3$, $NbO$, $NbO_2$, $Nb_2O_5$, $SeO_2$, $SeO_3$, $TeO_2$, $TeO_3$, $WO_2$, $WO_3$, $Cr_3O_4$, $Cr_2O_3$, $CrO_2$, $CrO_3$, $MnO$, $Mn_3O_4$, $Mn_2O_3$, $MnO_2$, $Mn_2O_7$, $HfO_2$, $Co_2O_3$, $CoO$, $Co_3O_4$, $Co_2O_3$, and $MgO$. Other suitable exemplary oxides are of those of the group of Cu, Ni, Pb, Sb, Bi, Co, Cd, Ge, Au, Ir, Fe, Hg, Mo, Os, Pd, Re, Rh, Ru, Se, Ag, Tc, Te, Tl, Sn, W, Al, V, Zr, Ti, Mn, Zn, Cr, and In. In an exemplary embodiment, the acid comprises a hydrohalic acid and the product is $H_2O$ and the metal halide of the oxide. The reaction mixture further comprises a source of hydrogen such as $H_2$ gas and a dissociator such as Pt/C wherein the H and $H_2O$ catalyst react to form hydrinos.

In an embodiment, the solid fuel comprises a $H_2$ source such as a permeation membrane or $H_2$ gas and a dissociator such as Pt/C and a source of $H_2O$ catalyst comprising an oxide or hydroxide that is reduced to $H_2O$. The metal of the oxide or hydroxide may form metal hydride that serves as a source of H. Exemplary reactions of an alkali hydroxide and oxide such as LiOH and $Li_2O$ are $$LiOH + H_2 \text{ to } H_2O + LiH \qquad (127)$$

$$Li_2O + H_2 \text{ to } H_2O + LiH \qquad (128)$$

The reaction mixture may comprise oxides or hydroxides of metals that undergo hydrogen reduction to $H_2O$ such as those of Cu, Ni, Pb, Sb, Bi, Co, Cd, Ge, Au, Ir, Fe, Hg, Mo, Os, Pd, Re, Rh, Ru, Se, Ag, Tc, Te, Tl, Sn, W, Al, V, Zr, Ti, Mn, Zn, Cr, and In and a source of hydrogen such as $H_2$ gas and a dissociator such as Pt/C.

In another embodiment, the reaction mixture comprises a $H_2$ source such as $H_2$ gas and a dissociator such as Pt/C and a peroxide compound such as $H_2O_2$ that decomposes to $H_2O$ catalyst and other products comprising oxygen such as $O_2$. Some of the $H_2$ and decomposition product such as $O_2$ may react to also form $H_2O$ catalyst.

In an embodiment, the reaction to form $H_2O$ as the catalyst comprises an organic dehydration reaction such as that of an alcohol such as a polyalcohol such as a sugar to an aldehyde and $H_2O$. In an embodiment, the dehydration reaction involves the release of $H_2O$ from a terminal alcohol to form an aldehyde. The terminal alcohol may comprise a sugar or a derivative thereof that releases $H_2O$ that may serve as a catalyst. Suitable exemplary alcohols are meso-erythritol, galactitol or dulcitol, and polyvinyl alcohol (PVA). An exemplary reaction mixture comprises a sugar+ hydrogen dissociator such as $Pd/Al_2O_3+H_2$. Alternatively, the reaction comprises a dehydration of a metal salt such as one having at least one water of hydration. In an embodiment, the dehydration comprises the loss of $H_2O$ to serve as the catalyst from hydrates such as aquo ions and salt hydrates such as $BaI_2 \cdot 2H_2O$ and $EuBr_2 \cdot nH_2O$.

In an embodiment, the reaction to form $H_2O$ catalyst comprises the hydrogen reduction of a compound comprising oxygen such as CO, an oxyanion such as $MNO_3$ (M=alkali), a metal oxide such as $NiO$, $Ni_2O_3$, $Fe_2O_3$, or $SnO$, a hydroxide such as $Co(OH)_2$, oxyhydroxides such as $FeOOH$, $COOH$, and $NiOOH$, and compounds, oxyanions, oxides, hydroxides, oxyhydroxides, peroxides, superoxides, and other compositions of matter comprising oxygen such as those of the present disclosure that are hydrogen reducible to $H_2O$. Exemplary compounds comprising oxygen or an oxyanion are $SOCl_2$, $Na_2S_2O_3$, $NaMnO_4$, $POBr_3$, $K_2S_2O_8$, CO, $CO_2$, NO, $NO_2$, $P_2O_5$, $N_2O_5$, $N_2O$, $SO_2$, $I_2O_5$, $NaClO_2$, NaClO, $K_2SO_4$, and $KHSO_4$. The source of hydrogen for hydrogen reduction may be at least one of $H_2$ gas and a hydride such as a metal hydride such as those of the present disclosure. The reaction mixture may further comprise a reductant that may form a compound or ion comprising oxygen. The cation of the oxyanion may form a product compound comprising another anion such as a halide, other chalcogenide, phosphide, other oxyanion, nitride, silicide, arsenide, or other anion of the present disclosure. Exemplary reactions are $$4NaNO_3(c) + 5MgH_2(c) \text{ to } 5MgO(c) + 4NaOH(c) + 3H_2O(1) + 2N_2(g) \qquad (129)$$

$$P_2O_5(c) + 6NaH(c) \text{ to } 2Na_3PO_4(c) + 3H_2O(g) \qquad (130)$$

$$NaClO_4(c) + 2MgH_2(c) \text{ to } 2MgO(c) + NaCl(c) + 2H_2O(l) \qquad (131)$$

$$KHSO_4 + 4H_2 \text{ to } KHS + 4H_2O \qquad (132)$$

$$K_2SO_4 + 4H_2 \text{ to } 2KOH + 2H_2O + H_2S \qquad (133)$$

$$LiNO_3 + 4H_2 \text{ to } LiNH_2 + 3H_2O \qquad (134)$$

$$GeO_2 + 2H_2 \text{ to } Ge + 2H_2O \qquad (135)$$

$$CO_2 + H_2 \text{ to } C + 2H_2O \qquad (136)$$

$$PbO_2 + 2H_2 \text{ to } 2H_2O + Pb \qquad (137)$$

$$V_2O_5 + 5H_2 \text{ to } 2V + 5H_2O \qquad (138)$$

$$Co(OH)_2 + H_2 \text{ to } Co + 2H_2O \qquad (139)$$

$$Fe_2O_3 + 3H_2 \text{ to } 2Fe + 3H_2O \qquad (140)$$

$$3Fe_2O_3 + H_2 \text{ to } 2Fe_3O_4 + H_2O \qquad (141)$$

$$Fe_2O_3 + H_2 \text{ to } 2FeO + H_2O \qquad (142)$$

$$Ni_2O_3 + 3H_2 \text{ to } 2Ni + 3H_2O \qquad (143)$$

$$3Ni_2O_3 + H_2 \text{ to } 2Ni_3O_4 + H_2O \qquad (144)$$

$$Ni_2O_3 + H_2 \text{ to } 2NiO + H_2O \qquad (145)$$

-continued $$3FeOOH + 1/2H_2 \text{ to } Fe_3O_4 + 2H_2O \qquad (146)$$

$$3NiOOH + 1/2H_2 \text{ to } Ni_3O_4 + 2H_2O \qquad (147)$$

$$3CoOOH + 1/2H_2 \text{ to } Co_3O_4 + 2H_2O \qquad (148)$$

$$FeOOH + 1/2H_2 \text{ to } FeO + H_2O \qquad (149)$$

$$NiOOH + 1/2H_2 \text{ to } NiO + H_2O \qquad (150)$$

$$CoOOH + 1/2H_2 \text{ to } CoO + H_2O \qquad (151)$$

$$SnO + H_2 \text{ to } Sn + H_2O \qquad (152)$$

The reaction mixture may comprise a source of an anion or an anion and a source of oxygen or oxygen such as a compound comprising oxygen wherein the reaction to form $H_2O$ catalyst comprises an anion-oxygen exchange reaction with optionally $H_2$ from a source reacting with the oxygen to form $H_2O$. Exemplary reactions are $$2NaOH + H_2 + S \text{ to } Na_2S + 2H_2O \qquad (153)$$

$$2NaOH + H_2 + Te \text{ to } Na_2Te + 2H_2O \qquad (154)$$

$$2NaOH + H_2 + Se \text{ to } Na_2Se + 2H_2O \qquad (155)$$

$$LiOH + NH_3 \text{ to } LiNH_2 + H_2O \qquad (156)$$

In another embodiment, the reaction mixture comprises an exchange reaction between chalcogenides such as one between reactants comprising O and S. An exemplary chalcogenide reactant such as tetrahedral ammonium tetrathiomolybdate contains the ($[MoS_4]^{2-}$) anion. An exemplary reaction to form nascent $H_2O$ catalyst and optionally nascent H comprises the reaction of molybdate $[MoO_4]^{2-}$ with hydrogen sulfide in the presence of ammonia:

$$[NH_4]_2[MoO_4] + 4H_2S \text{ to } [NH_4]_2[MoS_4] + 4H_2O \qquad (157)$$

In an embodiment, the reaction mixture comprises a source of hydrogen, a compound comprising oxygen, and at least one element capable of forming an alloy with at least one other element of the reaction mixture. The reaction to form $H_2O$ catalyst may comprise an exchange reaction of oxygen of the compound comprising oxygen and an element capable of forming an alloy with the cation of the oxygen compound wherein the oxygen reacts with hydrogen from the source to form $H_2O$. Exemplary reactions are $$NaOH + 1/2H_2 + Pd \text{ to } NaPb + H_2O \qquad (158)$$

$$NaOH + 1/2H_2 + Bi \text{ to } NaBi + H_2O \qquad (159)$$

$$NaOH + 1/2H_2 + 2Cd \text{ to } Cd_2Na + H_2O \qquad (160)$$

$$NaOH + 1/2H_2 + 4Ga \text{ to } Ga_4Na + H_2O \qquad (161)$$

$$NaOH + 1/2H_2 + Sn \text{ to } NaSn + H_2O \qquad (162)$$

$$NaAlH_4 + Al(OH)_3 + 5Ni \text{ to } NaAlO_2 + Ni_5Al + H_2O + 5/2H_2 \qquad (163)$$

In an embodiment, the reaction mixture comprises a compound comprising oxygen such as an oxyhydroxide and a reductant such as a metal that forms an oxide. The reaction to form $H_2O$ catalyst may comprise the reaction of an oxyhydroxide with a metal to from a metal oxide and $H_2O$. Exemplary reactions are $$2MnOOH + Sn \text{ to } 2MnO + SnO + H_2O \qquad (164)$$

$$4MnOOH + Sn \text{ to } 4MnO + SnO_2 + 2H_2O \qquad (165)$$

$$2MnOOH + Zn \text{ to } 2MnO + ZnO + 2H_2O \qquad (166)$$

In an embodiment, the reaction mixture comprises a compound comprising oxygen such as a hydroxide, a source of hydrogen, and at least one other compound comprising a different anion such as halide or another element. The reaction to form $H_2O$ catalyst may comprise the reaction of the hydroxide with the other compound or element wherein the anion or element is exchanged with hydroxide to from another compound of the anion or element, and $H_2O$ is formed with the reaction of hydroxide with $H_2$. The anion may comprise halide. Exemplary reactions are $$2NaOH + NiCl_2 + H_2 \text{ to } 2NaCl + 2H_2O + Ni \qquad (167)$$

$$2NaOH + I_2 + H_2 \text{ to } 2NaI + 2H_2O \qquad (168)$$

$$2NaOH + XeF_2 + H_2 \text{ to } 2NaF + 2H_2O + Xe \qquad (169)$$

$$BiX_3 \ (X = halide) + 4Bi(OH)_3 \text{ to } 3BiOX + Bi_2O_3 + 6H_2O \qquad (170)$$

The hydroxide and halide compounds may be selected such that the reaction to form $H_2O$ and another halide is thermally reversible. In an embodiment, the general exchange reaction is $$NaOH + 1/2H_2 + 1/yM_xCl_y = NaCl + 6H_2O + x/yM \qquad (171)$$

wherein exemplary compounds $M_xCl_y$ are $AlCl_3$, $BeCl_2$, $HfCl_4$, $KAgCl_2$, $MnCl_2$, $NaAlCl_4$, $ScCl_3$, $TiCl_2$, $TiCl_3$, $UCl_3$, $UCl_4$, $ZrCl_4$, $EuCl_3$, $GdCl_3$, $MgCl_2$, $NdCl_3$, and $YCl_3$. At an elevated temperature the reaction of Eq. (171) such as in the range of about 100° C. to 2000° C. has at least one of an enthalpy and free energy of about 0 kJ and is reversible. The reversible temperature is calculated from the corresponding thermodynamic parameters of each reaction. Representative are temperature ranges are NaCl—$ScCl_3$ at about 800K-900K, NaCl—$TiCl_2$ at about 300K-400K, NaCl—$UCl_3$ at about 600K-800K, NaCl—$UCl_4$ at about 250K-300K, NaCl—$ZrCl_4$ at about 250K-300K, NaCl—$MgCl_2$ at about 900K-1300K, NaCl—$EuCl_3$ at about 900K-1000K, NaCl—$NdCl_3$ at about >1000K, and NaCl—$YCl_3$ at about >1000K.

In an embodiment, the reaction mixture comprises an oxide such as a metal oxide such a alkali, alkaline earth, transition, inner transition, and rare earth metal oxides and those of other metals and metalloids such as those of Al, Ga, In, Si, Ge, Sn, Pb, As, Sb, Bi, Se, and Te, a peroxide such as $M_2O_2$ where M is an alkali metal such as $Li_2O_2$, $Na_2O_2$, and $K_2O_2$, and a superoxide such as $MO_2$ where M is an alkali metal such as $NaO_2$, $KO_2$, $RbO_2$, and $CsO_2$, and alkaline earth metal superoxides, and a source of hydrogen. The ionic peroxides may further comprise those of Ca, Sr, or Ba. The reaction to form $H_2O$ catalyst may comprise the hydrogen reduction of the oxide, peroxide, or superoxide to form $H_2O$. Exemplary reactions are $$Na_2O + 2H_2 \text{ to } 2NaH + H_2O \tag{172}$$

$$Li_2O_2 + H_2 \text{ to } Li_2O + H_2O \tag{173}$$

$$KO_2 + 3/2H_2 \text{ to } KOH + H_2O \tag{174}$$

In an embodiment, the reaction mixture comprises a source of hydrogen such as at least one of $H_2$, a hydride such as at least one of an alkali, alkaline earth, transition, inner transition, and rare earth metal hydride and those of the present disclosure and a source of hydrogen or other compound comprising combustible hydrogen such as a metal amide, and a source of oxygen such as $O_2$. The reaction to form $H_2O$ catalyst may comprise the oxidation of $H_2$, a hydride, or hydrogen compound such as metal amide to form $H_2O$. Exemplary reactions are $$2NaH + O_2 \text{ to } Na_2O + H_2O \tag{175}$$

$$H_2 + 1/2O_2 \text{ to } H_2O \tag{176}$$

$$LiNH_2 + 2O_2 \text{ to } LiNO_3 + H_2O \tag{177}$$

$$2LiNH_2 + 3/2O_2 \text{ to } 2LiOH + H_2O + N_2 \tag{178}$$

In an embodiment, the reaction mixture comprises a source of hydrogen and a source of oxygen. The reaction to form $H_2O$ catalyst may comprise the decomposition of at least one of source of hydrogen and the source of oxygen to form $H_2O$. Exemplary reactions are $$NH_4NO_3 \text{ to } N_2O + 2H_2O \tag{179}$$

$$NH_4NO_3 \text{ to } N_2 + 1/2O_2 + 2H_2O \tag{180}$$

$$H_2O_2 \text{ to } 1/2O_2 + H_2O \tag{181}$$

$$H_2O_2 + H_2 \text{ to } 2H_2O \tag{182}$$

The reaction mixtures disclosed herein this Chemical Reactor section further comprise a source of hydrogen to form hydrinos. The source may be a source of atomic hydrogen such as a hydrogen dissociator and $H_2$ gas or a metal hydride such as the dissociators and metal hydrides of the present disclosure. The source of hydrogen to provide atomic hydrogen may be a compound comprising hydrogen such as a hydroxide or oxyhydroxide. The H that reacts to form hydrinos may be nascent H formed by reaction of one or more reactants wherein at least one comprises a source of hydrogen such as the reaction of a hydroxide and an oxide. The reaction may also form $H_2O$ catalyst. The oxide and hydroxide may comprise the same compound. For example, an oxyhydroxide such as FeOOH could dehydrate to provide $H_2O$ catalyst and also provide nascent H for a hydrino reaction during dehydration:

$$4FeOOH \text{ to } H_2O + Fe_2O_3 + 2FeO + O_2 + 2H(1/4) \tag{183}$$

wherein nascent H formed during the reaction reacts to hydrino. Other exemplary reactions are those of a hydroxide and an oxyhydroxide or an oxide such as NaOH+FeOOH or $Fe_2O_3$ to form an alkali metal oxide such as $NaFeO_2 + H_2O$ wherein nascent H formed during the reaction may form hydrino wherein $H_2O$ serves as the catalyst. The oxide and hydroxide may comprise the same compound. For example, an oxyhydroxide such as FeOOH could dehydrate to provide $H_2O$ catalyst and also provide nascent H for a hydrino reaction during dehydration:

$$4FeOOH \text{ to } H_2O + Fe_2O_3 + 2FeO + O_2 + 2H(1/4) \tag{184}$$

wherein nascent H formed during the reaction reacts to hydrino. Other exemplary reactions are those of a hydroxide and an oxyhydroxide or an oxide such as NaOH+FeOOH or $Fe_2O_3$ to form an alkali metal oxide such as $NaFeO_2 + H_2O$ wherein nascent H formed during the reaction may form hydrino wherein $H_2O$ serves as the catalyst. Hydroxide ion is both reduced and oxidized in forming $H_2O$ and oxide ion. Oxide ion may react with $H_2O$ to form $OH^-$. The same pathway may be obtained with a hydroxide-halide exchange reaction such as the following $$2M(OH)_2 + 2M'X_2 \rightarrow H_2O + 2MX_2 + 2M'O + 1/2O_2 + 2H(1/4) \tag{185}$$

wherein exemplary M and M' metals are alkaline earth and transition metals, respectively, such as $Cu(OH)_2 + FeBr_2$, $Cu(OH)_2 + CuBr_2$, or $Co(OH)_2 + CuBr_2$. In an embodiment, the solid fuel may comprise a metal hydroxide and a metal halide wherein at least one metal is Fe. At least one of $H_2O$ and $H_2$ may be added to regenerate the reactants. In an embodiment, M and M' may be selected from the group of alkali, alkaline earth, transition, inner transition, and rare earth metals, Al, Ga, In, Si, Ge, Sn, Pb, Group 13, 14, 15, and 16 elements, and other cations of hydroxides or halides such as those of the present disclosure. An exemplary reaction to form at least one of HOH catalyst, nascent H, and hydrino is $$4MOH + 4M'X \rightarrow H_2O + 2M_2'O + M_2O + 2MX + X_2 + 2H(1/4) \tag{186}$$

In an embodiment, the reaction mixture comprises at least one of a hydroxide and a halide compound such as those of the present disclosure. In an embodiment, the halide may serve to facilitate at least one of the formation and maintenance of at least one of nascent HOH catalyst and H. In an embodiment, the mixture may serve to lower the melting point of the reaction mixture.

In an embodiment, the solid fuel comprises a mixture of $Mg(OH)_2 + CuBr_2$. The product CuBr may be sublimed to form a CuBr condensation product that is separated from the nonvolatile MgO. $Br_2$ may be trapped with a cold trap. CuBr may be reacted with $Br_2$ to form $CuBr_2$, and MgO may be reacted with $H_2O$ to form $Mg(OH)_2$. $Mg(OH)_2$ may be combined with $CuBr_2$ to form the regenerated solid fuel.

An acid-base reaction is another approach to $H_2O$ catalyst. Thus, the thermal chemical reaction is similar to the electrochemical reaction to form hydrinos. Exemplary halides and hydroxides mixtures are those of Bi, Cd, Cu, Co, Mo, and Cd and mixtures of hydroxides and halides of metals having low water reactivity of the group of Cu, Ni, Pb, Sb, Bi, Co, Cd, Ge, Au, Ir, Fe, Hg, Mo, Os, Pd, Re, Rh, Ru, Se, Ag, Tc, Te, Tl, Sn, W, and Zn. In an embodiment, the reaction mixture further comprises $H_2O$ that may serve as a source of at least one of H and catalyst such as nascent $H_2O$. The water may be in the form of a hydrate that decomposes or otherwise reacts during the reaction.

In an embodiment, the solid fuel comprises a reaction mixture of $H_2O$ and an inorganic compound that forms nascent H and nascent $H_2O$. The inorganic compound may comprise a halide such as a metal halide that reacts with the $H_2O$. The reaction product may be at least one of a hydroxide, oxyhydroxide, oxide, oxyhalide, hydroxyhalide, and hydrate. Other products may comprise anions comprising oxygen and halogen such as $XO^-$, $XO_2^-$, $XO_3^-$, and $XO_4^-$ (X=halogen). The product may also be at least one of a reduced cation and a halogen gas. The halide may be a metal halide such as one of an alkaline, alkaline earth, transition, inner transition, and rare earth metal, and Al, Ga, In, Sn, Pb, S, Te, Se, N, P, As, Sb, Bi, C, Si, Ge, and B, and other elements that form halides. The metal or element may additionally be one that forms at least one of a hydroxide, oxyhydroxide, oxide, oxyhalide, hydroxyhalide, hydrate, and one that forms a compound having an anion comprising oxygen and halogen such as $XO^-$, $XO_2^-$, $XO_3^-$, and $XO_4^-$ (X=halogen). Suitable exemplary metals and elements are at least one of an alkaline, alkaline earth, transition, inner transition, and rare earth metal, and Al, Ga, In, Sn, Pb, S, Te, Se, N, P, As, Sb, Bi, C, Si, Ge, and B. An exemplary reaction is $$5MX_2 + 7H_2O \text{ to } MXOH + \quad (187)$$

$$M(OH)_2 + MO + M_2O_3 + 11H(1/4) + 9/2X_2$$

wherein M is a metal such as a transition metal such as Cu and X is halogen such as Cl.

In an embodiment, $H_2O$ serves as the catalyst that is maintained at low concentration to provide nascent $H_2O$. In an embodiment, the low concentration is achieved by dispersion of the $H_2O$ molecules in another material such as a solid, liquid, or gas. The $H_2O$ molecules may be diluted to the limit of isolated of nascent molecules. The material also comprises a source of H. The material may comprise an ionic compound such as an alkali halide such as a potassium halide such as KCl or a transition metal halide such as $CuBr_2$. The low concentration to form nascent H may also be achieved dynamically wherein $H_2O$ is formed by a reaction. The product $H_2O$ may be removed at a rate relative to the rate of formation that results in a steady state low concentration to provide at least one of nascent H and nascent HOH. The reaction to form $H_2O$ may comprise dehydration, combustion, acid-base reactions and others such as those of the present disclosure. The $H_2O$ may be removed by means such as evaporation and condensation. Exemplary reactants are FeOOH to form iron oxide and $H_2O$ wherein nascent H is also formed with the further reaction to from hydrinos. Other exemplary reaction mixtures are $Fe_2O_3$+at least one of NaOH and $H_2$, and FeOOH+at least one of NaOH and $H_2$. The reaction mixture may be maintained at an elevated temperature such as in the range of about 100° C. to 600° C. $H_2O$ product may be removed by condensation of steam in a cold spot of the reactor such as a gas line maintained below 100° C. In another embodiment, a material comprising $H_2O$ as an inclusion or part of a mixture or a compound such as $H_2O$ dispersed or absorbed in a lattice such as that of an ionic compound such as an alkali halide such as a potassium halide such as KCl may be incident with the bombardment of energetic particles. The particles may comprise at least one of photons, ions, and electrons. The particles may comprise a beam such as an electron beam. The bombardment may provide at least one of $H_2O$ catalyst, H, and activation of the reaction to form hydrinos. In embodiments of the SF-CIHT cell, the $H_2O$ content may be high. The $H_2O$ may be ignited to form hydrinos at a high rate by a high current.

The reaction mixture may further comprise a support such as an electrically conductive, high surface area support. Suitable exemplary supports are those of the present disclosure such as a metal powder such as Ni or R—Ni, metal screen such as Ni, Ni celmet, Ni mesh, carbon, carbides such as TiC and WC, and borides. The support may comprise a dissociator such as Pd/C or Pd/C. The reactants may be in any desired molar ratio. In an embodiment, the stoichiometry is such to favor reaction completion to form $H_2O$ catalyst and to provide H to form hydrinos. The reaction temperature may be in any desired range such as in the range of about ambient to 1500° C. The pressure range may be any desired such as in the range of about 0.01 Torr to 500 atm. The reactions are at least one of regenerative and reversible by the methods disclosed herein and in Mills Prior Applications such as Hydrogen Catalyst Reactor, PCT/US08/61455, filed PCT Apr. 24, 2008; Heterogeneous Hydrogen Catalyst Reactor, PCT/US09/052072, filed PCT Jul. 29, 2009; Heterogeneous Hydrogen Catalyst Power System, PCT/US10/27828, PCT filed Mar. 18, 2010; Electrochemical Hydrogen Catalyst Power System, PCT/US11/28889, filed PCT Mar. 17, 2011; $H_2O$-Based Electrochemical Hydrogen-Catalyst Power System, PCT/US12/31369 filed Mar. 30, 2012, and CIHT Power System, PCT/US13/041938 filed May 21, 2013 herein incorporated by reference in their entirety. Reactions that form $H_2O$ may be reversible by changing the reaction conditions such as temperature and pressure to allow the reverse reaction that consumes $H_2O$ to occur as known by those skilled in the art. For example, the $H_2O$ pressure may be increased in the backward reaction to reform the reactants from the products by rehydration. In other cases, the hydrogen-reduced product may be regenerated by oxidation such as by reaction with at least one of oxygen and $H_2O$. In an embodiment, a reverse reaction product may be removed from the reaction such that the reverse or regeneration reaction proceeds. The reverse reaction may become favorable even in the absence of being favorable based on equilibrium thermodynamics by removing at least one reverse reaction product. In an exemplary embodiment, the regenerated reactant (reverse or regeneration reaction product) comprises a hydroxide such as an alkali hydroxide. The hydroxide may be removed by methods such as solvation or sublimation. In the latter case, alkali hydroxide sublime unchanged at a temperature in the range of about 350° C. to 400° C. The reactions may be maintained in the power plants systems of Mills Prior Applications. Thermal energy from a cell producing power may provide heat to at least one other cell undergoing regeneration as disclosed previously. Alternatively, the equilibrium of the reactions to form $H_2O$ catalyst and the reverse regeneration reaction can be shifted by changing the temperature of the water wall of the system design having a temperature gradient due to coolant at selected region of the cell as previously disclosed.

In an embodiment, the halide and oxide may undergo an exchange reaction. The products of the exchange reaction may be separated from each other. The exchange reaction may be performed by heating the product mixture. The separation may be by sublimation that may be driven by at least one of heating and applying a vacuum. In an exemplary embodiment, $CaBr_2$ and CuO may undergo an exchange reaction due to heating to a high temperature such as in the range of about 700° C. to 900° C. to form $CuBr_2$ and CaO. Any other suitable temperature range may be used such as in the range of about 100° C. to 2000° C. The $CuBr_2$ may be separated and collected by sublimation that may be achieved by applying heat and low pressure. The $CuBr_2$ may form a separate band. The CaO may be reacted with $H_2O$ to form $Ca(OH)_2$.

In an embodiment, the solid fuel or energetic material comprises a source of singlet oxygen. An exemplary reaction to generate singlet oxygen is $$NaOCl + H_2O_2 \text{ to } O_2 + NaCl + H_2O \qquad (188)$$

In another embodiment, the solid fuel or energetic material comprises a source of or reagents of the Fenton reaction such as $H_2O_2$.

In an embodiment, lower energy hydrogen species and compounds are synthesized using a catalyst comprising at least one of H and O such as $H_2O$. The reaction mixture to synthesize the exemplary lower energy hydrogen compound MHX wherein M is alkali and may be another metal such as alkaline earth wherein the compound has the corresponding stoichiometry, H is hydrino such as hydrino hydride, and X is an anion such as halide, comprises a source of M and X such as an alkali halide such as KCl, and metal reductant such as an alkali metal, a hydrogen dissociator such as Ni such as Ni screen or R—Ni and optionally a support such as carbon, a source of hydrogen such as at least one of a metal hydride such as MH that may substitute for M and $H_2$ gas, and a source of oxygen such as a metal oxide or a compound comprising oxygen. Suitable exemplary metal oxides are $Fe_2O_3$, $Cr_2O_3$, and NiO. The reaction temperature may be maintained in the range of about 200° C. to 1500° C. or about 400° C. to 800° C. The reactants may be in any desired ratios. The reaction mixture to form KHCl may comprise K, Ni screen, KCl, hydrogen gas, and at least one of $Fe_2O_3$, $Cr_2O_3$, and NiO. Exemplary weights and conditions are 1.6 g K, 20 g KCl, 40 g Ni screen, equal moles of oxygen as K from the metal oxides such as 1.5 g $Fe_2O_3$ and 1.5 g NiO, 1 atm $H_2$, and a reaction temperature of about 550-600° C. The reaction forms $H_2O$ catalyst by reaction of H with O from the metal oxide and H reacts with the catalyst to form hydrinos and hydrino hydride ions that form the product KHCl. The reaction mixture to form KHI may comprise K, R—Ni, KI, hydrogen gas, and at least one of $Fe_2O_3$, $Cr_2O_3$, and NiO. Exemplary weights and conditions are 1 g K, 20 g KI, 15 g R—Ni 2800, equal moles of oxygen as K from the metal oxides such as 1 g $Fe_2O_3$ and 1 g NiO, 1 atm $H_2$, and a reaction temperature of about 450-500° C. The reaction forms $H_2O$ catalyst by reaction of H with O from the metal oxide and H reacts with the catalyst to form hydrinos and hydrino hydride ions that form the product KHI. In an embodiment, the product of at least one of the CIHT cell, SF-CIHT cell, solid fuel, or chemical cell is $H_2(1/4)$ that causes an upfield H NMR matrix shift. In an embodiment, the presence of a hydrino species such as a hydrino atom or molecule in a solid matrix such as a matrix of a hydroxide such as NaOH or KOH causes the matrix protons to shift upfield. The matrix protons such as those of NaOH or KOH may exchange. In an embodiment, the shift may cause the matrix peak to be in the range of about −0.1 to −5 ppm relative to TMS.

In an embodiment, the regeneration reaction of a hydroxide and halide compound mixture such as $Cu(OH)_2+CuBr_2$ may by addition of at least one $H_2$ and $H_2O$. Products such as halides and oxides may be separated by sublimation of the halide. In an embodiment, $H_2O$ may be added to the reaction mixture under heating conditions to cause the hydroxide and halide such as $CuBr_2$ and $Cu(OH)_2$ to form from the reaction products. In an embodiment, the regeneration may be achieved by the step of thermal cycling. In an embodiment, the halide such as $CuBr_2$ is $H_2O$ soluble whereas the hydroxide such as $Cu(OH)_2$ is insoluble. The regenerated compounds may be separated by filtering or precipitation. The chemicals may be dried wherein the thermal energy may be from the reaction. Heat may be recuperated from the driven off water vapor. The recuperation may be by a heat exchanger or by using the steam directly for heating or to generate electricity using a turbine and generator for example. In an embodiment, the regeneration of $Cu(OH)_2$ from CuO is achieved by using a $H_2O$ splitting catalyst. Suitable catalysts are noble metals on a support such as $Pt/Al_2O_3$, and $CuAlO_2$ formed by sintering CuO and $Al_2O_3$, cobalt-phosphate, cobalt borate, cobalt methyl borate, nickel borate, $RuO_2$, $LaMnO_3$, $SrTiO_3$, $TiO_2$, and $WO_3$. An exemplary method to form an $H_2O$-splitting catalyst is the controlled electrolysis of $Co^{2+}$ and $Ni^{2+}$ solution in about 0.1 M potassium phosphate borate electrolyte, pH 9.2, at a potential of 0.92 and 1.15 V (vs., the normal hydrogen electrode), respectively. Exemplary, thermally reversible solid fuel cycles are $$T100 \quad 2CuBr_2 + Ca(OH)_2 \rightarrow 2CuO + 2CaBr_2 + H_2O \qquad (189)$$

$$T730 \quad CaBr_2 + 2H_2O \rightarrow Ca(OH)_2 + 2HB_r \qquad (190)$$

$$T100 \quad CuO + 2HBr \rightarrow Ca(OH)_2 + H_2O \qquad (191)$$

$$T100 \quad 2CuBr_2 + Cu(OH)_2 \rightarrow CuBr_2 + H_2O \qquad (192)$$

$$T730 \quad CuBr_2 + 2H_2O \rightarrow Cu(OH)_2 + 2HBr \qquad (193)$$

$$T100 \quad CuO + 2HBr \rightarrow CuBr_2 + H_2O \qquad (195)$$

In an embodiment, the reaction mixture of a solid fuel having at least one of $H_2$ as a reactant and $H_2O$ as a product and one or more of $H_2$ or $H_2O$ as at least one of a reactant and a product is selected such that the maximum theoretical free energy of the any conventional reaction is about zero within the range of −500 to +500 kJ/mole of the limiting reagent or preferably within the range of −100 to +100 kJ/mole of the limiting reagent. A mixture of reactants and products may be maintained at one or more of about the optimum temperature at which the free energy is about zero and about the optimum temperature at which the reaction is reversible to obtain regeneration or steady power for at least a duration longer than reaction time in the absence of maintaining the mixture and temperature. The temperature may be within a range of about +/−500° C. or about +/−100° C. of the optimum. Exemplary mixtures and reaction temperatures are a stoichiometric mixture of Fe, $Fe_2O_3$, $H_2$ and $H_2O$ at 800 K and a stoichiometric Sn, SnO, $H_2$ and $H_2O$ at 800 K.

In an embodiment, wherein at least one of an alkali metal M such as K or Li, and nH (n=integer), OH, O, 2O, $O_2$, and $H_2O$ serve as the catalyst, the source of H is at least one of a metal hydride such as MH and the reaction of at least one of a metal M and a metal hydride MH with a source of H to form H. One product may be an oxidized M such as an oxide or hydroxide. The reaction to create at least one of atomic hydrogen and catalyst may be an electron transfer reaction or an oxidation-reduction reaction. The reaction mixture may further comprise at least one of $H_2$, a $H_2$ dissociator such as those of the present disclosure such as Ni screen or R—Ni and an electrically conductive support such as these dissociators and others as well as supports of the present disclosure such as carbon, and carbide, a boride, and a carbonitride. An exemplary oxidation reaction of M or MH is $$4M\text{H} + \text{Fe}_2\text{O}_3 \text{ to } + \text{H}_2\text{O} + \text{H}(1/p) + M_2\text{O} + M\text{OH} + 2\text{Fe} + M \qquad (195)$$

wherein at least one of $H_2O$ and M may serve as the catalyst to form H(1/p). The reaction mixture may further comprise a getter for hydrino such as a compound such as a salt such as a halide salt such as an alkali halide salt such as KCl or KI. The product may be MHX (M=metal such as an alkali; X is counter ion such as halide; H is hydrino species). Other hydrino catalysts may substitute for M such as those of the present disclosure such as those of TABLE 1.

In an embodiment, the source of oxygen is a compound that has a heat of formation that is similar to that of water such that the exchange of oxygen between the reduced product of the oxygen source compound and hydrogen occurs with minimum energy release. Suitable exemplary oxygen source compounds are CdO, CuO, ZnO, $SO_2$, $SeO_2$, and $TeO_2$. Others such as metal oxides may also be anhydrides of acids or bases that may undergo dehydration reactions as the source of $H_2O$ catalyst are $MnO_x$, $AlO_x$, and $SiO_x$. In an embodiment, an oxide layer oxygen source may cover a source of hydrogen such as a metal hydride such as palladium hydride. The reaction to form $H_2O$ catalyst and atomic H that further react to form hydrino may be initiated by heating the oxide coated hydrogen source such as metal oxide coated palladium hydride. The palladium hydride may be coated on the opposite side as that of the oxygen source by a hydrogen impermeable layer such as a layer of gold film to cause the released hydrogen to selectively migrate to the source of oxygen such the oxide layer such as a metal oxide. In an embodiment, the reaction to form the hydrino catalyst and the regeneration reaction comprise an oxygen exchange between the oxygen source compound and hydrogen and between water and the reduced oxygen source compound, respectively. Suitable reduced oxygen sources are Cd, Cu, Zn, S, Se, and Te. In an embodiment, the oxygen exchange reaction may comprise those used to form hydrogen gas thermally. Exemplary thermal methods are the iron oxide cycle, cerium(IV) oxide-cerium(III) oxide cycle, zinc zinc-oxide cycle, sulfur-iodine cycle, copper-chlorine cycle and hybrid sulfur cycle and others known to those skilled in the art. In an embodiment, the reaction to form hydrino catalyst and the regeneration reaction such as an oxygen exchange reaction occurs simultaneously in the same reaction vessel. The conditions such a temperature and pressure may be controlled to achieve the simultaneity of reaction. Alternately, the products may be removed and regenerated in at least one other separate vessel that may occur under conditions different than those of the power forming reaction as given in the present disclosure and Mills Prior Applications.

In an embodiment, the $NH_2$ group of an amide such as $LiNH_2$ serves as the catalyst wherein the potential energy is about 81.6 eV corresponding to m=3 in Eq. (5). Similarly to the reversible $H_2O$ elimination or addition reaction of between acid or base to the anhydride and vice versa, the reversible reaction between the amide and imide or nitride results in the formation of the $NH_2$ catalyst that further reacts with atomic H to form hydrinos. The reversible reaction between amide, and at least one of imide and nitride may also serve as a source of hydrogen such as atomic H.

In an embodiment, a hydrino species such as molecular hydrino or hydrino hydride ion is synthesized by the reaction of H and at least one of OH and $H_2O$ catalyst. The hydrino species may be produced by at least two of the group of a metal such as an alkali, alkaline earth, transition, inner transition, and rare earth metal, Al, Ga, In, Ge, Sn, Pb, As, Sb, and Te, a metal hydride such as $LaNi_5H_6$ and others of the present disclosure, an aqueous hydroxide such as an alkaline hydroxide such as KOH at 0.1 M up to saturated concentration, a support such as carbon, Pt/C, steam carbon, carbon black, a carbide, a boride, or a nitrile, and oxygen. Suitable exemplary reaction mixtures to form hydrino species such as molecular hydrino are (1) Co PtC KOH (sat) with and without $O_2$; (2) Zn or Sn+$LaNi_5H_6$+KOH (sat), (3) Co, Sn, Sb, or Zn+$O_2$+CB+KOH (sat), (4) Al CB KOH (sat), (5) Sn Ni-coated graphite KOH (sat) with and without $O_2$, (6) Sn+SC or CB+KOH (sat)+$O_2$, (7) Zn Pt/C KOH (sat) $O_2$, (8) Zn R—Ni KOH (sat) $O_2$, (9) Sn $LaNi_5H_6$ KOH (sat) $O_2$, (10) Sb $LaNi_5H_6$ KOH (sat) $O_2$, (11) Co, Sn, Zn, Pb, or Sb+KOH (Sat aq)+$K_2CO_3$+CB-SA, and (12) $LiNH_2$ LiBr and LiH or Li and $H_2$ or a source thereof and optionally a hydrogen dissociator such as Ni or R—Ni. Additional reaction mixtures comprise a molten hydroxide, a source of hydrogen, a source of oxygen, and a hydrogen dissociator. Suitable exemplary reaction mixtures to form hydrino species such as molecular hydrino are (1) Ni($H_2$) LiOH—LiBr air or $O_2$, (2) Ni($H_2$) NaOH—NaBr air or $O_2$, and (3) Ni($H_2$) KOH—NaBr air or $O_2$.

In an embodiment, the product of at least one of the chemical, SF-CIHT, and CIHT cell reactions to form hydrinos is a compound comprising hydrino or lower-energy hydrogen species such as $H_2(1/p)$ complexed with an inorganic compound. The compound may comprise an oxyanion compound such as an alkali or alkaline earth carbonate or hydroxide or other such compounds of the present disclosure. In an embodiment, the product comprises at least one of $M_2CO_3 \cdot H_2(1/4)$ and $MOH \cdot H_2(1/4)$ (M=alkali or other cation of the present disclosure) complex. The product may be identified by ToF-SIMS as a series of ions in the positive spectrum comprising $$M(M_2\text{CO}_3 \cdot \text{H}_2(1/4))_n^+) \text{ and } M(\text{KOH} \cdot \text{H}_2(1/4))_n^+,$$

respectively, wherein n is an integer and an integer and integer p>1 may be substituted for 4. In an embodiment, a compound comprising silicon and oxygen such as $SiO_2$ or quartz may serve as a getter for $H_2(1/4)$. The getter for $H_2(1/4)$ may comprise a transition metal, alkali metal, alkaline earth metal, inner transition metal, rare earth metal, combinations of metals, alloys such as a Mo alloy such as MoCu, and hydrogen storage materials such as those of the present disclosure.

The lower-energy hydrogen compounds synthesized by the methods of the present disclosure may have the formula MH, $MH_2$, or $M_2H_2$, wherein M is an alkali cation and H is an increased binding energy hydride ion or an increased binding energy hydrogen atom. The compound may have the formula $MH_n$ wherein n is 1 or 2, M is an alkaline earth cation and H is an increased binding energy hydride ion or an increased binding energy hydrogen atom. The compound may have the formula MHX wherein M is an alkali cation, X is one of a neutral atom such as halogen atom, a molecule, or a singly negatively charged anion such as halogen anion, and H is an increased binding energy hydride ion or an increased binding energy hydrogen atom. The compound may have the formula MHX wherein M is an alkaline earth cation, X is a singly negatively charged anion, and H is an increased binding energy hydride ion or an increased binding energy hydrogen atom. The compound may have the formula MHX wherein M is an alkaline earth cation, X is a double negatively charged anion, and H is an increased binding energy hydrogen atom. The compound may have the formula $M_2HX$ wherein M is an alkali cation, X is a singly negatively charged anion, and H is an increased binding energy hydride ion or an increased binding energy hydrogen atom. The compound may have the formula $MH_n$ wherein n is an integer, M is an alkaline cation and the hydrogen content $H_n$ of the compound comprises at least one increased binding energy hydrogen species. The compound may have the formula $M_2H_n$ wherein n is an integer, M is an alkaline earth cation and the hydrogen content $H_n$ of the compound comprises at least one increased binding energy hydrogen species. The compound may have the formula $M_2XH_n$ wherein n is an integer, M is an alkaline earth cation, X is a singly negatively charged anion, and the hydrogen content $H_n$ of the compound comprises at least one increased binding energy hydrogen species. The compound may have the formula $M_2X_2H_n$ wherein n is 1 or 2, M is an alkaline earth cation, X is a singly negatively charged anion, and the hydrogen content $H_n$ of the compound comprises at least one increased binding energy hydrogen species. The compound may have the formula $M_2X_3H$ wherein M is an alkaline earth cation, X is a singly negatively charged anion, and H is an increased binding energy hydride ion or an increased binding energy hydrogen atom. The compound may have the formula $M_2XH_n$ wherein n is 1 or 2, M is an alkaline earth cation, X is a double negatively charged anion, and the hydrogen content $H_n$ of the compound comprises at least one increased binding energy hydrogen species. The compound may have the formula $M_2XX'H$ wherein M is an alkaline earth cation, X is a singly negatively charged anion, X' is a double negatively charged anion, and H is an increased binding energy hydride ion or an increased binding energy hydrogen atom. The compound may have the formula $MM'H_n$ wherein n is an integer from 1 to 3, M is an alkaline earth cation, M' is an alkali metal cation and the hydrogen content $H_n$ of the compound comprises at least one increased binding energy hydrogen species. The compound may have the formula $MM'XH_n$ wherein n is 1 or 2, M is an alkaline earth cation, M' is an alkali metal cation, X is a singly negatively charged anion and the hydrogen content $H_n$ of the compound comprises at least one increased binding energy hydrogen species. The compound may have the formula MM'XH wherein M is an alkaline earth cation, M' is an alkali metal cation, X is a double negatively charged anion and H is an increased binding energy hydride ion or an increased binding energy hydrogen atom. The compound may have the formula MM'XX'H wherein M is an alkaline earth cation, M' is an alkali metal cation, X and X' are singly negatively charged anion and H is an increased binding energy hydride ion or an increased binding energy hydrogen atom. The compound may have the formula $MXX'H_n$ wherein n is an integer from 1 to 5, M is an alkali or alkaline earth cation, X is a singly or double negatively charged anion, X' is a metal or metalloid, a transition element, an inner transition element, or a rare earth element, and the hydrogen content $H_n$ of the compound comprises at least one increased binding energy hydrogen species. The compound may have the formula $MH_n$ wherein n is an integer, M is a cation such as a transition element, an inner transition element, or a rare earth element, and the hydrogen content $H_n$ of the compound comprises at least one increased binding energy hydrogen species. The compound may have the formula $MXH_n$ wherein n is an integer, M is an cation such as an alkali cation, alkaline earth cation, X is another cation such as a transition element, inner transition element, or a rare earth element cation, and the hydrogen content $H_n$ of the compound comprises at least one increased binding energy hydrogen species. The compound may have the formula wherein m and n are each an integer and the hydrogen content of the compound comprises at least one increased binding energy hydrogen species. The compound may have the formula wherein m and n are each an integer, X is a singly negatively charged anion, and the hydrogen content of the compound comprises at least one increased binding energy hydrogen species. The compound may have the formula wherein n is an integer and the hydrogen content H of the compound comprises at least one increased binding energy hydrogen species. The compound may have the formula wherein n is an integer and the hydrogen content H of the compound comprises at least one increased binding energy hydrogen species. The compound including an anion or cation may have the formula wherein m and n are each an integer, M and M' are each an alkali or alkaline earth cation, X is a singly or double negatively charged anion, and the hydrogen content of the compound comprises at least one increased binding energy hydrogen species. The compound including an anion or cation may have the formula wherein m and n are each an integer, M and M' are each an alkali or alkaline earth cation, X and X' are a singly or double negatively charged anion, and the hydrogen content of the compound comprises at least one increased binding energy hydrogen species. The anion may comprise one of those of the present disclosure. Suitable exemplary singly negatively charged anions are halide ion, hydroxide ion, hydrogen carbonate ion, or nitrate ion. Suitable exemplary double negatively charged anions are carbonate ion, oxide, or sulfate ion.

In an embodiment, the increased binding energy hydrogen compound or mixture comprises at least one lower energy hydrogen species such as a hydrino atom, hydrino hydride ion, and dihydrino molecule embedded in a lattice such as a crystalline lattice such as in a metallic or ionic lattice. In an embodiment, the lattice is non-reactive with the lower energy hydrogen species. The matrix may be aprotic such as in the case of embedded hydrino hydride ions. The compound or mixture may comprise at least one of H(1/p), $H_2(1/p)$, and $H^-(1/p)$ embedded in a salt lattice such as an alkali or alkaline earth salt such as a halide. Exemplary alkali halides are KCl and KI. The salt may be absent any $H_2O$ in the case of embedded $H^-(1/p)$. Other suitable salt lattices comprise those of the present disclosure. The lower energy hydrogen species may be formed by catalysis of hydrogen with an aprotic catalyst such as those of TABLE 1.

The compounds of the present invention are preferably greater than 0.1 atomic percent pure. More preferably, the compounds are greater than 1 atomic percent pure. Even more preferably, the compounds are greater than 10 atomic percent pure. Most preferably, the compounds are greater than 50 atomic percent pure. In another embodiment, the compounds are greater than 90 atomic percent pure. In another embodiment, the compounds are greater than 95 atomic percent pure.

In another embodiment of the chemical reactor to form hydrinos, the cell to form hydrinos and release power such as thermal power comprises the combustion chamber of an internal combustion engine, rocket engine, or gas turbine. The reaction mixture comprises a source of hydrogen and a source of oxygen to generate the catalyst and hydrinos. The source of the catalyst may be at least one of a species comprising hydrogen and one comprising oxygen. The species or a further reaction product may be at least one of species comprising at least one of O and H such as $H_2$, H, $H^+$, $O_2$, $O_3$, $$O_3^+, O_3^-,$$

O, O+, $H_2O$, $H_3O^+$, OH, $OH^+$, $OH^-$, HOOH, $OOH^-$, $O^-$, $O^{2-}$, $$O_2^-, \text{ and } O_2^{2-}.$$

The catalyst may comprise an oxygen or hydrogen species such as $H_2O$. In another embodiment, the catalyst comprises at least one of nH, nO (n=integer), $O_2$, OH, and $H_2O$ catalyst. The source of hydrogen such as a source of hydrogen atoms may comprise a hydrogen-containing fuel such as $H_2$ gas or a hydrocarbon. Hydrogen atoms may be produced by pyrolysis of a hydrocarbon during hydrocarbon combustion. The reaction mixture may further comprise a hydrogen dissociator such as those of the present disclosure. H atoms may also be formed by the dissociation of hydrogen. The source of O may further comprise $O_2$ from air. The reactants may further comprise $H_2O$ that may serve as a source of at least one of H and O. In an embodiment, water serves as a further source of at least one of hydrogen and oxygen that may be supplied by pyrolysis of $H_2O$ in the cell. The water can be dissociated into hydrogen atoms thermally or catalytically on a surface, such as the cylinder or piston head. The surface may comprise material for dissociating water to hydrogen and oxygen. The water dissociating material may comprise an element, compound, alloy, or mixture of transition elements or inner transition elements, iron, platinum, palladium, zirconium, vanadium, nickel, titanium, Sc, Cr, Mn, Co, Cu, Zn, Y, Nb, Mo, Tc, Ru, Rh, Ag, Cd, La, Hf, Ta, W, Re, Os, Ir, Au, Hg, Ce, Pr, Nd, Pm, Sm, Eu, Gd, Tb, Dy, Ho, Er, Tm, Vb, Lu, Th, Pa, U, activated charcoal (carbon), or Cs intercalated carbon (graphite). The H an O may react to form the catalyst and H to form hydrinos. The source of hydrogen and oxygen may be drawn in through corresponding ports or intakes such as intake valves or manifolds. The products may be exhausted through exhaust ports or outlets. The flow may be controlled by controlling the inlet and outlet rates through the respective ports.

In an embodiment, hydrinos are formed by heating a source of catalyst and a source of hydrogen such as a solid fuel of the present disclosure. The heating may be at least one of thermal heating and percussion heating. Experimentally, Raman spectroscopy confirms that hydrinos are formed by ball milling a solid fuel such as a mixture of a hydroxide and a halide such as a mixture comprising alkali metals such as Li. For example, an inverse Raman effect peak is observed from ball milled LiOH+LiI and LiOH+LiF at 2308 cm$^{-1}$. Thus, a suitable exemplary mixture is LiGH+ LiI or LiF. In an embodiment, at least one of thermal and percussion heating is achieved by a rapid reaction. In this case, an additional energetic reaction is provided by forming hydrinos.

In an embodiment, $H_2(1/p)$ may serve as a MRI paramagnetic contrast agent since the 1 quantum number is nonzero.

The nonzero 1 quantum number allowing the rotational selection rule of the magnitude of $\Delta J=0, +1$ is permissive of a $H_2(1/p)$ molecular laser.

In an embodiment, since $H_2(1/p)$ is paramagnetic, it has a higher liquefaction temperature than H2. Bulk hydrino gas may be collected by cryo-separation methods.

In an embodiment, the solid fuel or energetic material comprises a rocket propellant. The high-current initiated ignition gives rise to rapidly expanding plasma that may provide thrust. Another invention of the present disclosure is a thruster comprising a closed cell except for a nozzle to direct the expanding plasma to provide thrust. In another embodiment, a thruster comprises a magnetic bottle or other similar plasma confinement and directing magnetic field system known by those skilled in the art to cause the plasma to flow in a directed manner from the electrodes that provide the igniting high current. In another embodiment, the highly ionized plasma may be used in ion motors and ion thrusters known by those skilled in the art to provide thrust.

In an embodiment, the energetic plasma from the ignited solid fuel is used to process materials such as at least one of plasma etch, stabilize the surface of silicon by doping or coating with a stable hydrogen layer such as one comprising hydrino species, and convert graphitic carbon to at least one of diamond-like-carbon and diamond. The methods and system according to the present disclosure to hydrino-species dope or coat surfaces such as silicon to cause stabilization and to convert carbon to diamond materials are given in my previous publications R. L. Mills, J. Sankar, A. Voigt, J. He, P. Ray, B. Dhandapani, "Role of Atomic Hydrogen Density and Energy in Low Power CVD Synthesis of Diamond Films," Thin Solid Films, 478, (2005) 77-90, R. L. Mills, J. Sankar, A. Voigt, J. He, B. Dhandapani, "Spectroscopic Characterization of the Atomic Hydrogen Energies and Densities and Carbon Species During Helium-Hydrogen-Methane Plasma CVD Synthesis of Diamond Films," Chemistry of Materials, Vol. 15, (2003), pp. 1313-1321, R. L. Mills, B. Dhandapani, J. He, "Highly Stable Amorphous Silicon Hydride from a Helium Plasma Reaction," Materials Chemistry and Physics, 94/2-3, (2005), 298-307, R. L. Mills, B. Dhandapani, J. He, "Highly Stable Amorphous Silicon Hydride," Solar Energy Materials & Solar Cells, Vol. 80, (2003), pp. 1-20, and R. L. Mills, J. He, P. Ray, B. Dhandapani, X. Chen, "Synthesis and Characterization of a Highly Stable Amorphous Silicon Hydride as the Product of a Catalytic Helium-Hydrogen Plasma Reaction," Int. J. Hydrogen Energy, Vol. 28, No. 12, (2003), pp. 1401-1424 which are herein incorporated reference in their entirety.

Figure 3:
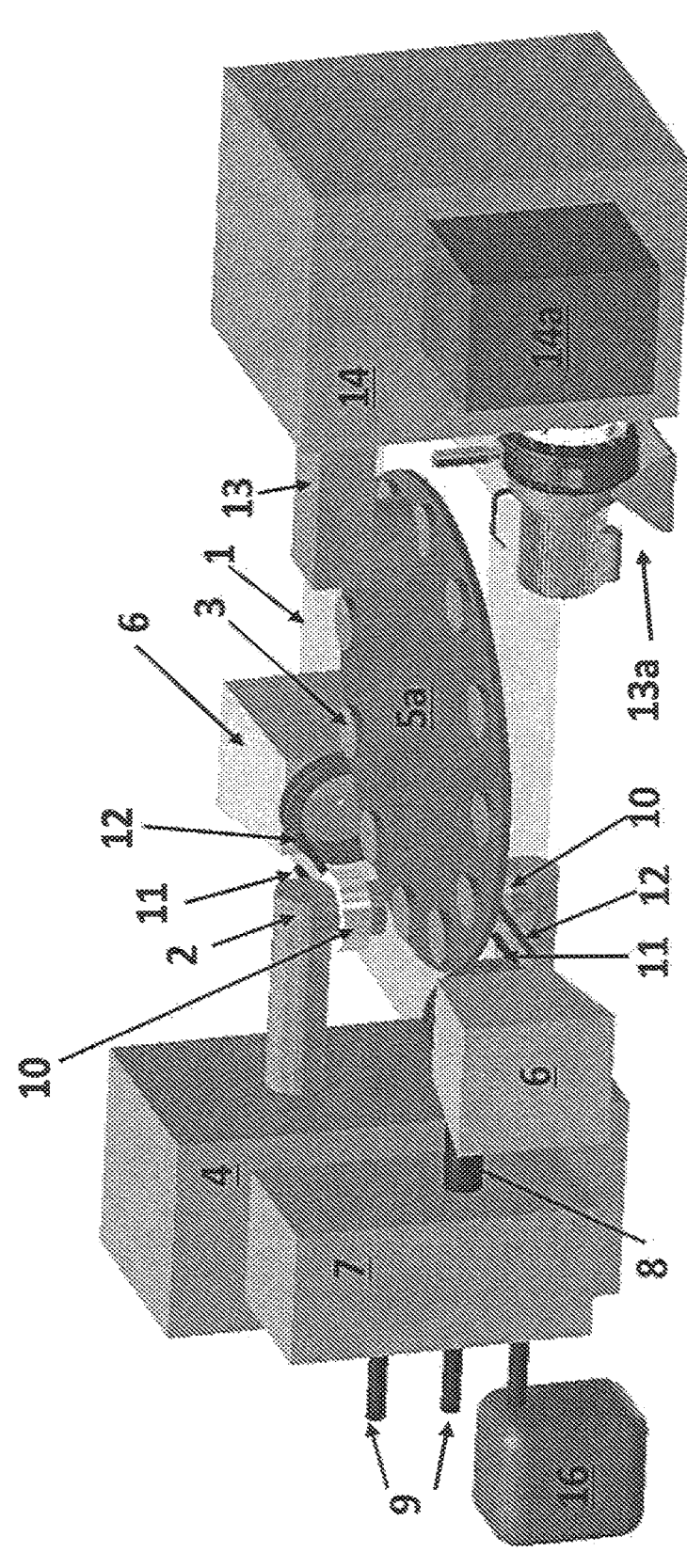
FIG. 3 is a schematic drawing of a SF-CIHT cell power generator showing a carrousel reloading system in accordance with an embodiment of the present disclosure.
Figure 4A:
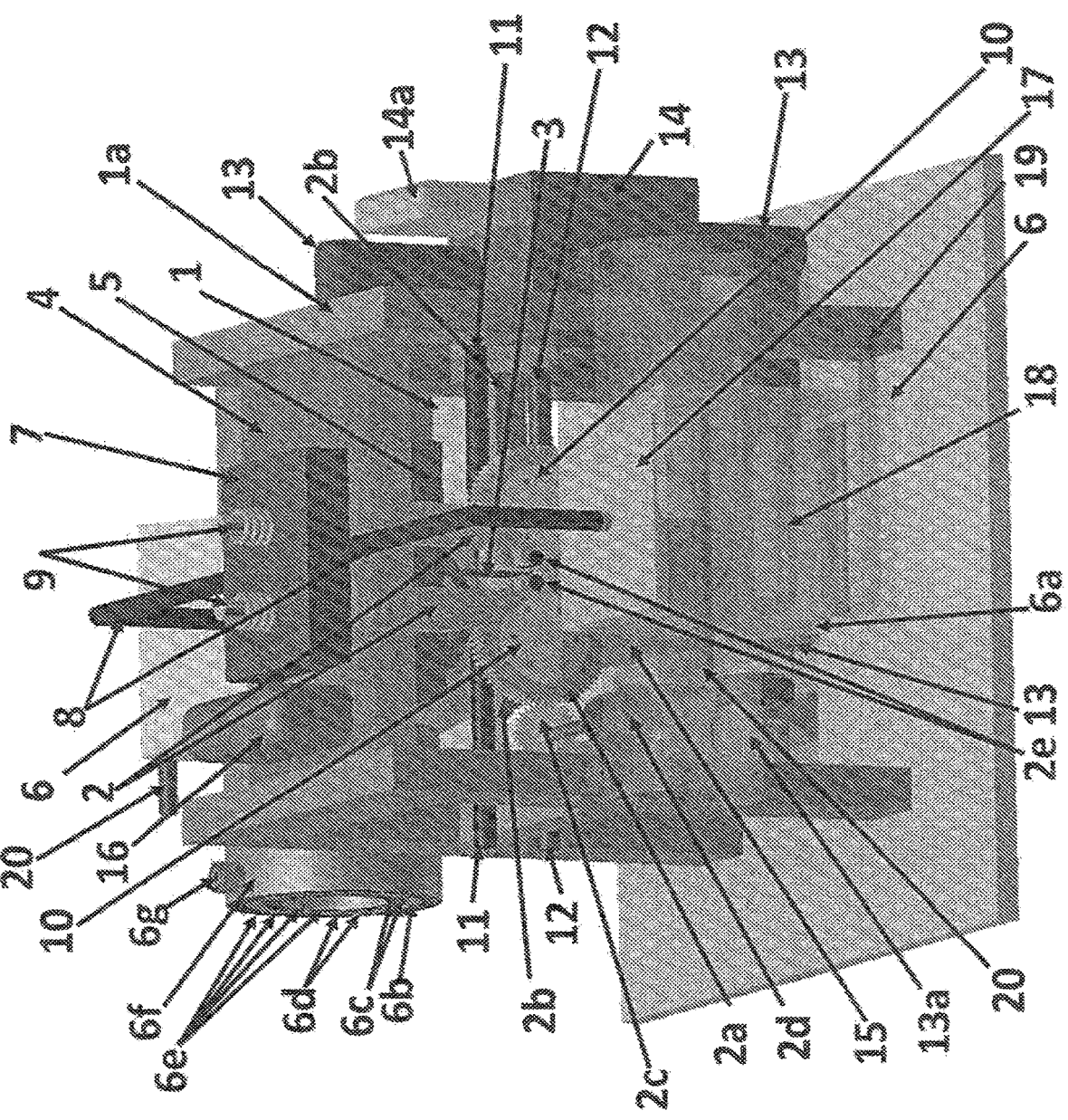
FIG. 4A is a schematic drawing of a SF-CIHT cell power generator showing a hopper reloading system in accordance with an embodiment of the present disclosure.
Figure 4B:
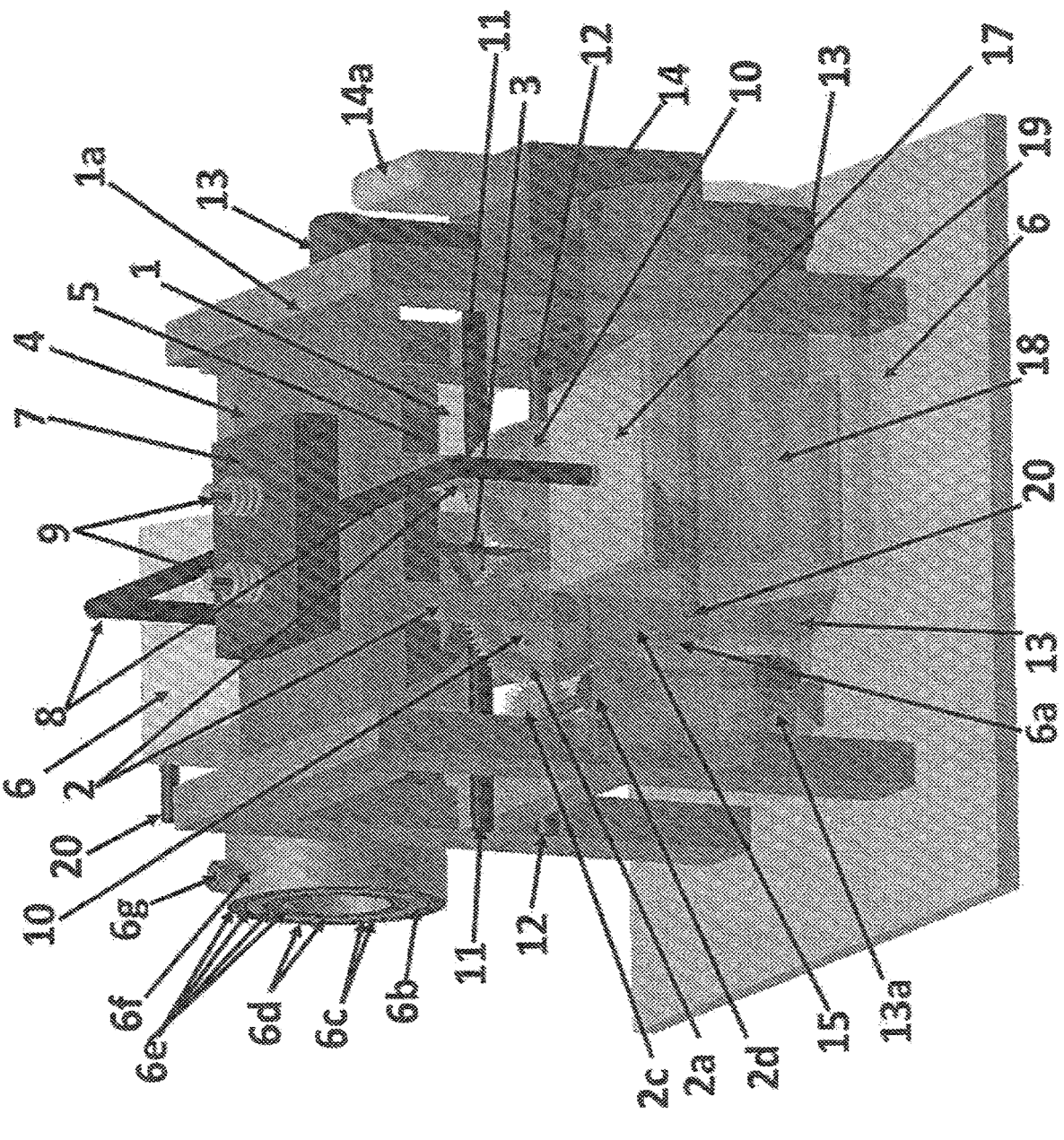
FIG. 4B is a schematic drawing of a SF-CIHT cell power generator showing electrodes that also serve as structure elements and showing a source of electrical power that also serves as the startup power source in accordance with an embodiment of the present disclosure.

In an embodiment, the energetic plasma from the ignited solid fuel is used to form an inverted population. In an embodiment, the solid fuel plasma components of the system shown in FIGS. 3 and 4A and 4B is at least one of a pumping source of a laser and a lasing medium of a laser. Methods and systems to form an inverted population to achieve lasing are given in my previous publications R. L. Mills, P. Ray, R. M. Mayo, "The Potential for a Hydrogen Water-Plasma Laser," Applied Physics Letters, Vol. 82, No. 11, (2003), pp. 1679-1681 and R. L. Mills, P. Ray, R. M. Mayo, "CW HI Laser Based on a Stationary Inverted Lyman Population Formed from Incandescently Heated Hydrogen Gas with Certain Group I Catalysts," IEEE Transactions on Plasma Science, Vol. 31, No. 2, (2003), pp. 236-247 R. L. Mills, P. Ray, R. M. Mayo, "CW HI Laser Based on a Stationary Inverted Lyman Population Formed from Incandescently Heated Hydrogen Gas with Certain Group I Catalysts," IEEE Transactions on Plasma Science, Vol. 31, No. 2, (2003), pp. 236-247 which are herein incorporated reference in its entirety.

In an embodiment, the solid fuel or energetic material is reacted by heating. The reaction mixture may comprise a conductor and be reacted on a highly conductive surface such as one that does not oxidize during the reaction to become less conductive. Suitable surfaces such as those of a reactor are noble metals such as Au and Pt.

VII. Solid Fuel Catalyst Induced Hydrino Transition (SF-CIHT) Cell and Power Converter In an embodiment, a power system that generates at least one of direct electrical energy and thermal energy comprises at least one vessel, reactants comprising: (a) at least one source of catalyst or a catalyst comprising nascent $H_2O$; (b) at least one source of atomic hydrogen or atomic hydrogen; and (c) at least one of a conductor and a conductive matrix, and at least one set of electrodes to confine the hydrino reactants, a source of electrical power to deliver a short burst of high-current electrical energy, a reloading system, at least one system to regenerate the initial reactants from the reaction products, and at least one direct plasma to electricity converter and at least one thermal to electric power converter. In a further embodiment, the vessel is capable of a pressure of at least one of atmospheric, above atmospheric, and below atmospheric. In an embodiment, the regeneration system can comprise at least one of a hydration, thermal, chemical, and electrochemical system. In another embodiment, the at least one direct plasma to electricity converter can comprise at least one of the group of plasmadynamic power converter, direct converter, magnetohydrodynamic power converter, magnetic mirror magnetohydrodynamic power converter, charge drift converter, Post or Venetian Blind power converter, gyrotron, photon bunching microwave power converter, and photoelectric converter. In a further embodiment, the at least one thermal to electricity converter can comprise at least one of the group of a heat engine, a steam engine, a steam turbine and generator, a gas turbine and generator, a Rankine-cycle engine, a Brayton-cycle engine, a Stirling engine, a thermionic power converter, and a thermoelectric power converter.

In an embodiment, $H_2O$ is ignited to form hydrinos with a high release of energy in the form of at least one of thermal, plasma, and electromagnetic (light) power. ("Ignition" in the present disclosure denotes a very high reaction rate of H to hydrinos that may be manifest as a burst, pulse or other form of high power release.) $H_2O$ may comprise the fuel that may be ignited with the application a high current such as one in the range of about 2000 A to 100,000 A. This may be achieved by the application of a high voltage such as 5,000 to 100,000 V to first form highly conducive plasma such as an arc. Alternatively, a high current may be passed through a compound or mixture comprising $H_2O$ wherein the conductivity of the resulting fuel such as a solid fuel is high. (In the present disclosure a solid fuel or energetic material is used to denote a reaction mixture that forms a catalyst such as HOH and H that further reacts to form hydrinos. However, the reaction mixture may comprise other physical states than solid. In embodiments, the reaction mixture may be at least one state of gaseous, liquid, solid, slurry, sol gel, solution, mixture, gaseous suspension, pneumatic flow, and other states known to those skilled in the art.) In an embodiment, the solid fuel having a very low resistance comprises a reaction mixture comprising $H_2O$. The low resistance may be due to a conductor component of the reaction mixture. In embodiments, the resistance of the solid fuel is at least one of in the range of about $10^{-9}$ ohm to 100 ohms, $10^{-8}$ ohm to 10 ohms, $10^{-3}$ ohm to 1 ohm, $10^{-4}$ ohm to $10^{-1}$ ohm, and $10^{-4}$ ohm to $10^{-2}$ ohm. In another embodiment, the fuel having a high resistance comprises $H_2O$ comprising a trace or minor mole percentage of an added compound or material. In the latter case, high current may be flowed through the fuel to achieve ignition by causing breakdown to form a highly conducting state such as an arc or arc plasma.

In an embodiment, the reactants can comprise a source of $H_2O$ and a conductive matrix to form at least one of the source of catalyst, the catalyst, the source of atomic hydrogen, and the atomic hydrogen. In a further embodiment, the reactants comprising a source of $H_2O$ can comprise at least one of bulk $H_2O$, a state other than bulk $H_2O$, a compound or compounds that undergo at least one of react to form $H_2O$ and release bound $H_2O$. Additionally, the bound $H_2O$ can comprise a compound that interacts with $H_2O$ wherein the $H_2O$ is in a state of at least one of absorbed $H_2O$, bound $H_2O$, physisorbed $H_2O$, and waters of hydration. In embodiments, the reactants can comprise a conductor and one or more compounds or materials that undergo at least one of release of bulk $H_2O$, absorbed $H_2O$, bound $H_2O$, physisorbed $H_2O$, and waters of hydration, and have $H_2O$ as a reaction product. In other embodiments, the at least one of the source of nascent $H_2O$ catalyst and the source of atomic hydrogen can comprise at least one of: (a) at least one source of $H_2O$; (b) at least one source of oxygen, and (c) at least one source of hydrogen.

In additional embodiments, the reactants to form at least one of the source of catalyst, the catalyst, the source of atomic hydrogen, and the atomic hydrogen comprise at least one of $H_2O$ and the source of $H_2O$; $O_2$, $H_2O$, HOOH, $OOH^-$, peroxide ion, superoxide ion, hydride, $H_2$, a halide, an oxide, an oxyhydroxide, a hydroxide, a compound that comprises oxygen, a hydrated compound, a hydrated compound selected from the group of at least one of a halide, an oxide, an oxyhydroxide, a hydroxide, a compound that comprises oxygen; and a conductive matrix. In certain embodiments, the oxyhydroxide can comprise at least one from the group of TiOOH, GdOOH, COOH, InOOH, FeOOH, GaOOH, NiOOH, AlOOH, CrOOH, MoOOH, CuOOH, MnOOH, ZnOOH, and SmOOH; the oxide can comprise at least one from the group of CuO, $Cu_2O$, CoO, $Co_2O_3$, $Co_3O_4$, FeO, $Fe_2O_3$, NiO, and $Ni_2O_3$; the hydroxide can comprise at least one from the group of $Cu(OH)_2$, $Co(OH)_2$, $Co(OH)_3$, $Fe(OH)_2$, $Fe(OH)_3$, and $Ni(OH)_2$; the compound that comprises oxygen can comprise at least one from the group of a sulfate, phosphate, nitrate, carbonate, hydrogen carbonate, chromate, pyrophosphate, persulfate, perchlorate, perbromate, and periodate, $MXO_3$, $MXO_4$ (M=metal such as alkali metal such as Li, Na, K, Rb, Cs; X=F, Br, Cl, I), cobalt magnesium oxide, nickel magnesium oxide, copper magnesium oxide, $Li_2O$, alkali metal oxide, alkaline earth metal oxide, CuO, $CrO_4$, ZnO, MgO, CaO, $MoO_2$, $TiO_2$, $ZrO_2$, $SiO_2$, $Al_2O_3$, NiO, FeO, $Fe_2O_3$, $TaO_2$, $Ta_2O_5$, VO, $VO_2$, $V_2O_3$, $V_2O_5$, $P_2O_3$, $P_2O_5$, $B_2O_3$, NbO, $NbO_2$, $Nb_2O_5$, $SeO_2$, $SeO_3$, $TeO_2$, $TeO_3$, $WO_2$, $WO_3$, $Cr_3O_4$, $Cr_2O_3$, $CrO_2$, $CrO_3$, CoO, $Co_2O_3$, $Co_3O_4$, FeO, $Fe_2O_3$, NiO, $Ni_2O_3$, rare earth oxide, $CeO_2$, $La_2O_3$, an oxyhydroxide, TiOOH, GdOOH, COOH, InOOH, FeOOH, GaOOH, NiOOH, AlOOH, CrOOH, MoOOH, CuOOH, MnOOH, ZnOOH, and SmOOH, and the conductive matrix can comprise at least one from the group of a metal powder, carbon, carbide, boride, nitride, carbonitrile such as TiCN, or nitrile.

In embodiments, the reactants can comprise a mixture of a metal, its metal oxide, and $H_2O$ wherein the reaction of the metal with $H_2O$ is not thermodynamically favorable. In other embodiments, the reactants can comprise a mixture of a metal, a metal halide, and $H_2O$ wherein the reaction of the metal with $H_2O$ is not thermodynamically favorable. In additional embodiments, reactants can comprise a mixture of a transition metal, an alkaline earth metal halide, and $H_2O$ wherein the reaction of the metal with $H_2O$ is not thermodynamically favorable. And in further embodiments, the reactants can comprise a mixture of a conductor, a hydroscopic material, and $H_2O$. In embodiments, the conductor can comprise a metal powder or carbon powder wherein the reaction of the metal or carbon with $H_2O$ is not thermodynamically favorable. In embodiments, the hydroscopic material can comprise at least one of the group of lithium bromide, calcium chloride, magnesium chloride, zinc chloride, potassium carbonate, potassium phosphate, carnallite such as $KMgCl_3 \cdot 6(H_2O)$, ferric ammonium citrate, potassium hydroxide and sodium hydroxide and concentrated sulfuric and phosphoric acids, cellulose fibers, sugar, caramel, honey, glycerol, ethanol, methanol, diesel fuel, methamphetamine, a fertilizer chemical, a salt, a desiccant, silica, activated charcoal, calcium sulfate, calcium chloride, a molecular sieves, a zeolite, a deliquescent material, zinc chloride, calcium chloride, potassium hydroxide, sodium hydroxide and a deliquescent salt. In certain embodiments, the power system can comprise a mixture of a conductor, hydroscopic materials, and $H_2O$ wherein the ranges of relative molar amounts of (metal/conductor), (hydroscopic material), ($H_2O$) are at least one of about (0.000001 to 100000), (0.000001 to 100000), (0.000001 to 100000); (0.00001 to 10000), (0.00001 to 10000), (0.00001 to 10000); (0.0001 to 1000), (0.0001 to 1000), (0.0001 to 1000); (0.001 to 100), (0.001 to 100), (0.001 to 100); (0.01 to 100), (0.01 to 100), (0.01 to 100); (0.1 to 10), (0.1 to 10), (0.1 to 10); and (0.5 to 1), (0.5 to 1), (0.5 to 1). In certain embodiments, the metal having a thermodynamically unfavorable reaction with $H_2O$ can be at least one of the group of Cu, Ni, Pb, Sb, Bi, Co, Cd, Ge, Au, Ir, Fe, Hg, Mo, Os, Pd, Re, Rh, Ru, Se, Ag, Tc, Te, Tl, Sn, W, Al, V, Zr, Ti, Mn, Zn, Cr, and In. In additional embodiments, the reactants can be regenerated by addition of $H_2O$.

In further embodiments, the reactants can comprise a mixture of a metal, its metal oxide, and $H_2O$ wherein the metal oxide is capable of $H_2$ reduction at a temperature less than 1000° C. In other embodiments, the reactants can comprise a mixture of an oxide that is not easily reduced with $H_2$ and mild heat, a metal having an oxide capable of being reduced to the metal with $H_2$ at a temperature less than 1000° C., and $H_2O$. In embodiments, the metal having an oxide capable of being reduced to the metal with $H_2$ at a temperature less than 1000° C. can be at least one of the group of Cu, Ni, Pb, Sb, Bi, Co, Cd, Ge, Au, Ir, Fe, Hg, Mo, Os, Pd, Re, Rh, Ru, Se, Ag, Tc, Te, Tl, Sn, W, Al, V, Zr, Ti, Mn, Zn, Cr, and In. In embodiments, the metal oxide that is not easily reduced with $H_2$, and mild heat comprises at least one of alumina, an alkaline earth oxide, and a rare earth oxide.

In embodiments, the solid fuel can comprise carbon or activated carbon and $H_2O$ wherein the mixture is regenerated by rehydration comprising addition of $H_2O$. In further embodiments, the reactants can comprise at least one of a slurry, solution, emulsion, composite, and a compound. In embodiments, the current of the source of electrical power to deliver a short burst of high-current electrical energy is sufficient enough to cause the hydrino reactants to undergo the reaction to form hydrinos at a very high rate. In embodiments, the source of electrical power to deliver a short burst of high-current electrical energy comprises at least one of the following: a voltage selected to cause a high AC, DC, or an AC-DC mixture of current that is in the range of at least one of 100 A to 1,000,000 A, 1 kA to 100,000 A, 10 kA to 50 kA; a DC or peak AC current density in the range of at least one of 100 $A/cm^2$ to 1,000,000 $A/cm^2$, 1000 $A/cm^2$ to 100,000 $A/cm^2$, and 2000 $A/cm^2$ to 50,000 $A/cm^2$; the voltage is determined by the conductivity of the solid fuel or energetic material wherein the voltage is given by the desired current times the resistance of the solid fuel or energetic material sample; the DC or peak AC voltage may be in at least one range chosen from about 0.1 V to 500 kV, 0.1 V to 100 kV, and 1 V to 50 kV, and the AC frequency may be in the range of about 0.1 Hz to 10 GHz, 1 Hz to 1 MHz, 10 Hz to 100 kHz, and 100 Hz to 10 kHz. In embodiments, the resistance of the solid fuel or energetic material sample is in at least one range chosen from about 0.001 milliohm to 100 Mohm, 0.1 ohm to 1 Mohm, and 10 ohm to 1 kohm, and the conductivity of a suitable load per electrode area active to form hydrinos is in at least one range chosen from about $10^{-10}$ $ohm^{-1}$ $cm^{-2}$ to $10^6$ $ohm^{-1}$ $cm^{-2}$, $10^{-5}$ $ohm^{-1}$ $cm^{-2}$ to $10^6$ $ohm^{-1}$ $cm^{-2}$, $10^{-4}$ $ohm^{-1}$ $cm^{-2}$ to $10^5$ $ohm^{-1}$ $cm^{-2}$, $10^{-2}$ $ohm^{-1}$ $cm^{-2}$ to $10^4$ $ohm^{-1}$ $cm^{-2}$, $10^{-2}$ $ohm^{-1}$ $cm^{-2}$ to $10^3$ $ohm^{-1}$ $cm^{-2}$, $10^{-1}$ $ohm^{-1}$ $cm^{-2}$ to $10^2$ $ohm^{-1}$ $cm^{-2}$, and 1 $ohm^{-1}$ $cm^{-2}$ to 10 $ohm^{-1}$ $cm^{-2}$.

In an embodiment, the solid fuel is conductive. In embodiments, the resistance of a portion, pellet, or aliquot of solid fuel is at least one of in the range of about $10^{-9}$ ohm to 100 ohms, $10^{-8}$ ohm to 10 ohms, $10^{-3}$ ohm to 1 ohm, $10^{-3}$ ohm to $10^{-1}$ ohm, and $10^{-3}$ ohm to $10^{-2}$ ohm. In an embodiment, the hydrino reaction rate is dependent on the application or development of a high current. The hydrino catalysis reaction such as an energetic hydrino catalysis reaction may be initiated by a low-voltage, high-current flow through the conductive fuel. The energy release may be very high, and shock wave may form. In an embodiment, the voltage is selected to cause a high AC, DC, or an AC-DC mixture of current that causes ignition such as a high current in the range of at least one of 100 A to 1,000,000 A, 1 kA to 100,000 A, 10 kA to 50 kA. The current density may be in the range of at least one of 100 $A/cm^2$ to 1,000,000 $A/cm^2$, 1000 $A/cm^2$ to 100,000 $A/cm^2$, and 2000 $A/cm^2$ to 50,000 $A/cm^2$ of fuel that may comprise a pellet such as a pressed pellet. The DC or peak AC voltage may be in at least one range chosen from about 0.1 V to 100 kV V, 0.1 V to 1 kV, 0.1 V to 100 V, and 0.1 V to 15 V. The AC frequency may be in the range of about 0.1 Hz to 10 GHz, 1 Hz to 1 MHz, 10 Hz to 100 kHz, and 100 Hz to 10 kHz. The pulse time may be in at least one range chosen from about $10^{-6}$ s to 10 s, $10^{-5}$ s to 1 s, $10^{-4}$ s to 0.1 s, and $10^{-3}$ s to 0.01 s. In another embodiment, at least one of a high magnetic field or flux, $\phi$, or a high velocity of the magnetic field change ignites the hydrino reaction. The magnetic flux may be in the range of about 10 G to 10 T, 100 G to 5 T, or 1 kG to 1 T.

$$\frac{d\phi}{dt}$$

may be that corresponding to a flux of 10 G to 10 T, 100 G to 5 T, or 1 kG to 1 T alternating at a frequency in the range of 1 Hz to 100 kHz, 10 Hz to 10 kHz, 10 Hz to 1000 Hz, or 10 Hz to 100 Hz.

In an embodiment, the solid fuel or energetic material may comprise a source of $H_2O$ or $H_2O$. The $H_2O$ mole % content may be in the range of at least one of about 0.000001% to 100%, 0.00001% to 100%, 0.0001% to 100%, 0.001% to 100%, 0.01% to 100%, 0.1% to 100%, 1% to 100%, 10% to 100%, 0.1% to 50%, 1% to 25%, and 1% to 10%. In an embodiment, the hydrino reaction rate is dependent on the application or development of a high current. In an embodiment, the voltage is selected to cause a high AC, DC, or an AC-DC mixture of current that is in the range of at least one of 100 A to 1,000,000 A, 1 kA to 100,000 A, 10 kA to 50 kA. The DC or peak AC current density may be in the range of at least one of 100 $A/cm^2$ to 1,000,000 $A/cm^2$, 1000 $A/cm^2$ to 100,000 $A/cm^2$, and 2000 $A/cm^2$ to 50,000 $A/cm^2$. In an embodiment, the voltage is determined by the conductivity of the solid fuel or energetic material. The resistance of the solid fuel or energetic material sample is in at least one range chosen from about 0.001 milliohm to 100 Mohm, 0.1 ohm to 1 Mohm, and 10 ohm to 1 kohm. The conductivity of a suitable load per electrode area active to form hydrinos is in at least one range chosen from about $10^{-10}$ $ohm^{-1}$ $cm^{-2}$ to $10^6$ $ohm^{-1}$ $cm^{-2}$, $10^{-5}$ $ohm^{-1}$ $cm^{-2}$ to $10^6$ $ohm^{-1}$ $cm^{-2}$, $10^{-4}$ $ohm^{-1}$ $cm^{-2}$ to 105 $ohm^{-1}$ $cm^{-2}$, $10^{-2}$ $ohm^{-1}$ $cm^{-2}$ to $10^4$ $ohm^{-1}$ $cm^{-2}$, $10^{-2}$ $ohm^{-1}$ $cm^{-2}$ to 103 $ohm^{-1}$ $cm^{-2}$, $10^{-1}$ $ohm^{-1}$ $cm^{-2}$ to $10^2$ $ohm^{-1}$ $cm^{-2}$, and 1 $ohm^{-1}$ $cm^{-2}$ to 10 $ohm^{-1}$ $cm^{-2}$. In an embodiment, the voltage is given by the desired current times the resistance of the solid fuel or energetic material sample. In the exemplary case that the resistance is of the order of 1 mohm, the voltage is low such as <10 V. In an exemplary case of essentially pure $H_2O$ wherein the resistance is essentially infinite, the applied voltage to achieve a high current for ignition is high, such as above the breakdown voltage of the $H_2O$ such as about 5 kV or higher. In embodiments, the DC or peak AC voltage may be in at least one range chosen from about 0.1 V to 500 kV, 0.1 V to 100 kV, and 1 V to 50 kV. The AC frequency may be in the range of about 0.1 Hz to 10 GHz, 1 Hz to 1 MHz, 10 Hz to 100 kHz, and 100 Hz to 10 kHz. In an embodiment, a DC voltage is discharged to create plasma comprising ionized $H_2O$ wherein the current is underdamped and oscillates as it decays.

In an embodiment, the high-current pulse is achieved with the discharge of capacitors such as supercapacitors that may be connected in at least one of series and parallel to achieve the desired voltage and current wherein the current may be DC or conditioned with circuit elements such a transformer such as a low voltage transformer known to those skilled in the art. The capacitor may be charged by an electrical source such as grid power, a generator, a fuel cell, or a battery. In an embodiment, a battery supplies the current. In an embodiment, a suitable frequency, voltage, and current waveform may be achieved by power conditioning the output of the capacitors or battery. In an embodiment, an exemplary circuit to achieve a current pulse of 500 A at 900 V is given in V. V. Nesterov, A. R. Donaldson, "High Current High Accuracy IGBT Pulse Generator", 1996 IEEE, pp. 1251-1253, https://accelconfweb.cern.ch/AccelConf/p95/AR-TICLES/WAA/WAA11.PDF, and one to achieve 25 kA is given in P. Pribyl, W. Gekelman, "24 kA solid state switch for plasma discharge experiments," Review of Scientific Instruments, Vol. 75, No. 3, March, 2004, pp. 669-673 wherein both are incorporated by reference in their entirely wherein a voltage divider may increase the current and decrease the voltage.

The solid fuel or energetic material may comprise a conductor or conductive matrix or support such as a metal, carbon, or carbide, and $H_2O$ or a source of $H_2O$ such as a compound or compounds that can react to form $H_2O$ or that can release bound $H_2O$ such as those of the present disclosure. The solid fuel may comprise $H_2O$, a compound or material that interacts with the $H_2O$, and a conductor. The $H_2O$ may be present in a state other than bulk $H_2O$ such as absorbed or bound $H_2O$ such as physisorbed $H_2O$ or waters of hydration. Alternatively, the $H_2O$ may be present as bulk $H_2O$ in a mixture that is highly conductive or made highly conductive by the application of a suitable voltage. The solid fuel may comprise $H_2O$ and a material or compound such as a metal powder or carbon that provides high conductivity and a material or compound such as an oxide such as a metal oxide to facilitate forming H and possibility HOH catalyst. A exemplary solid fuel may comprise R—Ni alone and with additives such as those of transition metals and Al wherein R—Ni releases H and HOH by the decomposition of hydrated $Al_2O_3$ and $Al(OH)_3$. A suitable exemplary solid fuel comprises at least one oxyhydroxide such as TiOOH, GdOOH, COOH, InOOH, FeOOH, GaOOH, NiOOH, AlOOH, CrOOH, MoOOH, CuOOH, MnOOH, ZnOOH, and SmOOH and a conducive matrix such as at least one of a metal powder and carbon powder, and optionally $H_2O$. The solid fuel may comprise at least one hydroxide such as a transition metal hydroxide such as at least one of $Cu(OH)_2$, $Co(OH)_2$, $Fe(OH)_2$ and $Ni(OH)_2$, an aluminum hydroxide such as $Al(OH)_3$, a conductor such as at least one of carbon powder and a metal powder, and optionally $H_2O$. The solid fuel may comprise at least one oxide such as at least one of a transition metal oxide such as at least one of CuO, $Cu_2O$, NiO, $Ni_2O_3$, FeO and $Fe_2O_3$, a conductor such as at least one of carbon powder and a metal powder, and $H_2O$. The solid fuel may comprise at least one halide such as a metal halide such as an alkaline earth metal halide such as $MgCl_2$, a conductor such as at least one of carbon powder and a metal powder such as Co or Fe, and $H_2O$. The solid fuel may comprise a mixture of solid fuels such as one comprising at least two of a hydroxide, an oxyhydroxide, an oxide, and a halide such as a metal halide, and at least one conductor or conductive matrix, and $H_2O$. The conductor may comprise at least one of a metal screen coated with one or more of the other components of the reaction mixture that comprises the solid fuel, R—Ni, a metal powder such as a transition metal powder, Ni or Co celmet, carbon, or a carbide or other conductor, or conducing support or conducting matrix known to those skilled in the art.

In an embodiment, the solid fuel comprises carbon such as activated carbon and $H_2O$. In the case that the ignition to form plasma occurs under vacuum or an inert atmosphere, following plasma-to-electricity generation, the carbon condensed from the plasma may be rehydrated to reform the solid in a regenerative cycle. The solid fuel may comprise at least one of a mixture of acidic, basic, or neutral $H_2O$ and activated carbon, charcoal, soft charcoal, at least one of steam and hydrogen treated carbon, and a metal powder. In an embodiment, the metal of the carbon-metal mixture is at least partially unreactive with $H_2O$. Suitable metals that are at least partially stable toward reaction with $H_2O$ are at least one of the group of Cu, Ni, Pb, Sb, Bi, Co, Cd, Ge, Au, Ir, Fe, Hg, Mo, Os, Pd, Re, Rh, Ru, Se, Ag, Tc, Te, Tl, Sn, W, Al, V, Zr, Ti, Mn, Zn, Cr, and In. The mixture may be regenerated by rehydration comprising addition of $H_2O$.

In an embodiment, the basic required reactants are a source of H, a source of O, and a good conductor matrix to allow a high current to permeate the material during ignition. The solid fuel or energetic material may be contained in a sealed vessel such as a sealed metal vessel such as a sealed aluminum vessel. The solid fuel or energetic material may be reacted by a low-voltage, high-current pulse such as one created by a spot welder such as that achieved by confinement between the two copper electrodes of a Taylor-Winfield model ND-24-75 spot welder and subjected to a short burst of low-voltage, high-current electrical energy. The 60 Hz voltage may be about 5 to 20 V RMS and the current may be about 10,000 to 40,000 A/cm$^2$.

Exemplary energetic materials and conditions are at least one of TiOOH, GdOOH, COOH, InOOH, FeOOH, GaOOH, NiOOH, AlOOH, CrOOH, MoOOH, CuOOH, MnOOH, ZnOOH, SmOOH, $Ni_2O_3 \cdot H_2O$, $La_2O_3 \cdot H_2O$, and $Na_2SO_4 \cdot H_2O$ coated onto a Ni mesh screen as a slurry and dried and then subjected to an electrical pulse of about 60 Hz, 8 V RMS, and to 40,000 A/cm$^2$.

The solid fuel or energetic material may comprise a cation capable of having multiple stable oxidation states as a compound comprising oxygen such as one comprising at least one of Mo, Ni, Co, and Fe wherein the cation is capable of having multiple stable oxidation states such as 2$^+$ and 3$^+$ oxidation states in the case of Ni, Co, and Fe and 2$^+$, 3$^+$, 4$^+$, 5$^+$, and 6$^+$ oxidation states in the case of Mo. These states may be present as hydroxide, oxyhydroxide, oxide, and halide compounds. The change in oxidation state may facilitate the propagation of the hydrino reaction by eliminating the self-limiting charge buildup by the ionization of the HOH catalyst during reaction by the cation undergoing reduction.

In an embodiment, the solid fuel or energetic material comprises $H_2O$ and a dispersant and dissociator to form nascent $H_2O$ and H. Suitable exemplary dispersants and dissociators are a halide compound such as a metal halide such as a transition metal halide such as a bromide such as $FeBr_2$, a compound that forms a hydrate such as $CuBr_2$, and compounds such as oxides and halides having a metal capable of multiple oxidation states. Others comprise oxides, oxyhydroxides, or hydroxides such as those of transition elements such as CoO, $Co_2O_3$, $Co_3O_4$, CoOOH, $Co(OH)_2$, $Co(OH)_3$, NiO, $Ni_2O_3$, NiOOH, $Ni(OH)_2$, FeO, $Fe_2O_3$, FeOOH, $Fe(OH)_3$, CuO, $Cu_2O$, CuOOH, and $Cu(OH)_2$. In other embodiments, the transition metal is replaced by another such as alkali, alkaline earth, inner transition, and rare earth metal, and Group 13 and 14 metals. Suitable examples are $La_2O_3$, $CeO_2$, and $LaX_3$ (X=halide). In another embodiment, the solid fuel or energetic material comprises $H_2O$ as a hydrate of an inorganic compound such as an oxide, oxyhydroxides, hydroxide, or halide. Other suitable hydrates are metal compounds of the present disclosure such as at least one of the group of sulfate, phosphate, nitrate, carbonate, hydrogen carbonate, chromate, pyrophosphate, persulfate, hypochlorite, chlorite, chlorate, perchlorate, hypobromite, bromite, bromate, perchlorate, hypoiodite, iodite, iodate, periodate, hydrogen sulfate, hydrogen or dihydrogen phosphate, other metal compounds with an oxyanion, and metal halides. The moles ratios of dispersant and dissociator such as a metal oxide or halide compound is any desired that gives rise to an ignition event. Suitable the moles of at the at least one compound to the moles $H_2O$ are in at least one range of about 0.000001 to 100000, 0.00001 to 10000, 0.0001 to 1000, 0.01 to 100, 0.1 to 10, and 0.5 to 1 wherein the ratio is defined as (moles compound/moles $H_2O$). The solid fuel or energetic material may further comprise a conductor or conducing matrix such as at least one of a metal powder such as a transition metal powder, Ni or Co celmet, carbon powder, or a carbide or other conductor, or conducing support or conducting matrix known to those skilled in the art. Suitable ratios of moles of the hydrated compound comprising at the least one compound and $H_2O$ to the moles of the conductor are in at least one range of about 0.000001 to 100000, 0.00001 to 10000, 0.0001 to 1000, 0.01 to 100, 0.1 to 10, and 0.5 to 1 wherein the ratio is defined as (moles hydrated compound/moles conductor).

In an embodiment, the reactant is regenerated from the product by the addition of $H_2O$. In an embodiment, the solid fuel or energetic material comprises $H_2O$ and a conductive matrix suitable for the low-voltage, high-current of the present disclosure to flow through the hydrated material to result in ignition. The conductive matrix material may be at least one of a metal surface, metal powder, carbon, carbon powder, carbide, boride, nitride, carbonitrile such as TiCN, nitrile, another of the present disclosure, or known to those skilled in the art. The addition of $H_2O$ to form the solid fuel or energetic material or regenerate it from the products may be continuous or intermittent.

The solid fuel or energetic material may comprise a mixture of conductive matrix, an oxide such as a mixture of a metal and the corresponding metal oxide such as a transition metal and at least one of its oxides such as ones selected from Fe, Cu, Ni, or Co, and $H_2O$. The $H_2O$ may be in the form of hydrated oxide. In other embodiments, the metal/metal oxide reactant comprises a metal that has a low reactivity with $H_2O$ corresponding to the oxide being readily capable of being reduced to the metal, or the metal not oxidizing during the hydrino reaction. A suitable exemplary metal having low $H_2O$ reactivity is one chosen from Cu, Ni, Pb, Sb, Bi, Co, Cd, Ge, Au, Ir, Fe, Hg, Mo, Os, Pd, Re, Rh, Ru, Se, Ag, Tc, Te, Tl, Sn, W, Al, V, Zr, Ti, Mn, Zn, Cr. The metal may be converted to the oxide during the reaction. The oxide product corresponding to the metal reactant may be regenerated to the initial metal by hydrogen reduction by systems and methods known by those skilled in the art. The hydrogen reduction may be at elevated temperature. The hydrogen may be supplied by the electrolysis of $H_2O$. In another embodiment, the metal is regenerated form the oxide by carbo-reduction, reduction with a reductant such as a more oxygen active metal, or by electrolysis such as electrolysis in a molten salt. The formation of the metal from the oxide may be achieved by systems and methods known by those skilled in the art. The molar amount of metal to metal oxide to $H_2O$ are any desirable that results in ignition when subjected to a low-voltage, high current pulse of electricity as given in the present disclosure. Suitable ranges of relative molar amounts of (metal), (metal oxide), ($H_2O$) are at least one of about (0.000001 to 100000), (0.000001 to 100000), (0.000001 to 100000); (0.00001 to 10000), (0.00001 to 10000), (0.00001 to 10000); (0.0001 to 1000), (0.0001 to 1000), (0.0001 to 1000); (0.001 to 100), (0.001 to 100), (0.001 to 100); (0.01 to 100), (0.01 to 100), (0.01 to 100); (0.1 to 10), (0.1 to 10), (0.1 to 10); and (0.5 to 1), (0.5 to 1), (0.5 to 1). The solid fuel or energetic material may comprise at least one of a slurry, solution, emulsion, composite, and a compound.

The solid fuel or energetic material may comprise a mixture of conductive matrix, a halide such as a mixture of a first metal and the corresponding first metal halide or a second metal halide, and $H_2O$. The $H_2O$ may be in the form of hydrated halide. The second metal halide may be more stable than the first metal halide. In an embodiment, the first metal has a low reactivity with $H_2O$ corresponding to the oxide being readily capable of being reduced to the metal, or the metal not oxidizing during the hydrino reaction. A suitable exemplary metal having low $H_2O$ reactivity is one chosen from Cu, Ni, Pb, Sb, Bi, Co, Cd, Ge, Au, Ir, Fe, Hg, Mo, Os, Pd, Re, Rh, Ru, Se, Ag, Tc, Te, Tl, Sn, W, Al, V, Zr, Ti, Mn, Zn, Cr. The molar amount of metal to metal halide to $H_2O$ are any desirable that results in ignition when subjected to a low-voltage, high current pulse of electricity as given in the present disclosure. Suitable ranges of relative molar amounts of (metal), (metal halide), ($H_2O$) are at least one of about (0.000001 to 100000), (0.000001 to 100000), (0.000001 to 100000); (0.00001 to 10000), (0.00001 to 10000), (0.00001 to 10000); (0.0001 to 1000), (0.0001 to 1000), (0.0001 to 1000); (0.001 to 100), (0.001 to 100), (0.001 to 100); (0.01 to 100), (0.01 to 100), (0.01 to 100); (0.1 to 10), (0.1 to 10), (0.1 to 10); and (0.5 to 1), (0.5 to 1), (0.5 to 1). The solid fuel or energetic material may comprise at least one of a slurry, solution, emulsion, composite, and a compound.

In an embodiment, the solid fuel or energetic material may comprise a conductor such as one of the present disclosure such as a metal or carbon, a hydroscopic material, and $H_2O$. Suitable exemplary hydroscopic materials are lithium bromide, calcium chloride, magnesium chloride, zinc chloride, potassium carbonate, potassium phosphate, carnallite such as $KMgCl_3 \cdot 6(H_2O)$, ferric ammonium citrate, potassium hydroxide and sodium hydroxide and concentrated sulfuric and phosphoric acids, cellulose fibers (such as cotton and paper), sugar, caramel, honey, glycerol, ethanol, methanol, diesel fuel, methamphetamine, many fertilizer chemicals, salts (including table salt) and a wide variety of other substances know to those skilled in the art as well as a desiccant such as silica, activated charcoal, calcium sulfate, calcium chloride, and molecular sieves (typically, zeolites) or a deliquescent material such as zinc chloride, calcium chloride, potassium hydroxide, sodium hydroxide and many different deliquescent salts known to those skilled in the art. Suitable ranges of relative molar amounts of (metal), (hydroscopic material), ($H_2O$) are at least one of about (0.000001 to 100000), (0.000001 to 100000), (0.000001 to 100000); (0.00001 to 10000), (0.00001 to 10000), (0.00001 to 10000); (0.0001 to 1000), (0.0001 to 1000), (0.0001 to 1000); (0.001 to 100), (0.001 to 100), (0.001 to 100); (0.01 to 100), (0.01 to 100), (0.01 to 100); (0.1 to 10), (0.1 to 10), (0.1 to 10); and (0.5 to 1), (0.5 to 1), (0.5 to 1). The solid fuel or energetic material may comprise at least one of a slurry, solution, emulsion, composite, and a compound.

In an exemplary energetic material, 0.05 ml (50 mg) of $H_2O$ was added to 20 mg or either $Co_3O_4$ or CuO that was sealed in an aluminum DSC pan (Aluminum crucible 30 µl, D:6.7×3 (Setaram, S08/HBB37408) and Aluminum cover D: 6,7, stamped, non-tight (Setaram, S08/HBB37409)) and ignited with a current of between 15,000 to 25,000 A at about 8 V RMS using a Taylor-Winfield model ND-24-75 spot welder. A large energy burst was observed that vaporized the samples, each as an energetic, highly-ionized, expanding plasma. Another exemplary solid fuel ignited in the same manner with a similar result comprises Cu (42.6 mg)+CuO (14.2 mg)+$H_2O$ (16.3 mg) that was sealed in an aluminum DSC pan (71.1 mg) (Aluminum crucible 30 µl, D:6.7×3 (Setaram, S08/HBB37408) and Aluminum cover D: 6,7, stamped, tight (Setaram, S08/HBB37409)).

In an embodiment, the solid fuel or energetic material comprises a source of nascent $H_2O$ catalyst and a source of H. In an embodiment, the solid fuel or energetic material is conductive or comprises a conductive matrix material to cause the mixture of the source of nascent $H_2O$ catalyst and a source of H to be conductive. The source of at least one of a source of nascent $H_2O$ catalyst and a source of H is a compound or mixture of compounds and a material that comprises at least O and H. The compound or material that comprises O may be at least one of an oxide, a hydroxide, and an oxyhydroxide such as alkali, alkaline earth, transition metal, inner transition metal, rare earth metal, and group 13 and 14 metal oxide, hydroxide and oxyhydroxide. The compound or material that comprises O may be a sulfate, phosphate, nitrate, carbonate, hydrogen carbonate, chromate, pyrophosphate, persulfate, perchlorate, perbromate, and periodate, $MXO_3$, $MXO_4$ (M=metal such as alkali metal such as Li, Na, K, Rb, Cs; X=F, Br, Cl, I), cobalt magnesium oxide, nickel magnesium oxide, copper magnesium oxide, $Li_2O$, alkali metal oxide, alkaline earth metal oxide, CuO, $CrO_4$, ZnO, MgO, CaO, $MoO_2$, $TiO_2$, $ZrO_2$, $SiO_2$, $Al_2O_3$, NiO, FeO, $Fe_2O_3$, $TaO_2$, $Ta_2O_5$, VO, $VO_2$, $V_2O_3$, $V_2O_5$, $P_2O_3$, $P_2O_5$, $B_2O_3$, NbO, $NbO_2$, $Nb_2O_5$, $SeO_2$, $SeO_3$, $TeO_2$, $TeO_3$, $WO_2$, $WO_3$, $Cr_3O_4$, $Cr_2O_3$, $CrO_2$, $CrO_3$, rare earth oxide such as $CeO_2$ or $La_2O_3$, an oxyhydroxide such as TiOOH, GdOOH, COOH, InOOH, FeOOH, GaOOH, NiOOH, AlOOH, CrOOH, MoOOH, CuOOH, MnOOH, ZnOOH, and SmOOH. Exemplary sources of H are $H_2O$, a compound that has bound or absorbed $H_2O$ such as a hydrate, a hydroxide, oxyhydroxide, or hydrogen sulfate, hydrogen or dihydrogen phosphate, and a hydrocarbon. The conductive matrix material may be at least one of a metal powder, carbon, carbon powder, carbide, boride, nitride, carbonitrile such as TiCN, or nitrile. The conductors of the present disclosure may be in different physical forms in different embodiments, such as bulk, particulate, power, nanopowder, and other forms know to those skilled in the art that cause the solid fuel or energetic material comprising a mixture with the conductor to be conductive.

Exemplary solid fuels or energetic materials comprise at least one of $H_2O$ and a conductive matrix. In an exemplary embodiment, the solid fuel comprises $H_2O$ and a metal conductor such as a transition metal such as Fe in a form such as a Fe metal powder conductor and a Fe compound such as iron hydroxide, iron oxide, iron oxyhydroxide, and iron halide wherein the latter may substitute for $H_2O$ as the hydrate that serves as the source of $H_2O$. Other metals may substitute for Fe in any of their physical forms such as metals and compounds as well as state such as bulk, sheet, screen, mesh, wire, particulate, powder, nanopowder and solid, liquid, and gaseous. The conductor may comprise carbon in one or more physical forms such as at least one of bulk carbon, particulate carbon, carbon powder, carbon aerogel, carbon nanotubes, activated carbon, graphene, KOH activated carbon or nanotubes, carbide derived carbon, carbon fiber cloth, and fullerene. Suitable exemplary solid fuels or energetic materials are $CuBr_2$+$H_2O$+conductive matrix; $Cu(OH)_2$+$FeBr_2$+conductive matrix material such as carbon or a metal powder; FeOOH+conductive matrix material such as carbon or a metal powder; $Cu(OH)Br$+conductive matrix material such as carbon or a metal powder; AlOOH or $Al(OH)_3$+Al powder wherein addition $H_2$ is supplied to the reactions to form hydrinos by reaction of Al with $H_2O$ formed from the decomposition of AlOOH or $Al(OH)_3$; $H_2O$ in conducting nanoparticles such as carbon nanotubes and fullerene that may be steam activated and $H_2O$ in metalized zeolites wherein a dispersant may be used to wet hydrophobic material such as carbon; $NH_4NO_3$+$H_2O$+NiAl alloy powder; $LiNH_2$+$LiNO_3$+Ti powder; $LiNH_2$+$LiNO_3$+Pt/Ti; $LiNH_2$+$NH_4NO_3$+Ti powder;

$BH_3NH_3+NH_4NO_3$; $BH_3NH_3+CO_2$, $SO_2$, $NO_2$, as well as nitrates, carbonates, sulfates; $LiH+NH_4NO_3+$transition metal, rare earth metal, Al or other oxidizable metal; $NH_4NO_3+$transition metal, rare earth metal, Al or other oxidizable metal; $NH_4NO_3+$R-Ni; $P_2O_5$ with each of a hydroxide of the present disclosure, $LiNO_3$, $LiClO_4$ and $S_2O_8+$conductive matrix; and a source of H such as a hydroxide, oxyhydroxide, hydrogen storage material such as one or more of the present disclosure, diesel fuel and a source of oxygen that may also be an electron acceptor such as $P_2O_5$ and other acid anhydrides such as $CO_2$, $SO_2$, or $NO_2$.

The solid fuel or energetic material to form hydrinos may comprise at least one highly reactive or energetic material, such as $NH_4NO_3$, tritonal, RDX, PETN, and others of the present disclosure. The solid fuel or energetic material may additionally comprise at least one of a conductor, a conducting matrix, or a conducting material such as a metal powder, carbon, carbon powder, carbide, boride, nitride, carbonitrile such as TiCN, or nitrile, a hydrocarbon such as diesel fuel, an oxyhydroxide, a hydroxide, an oxide, and $H_2O$. In an exemplary embodiment, the solid fuel or energetic material comprises a highly reactive or energetic material such as $NH_4NO_3$, tritonal, RDX, and PETN and a conductive matrix such as at least one of a metal powder such as Al or a transition metal powder and carbon powder. The solid fuel or energetic material may be reacted with a high current as given in the present disclosure. In an embodiment, the solid fuel or energetic material further comprises a sensitizer such as glass micro-spheres.

The energetic material may be a source for hydrino gas collection.

In an embodiment, the ignition of a solid fuel creates at least one of an expanding gas, expanding suspension that may be at least partially ionized, and expanding plasma. The expansion may be into vacuum. In an embodiment, the gas, suspension, or plasma that may expand such as into vacuum creates nanoparticles as at least one of the gas, suspension, or plasma cools. The nanoparticles serve as a new material with unique applications in areas such as electronics, pharmaceuticals, and surface coatings.

A. Plasmadynamic Converter (PDC)

The mass of a positively charge ion of a plasma is at least 1800 times that of the electron; thus, the cyclotron orbit is 1800 times larger. This result allows electrons to be magnetically trapped on magnetic field lines while ions may drift. Charge separation may occur to provide a voltage to a plasmadynamic converter.

B. Magnetohydrodynamic (MHD) Converter

Charge separation based on the formation of a mass flow of ions in a crossed magnetic field is well known art as magnetohydrodynamic (MHD) power conversion. The positive and negative ions undergo Lorentzian direction in opposite directions and are received at corresponding MHD electrode to affect a voltage between them. The typical MHD method to form a mass flow of ions is to expand a high-pressure gas seeded with ions through a nozzle to create a high speed flow through the crossed magnetic field with a set of MHD electrodes crossed with respect to the deflecting field to receive the deflected ions. In the present disclosure, the pressure is typically greater than atmospheric, but not necessarily so, and the directional mass flow may be achieved by reaction of a solid fuel to form a highly ionize radially expanding plasma.

C. Electromagnetic Direct (Crossed Field or Drift) Converter, $\vec{E} \times \vec{B}$ Direct Converter The guiding center drift of charged particles in magnetic and crossed electric fields may be exploited to separate and collect charge at spatially separated $\vec{E} \times \vec{B}$ electrodes. As the device extracts particle energy perpendicular to a guide field, plasma expansion may not be necessary. The performance of an idealized $\vec{E} \times \vec{B}$ converter relies on the inertial difference between ions and electrons that is the source of charge separation and the production of a voltage at opposing $\vec{E} \times \vec{B}$ electrodes relative to the crossed field directions. $\nabla \vec{B}$ drift collection may also be used independently or in combination with $\vec{E} \times \vec{B}$ collection.

D. Charge Drift Converter

The direct power converter described by Timofeev and Glagolev [A. V. Timofeev, "A scheme for direct conversion of plasma thermal energy into electrical energy," Sov. J. Plasma Phys., Vol. 4, No. 4, July-August, (1978), pp. 464-468; V. M. Glagolev, and A. V. Timofeev, "Direct Conversion of thermonuclear into electrical energy a drakon system," Plasma Phys. Rep., Vol. 19, No. 12, December (1993), pp. 745-749] relies on charge injection to drifting separated positive ions in order to extract power from a plasma. This charge drift converter comprises a magnetic field gradient in a direction transverse to the direction of a source of a magnetic flux B and a source of magnetic flux B having a curvature of the field lines. In both cases, drifting negatively and positively charged ions move in opposite directions perpendicular to plane formed by B and the direction of the magnetic field gradient or the plane in which B has curvature. In each case, the separated ions generate a voltage at opposing capacitors that are parallel to the plane with a concomitant decrease of the thermal energy of the ions. The electrons are received at one charge drift converter electrode and the positive ions are received at another. Since the mobility of ions is much less than that of electrons, electron injection may be performed directly or by boiling them off from a heated charge drift converter electrode. The power loss is small without much cost in power balance.

E. Magnetic Confinement

Consider that the blast or ignition event is when the catalysis of H to form hydrinos accelerates to a very high rate. In an embodiment, the plasma produced from the blast or ignition event is expanding plasma. In this case, magnetohydrodynamics (MHD) is a suitable conversion system and method. Alternatively, in an embodiment, the plasma is confined. In this case, the conversion may be achieved with at least one of a plasmadynamic converter, magnetohydrodynamic converter, electromagnetic direct (crossed field or drift) converter, $E\vec{E} \times \vec{B}$ direct converter, and charge drift converter. In this case, in addition to a SF-CIHT cell and balance of plant comprising ignition, reloading, regeneration, fuel handling, and plasma to electric power conversion systems, the power generation system further comprises a plasma confinement system. The confinement may be achieved with magnetic fields such as solenoidal fields. The magnets may comprise at least one of permanent magnets and electromagnets such as at least one of uncooled, water cooled, and superconducting magnets with the corresponding cryogenic management system that comprises at least one of a liquid helium dewar, a liquid nitrogen dewar, radiation baffles that may be comprise copper, high vacuum insulation, radiation shields, and a cyropump and compressor that may be powered by the power output of a hydrino-based power generator. The magnets may be open coils such as Helmholtz coils. The plasma may further be confined in a magnetic bottle and by other systems and methods known to those skilled in the art.

Two magnetic mirrors or more may form a magnetic bottle to confine plasma formed by the catalysis of H to form hydrinos. The theory of the confinement is given in my prior applications such as Microwave Power Cell, Chemical Reactor, And Power Converter, PCT/US02/06955, filed Mar. 7, 2002 (short version), PCT/US02/06945 filed Mar. 7, 2002 (long version), U.S. Pat. No. 10,469,913 filed Sep. 5, 2003 herein incorporated by reference in their entirety. Ions created in the bottle in the center region will spiral along the axis, but will be reflected by the magnetic mirrors at each end. The more energetic ions with high components of velocity parallel to a desired axis will escape at the ends of the bottle. Thus, in an embodiment, the bottle may produce an essentially linear flow of ions from the ends of the magnetic bottle to a magnetohydrodynamic converter. Since electrons may be preferentially confined due to their lower mass relative to positive ions, and a voltage is developed in a plasmadynamic embodiment of the present disclosure. Power flows between an anode in contact with the confined electrons and a cathode such as the confinement vessel wall which collects the positive ions. The power may be dissipated in an external load.

F. Solid Fuel Catalyst Induced Hydrino Transition (SF-CIHT) Cell

Chemical reactants of the present invention may be referred to as solid fuel or energetic materials or both. A solid fuel may perform as and thereby comprise an energetic material when conditions are created and maintained to cause very high reaction kinetics to form hydrinos. In an embodiment, the hydrino reaction rate is dependent on the application or development of a high current. In an embodiment of an SF-CIHT cell, the reactants to form hydrinos are subject to a low voltage, high current, high power pulse that causes a very rapid reaction rate and energy release. The rate may be sufficient to create a shock wave. In an exemplary embodiment, a 60 Hz voltage is less than 15 V peak, the current is between 10,000 A/cm$^2$ and 50,000 A/cm$^2$ peak, and the power is between 150,000 W/cm$^2$ and 750,000 W/cm$^2$. Other frequencies, voltages, currents, and powers in ranges of about 1/100 times to 100 times these parameters are suitable. In an embodiment, the hydrino reaction rate is dependent on the application or development of a high current. In an embodiment, the voltage is selected to cause a high AC, DC, or an AC-DC mixture of current that is in the range of at least one of 100 A to 1,000,000 A, 1 kA to 100,000 A, 10 kA to 50 kA. The DC or peak AC current density may be in the range of at least one of 100 A/cm$^2$ to 1,000,000 A/cm$^2$, 1000 A/cm$^2$ to 100,000 A/cm$^2$, and 2000 A/cm$^2$ to 50,000 A/cm$^2$. The DC or peak AC voltage may be in at least one range chosen from about 0.1 V to 1000 V, 0.1 V to 100 V, 0.1 V to 15 V, and 1 V to 15 V. The AC frequency may be in the range of about 0.1 Hz to 10 GHz, 1 Hz to 1 MHz, 10 Hz to 100 kHz, and 100 Hz to 10 kHz. The pulse time may be in at least one range chosen from about 10$^{-6}$ s to 10 s, 10$^{-5}$ s to 1 s, 10$^{-4}$ s to 0.1 s, and 10$^{-3}$ s to 0.01 s.

The plasma power formed by the hydrino may be directly converted into electricity. During H catalysis to hydrinos, electrons are ionized from the HOH catalyst by the energy transferred from the H being catalyzed to the HOH. These electrons may be conducted in the applied high circuit current to prevent the catalysis reaction from being self-limiting by charge buildup. A blast is produced by the fast kinetics that in turn causes massive electron ionization. The high velocity of the radially outward expansion of the exploding solid fuel that comprises an essentially 100% ionized plasma in the circumferential high magnetic field due to the applied current gives rise to magnetohydrodynamic power conversion. The magnitude of the voltage increases in the direction of the applied polarity since this is the Lorentzian deflection direction due to the current direction and the corresponding magnetic field vector and radial flow directions. In an embodiment using magnetohydrodynamic power conversion, the applied high current is DC such that the corresponding magnetic field is DC. A space charge electric field in the expanding plasma and high magnetic field from the applied current may also comprise a $\vec{E} \times \vec{B}$ direct converter that gives rise to the generated DC voltage and current wherein the applied high current is DC in an embodiment. Moreover, the high magnetic field produced by the high current traps the orders-of-magnitude-lighter electrons on the magnetic field lines while the heavy positive ions drift such that a plasmadynamic voltage may be produced between the electrodes if there is an electrode bias in this effect. In other embodiments, the plasma power from the ignition of solid fuel in converted to electric power using at least one dedicated plasma to electric converter such as at least one of a MHD, PDC, and $\vec{E} \times \vec{B}$ direct converter. The details of these and other plasma to electric power converters are given in my prior publications such as R. M. Mayo, R. L. Mills, M. Nansteel, "Direct Plasmadynamic Conversion of Plasma Thermal Power to Electricity," IEEE Transactions on Plasma Science, October, (2002), Vol. 30, No. 5, pp. 2066-2073; R. M. Mayo, R. L. Mills, M. Nansteel, "On the Potential of Direct and MHD Conversion of Power from a Novel Plasma Source to Electricity for Microdistributed Power Applications," IEEE Transactions on Plasma Science, August, (2002), Vol. 30, No. 4, pp. 1568-1578; R. M. Mayo, R. L. Mills, "Direct Plasmadynamic Conversion of Plasma Thermal Power to Electricity for Microdistributed Power Applications," 40th Annual Power Sources Conference, Cherry Hill, NJ, June 10-13, (2002), pp. 1-4 ("Mills Prior Plasma Power Conversion Publications") which are herein incorporated by reference in their entirety and my prior applications such as Microwave Power Cell, Chemical Reactor, And Power Converter, PCT/US02/06955, filed Mar. 7, 2002 (short version), PCT/US02/06945 filed Mar. 7, 2002 (long version), U.S. Pat. No. 10,469,913 filed Sep. 5, 2003; Plasma Reactor And Process For Producing Lower-Energy Hydrogen Species, PCT/US04/010608 filed Apr. 8, 2004, U.S. Pat. No. 10,552,585 filed Oct. 12, 2015; and Hydrogen Power, Plasma, and Reactor for Lasing, and Power Conversion, PCT/US02/35872 filed Nov. 8, 2002, U.S. Pat. No. 10,494,571 filed May 6, 2004 ("Mills Prior Plasma Power Conversion Publications") herein incorporated by reference in their entirety.

The plasma energy converted to electricity is dissipated in an external circuit. As demonstrated by calculations and experimentally in Mills Prior Plasma Power Conversion Publications greater than 50% conversion of plasma energy to electricity can be achieved. Heat as well as plasma is produced by each SF-CIHT cell. The heat may be used directly or converted to mechanical or electrical power using converters known by those skilled in the art such as a heat engine such as a steam engine or steam or gas turbine and generator, a Rankine or Brayton-cycle engine, or a Stirling engine. For power conversion, each SF CIHT cell may be interfaced with any of the converters of thermal energy or plasma to mechanical or electrical power described in Mills Prior Publications as well as converters known to those skilled in the art such as a heat engine, steam or gas turbine system, Stirling engine, or thermionic or thermoelectric converter. Further plasma converters comprise at least one of plasmadynamic power converter, $\vec{E} \times \vec{B}$ direct converter, magnetohydrodynamic power converter, magnetic mirror magnetohydrodynamic power converter, charge drift converter, Post or Venetian Blind power converter, gyrotron, photon bunching microwave power converter, and photoelectric converter disclosed in Mills Prior Publications. In an embodiment, the cell comprises at least one cylinder of an internal combustion engine as given in Mills Prior Thermal Power Conversion Publications, Mills Prior Plasma Power Conversion Publications, and Mills Prior Applications.

A solid fuel catalyst induced hydrino transition (SF-CIHT) cell power generator shown in FIG. 3 comprises at least one SF-CIHT cell 1 having a structural support frame 1a, each having at least two electrodes 2 that confine a sample, pellet, portion, or aliquot of solid fuel 3 and a source of electrical power 4 to deliver a short burst of low-voltage, high-current electrical energy through the fuel 3. The current ignites the fuel to release energy from forming hydrinos. The power is in the form of thermal power and highly ionized plasma of the fuel 3 capable of being converted directly into electricity. (Herein "ignites or forms blast" refers to the establishment of high hydrino reaction kinetics due to a high current applied to the fuel.) Exemplary sources of electrical power are that of a Taylor-Winfield model ND-24-75 spot welder and an EM Test Model CSS 500N10 CURRENT SURGE GENERATOR, 8/20US UP TO 10KA. In an embodiment, the source of electrical power 4 is DC, and the plasma to electric power converter is suited for a DC magnetic field. Suitable converters that operate with a DC magnetic field are magnetohydrodynamic, plasmadynamic, and $\vec{E} \times \vec{B}$ power converters. In an embodiment, the magnetic field may be provided by the current of the source of electrical power 4 of FIGS. 3 and 4A and 4B that may flow through additional electromagnets as well as the solid fuel pellet 3 (FIGS. 3 and 4A and 4B). In an embodiment of a PDC plasma to electric converter, the radial magnetic field due to current of electrode 2 may magnetized at least one PDC electrode that is shaped to follow the contour of the magnetic field lines. At least one PDC electrode perpendicular to the radial magnetic field lines comprises an unmagnetized PDC electrode. A voltage is generated between the at least one magnetized and one unmagnetized PDC electrode of the PDC converter.

In an embodiment, the source of electrical power 4 is capable of supplying or accepting high-currents such as those given in the present disclosure wherein by accepting current the self-limiting charge build up from the hydrino reaction may be ameliorated. The source and sink of current may be a transformer circuit, an LC circuit, an RLC circuit, capacitors, ultra-capacitors, inductors, batteries, and other low impedance or low resistance circuits or circuit elements and electrical energy storage elements or devices known to those skilled in the art about how to produce and accept large currents that may be in the form of at least one burst or pulse. In another embodiment shown in FIG. 4B, the ignition power source 4 that may also serve as a startup power source comprises at least one capacitor such as a bank of low voltage, high capacitance capacitors that supply the low voltage, high current necessary to achieve ignition. The capacitor circuit may be designed to avoid ripple or ringing during discharge to increase the lifetime of the capacitors. The lifetime may be long, such as in the range of about 1 to 20 years.

In an embodiment, the geometrical area of the electrodes is the same or larger than that of the solid fuel area in order to provide high current density to the entire sample to be ignited. In an embodiment, the electrodes are carbon to avoid loss of conductivity due to oxidation at the surface. In another embodiment, the ignition of the solid fuel occurs in a vacuum so that the electrodes are not oxidized. The electrodes may be at least one of continuously or intermittently regenerated with metal from a component of the solid fuel 3. The solid fuel may comprise metal in a form that is melted during ignition such that some adheres, fuses, weld, or alloys to the surface to replace electrode 2 material such as metal that was eroded way or worn away during operation. The SF-CIHT cell power generator may further comprise a means to repair the shape of the electrodes such as the teeth of gears 2a. The means may comprise at least one of a cast mold, a grinder, and a milling machine.

The power system further comprises a conveying reloading mechanical system 5 to remove the products of spent fuel and reload the electrodes 2 to confine another solid fuel pellet for ignition. In an embodiment, the fuel 3 comprises a continuous strip that is only ignited where the current flows through. Then, in the present disclosure, solid fuel pellet 3 refers in a general sense to a portion of the strip of solid fuel. The electrodes 2 may open and close during reloading. The mechanical action may be effected by systems known to those skilled in the art such as pneumatic, solenoidal, or electric motor action systems. The conveying reloading system may comprise a linear conveyor belt that moves product out and fuel into position to be confined by the electrodes 2. Alternatively, the conveying reloading system may comprise a carousel 5 that rotates between each ignition to remove products and position fuel 3 to be confined by the electrodes 2 for another ignition. The carousel 5 may comprise a metal that is resistant to melting or corroding such as a refractory alloy, high temperature oxidation resistant alloys such as TiAlN, or high temperature stainless steel such as those known in the art. In an embodiment, the SF-CIHT cell power generator shown in FIG. 3 produces intermittent bursts of hydrino-produced power from one SF-CIHT cell 1. Alternatively, the power generator comprises a plurality of SF-CIHT cells 1 that output the superposition of the individual cell's hydrino-produced power during timed blast events of solid fuel pellets 3. In an embodiment, the timing of the events amongst the plurality of cell may provide more continuous output power. In other embodiments, the fuel is continuously fed to the high current between the electrodes 2 to produce continuous power. In an embodiment, the two electrodes 2 that confine the solid fuel are extended such that contact can be made at opposing points along the length of the extended set of electrodes 2 to cause a sequence of high-current flow and rapid hydrino reaction kinetics along the electrode set 2. The opposing contact points on opposite electrodes 2 may be made by mechanically moving the corresponding connections to the location or by electronically switching the connections. The connections can be made in a synchronous manner to achieve a more steady power output from the cell or plurality cells. The fuels and ignition parameters are those given in the present disclosure.

To dampen any intermittence, some power may be stored in a capacitor and optionally a high-current transformer, battery, or other energy storage device. In another embodiment, the electrical output from one cell can deliver a short burst of low-voltage, high-current electrical energy that ignites the fuel of another cell. The output electrical power can further be conditioned by output power conditioner 7 connected by power connector 8. The output power conditioner 7 may comprise elements such as power storage such as a battery or supercapacitor, DC to AC (DC/AC) converter or inverter, and a transformer. DC power may be converted to another form of DC power such as one with a higher voltage; the power may be converted to AC, or mixtures of DC and AC. The output power may be power conditioned to a desired waveform such as 60 Hz AC power and supplied to a load through output terminals 9. In an embodiment, the output power conditioner 7 converts the power from the plasma to electric converter or the thermal to electric converter to a desired frequency and wave form such as an AC frequency other than 60 or 50 HZ that are standard in the United States and Europe, respectively. The different frequency may be applied to matching loads designed for the different frequency such as motors such as those for motive, aviation, marine, appliances, tools, and machinery, electric heating and space conditioning, telecommunications, and electronics applications. A portion of the output power at power output terminals 9 may used to power the source of electrical power 4 such as about 5-10 V, 10,000-40,000 A DC power. MHD and PDC power converters may output low-voltage, high current DC power that is well suited for re-powering the electrodes 2 to cause ignition of subsequently supplied fuel. The output of low voltage, high current may be supplied to DC loads. The DC may be conditioned with a DC/DC converter. Exemplary DC loads comprise DC motors such as electrically commutated motors such as those for motive, aviation, marine, appliances, tools, and machinery, DC electric heating and space conditioning, DC telecommunications, and DC electronics applications.

Since the power may be distributed, no power transmission may be needed, and high voltage DC transmission with minimum losses is an option where transmission is desired such as in a local area grid. Then, power applications may be powered with high current DC, and DC power may have advantages over AC. In fact, many if not most power loads such as motors, appliances, lighting, and electronics are operated on DC power converted from transmitted AC grid power. Another application that may benefit from the direct high current DC power output of the SF-CIHT cell is electric motive power that may use DC brushed, or brushless, electrically commutated DC motors. The DC/AC converter, in many cases, AC/DC converter, and corresponding conversions are eliminated with the direct, high current DC power output of the SF-CIHT cell. This results in reductions in the cost of capital equipment and power from eliminating the losses during conversion between DC and AC.

In an embodiment, a supercapacitor or a battery 16 (FIGS. 3 and 4A) is be used to start the SF-CIHT cell by supplying the power for the initial ignition so that power for subsequent ignitions is provided by output power conditioner 7 that in turn is powdered by plasma to electric power converter 6. In an embodiment, the output of the power conditioner 7 flows to an energy storage device such as 16 to restart the power generator. The storage may also store power or supply power to level rapid changes in load and thereby provide load leveling. The power generator may provide variable power output by controlling the rate that fuel is consumed by controlling the rate that it is fed into the electrodes 2 by controlling a variable or interruptible rotation speed of carrousel 5a. Alternatively, the rate that the electrodes 2 are fired is variable and controlled.

The ignition generates an output plasma and thermal power. The plasma power may be directly converted to electricity by plasma to electric power converter 6. The cell may be operated open to atmosphere. In an embodiment, the cell 1 is capable of maintaining a vacuum or a pressure less than atmospheric. The vacuum or a pressure less than atmospheric may be maintained by vacuum pump 13a to permit ions for the expanding plasma of the ignition of the solid fuel 3 to be free of collisions with atmospheric gases. In an embodiment, a vacuum or a pressure less than atmospheric is maintained in the system comprising the plasma-generating cell 1 and the connected plasma to electric converter 6. The vacuum or a pressure less than atmospheric eliminates gases whose collisions interfere with plasma to electric conversion. In an embodiment, the cell 1 may be filled with an inert gas such that the solid fuel or ignition products do not react with oxygen. The oxygen free cell 1 due to the cell being under vacuum or filled with an inert gas is favorable to fuel regeneration, especially when the fuel comprises a conductor such as carbon or a metal that is reacts unfavorably with $H_2O$ towards oxidization. Such metals are at least one of the group of Cu, Ni, Pb, Sb, Bi, Co, Cd, Ge, Au, Ir, Fe, Hg, Mo, Os, Pd, Re, Rh, Ru, Se, Ag, Tc, Te, Tl, Sn, W, Al, V, Zr, Ti, Mn, Zn, Cr, and In. The cell under vacuum is favorable to plasma to electric conversion since the plasma ion-gas collisions and thermalization of the plasma ion kinetic energy are avoided.

The thermal power may be extracted by at least one of an electrode heat exchanger 10 with coolant flowing through its electrode coolant inlet line 11 and electrode coolant outlet line 12 and a MHD heat exchanger 18 with coolant flowing through its MHD coolant inlet line 19 and MHD coolant outlet line 20. Other heat exchangers may be used to receive the thermal power from the hydrino reaction such as a water-wall type of design that may further be applied on at least one wall of the vessel 1, at least one other wall of the MHD converter, and the back of the electrodes 17 of the MHD converter. These and other heat exchanger designs to efficiently and cost effectively remove the heat form the reaction are known to those skilled in the art. The heat may be transferred to a heat load. Thus, the power system may comprise a heater with the heat supplied by the at least one of the coolant outlet lines 12 and 20 going to the thermal load or a heat exchanger that transfers heat to a thermal load. The cooled coolant may return by at least one of the coolant inlet lines 11 and 19. The heat supplied by at least one of the coolant outlet lines 12 and 20 may flow to a heat engine, a steam engine, a steam turbine, a gas turbine, a Rankine-cycle engine, a Brayton-cycle engine, and a Stirling engine to be converted to mechanical power such as that of spinning at least one of a shaft, wheels, a generator, an aviation turbofan or turbopropeller, a marine propeller, an impeller, and rotating shaft machinery. Alternatively, the thermal power may flow from at lest one of the coolant outlet lines 12 and 20 to a thermal to electric power converter such as those of the present disclosure. Suitable exemplary thermal to electricity converters comprise at least one of the group of a heat engine, a steam engine, a steam turbine and generator, a gas turbine and generator, a Rankine-cycle engine, a Brayton-cycle engine, a Stirling engine, a thermionic power converter, and a thermoelectric power converter. The output power from the thermal to electric converter may be used to power a load, and a portion may power components of the SF-CIHT cell power generator such as the source of electrical power 4.

Ignition of the reactants of a given pellet yields power and products wherein the power may be in the form of plasma of the products. The plasma to electric converter 6 generates electric from the plasma. Following transit through it, the plasma to electric converter 6 may further comprise a condensor of the plasma products and a conveyor to the reloading system 5. Then, the products are transported by the reloading system such as carousel 5 to a product remover-fuel loader 13 that conveys the products from the reloading system 5 to a regeneration system 14. In an embodiment, the SF-CIHT cell power generator further comprises a vacuum pump 13a that may remove any product oxygen and molecular hydrino gas. In an embodiment, at least one of oxygen and molecular hydrino are collected in a tank as a commercial product. The pump may further comprise selective membranes, valves, sieves, cryofilters, or other means known by those skilled in the art for separation of oxygen and hydrino gas and may additionally collect $H_2O$ vapor, and may supply $H_2O$ to the regeneration system 14 to be recycled in the regenerated solid fuel. Herein, the spent fuel is regenerated into the original reactants or fuel with any H or $H_2O$ consumed such as in the formation of hydrino made up with $H_2O$ from $H_2O$ source 14a. The water source may comprise a tank, cell, or vessel 14a that may contain at least one of bulk or gaseous $H_2O$, or a material or compound comprising $H_2O$ or one or more reactants that forms $H_2O$ such as $H_2+O_2$. Alternatively, the source may comprise atmospheric water vapor, or a means to extract $H_2O$ from the atmosphere such as a hydroscopic material such as lithium bromide, calcium chloride, magnesium chloride, zinc chloride, potassium carbonate, potassium phosphate, carnallite such as $KMgCl_3 \cdot 6(H_2O)$, ferric ammonium citrate, potassium hydroxide and sodium hydroxide and concentrated sulfuric and phosphoric acids, cellulose fibers (such as cotton and paper), sugar, caramel, honey, glycerol, ethanol, methanol, diesel fuel, methamphetamine, many fertilizer chemicals, salts (including table salt) and a wide variety of other substances know to those skilled in the art as well as a desiccant such as silica, activated charcoal, calcium sulfate, calcium chloride, and molecular sieves (typically, zeolites) or a deliquescent material such as zinc chloride, calcium chloride, potassium hydroxide, sodium hydroxide and many different deliquescent salts known to those skilled in the art.

In another embodiment, the reloading system such as carousel 5 comprises a hopper that is filled with regenerated solid fuel from the regeneration system 14 by product remover-fuel loader 13. The fuel flows out of the bottom between the electrodes 2. The electrodes 2 may open and close to ignite each portion of fuel that flows into position for ignition between the electrodes 2 or is so placed by a spreader. In an embodiment, the fuel 3 comprises a fine powder that may be formed by ball milling regenerated or reprocessed solid fuel wherein the regeneration system 14 may further comprise a ball mill, grinder, or other means of forming smaller particles from larger particles such as those grinding or milling means known in the art. An exemplary solid fuel mixture comprises a conductor such as conducting metal powder such as a powder of a transition metal, silver, or aluminum, its oxide, and $H_2O$. In another embodiment, the fuel 3 may comprise pellets of the solid fuel that may be pressed in the regeneration system 14. The solid fuel pellet may further comprise a thin foil of the powdered metal or another metal that encapsulates the metal oxide and $H_2O$, and optionally the metal powder. In this case, the regeneration system 14 regenerates the metal foil by means such as at least one of heating in vacuum, heating under a reducing hydrogen atmosphere, and electrolysis from an electrolyte such as a molten salt electrolyte. The regeneration system 14 further comprises metal processing systems such as rolling or milling machinery to form the foil from regenerated foil metal stock. The jacket may be formed by a stamping machine or a press wherein the encapsulated solid fuel may be stamped or pressed inside.

In an embodiment, an exemplary solid fuel mixture comprises a transition metal powder, its oxide, and $H_2O$. The fine powder may be pneumatically sprayed into the gap formed between the electrodes 2 when they open. In another embodiment, the fuel comprises at least one of a powder and slurry. The fuel may be injected into a desired region to be confined between the electrodes 2 to be ignited by a high current. To better confine the powder, the electrodes 2 may have male-female halves that form a chamber to hold the fuel. In an embodiment, the fuel and the electrodes 2 may be oppositely electrostatically charged such that the fuel flows into the inter-electrode region and electrostatically sticks to a desired region of each electrode 2 where the fuel is ignited.

In an embodiment of the power generator shown in FIGS. 4A and 4B, the electrodes surfaces 2 may be parallel with the gravitational axis, and solid fuel powder 3 may be gravity flowed from an overhead hopper 5 as intermittent stream wherein the timing of the intermittent flow streams matches the dimensions of the electrodes 2 as they open to receive the flowing powdered fuel 3 and close to ignite the fuel stream. In another embodiment, the electrodes 2 further comprise rollers 2a on their ends that are separated by a small gap filled with fuel flow. The electrically conductive fuel 3 completes the circuit between the electrodes 2, and the high current flow through the fuel ignites it. The fuel stream 3 may be intermittent to prevent the expanding plasma from disrupting the fuel stream flow.

In another embodiment, the electrodes 2 comprise a set of gears 2a supported by structural element 2b. The set of gears may be rotated by drive gear 2c powered by drive gear motor 2d. The drive gear 2c may further serve as a heat sink for each gear 2a wherein the heat may be removed by an electrode heat exchanger such as 10 that receives heat from the drive gear 2c. The gears 2a such herringbone gears each comprise an integer n teeth wherein the fuel flows into the $n^{th}$ inter-tooth gap or bottom land as the fuel in the $n-1^{th}$ inter-tooth gap is compressed by tooth n−1 of the mating gear. Other geometries for the gears or the function of the gears are within the scope of the present disclosure such as interdigitated polygonal or triangular-toothed gears, spiral gears, and augers as known to those skilled in the art. In an embodiment, the fuel and a desired region of the gear teeth of the electrodes 2a such as the bottom land may be oppositely electrostatically charged such that the fuel flows into and electrostatically sticks to the desired region of one or both electrodes 2a where the fuel is ignited when the teeth mesh. In an embodiment, the fuel 3 such as a fine powder is pneumatically sprayed into a desired region of the gears 2a. In another embodiment, the fuel 3 is injected into a desired region to be confined between the electrodes 2a such as the interdigitation region of the teeth of the gears 2a to be ignited by a high current. In an embodiment, the rollers or gears 2a maintain tension towards each other by means such as by being spring loaded or by pneumatic or hydraulic actuation. The meshing of teeth and compression causes electrical contact between the mating teeth through the conductive fuel. In an embodiment, the gears are conducting in the interdigitation region that contacts the fuel during meshing and are insulating in other regions such that the current selectively flows through the fuel. In an embodiment, the gears 2a comprise ceramic gears that are metal coated to be conductive in the interdigitation region or electrically isolated without a ground path. Also, the drive gear 2c may be nonconductive or electrically isolated without a ground path. The electrical contact and supply from the electrodes 2 to the interdigitating sections of the teeth may be provided by brushes 2e as shown in FIG. 4A. An exemplary brush comprises a carbon bar or rod that is pushed into contact with the gear by a spring, for example.

In another embodiment shown in FIG. 4B, electrical contact and supply from the electrodes 2 to the interdigitating sections of the teeth may be provided directly through a corresponding gear hub and bearings. Structural element 2b of FIG. 4A may comprise the electrodes 2. As shown in FIG. 4B, each electrode 2 of the pair of electrodes may be centered on each gear and connected to the center of each gear to serve as both the structural element 2b of FIG. 4A and the electrode 2 wherein the gear bearings connecting each gear 2a to its shaft or hub serves as an electrical contact, and the only ground path is between contacting teeth of opposing gears. In an embodiment, the outer part of each gear turns around its central hub to have more electrical contact through the additional bearings at the larger radius. The hub may also serve as a large heat sink. An electrode heat exchanger 10 may also attach to the hub to remove heat from the gears. The heat exchanger 10 may be electrically isolated from the hub with a thin layer of insulator such as an electrical insulator having high heat conductivity such as diamond or diamond-like carbon film. The electrification of the gears can be timed using a computer and switching transistors such as those used in brushless DC electric motors. In an embodiment, the gears are energized intermittently such that the high current flows through the fuel when the gears are meshed. The flow of the fuel may be timed to match the delivery of fuel to the gears as they mesh and the current is caused to flow through the fuel. The consequent high current flow causes the fuel to ignite. The fuel may be continuously flowed through the gears or rollers 2a that rotate to propel the fuel through the gap. The fuel may be continuously ignited as it is rotated to fill the space between the electrodes 2 comprising meshing regions of a set of gears or opposing sides of a set of rollers. In this case, the output power may be steady. The resulting plasma expands out the sides of the gears and flows to the plasma to electric converter 6, in an embodiment. The plasma expansion flow may be along the axis that is parallel with the shaft of each gear and transverse to the direction of the flow of the fuel stream 3. The axial flow may be through an MHD converter. Further directional flow may be achieved with confining magnets such as those of Helmholtz coils or a magnetic bottle.

The power generator further comprises means and methods for variable power output. In an embodiment, the power output of the power generator is controlled by controlling the variable or interruptible flow rate of the fuel 3 into the electrodes 2 or rollers or gears 2a, and the variable or interruptible fuel ignition rate by the power source 4. The rate of rotation of the rollers or gears may also be controlled to control the fuel ignition rate. In an embodiment, the output power conditioner 7 comprises a power controller 7 to control the output that may be DC. The power controller may control the fuel flow rate, the rotation speed of the gears by controlling the gear drive motor 2d that rotates the drive gear 2c and turns the gears 2a. The response time based on the mechanical or electrical control of at least one of the fuel consumption rate or firing rate may be very fast such as in the range of 10 ms to 1 us. The power may also be controlled by controlling the connectivity of the converter electrodes of the plasma to electric converter. For example, connecting MHD electrodes 17 or PDC electrodes in series increases the voltage, and connecting converter electrodes in parallel increases the current. Changing the angle of the MHD electrodes 17 or selectively connecting to sets of MHD electrodes 17 at different angles relative to at least one of the plasma propagation direction and magnetic field direction changes the power collected by changing at least one of the voltage and current.

The power controller 7 further comprises sensors of input and output parameters such as voltages, currents, and powers. The signals from the sensors may be fed into a processor that controls the power generator. At least one of the ramp-up time, ramp down time, voltage, current, power, waveform, and frequency may be controlled. The power generator may comprise a resistor such as a shunt resistor through which power in excess of that required or desired for a power load may be dissipated. The shunt resistor may be connected to output power conditioner or power controller 7. The power generator may comprise an embedded processor and system to provide remote monitoring that may further have the capacity to disable the power generator.

The hopper 5 may be refilled with regenerated fuel from the regeneration system 14 by product remover-fuel loader 13. Any H or $H_2O$ consumed such as in the formation of hydrino may be made up with $H_2O$ from $H_2O$ source 14a. In an embodiment, the fuel or fuel pellet 3 is partially to substantially vaporized to a gaseous physical state such as a plasma during the hydrino reaction blast event. The plasma passes through the plasma to electric power converter 6, and the recombined plasma forms gaseous atoms and compounds. These are condensed by a condenser 15 and collected and conveyed to the regeneration system 14 by product remover-fuel loader 13 comprising a conveyor connection to the regeneration system 14 and further comprising a conveyor connection to the hopper 5. The condenser 15 and product remover-fuel loader 13 may comprise systems such as at least one of an electrostatic collection system and at least one auger, conveyor or pneumatic system such as a vacuum or suction system to collect and move material. Suitable systems are known by those skilled in the art. In an embodiment, a plasma to electric converter 6 such as a magnetohydrodynamic converter comprises a chute or channel 6a for the product to be conveyed into the product remover-fuel loader 13. At least one of the floor of the MHD converter 6, the chute 6a, and MHD electrode 17 may be sloped such that the product flow may be at least partially due to gravity flow. At least one of the floor of the MHD converter 6, the chute 6a, and MHD electrode 17 may be mechanically agitated or vibrated to assist the flow. The flow may be assisted by a shock wave formed by the ignition of the solid fuel. In an embodiment, at least one of the floor of the MHD converter 6, the chute 6a, and MHD electrode 17 comprises a mechanical scraper or conveyor to move product from the corresponding surface to the product remover-fuel loader 13.

In an embodiment, the SF-CIHT cell power generator further comprises a vacuum pump 13a that may remove any product oxygen and molecular hydrino gas. The pump may further comprise selective membranes, valves, sieves, cryofilters, or other means known by those skilled in the art for separation of oxygen and hydrino gas and may additionally collect $H_2O$ vapor, and may supply $H_2O$ to the regeneration system 14 to be recycled in the regenerated solid fuel. In an embodiment the fuel 3 comprises a fine powder that may be formed by ball milling regenerated or reprocessed solid fuel wherein the regeneration system 14 may further comprise a ball mill, grinder, or other means of forming smaller particles from larger particles such as those grinding or milling means known in the art. In an embodiment, a portion of the electrical power output at terminals 9 is supplied to at least one of the source of electrical power 4, the gear (roller) drive motor 2d, carrousel 5a having a drive motor (FIG. 3), product remover-fuel loader 13, pump 13a, and regeneration system 14 to provide electrical power and energy to propagate the chemical reactions to regenerate the original solid fuel from the reaction products. In an embodiment, a portion of the heat from at least one of the electrode heat exchanger 10 and MHD heat exchanger 18 is input to the solid fuel regeneration system by at least one of the coolant outlet lines 12 and 20 with coolant return circulation by at least one of the coolant input lines 11 and 19 to provide thermal power and energy to propagate the chemical reactions to regenerate the original solid fuel from the reaction products. A portion of the output power from the thermal to electric converter 6 may also be used to power the regeneration system as well as other systems of the SF-CIHT cell generator.

In an exemplary embodiment, the solid fuel is regenerated by means such as given in the present disclosure such as at least one of addition of $H_2$, addition of $H_2O$, thermal regeneration, and electrolytic regeneration. Due to the very large energy gain of the hydrino reaction relative to the input energy to initiate the reaction, such as 100 times in the case of NiOOH (3.22 kJ out compared to 46 J input as given in the Exemplary SF-CIHT Cell Test Results section), the products such as $Ni_2O_3$ and NiO can be converted to the hydroxide and then the oxyhydroxide by electrochemical reactions as well as chemical reactions as given in the present disclosure and also by ones known to those skilled in the art. In other embodiments, other metals such as Ti, Gd, Co, In, Fe, Ga, Al, Cr, Mo, Cu, Mn, Zn, and Sm, and the corresponding oxides, hydroxides, and oxyhydroxides such as those of the present disclosure may substitute for Ni. In another embodiment, the solid fuel comprises a metal oxide and $H_2O$ and the corresponding metal as a conductive matrix. The product may be metal oxide. The solid fuel may be regenerated by hydrogen reduction of a portion of the metal oxide to the metal that is then mixed with the oxide that has been rehydrated. Suitable metals having oxides that can readily be reduced to the metals with mild heat such as less than 1000° C. and hydrogen are Cu, Ni, Pb, Sb, Bi, Co, Cd, Ge, Au, Ir, Fe, Hg, Mo, Os, Pd, Re, Rh, Ru, Se, Ag, Tc, Te, Tl, Sn, W, Al, V, Zr, Ti, Mn, Zn, Cr, and In. In another embodiment, the solid fuel comprises (1) an oxide that is not easily reduced with $H_2$ and mild heat such as at least one of alumina, an alkaline earth oxide, and a rare earth oxide, (2) a metal having an oxide capable of being reduced to the metal with $H_2$ at moderate temperatures such as less than 1000° C., and (3) $H_2O$. An exemplary fuel is MgO+Cu+$H_2O$. Then, the product mixture of the $H_2$ reducible and nonreducible oxide may be treated with $H_2$ and heated at mild conditions such that only the reducible metal oxide is converted to metal. This mixture may be hydrated to comprise regenerated solid fuel. An exemplary fuel is MgO+Cu+$H_2O$; wherein the product MgO+CuO undergoes $H_2$ reduction treatment to yield MgO+Cu that is hydrated to the solid fuel.

In another embodiment, the oxide product such as CuO or AgO is regenerated by heating under at least one of vacuum and an inert gas stream. The temperature may be in the range of at least one of about 100° C. to 3000° C., 300° C. to 2000° C., 500° C. 10 1200° C., and 500° C. to 1000° C. In an embodiment, the regeneration system 14 may further comprise a mill such as at least one of a ball mill and a shredding/grinding mill to mill at least one of bulk oxide and metal to powders such as fine powders such as one with particle sizes in the range of at least one of about 10 nm to 1 cm, 100 nm to 10 mm, 0.1 um to 1 mm, and 1 um to 100 um (u=micro).

In another embodiment, the regeneration system may comprises an electrolysis cell such as a molten salt electrolysis cell comprising metal ions wherein the metal of a metal oxide product may be plated onto the electrolysis cell cathode by electrodeposition using systems and methods that are well known in the art. The system may further comprise a mill or grinder to form metal particles of a desired size from the electroplated metal. The metal may be added to the other components of the reaction mixture such as $H_2O$ to form regenerated solid fuel.

In an embodiment the cell 1 of FIGS. 3 and 4A and 4B is capable of maintaining a vacuum or a pressure less than atmospheric. A vacuum or a pressure less than atmospheric is maintained in the cell 1 by pump 13a and may also be maintained in the connecting plasma to electric converter 6 that receives the energetic plasma ions from the plasma source, cell 1. In an embodiment, the solid fuel comprises a metal that is substantially thermodynamically stable towards reaction with $H_2O$ to become oxidized metal. In this case, the metal of the solid fuel is not oxidized during the reaction to form products. An exemplary solid fuel comprises a mixture of the metal, the oxidized metal, and $H_2O$. Then, the product such as a mixture of the initial metal and metal oxide may be removed by product remover-fuel loader 13 and regenerated by addition of $H_2O$. Suitable metals having a substantially thermodynamically unfavorable reaction with $H_2O$ may be chosen for the group of Cu, Ni, Pb, Sb, Bi, Co, Cd, Ge, Au, Ir, Fe, Hg, Mo, Os, Pd, Re, Rh, Ru, Se, Ag, Tc, Te, Tl, Sn, W, Al, V, Zr, Ti, Mn, Zn, Cr, and In. In other embodiments, the solid fuel comprises the $H_2O$ unreactive metal and at least one of $H_2O$, a metal oxide, hydroxide, and oxyhydroxide that may comprise the same or at least one different metal.

In an embodiment, the methods of $H_2$ reduction, reduction under vacuum, and rehydration are conducted in order to regenerate the solid fuel expeditiously, efficiently, and cost effectively as possible.

In an embodiment, the solid fuel comprises a mixture of hydroscopic material comprising $H_2O$ and a conductor. An exemplary fuel is a hydrated alkaline earth metal halide such as $MgX_2$ (X=F, Cl, Br, I) and a conductor such as a transition metal such as Co, Ni, Fe, or Cu.

In an embodiment, the solid fuel comprises a source of $H_2O$ encapsulated in a conductive jacket. The source of $H_2O$ may comprise materials and reaction mixtures of the present disclosure. The conductive jacket may comprise at least one of a metal, carbon, carbide, and other conductive matrix materials of the present disclosure. In another embodiment, the solid fuel comprises a metal oxide and $H_2O$ and a material such as the corresponding metal as a thin foil that encapsulates the metal oxide and $H_2O$. Other materials such as hydroscopic materials may substitute for the metal oxide and serve as a matrix to bind or absorb the $H_2O$. The conductor-encapsulated source of $H_2O$ may comprise a pellet. An exemplary solid fuel pellet comprises a thin foil metal jacket such as one comprising a transition metal, silver, or aluminum that encapsulates a material that is a source of $H_2O$ or holds $H_2O$ such as the materials and reaction mixtures of the present disclosure. Following energy release, the conductor such as the foil metal may be recovered by means such as cyclone separation, sedimentation, sifting, and other means known in the art. The foils may be formed from recovered metal stock by metal processing systems such as rolling or milling machinery. The jacket may be formed by a stamping machine or a press wherein the encapsulated material may be stamped or pressed inside. In the case that the conductor such as a metal is oxidized, the metal may be regenerated by reduction of the oxide. The foil metal may be regenerated by at least one of heating in vacuum, heating under a reducing hydrogen atmosphere, and electrolysis from an electrolyte such as a molten salt electrolyte.

In an embodiment, the solid fuel may be used once and not regenerated. Carbon comprising H and O such as steam carbon or activated carbon and $H_2O$ wetted carbon are suitable exemplary reactants or solid fuels that may be consumed without regeneration.

The plasma power may be converted to electricity using plasmadynamic power converter 6 that is based on magnetic space charge separation. Due to their lower mass relative to positive ions, electrons are preferentially confined to magnetic flux lines of a magnetized PDC electrode such as a cylindrical PDC electrode or a PDC electrode in a magnetic field. Thus, electrons are restricted in mobility; whereas, positive ions are relatively free to be collisional with the intrinsically or extrinsically magnetized PDC electrode. Both electrons and positive ions are fully collisional with an unmagnetized PDC electrode. Plasmadynamic conversion extracts power directly from the thermal and potential energy of the plasma and does not rely on plasma flow. Instead, power extraction by PDC exploits the potential difference between a magnetized and unmagnetized PDC electrode immersed in the plasma to drive current in an external load and, thereby, extract electrical power directly from stored plasma thermal energy. Plasmadynamic conversion (PDC) of thermal plasma energy to electricity is achieved by inserting at least two floating conductors directly into the body of high temperature plasma. One of these conductors is magnetized by an external electromagnetic field or permanent magnet, or it is intrinsically magnetic. The other is unmagnetized. A potential difference arises due to the vast difference in charge mobility of heavy positive ions versus light electrons. This voltage is applied across an electrical load.

In embodiments, the power system comprises additional internal or external electromagnets or permanent magnets or comprises multiple intrinsically magnetized and unmagnetized PDC electrodes such as cylindrical PDC electrodes such as pin PDC electrodes. The source of uniform magnetic field B parallel to each PDC electrode may be provided by an electromagnet such as by Helmholtz coils. The electromagnet(s) may be at least one of permanent magnets such as Halbach array magnets, and uncooled, water cooled, and superconducting electromagnets The exemplary superconducting magnets may comprise NbTi, NbSn, or high temperature superconducting materials. The magnet current may also be supplied to the solid fuel pellet to initiate ignition. In an embodiment, the magnetic field produce by the high current of the source of electrical power 4 is increased by flowing through multiple turns of an electromagnet before flowing through the solid fuel pellet. The strength of the magnetic field B is adjusted to produce an optimal positive ion versus electron radius of gyration to maximize the power at the PDC electrodes. In an embodiment, at least one magnetized PDC electrode is parallel to the applied magnetic field B; whereas, the at least one corresponding counter PDC electrode is perpendicular to magnetic field B such that it is unmagnetized due to its orientation relative to the direction of B. The power can be delivered to a load through leads that are connected to at least one counter PDC electrode. In an embodiment, the cell wall may serve as a PDC electrode. In an embodiment, the PDC electrodes comprise a refractory metal that is stable in a high temperature atmospheric environment such high-temperature stainless steels and other materials known to those skilled in the art. In an embodiment, the plasmadynamic converter further comprises a plasma confinement structure such as a magnetic bottle or source of solenoidal field to confine the plasma and extract more of the power of the energetic ions as electricity. The plasmadynamic output power is dissipated in a load.

Figure 5:
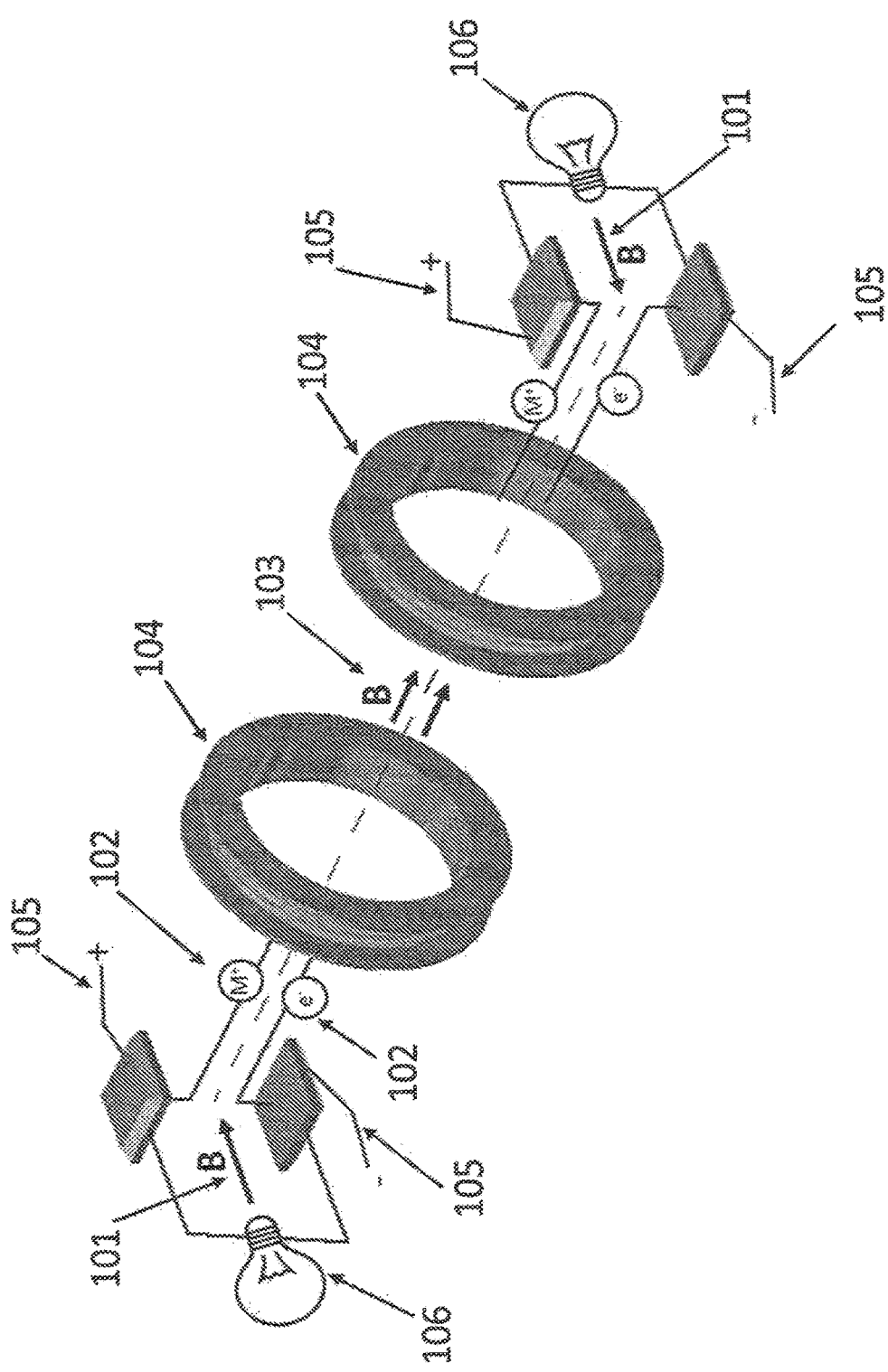
FIG. 5 is a schematic drawing of the operation of a magnetohydrodynamic power converter in accordance with an embodiment of the present disclosure.

The plasma to electric power converter 6 of FIGS. 3 and 4A and 4B may further comprise a magnetohydrodynamic power converter comprising a source of magnetic flux 101 transverse to the z-axis, the direction of ion flow 102 as shown in FIG. 5. Thus, the ions have preferential velocity along the z-axis due to the confinement field 103 provided by Helmholtz coils 104. Thus, the ions propagate into the region of the transverse magnetic flux. The Lorentzian force on the propagating electrons and ions is given by $$F = ev \times B \qquad (196)$$

The force is transverse to the ion velocity and the magnetic field and in opposite directions for positive and negative ions. Thus, a transverse current forms. The source of transverse magnetic field may comprise components that provide transverse magnetic fields of different strengths as a function of position along the z-axis in order to optimize the crossed deflection (Eq. (196)) of the flowing ions having parallel velocity dispersion.

Figure 6:
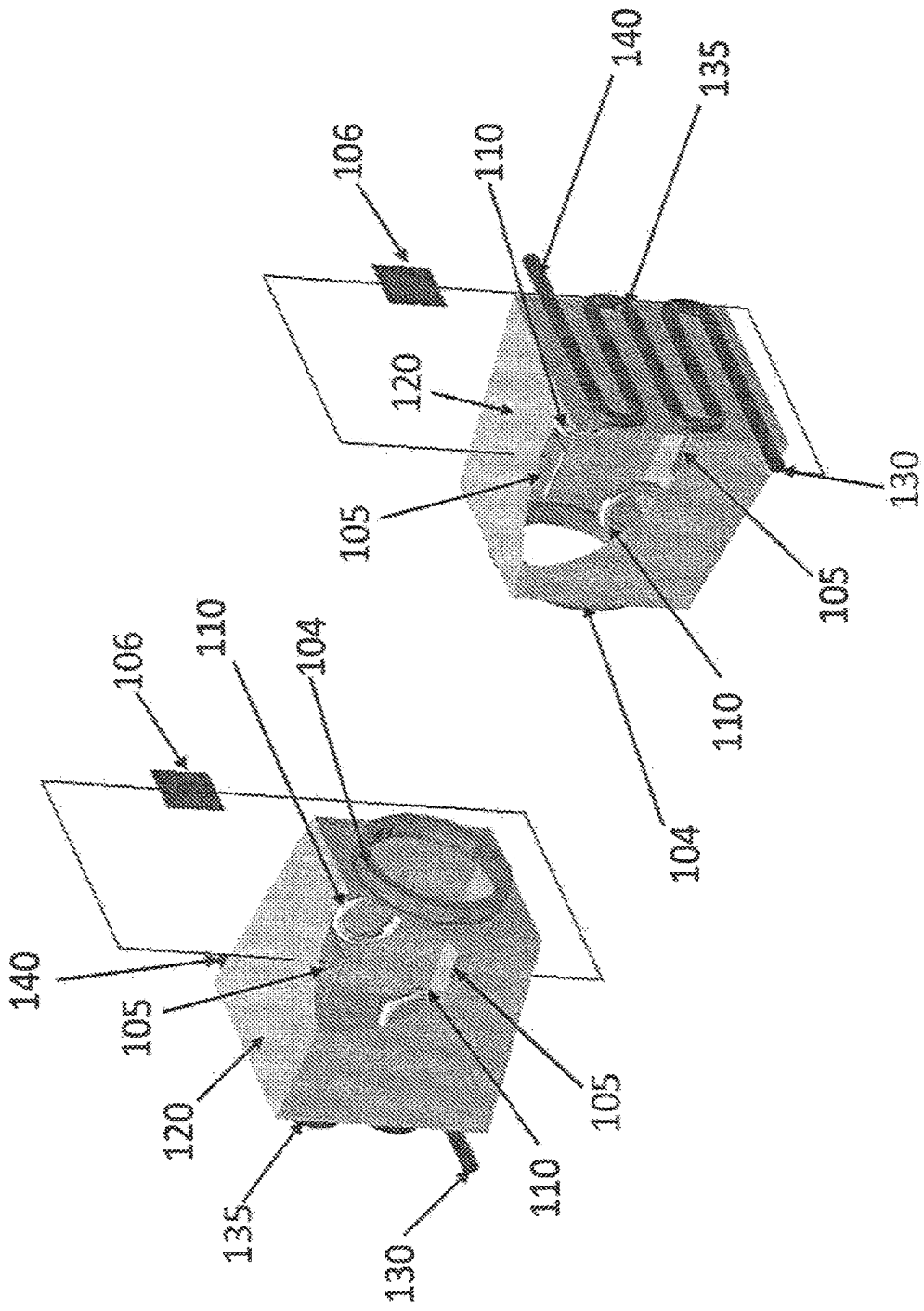
FIG. 6 is a schematic drawing of a magnetohydrodynamic power converter in accordance with an embodiment of the present disclosure.

The magnetohydrodynamic power converter shown in FIG. 5 further comprises at least two MHD electrodes 105 which may be transverse to the magnetic field (B) to receive the transversely Lorentzian deflected ions that creates a voltage across the MHD electrodes 105. The MHD power may be dissipated in an electrical load 106. A schematic drawing of a magnetohydrodynamic power converter is shown in FIG. 6 wherein the MHD set of Helmholtz coils or set of magnets 110 provide the Lorentzian deflecting field to the flowing plasma in the magnetic expansion section 120 to generate a voltage at the MHD electrodes 105 that is applied across the load 106. Referring to FIGS. 4A and 4B, the MHD electrodes are shown as 17. The electrodes 2 of FIGS. 3 and 4A and 4B may also serve as MHD electrodes with a suitably applied magnetic field in the direction transverse to the axis connecting the electrodes 2 and the direction of plasma expansion. The radial magnetic field due to the current along the electrodes 2 from source of electrical power 4 may provide the Lorentzian deflection. Magnetohydrodynamic generation is described by Walsh [E. M. Walsh, Energy Conversion Electromechanical, Direct, Nuclear, Ronald Press Company, NY, NY, (1967), pp. 221-248] the complete disclosure of which is incorporated herein by reference.

The electromagnet(s) 110 (FIG. 6) and 6f (FIGS. 4A and 4B) may be at least one of permanent magnets such as Halbach array magnets, and uncooled, water cooled, and superconducting electromagnets with a corresponding cryogenic management. The superconducting magnet system 6f shown in FIGS. 4A and 4B comprises (i) superconducting coils 6b that may comprise superconductor wire windings of NbTi or NbSn, or a high temperature superconductor (HTS) such as $YBa_2Cu_3O_7$, commonly referred to as YBCO-123 or simply YBCO, (ii) a liquid helium dewar providing liquid helium 6c on both sides of the coils 6b, (iii) liquid nitrogen dewars with liquid nitrogen 6*d* on the inner and outer radii of the solenoidal magnet wherein both the liquid helium and liquid nitrogen dewars may comprise radiation baffles and radiation shields that may be comprise copper and high vacuum insulation 6*e* at the walls, and (iv) an inlet 6*g* for each magnet 6*f* that may have attached a cyropump and compressor that may be powered by the power output of the SF-CIHT cell power generator through output power terminal 9.

The MHD electrodes 105 of FIG. 6 or a protective barrier to the MHD electrodes 105 may comprise an outer layer of a refractory material, a material that is a component of the solid fuel, and carbon such that MHD electrode or barrier corrosion products may not become significantly detrimental contaminants of the solid fuel or energetic material. The plasma to electric converter such as a MHD converter may further comprise a MHD heat exchanger 135 that receives coolant through the MHD coolant inlet 130 and removes power that is in the form of heat through the MHD coolant outlet 140 such as power contained in the expanding plasma that is not 100% converted to electricity. The heat exchanger 135 may be of the coil-type as shown in FIG. 6, a water-wall type, or another type as known by those skilled in the art. Referring to FIGS. 4A and 4B, the MHD heat exchanger 18 receives coolant through the MHD coolant inlet 19 and removes power that is in the form of heat through the MHD coolant outlet 20. This thermal power may be combined with that from electrode heat exchanger 10 that flows out electrode coolant outlet line 12. The heat may be applied to at least one of supplying a thermal load, the regeneration of the solid fuel by regeneration system 14 of FIGS. 3 and 4A and 4B, and conversion to mechanical or electrical power by systems and methods of the present disclosure.

In one embodiment, the magnetohydrodynamic power converter is a segmented Faraday generator. In another embodiment, the transverse current formed by the Lorentzian deflection of the ion flow undergoes further Lorentzian deflection in the direction parallel to the input flow of ions (z-axis) to produce a Hall voltage between at least a first MHD electrode and a second MHD electrode relatively displaced along the z-axis. Such a device is known in the art as a Hall generator embodiment of a magnetohydrodynamic power converter. A similar device with MHD electrodes angled with respect to the z-axis in the xy-plane comprises another embodiment of the present invention and is called a diagonal generator with a "window frame" construction. In each case, the voltage may drive a current through an electrical load. Embodiments of a segmented Faraday generator, Hall generator, and diagonal generator are given in Petrick [J. F. Louis, V. I. Kovbasyuk, Open-cycle Magnetohydrodynamic Electrical Power Generation, M Petrick, and B. Ya Shumyatsky, Editors, Argonne National Laboratory, Argonne, Illinois, (1978), pp. 157-163] the complete disclosure of which is incorporated by reference.

In a further embodiment of the magnetohydrodynamic power converter, the flow of ions along the z-axis with $v_\parallel >> v_\equiv$ may then enter a compression section comprising an increasing axial magnetic field gradient wherein the component of electron motion parallel to the direction of the z-axis $v_\parallel$ is at least partially converted into to perpendicular motion $v_\equiv$ due to the adiabatic invariant. An azimuthal current due to $v_\equiv$ is formed around the z-axis. The current is deflected radially in the plane of motion by the axial magnetic field to produce a Hall voltage between an inner ring and an outer ring MHD electrode of a disk generator magnetohydrodynamic power converter. The voltage may drive a current through an electrical load. The plasma power may also be converted to electricity using $\vec{E} \times \vec{B}$ direct converter 10 or other plasma to electricity devices of the present disclosure.

In an embodiment having time varying current such as alternating current (AC) supplied to the electrodes 2 by power supply 4 and the power system further comprises a plasma to electric power converter comprising a DC magnetic field such a magnetohydrodynamic or plasmadynamic, the time varying magnetic field due to the time varying current from source 4 may be shielded from the DC magnetic field of the plasma to electric power converter by a magnetic shield such as a mu-metal shield. The plasma may expand out from the time varying magnetic field region through a penetration in the magnetic shield to the DC field region where the power conversion may occur. Suitable magnetic shields are ones known to those skilled in the art. In an embodiment having a substantially DC source of electrical current from source 4, the substantially DC magnetic field may be exploited for at least one purpose of plasma confinement for a converter such as a PDC converter, plasma to electric conversion via PDC conversion with suitably aligned PDC electrodes, and for controlling the directionality of plasma flow. For example, the field may cause the plasma to flow substantially linearly. The linear flow may be through a MHD plasma to electric converter. Alternatively, the DC magnetic field may be shielded from a region having another desired magnetic field by a magnetic shield. The plasma may flow through a penetration in the magnetic shield to the region having the another magnetic field.

Each cell also outputs thermal power that may be extracted from the electrode heat exchanger 10 by inlet and out coolant lines 11 and 12, respectively, and the MHD heat exchanger 18 by inlet and outlet coolant lines 19 and 20, respectively. The thermal power may be used as heat directly or converted to electricity. In embodiments, the power system further comprises a thermal to electric converter. The conversion may be achieved using a conventional Rankine or Brayton power plant such as a steam plant comprising a boiler, steam turbine, and a generator or one comprising a gas turbine such as an externally heated gas turbine and a generator. Suitable reactants, regeneration reaction and systems, and power plants may comprise those of the present disclosure, in my prior US patent applications such as Hydrogen Catalyst Reactor, PCT/US08/61455, filed PCT Apr. 24, 2008; Heterogeneous Hydrogen Catalyst Reactor, PCT/US09/052072, filed PCT Jul. 29, 2009; Heterogeneous Hydrogen Catalyst Power System, PCT/US10/27828, PCT filed Mar. 18, 2010; Electrochemical Hydrogen Catalyst Power System, PCT/US11/28889, filed PCT Mar. 17, 2011; H₂O-Based Electrochemical Hydrogen-Catalyst Power System, PCT/US12/31369 filed Mar. 30, 2012, and CIHT Power System, PCT/US13/041938 filed May 21, 2013 ("Mills Prior Applications") and in my prior publications such as R. L. Mills, M. Nansteel, W. Good, G. Zhao, "Design for a BlackLight Power Multi-Cell Thermally Coupled Reactor Based on Hydrogen Catalyst Systems," Int. J. Energy Research, Vol. 36, (2012), 778-788; doi: 10.1002/er.1834; R. L. Mills, G. Zhao, W. Good, "Continuous Thermal Power System," Applied Energy, Vol. 88, (2011) 789-798, doi: 10.1016/j.apenergy.2010.08.024, and R. L. Mills, G. Zhao, K. Akhtar, Z. Chang, J. He, X. Hu, G. Wu, J. Lotoski, G. Chu, "Thermally Reversible Hydrino Catalyst Systems as a New Power Source," Int. J. Green Energy, Vol. 8, (2011), 429-473 ("Mills Prior Thermal Power Conversion Publications") herein incorporated by reference in their entirety. In other embodiments, the power system comprises one of other thermal to electric power converters known to those skilled in the art such as direct power converters such as thermionic and thermoelectric power converters and other heat engines such as Stirling engines.

In an exemplary embodiment, the SF-CIHT cell power generator outputs 10 MW of continuous power in a desired waveform such as DC or 120 V 60 Hz AC as well as thermal power. The solid fuel may comprise a metal such as one of the group of Cu, Ni, Pb, Sb, Bi, Co, Cd, Ge, Au, Ir, Fe, Hg, Mo, Os, Pd, Re, Rh, Ru, Se, Ag, Tc, Te, Ti, Sn, W, Al, V, Zr, Ti, Mn, Zn, Cr, and In that may not be oxidized by $H_2O$ during ignition and plasma expansion in a vacuum. In another embodiment, the solid fuel may comprise a metal such as Ag whose oxide AgO is capable of being reduced by heating in vacuum. Alternatively, the solid fuel may comprise a metal such as Cu whose oxide CuO is capable of being reduced with heating in a hydrogen atmosphere. Consider the case that the solid fuel comprises Cu+CuO+ $H_2O$. In an embodiment, the plasma is formed under vacuum such that the Cu metal does not oxidize. Then, regeneration of the fuel following ignition only requires the addition of $H_2O$ to make up that lost to form hydrinos wherein the energy of $H_2O$ to $H_2(\frac{1}{4})$ and $\frac{1}{2}O_2$ is 50 MJ/mole $H_2O$. Thus, the reaction product is rehydrated with 0.2 moles of $H_2O$/s. In the event that the Cu is oxidized, an exemplary mass flow rate of CuO is about 50 g CuO/s corresponding to 200 kJ/g to produce 10 MJ/s or 10 kJ/ms. The CuO may be reduced with 0.625 moles $H_2$/s that may be produced by electrolysis of $H_2O$ using an electrolyzer. This requires about 178 kW of electrical power that is returned as heat during the cycle. In another embodiment, $Cu_2O$ replaces CuO so that Cu does not react with CuO to form $Cu_2O$. If Ag is used as the metal of the solid fuel, then no $H_2$ is necessary for reduction of AgO to the metal Ag, only heat that is returned during each cycle.

The ignition of the solid fuel to form hydrinos at very high rate is initiated by a 20 kA power source at a repetition rate of 0.2 kHz. The power source may be a commercial welder source such as the Miyachi ISA-500CR/IT-1320-3 or ISA-1000CR/IT-1400-3. The volume of the transformer of the Miyachi ISA-500CR/IT-1320-3 unit is 34 liters, and it could be miniaturized further by means such as operating its transformer at a higher frequency. The power controller volume must also be considered, but it is expected that the control electronics can be miniaturized such that the transformer displacement is limiting. This power source may also at least partially serve as the output power conditioner. Moreover, once the system is initiated, a small portion such as 1% of the electrical output of the SF-CIHT cell power generator such as that of the MHD or PDC converter may be sufficient to maintain the fuel ignition. Thus, the high current power source to initiate the fuel may be essentially the cell SF-CIHT cell and power converter having their respective volume contribution to the scale of the SF-CIHT cell power generator. A charged supercapacitor having a volume of about 1 liter could be used to start the unit. In another embodiment, the ignition power source as well as the startup power source comprises at least one capacitor such as a bank of low voltage, high capacitance capacitors that supply the low voltage, high current necessary to achieve ignition. The corresponding volume of the capacitors may be low such as 1.5 liters. The generator power output may be low voltage DC such that little or no power conditioning is required. The former may be achieved using a DC/DC converter.

Consider the exemplary case of interdigitating, 60-teeth gears such as ceramic gears that are metalized on the surfaces that contact fuel during ignition. While operating at 200 RPMs, the corresponding ignition rate is 0.2 kHz or 5 ms per ignition. A SF-CIHT cell having this ignition system would have a displacement of about 2 liters. Considering that the MHIHD volumetric conversion density of RLN2 is 700 MW/m$^3$ [Yoshihiro Okuno, "Research activities on MHD power generation at Tokyo Institute of Technology", Tokyo Institute of Technology, 19 Dec. 2013, http://vips.es. titech.ac.jp/pdf/090325-meeting/Okuno.pdf] and given the orders of magnitude higher ion density and supersonic particle velocities of the hydrino driven plasma, the conversion density should be at least 10 GW/m$^3$ or 107 W/liter of MHD displacement. The power of the exemplary SF-CIHT cell power generator is 107 W; so, an estimated MHD converter volume is 1 liter. The superconducting magnets and the dewar/cryogenic management system may displace another 6 liters. Lastly, the product recovery and regeneration systems are expected to displace least about 2 liters, but the displacement could be higher, more like 20 liters, if the regeneration requires $H_2$ reduction.

Consider a system comprising (1) a capacitor-based source of power to the electrodes of 20 kA at a repetition rate of 0.2 kHz that also serves as the startup power source and has a displacement of about 1.5 liters, (2) a small portion of the electrical output of the SF-CIHT cell power generator such as that of the MHD or PDC converter is sufficient to maintain the fuel ignition, (3) a SF-CIHT cell having a displacement of about 2 liters with an ignition system comprising interdigitating, 60-teeth gears operating at 200 RPMs, (4) a MHD converter having two sections with a conservative displacement of 2 liters wherein the superconducting magnets and the cryogenic management system displaces three times this volume, another 6 liters, (5) a product recovery and regeneration system having a displacement of about 2 liters wherein the product is rehydrated to the reactants, and (6) a direct DC output from the MHD converter. The total volume of the 10 MW system in this exemplary embodiment is 1.5+2+2+6+2=13.5 liters (about 24 cm×24 cm×24 cm or about 9.4 inches×9.4 inches×9.4 inches).

In an embodiment, the SF-CIHT cell power generator may serve as a modular unit of a plurality of SF-CIHT cell power generators. The modular units may be connected in parallel, series, or parallel and series to increase the voltage, current, and power to a desired output. In an embodiment, a plurality of modular units may provide power to replace central grid power systems. For example, a plurality of units of 1 MW to 10 MW electric may replace power generation at the substation or central power station. SF-CIHT cell power generators may be interconnected with each other and other power conditioning and storage systems and power infrastructure such as that of the electrical utility grid using systems and methods known to those skilled in the art.

G. Applications

The SF-CIHT cell may be used to replace conventional electrical power sources with the advantage of being autonomous of the grid and fossil fuels infrastructure. Typical exemplary general applications are heating (both space and process heating), electrical power such as residential, commercial, and industrial, motive such as electric automobiles, trucks, and trains, marine such as electric ships and submarines, aviation such as electric planes and helicopters, and aerospace such as electric satellites. Specific exemplary applications are home and business electrification, lighting, electric vehicles, $H_2$ production through electrolysis of $H_2O$, truck refrigeration, telecommunications repeaters, salt water desalination, remote mining and smelting, electric heating such as home and business heating, powering household appliances such as an alarm system, a refrigerator/freezer, a dishwasher, an oven, a washer/dryer, a lawn mover, a hedge trimmer, a snow blower and consumer electronics such as a personal computer, a TV, a stereo, and a video player. The SF-CIHT cells of appropriate variable sizes may be dedicated power sources for certain appliances such as a heater, a washer/dryer, or an air conditioner.

Figure 7:
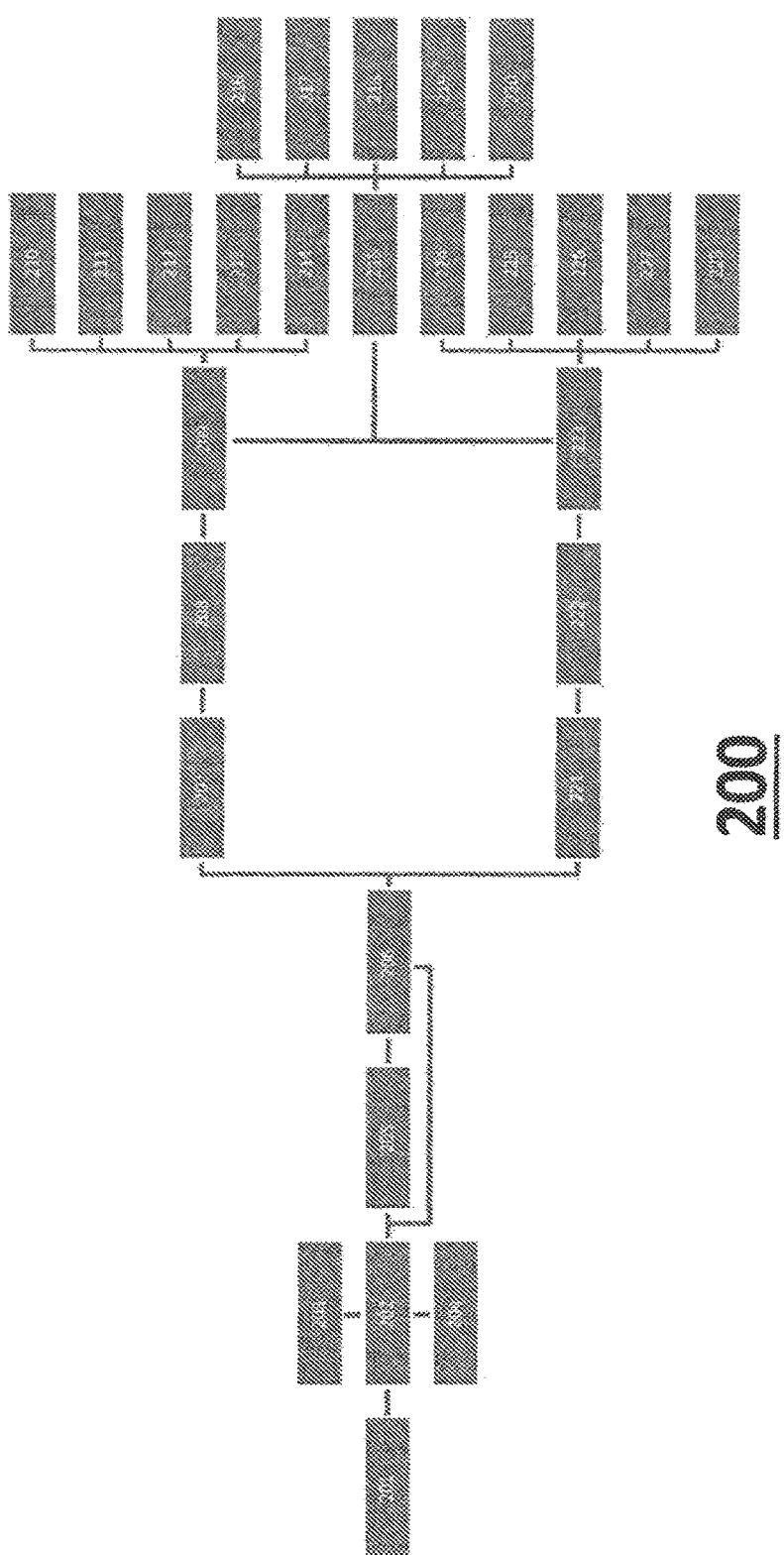
FIG. 7 is a schematic drawing of systems integration for electrical SF-CIHT cell applications in accordance with an embodiment of the present disclosure.

A vast number of power applications can be realized by a SF-CIHT cell that outputs at least one of AC and DC power to a corresponding load. A schematic drawing of systems integration for electrical SF-CIHT cell applications 200 is shown in FIG. 7. In an embodiment, the SF-CIHT cell 202 is controlled by SF-CIHT cell controller 201. The SF-CIHT cell receives $H_2O$ from a source 204, adds the $H_2O$ to the regenerating fuel and converts the H to hydrino with a very large release of power that is converted to electricity. Any byproduct heat may be delivered to a thermal load or removed as waste heat by a thermal cooling system 203. The output electrical power may be stored in a power storage means 205 such as a battery or supercapacitor and may then flow to a power distribution center 206. Alternatively, the output electricity may flow directly to the power distribution center 206. In an embodiment having DC output from plasma to electric converter such as a MHD or PDC converter, the electrical power is then condition from DC to AC by a DC/AC converter 207 or it modified to another form of DC power by a DC/DC converter 221. Thereafter, the conditioned AC or DC power flows into the AC 208 or DC 222 power controller and AC 209 or DC 223 power load, respectively. Exemplary mechanical loads powered by an AC or DC motor 215 are appliances 216, wheels 217 such as in motive power applications such as motorcycles, scooters, golf carts, cars, trucks, trains, tractors, and bulldozers and other excavation machinery, aviation electropropellers or electrofans 218 such as in aircraft, marine propellers 219 such as in ships and submarines, and rotating shaft machinery 220. Alternative exemplary AC loads comprise AC telecommunications 210, AC appliances 211, AC electronics 212, AC lighting 213, and AC space and process conditioning 214 such as heating and air conditioning. The corresponding suitable exemplary DC loads comprise DC telecommunications 224 such as data centers, DC appliances 225, DC electronics 226, DC lighting 227, and DC space and process conditioning 228 such as heating and air conditioning.

Figure 8:
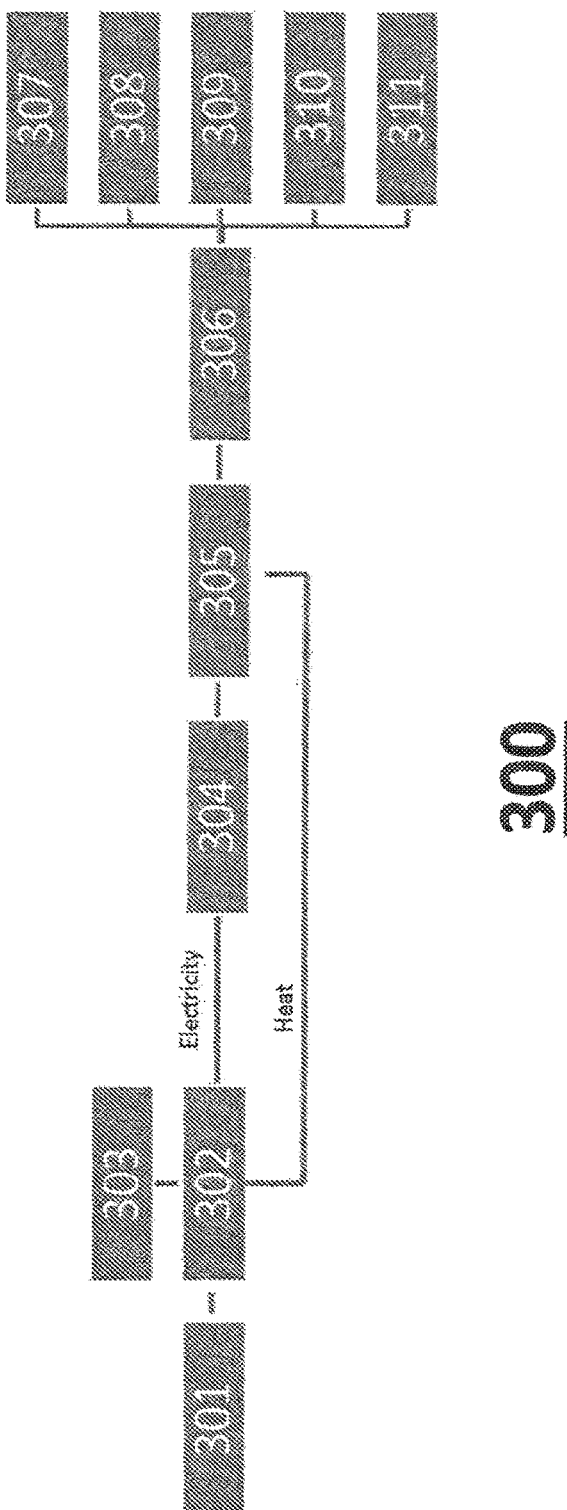
FIG. 8 is a schematic drawing of systems integration for thermal and hybrid electrical-thermal SF-CIHT cell applications in accordance with an embodiment of the present disclosure.

A vast number of power applications can be realized by a SF-CIHT cell that uses at least one of the electrical and thermal power derived from the conversion of the H from a source such as from $H_2O$ to hydrino, and outputs mechanical power in the form of a spinning shaft. A schematic drawing of systems integration for thermal and hybrid electrical-thermal SF-CIHT cell applications 300 is shown in FIG. 8. In an embodiment, the SF-CIHT cell 302 is controlled by SF-CIHT cell controller 301. The SF-CIHT cell 302 receives $H_2O$ from a source 303, adds the $H_2O$ to the regenerating fuel and converts the H to hydrino with a very large release of plasma power that may be directly converted to electricity using a plasma to electric converter, indirectly converted to electricity using a thermal to electric converter, or thermal power may be output directly. The electricity may flow to an electric heater 304 that may heat an external heat exchanger 305. Alternatively, heat may flow directly from the SF-CIHT cell 302 to the external heat exchanger 305. A working gas such as air flows into an unfired turbine 306 and is heated by the hot external heat exchanger 305; thereby, it receives thermal power from the SF-CIHT cell 302. The heated working gas performs pressure-volume work on the blades of the unfired turbine 306 and causes its shaft to spin. The spinning shaft may drive a plurality of types of mechanical loads. Suitable exemplary mechanical loads comprise wheels 307 such as in motive power applications, an electrical generator 308 such as in electric power generation, aviation electropropellers or electrofans 309 such as in aircraft, marine propellers 310 such as in ships and submarines, and rotating shaft machinery 311. The electrical power from the electrical generator 308 may be used for other applications such as electrical motive power and stationary electrical power. These and other applications may be achieved using the integrated systems or a portion of the integrated systems shown in FIG. 7.

In an embodiment, the electrical power from the SF-CIHT cell is used to power an antennae in a desired frequency band that may be received by an antennae capable of receiving the transmitted power. The power may be used to operate an electronics device such as a cellular telephone of a personal computer or entertainment system such as an MP3 player or a video player. In another embodiment, the receiving antennae may collect transmitted power and charge a battery to operate the electronics device.

The present disclosure is further directed to a battery or fuel cell system that generates an electromotive force (EMF) from the catalytic reaction of hydrogen to lower energy (hydrino) states providing direct conversion of the energy released from the hydrino reaction into electricity, the system comprising:

reactants that constitute hydrino reactants during cell operation with separate electron flow and ion mass transport, a cathode compartment comprising a cathode, an anode compartment comprising an anode, and a source of hydrogen.

Other embodiments of the present disclosure are directed to a battery or fuel cell system that generates an electromotive force (EMF) from the catalytic reaction of hydrogen to lower energy (hydrino) states providing direct conversion of the energy released from the hydrino reaction into electricity, the system comprising at least two components chosen from: a catalyst or a source of catalyst; atomic hydrogen or a source of atomic hydrogen; reactants to form the catalyst or source of catalyst and atomic hydrogen or source of atomic hydrogen; one or more reactants to initiate the catalysis of atomic hydrogen; and a support to enable the catalysis, wherein the battery or fuel cell system for forming hydrinos can further comprise a cathode compartment comprising a cathode, an anode compartment comprising an anode, optionally a salt bridge, reactants that constitute hydrino reactants during cell operation with separate electron flow and ion mass transport, and a source of hydrogen.

In an embodiment of the present disclosure, the reaction mixtures and reactions to initiate the hydrino reaction such as the exchange reactions of the present disclosure are the basis of a fuel cell wherein electrical power is developed by the reaction of hydrogen to form hydrinos. Due to oxidation-reduction cell half reactions, the hydrino-producing reaction mixture is constituted with the migration of electrons through an external circuit and ion mass transport through a separate path to complete an electrical circuit. The overall reactions and corresponding reaction mixtures that produce hydrinos given by the sum of the half-cell reactions may comprise the reaction types for thermal power and hydrino chemical production of the present disclosure.

In an embodiment of the present disclosure, different reactants or the same reactants under different states or conditions such as at least one of different temperature, pressure, and concentration are provided in different cell compartments that are connected by separate conduits for electrons and ions to complete an electrical circuit between the compartments. The potential and electrical power gain between electrodes of the separate compartments or thermal gain of the system is generated due to the dependence of the hydrino reaction on mass flow from one compartment to another. The mass flow provides at least one of the formation of the reaction mixture that reacts to produce hydrinos and the conditions that permit the hydrino reaction to occur at substantial rates. Ideally, the hydrino reaction does not occur or doesn't occur at an appreciable rate in the absence of the electron flow and ion mass transport.

In another embodiment, the cell produces at least one of electrical and thermal power gain over that of an applied electrolysis power through the electrodes.

In an embodiment, the reactants to form hydrinos are at least one of thermally regenerative or electrolytically regenerative.

An embodiment of the present disclosure is directed to an electrochemical power system that generates an electromotive force (EMF) and thermal energy comprising a cathode, an anode, and reactants that constitute hydrino reactants during cell operation with separate electron flow and ion mass transport, comprising at least two components chosen from: (a) a source of catalyst or a catalyst comprising at least one of the group of nH, OH, OH–, $H_2O$, $H_2S$, or $MNH_2$ wherein n is an integer and M is alkali metal; (b) a source of atomic hydrogen or atomic hydrogen; (c) reactants to form at least one of the source of catalyst, the catalyst, the source of atomic hydrogen, and the atomic hydrogen; one or more reactants to initiate the catalysis of atomic hydrogen; and a support. At least one of the following conditions may occur in the electrochemical power system: (a) atomic hydrogen and the hydrogen catalyst is formed by a reaction of the reaction mixture; (b) one reactant that by virtue of it undergoing a reaction causes the catalysis to be active; and (c) the reaction to cause the catalysis reaction comprises a reaction chosen from: (i) exothermic reactions; (ii) coupled reactions; (iii) free radical reactions; (iv) oxidation-reduction reactions; (v) exchange reactions, and (vi) getter, support, or matrix-assisted catalysis reactions. In an embodiment, at least one of (a) different reactants or (b) the same reactants under different states or conditions are provided in different cell compartments that are connected by separate conduits for electrons and ions to complete an electrical circuit between the compartments. At least one of an internal mass flow and an external electron flow may provide at least one of the following conditions to occur: (a) formation of the reaction mixture that reacts to produce hydrinos; and (b) formation of the conditions that permit the hydrino reaction to occur at substantial rates. In an embodiment, the reactants to form hydrinos are at least one of thermally or electrolytically regenerative. At least one of electrical and thermal energy output may be over that required to regenerate the reactants from the products.

Other embodiments of the present disclosure are directed to an electrochemical power system that generates an electromotive force (EMF) and thermal energy comprising a cathode; an anode, and reactants that constitute hydrino reactants during cell operation with separate electron flow and ion mass transport, comprising at least two components chosen from: (a) a source of catalyst or catalyst comprising at least one oxygen species chosen from $O_2$, $O_3$, O, $0^+$, H2O, $H_3O^+$, OH, $OH^+$, $OH^-$, HOOH, $OOH^-$, $O^-$, $O_2^-$, and that undergoes an oxidative reaction with a H species to form at least one of OH and $H_2O$, wherein the H species comprises at least one of $H_2$, H, $H^+$, $H_2O$, $H_3O^+$, OH, $OH^+$, $OH^-$, HOOH, and $OOH^-$; (b) a source of atomic hydrogen or atomic hydrogen; (c) reactants to form at least one of the source of catalyst, the catalyst, the source of atomic hydrogen, and the atomic hydrogen; and one or more reactants to initiate the catalysis of atomic hydrogen; and a support. The source of the O species may comprise at least one compound or admixture of compounds comprising O, $O_2$, air, oxides, NiO, CoO, alkali metal oxides, $Li_2O$, $Na_2O$, $K_2O$, alkaline earth metal oxides, MgO, CaO, SrO, and BaO, oxides from the group of Cu, Ni, Pb, Sb, Bi, Co, Cd, Ge, Au, Ir, Fe, Hg, Mo, Os, Pd, Re, Rh, Ru, Se, Ag, Tc, Te, Tl, Sn, and W, peroxides, alkali metal peroxides, superoxide, alkali or alkaline earth metal superoxides, hydroxides, alkali, alkaline earth, transition metal, inner transition metal, and Group III, IV, or V, hydroxides, oxyhydroxides, AlO(OH), ScO(OH), YO(OH), VO(OH), CrO(OH), MnO(OH) (—MnO(OH) groutite and —MnO(OH) manganite), FeO(OH), CoO(OH), NiO(OH), RhO(OH), GaO(OH), InO(OH), $Ni_{1/2}Co_{1/2}O$ (OH), and $Ni_{1/3}Co_{1/3}Mn_{1/3}O(OH)$. The source of the H species may comprise at least one compound or admixture of compounds comprising H, a metal hydride, $LaNi_5H_6$, hydroxide, oxyhydroxide, $H_2$, a source of $H_2$, $H_2$ and a hydrogen permeable membrane, $NiPt(H_2)$, $Ni(H_2)$, $V(H_2)$, $Ti(H_2)$, $Nb(H_2)$, $Pd(H_2)$, $PdAg(H_2)$, $Fe(H_2)$, and stainless steel (SS) such as 430 SS (H2).

In another embodiment, the electrochemical power system comprises a hydrogen anode; a molten salt electrolyte comprising a hydroxide, and at least one of an $O_2$ and a $H_2O$ cathode. The hydrogen anode may comprise at least one of a hydrogen permeable electrode such as at least one of $NiPt(H_2)$, $Ni(H_2)$, $V(H_2)$, $Ti(H_2)$, $Nb(H_2)$, $Pd(H_2)$, PdAg $(H_2)$, $Fe(H_2)$, and 430 $SS(H_2)$, a porous electrode that may sparge $H_2$, and a hydride such as a hydride chosen from R—Ni, $LaNi_5H_6$, $La_2Co_1Ni_9H_6$, $ZrCr_2H_{3.8}$, $LaNi_{3.55}Mn_{0.4}Al_{0.3}Co_{0.75}$, $ZrMn_{0.5}Cr_{0.2}V_{0.1}Ni_{1.2}$, and other alloys capable of storing hydrogen, $AB_5$ (LaCePrNdNiCoMnAl) or $AB_2$ (VTiZrNiCrCoMnAlSn) type, where the "$AB_x$" designation refers to the ratio of the A type elements (LaCePrNd or TiZr) to that of the B type elements (VNiCrCoMnAlSn), $AB_5$-type: $MmNi_{3.2}Co_{1.0}Mn_{0.6}Al_{0.11}Mo_{0.09}$ (Mm=misch metal: 25 wt % La, 50 wt % Ce, 7 wt % Pr, 18 wt % Nd), $AB_2$-type: $Ti_{0.51}Zr_{0.49}V_{0.70}Ni_{1.18}Cr_{0.12}$ alloys, magnesium-based alloys, $Mg_{1.9}Al_{0.1}Ni_{0.8}Co_{0.1}Mn_{0.1}$ alloy, $Mg_{0.72}Sc_{0.28}(Pd_{0.012}+Rh_{0.012})$, and $Mg_{80}Ti_{20}$, $Mg_{80}V_{20}$, $La_{0.8}Nd_{0.2}Ni_{2.4}Co_{2.5}Si_{0.1}$, $LaNi_{5-x}M_x$ (M=Mn, Al), (M=Al, Si, Cu), (M=Sn), (M=Al, Mn, Cu) and $LaNi_4Co$, $MmNi_{3.55}Mn_{0.44}Al_{0.3}Co_{0.75}$, $LaNi_{3.55}Mn_{0.44}Al_{0.3}Co_{0.75}$, $MgCu_2$, $MgZn_2$, $MgNi_2$, AB compounds, TiFe, TiCo, and TiNi, $AB_n$ compounds (n=5, 2, or 1), $AB_{3-4}$ compounds, ABx (A=La, Ce, Mn, Mg; B=Ni, Mn, Co, Al), $ZrFe_2$, $Zr_{0.5}Cs_{0.5}Fe_2$, $Zr_{0.8}Sc_{0.2}Fe_2$, $YNi_5$, $LaNi_5$, $LaNi_{4.5}Co_{0.5}$, (Ce, La, Nd, Pr)$Ni_5$, Mischmetal-nickel alloy, $Ti_{0.98}Zr_{0.02}V_{0.43}Fe_{0.09}Cr_{0.05}Mn_{1.5}$, $La_2CoiNi_9$, FeNi, and $TiMn_2$. The molten salt may comprise a hydroxide with at least one other salt such as one chosen from one or more other hydroxides, halides, nitrates, sulfates, carbonates, and phosphates. The molten salt may comprise at least one salt mixture chosen from $CsNO_3$—CsOH, CsOH—KOH, CsOH—LiOH, CsOH—NaOH, CsOH—RbOH, $K_2CO_3$—KOH, KBr—KOH, KCl—KOH, KF—KOH, KI—KOH, $KNO_3$—KOH, KOH—$K_2SO_4$, KOH—LiOH, KOH—NaOH, KOH—RbOH, $Li_2CO_3$—LiOH, LiBr—LiOH, LiCl—LiGH, LiF—LiOH, LiI—LiOH, $LiNO_3$—LiOH, LiOH—NaOH, LiOH—RbOH, $Na_2CO_3$—NaOH, NaBr—NaOH, NaCl—NaOH, NaF—NaOH, NaI—NaOH, $NaNO_3$—NaOH, NaOH—$Na_2SO_4$, NaOH—RbOH, RbCl—RbOH, $RbNO_3$—RbOH, LiOH—LiX, NaOH—NaX, KOH—KX, RbOH—RbX, CsOH—CsX, $Mg(OH)_2$—$MgX_2$, $Ca(OH)_2$—$CaX_2$, $Sr(OH)_2$—$SrX_2$, or $Ba(OH)_2$—$BaX_2$ wherein X=F, Cl, Br, or I, and LiGH, NaOH, KOH, RbOH, CsOH, $Mg(OH)_2$, $Ca(OH)_2$, $Sr(OH)_2$, or $Ba(OH)_2$ and one or more of $AlX_3$, $VX_2$, $ZrX_2$, $TiX_3$, $MnX_2$, $ZnX_2$, $CrX_2$, $SnX_2$, $InX_3$, $CuX_2$, $NiX_2$, $PbX_2$, $SbX_3$, $BiX_3$, $CoX_2$, $CdX_2$, $GeX_3$, $AUX_3$, $IrX_3$, $FeX_3$, $HgX_2$, $MoX_4$, $OsX_4$, $PdX_2$, $ReX_3$, $RhX_3$, $RUX_3$, $SeX_2$, $AgX_2$, $TcX_4$, $TeX_4$, TIX, and $WX_4$ wherein X=F, Cl, Br, or I. The molten salt may comprise a cation that is common to the anions of the salt mixture electrolyte; or the anion is common to the cations, and the hydroxide is stable to the other salts of the mixture.

In another embodiment of the disclosure, the electrochemical power system comprises at least one of [M"($H_2$)/MOH-M'halide/M'"] and [M"($H_2$)/M(OH)$_2$-M'halide/M'"], wherein M is an alkali or alkaline earth metal, M' is a metal having hydroxides and oxides that are at least one of less stable than those of alkali or alkaline earth metals or have a low reactivity with water, M" is a hydrogen permeable metal, and M'" is a conductor. In an embodiment, M' is metal such as one chosen from Cu, Ni, Pb, Sb, Bi, Co, Cd, Ge, Au, Ir, Fe, Hg, Mo, Os, Pd, Re, Rh, Ru, Se, Ag, Tc, Te, Tl, Sn, W, Al, V, Zr, Ti, Mn, Zn, Cr, and In. Alternatively, M and M' may be metals such as ones independently chosen from Li, Na, K, Rb, Cs, Mg, Ca, Sr, Ba, Al, V, Zr, Ti, Mn, Zn, Cr, Sn, In, Cu, Ni, Pb, Sb, Bi, Co, Cd, Ge, Au, Ir, Fe, Hg, Mo, Os, Pd, Re, Rh, Ru, Se, Ag, Tc, Te, Tl, and W. Other exemplary systems comprise [M'($H_2$)/MOH M"X/M'"] wherein M, M', M", and M'" are metal cations or metal, X is an anion such as one chosen from hydroxides, halides, nitrates, sulfates, carbonates, and phosphates, and M' is $H_2$ permeable. In an embodiment, the hydrogen anode comprises a metal such as at least one chosen from V, Zr, Ti, Mn, Zn, Cr, Sn, In, Cu, Ni, Pb, Sb, Bi, Co, Cd, Ge, Au, Ir, Fe, Hg, Mo, Os, Pd, Re, Rh, Ru, Se, Ag, Tc, Te, Tl, and W that reacts with the electrolyte during discharge. In another embodiment, the electrochemical power system comprises a hydrogen source; a hydrogen anode capable of forming at least one of OH, OH⁻, and $H_2O$ catalyst, and providing H; a source of at least one of $O_2$ and $H_2O$; a cathode capable of reducing at least one of $H_2O$ or $O_2$; an alkaline electrolyte; an optional system capable of collection and recirculation of at least one of $H_2O$ vapor, $N_2$, and $O_2$, and a system to collect and recirculate $H_2$.

The present disclosure is further directed to an electrochemical power system comprising an anode comprising at least one of: a metal such as one chosen from V, Zr, Ti, Mn, Zn, Cr, Sn, In, Cu, Ni, Pb, Sb, Bi, Co, Cd, Ge, Au, Ir, Fe, Hg, Mo, Os, Pd, Re, Rh, Ru, Se, Ag, Tc, Te, Tl, and W and a metal hydride such as one chosen from R—Ni, $LaNi_5H_6$, $La_2Co_1Ni_9H_6$, $ZrCr_2H_{3.8}$, $LaNi_{3.55}Mn_{0.4}Al_{0.3}Co_{0.75}$, $ZrMn_{0.5}Cr_{0.2}V_{0.1}Ni_{1.2}$, and other alloys capable of storing hydrogen such as one chosen from $AB_5$ (LaCePrNdNiCoMnAl) or $AB_2$ (VTiZrNiCrCoMnAlSn) type, where the "$AB_x$" designation refers to the ratio of the A type elements (LaCePrNd or TiZr) to that of the B type elements (VNiCrCoMnAlSn), $AB_5$-type, $MmNi_{3.2}Co_{1.0}Mn_{0.6}Al_{0.11}Mo_{0.09}$ (Mm=misch metal: 25 wt % La, 50 wt % Ce, 7 wt % Pr, 18 wt % Nd), $AB_2$-type: $Ti_{0.51}Zr_{0.49}V_{0.70}Ni_{1.18}Cr_{0.12}$ alloys, magnesium-based alloys, $Mg_{1.9}Al_{0.1}Ni_{0.8}Co_{0.1}Mn_{0.1}$ alloy, $Mg_{0.72}Sc_{0.28}(Pd_{0.012}+Rh_{0.012})$, and $Mg_{80}Ti_{20}$, $Mg_{80}V_{20}$, $La_{0.8}Nd_{0.2}Ni_{2.4}Co_{2.5}Si_{0.1}$, $LaNi_{5-x}M_x$ (M=Mn, Al), (M=Al, Si, Cu), (M=Sn), (M=Al, Mn, Cu) and $LaNi_4Co$, $MmNi_{3.55}Mn_{0.44}Al_{0.3}Co_{0.75}$, $LaNi_{3.55}Mn_{0.44}Al_{0.3}Co_{0.75}$, $MgCu_2$, $MgZn_2$, $MgNi_2$, AB compounds, TiFe, TiCo, and TiNi, $AB_n$ compounds (n=5, 2, or 1), $AB_{3-4}$ compounds, ABx (A=La, Ce, Mn, Mg; B=Ni, Mn, Co, Al), $ZrFe_2$, $Zr_{0.5}Cs_{0.5}Fe_2$, $Zr_{0.8}Sc_{0.2}Fe_2$, $YNi_5$, $LaNi_5$, $LaNi_{4.5}Co_{0.5}$, (Ce, La, Nd, Pr)$Ni_5$, Mischmetal-nickel alloy, $Ti_{0.98}Zr_{0.02}V_{0.43}Fe_{0.09}Cr_{0.05}Mn_{1.5}$, $La_2CoiNi_9$, FeNi, and $TiMn_2$; a separator; an aqueous alkaline electrolyte; at least one of a 02 and a $H_2O$ reduction cathode, and at least one of air and $O_2$. The electrochemical system may further comprise an electrolysis system that intermittently charges and discharges the cell such that there is a gain in the net energy balance. Alternatively, the electrochemical power system may comprise or further comprise a hydrogenation system that regenerates the power system by rehydriding the hydride anode.

Another embodiment comprises an electrochemical power system that generates an electromotive force (EMF) and thermal energy comprising a molten alkali metal anode; beta-alumina solid electrolyte (BASE), and a molten salt cathode comprising a hydroxide. The molten salt cathode may comprise a eutectic mixture such as one of those of TABLE 4 and a source of hydrogen such as a hydrogen permeable membrane and $H_2$ gas. The catalyst or the source of catalyst may be chosen from OH, OH–, $H_2O$, NaH, Li, K, Rb⁺, and Cs. The molten salt cathode may comprise an alkali hydroxide. The system may further comprise a hydrogen reactor and metal-hydroxide separator wherein the alkali metal cathode and the alkali hydroxide cathode are regenerated by hydrogenation of product oxide and separation of the resulting alkali metal and metal hydroxide.

Another embodiment of the electrochemical power system comprises an anode comprising a source of hydrogen such as one chosen from a hydrogen permeable membrane and $H_2$ gas and a hydride further comprising a molten hydroxide; beta-alumina solid electrolyte (BASE), and a cathode comprising at least one of a molten element and a molten halide salt or mixture. Suitable cathodes comprise a molten element cathode comprising one of In, Ga, Te, Pb, Sn, Cd, Hg, P, S, I, Se, Bi, and As. Alternatively, the cathode may be a molten salt cathode comprising NaX (X is halide) and one or more of the group of NaX, AgX, $AlX_3$, $AsX_3$, AuX, $AuX_3$, $BaX_2$, $BeX_2$, $BiX_3$, $CaX_2$, $CdX_3$, $CeX_3$, $CoX_2$, $CrX_2$, CsX, CuX, $CuX_2$, $EuX_3$, $FeX_2$, $FeX_3$, $GaX_3$, $GdX_3$, $GeX_4$, $HfX_4$, HgX, $HgX_2$, InX, $InX_2$, $InX_3$, IrX, $IrX_2$, KX, $KAgX_2$, $KAlX_4$, $K_3AlX_6$, $LaX_3$, LiX, $MgX_2$, $MnX_2$, $MoX_4$, $MoX_5$, $MoX_6$, $NaAlX_4$, $Na_3AlX_6$, $NbX_5$, $NdX_3$, $NiX_2$, $OsX_3$, $OsX_4$, $PbX_2$, $PdX_2$, $PrX_3$, $PtX_2$, $PtX_4$, $PuX_3$, RbX, $ReX_3$, RhX, $RhX_3$, $RuX_3$, $SbX_3$, $SbX_5$, $ScX_3$, $SiX_4$, $SnX_2$, $SnX_4$, $SrX_2$, $ThX_4$, $TiX_2$, $TiX_3$, TlX, $UX_3$, $UX_4$, $VX_4$, $WX_6$, $YX_3$, $ZnX_2$, and $ZrX_4$.

Another embodiment of an electrochemical power system that generates an electromotive force (EMF) and thermal energy comprises an anode comprising Li; an electrolyte comprising an organic solvent and at least one of an inorganic Li electrolyte and $LiPF_6$; an olefin separator, and a cathode comprising at least one of an oxyhydroxide, AlO(OH), ScO(OH), YO(OH), VO(OH), CrO(OH), MnO(OH) (α-MnO(OH) groutite and γ-MnO(OH) manganite), FeO(OH), CoO(OH), NiO(OH), RhO(OH), GaO(OH), InO(OH), $Ni_{1/2}Co_{1/2}O(OH)$, and $Ni_{1/3}Co_{1/3}Mn_{1/3}O(OH)$.

In another embodiment, the electrochemical power system comprises an anode comprising at least one of Li, a lithium alloy, $Li_3Mg$, and a species of the Li—N—H system; a molten salt electrolyte, and a hydrogen cathode comprising at least one of $H_2$ gas and a porous cathode, $H_2$ and a hydrogen permeable membrane, and one of a metal hydride, alkali, alkaline earth, transition metal, inner transition metal, and rare earth hydride.

The present disclosure is further directed to an electrochemical power system comprising at least one of the cells (a) through (h) comprising:

(a) (i) an anode comprising a hydrogen permeable metal and hydrogen gas such as one chosen from $NiPt(H_2)$, $Ni(H_2)$, $V(H_2)$, $Ti(H_2)$, $Fe(H_2)$, $Nb(H_2)$ or a metal hydride such as one chosen from $LaNi_5H_6$, $TiMn_2H_x$, and $La_2Ni_9CoH_6$ (x is an integer); (ii) a molten electrolyte such as one chosen from MOH or $M(OH)_2$, or MOH or $M(OH)_2$ with M'X or $M'X_2$ wherein M and M' are metals such as ones independently chosen from Li, Na, K, Rb, Cs, Mg, Ca, Sr, and Ba, and X is an anion such as one chosen from hydroxides, halides, sulfates, and carbonates, and (iii) a cathode comprising the metal that may be the same as that of the anode and further comprising air or $O_2$;

(b)(i) an anode comprising at least one metal such as one chosen from R—Ni, Cu, Ni, Pb, Sb, Bi, Co, Cd, Ge, Au, Ir, Fe, Hg, Mo, Os, Pd, Re, Rh, Ru, Se, Ag, Tc, Te, Tl, Sn, W, Al, V, Zr, Ti, Mn, Zn, Cr, and In; (ii) an electrolyte comprising an aqueous alkali hydroxide having the concentration range of about 10 M to saturated; (iii) an olefin separator, and (iv) a carbon cathode and further comprising air or $O_2$;

(c) (i) an anode comprising molten NaOH and a hydrogen permeable membrane such as Ni and hydrogen gas; (ii) an electrolyte comprising beta alumina solid electrolyte (BASE), and (iii) a cathode comprising a molten eutectic salt such as $NaCl$—$MgCl_2$, $NaCl$—$CaCl_2$), or $MX$-$M'X_2'$ (M is alkali, M' is alkaline earth, and X and X' are halide);

(d) (i) an anode comprising molten Na; (ii) an electrolyte comprising beta alumina solid electrolyte (BASE), and (iii) a cathode comprising molten NaOH;

(e) (i) an anode comprising an hydride such as $LaNi_5H_6$; (ii) an electrolyte comprising an aqueous alkali hydroxide having the concentration range of about 10 M to saturated; (iii) an olefin separator, and (iv) a carbon cathode and further comprising air or $O_2$;

(f) (i) an anode comprising Li; (ii) an olefin separator; (ii) an organic electrolyte such as one comprising LP30 and $LiPF_6$, and (iv) a cathode comprising an oxyhydroxide such as CoO(OH);

(g) (i) an anode comprising a lithium alloy such as $Li_3Mg$; (ii) a molten salt electrolyte such as $LiCl$—$KCl$ or $MX$-$M'X'$ (M and M' are alkali, X and X' are halide), and (iii) a cathode comprising a metal hydride such as one chosen from $CeH_2$, $LaH_2$, $ZrH_2$, and $TiH_2$, and further comprising carbon black, and (h) (i) an anode comprising Li; (ii) a molten salt electrolyte such as $LiCl$—$KCl$ or $MX$-$M'X'$ (M and M' are alkali, X and X' are halide), and (iii) a cathode comprising a metal hydride such as one chosen from $CeH_2$, $LaH_2$, $ZrH_2$, and $TiH_2$, and further comprising carbon black.

The present disclosure is further directed to an electrochemical power system comprising at least one of the cells: $[Ni(H_2)/LiOH$—$LiBr/Ni]$ wherein the hydrogen electrode designated $Ni(H_2)$ comprises at least one of a permeation, sparging, and intermittent electrolysis source of hydrogen; $[PtTi/H_2SO_4$ (about 5 M aq) or $H_3PO_4$ (about 14.5 M aq)/PtTi] intermittent electrolysis, and $[NaOH$ $Ni(H_2)/$ BASE/NaCl $MgCl_2]$ wherein the hydrogen electrode designated $Ni(H_2)$ comprises a permeation source of hydrogen. In suitable embodiments, the hydrogen electrode comprises a metal such as nickel that is prepared to have a protective oxide coat such as NiO. The oxide coat may be formed by anodizing or oxidation in an oxidizing atmosphere such as one comprising oxygen.

The present disclosure is further directed to an electrochemical power system comprising at least one of the cells (a) through (d) comprising:

(a) (i) an anode comprising a hydrogen electrode designated $Ni(H_2)$ comprising at least one of a permeation, sparging, and intermittent electrolysis source of hydrogen; (ii) a molten electrolyte such as one chosen from MOH or $M(OH)_2$, or MOH or $M(OH)_2$ with M'X or $M'X_2$ wherein M and M' are metals such as ones independently chosen from Li, Na, K, Rb, Cs, Mg, Ca, Sr, and Ba, and X is an anion such as one chosen from hydroxides, halides, sulfates, and carbonates, and (iii) a cathode comprising the metal that may be the same as that of the anode and further comprising air or $O_2$;

(b) (i) an anode comprising a hydrogen electrode designated $Ni(H_2)$ comprises at least one of a permeation, sparging, and intermittent electrolysis source of hydrogen; (ii) a molten electrolyte such as $LiOH$—$LiBr$, $NaOH$—$NaBr$, or $NaOH$—$NaI$, and (iii) a cathode comprising the metal that may be the same as that of the anode and further comprising air or $O_2$;

(c) (i) an anode comprising a noble metal such as Pt/Ti; (ii) an aqueous acid electrolyte such as $H_2SO_4$ or $H_3PO_4$ that may be in the concentration range of 1 M to 10 M, and 5 M to 15 M, respectively, and (iii) a cathode comprising the metal that may be the same as that of the anode and further comprising air or $O_2$, and (d) (i) an anode comprising molten NaOH and a hydrogen electrode designated $Ni(H_2)$ comprising a permeation source of hydrogen; (ii) an electrolyte comprising beta alumina solid electrolyte (BASE), and (iii) a cathode comprising a molten eutectic salt such as $NaCl$—$MgCl_2$, $NaCl$—$CaCl_2$), or $MX$-$M'X2'$ (M is alkali, M' is alkaline earth, and X and X' are halide).

Further embodiments of the present disclosure are directed to catalyst systems such as those of the electrochemical cells comprising a hydrogen catalyst capable of causing atomic H in its n=1 state to form a lower-energy state, a source of atomic hydrogen, and other species capable of initiating and propagating the reaction to form lower-energy hydrogen. In certain embodiments, the present disclosure is directed to a reaction mixture comprising at least one source of atomic hydrogen and at least one catalyst or source of catalyst to support the catalysis of hydrogen to form hydrinos. The reactants and reactions disclosed herein for solid and liquid fuels are also reactants and reactions of heterogeneous fuels comprising a mixture of phases. The reaction mixture comprises at least two components chosen from a hydrogen catalyst or source of hydrogen catalyst and atomic hydrogen or a source of atomic hydrogen, wherein at least one of the atomic hydrogen and the hydrogen catalyst may be formed by a reaction of the reaction mixture. In additional embodiments, the reaction mixture further comprises a support, which in certain embodiments can be electrically conductive, a reductant, and an oxidant, wherein at least one reactant that by virtue of it undergoing a reaction causes the catalysis to be active. The reactants may be regenerated for any non-hydrino product by heating.

The present disclosure is also directed to a power source comprising:

a reaction cell for the catalysis of atomic hydrogen;

a reaction vessel;

a vacuum pump;

a source of atomic hydrogen in communication with the reaction vessel;

a source of a hydrogen catalyst comprising a bulk material in communication with the reaction vessel, the source of at least one of the source of atomic hydrogen and the source of hydrogen catalyst comprising a reaction mixture comprising at least one reactant comprising the element or elements that form at least one of the atomic hydrogen and the hydrogen catalyst and at least one other element, whereby at least one of the atomic hydrogen and hydrogen catalyst is formed from the source, at least one other reactant to cause catalysis; and a heater for the vessel, whereby the catalysis of atomic hydrogen releases energy in an amount greater than about 300 kJ per mole of hydrogen.

The reaction to form hydrinos may be activated or initiated and propagated by one or more chemical reactions. These reactions can be chosen for example from (i) hydride exchange reactions, (ii) halide-hydride exchange reactions, (iii) exothermic reactions, which in certain embodiments provide the activation energy for the hydrino reaction, (iv) coupled reactions, which in certain embodiments provide for at least one of a source of catalyst or atomic hydrogen to support the hydrino reaction, (v) free radical reactions, which in certain embodiments serve as an acceptor of electrons from the catalyst during the hydrino reaction, (vi) oxidation-reduction reactions, which in certain embodiments, serve as an acceptor of electrons from the catalyst during the hydrino reaction, (vii) other exchange reactions such as anion exchange including halide, sulfide, hydride, arsenide, oxide, phosphide, and nitride exchange that in an embodiment, facilitate the action of the catalyst to become ionized as it accepts energy from atomic hydrogen to form hydrinos, and (viii) getter, support, or matrix-assisted hydrino reactions, which may provide at least one of (a) a chemical environment for the hydrino reaction, (b) act to transfer electrons to facilitate the H catalyst function, (c) undergoes a reversible phase or other physical change or change in its electronic state, and (d) bind a lower-energy hydrogen product to increase at least one of the extent or rate of the hydrino reaction. In certain embodiments, the electrically conductive support enables the activation reaction.

In another embodiment, the reaction to form hydrinos comprises at least one of a hydride exchange and a halide exchange between at least two species such as two metals. At least one metal may be a catalyst or a source of a catalyst to form hydrinos such as an alkali metal or alkali metal hydride. The hydride exchange may be between at least two hydrides, at least one metal and at least one hydride, at least two metal hydrides, at least one metal and at least one metal hydride, and other such combinations with the exchange between or involving two or more species. In an embodiment, the hydride exchange forms a mixed metal hydride such as $(M_1)_x(M_2)_y H_z$ wherein x, y, and z are integers and $M_1$ and $M_2$ are metals Other embodiments of the present disclosure are directed to reactants wherein the catalyst in the activating reaction and/or the propagation reaction comprises a reaction of the catalyst or source of catalyst and source of hydrogen with a material or compound to form an intercalation compound wherein the reactants are regenerated by removing the intercalated species. In an embodiment, carbon may serve as the oxidant and the carbon may be regenerated from an alkali metal intercalated carbon for example by heating, use of displacing agent, electrolytically, or by using a solvent.

In additional embodiments, the present disclosure is directed to a power system comprising:

(i) a chemical fuel mixture comprising at least two components chosen from: a catalyst or source of catalyst; atomic hydrogen or a source of atomic hydrogen; reactants to form the catalyst or the source of catalyst and atomic hydrogen or a source of atomic hydrogen; one or more reactants to initiate the catalysis of atomic hydrogen; and a support to enable the catalysis, (ii) at least one thermal system for reversing an exchange reaction to thermally regenerate the fuel from the reaction products comprising a plurality of reaction vessels, wherein regeneration reactions comprising reactions that form the initial chemical fuel mixture from the products of the reaction of the mixture are performed in at least one reaction vessel of the plurality in conjunction with the at least one other reaction vessel undergoing power reactions, the heat from at least one power-producing vessel flows to at least one vessel that is undergoing regeneration to provide the energy for the thermal regeneration, the vessels are embedded in a heat transfer medium to achieve the heat flow, at least one vessel further comprising a vacuum pump and a source of hydrogen, and may further comprise two chambers having a temperature difference maintained between a hotter chamber and a colder chamber such that a species preferentially accumulates in the colder chamber, wherein a hydride reaction is performed in the colder chamber to form at least one initial reactant that is returned to the hotter chamber, (iii) a heat sink that accepts the heat from the power-producing reaction vessels across a thermal barrier, and (iv) a power conversion system that may comprise a heat engine such as a Rankine or Brayton-cycle engine, a steam engine, a Stirling engine, wherein the power conversion system may comprise thermoelectric or thermionic converters. In certain embodiments, the heat sink may transfer power to a power conversion system to produce electricity.

In certain embodiments, the power conversion system accepts the flow of heat from the heat sink, and in certain embodiments, the heat sink comprises a steam generator and steam flows to a heat engine such as a turbine to produce electricity.

In additional embodiments, the present disclosure is directed to a power system comprising:

(i) a chemical fuel mixture comprising at least two components chosen from: a catalyst or a source of catalyst; atomic hydrogen or a source of atomic hydrogen; reactants to form the catalyst or the source of catalyst and atomic hydrogen or a source of atomic hydrogen; one or more reactants to initiate the catalysis of atomic hydrogen; and a support to enable the catalysis, (ii) a thermal system for reversing an exchange reaction to thermally regenerate the fuel from the reaction products comprising at least one reaction vessel, wherein regeneration reactions comprising reactions that form the initial chemical fuel mixture from the products of the reaction of the mixture are performed in the at least one reaction vessel in conjunction with power reactions, the heat from power-producing reactions flows to regeneration reactions to provide the energy for the thermal regeneration, at least one vessel is insulated on one section and in contact with a thermally conductive medium on another section to achieve a heat gradient between the hotter and colder sections, respectively, of the vessel such that a species preferentially accumulates in the colder section, at least one vessel further comprising a vacuum pump and a source of hydrogen, wherein a hydride reaction is performed in the colder section to form at least one initial reactant that is returned to the hotter section, (iii) a heat sink that accepts the heat from the power-producing reactions transferred through the thermally conductive medium and optionally across at least one thermal barrier, and (iv) a power conversion system that may comprise a heat engine such as a Rankine or Brayton-cycle engine, a steam engine, a Stirling engine, wherein the power conversion system may comprise thermoelectric or thermionic converters, wherein the conversion system accepts the flow of heat from the heat sink.

In an embodiment, the heat sink comprises a steam generator and steam flows to a heat engine such as a turbine to produce electricity.

H. Electrochemical SF-CIHT Cell

In an electrochemical embodiment of the SF-CIHT cell, at least one of an excess voltage, current, and electrical power to those applied or generated internally is produced by the formation of at least one of HOH catalyst and H by the flow of a high current wherein HOH catalyzes the reaction of H to form hydrinos with the rate greatly enhanced by the catalyst reaction being in the presence of the flow of the high current. In another electrochemical embodiment of the SF-CIHT cell, a voltage and electrical power is produced by the formation of at least one of HOH catalyst, H, and a conductor capable of carrying high current by at least one electrochemical reaction wherein HOH catalyzes the reaction of H to form hydrinos with the rate greatly enhanced by the catalyst reaction being in the presence of the flow of high current. The electrochemical reaction may involve an electron transfer with at least one electrode of the cell. In an embodiment such as one shown in FIG. 1, the cell comprises a vessel 400 that is capable of containing the cell components, reactants, and electrolyte, the cell components comprising a cathode 405 and an anode 410, the reactants comprising a source of HOH catalyst and a source of H, and the electrolyte comprising a source of a highly conductive medium capable of carrying at least one of ion and electron current. The cathode may comprise nickel oxide, lithiated nickel oxide, nickel, and others of the present disclosure. The anode may comprise Ni, Mo, or a Mo alloy such as MoCu, MoNi, or MoCo. The source of HOH may be a source of H. The source of at least one of HOH catalyst and H may be a source of at least one of oxygen and hydrogen such as a hydrated compound or material such as a hydrated hydroscopic material of the present disclosure such as a hydrated oxide or halide such as hydrated CuO, CoO, and $MX_2$ (M=Mg, Ca, Sr, Ba; X=F, Cl, Br, I), an oxide, hydroxide, oxyhydroxide, $O_2$, $H_2O$, HOOH, $OOH^-$, peroxide ion, superoxide ion, hydride, and $H_2$. The $H_2O$ mole % content of the hydrated compound may be in the range of at least one of about 0.000001% to 100%, 0.00001% to 100%, 0.0001% to 100%, 0.001% to 100%, 0.01% to 100%, 0.1% to 100%, 1% to 100%, 10% to 100%, 0.1% to 50%, 1% to 25%, and 1% to 10%. In an embodiment, the electrochemical reaction forms HOH that reacts with H present in the cell. The cell may further comprise a bipolar plate 500 such as that shown in FIG. 2. The bipolar plates may be stacked and connected in series or parallel or a combination to achieve at least one of greater voltage, current, and power.

In embodiments of the present disclosure, an electrochemical power system can comprise a vessel, the vessel comprising at least one cathode; at least one anode; at least one electrolyte; at least two reactants chosen from: (a) at least one source of catalyst or a catalyst comprising nascent $H_2O$; (b) at least one source of atomic hydrogen or atomic hydrogen; and (c) at least one of a source of a conductor, a source of a conductive matrix, a conductor, and a conductive matrix; and at least one current source to produce a current comprising at least one of a high ion and electron current chosen from an internal current source and an external current source; wherein the electrochemical power system generates at least one of electricity and thermal energy. In certain embodiments, the combination of the cathode, anode, reactants, and external current source permit the catalysis of atomic hydrogen to form hydrinos to propagate that maintains a contribution to the current between each cathode and corresponding anode. In additional embodiments, the reaction of the catalyst with atomic H can cause a decrease in the cell voltage as the cell current increases.

In an embodiment, the electrolyte may comprise at least one of the source of oxygen, the source of hydrogen, $H_2O$, the source of HOH catalyst, and the source of H. The electrolyte may comprise a molten electrolyte such as those of the present disclosure such as a mixture of a molten hydroxide and a molten halide such as a mixture of an alkali hydroxide and an alkali halide such as LiOH—LiBr. The electrolyte may further comprise a matrix material such as one of those of the present disclosure such as an oxide such as an alkaline earth oxide such as MgO. The electrolyte may further comprise an additive such as those of the present disclosure. Alternatively, the electrolyte may comprise an aqueous electrolyte such as one comprising a base such as a hydroxide such as an alkali hydroxide such as KOH or an acid such as HCl, $H_3PO_4$, or $H_2SO_4$. In addition, the electrolyte can comprise at least one electrolyte chosen from: at least one aqueous alkali metal hydroxide; saturated aqueous KOH; at least one molten hydroxide; at least one eutectic salt mixture; at least one mixture of a molten hydroxide and at least one other compound; at least one mixture of a molten hydroxide and a salt; at least one mixture of a molten hydroxide and halide salt; at least one mixture of an alkaline hydroxide and an alkaline halide; at least one of the group of molten LiOH—LiBr, LiOH—NaOH, LiOH—LiBr—NaOH, LiOH—LiX—NaOH, LiOH—LiX, NaOH—NaBr, NaOH—NaI, NaOH—NaX, and KOH—KX, wherein X represents a halide); at least one acid, and at least one of HCl, $H_3PO_4$, and $H_2SO_4$.

In an embodiment, at least one of the source of nascent $H_2O$ catalyst and the source of atomic hydrogen can comprise: (a) at least one source of H2O; (b) at least one source of oxygen, and (c) at least one source of hydrogen. In further embodiments, the electrochemical power system can further comprise one or more solid fuel reactants to form at least one of the conductor, source of catalyst, the catalyst, the source of atomic hydrogen, and the atomic hydrogen. In additional embodiments, the reactants can undergo reaction during cell operation with separate electron flow in an external circuit and electron flow and ion mass transport within the reactants. In embodiments, at least one of an excess voltage, current, and electrical power to those applied or generated internally can be produced by the formation of at least one of HOH catalyst and H by the flow of a high current. In additional embodiments, a voltage and electrical power can be produced by the formation of at least one of HOH catalyst, H, and a conductor capable of carrying high current by at least one electrochemical reaction and, in further embodiments, a high current enhances the rate of reaction of the catalyst with atomic H. In embodiments, the electrochemical reaction can involve an electron transfer with at least one electrode of the cell.

In an embodiment, at least one of a high current and a high current density is applied to cause the hydrino reaction to occur with a high rate. The source of at least one of a high current and a high current density may be at least one of an external and an internal source. At least one of the internal and external current source comprises a voltage selected to cause a DC, AC, or an AC-DC mixture of current that is in the range of at least one of 1 A to 50 kA, 10 A to 10 kA, and 10 A to 1 kA and a DC or peak AC current density in the range of at least one of 1 A/cm$^2$ to 50 kA/cm$^2$, 10 A/cm$^2$ to 10 kA/cm$^2$, and 10 A/cm$^2$ to 1 kA/cm$^2$. The voltage may be determined by the conductivity of electrolyte wherein the voltage is given by the desired current times the resistance of the electrolyte that may comprise a conductor. The DC or peak AC voltage may be in at least one range chosen from about 0.1 V to 100 V, 0.1 V to 10 V, and 1 V to 5 V, and the AC frequency may be in the range of about 0.1 Hz to 10 GHz, 1 Hz to 1 MHz, 10 Hz to 100 kHz, and 100 Hz to 10 kHz. In an embodiment, the electrodes may be very closely spaced such that an electrical discharge arc may form between them. In an embodiment, the resistance of the electrolyte is in at least one range chosen from about 0.001 milliohm to 10 ohm and 0.01 ohm to 1 ohm, and the resistance of the electrolyte per electrode area active to form hydrinos is in at least one range chosen from about 0.001 milliohm/cm$^2$ to 10 ohm/cm$^2$ and 0.01 ohm/cm$^2$ to 1 ohm/cm$^2$.

In an embodiment, the current comprising at least one of ion and electron current is carried by the electrolyte. Current may be carried by electrochemical reactions between at least one of the electrolyte, reactants, and the electrodes. In certain embodiments, the at least one species of the electrolyte may optionally comprise at least one reactant. The current may flow through a conductor of the electrolyte. The conductor may form by a reduction reaction at an electrode such as the cathode. The electrolyte may comprise metal ions that are reduced to form metal that is conductive. In embodiments, the metal ions can be reduced during current flow to form a conductive metal. In other embodiments, the current carrying reduction electrochemical reaction is at least one of metal ion to a metal; $H_2O+O_2$ to $OH^-$; a metal oxide+$H_2O$ to at least one of the metal oxyhydroxide and metal hydroxide and $OH^-$, and a metal oxyhydroxide+$H_2O$ to $OH^-$, wherein the ion current carrier is $OH^-$. In embodiments, the anode can comprise H, $H_2O$ can be formed by oxidation of the $OH^-$ and reaction with H at the anode, and/or the source of H at the anode comprises at least one of a metal hydride, $LaNi_5H_x$, $H_2$ formed by electrolysis on the anode, $H_2$ supplied as a gas, and $H_2$ supplied through a hydrogen permeable membrane.

In an embodiment, at least one of the electrolyte and reactants comprise reactants that constitute hydrino reactants of the present disclosure comprising at least one source of catalyst or a catalyst comprising nascent $H_2O$, at least one source of atomic hydrogen or atomic hydrogen, and further comprising at least one of a conductor and a conductive matrix. In an embodiment, at least one of the electrolyte and reactants comprise at least one of a source of a solid fuel or energetic material of the present disclosure and a solid fuel or energetic material of the present disclosure. In an embodiment, exemplary solid fuels comprise a source of $H_2O$ and a conductive matrix to form at least one of the source of catalyst, the catalyst, the source of atomic hydrogen, and the atomic hydrogen. The $H_2O$ source may comprise at least one of bulk $H_2O$, a state other than bulk $H_2O$, a compound or compounds that undergo at least one of react to form $H_2O$ and release bound $H_2O$. The bound $H_2O$ may comprise a compound that interacts with $H_2O$ wherein the $H_2O$ is in a state of at least one of absorbed $H_2O$, bound $H_2O$, physisorbed $H_2O$, and waters of hydration. The reactants may comprise a conductor and one or more compounds or materials that undergo at least one of release of bulk $H_2O$, absorbed $H_2O$, bound $H_2O$, physisorbed $H_2O$, and waters of hydration, and have $H_2O$ as a reaction product. Further exemplary solid fuels are a hydrated hydroscopic material and a conductor; hydrated carbon; hydrated carbon and a metal; a mixture of a metal oxide, a metal or carbon, and $H_2O$; and a mixture of a metal halide, a metal or carbon, and $H_2O$. The metal and metal oxide may comprise a transition metal such as Co, Fe, Ni, and Cu. The metal of the halide may comprise an alkaline earth metal such as Mg or Ca and a halide such as F, Cl, Br or I. The metal may have a thermodynamically unfavorable reaction with $H_2O$ such as at least one of the group of Cu, Ni, Pb, Sb, Bi, Co, Cd, Ge, Au, Ir, Fe, Hg, Mo, Os, Pd, Re, Rh, Ru, Se, Ag, Tc, Te, Tl, Sn, W, Al, V, Zr, Ti, Mn, Zn, Cr, and In wherein the reactants may be regenerated by addition of $H_2O$. The reactants that constitute hydrino reactants may comprise at least one of a slurry, solution, emulsion, composite, and a compound.

In additional embodiments of the present disclosure the reactants to form at least one of the source of catalyst, the catalyst, the source of atomic hydrogen, and the atomic hydrogen can comprise at least one of: $H_2O$ and the source of $H_2O$; $O_2$, $H_2O$, HOOH, $OOH^-$, peroxide ion, superoxide ion, hydride, $H_2$, a halide, an oxide, an oxyhydroxide, a hydroxide, a compound that comprises oxygen, a hydrated compound, a hydrated compound selected from the group of at least one of a halide, an oxide, an oxyhydroxide, a hydroxide, a compound that comprises oxygen, and a conductive matrix. As exemplary embodiments, the oxyhydroxide can comprise at least one from the group of TiOOH, GdOOH, COOH, InOOH, FeOOH, GaOOH, NiOOH, AlOOH, CrOOH, MoOOH, CuOOH, MnOOH, ZnOOH, and SmOOH; the oxide can comprise at least one from the group of CuO, $Cu_2O$, CoO, $Co_2O_3$, $Co_3O_4$, FeO, $Fe_2O_3$, NiO, and $Ni_2O_3$; the hydroxide can comprise at least one from the group of $Cu(OH)_2$, $Co(OH)_2$, $Co(OH)_3$, $Fe(OH)_2$, $Fe(OH)_3$, and $Ni(OH)_2$; the compound that comprises oxygen can comprise at least one from the group of a sulfate, phosphate, nitrate, carbonate, hydrogen carbonate, chromate, pyrophosphate, persulfate, perchlorate, perbromate, and periodate, $MXO_3$, $MXO_4$ (M=metal such as alkali metal such as Li, Na, K, Rb, Cs; X=F, Br, Cl, I), cobalt magnesium oxide, nickel magnesium oxide, copper magnesium oxide, $Li_2O$, alkali metal oxide, alkaline earth metal oxide, CuO, $CrO_4$, ZnO, MgO, CaO, $MoO_2$, $TiO_2$, $ZrO_2$, $SiO_2$, $Al_2O_3$, NiO, FeO, $Fe_2O_3$, $TaO_2$, $Ta_2O_5$, VO, $VO_2$, $V_2O_3$, $V_2O_5$, $P_2O_3$, $P_2O_5$, $B_2O_3$, NbO, $NbO_2$, $Nb_2O_5$, $SeO_2$, $SeO_3$, $TeO_2$, $TeO_3$, $WO_2$, $WO_3$, $Cr_3O_4$, $Cr_2O_3$, $CrO_2$, $CrO_3$, CoO, $Co_2O_3$, $Co_3O_4$, FeO, $Fe_2O_3$, NiO, $Ni_2O_3$, rare earth oxide, $CeO_2$, $La_2O_3$, an oxyhydroxide, TiOOH, GdOOH, COOH, InOOH, FeOOH, GaOOH, NiOOH, AlOOH, CrOOH, MoOOH, CuOOH, MnOOH, ZnOOH, and SmOOH, and the conductive matrix can comprise at least one from the group of a metal powder, carbon, carbide, boride, nitride, carbonitrile such as TiCN, or nitrile.

In embodiments, the reactants constitute hydrino reactants comprising a mixture of a metal, a metal halide, and $H_2O$.

In other embodiments, the reactants constitute hydrino reactants comprising a mixture of a transition metal, an alkaline earth metal halide, and $H_2O$. In further embodiments, the reactants constitute hydrino reactants comprising a mixture of a conductor, hydroscopic materials, and $H_2O$. Non-limiting examples of the conductor include a metal powder or carbon powder, and non-limiting examples of the hydroscopic material include at least one of the group of lithium bromide, calcium chloride, magnesium chloride, zinc chloride, potassium carbonate, potassium phosphate, carnallite such as $KMgCl_3 \cdot 6(H_2O)$, ferric ammonium citrate, potassium hydroxide and sodium hydroxide and concentrated sulfuric and phosphoric acids, cellulose fibers, sugar, caramel, honey, glycerol, ethanol, methanol, diesel fuel, methamphetamine, a fertilizer chemical, a salt, a desiccant, silica, activated charcoal, calcium sulfate, calcium chloride, a molecular sieves, a zeolite, a deliquescent material, zinc chloride, calcium chloride, potassium hydroxide, sodium hydroxide and a deliquescent salt. In certain embodiments of the present disclosure, the electrochemical power system can comprise a mixture of a conductor, a hydroscopic material, and $H_2O$ wherein the ranges of relative molar amounts of (metal), (hydroscopic material), ($H_2O$) are at least one of about (0.000001 to 100000 metal), (0.000001 to 100000 hydroscopic material), (0.000001 to 100000 $H_2O$); about (0.00001 to 10000 metal), (0.00001 to 10000 hydroscopic material), (0.00001 to 10000 $H_2O$); about (0.0001 to 1000 metal), (0.0001 to 1000 hydroscopic material), (0.0001 to 1000 $H_2O$); about (0.001 to 100 metal), (0.001 to 100 hydroscopic material), (0.001 to 100 $H_2O$); about (0.01 to 100 metal), (0.01 to 100 hydroscopic material), (0.01 to 100 $H_2O$); about (0.1 to 10 metal), (0.1 to 10 hydroscopic material), (0.1 to 10 $H_2O$); and about (0.5 to 1 metal), (0.5 to 1 hydroscopic material), (0.5 to 1 $H_2O$).

Exemplary cathode materials that can undergo a reduction reaction to give rise to an ion current are metal oxyhydroxides, metal oxides, metal ions, oxygen, and a mixture of oxygen and $H_2O$. At least one of the metal oxide, metal oxyhydroxide, and metal hydroxide may comprise a transition metal. The metal oxide, metal oxyhydroxide, and metal hydroxide may comprise one of the present disclosure. Exemplary current carrying reduction electrochemical reactions are metal ion to a metal; $H_2O + O_2$ to $OH^-$; a metal oxide+$H_2O$ to at least one of the metal oxyhydroxide and metal hydroxide and $OH^-$, and a metal oxyhydroxide+$H_2O$ to $OH^-$. The ion current carrier may be $OH^-$, and the anode may comprise H to form $H_2O$ by oxidation of the $OH^-$. The source of H at the anode may comprise at least one of a metal hydride such as $LaNi_5H_x$, $H_2$ formed by electrolysis on the anode, $H_2$ supplied as a gas, and $H_2$ through a hydrogen permeable membrane. In other embodiments, the ion current is carried by at least one of ions comprising oxygen, of ions comprising oxygen and hydrogen, $OH^-$, $OOH^-$, $O^{2-}$, and $O_2^{2-}$ wherein the ion carrying reactions may be those given by Eqs. (61-72).

In an embodiment, the electrochemical power system of the present disclosure can comprise at least one of (a) a porous electrode, (b) a gas diffusion electrode, (c) a hydrogen permeable anode, wherein at least one of oxygen and $H_2O$ is supplied to the cathode and $H_2$ is supplied to the anode, (d) a cathode comprising at least one of an oxyhydroxide, an oxide, nickel oxide, lithiated nickel oxide, nickel, and (e) an anode comprising Ni, Mo, or a Mo alloy such as MoCu, MoNi, or MoCo, and a hydride. In further embodiments, wherein the hydride can be $LaNi_5H_x$ and the cathode can be at least one of TiOOH, GdOOH, CoOOH, InOOH, FeOOH, GaOOH, NiOOH, AlOOH, CrOOH, MoOOH, CuOOH, MnOOH, ZnOOH, SmOOH, and $MnO_2$. In other embodiments, the electrochemical power system of the present disclosure can comprise at least one gas supply system comprising a manifold, a gas line, and at least one gas channel connected to the electrode.

In an embodiment, the cell produces a current in excess to that applied due to the power released with the formation of hydrinos. In an embodiment, the formation of hydrinos from H releases energy that causes ionization of at least one species such as at least one of the reactants, electrolyte, and electrodes. The ionization may give rise to an excess current beyond that applied. Due to the higher mobility of the electrons compared to the ions, the ionized species gives rise to a contribution to the current in the direction of the applied current. In an embodiment, the applied current may be due to at least one of an external voltage and current source or an internally electrochemically produced current. In an exemplary embodiment comprising the 2 cm OD cell [Ni, Ni powder+$LaNi_5H_x$/KOH (saturated aqueous)/Ni powder+NiOOH, Ni], (50 wt % Ni powder was mixed with the cathode and anode materials, and the electrode current collectors were Ni) the cell was run with a voltage-limited, high current DC power supply (Kepco ATE6-100M, 0-6 V, 0-100 A). The voltage limit was set at 4 V. The cell current was initially 20 A at the 3.8 V, but increased to 100 A as the voltage dropped to 2.25 V. The cell showed anomalous negative resistance, a decreasing voltage at higher current, which is characteristic of and identifies the electrical power contribution from the formation of hydrinos. The cell temperature also increased above that expected due to the thermal energy release from the hydrino reaction.

In an embodiment, at least one magnet is applied to the cell to cause a Lorentzian deflection of electrons created by the energy released from the catalysis of H to hydrinos. In an embodiment, the electrons are preferentially deflected or biased to the negative electrode and the positive ions are preferentially deflected or biased to the positive electrode. In an embodiment, the preferential deflection is due to the greater energy release with the deflection in the direction of current flow.

In an embodiment, the electrochemical SF-CIHT cell further comprises an electrolysis system. Electrolysis may be intermittently applied to regenerate at least one of the electrolyte, reactants, and electrodes. The system may be supplied reactants that are consumed during the formation of hydrinos and power. The supplied reactants may replace at least one of the source of HOH and H. Suitable exemplary supplied reactants are one or more of the group of $H_2O$, $H_2$, and $O_2$. In an embodiment, at least one of the electrolyte and solid fuel may regenerated in situ or may be supplied to the cell intermittently or continuously wherein the products of the cell reactions may be regenerated into the initial reactants. The regeneration may be by thermal regeneration, $H_2$ reduction, rehydration, or any of the methods of the present disclosure or disclosed in my Prior Applications that are herein incorporated by reference. The electrodes may be regenerated by electrolysis of the anode materials such as a metal such as Ni, Mo, of a Mo alloy that may involve a regeneration scheme of reaction(s) such as those of the present disclosure such as those of Eqs. (53-60)

In an embodiment, the ion carrier may comprise $H^-$ and the electrolyte may be capable of conducting hydride ions such as a molten halide salt mixture such as a molten alkali halide salt mixture such as LiCl—KCl. The catalyst may comprise at least one H atom according to the reactions of Eqs. (6-9) and (24-31). The cell may comprise a hydrogen permeable membrane cathode supplied with hydrogen gas and an anode comprising a reactant capable of forming a hydride such as a metal such as an alkali metal such as Li. The metal may be inside of a hydrogen permeable anode. Exemplary hydrogen permeable metals are Ni, V, Ti, Nb, and Ta. The cells and methods of hydride ion conducting cells to form power by forming hydrinos is disclosed herein and in Mills Prior Applications such as Hydrogen Catalyst Reactor, PCT/US08/61455, filed PCT Apr. 24, 2008; Heterogeneous Hydrogen Catalyst Reactor, PCT/US09/052072, filed PCT Jul. 29, 2009; Heterogeneous Hydrogen Catalyst Power System, PCT/US10/27828, PCT filed Mar. 18, 2010; Electrochemical Hydrogen Catalyst Power System, PCT/US11/28889, filed PCT Mar. 17, 2011; $H_2O$-Based Electrochemical Hydrogen-Catalyst Power System, PCT/US12/31369 filed Mar. 30, 2012, and CIHT Power System, PCT/US13/041938 filed May 21, 2013 herein incorporated by reference in their entirety. In an embodiment, power from an external or internal source is applied to the cell to discharge it, and excess power is formed by forming hydrinos. The current may be high such as one of those of the present disclosure. In an embodiment, the cell is intermittently run in reverse to recharge it. In an embodiment, the metal is regenerated in the anode, and the hydrogen gas is regenerated in the cathode.

Heat as well as electricity is produced by the electrochemical embodiment of the SF-CIHT cell. The electrochemical embodiment of the SF CIHT cell further comprises a heat exchanger that may be on an exterior cell surface to remove heat produced by the cell and deliver it to a load. In another embodiment, the SF CIHT cell comprises a boiler. The heat exchanger or boiler comprises a coolant input to receive cool coolant from a load and a coolant outlet to supply or return hot coolant to the load. The heat may be used directly or converted to mechanical or electrical power using converters known by those skilled in the art such as a heat engine such as a steam engine or steam or gas turbine and generator, a Rankine or Brayton-cycle engine, or a Stirling engine. For power conversion, the thermal output from each electrochemical embodiment of the SF CIHT cell may flow out the coolant outlet line to any of the converters of thermal energy to mechanical or electrical power described in Mills Prior Publications as well as converters known to those skilled in the art such as a heat engine, steam or gas turbine system, Stirling engine, or thermionic or thermoelectric converter. In an embodiment, the electrochemical SF-CIHT cell is operated as an electrolysis cell. Hydrogen may be produced at the negative electrode and oxygen may be produced at the positive electrode. The cell may consume $H_2O$. The $H_2O$ may be electrolyzed into $H_2$ and $O_2$. The $H_2O$ may be supplied to the cell from a source such as a tank or from a $H_2O$ vapor supply or from the atmosphere. The formation of hydrinos may produce heat that may be used directly or converted to mechanical or electrical power.

I. Internal SF-CIHT Cell Engine

In a mechanical embodiment of the SF-CIHT cell comprising a SF-CIHT cell engine, at least one of heat and gas pressure is generated by the ignition of a solid fuel or energetic material of the present disclosure. The ignition is achieved by the formation of at least one of HOH catalyst and H by the flow of an applied high current wherein HOH catalyzes the reaction of H to form hydrinos with the rate greatly enhanced by the catalyst reaction being in the presence of the flow of the high current. Certain embodiments of the present disclosure are directed to a mechanical power system comprising: at least one piston cylinder of an internal combustion-type engine; a fuel comprising: (a) at least one source of catalyst or a catalyst comprising nascent $H_2O$; (b) at least one source of atomic hydrogen or atomic hydrogen; (c) at least one of a conductor and a conductive matrix; at least one fuel inlet with at least one valve; at least one exhaust outlet with at least one valve; at least one piston; at least one crankshaft; a high current source, and at least two electrodes that confine and conduct a high current through the fuel.

The power system can comprises at least one piston cylinder capable of a pressure of at least one of atmospheric, above atmospheric, and below atmospheric during different phases of a reciprocating cycle, a high power source capable of high current and optionally high voltage, a source of solid fuel or energetic material of the present disclosure, at least one fuel inlet with at least one valve, and at least one exhaust outlet with at least one valve, at least one piston, at least one shaft such as a crankshaft to transfer the mechanical motion of the at least one piston to a mechanical load, and at least two electrodes that confine and conduct a high current through the fuel to cause it to ignite wherein at least one of the piton or cylinder may serve as a counter electrode for the other electrode. In addition, the power system can further comprise at least one brush to provide electrical contact between the at least one piston and the high current source In an embodiment, the internal SF-CIHT cell engine further comprises a generator that is powered by the mechanical power of the engine to generate electrical power to power the high current source that in turn provides high current flow through the solid fuel to cause it to ignite. The generator may be spun by the shaft such as the engine crankshaft or otherwise actuated with gears or other mechanical coupling machinery to the crankshaft. The engine may further comprise a fuel regenerator to convert or regenerate the products back into the initial solid fuel.

The engine piston(s) may undergo a reciprocating motion. The engine may comprise a two-stroke cycle comprising the steps of induction and compression, and ignition and exhaust or a four-stroke cycle comprising the individual steps of power, exhaust, intake, and compression. Other engines known to those skilled in the art such as rotary engines are within the scope of the present disclosure. The solid fuel flows into the piston chamber with the piston displaced. During the power stroke of a reciprocating cycle, the compressed fuel is ignited with a high current corresponding to a high hydrino transition rate that causes the products and any additional added gas or source of gas to be heated and perform pressure-volume (PV) work on the piston causing it to move in the cylinder and turn a shaft such as a crankshaft. Fuel flows into the cylinder when the piston is displaced, the fuel becomes compressed by the returning piston before ignition, and products are exhausted after the power step by the returning displaced piston. Alternatively, exhaust gases are vented while the fuel flows into the cylinder, and the piston compresses it before another ignition. The exhausted product may flow to the regeneration system to be regenerated into the initial fuel. Any additional gas or source of gas to assist in performance of conversion of the heat from the ignition of the solid fuel into PV work may be recovered, regenerated, and recycled.

In an embodiment, the fuel comprises reactants that constitute hydrino reactants of the present disclosure comprising at least one source of catalyst or a catalyst comprising nascent $H_2O$, at least one source of atomic hydrogen or atomic hydrogen, and further comprising at least one of a conductor and a conductive matrix. In an embodiment, the fuel comprises at least one of a source of a solid fuel or energetic material of the present disclosure and a solid fuel or energetic material of the present disclosure. In an embodiment, exemplary solid fuels comprise a source of $H_2O$ and a conductive matrix to form at least one of the source of catalyst, the catalyst, the source of atomic hydrogen, and the atomic hydrogen. The $H_2O$ source may comprise at least one of bulk $H_2O$, a state other than bulk $H_2O$, a compound or compounds that undergo at least one of react to form $H_2O$ and release bound $H_2O$. The bound $H_2O$ may comprise a compound that interacts with $H_2O$ wherein the $H_2O$ is in a state of at least one of absorbed $H_2O$, bound $H_2O$, physisorbed $H_2O$, and waters of hydration. The reactants may comprise a conductor and one or more compounds or materials that undergo at least one of release of bulk $H_2O$, absorbed $H_2O$, bound $H_2O$, physisorbed $H_2O$, and waters of hydration, and have $H_2O$ as a reaction product. Further exemplary solid fuels are a hydrated hydroscopic material and a conductor; hydrated carbon; hydrated carbon and a metal; a mixture of a metal oxide, a metal or carbon, and $H_2O$; and a mixture of a metal halide, a metal or carbon, and $H_2O$. The metal and metal oxide may comprise a transition metal such as Co, Fe, Ni, and Cu. The metal of the halide may comprise an alkaline earth metal such as Mg or Ca and a halide such as F, Cl, Br or I. The metal may have a thermodynamically unfavorable reaction with $H_2O$ such as at least one of the group of Cu, Ni, Pb, Sb, Bi, Co, Cd, Ge, Au, Ir, Fe, Hg, Mo, Os, Pd, Re, Rh, Ru, Se, Ag, Tc, Te, Tl, Sn, W, Al, V, Zr, Ti, Mn, Zn, Cr, and In wherein the reactants may be regenerated by addition of $H_2O$. The reactants that constitute hydrino reactants may comprise at least one of a slurry, solution, emulsion, composite, and a compound.

In certain embodiments, at least one of the source of nascent $H_2O$ catalyst and the source of atomic hydrogen can comprise at least one of: (a) at least one source of $H_2O$; (b) at least one source of oxygen, and (c) at least one source of hydrogen. In additional embodiments, the fuel can form at least one of the source of catalyst, the catalyst, the source of atomic hydrogen, and the atomic hydrogen comprise at least one of (a) $H_2O$ and the source of $H_2O$; (b) $O_2$, $H_2O$, HOOH, $OOH^-$, peroxide ion, superoxide ion, hydride, $H_2$, a halide, an oxide, an oxyhydroxide, a hydroxide, a compound that comprises oxygen, a hydrated compound, a hydrated compound selected from the group of at least one of a halide, an oxide, an oxyhydroxide, a hydroxide, a compound that comprises oxygen, and (c) a conductive matrix. Non-limiting examples of oxyhydroxide include at least one group chosen from TiOOH, GdOOH, COOH, InOOH, FeOOH, GaOOH, NiOOH, AlOOH, CrOOH, MoOOH, CuOOH, MnOOH, ZnOOH, and SmOOH; non-limiting examples of the oxide include at least one group chosen from CuO, $Cu_2O$, CoO, $Co_2O_3$, $Co_3O_4$, FeO, $Fe_2O_3$, NiO, and $Ni_2O_3$; non-limiting examples of the hydroxide include at least one group chosen from $Cu(OH)_2$, $Co(OH)_2$, $Co(OH)_3$, $Fe(OH)_2$, $Fe(OH)_3$, and $Ni(OH)_2$; non-limiting examples of the compound that comprises oxygen include at least one group chosen from a sulfate, phosphate, nitrate, carbonate, hydrogen carbonate, chromate, pyrophosphate, persulfate, perchlorate, perbromate, and periodate, $MXO_3$, $MXO_4$ (M=metal such as alkali metal such as Li, Na, K, Rb, Cs; X=F, Br, Cl, I), cobalt magnesium oxide, nickel magnesium oxide, copper magnesium oxide, $Li_2O$, alkali metal oxide, alkaline earth metal oxide, CuO, $CrO_4$, ZnO, MgO, CaO, $MoO_2$, $TiO_2$, $ZrO_2$, $SiO_2$, $Al_2O_3$, NiO, FeO, $Fe_2O_3$, $TaO_2$, $Ta_2O_5$, VO, $VO_2$, $V_2O_3$, $V_2O_5$, $P_2O_3$, $P_2O_5$, $B_2O_3$, NbO, $NbO_2$, $Nb_2O_5$, $SeO_2$, $SeO_3$, $TeO_2$, $TeO_3$, $WO_2$, $WO_3$, $Cr_3O_4$, $Cr_2O_3$, $CrO_2$, $CrO_3$, CoO, $Co_2O_3$, $Co_3O_4$, FeO, $Fe_2O_3$, NiO, $Ni_2O_3$, rare earth oxide, $CeO_2$, $La_2O_3$, an oxyhydroxide, TiOOH, GdOOH, COOH, InOOH, FeOOH, GaOOH, NiOOH, AlOOH, CrOOH, MoOOH, CuOOH, MnOOH, ZnOOH, and SmOOH, and the conductive matrix can comprise at least one from the group of a metal powder, carbon, carbide, boride, nitride, carbonitrile such as TiCN, or nitrile.

In certain embodiments, the fuel can comprise (a) a mixture of a metal, its metal oxide, and $H_2O$ wherein the reaction of the metal with $H_2O$ is not thermodynamically favorable; (b) a mixture of a metal, a metal halide, and $H_2O$ wherein the reaction of the metal with $H_2O$ is not thermodynamically favorable; and (c) a mixture of a transition metal, an alkaline earth metal halide, and $H_2O$ wherein the reaction of the metal with $H_2O$ is not thermodynamically favorable. In additional embodiments, the metal having a thermodynamically unfavorable reaction with $H_2O$ is chosen from at least one of Cu, Ni, Pb, Sb, Bi, Co, Cd, Ge, Au, Ir, Fe, Hg, Mo, Os, Pd, Re, Rh, Ru, Se, Ag, Tc, Te, Tl, Sn, W, Al, V, Zr, Ti, Mn, Zn, Cr, and In. In further embodiments, the fuel can comprise a mixture of a conductor, a hydroscopic material, and $H_2O$. In such embodiments, the conductor can comprise a metal powder or carbon powder wherein the reaction of the metal or carbon with $H_2O$ is not thermodynamically favorable, and the hydroscopic material can comprise at least one of the group of lithium bromide, calcium chloride, magnesium chloride, zinc chloride, potassium carbonate, potassium phosphate, carnallite such as $KMgCl_3·6(H_2O)$, ferric ammonium citrate, potassium hydroxide and sodium hydroxide and concentrated sulfuric and phosphoric acids, cellulose fibers, sugar, caramel, honey, glycerol, ethanol, methanol, diesel fuel, methamphetamine, a fertilizer chemical, a salt, a desiccant, silica, activated charcoal, calcium sulfate, calcium chloride, a molecular sieves, a zeolite, a deliquescent material, zinc chloride, calcium chloride, potassium hydroxide, sodium hydroxide and a deliquescent salt. In certain embodiments, the fuel can comprise a mixture of a conductor, hydroscopic materials, and $H_2O$ wherein the ranges of relative molar amounts of (metal), (hydroscopic material), ($H_2O$) are at least one of about (0.000001 to 100000 metal), (0.000001 to 100000 hydroscopic material), (0.000001 to 100000 $H_2O$); (0.00001 to 10000 metal), (0.00001 to 10000 hydroscopic material), (0.00001 to 10000 $H_2O$); (0.0001 to 1000 metal), (0.0001 to 1000 hydroscopic material), (0.0001 to 1000 $H_2O$); (0.001 to 100 metal), (0.001 to 100 hydroscopic material), (0.001 to 100 $H_2O$); (0.01 to 100 metal), (0.01 to 100 hydroscopic material), (0.01 to 100 $H_2O$); (0.1 to 10 metal), (0.1 to 10 hydroscopic material), (0.1 to 10 $H_2O$); and (0.5 to 1 metal), (0.5 to 1 hydroscopic material), (0.5 to 1 $H_2O$).

In additional embodiments, the fuel can comprise a mixture of a metal, its metal oxide, and $H_2O$ wherein the metal oxide is capable of $H_2$ reduction at a temperature less than 1000° C. In embodiments, the metal having an oxide capable of being reduced to the metal with $H_2$ at a temperature less than 1000° C. can be chosen from at least one of of Cu, Ni, Pb, Sb, Bi, Co, Cd, Ge, Au, Ir, Fe, Hg, Mo, Os, Pd, Re, Rh, Ru, Se, Ag, Tc, Te, Tl, Sn, W, Al, V, Zr, Ti, Mn, Zn, Cr, and In.

In other embodiments, the fuel can comprise a mixture of an oxide that is not easily reduced with $H_2$ and mild heat; a metal having an oxide capable of being reduced to the metal with $H_2$ at a temperature less than 1000° C., and $H_2O$. In embodiments, the metal oxide that is not easily reduced with $H_2$, and mild heat can comprise at least one of alumina, an alkaline earth oxide, and a rare earth oxide. In further embodiments, the fuel can comprise carbon or activated carbon and $H_2O$ wherein the mixture is regenerated by rehydration comprising addition of $H_2O$.

In certain embodiments, the $H_2O$ mole % content in the power system can be in the range of at least one of about 0.000001% to 100%, 0.00001% to 100%, 0.0001% to 100%, 0.001% to 100%, 0.01% to 100%, 0.1% to 100%, 1% to 100%, 10% to 100%, 0.1% to 50%, 1% to 25%, and 1% to 10%.

Figure 9:
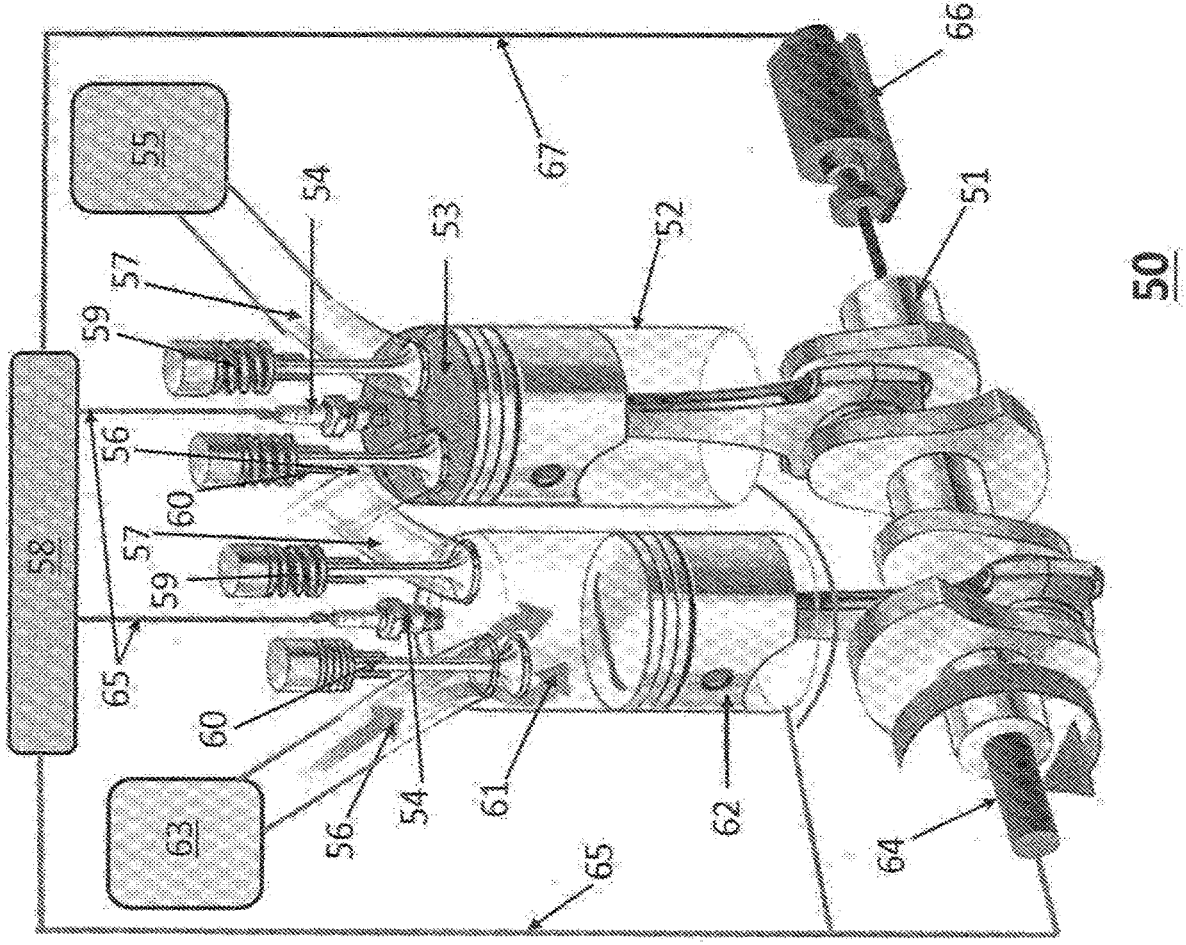
FIG. 9 is a schematic drawing of an internal SF-CIHT cell engine in accordance with an embodiment of the present disclosure.

In an embodiment, the cell such as the ones shown in FIGS. 3 and 4A and 4B comprises at least one cylinder of an internal combustion-type engine as given in Mills Prior Thermal Power Conversion Publications, Mills Prior Plasma Power Conversion Publications, and Mills Prior Applications. An internal SF-CIHT cell engine shown in FIG. 9 comprises at least one cylinder 52 that receives fuel from a fuel source 63 through a fuel inlet 56 and an inlet valve assembly 60 that opens a passage to the cylinder chamber during a fuel intake phase of a reciprocating cycle. Gases such as air or an inert gas such as a noble gas such as argon that may be recycled may also flow into the cylinder 52 by means such as through the fuel inlet 56 and a inlet valve assembly 60. In another embodiment, a source of gas such as a fluid capable of being vaporized during power generation such as $H_2O$ is injected. The fluid such as $H_2O$ may at least partially comprise the fuel such as a source of catalyst and H.

Each cylinder 52 comprises at least two electrodes 54 and at least one of 62 and 52 connected by electrical connections 65 to a high-current power supply 58 such as one that can provide about 1 kA to 100 kA to provide a high current to ignite the solid fuel to form hydrinos at a very high rate as given in the present disclosure. In an embodiment, fuel flows in between at the least two electrodes and is ignited to form hydrinos with the release of thermal energy that causes at least one of the release of hot gases and heating and expansion of gases and any fluid that may be vaporized in the cylinder. In another embodiment, the electrodes cause an arc plasma in $H_2O$ or a gas comprising $H_2O$ to ignite $H_2O$ to form hydrinos as given in the present disclosure. In an embodiment, one electrode comprises an isolated feed-through and the other comprises at least one of the piston and the cylinder. Electrical connections 65 may be made directly between the high current power supply 58 and the feed-through 54 and cylinder electrodes 52. In an embodiment wherein the piston 62 is the counter electrode, the cylinder 52 is nonconducting. An exemplary non-conducting cylinder comprises a ceramic. The electrical contact from the high current power supply 58 to the piston electrode 62 may be through a brush 64 such as one that contacts the shaft 51 that is electrically connected to the piston electrode 62. Contact between the conductive fuel 61 and the feed-through electrode 54 and at least one of the piston 62 and cylinder electrode 52 may be made when the fuel is compressed during the compression phase or stroke of the reciprocating cycle. Upon fuel ignition of the compressed $H_2O$ or solid fuel 53 to form hydrinos at a very high rate, the hot cylinder gases expand to perform pressure-volume work. The heated cylinder gases exert pressure on the head of the piston 62 to cause it to move corresponding to positive displacement during the power phase. The action of the piston 62 is transferred to a crankshaft 51 that spins, and this action is applied to a mechanical load such as those known in the art. In an embodiment, the engine further comprises an internal generator 66 connected to shaft 51 with the output electricity connected to the high power supply 58 by generator power connector 67. Thus, a portion of the mechanical energy is used to provide the high power to maintain ignition while the remainder is applied to other mechanical loads such as spinning at least one of a shaft, wheels, a external generator, an aviation turbofan or turbopropeller, a marine propeller, an impeller, and rotating shaft machinery.

The high current power supply to deliver a short burst of high-current electrical energy is sufficient enough to cause the hydrino reactants to undergo the reaction to form hydrinos at a very high rate. In an embodiment, the high current power supply is capable of a high voltage to achieve $H_2O$ arc plasma. The arc plasma may have the characteristics given in the Arc and High-Current Hydrino Plasma Cells Having DC, AC, and Mixtures section of the present disclosure. In an embodiment, the high current power supply to deliver a short burst of high-current electrical energy comprises: a voltage selected to cause a high AC, DC, or an AC-DC mixture of current that is in the range of at least one of 100 A to 1,000,000 A, 1 kA to 100,000 A, 10 kA to 50 kA; a DC or peak AC current density in the range of at least one of 100 $A/cm^2$ to 1,000,000 $A/cm^2$, 1000 $A/cm^2$ to 100,000 $A/cm^2$, and 2000 $A/cm^2$ to 50,000 $A/cm^2$ wherein the voltage may be determined by the conductivity of the solid fuel wherein the voltage is given by the desired current times the resistance of the solid fuel; the DC or peak AC voltage may be in at least one range chosen from about 0.1 V to 500 kV, 0.1 V to 100 kV, and 1 V to 50 kV, and the AC frequency may be in the range of about 0.1 Hz to 10 GHz, 1 Hz to 1 MHz, 10 Hz to 100 kHz, and 100 Hz to 10 kHz. In certain embodiments, the resistance of the fuel can be in at least one range chosen from about 0.001 milliohm to 100 Mohm, 0.1 ohm to 1 Mohm, and 10 ohm to 1 kohm, and the conductivity of a suitable load per electrode area active to form hydrinos can be in at least one range chosen from about $10^{-10}$ $ohm^{-1}$ $cm^{-2}$ to $10^6$ $ohm^{-1}$ $cm^{-2}$, $10^{-5}$ $ohm^{-1}$ $cm^{-2}$ to $10^6$ $ohm^{-1}$ $cm^{-2}$, $10^{-4}$ $ohm^{-1}$ $cm^{-2}$ to $10^5$ $ohm^{-1}$ $cm^{-2}$, $10^{-2}$ $ohm^{-1}$ $cm^{-2}$ to $10^4$ $ohm^{-1}$ $cm^{-2}$, $10^{-2}$ $ohm^{-1}$ $cm^{-2}$ to $10^3$ $ohm^{-1}$ $cm^{-2}$, $10^{-1}$ $ohm^{-1}$ $cm^{-2}$ to $10^2$ $ohm^{-1}$ $cm^{-2}$, and 1 $ohm^{-1}$ $cm^{-2}$ to 10 $ohm^{-1}$ $cm^{-2}$.

In an embodiment, the power stroke corresponding to expansion of the cylinder gases is followed by a compressive exhaust stroke wherein the piston travels in the opposite direction, and the negative displacement compresses the cylinder gases that may be forced out of the cylinder 52 through the an outlet or exhaust valve assembly 59. The heated cylinder gases may transport products out of the cylinder 52 through at least one exhaust valve 59. At least one of the fuel products and gases may be transported out the exhaust valve assembly 59 through the exhaust outlet 57 to a fuel regenerator 55 wherein the products and optionally the gases or fluid that is vaporized are regenerated to the initial fuel and then returned to the fuel source. In an embodiment, the system may be closed except for the addition of $H_2O$ that is consumed to form hydrinos and oxygen that may be vented through the exhaust outlet 57 and regenerator 55. In an embodiment, the engine further comprises a conveyor to move the regenerated fuel from the regenerator 55 into the fuel source 63. Suitable conveyors may be at least one of a conveyor belt, auger or screw, pneumatic conveyor or mover, gravity assisted flow channel, and others known by those skilled in the art.

In an embodiment, the engine is a reciprocating type with positive and negative displacement. At least two cylinders may work out of phase with each other to mutually assist in the reciprocating cycle. The fuel may be at least significantly combustible such as carbon that comprises $H_2O$. The fuel may be a fine powder that is injected pneumatically in an embodiment. The fuel may comprise a conductor and $H_2O$ wherein the conductor may form a gaseous product that may perform pressure volume work and be readily exhaustible from the cylinder. In an embodiment, the SF-CIHT engine comprises a modified internal combustion engine having the fossil fuel replaced by a solid fuel or energetic material of the present disclosure, and the spark plugs and the corresponding power source is replaced by electrodes 54 and at least one of 62 and 52 and a high-current power source 58 that may be low voltage or an arc plasma power source such as one of those of the present disclosure.

The balance of plant of an internal combustion engine and power load systems are well known to those skilled in the art. In other embodiments, the engine may comprise another type such as a rotary engine wherein pressure-volume (PV) work is performed by at least one of the gases formed and heated by the energy released by the hydrino reaction that may be explosive kinetically. The system and methods parallel those of the conventional piston engine. Fuel flows into the compression chamber, is ignited, expands to perform PV work, then the gases are compressed as they are exhausted to start a new cycle. The exhaust gas may be regenerated and recycled.

Heat as well as mechanical power is produced by the mechanical embodiment of the SF-CIHT cell. The SF-CIHT cell engine further comprises a heat exchanger that may be on an exterior cylinder surface to remove heat produced by the cell and deliver it to a load. In another embodiment, the SF CIHT cell comprises a boiler. The heat exchanger or boiler comprises a coolant input to receive cool coolant from a load and a coolant outlet to supply or return hot coolant to the load. The heat may be used directly or converted to mechanical or electrical power using converters known by those skilled in the art such as a heat engine such as a steam engine or steam or gas turbine and generator, a Rankine or Brayton-cycle engine, or a Stirling engine. For power conversion, the thermal output from the mechanical embodiment of the SF CIHT cell may flow out the coolant outlet line to any of the converters of thermal energy to mechanical or electrical power described in Mills Prior Publications as well as converters known to those skilled in the art such as a heat engine, steam or gas turbine system, Stirling engine, or thermionic or thermoelectric converter.

VIII. Hydrino Plasma Cell

In an embodiment, the CIHT cell comprises a plasma cell wherein the plasma is formed intermittently by intermittent application of external input power, and electrical power is drawn or output during the phase that the external input power in off. The plasma gases comprise at least two of a source of hydrogen, hydrogen, a source of catalyst, and a catalyst that form hydrinos by reaction of H with the catalyst to provide power to an external load. The input plasma power creates the reactants that form hydrinos at least during the external power off phase. The plasma cell may comprise a plasma electrolysis reactor, barrier electrode reactor, RF plasma reactor, rt-plasma reactor, pressurized gas energy reactor, gas discharge energy reactor, microwave cell energy reactor, and a combination of a glow discharge cell and a microwave and or RF plasma reactor. The catalysts and systems may be those of the present disclosure and those of disclosed in my prior US patent applications such as Hydrogen Catalyst Reactor, PCT/US08/61455, filed PCT Apr. 24, 2008; Heterogeneous Hydrogen Catalyst Reactor, PCT/US09/052072, filed PCT Jul. 29, 2009; Heterogeneous Hydrogen Catalyst Power System, PCT/US10/27828, PCT filed Mar. 18, 2010; Electrochemical Hydrogen Catalyst Power System, PCT/US11/28889, filed PCT Mar. 17, 2011; $H_2O$-Based Electrochemical Hydrogen-Catalyst Power System, PCT/US12/31369 filed Mar. 30, 2012, and CIHT Power System, PCT/US13/041938 filed May 21, 2013 ("Mills Prior Applications") herein incorporated by reference in their entirety.

The hydrino reaction rate is extraordinarily increased by application of a high current through the reactants comprising H and catalyst such as HOH. Ignition of $H_2O$ is achieved by application of high current to solid fuels comprising $H_2O$ or a source of $H_2O$ or by forming and maintaining an arc plasma comprising $H_2O$. The arc plasma may be achieved in microwave cells, DC powered cells, AC powered cells, and cells powered with a mixture of DC and AC. In another embodiment, high current is achieved using plasma flow wherein the plasma may be confined with at least one of electrostatic and magnetic fields. Exemplary embodiments of confinement comprise a solenoidal field such as that provided by Helmholtz coils, a magnetic bottle or mirror as given in Mills Prior Applications, and configurations used in hot fusion research known by those skilled in the art. The plasma flow can be increased by RF coupling, particle injection, and other methods and means known to those skilled in the art of plasmas.

In embodiments of the present disclosure, the water arc plasma power system can comprise: at least one closed reaction vessel; reactants comprising at least one of source of $H_2O$ and $H_2O$; at least one set of electrodes; a source of electrical power to deliver an initial high-voltage breakdown of the $H_2O$ and provide a subsequent high current, and a heat exchanger system, wherein the power system generates arc plasma, light, and thermal energy. In embodiments, arc plasma can be generated and cause the reactants to undergo a reaction to form hydrinos at a very high rate. In certain embodiments, the $H_2O$ serves a reactant comprising: (a) a source of catalyst or a catalyst comprising nascent $H_2O$; (b) a source of atomic hydrogen or atomic hydrogen, and (c) a plasma medium. The water arc plasma power system can further comprise a plasma medium comprising at least one of $H_2O$ and trace ions. In certain embodiments, $H_2O$ can be the source of HOH catalyst and H that are formed by arc plasma. $H_2O$ can also be present as at least one of liquid and gaseous states at the standard conditions of a liquid and gaseous mixture according to the $H_2O$ phase diagram for the operating temperatures and pressures in the range of about 1° C. to 2000° C. and 0.01 atm to 200 atm, respectively. In further embodiments, the plasma medium can comprise a source of ions comprising at least one of a dissolved ionic and a salt compound that causes the medium to be more conductive to achieve arc breakdown at a lower voltage.

In embodiments, the high breakdown voltage can be in the range of at least one of about 50 V to 100 kV, 1 kV to 50 kV, and 1 kV to 30 kV, and the high current can have a limit in the range of at least one of about 1 kA to 100 kA, 2 kA to 50 kA, and 10 kA to 30 kA. The high voltage and current may be at least one of DC, AC, and mixtures thereof. In addition, the source of electrical power can provide a high discharge current density in the range of at least one of 0.1 $A/cm^2$ to 1,000,000 $A/cm^2$, 1 $A/cm^2$ to 1,000,000 $A/cm^2$, 10 $A/cm^2$ to 1,000,000 $A/cm^2$, 100 $A/cm^2$ to 1,000,000 $A/cm^2$, and 1 $kA/cm^2$ to 1,000,000 $A/cm^2$. In embodiments, the source of electrical power to form arc plasma comprises a plurality of capacitors comprising a bank of capacitors capable of supplying high voltage in the range of about 1 kV to 50 kV and a high current that increases as the resistance and voltage decreases. In further embodiments, the water arc plasma power system can comprise a secondary power source. In addition, the water arc plasma power system can comprise at least one of additional power circuit elements and a secondary high current power source. In such embodiments, the source of electrical power can comprise a plurality of banks of capacitors that sequentially supply power to the arc wherein each discharged bank of capacitors is recharged by the secondary power source as a given charged bank of capacitors is discharged.

In further embodiments, the closed vessel further comprises a boiler comprising a steam outlet, a return, and a recirculation pump wherein at least one $H_2O$ phase comprising at least one of heated water, super-heated water, steam, and super-heated steam flow out the steam outlet and supply a thermal or mechanical load, at least one the processes of cooling of the outlet flow and condensation of steam occurs with thermal power transfer to the load, the cooled steam or water is pumped by the recirculation pump, and the cooled steam or water is returned to the cell through the return. In additional embodiments, the water arc plasma power system further comprises at least one thermal-to-electric converter to receive thermal power from at least one of the boiler and the heat exchanger. The at least one thermal-to-electric converter can comprise at least one of the group chosen from a heat engine, a steam engine, a steam turbine and generator, a gas turbine and generator, a Rankine-cycle engine, a Brayton-cycle engine, a Stirling engine, a thermionic power converter, and a thermoelectric power converter.

A. Microwave Hydrino Plasma Cell

In an embodiment, the plasma cell comprises a microwave plasma cell such as one of Mills Prior Applications. The microwave cell comprises a vessel capable of maintaining at least one of a vacuum, atmospheric pressure, and a pressure above atmospheric, a source of plasma gas, a gas inlet, a gas outlet, and a pump to maintain flow of the plasma gas and a pressure gauge, and at least one of an antennae and a microwave cavity, a microwave generator, and a coaxial cable connected from the microwave generator to at least one of the antennae and the microwave cavity. The plasma gas may comprise at least one of $H_2$ and $H_2O$. The plasma cell may further comprise a grounded conductor immersed in the plasma such as a center axial metal rod to provide a short to ground of the voltage generated at the antennae or cavity. The short gives rise to a high current to ignite hydrino reaction. The short may form an arc between antennae and the grounded conductor. The high current of the arc may cause the hydrino reaction to increase significantly.

In embodiment of the microwave plasma cell the plasma gas comprises at least nitrogen and hydrogen. The catalyst may be amide ion. The pressure may be in the range of at least about 0.001 Torr to 100 atm, 0.01 Torr to 760 Torr, and 0.1 Torr to 100 Torr. The ratio of nitrogen to hydrogen may be any desired. In an embodiment, the percentage of nitrogen of the nitrogen-hydrogen plasma gas is in the range of about 1% to 99%.

B. Arc and High-Current Hydrino Plasma Cells Having DC, AC, and Mixtures

In an embodiment, the CIHT cell comprises a hydrino-forming plasma cell called a hydrino plasma cell. The high current may be DC, AC, or combinations thereof. In an embodiment, the cell comprises a high voltage dielectric barrier gas discharge cell comprising a conducing electrode and a conducting counter electrode that is sheathed with a dielectric barrier such as a barrier comprising a Garolite insulator. The conducting electrode may be cylindrical circumferential to an axial centered barrier electrode. The plasma gas may comprise at least one of a source of H and a source of HOH catalyst such as $H_2O$. Additional suitable plasma gases are a mixture of at least one of $H_2O$, a source of H, $H_2$, a source of oxygen, $O_2$, and an inert gas such as a noble gas. The gas pressure may be in the range of at least one of about 0.001 Torr to 100 atm, 1 Torr to 50 atm, and 100 Torr to 10 atm. The voltage may be high such as in the range of at least one of about 50 V to 100 kV, 1 kV to 50 kV, and 1 kV to 30 kV. The current may be in the range of at least one of about 0.1 mA to 100 A, 1 mA to 50 A, and 1 mA to 10 A. The plasma may comprise arcs that have much higher current such as ones in the range of at least one of about 1 A to 100 kA, 100 A to 50 kA, and 1 kA to 20 kA. In an embodiment, the high current accelerates the hydrino reaction rate. In an embodiment, the voltage and current are AC. The driving frequency may be an audio frequency such as in the range of 3 kHz to 15 kHz. In an embodiment, the frequency is in the range of at least one of about 0.1 Hz to 100 GHz, 100 Hz to 10 GHz, 1 kHz to 10 GHz, 1 MHz to 1 GHz, and 10 MHz to 1 GHz. An exemplary barrier electrode plasma cell is described in J. M. Nowak, "Examination of the Strontium Catalysis of the Hydrino Reaction in an Audio-Frequency, Capacitively Coupled, Cylindrical Plasma Discharge", Master of Science Thesis, North Carolina State University, Nuclear Engineering Department, (2009), http://repository.lib.ncsu.edu/ir/bitstream/1840.16/31/1/etd.pdf which is herein incorporated by reference in its entirety. In another embodiment, the dielectric barrier is removed to better support an arc plasma. The conductor that is thereby exposed to the plasma gas may provide electron thermionic and field emission to support the arc plasma.

In an embodiment, the cell comprises a high voltage power source that is applied to achieve a breakdown in a plasma gas comprising a source of H and a source of HOH catalyst. The plasma gas may comprise at least one of water vapor, hydrogen, a source of oxygen, and an inert gas such as a noble as such as argon. The high voltage power may comprise direct current (DC), alternating current (AC), and mixtures thereof. The breakdown in the plasma gas causes the conductivity to significantly increase. The power source is capable of high current. A high current at a lower voltage than the breakdown voltage is applied to cause the catalysis of H to hydrino by HOH catalyst to occur at a high rate. The high current may comprise direct current (DC), alternating current (AC), and mixtures thereof.

An embodiment, of a high current plasma cell comprises a plasma gas capable of forming HOH catalyst and H. The plasma gas comprises a source of HOH and a source of H such as $H_2O$ and $H_2$ gases. The plasma gas may further comprise additional gases that permit, enhance, or maintain the HOH catalyst and H. Other suitable gases are noble gases. The cell comprises at least one of, at least one set of electrodes, at least one antennae, at least one RF coil, and at least one microwave cavity that may comprise an antenna and further comprising at least one breakdown power source such as one capable of producing a voltage or electron or ion energy sufficient to cause electrical breakdown of the plasma gas. The voltage may be in the range of at least one of about 10 V to 100 kV, 100 V to 50 kV, and 1 kV to 20 kV. The plasma gas may initially be in a liquid state as well as be in a gaseous state. The plasma may be formed in a medium that is liquid $H_2O$ or comprises liquid $H_2O$. The gas pressure may be in the range of at least one of about 0.001 Torr to 100 atm, 0.01 Torr to 760 Torr, and 0.1 Torr to 100 Torr. The cell may comprise at least one secondary source of power that provides high current once breakdown is achieved. The high current may also be provided by the breakdown power source. Each of the power sources may be DC or AC. The frequency range of either may be in the range of at least one of about 0.1 Hz to 100 GHz, 100 Hz to 10 GHz, 1 kHz to 10 GHz, 1 MHz to 1 GHz, and 10 MHz to 1 GHz. The high current may be in the range of at least one of about 1 A to 100 kA, 10 A to 100 kA, 1000 A to 100 kA, 10 kA to 50 kA. The high discharge current density may be in the range of at least one of 0.1 A/cm² to 1,000,000 A/cm², 1 A/cm² to 1,000,000 A/cm², 10 A/cm² to 1,000,000 A/cm², 100 A/cm² to 1,000,000 A/cm², and 1 kA/cm² to 1,000,000 A/cm². In an embodiment, at least one of the breakdown and secondary high current power sources may be applied intermittently. The intermittent frequency may be in the range of at least one of about 0.001 Hz to 1 GHz, 0.01 Hz to 100 MHz, 0.1 Hz to 10 MHz, 1 Hz to 1 MHz, and 10 Hz to 100 kHz. The duty cycle may be in the range of at least one of about 0.001% to 99.9%, 1% to 99%, and 10% to 90%. In an embodiment, comprising an AC such as RF power source and a DC power source, the DC power source is isolated from the AC power source by at least one capacitor. In an embodiment, the source of H to form hydrinos such as at least one of $H_2$ and $H_2O$ is supplied to the cell at a rate that maintains a hydrino component to the output power that is gives a desired cell gain such as one wherein the hydrino power component exceeds the input electrical power.

In an embodiment, the plasma gas is replaced by liquid $H_2O$ that may be pure or comprise an aqueous salt solution such as brine. The solution may be incident with AC excitation such high frequency radiation such as RF or microwave excitation. The excited medium comprising $H_2O$ such as brine may be placed between a RF transmitter and receiver. The RF transmitter or antenna receives RF power from a RF generator capable of generating a RF signal of frequency and power capable of being absorbed by the medium comprising $H_2O$. The cell and excitation parameters may be one of those of the present disclosure. In an embodiment, the RF frequency may be in the range of about 1 MHz to 20 MHz. The RF excitation source may further comprise a tuning circuit or matching network to match the impedance of the load to the transmitter. Metal particles may be suspended in the $H_2O$ or salt solution. The incident power may be high such as in the range of at least one of about 0.1 W/cm² to 100 kW/cm², 0.5 W/cm² to 10 kW/cm², and 0.5 W/cm² to 1 kW/cm² to cause arcs in the plasma due to interaction of the incident radiation with the metal particles. The size of the metal particles may be adjusted to optimize the arc formation. Suitable particle sizes are in the range of about 0.1 um to 10 mm. The arcs carry high current that causes the hydrino reaction to occur with high kinetics. In another embodiment, the plasma gas comprises $H_2O$ such as $H_2O$ vapor, and the cell comprises metal objects that are also incident with high frequency radiation such as RF or microwave. The field concentration on sharp points on the metal objects causes arcs in the plasma gas comprising $H_2O$ with a great enhancement of the hydrino reaction rate.

In an embodiment, the high-current plasma comprises an arc. The arc plasma may have a distinguishing characteristic over glow discharge plasma. In the former case, the electron and ion temperatures may be similar, and in the latter case, the electron thermal energy may be much greater than the ion thermal energy. In an embodiment, the arc plasma cell comprises a pinch plasma. The plasma gas such as one comprising $H_2O$ is maintained at a pressure sufficient to form an arc plasma. The pressure may be high such as in the range of about 100 Torr to 100 atm. In an embodiment, the breakdown and high current power supplies may be the same. The arc may be formed in high pressure $H_2O$ including liquid $H_2O$ by a power supply comprising a plurality of capacitors comprising a bank of capacitors capable of supplying high voltage such as a voltage in the range of about 1 kV to 50 kV and a high current such as one that may increase as the resistance and voltage decreases with arc formation and maintenance wherein the current may be in the range of about 0.1 mA to 100,000 A. The voltage may be increased by connecting the capacitors in series, and the capacitance may be increased by connecting the capacitors in parallel to achieve the desired high voltage and current. The capacitance may be sufficient to maintain the plasma for a long duration such as 0.1 s to greater than 24 hours. The power circuit may have additional elements to maintain the arc once formed such as a secondary high current power source. In an embodiment, the power supply comprises a plurality of banks of capacitors that may sequentially supply power to the arc wherein each discharged bank of capacitors may be recharged by a charging power source as a given charged bank of capacitors is discharged. The plurality of banks may be sufficient to maintain steady state arc plasma. In another embodiment, the power supply to provide at least one of plasma breakdown and high current to the arc plasma comprises at least one transformer. In an embodiment, the arc is established at a high DC repetition rate such as in the range of about 0.01 Hz to 1 MHz. In an embodiment, the role of the cathode and anode may reverse cyclically. The rate of the reversal may be low to maintain an arc plasma. The cycle rate of the alternating current may be at least one of about 0 Hz to 1000 Hz, 0 Hz to 500 Hz, and 0 Hz to 100 Hz. The power supply may have a maximum current limit that maintains the hydrino reaction rate at a desired rate. In an embodiment, the high current is variable to control the hydrino-produced power to provide variable power output. The high current limit controlled by the power supply may be in the range of at least one of about 1 kA to 100 kA, 2 kA to 50 kA, and 10 kA to 30 kA. The arc plasma may have a negative resistance comprising a decreasing voltage behavior with increasing current. The plasma arc cell power circuit may comprise a form of positive impedance such as an electrical ballast to establish a stable current at a desired level. The electrodes may be in a desired geometry to provide and electric field between the two. Suitable geometries are at least one of a center cylindrical electrode and an outer concentric electrode, parallel-plate electrodes, and opposing pins or cylinders. The electrodes may provide at least one of electron thermionic and field emission at the cathode to support the arc plasma. High current densities such as ones as high as about 106 A/cm² may be formed. The electrode may be comprised of at least one of a material that has a high melting point such as one from the group of a refractory metal such as W or Mo and carbon and a material that has a low reactivity with water such as one from the group of Cu, Ni, Pb, Sb, Bi, Co, Cd, Ge, Au, Ir, Fe, Hg, Mo, Os, Pd, Re, Rh, Ru, Se, Ag, Tc, Te, Tl, Sn, W, Al, V, Zr, Ti, Mn, Zn, Cr, and In. In an embodiment, the electrodes may be movable. The electrodes may be placed in close or direct contact with each other and then mechanically separated to initiate and maintain the arc plasma. In this case, the breakdown voltage may be much less than the case wherein the electrodes are permanently separated with a fixed gap. The voltage applied to form the arc with movable or gap adjustable electrodes may be in the range of at least one of about 0.1 V to 20 kV, 1 V to 10 kV, and 10 V to 1 kV. The electrode separation may be adjusted to maintain a steady arc at a desire current or current density.

Figure 10:
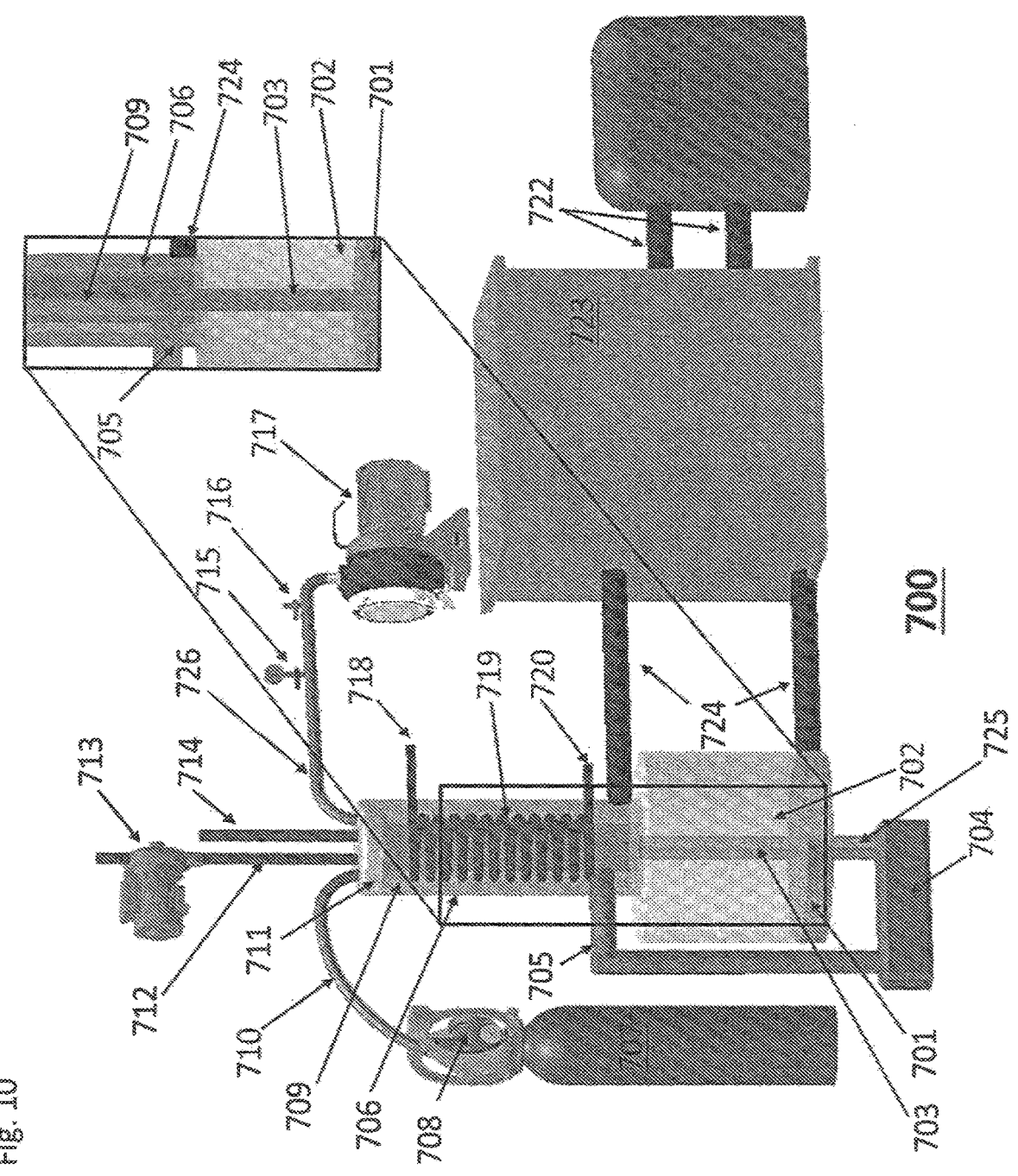
FIG. 10 is a schematic drawing of a $H_2O$ arc plasma cell power generator with excerpt showing the inside of the arc plasma vessel in accordance with an embodiment of the present disclosure.

In an embodiment, the catalyst comprising at least one of OH, HOH, $O_2$, nO, and nH (n is an integer) is generated in a water-arc plasma. A schematic drawing of a $H_2O$ arc plasma cell power generator 700 is shown in FIG. 10. The arc plasma cell 709 comprises two electrodes such as an outer cylindrical electrode 706 and a center axial electrode 703 such as a center rod that with a cell cap 711 and an insulator base 702 that can define an arc plasma chamber of cell 709 capable of at least one of a vacuum, atmospheric pressure, and a pressure greater than atmospheric. The cell 709 is supplied with an arc plasma gas or liquid such as $H_2O$. Alternatively, the electrodes 703 and 706 are immersed in the arc plasma gas or liquid such as $H_2O$ contained in a vessel 709. The $H_2O$ may be made more conductive to achieve arc breakdown at a lower voltage by the addition of a source of ions such as an ionic compound that may dissolve such as a salt. The salt may comprise a hydroxide or halide such as an alkali hydroxide or halide or others of the present disclosure. The supply may be from a source such as a tank 707 having a valve 708 and a line 710 through which the gas or liquid flows into the cell 709, and exhaust gases flow out of the cell through outlet line 726 having at least one pressure gauge 715 and valve 716 where in a pump 717 removes gases from the cell 709 to maintain at least one of a desired flow and pressure. In an embodiment, the plasma gas is maintained at a high flow condition such as supersonic flow at high pressure such as atmospheric pressure and higher to provide adequate mass flow of the reactants to the hydrino reaction to produce hydrino-based power a desired level. A suitable exemplary flow rate achieves a hydrino-based power that exceeds the input power. Alternatively, liquid water may be in the cell 709 such as in the reservoir having the electrodes as the boundaries. The electrodes 703 and 706 are connected to a high voltage-high current power supply 723 through cell power connectors 724. The connection to the center electrode 703 may be through a base plate 701. In an embodiment, the power supply 723 may be supplied by another power supply such as a charging power supply 721 through connectors 722. The high voltage-high current power supply 723 may comprise a bank of capacitors that may be in series to provide high voltage and parallel to provide high capacitance and a high current, and the power supply 723 may comprise a plurality of such capacitor banks wherein each may be temporally discharged and charged to provide a power output that may approach a continuous output. The capacitor bank or banks may be charged by the charging power supply 721.

In an embodiment, an electrode such as 703 may be powered by an AC power source 723 that may be high frequency and may be high power such as that provided by an RF generator such as a Tesla coil. In another embodiment, the electrodes 703 comprise an antennae of a microwave plasma torch. The power and frequency may be one of the present disclosure such as in the range of about 100 kHz to 100 MHz or 100 MHz to 10 GHz and 100 W to 500 kW per liter, respectively. In an embodiment, the cylindrical electrode may comprise only the cell wall and may be comprised of an insulator such as quartz, ceramic, or alumina. The cell cap 711 may further comprise an electrode such as a grounded or ungrounded electrode. The cell may be operated to form plasma arcs or streamers of the $H_2O$ that at least partially covers the electrode 703 inside of the arc plasma cell 709. The arcs or steamers greatly enhance the hydrino reaction rate.

In an embodiment, the arc plasma cell 709 is closed to confine the thermal energy release. The water inside of the then sealed cell is in the standard conditions of a liquid and gaseous mixture according to the $H_2O$ phase diagram for the desired operating temperature and pressure as known by those skilled in the art. The operating temperature may be in the range of about 25° C. to 1000° C. The operating pressure may be in the range of at least one of about 0.001 atm to 200 atm, 0.01 atm to 200 atm, and 0.1 atm to 100 atm. The cell 709 may comprise a boiler wherein at least one phase comprising heated water, super heated water, steam, and super heated steam flow out steam outlet 714 and supply a thermal or mechanical load such as a steam turbine to generate electricity. At least one the processes of cooling of the outlet flow and condensation of steam occurs with thermal power transfer to the load, and the cooled steam or water is returned to the cell through a return 712. Alternatively, makeup steam or water is returned. The system make be closed and may further comprise a pump 713 such as a $H_2O$ recirculation or return pump to circulate the $H_2O$ in its physical phase that serves as a coolant. The cell may further comprise a heat exchanger 719 that may be internal or on the external cell wall to remove the thermal energy into a coolant that enters cold at coolant inlet 718 and exists hot at coolant outlet 720. Thereafter, the hot coolant flows to a thermal load such as a pure thermal load or a thermal to mechanical power converter or a thermal to electrical power converter such as a steam or gas turbine or a heat engine such as a steam engine and optionally a generator. Further exemplary converters from thermal to mechanical or electrical power are Rankine or Brayton-cycle engines, Stirling engines, thermionic and thermoelectric converters and other systems known in the art. System and methods of thermal to at least one of mechanical and electrical conversion are also disclosed in Mills Prior Applications that are herein incorporated by reference in their entirety.

In an embodiment, the electrodes 703 and 706 such as carbon or metal electrodes such as tungsten or copper electrodes may be fed into the cell 709 as they erode due to the plasma. The electrodes may be replaced when sufficiently eroded or replaced continuously. The corrosion product may be collected from the cell in a form such as sediment and recycled into new electrodes. Thus, the arc plasma cell power generator further comprises an electrode corrosion product recovery system 705, an electrode regeneration system 704, and a regenerated electrode continuous feed 725. In an embodiment, at least one electrode prone to the majority of the corrosion such as the cathode such as the center electrode 703 may be regenerated by the systems and methods of the present disclosure. For example, an electrode may comprise one metal chosen from Cu, Ni, Pb, Sb, Bi, Co, Cd, Ge, Au, Ir, Fe, Hg, Mo, Os, Pd, Re, Rh, Ru, Se, Ag, Tc, Te, Tl, Sn, W, Al, V, Zr, Ti, Mn, Zn, Cr, and In having a corresponding oxide that may be reduced by at least one of $H_2$ treatment, heating, and heating under vacuum. The regeneration system 704 may comprise a furnace to melt at least one of the oxide and metal and cast or extrude the electrode from the regenerated metal. The systems and methods for metal smelting and shaping or milling are well known to those skilled in the art. In another embodiment, the regeneration system 704 may comprise an electrolysis cell such as a molten salt electrolysis cell comprising metal ions wherein the electrode metal may be plated onto the electrode by electrodeposition using systems and methods that are well known in the art.

An exemplary plasma system reported in the Experimental section comprises an energy storage capacitor connected between a baseplate-and-rod electrode and a concentric electrode that contains water wherein the rod of the baseplate-and-rod electrode is below the water column. The rod is embedded in an insulator such as a Nylon or ceramic sleeve in the cylindrical section and a Nylon or ceramic block between the baseplate and the cylinder. The circuit further comprises a resistor and an inductor to cause an oscillating discharge in the water between the rod and cylinder electrodes. The capacitor may be charged by a high voltage power supply and is discharged by a switch that may comprise a spark gap in atmospheric air. The electrodes may be made of copper. The high voltage may be in the range of about 5 to 25 kV. The discharge current may be in the range of 5 to 100 kA. $H_2O$ ignition to form hydrinos at a high rate is achieved by the triggered water arc discharge wherein the arc causes the formation of atomic hydrogen and HOH catalyst that react to form hydrinos with the liberation of high power. The power from the formation of hydrinos may be in the form of thermal, plasma, and light energy. In an embodiment, all energy release may be converted to thermal energy that is captured in the sealed cell and may be used directly in thermal applications such as space and process heating or converted to mechanical energy using a heat engine or to electricity using a thermal to electric converter such as a steam turbine and generator as well as other systems known to those skilled in the art. The system may also be used to form increased binding energy hydrogen species and compounds such as molecular hydrino $H_2(1/p)$. The products may be removed at outlets 705 and 726.

In an embodiment, the hydrino cell comprises a pinched plasma source to form hydrino continuum emission. The cell comprises and cathode, an anode, a power supply, and at least one of a source of hydrogen and a source of HOH catalyst to form a pinched plasma. The plasma system may comprise a dense plasma focus source such as those known in the art. The plasma current may be very high such as greater than 1 kA. The plasma may be an arc plasma. The distinguishing features are that the plasma gas comprises at least one of H and HOH or H catalyst and the plasma conditions may be optimized to give hydrogen continuum emission. The emission may be used as a light source of EUV lithography.

IX. Additional Electrical Power Generation Embodiments

Exemplary power generation systems of the present disclosure may include two or more electrodes configured to deliver energy to a fuel source, a source of electrical power configured to deliver energy to the electrodes, and a plasma power converter. Fuel may be loaded into an area defined by the two or more electrodes, and when the source of electrical power supplies power to the electrodes, the electrodes may cause the fuel to ignite, releasing energy. Byproducts from ignition of the fuel may include heat and plasma. Accordingly, the power generated from ignition of the fuel may be in the form of thermal power and may be a highly ionized plasma of the fuel source, which may be capable of being converted directly or indirectly into electricity. Once formed, the plasma may be directed to the plasma power converter for capturing the energy of the plasma.

As used herein, the term "ignites" refers to the establishment of high reaction kinetics caused by a high current applied to the fuel. Ignition may occur at approximately atmospheric pressure, or may occur in a vacuum, for example, at pressures ranging up to approximately 101° Torr or more. Accordingly, the fuel, the electrodes, and/or the plasma converter may exist in a vacuum environment. Further, one or more of these components may exist in a suitable vacuum vessel to facilitate the creation and maintenance of a vacuum environment.

Chemical reactants of the present disclosure may be referred to as water-based that may comprise a majority $H_2O$, or solid fuel, or energetic materials (e.g., materials comprising $H_2O$ or a source of $H_2O$ and further comprising a conductive material to promote the ignition of the fuel by conducting a high applied current), or a combination thereof. Solid fuels 1003 include any materials capable of forming plasma and may include, e.g., a pellet, portion, aliquot, powder, droplet, stream, mist, gas, suspension, or any suitable combination thereof. Solid embodiments may have any suitable shape; for example, solid fuel 1003 may be shaped so as to increase the surface area of solid fuel 1003 in order to promote ignition. The term "solid fuel" may include liquid or vapor fuels. Examples of suitable solid fuels are described in the Chemical Reactor section and the Solid Fuel Catalyst Induced Hydrino Transition (SF-CIHT) Cell and Power Converter section of the disclosure, but basic required reactants may include, among other things, at least one of a source of H and a source of O, and $H_2O$ or a source of $H_2O$; and a conductor. The solid fuel and/or energetic material may comprise a source of nascent $H_2O$ catalyst, a source of H, and a conductor. An exemplary solid fuel may comprise approximately, e.g., 1:1:1 mole ratios of transition metal oxide to transition metal to water, though any material may be included in a ratio of approximately 2:1 or 10:1 relative to any of the other materials. Water-based fuels comprising a majority $H_2O$ may comprise water or a water-based mixture or solution, e.g., water with one or more impurities. The water may be absorbed within another material and may include a conducting element dissolved or mixed within it. Though many of the exemplary embodiments refer to use with a "solid fuel," devices for use with all chemical reactants, including water-based fuels, are contemplated herein.

The fuel or energetic material may be conductive, for example, a metal, a metal oxide, or a conducting element. In some embodiments, a conductive matrix may be used to allow a high current to permeate solid fuel 1003 during ignition and/or to cause the mixture to be conductive. For example, chemical reactants may be misted or coated onto a mesh as a slurry and dried before being subjected to an electrical pulse. Chemical reactants may be loose or may be contained in a sealed vessel, for example, a sealed metal vessel, such as a sealed aluminum vessel. Some fuels may not be used in conjunction with a conductive vessel, including, for example, certain fuel pellets made of, e.g., alkaline earth halides, magnesium chloride, some transition metals or metal oxides, activated carbons, or any suitable materials or combinations thereof.

In an embodiment, the fuel 1003 comprises reactants that constitute hydrino reactants of the disclosure comprising at least one source of catalyst or a catalyst comprising nascent $H_2O$, at least one source of atomic hydrogen or atomic hydrogen, and further comprising at least one of a conductor and a conductive matrix. In an embodiment, the fuel 1003 comprises at least one of a source of a solid fuel or energetic material of the current disclosure and a solid fuel or energetic material of the current disclosure. In an embodiment, exemplary solid fuels 1003 comprise a source of $H_2O$ and a conductive matrix to form at least one of the source of catalyst, the catalyst, the source of atomic hydrogen, and the atomic hydrogen. The $H_2O$ source may comprise at least one of bulk $H_2O$, a state other than bulk $H_2O$, a compound or compounds that undergo at least one of react to form $H_2O$ and release bound $H_2O$. The bound $H_2O$ may comprise a compound that interacts with $H_2O$ wherein the $H_2O$ is in a state of at least one of absorbed $H_2O$, bound $H_2O$, physisorbed $H_2O$, and waters of hydration. The fuel 1003 may comprise a conductor and one or more compounds or materials that undergo at least one of release of bulk $H_2O$, absorbed $H_2O$, bound $H_2O$, physisorbed $H_2O$, and waters of hydration, and have $H_2O$ as a reaction product. Further exemplary solid or energetic material fuels 1003 are a hydrated hydroscopic material and a conductor; hydrated carbon; hydrated carbon and a metal; a mixture of a metal oxide, a metal or carbon, and $H_2O$; and a mixture of a metal halide, a metal or carbon, and $H_2O$. The metal and metal oxide may comprise a transition metal such as Co, Fe, Ni, and Cu. The metal of the halide may comprise an alkaline earth metal such as Mg or Ca and a halide such as F, Cl, Br or I. The metal may have a thermodynamically unfavorable reaction with $H_2O$ such as at least one of the group of Cu, Ni, Pb, Sb, Bi, Co, Cd, Ge, Au, Ir, Fe, Hg, Mo, Os, Pd, Re, Rh, Ru, Se, Ag, Tc, Te, Tl, Sn, W, Al, V, Zr, Ti, Mn, Zn, Cr, and In wherein the fuel 1003 may be regenerated by addition of $H_2O$. The fuel 1003 that constitute hydrino reactants may comprise at least one of slurry, solution, emulsion, composite, and a compound.

Figure 12:
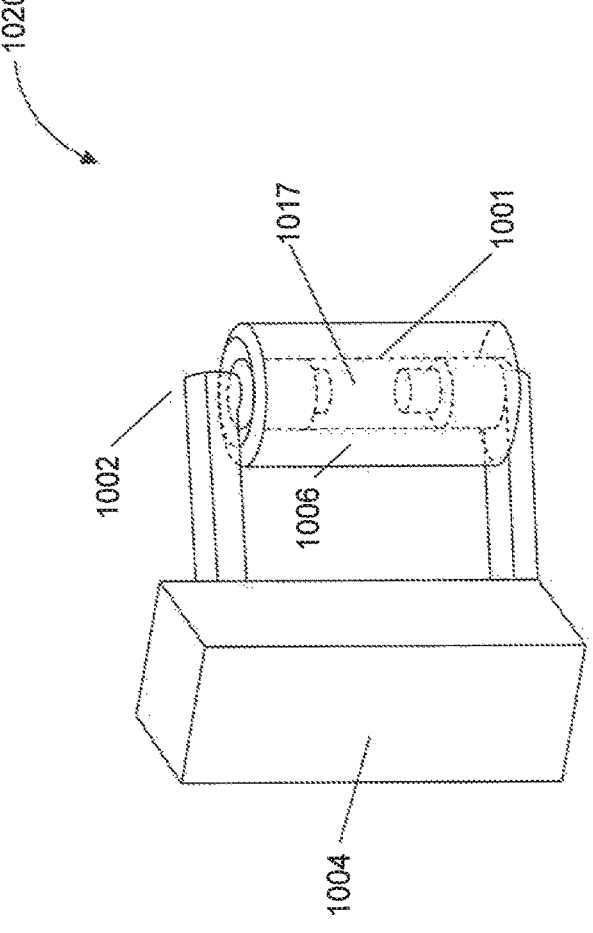
FIG. 12 depicts an exemplary power generation system, according to an embodiment of an embodiment of the present disclosure.

As is shown in FIG. 12, a number of electrodes 1002 define a space 1017 between the electrodes for receiving and/or containing solid fuel 1003. Electrodes 1002 may be configured to deliver electrical power to solid fuel 1003, for example, in a short burst of low-voltage, high-current electrical energy. For example, in some embodiments in which a solid fuel is used, a lower voltage and a higher current may be applied to the fuel to promote ignition. For example, less than 10 V (e.g., 8 V) and approximately 14,000 A/cm$^2$ may be applied to a solid fuel. In embodiments in which a higher voltage is applied to a solid fuel, a conductor may not be needed to promote ignition. When a lower voltage is applied to a fuel, a conductor may be used to promote ignition. In some embodiments, the reaction rate of converting chemical reactants into plasma may depend, at least in part, on the application or development of a high current to the reactants. For example, in some embodiments in which a water-based fuel is used, approximately 4.5 kV and approximately 20,000 A/cm$^2$ may be applied to the fuel. Electrodes 1002 may apply a low-voltage, high-current, high-power pulse to solid fuel 1003 that causes a very rapid reaction rate and energy release. The energy release may be very high and may generate streams of plasma that flow outwards in opposite directions at high velocities such as supersonic velocities.

In an exemplary embodiment, electrodes 1002 may apply a 60 Hz voltage with less than a 15 V peak, and the current may be between approximately 10,000 A/cm$^2$ and 50,000 A/cm$^2$ peak, and the power may be between approximately 50,000 W/cm$^2$ and 750,000 W/cm$^2$. A wide range of frequencies, voltages, currents, and powers may be suitable; for example, ranges of about 1/100 times to 100 times the afore-mentioned parameters may also be suitable. For example, the solid fuel or energetic material may be ignited by a low-voltage, high-current pulse, such as one created by a spot welder, achieved by confinement between two copper electrodes of a Taylor-Winfield model ND-24-75 spot welder. In some embodiments, the 60 Hz voltage may be about 5 to 20 V RMS, and the current may be about 10,000 A to 40,000 A.

The voltage may be selected to cause a high AC, DC, or an AC-DC mixture of current that is in the range of, e.g., approximately 100 A to 1,000,000 A, 1 kA to 100,000 A, or 10 kA to 50 kA. The DC or peak AC current density may be in the range of, e.g., approximately 100 A/cm$^2$ to 1,000,000 A/cm$^2$, 1,000 A/cm$^2$ to 100,000 A/cm$^2$, 2,000 A/cm$^2$ to 50,000 A/cm$^2$, 10,000 A/cm$^2$ to 50,000 A/cm$^2$, or 5,000 A/cm$^2$ to 100,000 A/cm$^2$, for example, 5,000 A/cm$^2$, 10,000 A/cm$^2$, 12,000 A/cm$^2$, 14,000 A/cm$^2$, 18,000 A/cm$^2$, or 25,000 A/cm$^2$. For highly conducive fuels the DC or peak AC voltage may be in the range of about, e.g., 0.1 V to 1 kV, 1 V to 100 V, 1 V to 20 V, or 1 V to 15 V. For highly resistive solid fuels such as water-based solid fuels that comprise a majority $H_2O$, the DC or peak AC voltage may be in the range of about, e.g., 100 V to 50 kV, 1 kV to 30 kV, 2 kV to 15 kV, or 4 kV to 10 kV. The AC frequency may be in the range of, e.g., approximately 0.1 Hz to 10 GHz, 1 Hz to 1 MHz, 10 Hz to 100 kHz, or 100 Hz to 10 kHz. The pulse time may be in the range of about, e.g., $10^{-6}$ s to 10 s, $10^{-5}$ s to 1 s, $10^{-4}$ s to 0.1 s, or $10^{-3}$ s to 0.01 s.

In some embodiments, the current, voltage, frequency, or pulse time may be determined, at least in part, by the type of solid fuel 1003 or energetic material used, or the conductivity of the fuel or energetic material used. The voltage may be determined according to the desired current multiplied by the resistance of the fuel or energetic material sample. For example, if the resistance of the solid fuel or energetic material sample is of the order of 1 mohm, the voltage applied may be lower, such as <10 V. In the exemplary case wherein the fuel comprises 100% $H_2O$ or essentially 100% $H_2O$ having a resistance that is very high such as greater than 1 Mohm, the voltage may be high and, in some embodiments, may be above the breakdown voltage (e.g., >5 kV) of $H_2O$. In embodiments spanning the two extreme cases, the DC or peak AC voltage may be in at least one range chosen from about 0.1 V to 500 kV, 0.1 V to 100 kV, and 1 V to 50 kV. The AC frequency may be in the range of about 0.1 Hz to 10 GHz, 1 Hz to 1 MHz, 10 Hz to 100 kHz, or 100 Hz to 10 kHz. In one embodiment, a DC voltage may be discharged to create plasma such as arc plasma comprising ionized $H_2O$ wherein the current is underdamped and oscillates as it decays.

In some embodiments, a high-current pulse with the desired voltage and current may be achieved using the discharge of capacitors, such as supercapacitors, that may be connected in series or in parallel. The current may be DC or may be conditioned with circuit elements, including, e.g., a transformer (such as a low voltage transformer). The capacitor may be charged by or may be included in an electrical power source 1004, which may include, e.g., a power grid, a generator, a fuel cell, a battery, or a portion of an electrical output of the power generator system 1020 or another such power generator system e.g. In an exemplary embodiment, a suitable frequency, voltage, and current waveform may be achieved by power conditioning the output of the capacitors or battery. In an embodiment, an exemplary circuit achieves a current pulse of 15,000 A at 8 V.

In some exemplary water-based fuel embodiments comprising mostly $H_2O$, the high-current plasma generated may be in the form of arc plasma. Plasma gas, such as one comprising $H_2O$, may be maintained at a pressure sufficient to form arc plasma. The arc may be formed in high-pressure (e.g., in the range of about 100 Torr to 100 atm) $H_2O$, including liquid $H_2O$, by a power supply capable of supplying a high voltage such (e.g., in the range of about 1 kV to 50 kV) and a high current (e.g., in the range of about 0.1 mA to 100,000 A), which may increase as the resistance and voltage decreases with arc formation and maintenance. Exemplary power supplies may include a series of capacitors that may be connected in series to increase the voltage and in parallel to increase the capacitance and the current. The capacitance with optional dynamic recharging of the capacitors may be sufficient to maintain the plasma for a longer duration, for example, for approximately 0.1 s to greater than 24 hours. In some embodiments, the breakdown and high current power supplies may be the same. The system may comprise a second power supply to dynamically recharge the capacitors.

An exemplary power generation system may include additional elements to help maintain the arc once formed, such as a secondary high-current power source. In some embodiments, the power supply may include a plurality of capacitors in series or parallel that may sequentially supply power to the arc. The plurality of capacitors may be sufficient to maintain steady state arc plasma. In some embodiments, the arc may be established at a higher DC repetition rate, e.g., in the range of about 0.01 Hz to 1 MHz, and the role of the cathode and anode may reverse cyclically. The rate of the reversal may be low to maintain arc plasma. The cycle rate of the alternating current may be at least one of about 0 Hz to 1000 Hz, 0 Hz to 500 Hz, and 0 Hz to 100 Hz. The power supply may have a maximum current limit that substantially maintains the plasma reaction rate at a desired rate. In some embodiments, the high current may be variable to control the plasma-produced power to provide variable power output. The high current limit controlled by the power supply may be in the range of at least one of about 1 kA to 100 kA, 2 kA to 50 kA, and 10 kA to 30 kA.

Catalysts for a water-based fuel embodiment may include at least one of OH, $H_2O$, O2, nO, and nH (n is an integer) to promote generation of water-arc plasmas. An exemplary power generation system may include an energy storage capacitor. The capacitor may be charged by a high-voltage power supply and may be discharged by a switch that may include a spark gap in atmospheric air. The high voltage may be in the range of about 4 to 25 kV, for example. The discharge current may be in the range of 5 to 100 kA, for example. $H_2O$ ignition to form plasma at a high rate may be achieved by the triggered water arc discharge so that the arc causes the formation of atomic hydrogen and HOH catalysts that react to form plasma with the liberation of high power. The power from the reaction may be in the form of thermal, plasma, and light energy. All energy release may be converted to thermal energy that may be used directly in thermal applications (such as space and process heating, e.g.) or converted to electricity using a heat engine (such as a steam turbine, e.g.).

Electrodes 1002 may be formed of any suitable material for substantially withstanding fuel ignition and the resulting heat generation. For example, electrodes 1002 may be formed of carbon, which may decrease or substantially prevent loss of conductivity that may occur due to oxidation at the surface. The electrodes may be formed of a refractory metal that is stable in a high-temperature atmospheric environment, for example, high-temperature stainless steel, copper, or any other suitable material or combinations of materials. Electrodes 1002 may include a coating for protecting electrodes 1002 from the ignition process. Electrodes 1002 may be coated with or formed of a suitable conducting material that is resistant to melting or corroding, e.g., a refractory alloy, a high-temperature, oxidation-resistant alloy [such as TiAlN], or a high-temperature stainless steel), or any suitable combination thereof. Additionally, electrodes 1002 may be formed of a material that is substantially non-reactive in an aqueous environment. One or more electrodes may include, for example, one or more of Cu, Ni, Pb, Sb, Bi, Co, Cd, Ge, Au, Ir, Fe, Hg, Mo, Os, Pd, Re, Rh, Ru, Se, Ag, Tc, Te, Tl, Sn, W, Al, V, Zr, Ti, Mn, Zn, Cr, and In.

The geometrical area of the electrodes may facilitate high current density to the fuel sample to be ignited and, in some instances, to the entire fuel sample. While two electrodes 1002 are depicted in the exemplary figures, any number of electrodes may be used, for example, three or more electrodes may together define an area for receiving solid fuel 1003, or multiple sets of electrodes 1002 may be included in power generation system 1020 and may define multiple regions for receiving fuel.

Figure 13A:
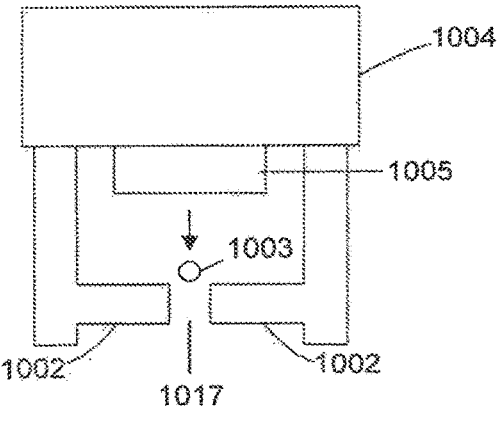
FIG. 13A depicts an exemplary power generation system in an open state, according to an embodiment of the present disclosure.
Figure 13C:
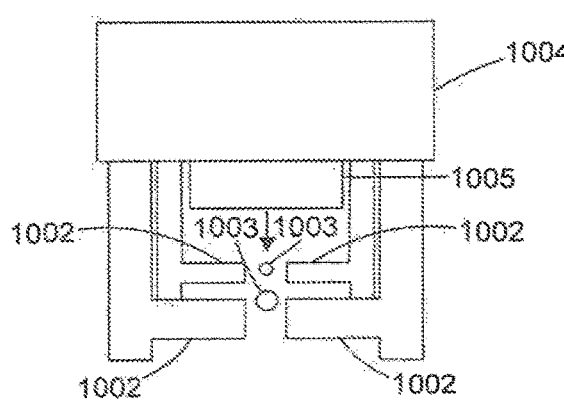
FIG. 13C depicts an exemplary power generation system in an open state, according to an embodiment of the present disclosure.
Figure 13B:
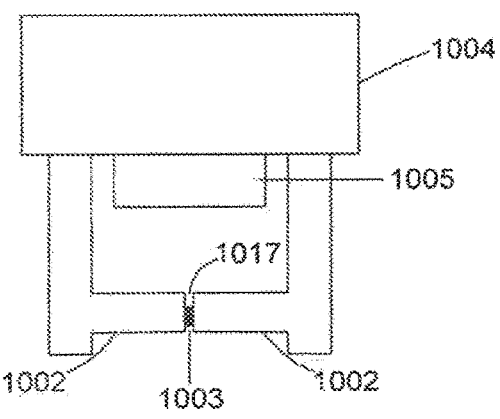
FIG. 13B depicts the exemplary power generation system of FIG. 13A in a closed state.
Figure 13D:
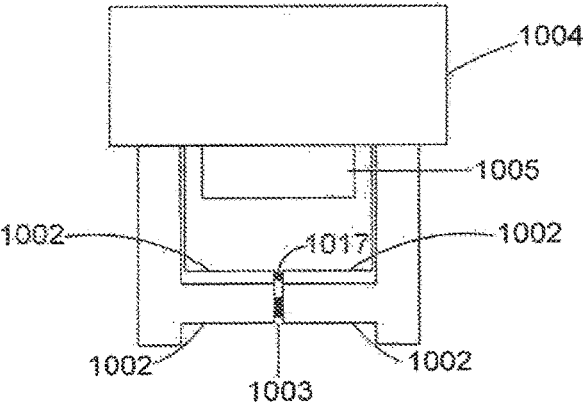
FIG. 13D depicts the exemplary power generation system of FIG. 13C in a closed state.

The space between the electrodes for receiving solid fuel 1003, shown in FIG. 12 as fuel loading region 1017, may be smaller than the size of each of the electrodes defining the area, respectively, or may be the same size or larger than the size of the electrodes. As is shown in FIGS. 13A and 13B, the size of fuel loading region 1017 may vary. For example, electrodes 1002 may be configured to move further apart from each other (FIG. 13A) or closer together to each other (FIG. 13B). As is depicted in FIGS. 13C and 13D, power generation system 1020 may include a plurality of electrodes defining a plurality of fuel loading regions 1017, which may also be moveable relative to each other, or alternatively, may be stationary. For example, one set of electrodes may be moveable and one set may be stationary, or both sets may be moveable or both sets may be stationary. In moveable embodiments, the variation in size of fuel loading region 1017 may be fixed, e.g., electrodes 1002 may move at a fixed distance relative to each other. In other embodiments, the variation in size of fuel loading region 1017 may change, e.g., to accommodate fuel samples of different sizes or to increase or decrease power generation or the amount of voltage or current delivered by electrodes 1002 to solid fuel 1003.

As is shown in FIGS. 13A and 13C, electrodes 1002 may move further apart from each other when receiving solid fuel 1003 and may move closer together once solid fuel 1003 is within fuel loading region 1017, as is shown in FIGS. 13B and 13D. As discussed above, electrodes 1002 may cooperate to define fuel loading region 1017. Electrodes 1002 may move apart from each other or closer together to each other, for example, to increase or decrease the size of fuel loading region 1017 to facilitate delivery, maintain fuel within fuel loading region 1017, and/or position solid fuel 1003 within fuel loading region 1017. In some embodiments, one electrode may move closer or further from another electrode, while the other electrode remains in place, while in other embodiments, both electrodes 1002 may be moveable. Movement of electrodes 1002 relative to each other may facilitate ignition of solid fuel 1003 within fuel loading region 1017. For example, collision of electrode surfaces may promote ignition, or rotational or friction-generating movement of one or both electrodes may promote ignition. In other embodiments, electrodes 1002 may each be stationary.

Figures 14A, 14B:
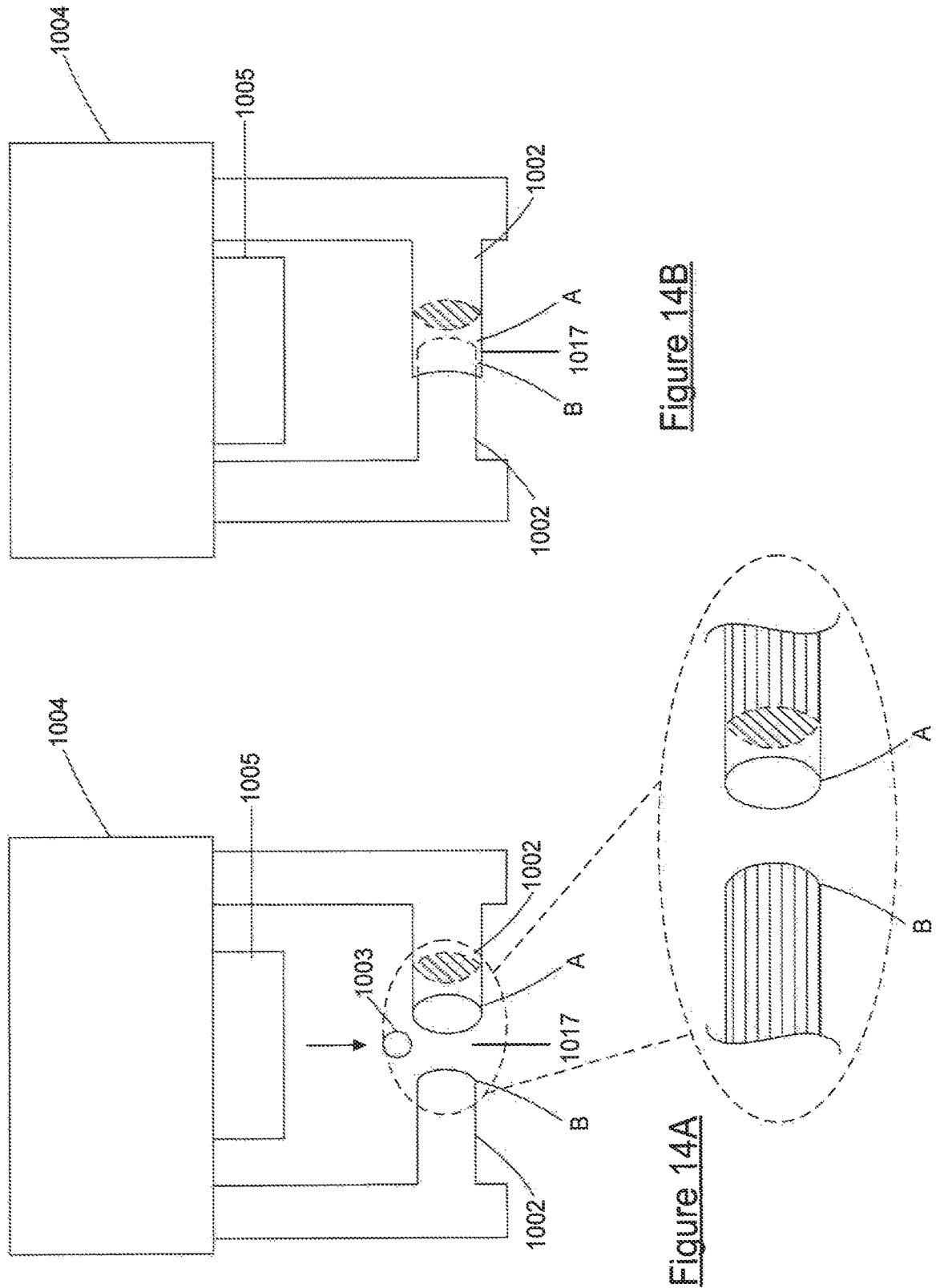
FIGS. 14A and 14B depict various perspectives of an exemplary power generation system, according to an embodiment of the present disclosure.

As is shown in FIGS. 14A and 14B, to better confine solid fuel 1003, one of electrodes 1002 may include a male portion, depicted as region A, and one of electrodes 1002 may include a female portion, depicted as region B. The male and female portions may be configured to cooperatively form a chamber capable of housing solid fuel 1003, as is shown in FIG. 14B. The chamber, and thus fuel loading region 1017, may be open or may be closed off, entirely or in part, from the surrounding environment. Additionally, the chamber may be configured to open and/or close with or without the movement of electrodes 1002 further or closer relative to each other. For example, the male and female portions may include an opening or a moveable panel or door for loading solid fuel 1003 into the chamber defined by electrodes 1002.

Further, the pressures achieved in loading region 1017 may also facilitate fuel ignition and/or plasma generation and manipulation. Plasma generated from the ignition of solid fuel 1003 may by highly reactive, and containing the plasma within a vacuum environment may increase control over the plasma generation and conversion process. For example, a vacuum environment may reduce the collision of ions with the surrounding air and/or control the reaction of plasma with surrounding oxygen. In various embodiments, loading region 1017 may be enclosed within a suitable vacuum vessel, or electrodes 1002, a plasma-to-electric converter 1006, and/or any other suitable components of system 1020 may be included within a vacuum vessel. In some embodiments, all of system 1020 may be included in a vacuum vessel. Suitable pressures may range from approximately atmospheric pressure to approximately $10^{-10}$ Torr or more. To create and maintain vacuum pressures, power generation system 1020 may include any suitable vacuum pumps, valves, inlets, outlets, for example. Further, a vacuum vessel may be substantially rigid or substantially flexible (for example, a bag or other deformable material), and may be formed of any suitable material, including, e.g., metal or plastic. Suitable vessels may create or maintain reduced-oxygen or oxygen-free environments, reduced-gas or gas-free environments, or may contain an amount of inert gas, for example, argon, nitrogen, or other noble gases to help control the reaction of plasma.

Figure 15B:
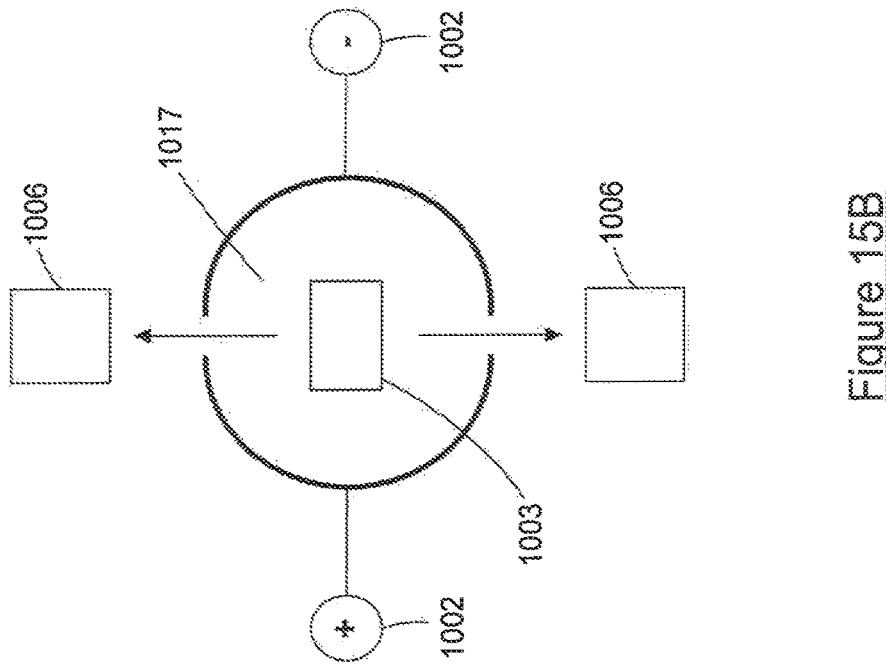
FIG. 15B depicts an exemplary configuration of components within a power generation system, according to an embodiment of the present disclosure.
Figure 15A:
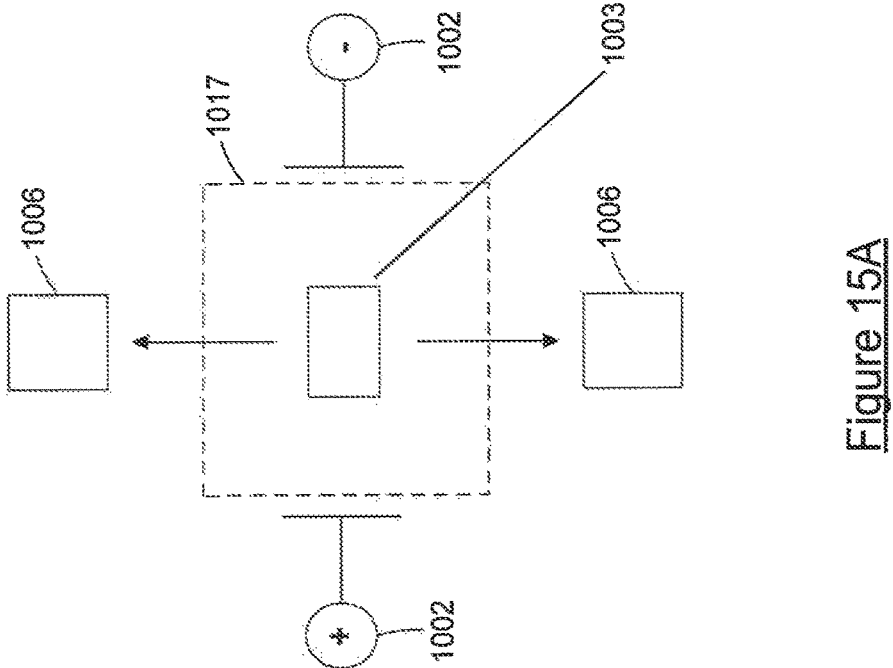
FIG. 15A depicts an exemplary configuration of components within a power generation system, according to an embodiment of the present disclosure.
Figure 15D:
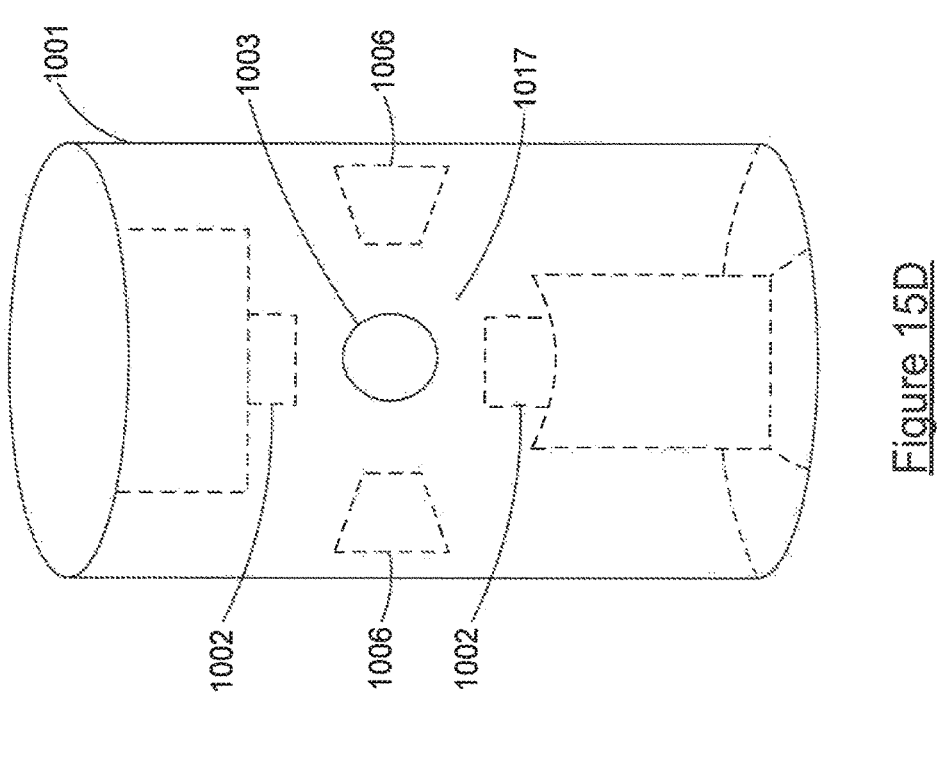
FIG. 15D depicts an exemplary configuration of components within a power generation system, according to an embodiment of the present disclosure.
Figure 15C:
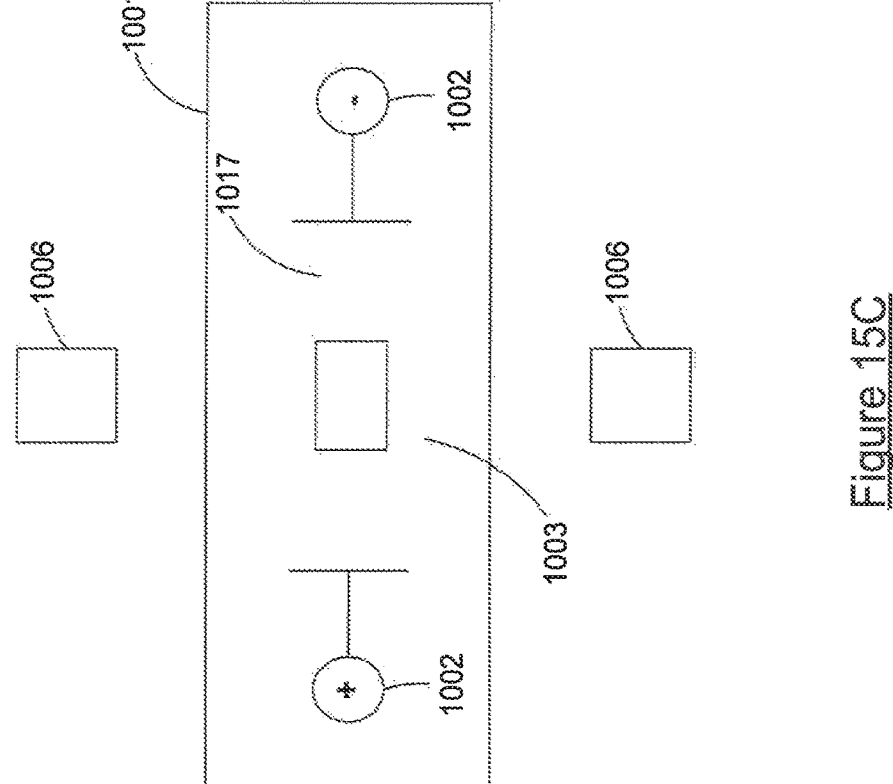
FIG. 15C depicts an exemplary configuration of components within a power generation system, according to an embodiment of the present disclosure.

In FIG. 15A, fuel loading region 1017 is flanked by electrodes 1002, and electrodes 1002 and solid fuel 1003 are open to the surrounding environment. In FIG. 15B, electrodes 1002 each include semi-circular portions configured to cooperate to form a more closed fuel loading region 1017. Electrodes 1002 may close off fuel loading region 1017 completely or may include open portions, for example, through which expanding plasma may escape. Electrodes 1002 may move closer together and further apart from each other to open and close loading region 1017, or may remain stationary. In FIG. 15C, electrodes 1002 and fuel loading region 1017 may both be partially or fully enclosed in a cell 1001. Cell 1001 may be configured to open and close to allow delivery of solid fuel 1003 within fuel loading region 1017. As discussed above, cell 1001 may include a vacuum vessel, and electrodes 1002 and fuel loading region 1017 may be exposed to negative pressures. As is shown in FIG. 15D, cell 1001 may enclose fuel loading region 1017, electrodes 1002, and plasma-to-electric converters 1006. Pressures inside cell 1001 may approximate atmospheric pressure or may be negative to expose fuel loading region 1017, electrodes 1002, and plasma-to-electric converters 1006 to vacuum pressures. As with FIG. 15C, cell 1001 may partially or fully enclose the inner components and may be configured to open and close to allow delivery of solid fuel 1003 within fuel loading area 1017.

Electrodes 1002 may be stand-alone or may be part of a larger component within power generation system 1020. For example, in the embodiment of FIG. 12, electrodes 1002 may be included as part of a catalyst-induced hydrino transition cell. A power generation system may include one or more cells. Each cell may in turn include at least two electrodes 1002. As is shown in FIG. 12, within a cell 1001, two or more electrodes 1002 may cooperate with each other to define a fuel loading region 1017. In some embodiments incorporating cell 1001, electrodes 1002 may apply a low-voltage, high-current, high-power pulse to solid fuel 1003 that causes a very rapid reaction rate and energy release. Additionally, pressures within cell 1001 may be negative to facilitate plasma generation and manipulation and to control the reactivity of the generated plasma. For example, fuel loading region 1017 and/or electrodes 1002 may exist in a vacuum of just below atmospheric pressure to approximately $10^{-10}$ Torr or more. Accordingly, any suitable vacuum pumps, valves, inlets, outlets, etc., may be included in system 1020 in order to create and maintain vacuum pressures.

In some embodiments, fuel 1003 and electrodes 1002 may be oppositely electrostatically charged to facilitate loading of solid fuel 1003 into fuel loading region 1017, which may cause solid fuel 1003 to electrostatically stick to a predetermined region of each electrode 1002 where the fuel is ignited. In the embodiment shown in FIG. 16, the surfaces of electrodes 1002 may be parallel with a gravitational axis. This may allow solid fuel 1003 to be delivered to fuel loading region 1017 from a region above electrodes 1002. Further, the regions of electrodes 1002 that define fuel loading region 1017 may be smooth or may be textured, e.g., to facilitate ignition of solid fuel 1003.

In some embodiments, electrodes 1002 may include moveable portions, for example, to promote ignition of solid fuel 1003. One electrode may include a moveable portion configured to interact with a surface of one or more other electrodes, or an electrode may include a movable portion that is configured to interact with a moveable portion of one or more other electrodes.

Figure 16:
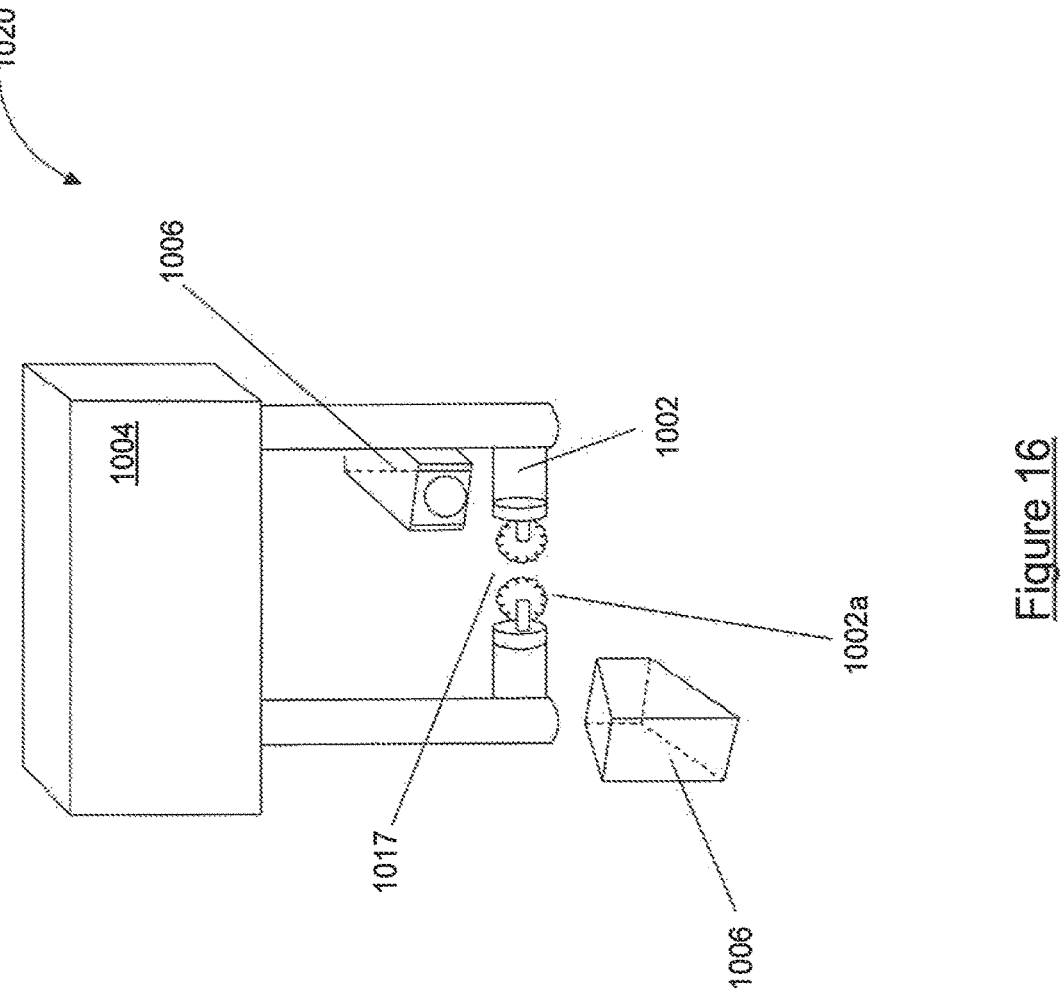
FIG. 16 depicts an exemplary power generation system, according to an embodiment of the present disclosure.

In the embodiment of FIG. 16, electrodes 1002 may include moveable compression mechanisms 1002a configured to interact with each other to apply a compressive force on solid fuel 1003. For example, one or more electrodes 1002 may include gears adjacent fuel loading region 10017. Suitable gears may include, for example, bevel gears, spur gears, helical gears, double helical gears (e.g., herringbone gears), and crossed gears, and the gears may include any suitable number or orientation of teeth. As is shown in FIG. 17A, solid fuel 1003 may be received within fuel loading region 1017 between the gears. Solid fuel 1003 may deposit in gaps formed between the teeth of a gear and may be compressed by a mating tooth of the mating gear. For example, as is shown in FIG. 17B, the gears may interact, and a gear with n teeth (where n is an integer) may receive solid fuel 1003 within an $n^{th}$ inter-tooth gap, and fuel in the n−1 inter-tooth gap may be compressed by tooth n−1 of the mating gear. In some embodiments, solid fuel 1003 and a fuel-receiving region of the gear teeth of electrodes 1002 may be oppositely electrostatically charged such that, when delivered to the electrodes, solid fuel 1003 electrostatically sticks to the region of one or both electrodes where the fuel is ignited when the teeth mesh.

In FIGS. 17A and 17B, compression mechanisms 1002a are shown as a region of electrodes 1002. In other compression, compression mechanisms 1002a may make up all of electrodes 1002. Such an embodiment is shown in FIGS. 18A and 18B. Further, while compression mechanisms 1002a may move (in these embodiments, rotate), electrodes 1002 may also move closer and further away from each compression, as is demonstrated in FIGS. 17A and 17B and FIGS. 18A and 18B. Alternatively, compression mechanisms 1002a may move (in this case, rotate) and electrodes 1002 may remain stationary.

Figure 24:
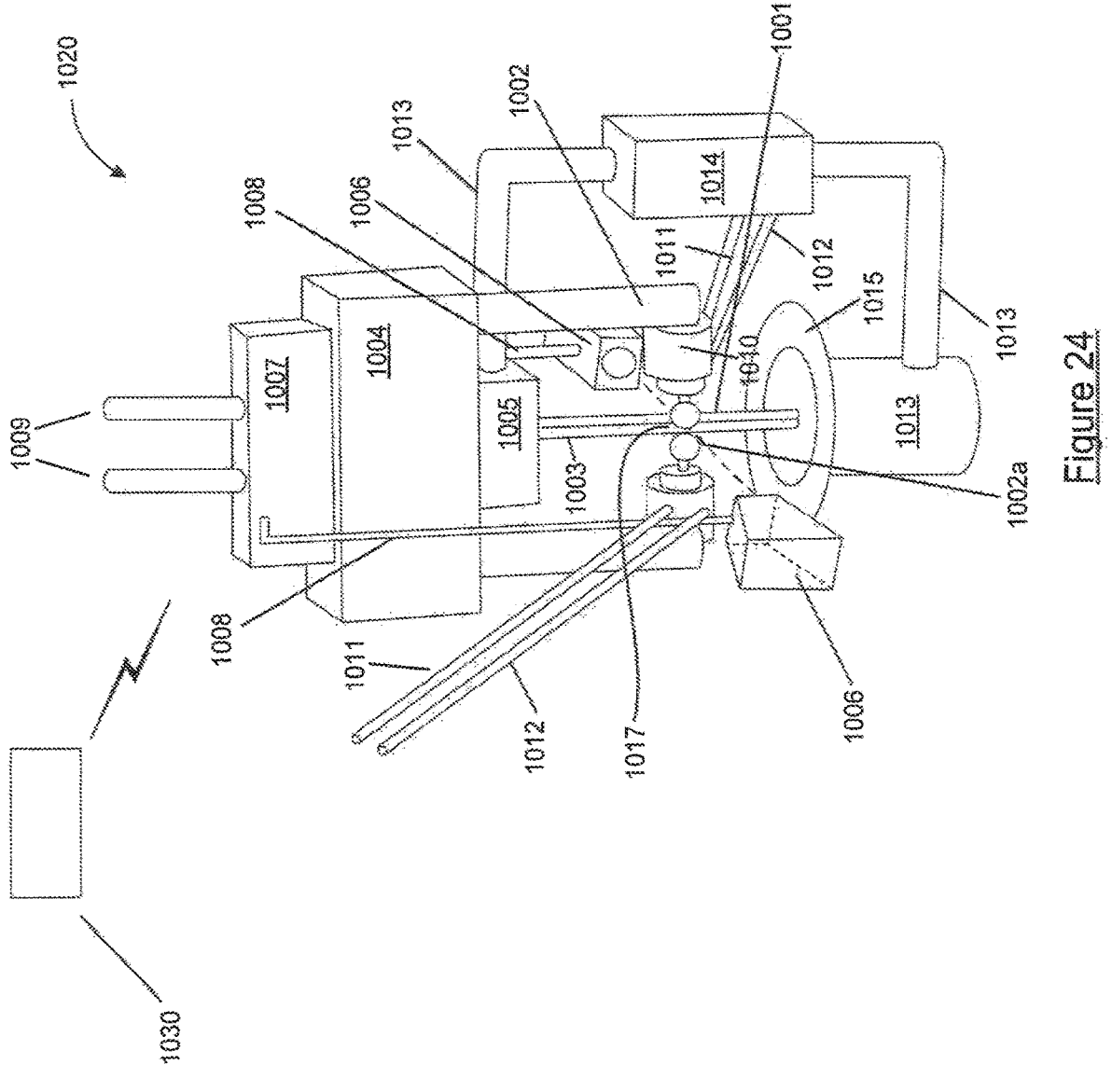
FIG. 24 depicts an exemplary power generation system, according to an embodiment of the present disclosure.

In some embodiments, one or more electrodes 1002 may include rollers instead of, or in addition to, gears as compression mechanisms 1002a. For example, the embedment depicted in FIG. 24 includes rollers in place of gears. The rollers may be located at end regions of electrodes 1002 and may be separated by a gap to facilitate delivery of solid fuel 1003 between the electrodes and may move closer to each other once solid fuel 1003 is delivered to fuel loading region 1017 in order to apply a compressive force on the fuel. In other embodiments, electrodes 1002 and the rollers may be configured to remain in place and solid fuel 1003 may be fed into the rollers from one side, for example, fed down into the rollers without movement of electrodes 1002 towards or away from each other. Solid fuel 1003 and a fuel-receiving region of the rollers of electrodes 1002 may be oppositely charged such that, when delivered to the electrodes, solid fuel 1003 electrostatically sticks to the region of one or both electrodes where the rollers meet and the fuel ignites.

In moveable embodiments, electrodes 1002 may be biased towards or away from each other. For example, in some moveable embodiments, the rollers or gears of electrodes 1002 may be biased towards each other. Biasing of electrodes 1002 or of moveable portions of electrodes 1002 may be achieved using, e.g., springs or pneumatic or hydraulic mechanisms.

Compression of solid fuel 1003 against the rollers or gears may aid in ignition, and in embodiments including gears, the meshing of teeth and compression on solid fuel 1003 may cause electrical contact between the mating teeth through a conductive fuel. In some embodiments, the gears may include a conductive material in the interdigitation region that contacts the fuel during meshing and may include an insulating material in other regions so that the current selectively flows through the fuel. For example, the gears may be formed of or coated with a non-conductive or insulating material, e.g., ceramic, quartz, diamond thin film, or any other suitable material or combination of materials, and may be coated with a conductive material, e.g., a conductive metal, in the interdigitation region. In other embodiments, the gears may be formed of a conductive material and may be coated with a non-conductive or insulating material outside of the interdigitation region. The high-current flow generated by the electrical contact between the mating teeth and the fuel may promote ignition of solid fuel 1003. The gears or rollers may be textured, e.g., to increase friction and promote ignition. In some embodiments, delivery of solid fuel 1003 may be timed to the movement of the gears or rollers.

The plasma formed by ignition of solid fuel 1003 may expand out the sides of the gears, rollers, or end regions of electrodes 1002, and a plasma-to-electric converter may be placed in the flow path to receive the plasma. In embodiments in which two or more streams of plasma are ejected from electrodes 1002 in opposite axial directions, a converter may be placed in the flow path of each stream. The axial flow may occur through a magnetohydrodynamic (IHD) converter or the plasma may be in stationary or flowing contact with a plasmadynamic (PDC) power converter. Further directional flow may be achieved with confining magnets, such as those of Helmholtz coils or a magnetic bottle, for example.

For example, in a moveable embodiment, the plasma expansion flow may occur along an axis that is parallel with the shaft of the gears (if included), which may also be transverse to the direction of fuel delivery into fuel loading region 1017. Solid fuel 1003 may be continuously delivered to gears or rollers that rotate to propel the fuel through the gap. Solid fuel 1003 may be continuously ignited as it is rotated to fill the space between the electrodes along the meshing regions of a set of gears or opposing sides of a set of rollers. An electrically conductive solid fuel 1003 may complete the circuit between the electrodes 1002, and the high-current flow through solid fuel 1003 may ignite the fuel. In some embodiments, the output power may be in a generally steady state. In some embodiments, solid fuel 1003 may be delivered intermittently to prevent the expanding plasma from disrupting the fuel stream flow. For example, delivery of solid fuel 1003 may occur at timed intervals or may be initiated based on output power, either automatically, e.g., through the use of a feedback mechanism, or manually. Exemplary delivery mechanisms will be described further below in detail.

In an exemplary embodiment, electrodes 1002 (acting as part of a power generator) may produce intermittent bursts of power from a cell 1001. Alternatively, a power generation system 1020 may include a plurality of cells 1001 that output the superposition of the individual cell's power during timed blast events of solid fuel 1003. The timing of the events among the plurality of cells may provide more continuous output power.

Electrodes 1002 may be positioned so that they make contact with one another at opposing points along the length of the electrodes to cause a sequence of high-current flow and rapid reaction kinetics along the electrode set at a given location. The opposing contact points on opposite electrodes may be made by mechanically moving the corresponding connections to the contact location or by electronically switching the connections. The connections may be made in a synchronous manner to achieve a more steady power output from the cell or plurality cells.

Following ignition, the plasma power formed may then be converted into electricity by a suitable plasma converter. A plasma converter may convert plasma into any suitable form of non-plasma power, including, e.g., mechanical, nuclear, chemical, thermal, electrical, and electromagnetic power, or any suitable combination thereof. Descriptions of exemplary suitable plasma power converters are provided in the Plasmadynamic Converter (PDC) section, the Magnetohydrodynamic (MHD) Converter section, the Electromagnetic Direct (Crossed Field or Drift) Converter, Direct Converter section, the Charge Drift Converter section, the Magnetic Confinement section, and the Solid Fuel Catalyst Induced Hydrino Transition (SF-CIHT) Cell section. The details of these and other plasma to electric power converters are given in my prior publications such as R. M. Mayo, R. L. Mills, M. Nansteel, "Direct Plasmadynamic Conversion of Plasma Thermal Power to Electricity," IEEE Transactions on Plasma Science, October, (2002), Vol. 30, No. 5, pp. 2066-2073; R. M. Mayo, R. L. Mills, M. Nansteel, "On the Potential of Direct and MIHD Conversion of Power from a Novel Plasma Source to Electricity for Microdistributed Power Applications," IEEE Transactions on Plasma Science, August, (2002), Vol. 30, No. 4, pp. 1568-1578; R. M. Mayo, R. L. Mills, "Direct Plasmadynamic Conversion of Plasma Thermal Power to Electricity for Microdistributed Power Applications," 40th Annual Power Sources Conference, Cherry Hill, NJ, June 10-13, (2002), pp. 1-4 ("Mills Prior Plasma Power Conversion Publications") which are herein incorporated by reference in their entirety and my prior applications such as Microwave Power Cell, Chemical Reactor, And Power Converter, PCT/US02/06955, filed Mar. 7, 2002 (short version), PCT/US02/06945 filed Mar. 7, 2002 (long version), U.S. Pat. No. 10,469,913 filed Sep. 5, 2003; Plasma Reactor And Process For Producing Lower-Energy Hydrogen Species, PCT/US04/010608 filed Apr. 8, 2004, U.S. Pat. No. 10,552,585 filed Oct. 12, 2015; and Hydrogen Power, Plasma, and Reactor for Lasing, and Power Conversion, PCT/US02/35872 filed Nov. 8, 2002, U.S. Pat. No. 10,494,571 filed May 6, 2004 ("Mills Prior Plasma Power Conversion Publications") herein incorporated by reference in their entirety. Heat, as well as plasma, may be produced by each cell as byproducts of the fuel ignition. The heat may be used directly or may be converted to mechanical or electrical power using any suitable converter or combination of converters, including, e.g., a heat engine, such as a steam engine or steam or gas turbine and generator, a Rankine or Brayton-cycle engine, or a Stirling engine. For power conversion, each cell may be interfaced with any converter of thermal power or plasma power to mechanical or to electrical power such as, e.g., a plasma-to-electric converter, a heat engine, steam or gas turbine system, Stirling engine, or thermionic or thermoelectric converter. Exemplary plasma converters may include a plasmadynamic power converter, an direct converter, a magnetohydrodynamic power converter, a magnetic mirror magnetohydrodynamic power converter, a charge drift converter, a Post or a Venetian Blind power converter, a gyrotron, a photon-bunching microwave power converter, a photoelectric converter, an electromagnetic direct (crossed field or drift) converter, or any other suitable converter or combination of converters. In some embodiments, a cell may include at least one cylinder of an internal combustion engine. Exemplary cells are described further herein in detail.

The plasma energy converted to electricity may, in some embodiments, be dissipated in an external circuit. As demonstrated by calculations and experimentally, greater than 50% conversion of plasma energy to electricity may be achieved in some instances.

In some embodiments, plasma power formed may be directly converted into electricity. During H catalysis, electrons are ionized from the HOH catalyst by the energy transferred from the H being catalyzed to the HOH. These electrons may be conducted in the applied, high-current circuit to prevent the catalysis reaction from being self-limiting by charge buildup. A burst is produced by the fast kinetics that in turn causes massive electron ionization. The high velocity of the radially outward expansion of the exploding fuel that, in some embodiments, may comprise an essentially 100% ionized plasma in the circumferential high magnetic field due to the applied current, and may give rise to magnetohydrodynamic power conversion at crossed electrodes. The magnitude of the voltage may increase in the direction of the applied polarity since this is the Lorentzian deflection direction due to the current direction and the corresponding magnetic field vector and radial flow directions. In an embodiment using magnetohydrodynamic power conversion and DC current, the applied high DC current may be such that the corresponding magnetic field is DC.

In an embodiment using the principles of magnetic space charge separation, a plasmadynamic power converter 1006 may be used. Due to their lower mass relative to positive ions, electrons may be confined to magnetic flux lines of a magnetized electrode, e.g., a cylindrical magnetized electrode or an electrode in an applied magnetic field. Thus, electrons are restricted in mobility, whereas, positive ions are relatively free to be collisional with the intrinsically or extrinsically magnetized electrode. Both electrons and positive ions are fully collisional with an unmagnetized counter electrode that may comprise a conductor oriented in a direction perpendicular to the magnetic field applied to the extrinsically magnetized electrode. Plasmadynamic conversion ("PDC") extracts power directly from the thermal and potential energy of the plasma and does not rely on plasma flow. Instead, power extraction by PDC exploits the potential difference between a magnetized and unmagnetized electrode immersed in the plasma to drive current in an external load and, thereby, extract electrical power directly from stored plasma thermal energy. PDC of thermal plasma energy to electricity may be achieved by inserting at least two floating conductors directly into the body of high temperature plasma. One of these conductors may be magnetized by an external electromagnetic field or permanent magnet, or it may be intrinsically magnetic. The other may be unmagnetized. A potential difference arises due to the difference in charge mobility of heavy positive ions versus light electrons. This voltage is applied across an electrical load.

Power generation system 1020 may also include additional internal or external electromagnetic or permanent magnets or may include multiple intrinsically magnetized and unmagnetized electrodes, for example, cylindrical electrodes, such as pin electrodes. The source of uniform magnetic field B parallel to each electrode may be provided by an electromagnet, e.g., one or more Helmholtz coils that may be superconducting or a permanent magnet.

The magnet current may also be supplied to solid fuel 1003 to initiate ignition. A source of electrical power 1004, as shown in FIG. 12, may supply power to electrodes 1002 to ignite solid fuel 1003. In such embodiments, the magnetic field produced by the high current of electrical power source 1004 may be increased by flowing through multiple turns of an electromagnet before flowing through solid fuel 1003. The strength of the magnetic field B may be adjusted to produce a pre-determined positive ion versus electron radius of gyration to maximize the power at the electrodes. In some embodiments, at least one magnetized electrode may be oriented parallel to the applied magnetic field B and at least one corresponding counter electrode may be oriented perpendicular to magnetic field B such that it is unmagnetized due to its orientation relative to the direction of B. The power may be delivered to a load through leads that are connected to at least one counter electrode. In some embodiments, the cell wall may serve as an electrode.

In some embodiments, the plasma produced from the ignition event may be expanding plasma. When expanding plasma is produced, magnetohydrodynamics (IHD) may be a suitable method of conversion. Alternatively, in some embodiments, the plasma may be confined. In addition to a plasma power conversion system, the power generation system may also include a plasma confinement system, e.g., solenoidal fields or a magnetic bottle, to confine the plasma and extract more of the power of the energetic ions as electricity. The magnets may include one or more electromagnetic and permanent magnets. The magnets may be open coils, e.g., Helmholtz coils. The plasma may further be confined in a magnetic bottle and by any other systems and methods known to those skilled in the art.

The plasma-to-electric power converter 1006 of FIGS. 12, 15A-15C and 16, may include a magnetohydrodynamic power converter. The positive and negative ions undergo Lorentzian direction in opposite directions and are received at corresponding electrodes to affect a voltage between them. Accordingly, two magnetohydrodynamic power converters may be used—one placed in each ion path. The typical MI HD method to form a mass flow of ions is to expand a high-pressure gas seeded with ions through a nozzle to create a high-speed flow through the crossed magnetic field with a set of electrodes crossed with respect to the deflecting field to receive the deflected ions. In the present disclosure, the pressure is typically greater than atmospheric, but not necessarily so, and the directional mass flow may be achieved by an ignition of a solid fuel to form a highly ionized, radially expanding plasma.

In one embodiment, the magnetohydrodynamic power converter is a segmented Faraday generator. In another embodiment, the transverse current formed by the Lorentzian deflection of the ion flow undergoes further Lorentzian deflection in the direction parallel to the input flow of ions (z-axis) to produce a Hall voltage between at least a first electrode and a second electrode relatively displaced along the z-axis. Such a device is known in the art as a Hall generator embodiment of a magnetohydrodynamic power converter. In some embodiments, power generation system 1020 may include a diagonal generator with a "window frame" construction having electrodes angled with respect to the z-axis in the xy-plane.

Figure 19:
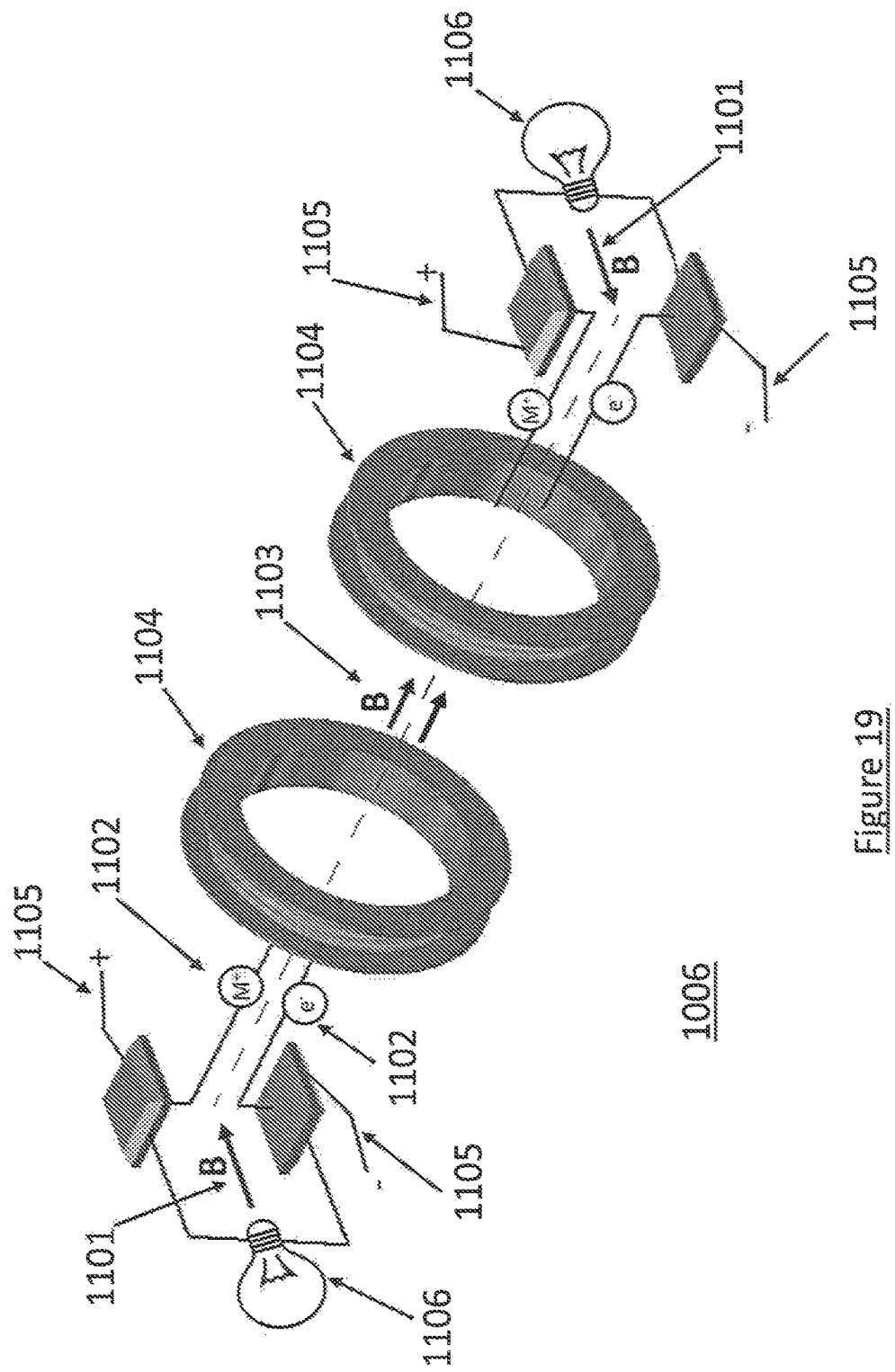
FIG. 19 depicts an exemplary plasma converter, according to an embodiment of the present disclosure.

In each case, the voltage may drive a current through an electrical load. As is shown in FIG. 19, a magnetohydrodynamic converter 1006 may include a source of magnetic flux 1101 transverse to the z-axis, and the ions may flow in a direction 1102. Thus, the ions may have preferential velocity along the z-axis due to a confinement field 1103 provided by Helmholtz coils 1104, causing the ions to propagate into the region of the transverse magnetic flux. The Lorentzian force on the propagating electrons and ions is given by. The force is transverse to the ion velocity and the magnetic field and in opposite directions for positive and negative ions. This may form a transverse current. The source of transverse magnetic field may include components that provide transverse magnetic fields of different strengths as a function of position along the z-axis in order to optimize the crossed deflection of the flowing ions having parallel velocity dispersion.

Magnetohydrodynamic power converter 1006 shown in FIG. 19 may also include at least two electrodes 1105, which may be transverse to the magnetic field to receive the transversely Lorentzian deflected ions that create a voltage across the electrodes 1105. The MHD power may be dissipated in an electrical load 1106. Electrodes 1002 of FIGS. 12-16 may also serve as MHD electrodes. Magnetohydrodynamic power converter 1006 shown in FIG. 19 may also include an additional set of Helmholtz coils (not shown) to provide the Lorentzian deflecting field to the flowing plasma in the magnetic expansion section to generate a voltage at electrodes 1105 that is applied across load 1106.

In some embodiments of magnetohydrodynamic power converter 1006, the flow of ions along the z-axis with $v_\square \gg v_\perp$ may then enter a compression section. The compression section may include an increasing axial magnetic field gradient wherein the component of electron motion parallel to the direction of the z-axis $v_\parallel$ is at least partially converted into to perpendicular motion $v_\perp$ due to the adiabatic invariant $$\frac{v_\perp^2}{B} = \text{constant.}$$

An gzilmuthal current due to $v_\perp$ may be formed around the z-axis. The current may be deflected radially in the plane of motion by the axial magnetic field to produce a Hall voltage, e.g., between an inner ring and an outer ring electrode of a disk generator magnetohydrodynamic power converter. The voltage may drive a current through an electrical load. In some embodiments, the plasma power may also be converted to electricity using an $\vec{E} \times \vec{B}$ direct converter, or any other suitable plasma converter devices.

As discussed above, to facilitate plasma and ion manipulation and conversion, portions or all of magnetohydrodynamic power converter 1006 may exist in a vacuum. For example, pressures within magnetohydrodynamic power converter 1006 may range from approximately atmospheric pressure to negative pressures of approximately $10^{-10}$ Torr or more. In some embodiments, e.g., confinement field 1103 and/or Helmholtz coils 1104 may exist in a vacuum environment, The magnetic field of magnetohydrodynamic power converter 1006 may be provided by the current of an electrical power source 1004 that may flow through additional electromagnets, in addition to flowing to solid fuel 1003. In some embodiments, the magnetic field of magnetohydrodynamic power converter 1006 may be powered by a separate power source.

As described briefly above, power generation system 1020 may include an electrical power source 1004 configured to deliver a short burst of low-voltage, high-current electrical energy to solid fuel 1003 via electrodes 1002. Any suitable electrical power source 1004 or combinations of electrical power sources 1004 may be used, for example, a power grid, a generator, a fuel cell, solar, wind, chemical, nuclear, tidal, thermal, hydropower, or mechanical source, a battery, power source 1020, or another power source 1020. Power source 1004 may include a Taylor-Winfield model ND-24-75 spot welder and an EM Test Model CSS 500N10 CURRENT SURGE GENERATOR, 8/20US UP TO 10KA. In some embodiments, electrical power source 1004 is DC, and the plasma power converter is suited to a DC magnetic field, e.g., with a magnetohydrodynamic or $\vec{E} \times \vec{B}$ power converter.

Electrical power source 1004 may supply high currents to electrodes 1002 (and cell 1001, if included), and may supply power to other components in power generation system 1020, for example, to any plasma converters or regeneration systems to convert the products of solid fuel ignition back into the initial solid fuel that may be recycled.

In some embodiments, electrical power source 1004 may also accept currents, such as the high currents given in the disclosure. By accepting current, self-limiting charge buildup from the reaction may be ameliorated. One or more sources and sinks of current may also be included. For example, power generation system 1020 may include one or more of a transformer circuit, an LC circuit, an RLC circuit, capacitors, ultra-capacitors, inductors, batteries, and other low impedance or low resistance circuits or circuit elements and electrical energy storage elements or any other devices or combination of devices suitable for accepting currents.

Figure 20:
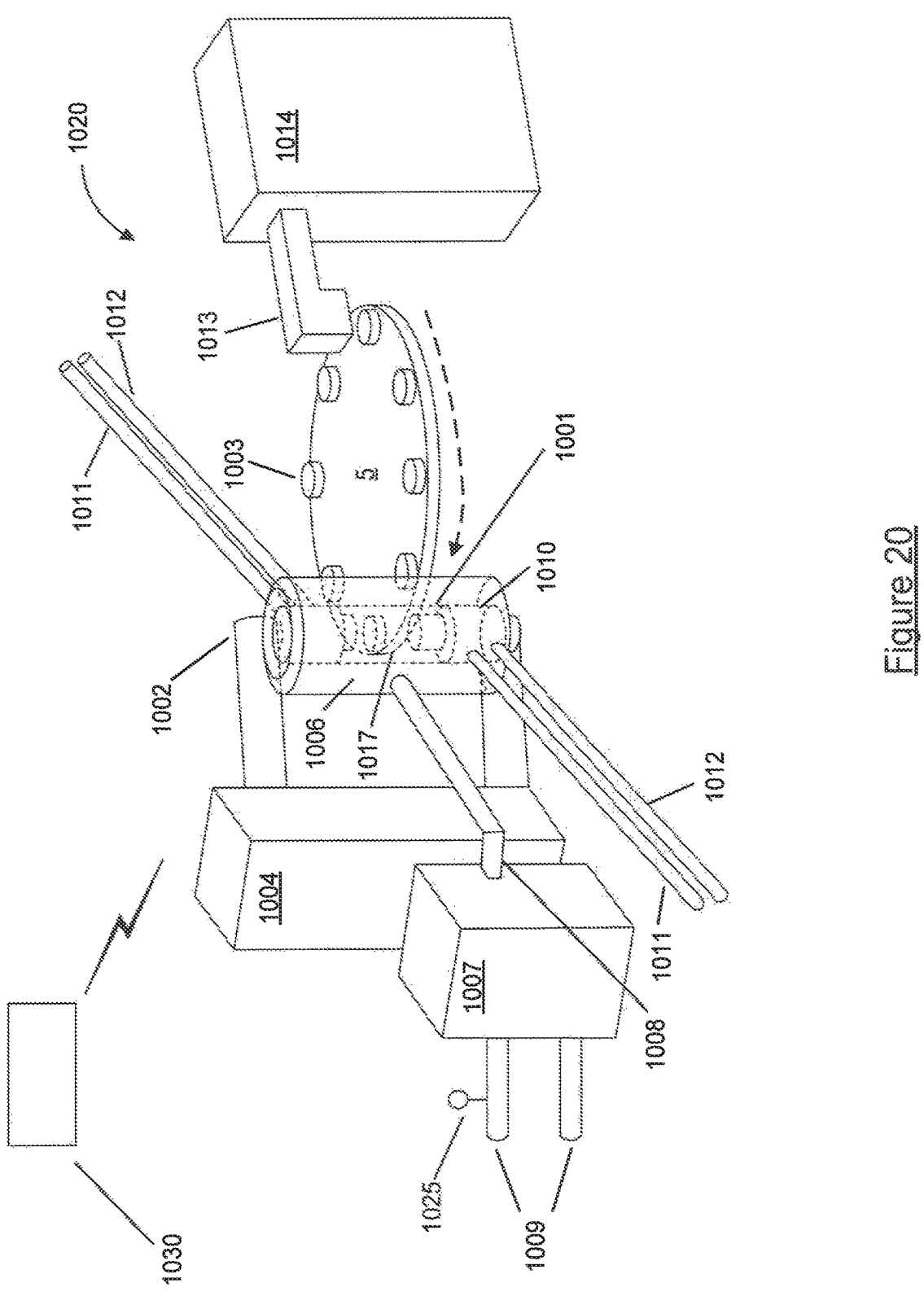
FIG. 20 depicts an exemplary power generation system, according to an embodiment of the present disclosure.
Figure 21:
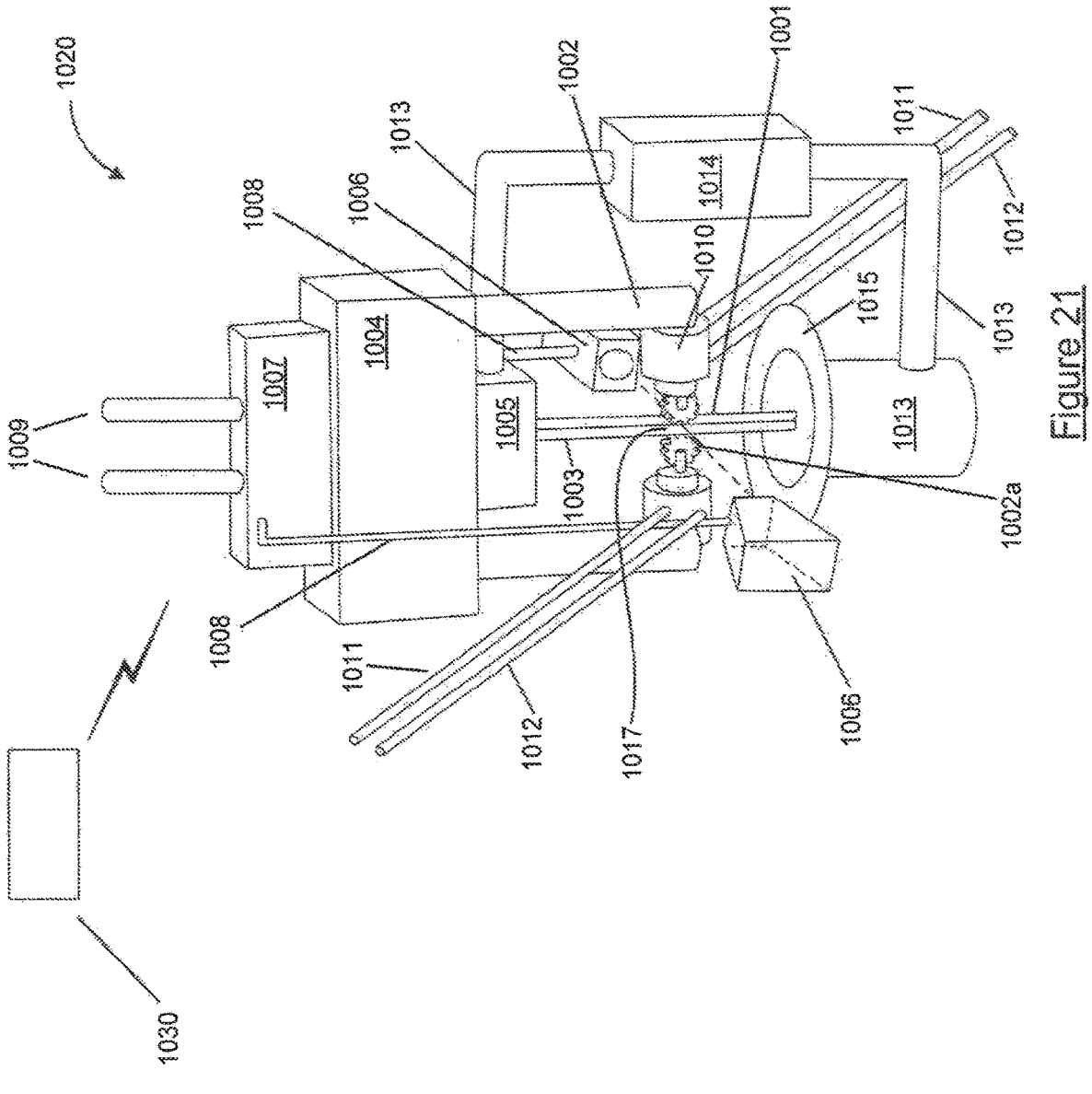
FIG. 21 depicts an exemplary power generation system, according to an embodiment of the present disclosure.

Turning to the exemplary embodiments of FIGS. 20 and 21, power generation system 1020 may include other components, in addition to the electrodes, electrical power source, and plasma-to-electric converters 1006 discussed in reference to FIGS. 12-19. For example, power generation system 1020 may include a delivery mechanism 1005 for delivering solid fuel 1003 to fuel loading region 1017 between electrodes 1002. The type of delivery mechanism included in power generation system 1020 may depend, at least in part, on the state, type, size, or shape, e.g., of fuel being delivered to fuel loading region 1017. For example, in the embodiment of FIG. 20, solid fuel 1003 is depicted in pellet form. A suitable delivery mechanism 1005 for delivering a pellet of fuel may include a carousel configured to rotate so as to deliver a pellet to fuel loading region 1017. In the exemplary embodiment of FIG. 20, delivery mechanism 1005 may carry a number of fuel pellets spaced along a peripheral region of the carousel. As the carousel rotates, consecutive pellets may be delivered to fuel loading region 1017 between electrodes 1002.

In some embodiments, the carousel may be pre-loaded with a pre-determined number of fuel pellets. While eight pellets are depicted as pre-loaded on the carousel of FIG. 20, any number of pellets may be pre-loaded onto delivery mechanism 1005. The carousel may take the form of a disposable cartridge configured for removal and replacement. In such embodiments, delivery mechanism 1005 may further include an indicator for signaling the number of remaining pellets, the number of used pellets, or when the cartridge needs to be replaced. In some embodiments, the cartridge may be loaded with pellets once in place, or may be pre-loaded and then loaded again as pellets are used. For example, a separate storage and/or loading mechanism may operate in conjunction with delivery mechanism 1005 in order to replace the pellets once they are used. In such reloadable or loadable embodiments, the cartridge may be replaceable, disposable, or permanent.

Additionally, delivering pellets of solid fuel 1003 to fuel loading region 1017 may include moving a pellet off of the carousel, or may simply include positioning the pellet between electrodes 1002 while the pellet remains on the carousel. Further, while the pellets on the carousel in FIG. 20 are depicted as uncovered, the pellets may also be housed within the carousel or partially surrounded, e.g., by an outer wall, by individual partitions between the pellets, or by an overhang. Delivery of a pellet to fuel loading region 1017 may include uncovering the delivered pellet or dispensing the pellet from the carousel, for example. In another embodiment, the carousel in FIG. 20 comprising the pellets may be housed in a vacuum chamber that may also house the electrodes 1002, the fuel loading region 1017, and the plasma to electric converter 1006.

In some embodiments, one pellet at a time may be delivered to fuel loading region 1017. In other embodiments, more than one pellet may be delivered to fuel loading region 1017 before ignition of solid fuel 1003. Solid fuel 1003 may be delivered at a constant rate or at a variable rate. The rate of delivery may be capable of being changed either manually or automatically (e.g., based on feedback or a timed schedule) in order to vary the power output or to maintain a substantially constant output, for example. Delivery of the fuel may be timed to the movement of electrodes 1002 as they open and close to receive fuel or as they move to ignite the fuel (in moveable embodiments or embodiments with moveable compression mechanisms 1002a).

In the embodiment of FIG. 21, delivery mechanism 1005 is depicted as a hopper or a storage tank for delivering solid fuel 1003. The hopper may deliver fuel samples, like the pellets shown in FIG. 20, or may deliver granules of solid fuel 1003, e.g., in embodiments in which solid fuel 1003 is in powdered form. Powdered fuel may be delivered in individual capsules, in a manner similar to how pellets are delivered, or may be delivered as quantities of loose powder. Liquid fuel may be delivered in capsules, or may be delivered as streams, vapor, sprays, or droplets, for example. The hopper may deliver one or more pellets to fuel loading region 1017 or may deliver a metered amount or stream of powder or liquid to fuel loading region 1017. As discussed above in reference to FIG. 20, the amount or rate of fuel delivery to fuel loading region 1017 may be constant or may vary and may be controlled by any suitable means.

The hopper may include a chute, valve, dropper, or any suitable structure(s) for directing and/or regulating the flow of solid fuel 1003 to fuel loading region 1017. In some embodiments, the hopper may take the form of a fluid dispenser and may dispense a liquid or gaseous form of solid fuel 1003. In addition, the hopper, or any delivery mechanism 1005, may include one or more sensors for detecting a parameter of the solid fuel or the delivery mechanism. For example, delivery mechanism 1005 may be operably coupled to one or more sensors to detect, e.g., pressure, temperature, fill level, movement, flow speed, or any other suitable parameters. The sensors may be operably coupled to a display, meter, control system, or any suitable means for communicating measurement data to an external reader or means for regulating power generation system 1020 based on the measured parameter. One or more sensors may assist with determining or controlling delivery of an amount of fuel to fluid area 1017, to detecting the overall amount of solid fuel 1003 remaining or used, or a condition of the solid fuel 1003 within, for example.

In some embodiments, a hopper may be positioned above fuel loading region 1017, so that when a sample of solid fuel 1003 is delivered, gravity causes the solid fuel to drop into fuel loading region 1017. In other embodiments, a hopper may be situated next to or below fuel loading region 1017 and may be configured to eject or push a sample of solid fuel laterally or upwards, against gravity, to deliver solid fuel 1003 to fuel loading region 1017. For example, the hopper may include a lever, piston, spring, pneumatic, auger, conveyor, hydraulic, or electrical device or trigger device, or any other suitable mechanism or combination of mechanisms for actively pushing (as opposed to passively dropping via gravity) solid fuel 1003 into fuel loading region 1017.

In some powdered embodiments, solid fuel 1003 may flow from an overhead hopper as an intermittent stream, and the timing of the intermittent flow stream may be synchronized to accommodate the dimensions of electrodes 1002 as they move away from each other to receive the flowing powdered or liquid solid fuel 1003 and move closer to each other to ignite the fuel stream. Alternatively, fuel delivery may be continuous.

In some powder embodiments, solid fuel 1003 may be in the form a fine powder, for example, a powder that is formed by ball milling (or any other suitable technique) regenerated or reprocessed fuel. An exemplary fuel mixture may include, e.g., a transition metal, its oxide, and $H_2O$. In such embodiments, delivery mechanism 1005 may include a sprayer (e.g., a pneumatic, aerosol, mechanical, or electric sprayer), and the fine powder solid fuel 1003 (e.g., a suspension or mist) may be sprayed into fuel loading region 1017.

Figure 22:
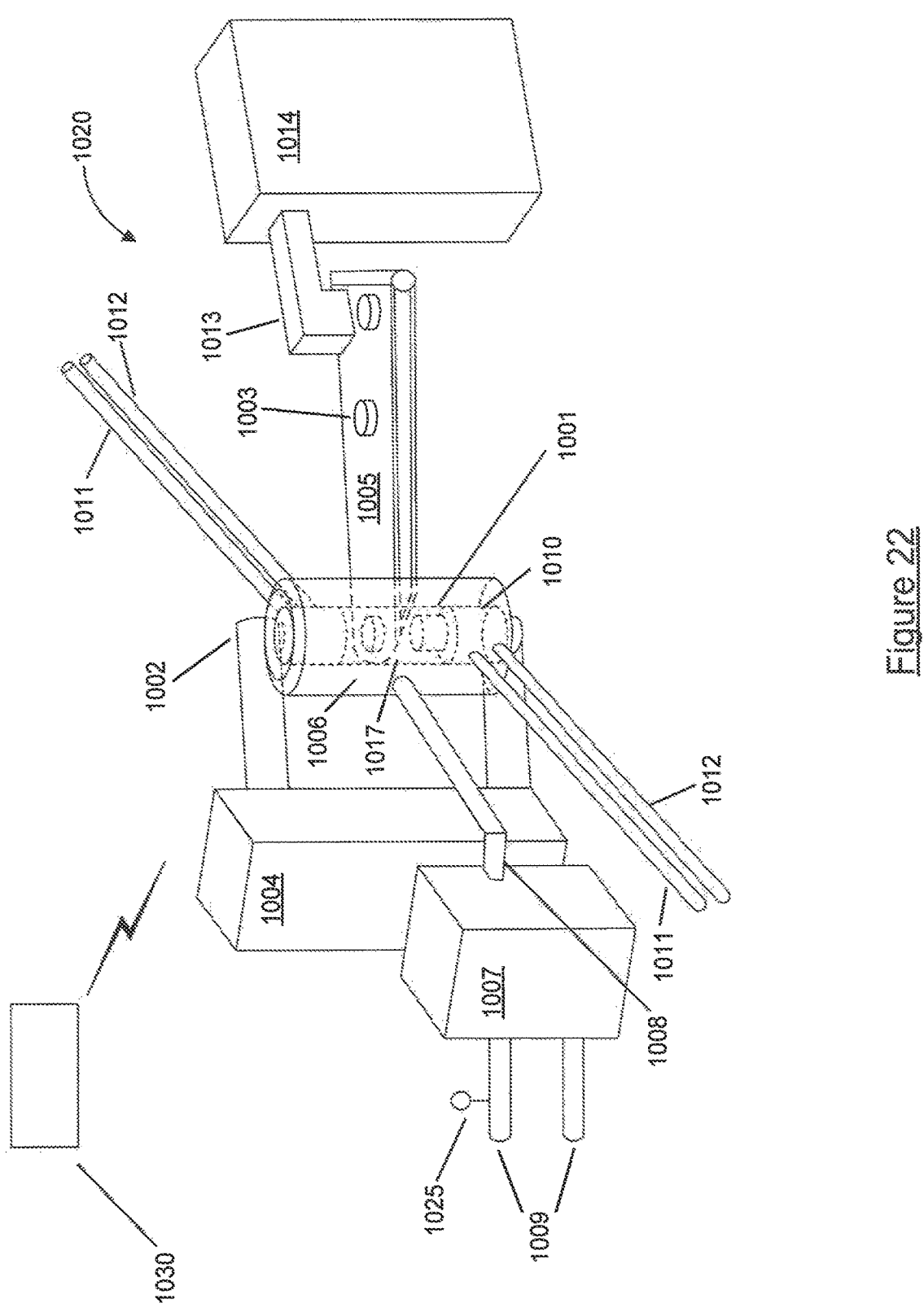
FIG. 22 depicts an exemplary power generation system, according to an embodiment of the present disclosure.

In the embodiment of FIG. 22, a conveyor belt may be used to deliver solid fuel 1003. For example, rather than a carousel, a conveyor belt may move fuel into loading region 1017. The conveyor belt may be pre-loaded or may be loaded by solid fuel loader 1013 from a fuel source 1014 and convey solid fuel 1003 from the source to fuel loading region 1017. For example, the loader 1013 may deposit samples of solid fuel 1003 from a source 1014 onto the conveyor belt 1005, or the conveyor belt 1005 may interact with the fuel source to withdraw an amount of solid fuel 1003 from the source as it passes by or through the source. A conveyor belt may extend lateral to fuel loading region 1017 (either in line with, above, or below fuel loading region 1017) or may extend vertical relative to fuel loading region 1017. In vertical embodiments, the conveyor belt may include a series of compartments, scoops, or projections configured to carry a sample of solid fuel 1003 along the belt to fuel loading region 1017. In addition, delivery of solid fuel 1003 to fuel loading region 1017 may include allowing solid fuel 1003 to remain on the belt or moving solid fuel 1003 off of the belt and into the loading region.

In still other embodiments, delivery mechanism 1005 may include a screw conveyor with threads configured to move solid fuel 1003, or may include one or more gears, valves, levers, pulleys, sprayers, fluid dispensers, droppers, or any other suitable delivery mechanism.

Further, any suitable delivery mechanism 1005, or combination of delivery mechanisms 1005, may be used to deliver solid fuel 1003 to fuel loading region 1017. For example, a hopper may be used in conjunction with a carousel or a conveyor belt in order to load or re-load the carousel or conveyor belt to replace the delivered fuel, or a conveyor belt may deliver solid fuel 1003 to a hopper or a carousel.

Figure 23:
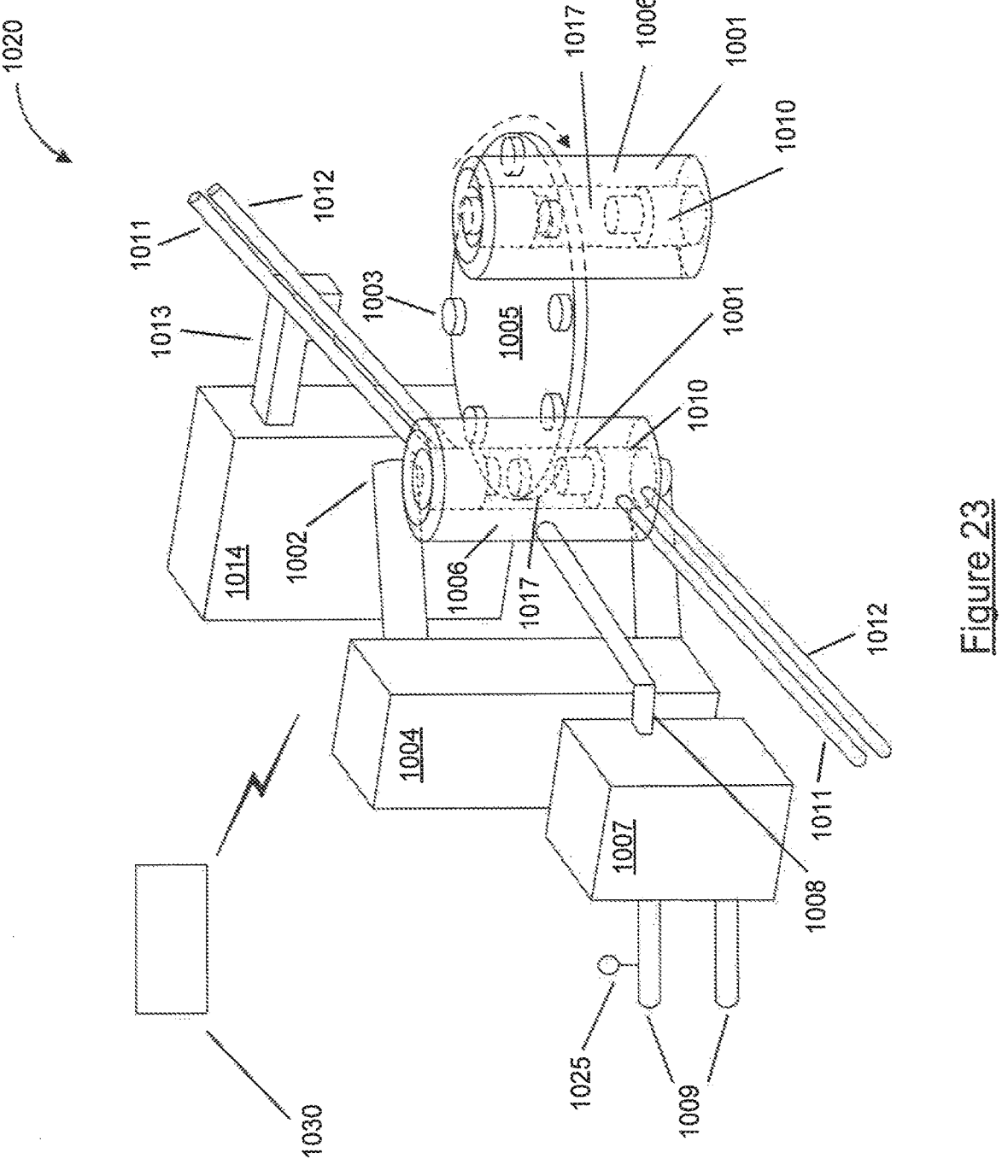
FIG. 23 depicts an exemplary power generation system, according to an embodiment of the present disclosure.

Additionally, as is shown in FIG. 23, delivery mechanism 1005 may deliver fuel 1003 to multiple fuel loading regions 1017, e.g., in embodiments in which system 1020 includes multiple sets of electrodes 1002 and/or multiple cells 1001. In other embodiments, multiple delivery mechanisms 1005 may serve multiple fuel loading regions 1017, or multiple delivery mechanisms 1005 may serve a single fuel loading region 1017. Such embodiments may allow for increased power generation by system 1020.

Power generation system 1020 may also include a removal system for removing the byproducts of spent fuel from fuel loading region 1017. Byproducts may include spent fuel, unreacted fuel, or any products formed when reacting solid fuel 1003. The removal system may be separate from delivery mechanism 1005, or delivery mechanism 1005 may also perform the function of removing spent fuel, in addition to loading the electrodes with fuel for ignition.

In embodiments in which delivery mechanism 1005 also performs a removal function, delivery mechanism 1005 may, e.g., take the form of a conveyor belt that moves spent fuel out of fuel loading region 1017, which may also be the conveyor belt that moves fuel into fuel loading region 1017. In some embodiments, solid fuel 1003 and the conveyor belt may come in the form of a continuous strip that is only ignited where the current flows through. In such an embodiments, solid fuel 1003 may refer generally to a portion of the strip of solid fuel, and new, not-yet-ignited portions of the strip may move into fuel loading region 1017 and then out of the fuel loading region 1017, once ignited. In other strip embodiments, the strip may include packets of powdered fuel or may include pellets of fuel attached to the strip, and as the strip moves along the conveyor, the packets or pellets may move into loading region 1017 for ignition and then may move out of loading region 1017 once spent.

In some embodiments, delivery mechanism 1005 may include a carousel that rotates to deliver solid fuel 1003 into fuel loading region 1017, pauses for ignition, and then rotates to remove the spent fuel out of the area and position new solid fuel 1003 to fuel loading region 1017 between electrodes 1002 for the next ignition process. A carousel, or a conveyor belt, or any delivery mechanism that performs both removal and delivery functions, may be coated with or formed of a suitable material that is resistant to melting or corroding, e.g., a ceramic, quartz, diamond thin film, or metal (such as a refractory alloy, a high-temperature, oxidation-resistant alloy [such as TiAlN], or a high-temperature stainless steel), or any suitable combination thereof. Such materials may allow solid fuel 1003 to remain on delivery mechanism 1005 during ignition without substantially compromising the integrity of delivery mechanism 1005. Delivery and/or removal mechanisms that only provide one of the delivery or removal functions may also be formed of similar coatings or materials to provide additional protection or to decrease wear, for example.

In embodiments in which the removal system is separate from delivery mechanism 1005, the removal system may include a carousel, conveyor belt, or any of the mechanisms described in reference to delivery mechanism 1005, and may interact with delivery mechanism 1005 or operate separately from delivery mechanism 1005. In some embodiments, the removal system may cause a blast of fluid (e.g., water or air) directed so that spent fuel is expelled from fuel loading region 1017. In other embodiments, a vacuum may suction spent from fuel loading region 1017, magnets may repel or attract spent fuel from fuel loading region 1017, or an electrostatic collection system may move spent fuel from loading region 1017. Electrodes 1002 may also move so that spent fuel may drop out of fuel loading region 1017 due to gravity, for example. A lever, sweeper, rake, hook, scraper, or other mechanical device may push, pull, or lift spent fuel from fuel loading region 1017. Spent fuel or products may also be removed from the plasma to electric converter 1006 such as a MHD converter by a similar mechanism.

In still other embodiments, no removal system may be needed, as spent solid fuel 1003 may be substantially destroyed, vaporized, or otherwise 'used up' so that there is little or negligible spent fuel remaining after ignition of solid fuel 1003.

In the exemplary embodiment of FIG. 20, the carousel may act as a partial removal system to move spent fuel out of fuel loading region 1017, but may work with an additional removal system 1013 to remove the spent fuel from the carousel once the spent fuel is removed from loading region 1017. A removal system 1013 may similarly be used in conjunction with a conveyor belt, or any other delivery mechanism 1005 described above. Removal system 1013 may also re-load the carousel or other delivery mechanism 1005 with unused solid fuel 1003 for introduction to loading region 1017.

Removal system 1013 may also work in conjunction with a regeneration system 1014, which may recycle the spent fuel (e.g., into usable components such as fuel and energetic materials). In addition, delivery mechanism 1005 may work in conjunction with removal system 1013 and regeneration 1014, as shown in the exemplary embodiment of FIG. 20. Spent solid fuel may be removed from fuel loading region 1017 by delivery system 1005, removed from delivery system 1005 by removal system 1013, processed by regeneration system 1014, and then delivery system 1005 may be refilled with regenerated fuel from regeneration system 1014, for example, via removal system 1013, which may also act as a re-loading system. Alternatively, a re-loading system may be separate from removal system 1013.

In the embodiment of FIG. 21, solid fuel 1003 may be dispensed from hopper delivery mechanism 1005 into fuel loading zone 1017. Upon ignition by electrodes 1002, solid fuel 1003 may be partially or completely vaporized to a gaseous physical state to form plasma during the resulting burst or blast reaction event. Once formed, the plasma may pass through plasma-to-electric power converter 1006, and the recombined plasma may form gaseous atoms and compounds. These gaseous atoms and compounds may be condensed by a condenser 1015 and collected and conveyed to regeneration system 1014 by removal system 1013. For example, removal system 1013 may include a conveyor connection to regeneration system 1014, which may be further connected to the hopper delivery mechanism 1005. Spent fuel may move from fuel loading zone 1017, to condenser 1015 and/or removal system 1013, to regeneration system 1014, to a storage component and/or delivery mechanism 1005, and back to zone 1017. Condenser 1015 and removal system 1013 may include any suitable system or combination of systems to collect and move materials, including, e.g., an electrostatic collection system, an auger, a conveyor, a carousel, or a pneumatic (e.g., vacuum or positive pressure) system.

In some embodiments, electrical power source 1004 may power removal system 1013 and/or regeneration system 1014. Power generation system 1020 may further include output power terminals 1009 configured to direct power generated by plasma-to-electric power converter 1006. A portion of the electrical power output at terminals 1009 may be supplied to removal system 1013 and/or regeneration system 1014 and/or condenser 1015 to provide electrical power and energy to propagate the chemical reactions needed to regenerate the original solid fuel 1003 from the reaction products. Power from output terminals 1009 may also be used to supply any suitable component of power generation system 1020. In an exemplary embodiment of a solid fuel comprising a metal oxide, and metal resistant to reaction with $H_2O$, and $H_2O$, regeneration comprises rehydration of the product.

Power generation system 1020 may also include a temperature regulation system. For example, a cooling system may remove heat from system 1020 produced by ignition of solid fuel 1003. As shown in FIGS. 20-25, system 1020 optionally includes a heat exchanger 1010. In the exemplary embodiment of FIG. 24, a portion of the heat from heat exchanger 1010 may be transferred to regeneration system 1014 by coolant lines 1011 and 1012. Heat within regeneration system 1014 may provide thermal power and energy to propagate the chemical reactions to regenerate the original solid fuel 1003 from the reaction products. In some embodiments, a portion of the output power from plasma-to-electric converter 1006 may also be used to power regeneration system 1014.

Regeneration system 1014 may regenerate solid fuel 1003 using any suitable reactions or combination of reactions, including any of those described in the Chemical Reactor section and the Solid Fuel Catalyst Induced Hydrino Transition (SF-CIHT) Cell section, for example, the addition of $H_2$, $H_2O$, thermal regeneration, or electrolytic regeneration. Due to the very large energy gain of the reaction relative to the input energy to initiate the reaction, which in some embodiments, may be 100 times in the case of NiOOH (e.g., 5.5 kJ out compared to 46 J input), the products (such as $Ni_2O_3$ and NiO) may be converted to hydroxide, and then to oxyhydroxide, by electrochemical reactions and/or chemical reactions. In other embodiments, metals, such as Ti, Gd, Co, In, Fe, Ga, Al, Cr, Mo, Cu, Mn, Zn, and Sm, and the corresponding oxides, hydroxides, and oxyhydroxides, e.g., may substitute for Ni. Solid fuel 1003 may also include a metal oxide and $H_2O$, and the corresponding metal as a conductive matrix. The product may be metal oxide. The solid fuel may be regenerated by hydrogen reduction of a portion of the metal oxide to the metal that is then mixed with the oxide that has been rehydrated. Suitable metals having oxides that can readily be reduced to the metals with mild heat, such as less than approximately 1000° C., and hydrogen include, e.g., Cu, Ni, Pb, Sb, Bi, Co, Cd, Ge, Au, Ir, Fe, Hg, Mo, Os, Pd, Re, Rh, Ru, Se, Ag, Tc, Te, Tl, Sn, W, Al, V, Zr, Ti, Mn, Zn, Cr, and In, or a combination thereof.

In another embodiment, solid fuel 1003 may include (1) an oxide that is not easily reduced with $H_2$ and mild heat, e.g., alumina, an alkaline earth oxide, and a rare earth oxide, (2) a metal having an oxide capable of being reduced to the metal with $H_2$ at moderate temperatures, e.g., less than approximately 1000° C., and (3) $H_2O$. An exemplary fuel is MgO+Cu+$H_2O$. The mixture of $H_2$ reducible and nonreducible oxide may be treated with $H_2$ and heated at mild conditions so that only the reducible metal oxide is converted to metal. This mixture may be hydrated to comprise regenerated fuel. An exemplary fuel is MgO+Cu+$H_2O$; wherein the product MgO+CuO undergoes $H_2$ reduction treatment to yield MgO+Cu, which is hydrated to the fuel.

In another embodiment, the reactant may be regenerated from the product by the addition of $H_2O$. For example, the fuel or energetic material may include $H_2O$ and a conductive matrix, and regeneration may include the addition of $H_2O$ to the spent fuel. The addition of $H_2O$ to regenerate the spent fuel and form solid fuel 1003 may be continuous or intermittent. In other embodiments, a metal/metal oxide reactant may include a metal that has low reactivity with $H_2O$ corresponding to the oxide being capable of being reduced to the metal. A suitable exemplary metal having low $H_2O$ reactivity is one chosen from, e.g., Cu, Ni, Pb, Sb, Bi, Co, Cd, Ge, Au, Ir, Fe, Hg, Mo, Os, Pd, Re, Rh, Ru, Se, Ag, Tc, Te, Tl, Sn, W, Al, V, Zr, Ti, Mn, Zn, Cr, or any combination thereof. The metal may be converted to the oxide form during the ignition reaction. The oxide product corresponding to the metal reactant may be regenerated back to the initial metal by regeneration system 1014, which may include hydrogen reduction by systems, e.g., and other suitable systems. The hydrogen may be supplied by the electrolysis of $H_2O$. In another embodiment, the metal is regenerated from the oxide by carbon reduction, reduction with a reductant (such as, e.g., a more oxygen active metal), or by electrolysis (such as, e.g., electrolysis in a molten salt). The formation of the metal from the oxide may be achieved by any suitable systems and methods known by those skilled in the art.

In other embodiments, a hydrated metal/metal oxide solid fuel may include a metal that has low reactivity with $H_2O$ corresponding to the oxide not being form during ignition. A suitable exemplary metal having low $H_2O$ reactivity is one chosen from, e.g., Cu, Ni, Pb, Sb, Bi, Co, Cd, Ge, Au, Ir, Fe, Hg, Mo, Os, Pd, Re, Rh, Ru, Se, Ag, Tc, Te, Tl, Sn, W, Al, V, Zr, Ti, Mn, Zn, Cr, and In or any combination thereof. The product comprising unreacted metal and metal oxide is rehydrated to form the regenerated solid fuel. In another embodiment, the solid fuel comprises carbon that comprises $H_2O$. The carbon product condensed from the plasma may be rehydrated to reform the solid in a regenerative cycle.

It may be possible to use solid fuel 1003 once and not use a regeneration step. For example, carbon comprising H and O (e.g., steam carbon or activated carbon) may be a suitable exemplary reactant or solid fuel 1003 that may be consumed without regeneration. In such embodiments, power generation system 1020 may not include regeneration system 1014 or a condenser 1015.

The mechanical actions described above in reference to delivery mechanism 1005, removal system 1013, or regeneration system 1014 may be effected by any suitable systems known to those skilled in the art, including, e.g., pneumatic, solenoidal, or electric motor action systems. In addition, delivery mechanism 1005, removal system 1013, or regeneration system 1014 may be powered separately from or in combination with electrical power source 1004, output power terminals 1009, and any additional power sources for any of the other components in power generation system 1020.

An exemplary power generation process may proceed as follows. Ignition of the reactants of a given solid fuel 1003 yields plasma. Plasma-to-electric converter 1006 may generate electricity from the plasma. Plasma-to-electric converter 1006 may further include a condenser of the plasma products and a conveyor to delivery mechanism 1005. The products may then be transported by delivery mechanism 1005, e.g., a carousel, to a removal system 1013 that conveys the products from delivery mechanism 1005 to regeneration system 1014. In regeneration system 1014, the spent solid fuel may be regenerated into the original reactants or solid fuel 1003 and then directed back to delivery mechanism 1005 via removal system 1013 or a separate reloading component.

Figure 25:
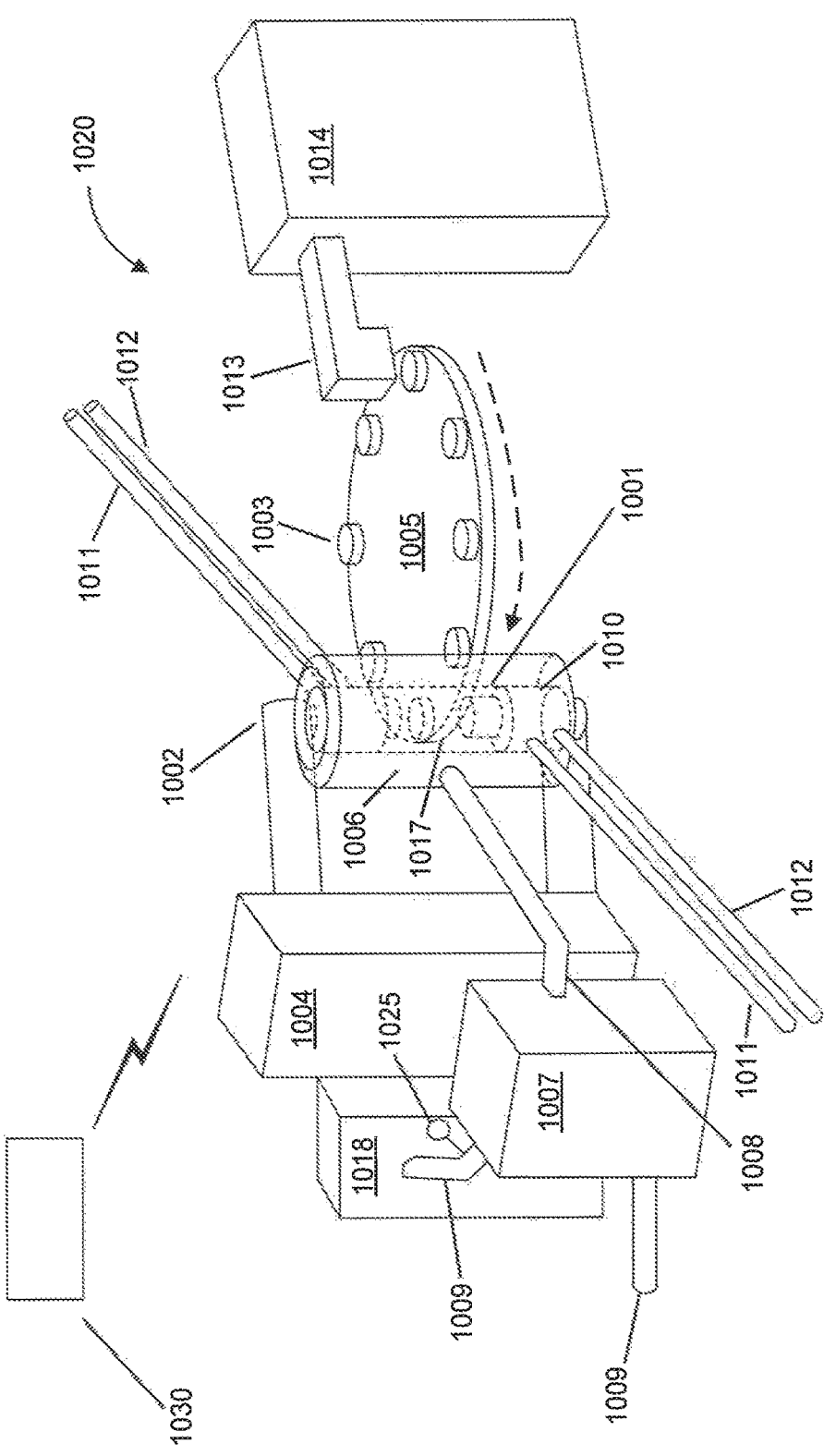
FIG. 25 depicts an exemplary power generation system, according to an embodiment of the present disclosure.

The ignition of solid fuel 1003 generates an output plasma and thermal power. The plasma power may be directly converted to electricity by plasma-to-electric power converter 1006, as discussed above. As is shown in the embodiment of FIG. 25, at least some power may be also be diverted and stored in a storage device 1018 included in system 1020. Storage device 1018 may store any suitable form of energy, including, for example, electrical, chemical, or mechanical energy. Storage device 1018 may include, e.g., a capacitor, a high-current transformer, a battery, a flywheel, or any other suitable power storage device or combination thereof. Storage device 1018 may be included in system 1020, for example, to store power generated by plasma-to-electric power converter 1006 for later use by system 1020, for later use by another device (e.g., an external load), or to dampen any intermittence. System 1020 may be configured to re-charge or fill storage device 1018, which may then be removed once filled and connected to a separate device to supply power. System 1020 may optionally include a storage device configured to accept and store some or all of the power generated by system 1020 for later use by system 1020, for example, as a back-up power supply. As is shown in FIG. 25, storage device 1018 may be electrically connected to output power conditioner 1007 and electrical power source 1004. This may allow a portion of power generated by system 1020 to be fed back into system 1020 via power source 1004, where it may be used, for example, to power electrodes 1002 or any other suitable component of system 1020. In other embodiments, storage device 1018 may not accept power generated by system 1020 and may instead only supply power to system 1020. Further, in lieu of, or in addition to, storage device 1018, system 1020 may be electrically connected to an external device or power grid so that power generated by system 1020 may directly power a separate device or directly supply power to a separate power grid. In some embodiments, the electrical output from a cell 1001 of system 1020 may deliver a short burst of low-voltage, high-current electrical energy that ignites the fuel of another cell, reusing the generated power to fuel system 1020 without the use of storage device 1018. Further, electrical power source 1004 may include its own storage device 1018 for accepting power from system 1020 to utilize when supplying power to system 1020, as in the embodiment of FIG. 25.

Each electrode 1002 and/or cell 1001 also outputs thermal power that may be extracted from heat exchanger 1010 by inlet and out coolant lines 1011 and 1012, respectively. The thermal power may be used as heat directly or may be converted to electricity. Power generation system 1020 may further include a thermal-to-electric converter. The conversion may be achieved using any suitable power converter, e.g., a power plant (e.g., conventional Rankine or Brayton), a steam plant with a boiler, a steam turbine, a generator, or a gas turbine with a generator. Exemplary reactants, regeneration reaction and systems, and power converters are described, for example, in International Application Nos. PCT/US08/61455, PCT/US09/052072, PCT/US10/27828, PCT/US11/28889, PCT/US12/31369, and PCT/US13/041938, each of which is herein incorporated by reference in its entirety. Other suitable power converters may include, e.g., thermionic and thermoelectric power converters and heat engines (such as Stirling engines). Heat exchanger 1010 may be used to cool electrodes 1002, plasma-to-electric converter 1006, fuel loading region 1017, or any suitable component of system 1020.

Electrical power generated by power generation system 1020 may further be conditioned by an output power conditioner 1007 connected to plasma-to-electric converter 1006 by power connector 1008. Output power conditioner 1007 may alter the quality of the generated power to be compatible with the internal or external electrical load equipment the power is being delivered to. The quality of the generated power may include current, voltage, frequency, noise/coherence, or any other suitable quality. Output power conditioner 1007 and power flow from plasma to electric converter 1006 connected by power connector 1008 may be adjustable in order to vary the conditioning of the power, for example, to reflect changes in the electrical load equipment or the power generated by system 1020. The conditioners may perform one or more functions, including, e.g., power level, voltage regulation, power factor correction, noise suppression, or transient impulse protection. In an exemplary embodiment, output power conditioner 1007 may condition the power generated by system 1020 to a desired waveform, e.g., 60 Hz AC power, to maintain a more constant voltage over varying loads.

Once conditioned, the generated power may be passed from conditioner 1007 to a load through output terminals 1009. Though two power connectors 1008 to two plasma to electric converters 1006 and one output power conditioner 1007 are depicted in the exemplary figures, any suitable number and arrangement of these devices may be incorporated into system 1020. Further, any number and arrangement of output power terminals 1009 may be included in power generation system 1020.

In some embodiments, as discussed above, a portion of the power output at power output terminals 1009 may be used to power electrical power source 1004, for example, providing about 5-10 V, 10,000-40,000 A DC power. MHD and PDC power converters may output low-voltage, high-current DC power capable of re-powering electrodes 1002 to cause ignition of subsequently supplied fuel. In some embodiments, a supercapacitor or a battery may be used to start cell 1001 by supplying the power for the initial ignition so that power for subsequent ignitions is provided by output power conditioner 1007, which may in turn be powered by plasma-to-electric power converter 1006.

Additionally, thermal power may be extracted by heat exchanger 1010 with coolant flowing through inlet line 1011 and outlet line 1012. Additional heat exchangers are anticipated such as one or more on the walls of the vessel 1001 or the plasma to electric converter such as a MHD converter 1006. The heat exchangers may each comprise a water-wall type, or comprise a type wherein the coolant is contained and circulated in lines, pipes, or channels. The heat may be transferred to a heat load or to a thermal-to-electric power converter. The output power from the thermal-to-electric converter may be used to power a load, and a portion may be used to power electrical power source 1004.

Power generation system 1020 may further include a control system 1030, which may be part of system 1020 or may be separate and/or remove from system 1020. Control system 1030 may monitor system 1020 and/or may automate portions or all of system 1020. For example, control system 1030 may control the timing of ignition, the amount of current or voltage used to cause ignition, the speed of delivery mechanism 1005 and/or the timing or amount of fuel delivered or removed from fuel loading region 1017, the positioning and/or movement of electrodes 1002, the regeneration of fuel, the flow of generated power within system 1020 (e.g., to power one or more components or to store in a storage device), the flow of generated power out of system 1020, to initiate cooling or heating of system 1020, to monitor one or more parameters of system 1020 (e.g., temperature, pressure, fill level, power generation parameters like current and voltage, magnetic fields, motion, maintenance indicators, or any other suitable parameter), to turn on or off system 1020, to initiate a safety mechanism or a standby mode, or to control any other suitable function of system 1020. In some embodiments, control system 1030 may only monitor system 1020.

Power generation system 1020 may also include one or more measuring devices 1025 operably coupled to one or more components of system 1020 and configured to measure a suitable parameter. While FIG. 20 depicts one measuring device 1025 located on power output terminals 1009, one or more measuring devices 1025 may be operably coupled to any suitable component in system 1020 and may be located within, on, or near any suitable component of power generation system 1020, in any suitable location. Measuring devices 1025 may be operably coupled to a display, a meter, control system 1030, or any suitable means for communicating measurement data to an external reader. Measuring devices 1025 may include sensors, such as those to detect temperature, pressure, fill level, power generation parameters (e.g., current, voltage), magnetic fields, motion, maintenance indicators, or any other suitable parameters. These sensors may be configured to warn an operator of system 1020 or control system 1030 of certain conditions that are present or are possible with regards to system 1020, e.g., by audio or visual alert. In some embodiments, sensors working in conjunction with system 1020 may form a feedback system to facilitate automation of system 1020 based on one or more sensed parameters. In some embodiments, one or more parameters measured by measuring device 1025 may initiate an emergency shutoff or a standby mode, e.g., if one or more parameters is detected as being above or below a pre-determined cutoff threshold, to prevent damage to system 1020 or the surrounding area, or to facilitate maintenance or repairs.

Control system 1030 and/or measuring devices 1025 may be in communication with any suitable component of system 1020, with control mechanisms within system 1020 to facilitate automation, or with a processor or a display. Control system 1030 may include a processor operatively connected to power generation system 1020. A processor may include, e.g., a Programmable Logic Controller (PLC), a Programmable Logic Relay (PLR), a Remote Terminal Unit (RTU), a Distributed Control System (DCS), a printed circuit board (PCB), or any other type of processor capable of controlling power generation system 1020. A display may be operably connected to control system 1030 and may include any type of device (e.g., CRT monitors, LCD screens, etc.) capable of graphically depicting information. Measuring devices 1025 and/or control system 1030 may be directly connected to each other and/or components of system 1020 (e.g., through hard wiring) or may be wirelessly connected (e.g., WiFi, Bluetooth). Further, power generation system 1020, measuring devices 1025, and/or control system 1030 may be configured to communicate with remote devices, e.g., a smart phone or remote power control facility, to allow for remote monitoring and/or control of system 1020. Further, if power generation system 1020 is wholly or partially automated, system 1020 may also include a manual override, which may be activated remotely and/or on site.

In some embodiments, power generation system 1020 may operate autonomously or semi-autonomously. For example, system 1020 may produce enough power to power itself for continued operation. System 1020 may generate enough power to supply power to a storage device included in system 1020, which may be used as a back-up power supply in the event that the main power supply is cut off or when supplied power is low. System 1020 may also generate enough power to power an external load device while providing enough power to itself to continue operation for a period of time without receiving power from an external power source. Such embodiments of system 1020, particularly when combined with control system 1030, may allow power generation system 1020 to be partially or entirely self-sufficient and autonomous such as optionally independent of a grid or a traditional fossil fuels infrastructure.

Such self-sufficient embodiments may be useful in providing power to hard-to-access locations or locations in which power supplies are inconsistent or unpredictable, or for other stand-alone or home uses. For example, power generation system 1020 may be set up in a remote location and then left and monitored remotely, if at all, while system 1020 continues to operate over time, generating enough power to operate (either intermittently as needed or continuously), while also producing extra power for supplying to a load. Control system 1030 may control one or more components of system 1020 to buffer power generation to, e.g., operate independently of an external power source. In such autonomous and/or semi-autonomous embodiments, power generation system 1020 may include a regeneration system, as discussed above, to allow all or most of the fuel reactants to be reused, so that reactants need to be replenished less frequently, if at all. In addition, in embodiments that require water as a fuel or reactant for regeneration of the solid fuel or energetic material, power generation system 1020 may include, e.g., a water collection component configured to collect water from the surrounding environment to fuel system 1020. The water collection component may comprise a hydroscopic material such as one of the disclosure to extract $H_2O$ from the ambient atmosphere.

Autonomous, semi-autonomous, or non-autonomous embodiments of the present disclosure may be used to power an external load. Embodiments of the present disclosure may be used to power household items (e.g., heating or cooling systems, appliances, electronics, etc.), vehicles (e.g., cars, trucks, planes, forklifts, trains, boats, motorcycles, etc.), for industrial uses, as local power stations or generators, for telecommunications such as data centers, or for any suitable application. Various exemplary embodiments may use different types of fuel (e.g., water-based solid fuels comprising mostly $H_2O$ and those that are highly conductive due to a conductive component of the solid fuel), different ignition parameters, and/or different configurations of system components in order to generate the appropriate amount of power for different applications powering various external loads. Some exemplary devices and their general exemplary power usages are provided below to demonstrate exemplary ranges of power that a power generation system 1020 may be configured to output. Additionally, autonomous or semi-autonomous power generation systems 1020 may generate more power than what is required for a given use in order to supply surplus power to redirect back to system 1020 to power operation of the system. Larger power systems can be achieved by configuring or connecting a plurality of modular power generation systems 1020. The connections may be in series, parallel, or combinations thereof to achieve the desired voltage, current, and power of the aggregated unit.

| Appliance | Watts | Appliance | Watts | Appliance | Watts |
|---|---|---|---|---|---|
| Central air conditioner | 5,000 | Electric clothes dryer | 3,400 | Well pump (1/3-1 HP) | 480-1,200 |
| Humidifier | 300-1,000 | Water heater (40 gallon) | 5,000 | Satellite dish | 30 |
| Fan | 100 | Stereo | 70-400 | Cell phone charger | 2-4 |
| Portable heater | 1,500 | 100 watt incandescent bulb | 100 | Commercial generator | 20-50 kW |
| Train | 10 MW | Ship | 10 MW | Plane | 100 MW |

X. Additional Mechanical Power Generation Embodiments

In one embodiment of the present disclosure, a system is provided for producing mechanical power. The system can include an electrical power source of at least about 5,000 A, an ignition chamber configured to produce at least one of plasma and thermal power, and a fuel delivery device configured to deliver a solid fuel of the present disclosure to the ignition chamber. Exemplary solid fuels suitable for the ignition of water or water-based fuel source (referring to solid fuel or energetic materials of the present disclosure) to generate mechanical power are given in the Internal SF-CIHT Cell Engine section of the present disclosure. Each of the embodiments disclosed in this section can employ the solid fuels of the present disclosure. The system can also include a pair of electrodes coupled to the power source and configured to supply power to the solid fuel to produce the plasma, and a piston located within the ignition chamber and configured to move relative to the ignition chamber to output mechanical power.

In another aspect, the system can include an electrical power source of at least about 5,000 A, an ignition chamber configured to produce at least one of plasma and thermal power, and a fuel delivery device configured to deliver a solid fuel of the present disclosure to the ignition chamber. The system can also include a pair of electrodes coupled to the electrical power source and configured to supply electrical power to the solid fuel to produce the plasma, and a turbine in fluid communication with the outlet port and configured to rotate to output mechanical power.

In another aspect, the system can include an electrical power source capable of at least about 5,000 A, and an impeller configured to rotate to output mechanical power, wherein the impeller can include a hollow region configured to produce at least one of plasma and thermal power and the hollow region can include an intake port configured to receive a working fluid. The system can further include a fuel delivery device configured to deliver a solid fuel of the present disclosure to the hollow region, and a pair of electrodes coupled to the electrical power source and configured to supply power to the hollow region to ignite the solid fuel and produce the plasma.

In another embodiment, the system can include an electrical power source of at least about 5,000 A, and a moveable element configured to rotate to output mechanical power, wherein the moveable element at least partially defines an ignition chamber configured to produce at least one of plasma and thermal power. Also, the system can include a fuel delivery device configured to deliver a solid fuel to the ignition chamber, and a pair of electrodes coupled to the power source and configured to supply power to the solid fuel to produce the plasma.

In another embodiment, the system can include an electrical power source of at least about 5,000 A, and a plurality of ignition chambers, wherein each of the plurality of ignition chambers is configured to produce at least one of plasma and thermal power. The system also includes a fuel delivery device configured to deliver a solid fuel to the plurality of ignition chambers, and a plurality of electrodes coupled to the power source, wherein at least one of the plurality of electrodes is associated with at least one of the plurality of ignition chambers and configured to supply power to the solid fuel to produce the plasma.

In another embodiment, the system can include an electrical power source of at least about 5,000 A, an ignition chamber configured to produce at least one of arc plasma and thermal power, and a fuel delivery device configured to deliver a water-based fuel to the ignition chamber. The system can further include a pair of electrodes coupled to the power source and configured to supply power to the fuel to produce the arc plasma, and a piston fluidly coupled to the ignition chamber and configured to move relative to the ignition chamber to output mechanical power.

In another embodiment, the system can include an electrical power source of at least about 5,000 A, an ignition chamber configured to produce at least one of arc plasma and thermal power, wherein the ignition chamber includes an outlet port, and a fuel delivery device configured to deliver a water-based fuel to the ignition chamber. Also included can be a pair of electrodes coupled to the electrical power source and configured to supply power to the fuel to produce the arc plasma, and a turbine in fluid communication with the outlet port and configured to rotate to output mechanical power.

In another embodiment, the system can include an electrical power source of at least about 5,000 A, an impeller configured to rotate to output mechanical power, wherein the impeller includes a hollow region configured to produce at least one of arc plasma and thermal power and the hollow region includes an intake port configured to receive a working fluid, a fuel delivery device configured to deliver a water-based fuel to the hollow region, and a pair of electrodes coupled to the electrical power source and configured to supply power to the hollow region to ignite the water-based fuel and produce the arc plasma.

In another embodiment, the system can include an electrical power source of at least about 5,000 A, a plurality of ignition chambers, wherein each of the plurality of ignition chambers is configured to produce at least one of arc plasma and thermal power, a fuel delivery device configured to deliver a water-based fuel to the plurality of ignition chambers, and a plurality of electrodes coupled to the electrical power source, wherein at least one of the plurality of electrodes is associated with at least one of the plurality of ignition chambers and configured to supply electrical power to the water-based fuel to produce the arc plasma.

In another embodiment, an ignition chamber can include a shell defining a hollow chamber configured to create at least plasma, an arc plasma, and thermal power, a fuel receptacle in fluid communication with the hollow chamber, wherein the fuel receptacle is electrically coupled to a pair of electrodes, and a moveable element in fluid communication with the hollow chamber.

In another embodiment, the ignition chamber can include a shell defining a hollow chamber, and an injection device in fluid communication with the hollow chamber, wherein the injection device is configured to inject a fuel into the hollow chamber. The chamber can further include a pair of electrodes electrically coupled to the hollow chamber and configured to supply electrical power to the fuel sufficient to produce at least one of plasma, arc plasma, and thermal power in the hollow chamber, and a moveable element in fluid communication with the hollow chamber.

In another embodiment, a method of producing mechanical power can include delivering a solid fuel to an ignition chamber, and passing a current of at least about 5,000 A through the solid fuel and applying a voltage of less than about 10 V to the solid fuel to ignite the solid fuel and produce at least one of plasma and thermal power. The method can also include mixing the thermal power with a working fluid, and directing the working fluid toward a moveable element to move the moveable element and output mechanical power wherein it is implicit in the present disclosure that the power of plasma and arc plasma spontaneously decays or converts to thermal power. The thermal power may be converted to mechanical power by means such as pressure volume work. Plasma may be converted directly to electrical power by a plasma to electric converter such as those of the present disclosure such as MHD or PDC converters. The electrical power may be converted to mechanical power by means such as an electric motor, or the plasma or plasma arc power may be thermalized and thermal power may be converted to mechanical power by means such as a heat engine wherein the heat may be coupled to pressure volume work.

Another method can include delivering a water-based fuel to an ignition chamber and passing a current of at least about 10,000 A through the water-based fuel and applying a voltage of at least about 4 kV to the water-based fuel to ignite the water-based fuel to produce at least one of arc plasma and thermal power. Also, the method can include mixing the thermal power with a working fluid and directing the working fluid toward a moveable element to move the moveable element and output mechanical power.

Another method can include supplying a solid fuel to an ignition chamber, supplying at least about 5,000 A to an electrode electrically coupled to the solid fuel, igniting the solid fuel to produce at least one of plasma and thermal power in the ignition chamber, and converting at least some of the at least one of plasma and thermal power into mechanical power.

Another method can include supplying a water-based fuel to an ignition chamber, supplying at least about 5,000 A to an electrode electrically coupled to the water-based fuel, igniting the water-based fuel to produce at least one of arc plasma and thermal power in the ignition chamber, and converting at least some of the at least one of arc plasma and thermal power into mechanical power.

A further embodiment of the present disclosure provides a machine for land-based transportation. The machine may include an electrical power source of at least about 5,000 A, an ignition chamber configured to produce at least one of plasma, arc plasma, and thermal power, and a fuel delivery device configured to deliver a fuel to the ignition chamber. The machine can also include a pair of electrodes coupled to the electrical power source and configured to supply power to the fuel to produce the at least one of the plasma, the arc plasma, and the thermal power, a moveable element fluidly coupled to the ignition chamber and configured to move relative to the ignition chamber, and a drive-shaft mechanically coupled to the moveable element and configured to provide mechanical power to a transportation element.

A further embodiment of the present disclosure provides a machine for aviation transport. The machine may include an electrical power source of at least about 5,000 A, an ignition chamber configured to produce at least one of plasma, arc plasma, and thermal power, and a fuel delivery device configured to deliver a fuel to the ignition chamber. The machine can also include a pair of electrodes coupled to the electrical power source and configured to supply power to the fuel to produce the at least one of the plasma, the arc plasma, and thermal power, a moveable element fluidly coupled to the ignition chamber and configured to move relative to the ignition chamber, and an aviation element mechanically coupled to the moveable element and configured to provide propulsion in an aviation environment.

Another embodiment of the present disclosure provides a machine for marine transport. The machine may include an electrical power source of at least about 5,000 A, an ignition chamber configured to produce at least one of plasma, arc plasma, and thermal power and a fuel delivery device configured to deliver a fuel to the ignition chamber. The machine can also include a pair of electrodes coupled to the electrical power source and configured to supply power to the fuel to produce the at least one of the plasma, the arc plasma, and thermal power, a moveable element fluidly coupled to the ignition chamber and configured to move relative to the ignition chamber, and a marine element mechanically coupled to the moveable element and configured to provide propulsion in a marine environment.

Another embodiment of the present disclosure provides a work machine, which may include an electrical power source of at least about 5,000 A, an ignition chamber configured to produce at least one of plasma, arc plasma, and thermal power, and a fuel delivery device configured to deliver a fuel to the ignition chamber. The work machine can also include a pair of electrodes coupled to the electrical power source and configured to supply power to the fuel to produce the at least one of the plasma, the arc plasma, and thermal power, a moveable element fluidly coupled to the ignition chamber and configured to move relative to the ignition chamber, and a work element mechanically coupled to the moveable element and configured to provide mechanical power.

In the embodiments according to present disclosure, the electrical power source can be at least about 10,000 A, such as at least about 14,000 A. In other embodiments according to present disclosure, the electrical power source can be less than about 100 V, such as less than about 10 V, or less than about 8 V. In additional embodiments according to present disclosure, the electrical power source can be at least about 5,000 kW. In further embodiments, the solid fuel can comprise a portion of water, a portion of a water absorbing material, and a portion of a conducting element, and non-limiting examples include the portion of water being at least about 30 mole % of the solid fuel, the portion of the water absorbing material being at least about 30 mole % of the solid fuel, and the portion of the conducting element being at least about 30 mole % of the solid fuel.

In further embodiments, the systems can include an intake port configured to deliver a working fluid to the ignition chamber. In certain embodiments, the working fluid can include at least one of air, $H_2O$, and an inert gas, and the working fluid can be delivered to the ignition chamber at a pressure of at least one of below atmospheric pressure, at atmospheric pressure, and above atmospheric pressure. In addition, the system can comprise at least one of the pair of electrodes being electrically coupled to at least one of the piston and the ignition chamber. In certain embodiments, the fuel delivery device includes an injection device configured to inject at least a portion of the solid fuel into the ignition chamber, such as the injection device being configured to inject at least one of a gas, a liquid, and a solid particulate into the ignition chamber. In addition, the fuel delivery device can include a carousel. In certain embodiments, at least one of the fuel delivery device and the pair of electrodes can include a receptacle configured to receive the solid fuel.

Certain embodiments of the present disclosure further include at least one of a cooling system, a heating system, a vacuum system, and a plasma converter. In addition, certain systems can further include a regeneration system configured to at least one of capture, regenerate, and recycle one or more components produced by the ignition of the solid fuel.

In embodiments of the present disclosure, at least one of the pair of electrodes can be electrically coupled to at least one of the turbine and the ignition chamber. In addition, the fuel delivery device can include an injection device configured to inject at least a portion of the solid fuel into the ignition chamber or the injection device can be configured to inject at least one of a gas, a liquid, and a solid particulate into the ignition chamber. In certain embodiments, the impeller can include at least one blade configured to divert a flow of the working fluid, and the working fluid includes at least one of air, $H_2O$, and an inert gas. In other embodiments, the working fluid can be delivered to the hollow region at a pressure of at least one of below atmospheric pressure, at atmospheric pressure, and above atmospheric pressure.

In embodiments of the present disclosure, at least one of the pair of electrodes is electrically coupled to at least one of the impeller and the hollow region. In addition, the fuel delivery device can include an injection device configured to inject at least a portion of the solid fuel into the hollow region, and the injection device can be configured to inject at least one of a gas, a liquid, and a solid particulate into the hollow region.

In certain embodiments, the moveable element can form at least part of a first electrode of the pair of electrodes, and a second moveable element can form at least part of a second electrode of the pair of electrodes. In embodiments, the moveable element includes a receptacle configured to receive the fuel, the moveable element can include a nozzle fluidly coupled to the ignition chamber and configured to direct a flow of at least one of plasma and thermal power, the moveable element is configured to move in at least one of a linear, an arcuate, and a rotational direction, and the moveable element includes at least one of a gear and a roller.

Figure 26:
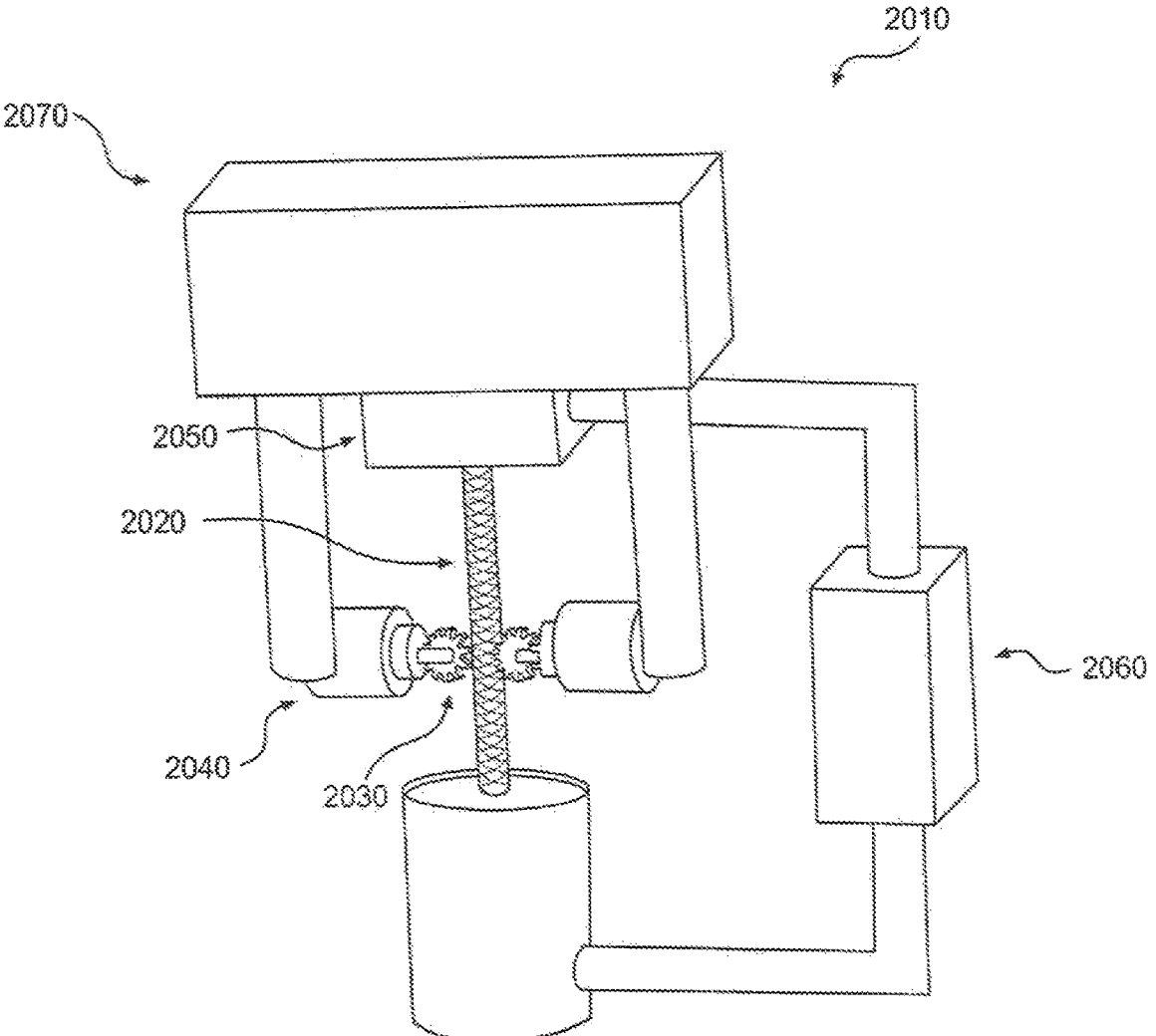
FIG. 26 is an illustration of a mechanical power generation system, according to an embodiment of the present disclosure.

FIG. 26 depicts a mechanical power generation system 2010, according to an exemplary embodiment. System 2010 can be configured to produce at least one type of mechanical output. Such output can include translational movement in one or more linear or rotational directions. For example, generation of mechanical power can include movement of moveable elements associated with system 2010, such as, a piston (see FIG. 28), a turbine (see FIG. 29), a gear (see FIG. 30), or an impeller (see FIGS. 33A, 33B). A moveable element can be configured to move in a linear, an arcuate, a rotational, or in a combination of these or one or more other directions. Other types of moveable elements may provide mechanical power using the ignition processes and components described herein.

System 2010 can be configured to ignite hydrogen, oxygen, water, or a water-based fuel 2020 (referring to the solid fuels of the present disclosure such as those given in the Internal SF-CIHT Cell Engine section, the Chemical Reactor section, and the Solid Fuel Catalyst Induced Hydrino Transition (SF-CIHT) Cell and Power Converter section of the present disclosure). Fuel 2020 can include a solid fuel as disclosed in the present disclosure wherein in the present disclosure, it is implicit that the fuel may comprise other physical states. In embodiments, the fuel or solid fuel may be at least one state of gaseous, liquid, solid, slurry, sol gel, solution, mixture, gaseous suspension, and pneumatic flow. The fuel 2020 can be configured to ignite to form plasma. The solid fuel can include a portion of water, a portion of a water absorbing material, and a portion of a conducting element, as described above. The mole portions of these components can range from about 1% to about 99%. In some embodiments, the portions can each be about 30% of the solid fuel. In other embodiments, fuel 2020 can include a water-based fuel that may be ignited to form at least one of arc plasma and thermal power. The water-based fuel can include at least 50% water, at least 90% water, or a material comprising water ranging from about 1% to 100% mole/mole, vol/vol, or wt/wt. Fuel 2020 may include various forms of material, including a gas, a liquid, and a solid. The liquid can further encompass a range of viscosities, from very low to very high viscosities, and may include liquids with slurry or a gel-type consistency. While FIG. 27 shows fuel 2020 in a solid, elongated form, other forms of fuel 2020 are contemplated for use with system 2010. As explained below, gas, liquid, or various combinations of gas, liquid, or solid forms of fuel 2020 may be used with system 2010. For example, fuel 2020 could include a pellet, portion, aliquot, powder, droplet, stream, mist, gas, suspension, or any suitable combination thereof. Basic reactants may include, among other things, a source of H and a source of O, and these can form $H_2O$ or H as products or intermediate reaction products.

Fuel 2020 may also include one or more energetic materials of the present disclosure also configured to undergo the ignition process (in the present disclosure solid fuel is also referred to as energetic material due to the high energy yield and also the possibility of high kinetics and corresponding power). Moreover, the energetic material fuel 2020 may be conductive. For example, an energetic material may comprise $H_2O$ and at least one of a metal and a metal oxide, and a conducting element. Energetic material fuel 2020 may comprise multiple physical forms or states of matter such as at least one of a slurry, solution, emulsion, composite, and compound.

In an embodiment, the fuel 2020 comprises reactants that constitute hydrino reactants of the present disclosure comprising at least one source of catalyst or a catalyst comprising nascent $H_2O$, at least one source of atomic hydrogen or atomic hydrogen, and further comprising at least one of a conductor and a conductive matrix. In an embodiment, the fuel 2020 comprises at least one of a source of a solid fuel or energetic material of the current disclosure and a solid fuel or energetic material of the current disclosure. In an embodiment, exemplary solid fuels 2020 comprise a source of $H_2O$ and a conductive matrix to form at least one of the source of catalyst, the catalyst, the source of atomic hydrogen, and the atomic hydrogen. The $H_2O$ source may comprise at least one of bulk $H_2O$, a state other than bulk $H_2O$, a compound or compounds that undergo at least one of react to form $H_2O$ and release bound $H_2O$. The bound $H_2O$ may comprise a compound that interacts with $H_2O$ wherein the $H_2O$ is in a state of at least one of absorbed $H_2O$, bound $H_2O$, physisorbed $H_2O$, and waters of hydration. The fuel 2020 may comprise a conductor and one or more compounds or materials that undergo at least one of release of bulk $H_2O$, absorbed $H_2O$, bound $H_2O$, physisorbed $H_2O$, and waters of hydration, and have $H_2O$ as a reaction product. Further exemplary solid or energetic material fuels 2020 are a hydrated hydroscopic material and a conductor; hydrated carbon; hydrated carbon and a metal; a mixture of a metal oxide, a metal or carbon, and $H_2O$; and a mixture of a metal halide, a metal or carbon, and $H_2O$. The metal and metal oxide may comprise a transition metal such as Co, Fe, Ni, and Cu. The metal of the halide may comprise an alkaline earth metal such as Mg or Ca and a halide such as F, Cl, Br or I. The metal may have a thermodynamically unfavorable reaction with $H_2O$ such as at least one of the group of Cu, Ni, Pb, Sb, Bi, Co, Cd, Ge, Au, Ir, Fe, Hg, Mo, Os, Pd, Re, Rh, Ru, Se, Ag, Tc, Te, Tl, Sn, W, Al, V, Zr, Ti, Mn, Zn, Cr, and In wherein the fuel 2020 may be regenerated by addition of $H_2O$. The fuel 2020 that constitute hydrino reactants may comprise at least one of a slurry, solution, emulsion, composite, and a compound.

System 2010 can also include one or more electrodes. For example, system 2010 can include a pair of electrodes 2030. Electrodes 2030 can include moveable components, such as, for example, gears, cogs, rollers, or other components configured for movement in one or more directions, including rotational, arcuate, or linear movement. Electrodes 2030 can also include one or more electrodes that are stationary and one or more electrodes that move. All electrodes may be stationary or moveable. For example, electrodes 2030 can be configured to permit fuel 2020 to move linearly or rotate relative to electrodes 2030 while electrodes 2030 remain stationary. Electrodes 2030 may also be configured to wear.

In general, electrodes 2030 can be configured to interact with fuel 2020 such that a current can be applied across fuel 2020. The fuel may be highly conductive. Fuel 2020 may be ignited by the application of the high current, which may range of about 2,000 A to 100,000 A. The voltage may be low such as in the range of about 1 V to 100 V. Alternatively, the fuel such as $H_2O$ with or without minor additives comprising non-$H_2O$ matter may have a high resistance. Ignition may also be achieved by the application of sufficient high voltage and current to electrodes 2030. For example, as 1 kV to 50 kV across electrodes 2030. Such an ignition process may form at least one of plasma, arc plasma, a similar form of matter, and heated matter. Light, heat, and other reactions products may also be formed.

Electrodes 2030 are configured to apply an electrical pulse to fuel 2020. Specifically, electrodes 2030 can be designed to permit application of a high-intensity current flow, a low-intensity or high-intensity voltage appropriate for the resistance of the fuel to achieve high current, or other high-intensity power flow across fuel 2020. As explained below, one or more electrodes 2030 may be coupled to a moveable or a stationary component. For example, one or more electrodes may be coupled to a piston, a turbine, a gear, an impeller, or other moveable element. One or more other electrodes may be coupled to an ignition chamber, or hollow region, conduit associated with the ignition chamber or hollow region, or another stationary part of system 2010.

Electrodes 2030 may be formed from suitable material having specific dimensions to accommodate the one or more electrical pulses. Electrodes 2030 may also require insulation, cooling, and control mechanisms to operate as required. It is contemplated that a high AC, DC, or an AC-DC mixture of current can be applied across electrodes 2030. Current can range from approximately 100 A to 1,000,000 A, 1 kA to 100,000 A, or 10 kA to 50 kA, and the DC or peak AC current density may range from approximately 100 $A/cm^2$ to 1,000,000 $A/cm^2$, 1,000 $A/cm^2$ to 100,000 $A/cm^2$, or 2,000 $A/cm^2$ to 50,000 $A/cm^2$. The DC or peak AC voltage may range from about 0.1 V to 50 kV, 1 kV to 20 kV, 0.1 V to 15 V, or 1 V to 15 V. The AC frequency may range from about 0.1 Hz to 10 GHz, 1 Hz to 1 MHz, 10 Hz to 100 kHz, or 100 Hz to 10 kHz. And pulse time may range from about $10^{-6}$ s to 10 s, $10^{-5}$ s to 1 s, $10^{-4}$ s to 0.1 s, or $10^{-3}$ s to 0.01 s.

It is also contemplated that electrodes 2030 may apply a 60 Hz voltage with less than a 15 V peak, a current between approximately 10,000 $A/cm^2$ and 50,000 $A/cm^2$ peak, and a power between approximately 10,000 $W/cm^2$ and 750,000 $W/cm^2$. A wide range of frequencies, voltages, currents, and powers may be applied. For example, ranges of about 1/100 times to 100 times the afore-mentioned parameters may also be suitable. In particular, fuel may be ignited by a low-voltage, high-current pulse, such as one created by a spot welder, achieved by confinement between two copper electrodes of a Taylor-Winfield model ND-24-75 spot welder. The 60 Hz voltage may be about 5 to 20 V RMS, and the current and current densities through the fuel 2020 may be about 10,000 A to 40,000 A, and 10,000 $A/cm^2$ to 40,000 $A/cm^2$, respectively.

System 2010 can also include other systems, devices, or components. For example, system 2010 can include a cooling system 2040, a fuel delivery device 2050, a regeneration system 2060, and an electrical power source 2070. Cooling system 2040 may be configured to cool one or more components of system 2010, such as, for example, electrodes 2030. Fuel delivery device 2050 may be configured to deliver fuel 2020 to electrodes 2030. Regeneration system 2060 may be configured to regenerate one or more materials associated with fuel 2020. For example, forms of a metal contained within fuel 2020 may be captured, recycled, and returned to fuel delivery device 2050.

Electrical power source 2070 may be configured to supply electrodes 2030 with power, such as electrical power. In some aspects, power source 2070 can be configured to supply sufficient power to produce plasma. For example, power source 2070 can be at least about 10,000 A, at least about 14,000 A, less than about 100 V, less than about 10 V, less than about 8 V, or at least about 5,000 kW. In other aspects, power source 2070 can be configured to supply sufficient power to produce arc plasma. For example, power source 2070 can be at least about 10,000 A, at least about 12,000 A, at least about 1 kV, at least about 2 kV, at least about 4 kV, or at least about 5,000 kW.

As shown in FIG. 27, system 2010 can also include an ignition chamber 2080 where fuel 2020 is reacted to form at least one of plasma, arc plasma, or thermal power. As explained below, system 2010 can include one or more ignition chambers 2080. Chamber 2080 can be formed of a metal or other suitable material capable of withstanding the forces and temperatures associated with water ignition or at least one of plasma and thermal power formation. Chamber 2080 can include a generally cylindrical conduit configured to provide an environment suitable for igniting water. Chamber 2080 can be variously shaped, sized, or configured for different applications.

As explained below, chamber 2080 can be configured to operate with one or more moveable elements configured to output mechanical power. Chamber 2080 can also include one or more ports, cams, injection devices, or other components configured to permit a fluid to enter or exit chamber 2080. In particular, chamber 2080 can include an intake port configured to permit delivery of a fluid to chamber 2080. Chamber 2080 can also include an outlet port configured to permit a fluid to exit from chamber 2080. Such ports may be configured to operate with a working fluid configured to operate in conjunction with at least one of plasma, arc plasma, and thermal power to provide mechanical power. The working fluid may include air, an inert gas, or another fluid capable of operating with at least one of plasma, arc plasma, and thermal power. The working fluid or any other type of fluid may be delivered to chamber 2080 in a pressurized state. In particular, a fluid could be delivered to chamber 2080 at a pressure below atmospheric pressure, at atmospheric pressure, or above atmospheric pressure. Various components, such as, a turbocharger or supercharger could be used to pressurize a fluid before supplying the fluid to chamber 2080.

Ignition chamber 2080 can also include a shell defining a hollow chamber configured to create at least at least one of plasma, arc plasma, and thermal power. Chamber 2080 can also include a fuel receptacle in fluid communication with the hollow chamber. The fuel receptacle may be electrically coupled to a pair of electrodes. Chamber 2080 can also include a moveable element in fluid communication with the hollow chamber.

FIG. 28 depicts ignition chamber 2080, according to an exemplary embodiment. As shown, chamber 2080 includes a piston 2090 configured to convert part of the energy provided by the ignition of fuel 2020 into mechanical power. Piston 2090 can be configured for reciprocating movement within a combustion chamber, such as, chamber 2080. In other embodiments, piston 2090 can undergo reciprocating movement in a combustion chamber fluidly connected to chamber 2080. Piston 2090 can also be dimensioned and designed to operate in various combustion environments and with various combustible fuels. Moreover, piston 2090 can be formed from a range of materials, depending on the type and requirements of the combustion process. As explained in more detail below, other types of moveable elements may also be used to provide mechanical power. In addition, system 2010 could be modified to operate as a Stirling engine.

For example, as shown in FIG. 29, a turbine 2100 may be in fluid communication with the output from one or more chambers 2080 to provide rotational power. System 2010 shown in FIG. 29 may include other components, such as, for example, one or more additional turbines, or a compressor, mixing chamber, expander blower, air intake, supercharger, reformer, cooler, motor, generator, recuperator, recirculator, heat exchanger, damper, or exhaust. As such, system 2010 could be configured as a Brayton-type engine, or modification thereof. Other components, devices, and systems may be integrated with system 2010 or used in conjunction with system 2010 to provide mechanical power.

Figure 30:
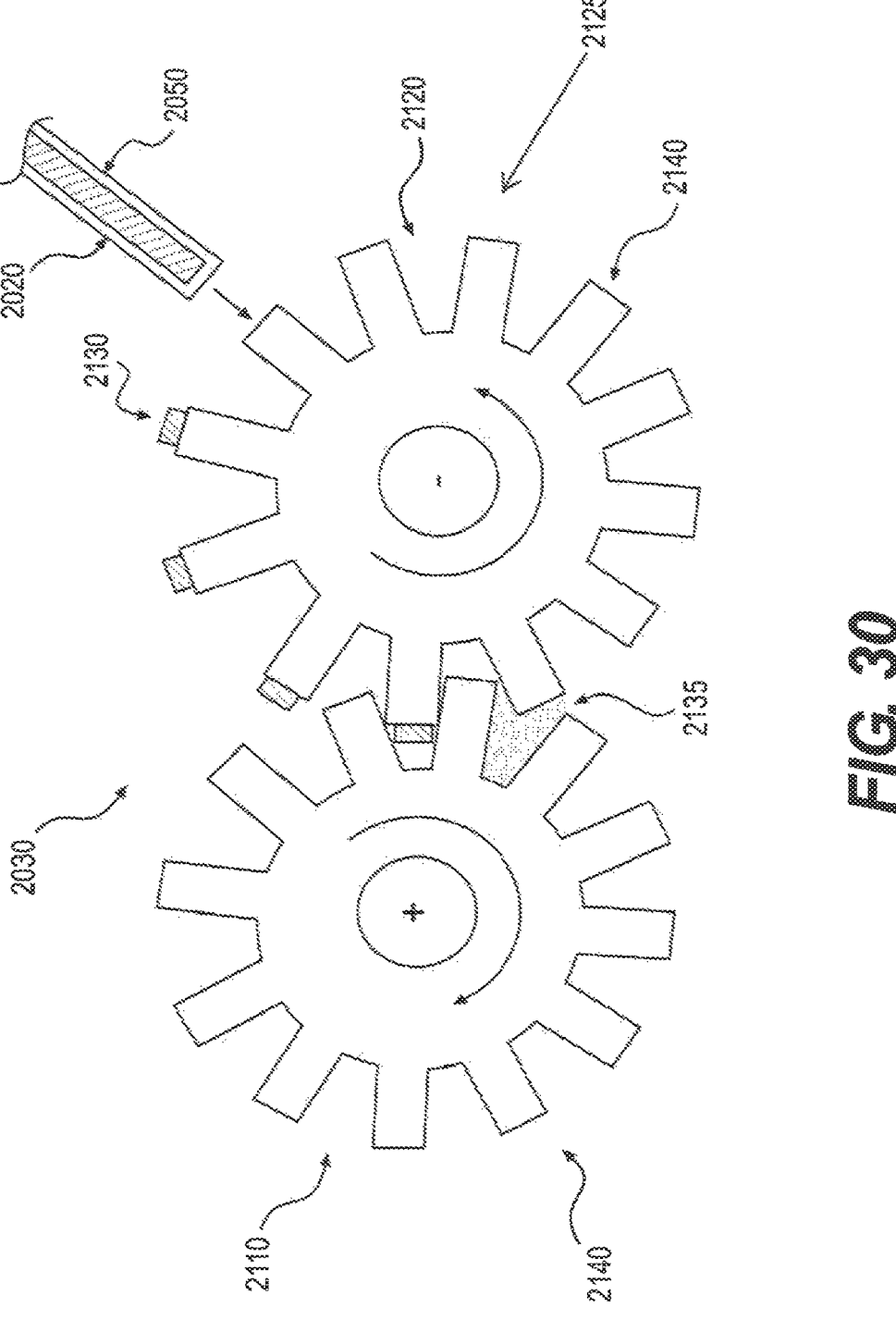
FIG. 30 is an illustration of a pair of electrodes, according to an embodiment of the present disclosure.

FIG. 30 depicts electrodes 2030 including an anode 2110 and a cathode 2120, according to an exemplary embodiment. As shown, anode 2110 and cathode 2120 are configured to rotate. Accordingly, electrodes 2030 can include a gear 2125. Cathode 2120 is also shown with a pellet 2130 of fuel 2020 associated with a gear tooth 2140. Fuel delivery device 2050 can position pellet 2130 relative to gear tooth 2140, for example, at a tip of gear tooth 2140. In other embodiments (not shown), pellet 2130 could be located at least partially between adjacent gear teeth 2140 or located on anode 2110.

Cathode 2120 or fuel 2020 could be coupled to each other using any suitable mechanisms. For example, mechanical graspers (not shown) could be used to couple pellet 2130 to gear tooth 2140. Fuel 2020 in liquid form could couple to cathode 2120 via surface tension. Magnetic and other forces could also be used.

Fuel 20 or pellet 2130 may be moved about system 2010 using various transport mechanisms. For example, mechanical mechanisms (e.g., an auger, roller, spiral, gear, conveyer belt, etc.) may be used. It is also contemplated that pneumatic, hydraulic, electrostatic, electrochemical, or other mechanisms may be used. Fuel 2020 and a desired region of gear teeth 2140 of electrodes 2030 may be oppositely electrostatically charged such that fuel 2020 flows into and electrostatically sticks to the desired region of one or both electrodes 2030. Fuel 2020 can be subsequently ignited when opposing teeth 2140 mesh. In another embodiment, the rollers or gears 2125 maintain tension towards each other by biasing mechanisms, such as, for example, by spring loading, or by pneumatic or actuation. The meshing of teeth 2140 and compression of fuel 2020 there between may cause electrical contact between the mating teeth 2140 through the conductive fuel 2020.

Once coupled to cathode 2120, pellet 2130 can be rotated to bring pellet 2130 into close proximity or into contact with anode 2110. Once so positioned, a high intensity current may be applied across electrodes 2030, causing the ignition of water in fuel 2020. Expanding gases 2135 caused by the ignition process of pellet 2130 may cause the rotation of electrodes 2030. Such rotation may be coupled to a shaft (not shown) to provide rotational power.

One or more gears 2125 can include a set of herringbone gears each comprising an integer n teeth wherein fuel 2020 flows into the nth inter-tooth gap or bottom land as the fuel in the n−1th inter-tooth gap is compressed by tooth n−1 of the mating gear. Other geometries of gears 2125 or the function of gears 2125 are contemplated by the present disclosure, such as, for example, inter-digitated polygonal or triangular-toothed gears, spiral gears, and augers as known to those skilled in the art.

Electrodes 2030 could include conducting and non-conducting regions. For example, gear tooth 2140 of cathode 2120 may include conducting materials while the gear teeth 2140 of anode 2110 may be non-conducting. Instead, the material between gear teeth 2140 of anode 2110 may be conducting, providing a conduction pathway between anode 2110 and cathode 2120 that passes through pellet 2130. If gears 2125 have a conducting inter-digitation region that contacts fuel 2020 during meshing, and are insulating in other regions, current may selectively flow through fuel 2020. At least part of gear 2125 may comprise a non-conductive ceramic material, while the inter-digitation region can be metal coated to be conductive.

In operation, gears 2125 may be energized intermittently such that a high current flows through fuel 2020 when gears 2125 are meshed. The flow of fuel 2020 may be timed to match the delivery of pellet 2130 to gears 2125 as they mesh and the current is caused to flow through pellet 2130. The consequent high current flow causes fuel 2020 to ignite. The resulting plasma expands out the sides of gears 2125. The plasma expansion flow may be along the axis that is parallel with the shaft of gear 2125 and transverse to the direction of the flow of the fuel 2020. Moreover, one or more flows of plasma can be directed to an electric converter, such as, for example, in an MHD converter, as explained in more detail below. Further directional flow of plasma may be achieved with confining magnets such as those of Helmholtz coils or a magnetic bottle.

Electrodes 2030 may include a regeneration system or process to remove material deposited on gear teeth 2140 via the ignition process. A heating or cooling system (not shown) may also be included.

Although every gear tooth 2140 of cathode 2120 may be coupled to pellet 2130 in the accompanying figures, in some embodiments, one or more gear teeth 2140 may not couple to pellet 2130. Additionally, anode 2110, cathode 2120, or both electrodes 2030 may include various distributions of pellets 2130 or other forms of fuel 2020, for example, different numbers of pellets 2130 may be located on each on different gear teeth 2140.

In operation fuel 2020 may be continuously flowed through gears 2125 (or rollers) that may rotate to propel fuel 2020 through the gap. Fuel 2020 may be continuously ignited as it is rotated to fill the space between electrodes 2030 comprising meshing regions of a set of gears 2125. Such operation may output a generally constant mechanical or electrical power output.

Figure 31:
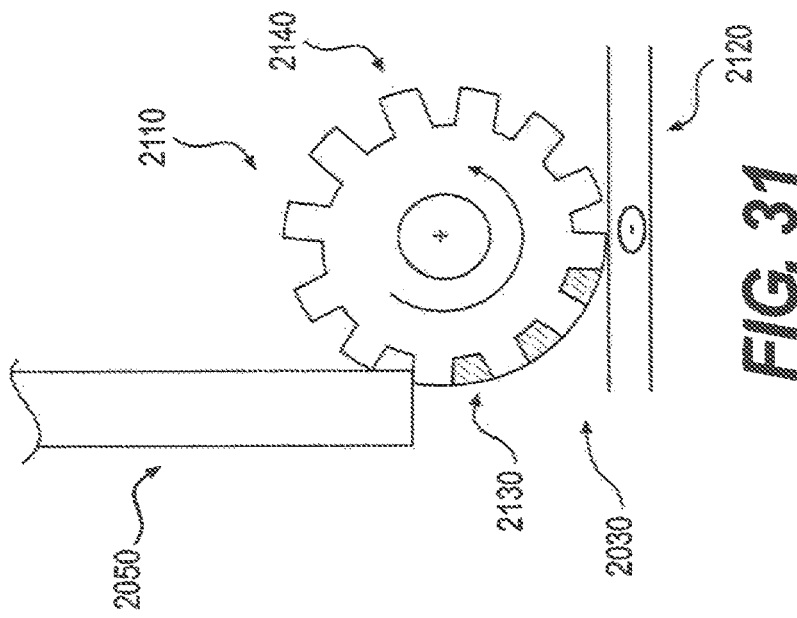
FIG. 31 is an illustration of a pair of electrodes, according to an embodiment of the present disclosure.

FIG. 31 depicts electrodes 2030, according to another exemplary embodiment, where anode 2110 moves (e.g., rotates) while cathode 2120 remains stationary. In other embodiments, cathode 2120 may move and anode 2110 may remain stationary.

As shown, fuel delivery device 2050 delivers pellet 2130 between gear teeth 2140. Rotation of anode 2110 can then bring pellet 2130 into contact with or into close proximity to cathode 2120. Ignition of the water within pellet 2130 can then cause rotation of anode 2110, in a similar manner to that described above.

Figure 32:
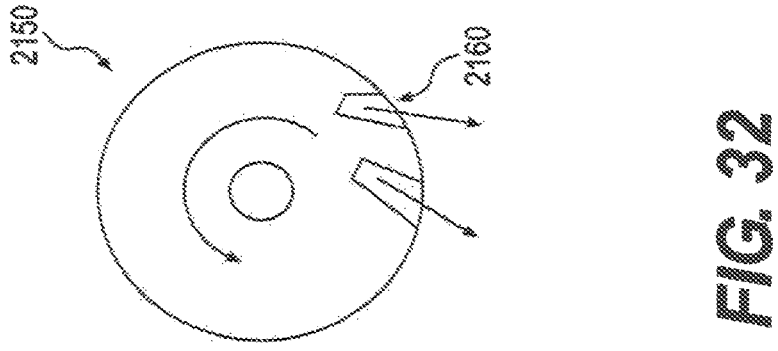
FIG. 32 is an illustration of an electrode, according to an embodiment of the present disclosure.

FIG. 32 illustrates another configuration where an electrode 2150, which can include anode 2110 or cathode 2120, includes one or more ignition flow portal 2160 positioned about electrode 2150 to provide rotational thrust. For example, flow portal 2160 could be angled relative to a circumference of electrode 2150 such that ignition gases exit flow portals 2160 at an angle, as shown in FIG. 32. Such angled thrust can provide electrode 2150 with rotation. Other objects (not shown), such as baffles, conduits, or other mechanisms may be used to create rotational forces on electrode 2150, which could subsequently drive a shaft (not shown) or other component to output rotational power.

Figures 33A, 33B:
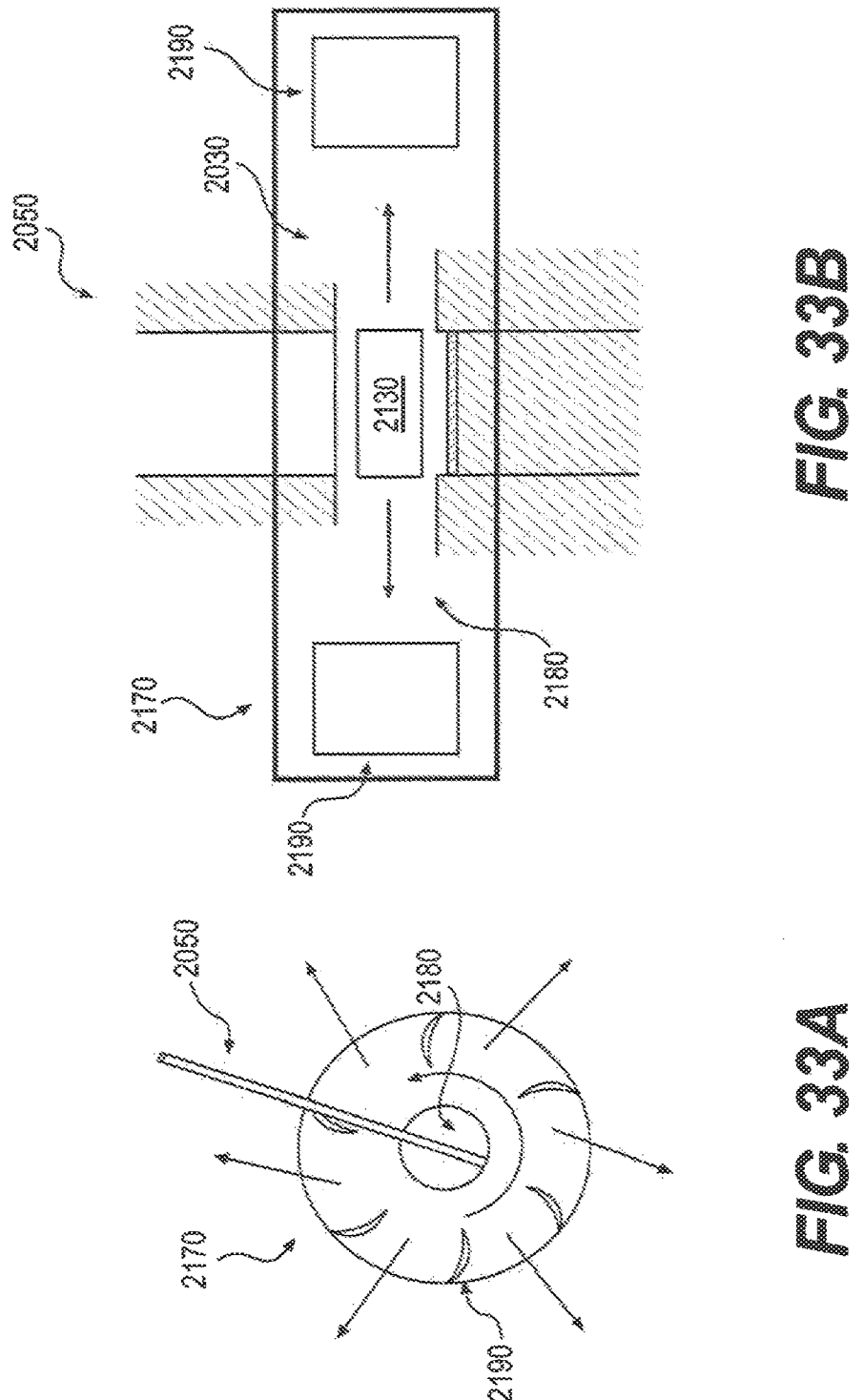
FIGS. 33A and 33B are different views of an impeller, according to an embodiment of the present disclosure.

FIGS. 33A, 33B illustrate an embodiment of system 2010 whereby an ignition process is used to rotate an impeller 2170. Such a radial flow impeller may be driven by an ignition process using fuel 2020, described above. As shown in FIG. 33A, fuel delivery device 2050 may extend toward a central, hollow region 2180 of impeller 2170. Pellet 2130 may be generally positioned within hollow region 2180, as shown in FIG. 33B. Electrodes (not shown) can also be located within hollow region 2180 and may be configured to electrically couple to pellet 2130 when pellet 2130 is located within hollow region 2180. Once properly positioned, pellet 2130 can be ignited, producing radially expanding ignition gases and/or plasma. These gases may be directed by one or more blades 2190 of impeller 2170. Blades 2190 may direct the ignition gas flow at an angle to impeller 2170, imparting rotational movement on impeller 2170.

Figure 34:
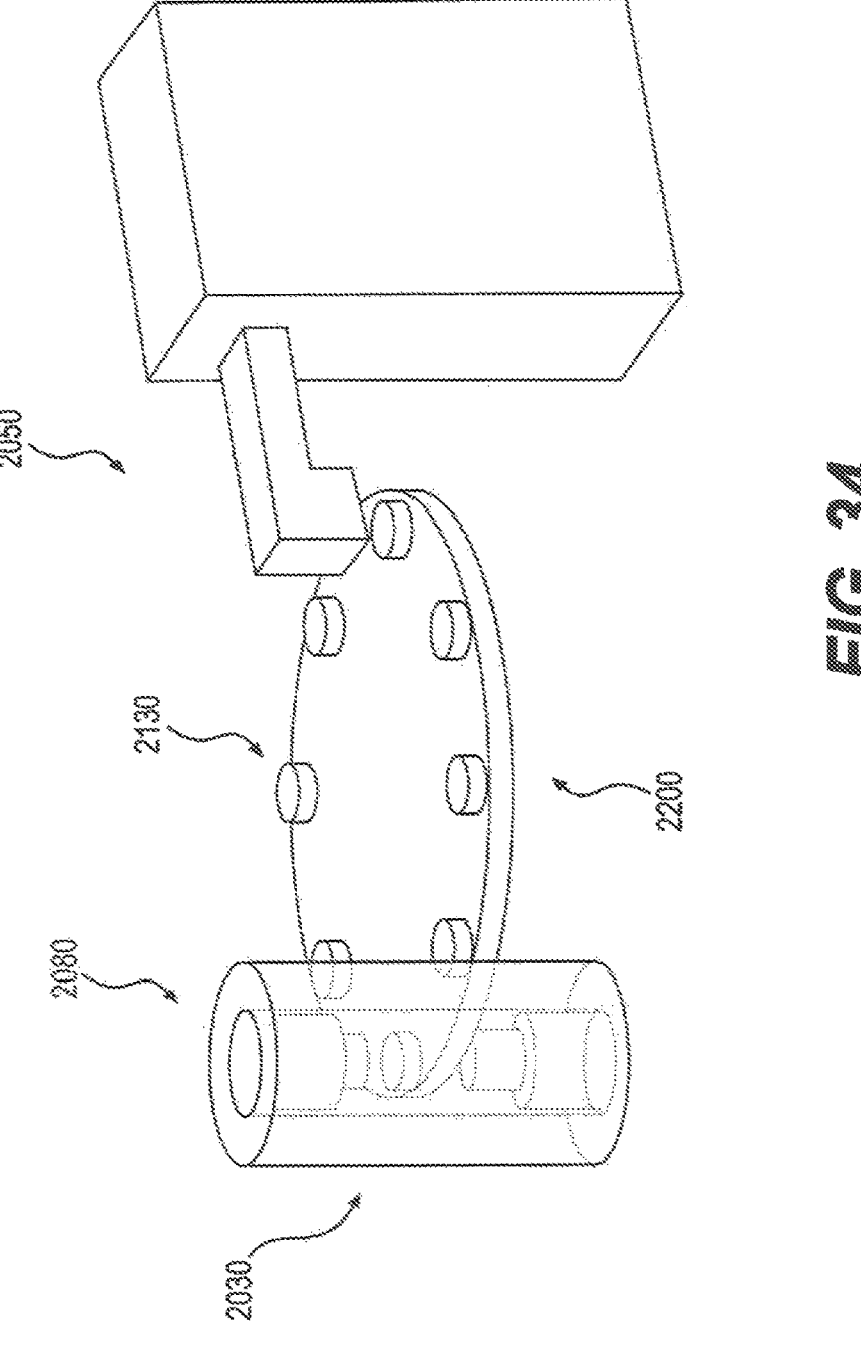
FIG. 34 is an illustration of a mechanical power generation system, according to an embodiment of the present disclosure.

FIG. 34 depicts another exemplary embodiment of system 2010, wherein fuel delivery device 2050 includes a carousel 2200. Carousel 2200 can be configured to move fuel 2020 generally between electrodes 2030 via rotational movement. For example, once properly positioned within ignition chamber 2080, a high-intensity electrical pulse can be applied to pellet 2130. The other components of system 2010 are described above.

Figure 35B:
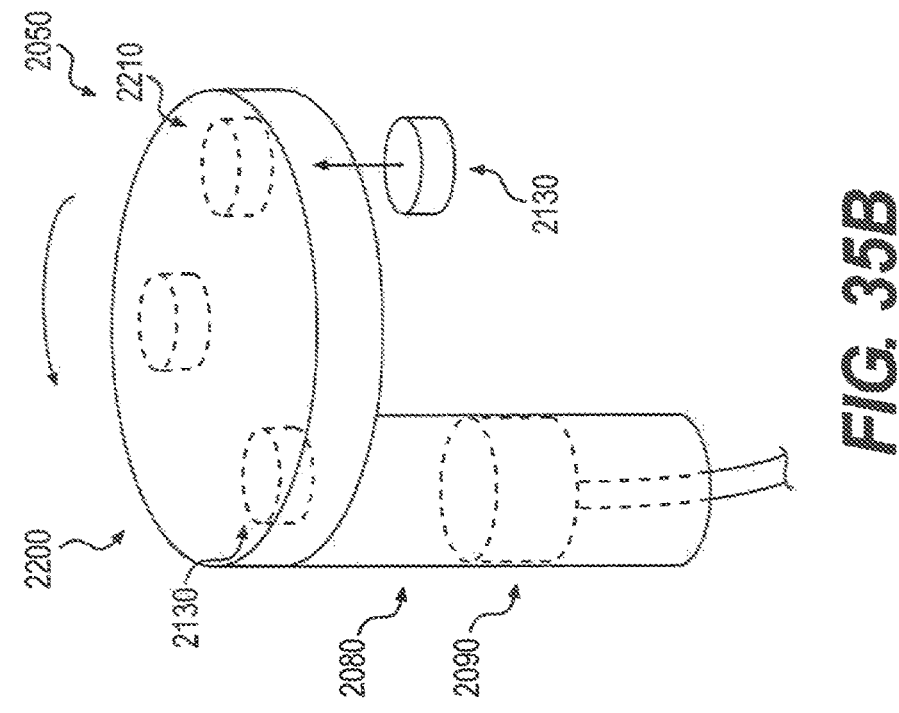
FIGS. 35A and 35B are different views of a fuel delivery device and an ignition chamber, according to an embodiment of the present disclosure.
Figure 35A:
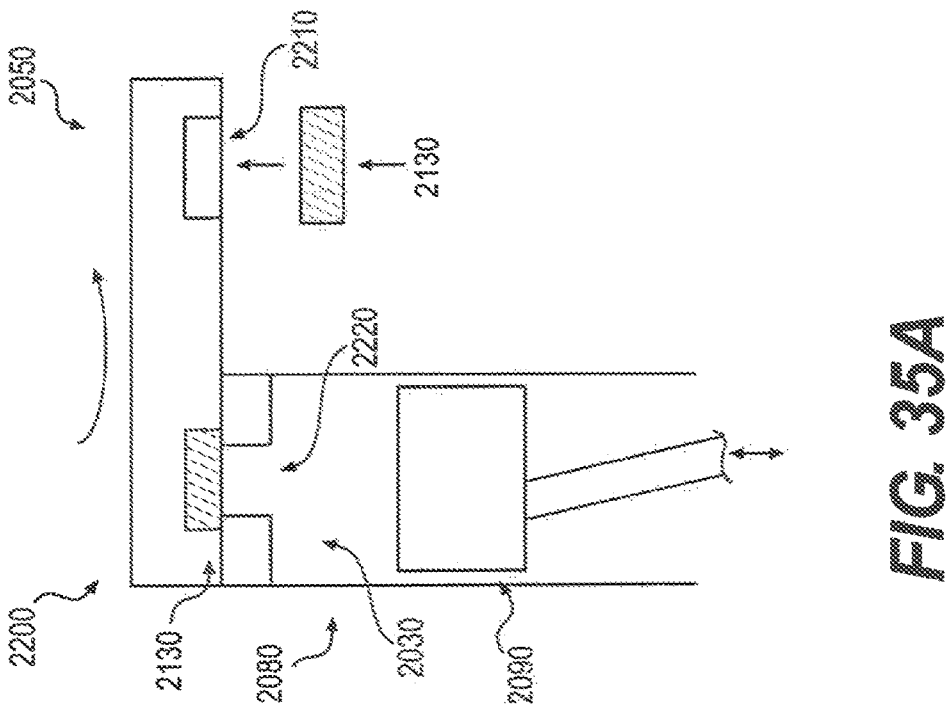

Another embodiment of the present disclosure is shown in FIGS. 35A, 35B, wherein fuel delivery device 2050 is moveably coupled to ignition chamber 2080. In particular, carousel 2200 can be configured to receive pellet 2130 within a receptacle 2210. Once pellet 2130 is coupled to receptacle 2210, carousel 2200 may rotate to position pellet 2130 about an aperture 2220 of ignition chamber 2080. For example, pellet 2130 could be positioned within aperture 2220 or in fluid communication with aperture 2220. Once appropriately positioned, a high-intensity electrical pulse may be applied across electrodes 2030 and may pass through pellet 2130. The ignition gases may expand and in doing so, may apply a pressure to piston 2090 to drive piston 2090.

Figure 36:
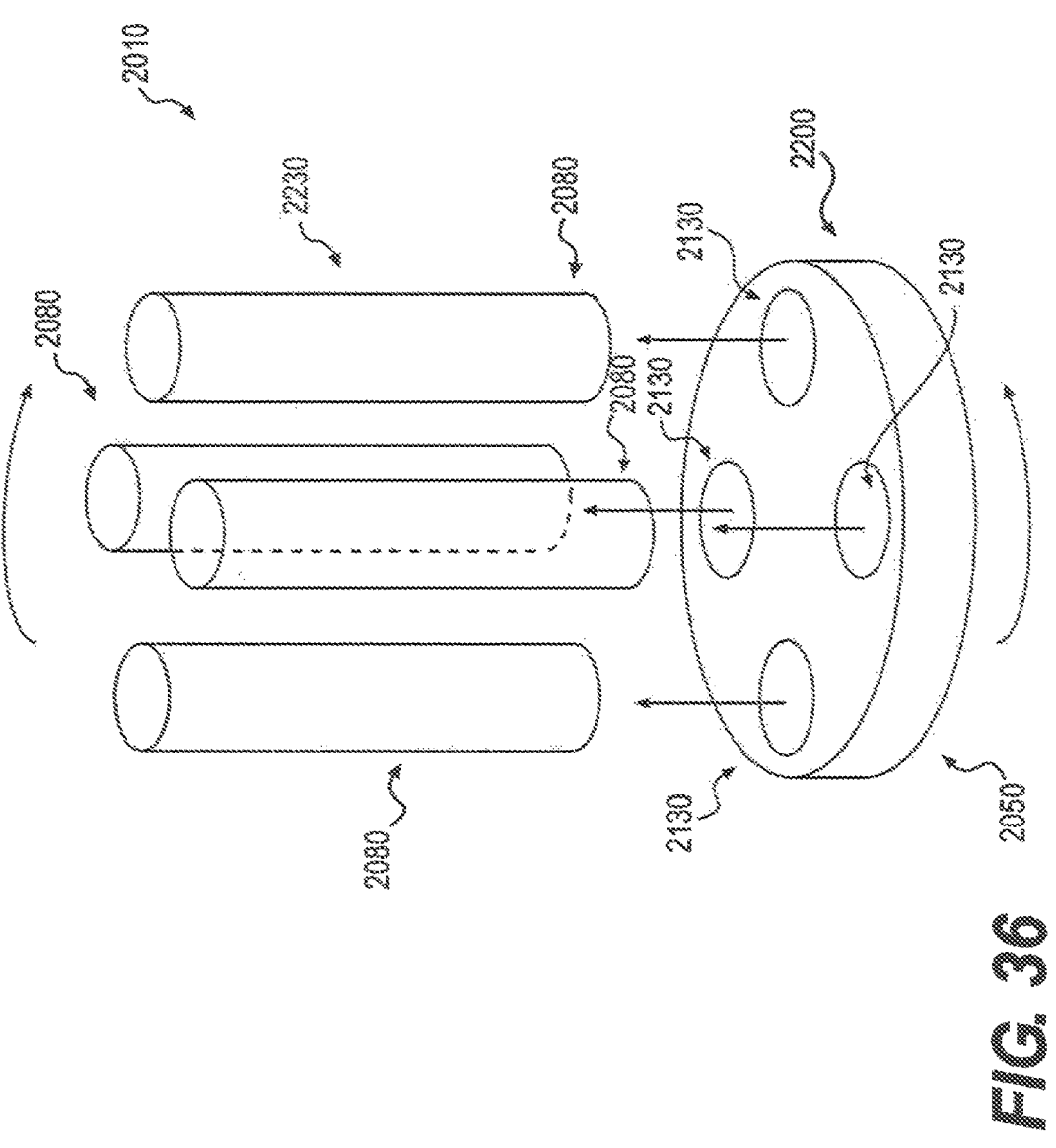
FIG. 36 is an illustration of a chamber array and a fuel delivery device, according to an embodiment of the present disclosure.

FIG. 36 depicts another exemplary embodiment of system 2010, wherein carousel 2200 cooperates with a chamber array 2230. Chamber array 2230 can include a collection of two or more ignition chambers 2080. In operation, chamber array 2230 can move relative to carousel 2200 or another form of fuel delivery device 2050. For example, array 2230 may move rotationally relative to a stationary fuel delivery device 2050. Alternatively, chamber array 2230 may remain stationary while carousel 2200 moves, or both array 2230 and carousel 2200 may move.

Fuel from fuel delivery device 2050 may be loaded sequentially or simultaneously into one or more ignition chambers 2080 of array 2230. Once loaded, one or more pellets 2130 in one or more chambers 2080 may be fired to power one or more pistons, turbines, gears, or other moveable elements (not shown). While system 2010 is shown with a single carousel 2200, it is also contemplated that multiple carousels 2200 could be used to supply fuel to array 2230. Such a system could include a single carousel 2200 associated with a single ignition chamber 2080, so that four carousels (not shown) would supply fuel to the four ignition chambers 2080 of array 2230. Such an embodiment could allow for a greater firing rate than using a single carousel 2200.

As described above, water-based fuel 2020 may be supplied in one or more various forms, including gas, liquid, or solid. Solid pellets 2130 may be provided in various shapes, and the hockey-puck shown in the above figures is exemplary. In other embodiments, pellet 2130 can be cubic, spherical, tablet-shaped, irregular, or any other suitable shape. Moreover, pellet 2130 could be formed into any appropriate size, including mm, micron, and nano-meter sized particles.

Figures 37A, 37B, 37C:
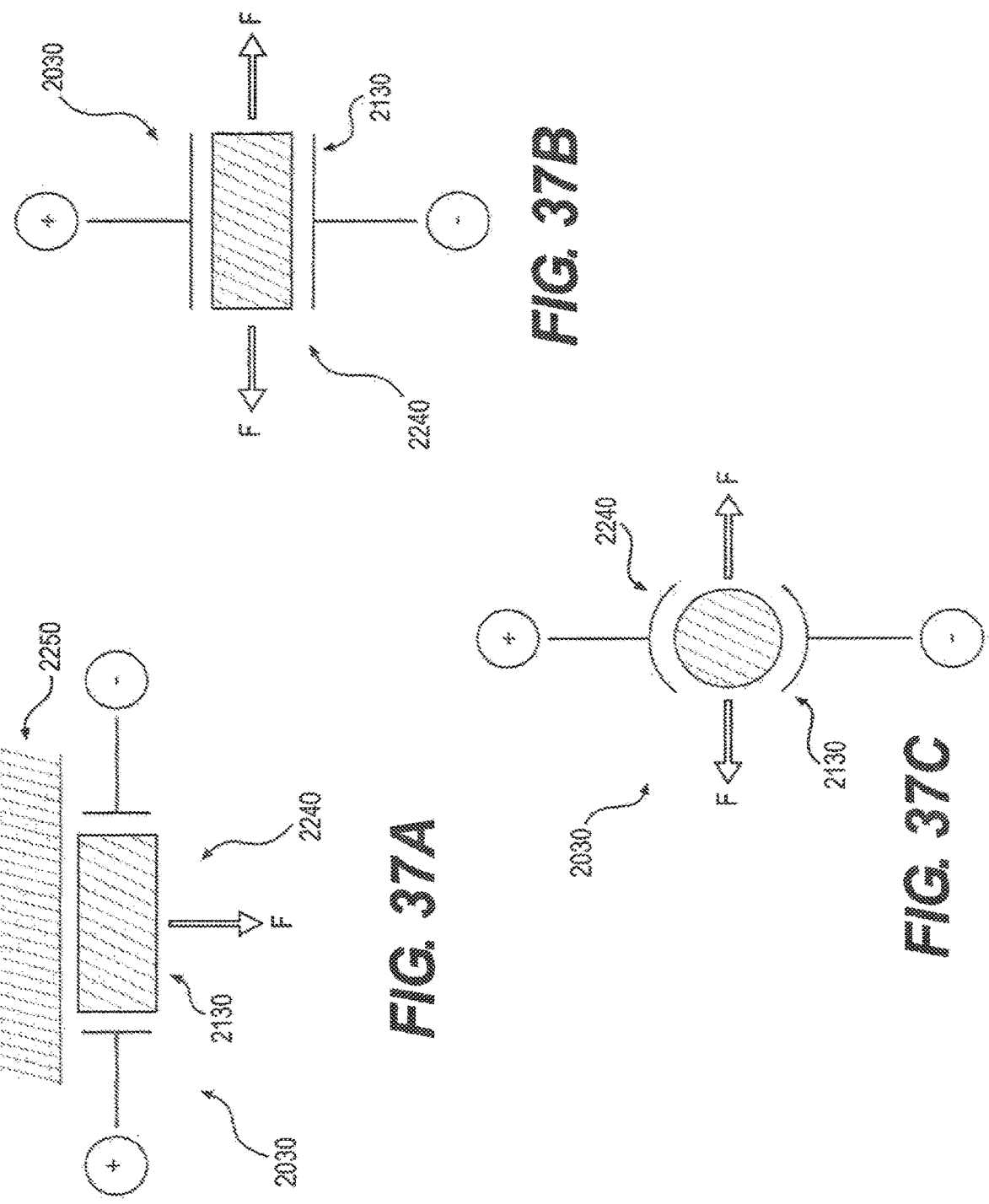
FIGS. 37A, 37B, and 37C are illustrations of different embodiments of fuel receptacles and electrodes in accordance with the present disclosure.

The shape and size of pellet 2130 may influence the configuration of electrodes 2030. For example, as shown in FIGS. 37A, 37B a puck-type pellet can be received in a suitably shaped receptacle 2240. Part of receptacle 2240 may be formed by a wall element 2250, which may be stationary or moveable, which may enclose or partially enclose pellet 2130 once received. Part of receptacle 2240 may also be formed by one or more electrodes 2030. As further shown in FIGS. 37A, 37B, different configurations of electrodes 2030 and/or wall elements 2250 can create different force directions (arrows shown as "F"). Moreover, differently shaped electrodes 2030 and/or wall elements 2250 can be configured to form differently shaped receptacles, such as, for example, a spherical receptacle 2240, as shown in FIG. 37C.

Figures 38A, 38B:
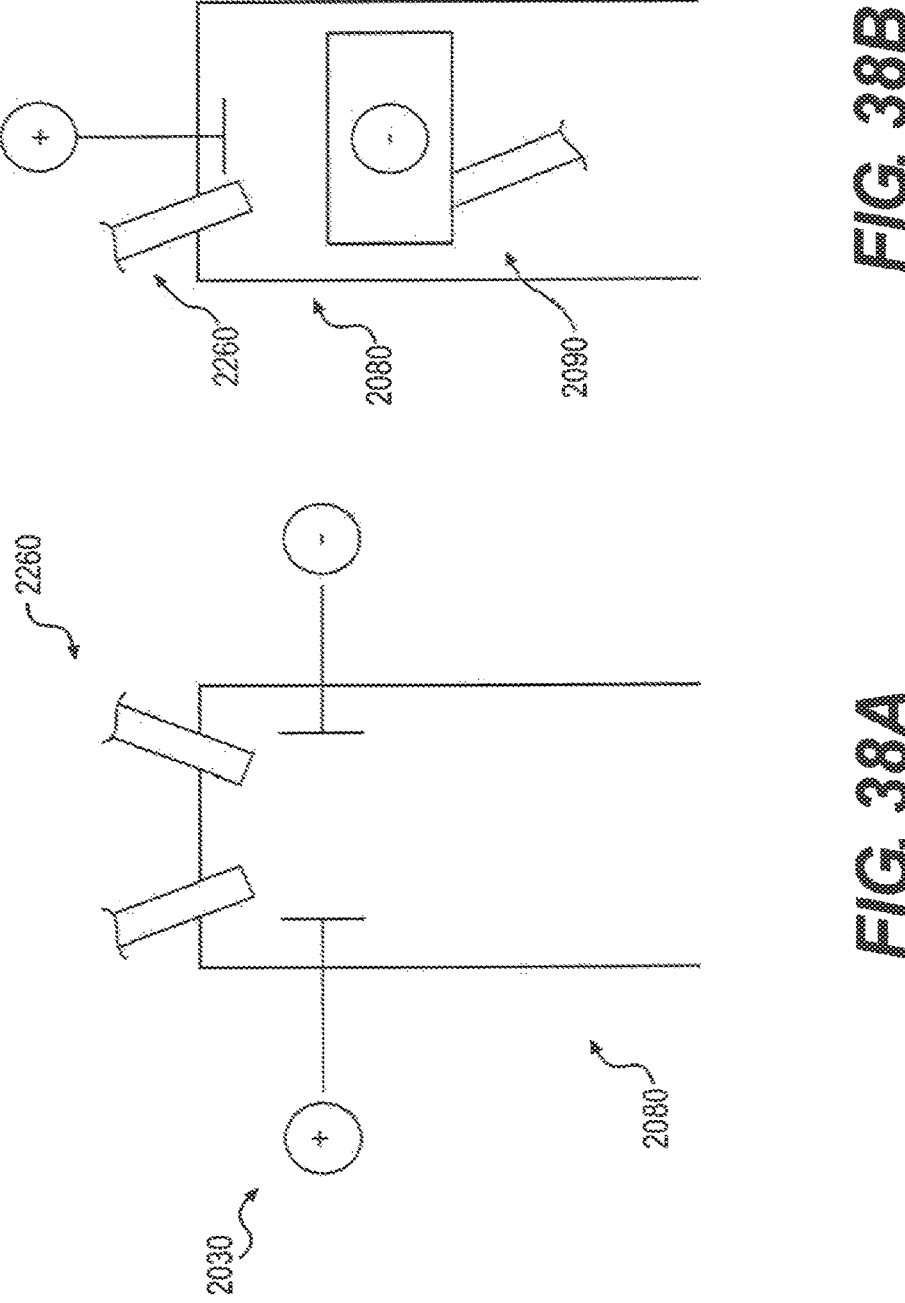
FIGS. 38A and 38B is an illustration of ignition chambers, according to embodiments of the present disclosure.

As explained above, a solid, liquid, or gas form of fuel 2020 may be used. Such fuel may be injected into ignition chamber 2080 using one or more injection devices 2260, as shown in FIGS. 38A and 38B. A first injection device 2260 may be configured to supply water or a water-based material in a fine stream of particulate matter, in a liquid, slurry, gel, or gas. A second injection device 2260 may be configured to supply a solid fuel or energetic material, as described above (the latter comprise some $H_2O$ or form $H_2O$ in some embodiments of the present disclosure). Streams of one or more materials may be directed into chamber 2080 to provide appropriate mixing and/or positioning of materials relative to electrodes 2030.

In other embodiments, one or more injection devices 2260 can be configured to deliver a working fluid to chamber 2080. The working fluid can include air, inert gas, other gas or gas combinations, or liquid. The working fluid can be injected at pressures below atmospheric, at atmospheric, or above atmospheric.

Although FIG. 38A shows two injection devices 2260 associated with a single ignition chamber 2080, one or more injection devices may be associated with one or more chambers 2080. It is also contemplated that injection device 2260 may include one or more electrodes 2030. One or more electrodes may be stationary or moveable relative to ignition chamber 2080. For example, as shown in FIG. 38B, piston 2090 may include a cathode, and chamber 2080 may include an anode. Relative movement between electrodes 2030 and chamber 2080 may permit regeneration of fuel 2020, reduce maintenance, or prolong operating life of system 2010. Moreover, one or more injection devices 2260 may be moveable relative to ignition chamber 2080, similar to fuel delivery device 2050 described above. Moving injection device 2260 relative to ignition chamber 2080 prior to ignition of fuel 2020 may reduce the maintenance and prolong the operating life of injection device 2260.

In other aspects, one or more injection devices 2260 could be used with system 2010 described above. For example, fuel 2020 in the form of a fine powder may be sprayed onto a region of gear tooth 2140. Fuel confined between adjacent electrodes 2030 may be ignited, transferring forces to a movable element, to output mechanical power. In another aspect, fuel 2020 may be injected into hollow region 2180, as shown in FIGS. 38A and 38B.

Figure 39:
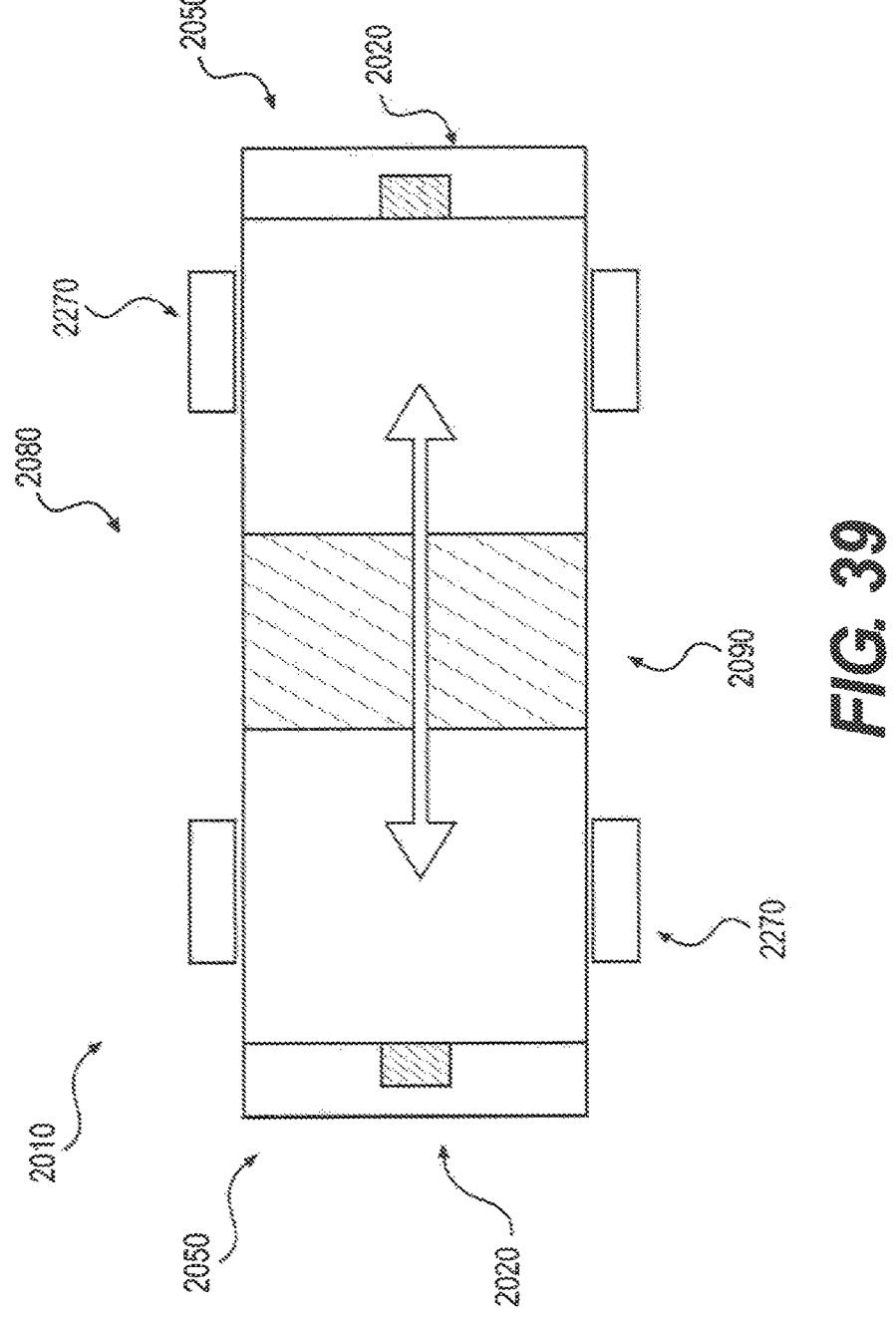
FIG. 39 is an illustration of an ignition chamber, according to an embodiment of the present disclosure.

FIG. 39 depicts another exemplary embodiment of system 2010, wherein ignition chamber 2080 includes at least a partial vacuum. Specifically, a hollow region of chamber 2080 containing piston 2090 may include at least a partial vacuum. The vacuum may range from about 10-1 Torr to about 10-10 Torr. In some embodiments, atmospheric pressure may be used. In other embodiments, pressures greater than atmospheric may be used.

In operation, piston 2090 may move left and right as indicated in FIG. 39. For example, ignition of fuel 2020 on the left-hand side of chamber 2080 may drive piston 2090 right. Then ignition of fuel 2020 on the right-hand side of chamber 2080 may drive piston 2090 left. In between ignition cycles, fuel delivery devices 2050 may replenish fuel 2020. Piston 2090 may be coupled to a mechanical member (not shown), configured to output mechanical power. Such closed-loop embodiments could be adapted to operate as a Stirling engine, including alpha-type, beta-type, gamma-type, free-piston, flat, and other types of Stirling engines.

A closed-loop system could also operate with one or more moveable elements. And in general, one or more components of system 2010 could form part of a closed-loop system. For example, chamber 2080 could form part of a closed-loop system configured to recirculate a working fluid. Such a system could operate as a heat exchanger. For example, system 2010 could operate a refrigeration cycle whereby a working fluid would circulate between heating and cooling elements. Such a system may include periodic injections of fuel 2020 as required to maintain at least on of plasma, arc plasma, and thermal power formation.

In some embodiments, system 2010 of FIG. 39 could include one or more magnetohydrodynamic (MHD) converters comprising at least one pair of conductive elements 2270 that serve as MHD electrodes or comprising magnets 2270 to produce a transverse magnetic field to the axis of flow shown as the longitudinal axis of the combustion chamber 2080 wherein the pair of electrodes 2270 and magnets 2270 are transverse to each other and both are transverse to the direction of plasma flow. In other embodiments, similar devices are configured to generate electrical power. For example, in a plasmadynamic converter (PDC), one or more magnetized conductive elements (not shown) placed in chamber 2080 may be used with correspondingly paired unmagnetized conductive elements (not shown) placed in chamber 2080 to generate electrical power. In other embodiments, an electromagnetic direct converter, a charge drift converter, or magnetic confinement may also be used to generate electrical power.

MHD power conversion relies on passing a flow of ions or plasma across a magnetic field. Positive and negative ions may be directed along various trajectories, depending on electrode placement, and a voltage may be applied between the electrodes. The typical MHD method of forming a mass flow of ions includes expanding a high-pressure gas seeded with ions through a nozzle. This can create a high-speed flow through the crossed magnetic field, with a set of electrodes located with respect to the deflecting field to receive the deflected ions. In system 2010, the pressure of an ignition reaction is typically greater than atmospheric, but not necessarily so. Directional mass flow may be achieved by ignition of fuel 2020 to form an ionized expanding plasma.

Such a configuration could allow for the generation of both mechanical and electrical power from the ignition of water. In addition, at least some of the electrical energy produced by the ignition process could be used to power electrodes 2030 or other electrical components of system 2010.

Figure 40:
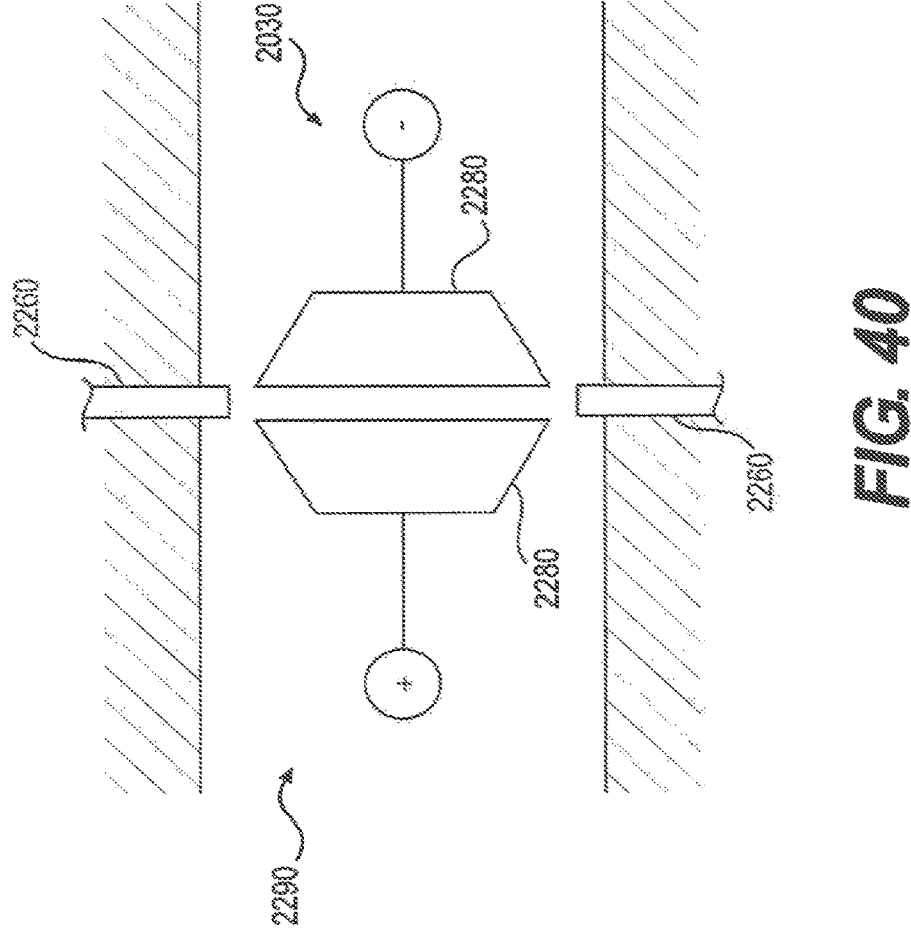
FIG. 40 is an illustration of an ignition chamber, according to an embodiment of the present disclosure.

FIG. 40 depicts another exemplary embodiment of system 2010, wherein one or more turbines 2280 are located within a flow chamber 2290. One or more injection devices 2260 may also be directed into flow chamber 2290.

As described above for chamber 2080, flow chamber 2290 can be configured to ignite fuel 2020. Flow chamber 2290 can also be configured to receive a working fluid that passes through flow chamber 2290. As shown, turbine 2280 upstream of injection devices 2260 may receive a flow of working fluid and at least partially compress the working fluid. Injection devices 2260 may then inject one or more materials, as described above, into the compressed working fluid. Ignition may expand the working fluid through a second downstream turbine 2280, creating thrust. Alternatively, mechanical power may be output via a shaft (not shown) or other device mechanical coupled to turbine 2280.

Figure 41:
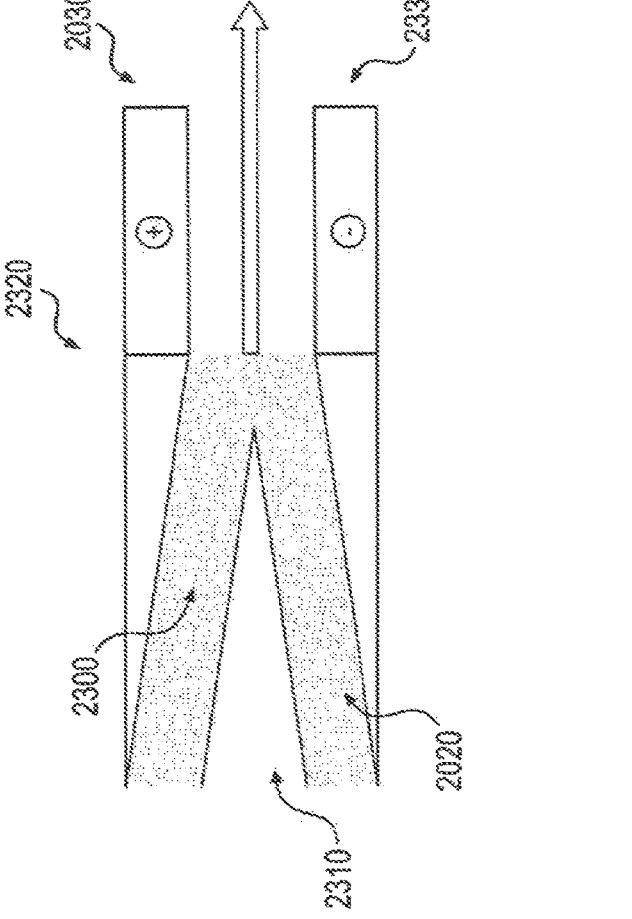
FIG. 41 is an illustration of an ignition chamber, according to an embodiment of the present disclosure.

FIG. 41 depicts another exemplary embodiment of system 2010, wherein a thruster 2320 is configured to provide thrust as shown by the arrow. For example, fuel 2020 may be supplied to a passage 2300. In some embodiments, fuel 2020 and/or a fluid in passage 2300 may be at least partially directed towards a nozzle 2330 by an element 2310. In addition, passage 2300 can be configured to compress or direct fuel 2020 or a fluid in passage 2300. As explained above, the fluid in passage 2300 can include a working fluid. One or more electrodes 2030 can be associated with passage 2300 or element 2310. Such an arrangement can be used to provide thruster 2320.

In operation, fuel 2020 can be ignited as described above. For example, a high-current initiated ignition can create expanding plasma that may provide thrust. Thruster 2320 may comprise a closed cell except for a nozzle 2330 configured to direct the expanding plasma to provide thrust. In another embodiment, thruster 2320 can comprise a magnetic or other plasma confinement region. Additional components can direct a magnetic field system to cause the plasma to flow in a directed manner from electrodes 2030 following ignition by high-current. In another embodiment, the highly ionized plasma may be used in ion motors and ion thrusters known by those skilled in the art to provide thrust.

The systems, engines, and ignition processes described herein may find use in a wide range of applications requiring mechanical power. For example, the present systems, devices, and methods may be used or readily adapted to operate in land-based, aviation, marine, submarine, or space environments. Mechanical power generation using principles described herein may find use in transport, mining, farming, or industrial equipment. For example, a large-output motor may be used in industrial processing, power generation, HVAC, or manufacturing facilities. Medium-output applications may include use in a car, truck, train, boat, motorbike, scooter, jet-ski, snow-mobile, outboard marine engine, fork lift, etc. Features described herein may also be used in white goods (e.g., refrigerator, washing machine, dish washer, etc.), gardening equipment (e.g., lawn mower, snow blower, brush cutter, etc.), or other applications requiring a small output motor.

For example, embodiments of the present disclosure may be used with a machine configured for land-based transportation. One or more aspects of system 2010 described above may be mechanically coupled to a drive-shaft or other component configured to output mechanical power to a transportation element. The transportation element can include at least one of a wheel, a track, a gear assembly, a hydraulic member, or other device to provide movement over a land surface. Various machines are contemplated for land-based transportation, including, an automobile, a motorcycle, a snow-mobile, a truck, or a train. Other types of personal, recreational, and commercial vehicles are also contemplated.

In another embodiment, one or more aspects of system 2010 could be used with a machine configured for aviation transport. Such a machine can include one or more aviation elements configured to provide propulsion. It is contemplated that the aviation element could include an aviation propeller, a compressor, or other element configured to produce propulsion in an aviation environment. Such a machine could include a turbojet, a turbofan, a turboprop, a turboshaft, a propfan, a ramjet, a scramjet, or another type of aviation engine.

Aspects of the present disclosure could also be configured to operate in a marine environment. For example, a marine element could provide propulsion in a marine environment, and may include a marine propeller. Other types of marine elements could be contemplated by one of ordinary skill, and could form part of a pump-jet, a hydro-jet, a water-jet, or other type of water engine.

Yet other aspects of the present disclosure include a work machine provided with a work element configured to provide mechanical power. The work element can include a rotating shaft, a reciprocating rod, a cog, an auger, a blade or other component known in the art. The work element can form part of a refrigerator, a washing machine, a dish washer, a lawn mower, a snow blower, a brush cutter, or other type of work machine.

XI. Experimental

A. Exemplary SF-CIHT Cell Test Results on Energy and Solid Fuel Regeneration

In an experimental test the sample comprised a 1 cm$^2$ nickel screen conductor coated with a thin (<1 mm thick) tape cast coating of NiOOH, 11 wt % carbon, and 27 wt % Ni powder. The material was confined between the two copper electrodes of a Taylor-Winfield model ND-24-75 spot welder and subjected to a short burst of low-voltage, high-current electrical energy. The applied 60 Hz voltage was about 8 V peak, and the peak current was about 20,000 A. After about 0.14 ms with an energy input of about 46 J, the material vaporized in about 1 ms. Several gauges of wire were tested to determine if 8 V was sufficient to cause an exploding wire phenomenon observed with high-energy, multi-kilovolt-charged, high-capacitance capacitors that are short circuited. Only known resistive heating to glowing red and heating to melting in the case of an 0.25 mm diameter Au wire were observed.

The thermodynamically calculated energy to vaporize just the 350 mg of NiOOH and 50 mg of Ni metal was 3.22 kJ or 9.20 kJ/g NiOOH. Since the NiOOH decomposition energy is essentially zero, this experiment demonstrated a large energy release. The blast initiated after a negligible total energy of 40 J was applied. The blast caused 3.22 kJ of thermal energy to be released in 3 ms corresponding to 1,100,000 W (1.1 MW) thermal power. Given the sample dimensions of 1 cm$^2$ area and <1 mm thickness, the volumetric power density was in excess of $11 \times 10^9$ W/l thermal. From the fit of the visible spectrum recorded with an Ocean Optics visible spectrometer to the blackbody radiation curve, the gas temperature was 25,000K.

Consider that the calculated thermal energy to achieve the observed vaporization of just the 350 mg of NiOOH and 50 mg of Ni mesh components of the reaction mixture is 3.22 kJ. The moles of H$_2$ in 350 mg of NiOOH solid fuel is 2 mmoles. Based on the calculated enthalpy of 50 MJ/mole H$_2$(¼) for the hydrino reaction of H$_2$ to H$_2$(¼) with a stoichiometry of ⅔ of the H goes to HOH catalyst and ⅓ to hydrino H$_2$(¼), the corresponding maximum theoretical energy from forming H$_2$(¼) is 33 kJ; so, about 10% of the available hydrogen was converted to H$_2$(¼). The corresponding hydrino reaction yield is 64.4 umoles H$_2$(¼).

Another embodiment of the solid fuel comprised 100 mg of Co powder and 20 mg of MgCl$_2$ that was hydrated. The reactants were compressed into a pellet and ignited with the Taylor-Winfield model ND-24-75 spot welder by subjecting the pellet to a short burst of low-voltage, high-current electrical energy. The applied 60 Hz voltage was about 8 V peak, and the peak current was about 20,000 A. The blast occurred in an argon filled glove bag and released an estimated 3 kJ of plasma energy. The particles of the plasma condensed as a nanopowder. The product was hydrated with 10 mg $H_2O$, and the ignition was repeated. The repeat blast of the regenerated solid fuel was more powerful than the first, releasing about 5 kJ of energy.

B. Calorimetry of Solid Fuel of the SF-CIHT Cell

Calorimetry was performed using a Parr 1341 plain-jacketed calorimeter with a Parr 6774 calorimeter thermometer option on a solid fuel pellet. A Parr 1108 oxygen combustion chamber of the calorimeter was modified to response to the energy released from the ignited solid fuel using the calibrated heat capacity was 3,035.7 J. By subtracting the input energy, the net energy was 2,136.7 J for the 0.075 g sample. In control experiments with $H_2O$, the alumina pan did not undergo a reaction other than become vaporized in the blast. XRD also showed no aluminum oxide formation. Thus, the theoretical chemical reaction energy was zero, and the solid fuel produced 28,500 J/g of excess energy in the formation of hydrinos.

C. Differential Scanning Calorimetry (DSC) of Solid Fuels

Solid fuels were tested for excess energy over the maximum theoretical using a Setaram DSC 131 differential scanning calorimeter using Au-coated crucibles with representative results shown in TABLE 8.

TABLE 8

Exemplary DSC Test Results.

| Date | Reactants | Mass (mg) | Temp (° C.) | Heating (J/g) | Cooling (J/g) | Exp. Total (J/g) | Theo Energy (J/g) |
|---|---|---|---|---|---|---|---|
| Sep. 30, 2013 | 4.6 mg Cu(OH)2 + 11.0 mg FeBr2 | 15.6 | 280 | −195.51 | −19.822 | −215.33 | −62.97 |
| Oct. 10, 2013 | 5.7 mg FeOOH | 5.7 | 450 | −116.661 | 6.189 | −110.472 | −51.69 |
| Oct. 28, 2013 | 14.3 mg CuBr2 + 1.2 mg H2O | 15.5 | 340 | −78.7 | −30.4 | −109.1 | +885.4 | permit initiation of the chemical reaction with high current. Copper rod ignition electrodes that comprised ½" outer diameter (OD) by 12" length copper cylinders were fed through the sealed chamber containing a graphite pellet (~1000 mg, L×W×H=0.18"×0.6"×0.3") as a control resistive load for calibration of the heat capacity of the calorimeter or a solid fuel pellet wherein the ends had a copper clamp that tightly confined each sample. The calorimeter water bath was loaded with 2,000 g DI water (as per Parr manual). The power source for calibration and ignition of the solid fuel pellet was a Taylor-Winfield model ND-24-75 spot welder that supplied a short burst of electrical energy in the form of a 60 Hz low-voltage of about 8 V RMS and high-current of about 15,000 to 20,000 A. The input energy of the calibration and ignition of the solid fuel was given as the product of the voltage and current integrated over the time of the input. The voltage was measured by a data acquisition system (DAS) comprising a PC with a National Instruments USB-6210 data acquisition module and Labview VI. The current was also measured by the same DAS using a Rogowski coil (Model CWT600LF with a 700 mm cable) that was accurate to 0.3% as the signal source. V and I input data was obtained at 10 KS/s and a voltage attenuator was used to bring analog input voltage to within the +/−10V range of the USB-6210.

The calibrated heat capacity of the calorimeter and electrode apparatus was determined to be 12,000 J/° C. using the graphite pellet with an energy input of 995 J by the spot welder. The sample of solid fuel comprising Cu (45 mg)+ CuO (15 mg)+$H_2O$ (15 mg) that was sealed in an aluminum DSC pan (70 mg) (Aluminum crucible 30 µl, D:6.7×3 (Setaram, S08/HBB37408) and Aluminum cover D: 6,7, stamped, tight (Setaram, S08/HBB37409)) was ignited with an applied peak 60 Hz voltage of 3 V and a peak current of about 11,220 A. The input energy measured from the voltage and current over time was 46 J to ignite the sample as indicated by a disruption spike in the waveforms with a total of 899 J input by the power pulse of the spot welder, and the total output energy calculated for the calorimetry thermal D. Spectroscopic Identification of Molecular Hydrino 0.05 ml (50 mg) of $H_2O$ was added to 20 mg or either $Co_3O_4$ or CuO that was sealed in an aluminum DSC pan (Aluminum crucible 30 µl, D:6.7×3 (Setaram, S08/HBB37408) and Aluminum cover D: 6,7, stamped, non-tight (Setaram, S08/HBB37409)) and ignited with a current of between 15,000 to 25,000 A at about 8 V RMS using a Taylor-Winfield model ND-24-75 spot welder. A large power burst was observed that vaporized the samples, each as an energetic, highly-ionized, expanding plasma. A MoCu foil witness plate (50-50 at %, AMETEK, 0.020" thickness) was placed 3.5 inches from the center of the ignited sample such that the expanding plasma was incident on the surface to embed $H_2(¼)$ molecules into the surface.

Using a Thermo Scientific DXR SmartRaman with a 780 nm diode laser in the macro mode, a 40 cm$^{-1}$ broad absorption peak was observed on the MoCu foil following exposure to the $H_2(¼)$ containing plasma. The peak was not observed in the virgin alloy, and the peak intensity increased with increasing plasma intensity and laser intensity. Since no other element or compound is known that can absorb a single 40 cm$^{-1}$ (0.005 eV) near infrared line at 1.33 eV (the energy of the 780 nm laser minus 1950 cm$^{-1}$) $H_2(¼)$ was considered. The absorption peak starting at 1950 cm$^{-1}$ matched the free space rotational energy of $H_2(¼)$ (0.2414 eV) to four significant figures, and the width of 40 cm$^{-1}$ matches the orbital-nuclear coupling energy splitting [Mills GUTCP].

The absorption peak matching the $H_2(¼)$ rotational energy is a real peak and cannot be explained by any known species. The excitation of the hydrino rotation may cause the absorption peak by an inverse Raman effect (IRE). Here, the continuum caused by the laser is absorbed and shifted to the laser frequency wherein the continuum is strong enough to maintain the rotational excited state population to permit the antiStokes energy contribution. Typically, the laser power is very high for an IRE, but the MoCu surface was found to cause surface enhanced Raman scattering (SERS). The absorption was assigned to an inverse Raman effect (IRE)

for the $H_2(\frac{1}{4})$ rotational energy for the J'=1 to J"=0 transition. This result shows that $H_2(\frac{1}{4})$ is a free rotor which is the case with $H_2$ in silicon matrix. The results on the plasma-exposed MoCu foils match those observed previously on CIHT cell as reported in Mills prior publication: R. Mills, J. Lotoski, J. Kong, G Chu, J. He, J. Trevey, High-Power-Density Catalyst Induced Hydrino Transition (CIHT) Electrochemical Cell, (2014) that is herein incorporated by reference in its entirety.

MAS $^1$H NMR, electron-beam excitation emission spectroscopy, Raman spectroscopy, and photoluminescence emission spectroscopy were performed on samples of reaction products comprising CIHT electrolyte, CIHT electrodes, and inorganic compound getter KCl—KOH mixture placed in the sealed container of closed CIHT cells.

MAS NMR of molecular hydrino trapped in a protic matrix represents a means to exploit the unique characteristics of molecular hydrino for its identification via its interaction with the matrix. A unique consideration regarding the NMR spectrum is the possible molecular hydrino quantum states. Similar to $H_2$ exited states, molecular hydrinos $H_2(1/p)$ have states with $\ell=0, 1, 2, \ldots, p-1$. Even the $\ell=0$ quantum state has a relatively large quadrupole moment, and additionally, the corresponding orbital angular momentum of $\ell \neq 0$ states gives rise to a magnetic moment [Mills GUT] that could cause an upfield matrix shift. This effect is especially favored when the matrix comprises an exchangeable H such as a matrix having waters of hydration or an alkaline hydroxide solid matrix wherein a local interaction with $H_2(1/p)$ influences a larger population due to rapid exchange. CIHT cell getter KOH—KCl showed a shift of the MAS NMR active component of the matrix (KOH) from +4.4 ppm to about –4 to –5 ppm after exposure to the atmosphere inside of the sealed CIHT cell. For example, the MAS NMR spectrum of the initial KOH—KCl (1:1) getter, the same KOH—KCl (1:1) getter from CIHT cells comprising [MoNi/LiOH—LiBr/NiO] and [CoCu (H perm)/LiOH—LiBr/NiO] that output 2.5 Wh, 80 mA, at 125% gain, and 6.49 Wh, 150 mA, at 186% gain, respectively, showed that the known downfield peak of OH matrix shifted from about +4 ppm to the upfield region of about –4 ppm. Molecular hydrino produced by the CIHT cell shifted the matrix from positive to significantly upfield. The different $\ell$ if quantum numbers possible for the p=4 state can give rise to different upfield matrix shifts consistent with observations of multiple such peaks in the region of –4 ppm. The MAS NMR peak of the KOH matrix upfield shifted by forming a complex with molecular hydrino that can be sharp when the upfield shifted hydroxide ion (OH$^-$) acts as a free rotor, consistent with prior observations. The MAS-NMR results are consistent with prior positive ion ToF-SIMS spectra that showed multimer clusters of matrix compounds with di-hydrogen as part of the structure, M:$H_2$ (M=KOH or $K_2CO_3$). Specifically, the positive ion spectra of prior CIHT cell getters comprising KOH and $K_2CO_3$ such as of $K_2CO_3$—KCl (30:70 wt %) showed K$^+$ ($H_2$:KOH)$_n$ and K$^+$ ($H_2$:$K_2CO_3$)$_n$ consistent with $H_2(1/p)$ as a complex in the structure [R. Mills, X Yu, Y. Lu, G Chu, J. He, J. Lotoski, "Catalyst induced hydrino transition (CIHT) electrochemical cell," (2014), International Journal of Energy Research].

The direct identification of molecular hydrino by its characteristic extraordinarily high ro-vibrational energies was sought using Raman spectroscopy. Another distinguishing characteristic is that the selection rules for molecular hydrino are different from those of ordinary molecular hydrogen. Similarly to $H_2$ excited states, molecular hydrinos have states with $\ell=0, 1, 2, \ldots, p-1$ wherein the prolate spheroidal photon fields of $H_2(1/p)$; p=1, 2, 3, $\ldots$, 137 have spherical harmonic angular components of quantum number e relative to the semimajor axis [Mills GUT]. Transitions between these prolate spheroidal harmonic states are permissive of rotational transitions of $\Delta J=0, \pm 1$ during a pure vibrational transition without an electronic transition as observed for $H_2$ excited states. The lifetimes of the angular states are sufficiently long such that $H_2(1/p)$ may uniquely undergo a pure ro-vibrational transition having the selection rule $\Delta J=0, \pm 1$.

The emitting ro-vibrational molecular hydrino state may be excited by a high-energy electron collision or the by a laser wherein due to the rotational energy of $p^2(J+1)0.01509$ eV [Mills GUT] excited rotational states cannot be populated as a statistical thermodynamic population at ambient temperatures since the corresponding thermal energy is less than 0.02 eV. Thus, the ro-vibrational state population distribution reflects the excitation probability of the external source. Moreover, due to the thirty-five times higher vibrational energy of $p^2 0.515$ eV over the rotational energy, only the first level, v=1 is expected to be excited by the external source. Molecular hydrino states can undergo $\ell$ quantum number changes at ambient temperature, and the J quantum state may changed during e-beam or laser irradiation as the power is thermalized. Thus, the initial state may be any one of $\ell=0, 1, 2, 3$ independently of the J quantum number. Thus, rotational and ro-vibrational transitions are Raman and IR active with the R, Q, P branches being allowed wherein the angular momentum is conserved between the rotational and electronic state changes. Permitted by the change in $\ell$ quantum number, the de-excitation vibrational transition v=1→v=0 with a rotational energy up conversion (J'-J"=-1), a down conversion (J'-J"=+1), and no change (J'-J"=0) gives rise to the P, R, and Q branches, respectively. The Q-branch peak corresponding to the pure vibrational transition v=1→v=0; $\Delta J=0$ is predicted to be the most intense with a rapid decrease in intensity for the P and R series of transition peaks of higher order wherein due to the available energy of internal conversion, more peaks of higher intensity are expected for the P branch relative to the R branch. An influence of the matrix is expected to cause a vibrational energy shift from that of a free vibrator, and a matrix rotational energy barrier is anticipated to give rise to about the same energy shift to each of the P and R branch peaks manifest as a nonzero intercept of the linear energy separation of the series of rotational peaks.

It was reported previously [R. Mills, X Yu, Y. Lu, G Chu, J. He, J. Lotoski, "Catalyst induced hydrino transition (CIHT) electrochemical cell," (2014), International Journal or Energy Research] that ro-vibrational emission of $H_2(\frac{1}{4})$ trapped in the crystalline lattice of getters of CIHT cell gas was excited by an incident 6 KeV electron gun with a beam current of 8 μA in the pressure range of $5\times10^{-6}$ Torr, and recorded by windowless UV spectroscopy. By the same method $H_2(\frac{1}{4})$ trapped in the metal crystalline lattice of MoCu was observed by electron-beam excitation emission spectroscopy. An example of the resolved ro-vibrational spectrum of $H_2(\frac{1}{4})$ (so called 260 nm band) recorded from the MoCu anode of the CIHT cell [MoCu(50/50) (H permeation)/LiOH+LiBr/NiO] that output 5.97 Wh, 80 mA, at 190% gain showed the peak maximum at 258 nm with representative positions of the peaks at 227, 238, 250, 263, 277, and 293 nm, having an equal spacing of 0.2491 eV. The results are in very good agreement with the predicted values for $H_2(\frac{1}{4})$ for the transitions of the matrix-shifted vibrational and free rotor rotational transitions of v=1→v=0 and Q(0), R(0), R(1), P(1), P(2), and P(3), respectively, wherein Q(0) is identifiable as the most intense peak of the series. The peak width (FWHM) was 4 nm. Broadening of ro-vibrational transitions of $H_2(\frac{1}{4})$ relative to ordinary H2 in a crystalline lattice is expected since the energies involved are extraordinary, being sixteen times higher, and significantly couple to phonon bands of the lattice resulting in resonance broadening. The 260 nm band was not observed on the MoCu starting material. The 260 nm band was observed as a second order Raman fluorescence spectrum from KOH—KCl crystals that served as a getter of $H_2(\frac{1}{4})$ gas when sealed in CIHT cells as described previously [R. Mills, X Yu, Y. Lu, G Chu, J. He, J. Lotoski, "Catalyst induced hydrino transition (CIHT) electrochemical cell," (2014), International Journal or Energy Research]. The 260 nm band was also observed on the CoCu anode.

$H_2(\frac{1}{4})$ was further confirmed using Raman spectroscopy wherein due to the large energy difference between ortho and para, the latter was expected to dominate the population. Given that para is even, the typical selection rule for pure rotational transitions is $\Delta J=\pm2$ for even integers. However, orbital-rotational angular momentum coupling gives rise to a change in the f quantum number with the conservation of the angular momentum of the photon that excites the $\ell$ rotational level wherein the resonant photon energy is shifted in frequency by the orbital-nuclear hyperfine energy relative to the transition in the absence of the $\ell$ quantum number change. Moreover, for $\ell \neq 0$, the nuclei are aligned along the internuclear axis as given in Chp 12 of Ref. [Mills GUT]. The rotational selection rule for Stokes spectra defined as initial state minus final state is $\Delta J=J'-J''=-1$, the orbital angular momentum selection rule is $\Delta \ell =+1$, and the transition becomes allowed by the conservation of angular momentum during the coupling of the rotational and the orbital angular momentum excitations [Mills GUT]. And, no intensity dependency on nuclear spin is expected.

Using a Thermo Scientific DXR SmartRaman with a 780 nm diode laser in the macro mode, a 40 cm$^{-1}$ broad absorption peak was observed on MoCu hydrogen permeation anodes after the production of excess electricity. The peak was not observed in the virgin alloy, and the peak intensity increased with increasing excess energy and laser intensity. Moreover it was present pre and post sonication indicating that the only possible elements to consider as the source were Mo, Cu, H, and O as confirmed by SEM-EDX. Permutations of control compounds did not reproduce the peak. The peak was also observed on cells having Mo, CoCu, and MoNiAl anodes such as the cell [CoCu (H permeation)/LiOH—LiBr/NiO] that output 6.49 Wh, 150 mA, at 186% gain and the cell [MoNiAl (45.5/45.5/9 wt %)/LiOH—LiBr/NiO] that output 2.40 Wh, 80 mA, at 176% gain. In separate experiments, KOH—KCl gettered gas from these cells gave a very intense fluorescence or photoluminescence series of peaks that were assigned to $H_2(\frac{1}{4})$ ro-vibration. Since no other element or compound is known that can absorb a single 40 cm$^{-1}$ (0.005 eV) near infrared line at 1.33 eV (the energy of the 780 nm laser minus 2000 cm$^{-1}$) $H_2(\frac{1}{4})$ was considered. The absorption peak starting at 1950 cm$^{-1}$ matched the free space rotational energy of $H_2(\frac{1}{4})$ (0.2414 eV) to four significant figures, and the width of 40 cm$^{-1}$ matches the orbital-nuclear coupling energy splitting [Mills GUT].

The absorption peak matching the $H_2(\frac{1}{4})$ rotational energy is a real peak and cannot be explained by any known species. The excitation of the hydrino rotation may cause the absorption peak by two mechanisms. In the first, the Stokes light is absorbed by the lattice due to a strong interaction of the rotating hydrino as a lattice inclusion. This is akin to resonance broadening observed with the 260 nm e-beam band. The second comprises a known inverse Raman effect. Here, the continuum caused by the laser is absorbed and shifted to the laser frequency wherein the continuum is strong enough to maintain the rotational excited state population to permit the antiStokes energy contribution. Typically, the laser power is very high for an IRE, but molecular hydrino may be a special case due to its non-zero $\ell$ quantum number and corresponding selections rules. Moreover, MoCu is anticipated to cause a Surface Enhanced Raman Scattering (SERS) due to the small dimensions of the Mo and Cu grain boundaries of the mixture of metals. So, the results are discussed from the context of the latter mechanism.

The absorption was assigned to an inverse Raman effect (IRE) for the $H_2(\frac{1}{4})$ rotational energy for the J'=1 to J"=0 transition [Mills GUT]. This result showed that $H_2(\frac{1}{4})$ is a free rotor which is the case with $H_2$ in silicon matrix. Moreover, since $H_2(\frac{1}{4})$ may form complexes with hydroxide as shown by MAS NMR and ToF-SIMs, and a matrix shift is observed with the electron-bean excitation emission spectrum and the photoluminescence spectrum due to the influence of the local environment at the $H_2(\frac{1}{4})$ site in the lattice, the IRE is anticipated to shift as well in different matrices and also with pressure [R. Mills, X Yu, Y. Lu, G Chu, J. He, J. Lotoski, "Catalyst induced hydrino transition (CIHT) electrochemical cell," (2014), International Journal or Energy Research]. Likewise, the Raman peaks of $H_2$ as a matrix inclusion shift with pressure. Several instances were observed by Raman spectral screening of metals and inorganic compounds. Ti and Nb showed a small absorption peak of about 20 counts starting at 1950 cm$^{-1}$. Al showed a much larger peak. Instances of inorganic compounds included LiOH and LiOH—LiBr that showed the peak at 2308 cm$^{-1}$ and 2608 cm$^{-1}$, respectively. Ball milling LiOH—LiBr caused a reaction to greatly intensify the IRE peak and shift it to be centered at 2308 cm$^{-1}$ like LiOH as well as form a peak centered at 1990 cm$^{-1}$. An especially strong absorption peak was observed at 2447 cm$^{-1}$ from $Ca(OH)_2$ that forms $H_2O$. The latter may serve as a catalyst to form $H_2(\frac{1}{4})$ upon dehydration of $Ca(OH)_2$ at 512° C. or by reaction with $CO_2$. These are solid fuel type reactions to form hydrinos as reported previously [R. Mills, X Yu, Y. Lu, G Chu, J. He, J. Lotoski, "Catalyst induced hydrino transition (CIHT) electrochemical cell," (2014), International Journal or Energy Research]. LiOH and $Ca(OH)_2$ both showed a $H_2(\frac{1}{4})$ IRE peak, and the LiOH is commercially formed from $Ca(OH)_2$ by reaction with $Li_2CO_3$. Thus, $Ca(OH)_2+Li_2CO_3$ mixture was caused to react by ball milling, and a very intense $H_2(\frac{1}{4})$ IRE peak was observed centered at 1997 cm$^{-1}$.

$H_2(\frac{1}{4})$ as the product of solid fuel reactions was reported previously [R. Mills, X Yu, Y. Lu, G Chu, J. He, J. Lotoski, "Catalyst induced hydrino transition (CIHT) electrochemical cell," (2014), International Journal of Energy Research; R. Mills, J. Lotoski, W. Good, J. He, "Solid Fuels that Form HOH Catalyst," (2014)]. The energy released by forming hydrinos according to Eqs. (6-9) was shown to give rise to high kinetic energy H$^-$. Using solid fuel Li+LiNH$_2$+dissociator Ru—Al$_2$O$_3$ that can form H and HOH catalyst by decomposition of Al(OH)$_3$ and reaction of Li with $H_2O$ and LiNH$_2$, ions arriving before m/e=1 were observed by ToF-SIMS that confirmed the energy release of Eq. (9) is manifest as high kinetic energy H$^-$. Other ions such as oxygen (m/e=16) showed no early peak. The relation between time of flight T, mass m, and acceleration voltage V is $$T = A\sqrt{\frac{m}{v}} \qquad (197)$$

where A is a constant that depends on ion flight distance. From the observed early peak at m/e=0.968 with an acceleration voltage of 3 kV, the kinetic energy imparted to the H species from the hydrino reaction is about 204 eV that is a match to the HOH catalyst reaction given by Eqs. (6-9). The same early spectrum was observed in the positive mode corresponding to H⁺, but the intensity was lower.

XPS was performed on the solid fuel. The XPS of LiHBr formed by the reaction of Li, LiBr, LiNH₂, dissociator R—Ni (comprising about 2 wt % Al(OH)₃), and 1 atm H₂, showed a peak at 494.5 eV and 495.6 eV for XPS spectra on reaction products of two different runs that could not be assigned to any known elements. Na, Sn, and Zn being the only possibilities were easy to eliminate based on the absence of any other corresponding peaks of these elements since only Li, Br, C, and O peaks were observed. The peak matched the energy of the theoretically allowed double ionization [R. Mills, X Yu, Y. Lu, G Chu, J. He, J. Lotoski, "Catalyst induced hydrino transition (CIHT) electrochemical cell," (2014), International Journal or Energy Research] of molecular hydrino H₂(¼). Molecular hydrino was further confirmed as a product by Raman and FTIR spectroscopy. The Raman spectrum of solid fuel product LiHBr showed a H₂(¼) inverse Raman effect absorption peak centered at 1994 cm⁻¹. The FTIR spectrum of solid fuel product LiHBr showed a new sharp peak at 1988 cm⁻¹ that is a close match to the free rotor energy of H₂(¼). Furthermore, the MAS NMR showed a strong up-field shift peak consistent with that shown for other CIHT cell KOH—KCl (1:1) getter samples such as one from a CIHT cell comprising [Mo/LiOH—LiBr/NiO] that output 2.5 Wh, 80 mA, at 125% gain that showed upfield shifted matrix peaks at −4.04 and −4.38 ppm and one from a CIHT cell comprising [CoCu (H permeation)/LiOH—LiBr/NiO] that output 6.49 Wh, 150 mA, at 186% gain that showed upfield shifted matrix peaks at −4.09 and −4.34 ppm.

XPS was also performed on the anodes of CIHT cells such as [MoCu (H permeation)/LiOH—LiBr/NiO] (1.56 Wh, 50 mA, at 189% gain), and [MoNi (H permeation)/LiOH—LiBr/NiO](1.53 Wh, 50 mA, at 190%). The 496 eV peak was observed as well. The peak was assigned to H₂(¼) since the other possibilities were eliminated. Specifically, in each case, the 496 eV peak could not be associated with Mo is, as its intensity would much smaller than Mo 3p peaks and the energy would be higher that that observed, and it could not assigned to Na KLL, since there is no Na is in the spectrum.

Another successful cross-confirmatory technique in the search for hydrino spectra involved the use of the Raman spectrometer wherein the ro-vibration of H₂(¼) matching the 260 nm e-beam band was observed as second order fluorescence. The gas from the cells [Mo, 10 bipolar plates/LiOH—LiBr—MgO/NiO] (2550.5 Wh, 1.7 A, 9.5V, at 234% gain), [MoCu/LiOH—LiBr/NiO] (3.5 Wh, 80 mA, at 120% gain), [MoNi/LiOH—LiBr/NiO] (1.8 Wh, 80 mA, at 140%) was gettered with KOH—KCl (50-50 at %), and [CoCu (H permeation)/LiOH—LiBr/NiO] (6.49 Wh, 150 mA, at 186% gain), and the Raman spectra were recorded on the getters using the Horiba Jobin Yvon LabRAM Aramis Raman spectrometer with a HeCd 325 nm laser in microscope mode with a magnification of 40×. In each case, an intense series of 1000 cm⁻¹ (0.1234 eV) equal-energy spaced Raman peaks were observed in the 8000 cm⁻¹ to 18,000 cm⁻¹ region. The conversion of the Raman spectrum into the fluorescence or photoluminescence spectrum revealed a match as the second order ro-vibrational spectrum of H₂(¼) corresponding to the 260 nm band first observed by e-beam excitation [R. Mills, X Yu, Y. Lu, G Chu, J. He, J. Lotoski, "Catalyst induced hydrino transition (CHIT) electrochemical cell," (2014), International Journal or Energy Research]. The peak assignments to the Q, R, and P branches for the spectra are Q(0), R(0), R(1), R(2), R(3), R(4), P(1), P(2), P(3), P(4), P(5), and P(6) observed at 12,199, 11,207, 10,191, 9141, 8100, 13,183, 14,168, 15,121, 16,064, 16,993, and 17,892 cm⁻¹, respectively. The excitation was deemed to be by the high-energy UV and EUV He and Cd emission of the laser wherein the laser optics are transparent to at least 170 nm and the grating (Labram Aramis 2400 g/mm 460 mm focal length system with 1024×26 µm² pixels CCD) is dispersive and has its maximum efficiency at the shorter wavelength side of the spectral range, the same range as the 260 nm band. For example, cadmium has a very intense line at 214.4 nm (5.8 eV) that matches the ro-vibrational excitation energy of H₂(¼) in KCl matrix based on the e-beam excitation data. The CCD is also most responsive at 500 nm, the region of the second order of the 260 nm band centered at 520 nm.

The photoluminescence bands were also correlated with the upfield shifted NMR peaks. For example, the KOH—KCl (1:1) getter from MoNi anode CIHT cells comprising [MoNi/LiOH—LiBr/NiO] having upfield shifted matrix peaks at −4.04 and −4.38 ppm and the KOH—KCl (1:1) getter from CoCu H permeation anode CIHT cells comprising [CoCu (H permeation)/LiOH—LiBr/NiO] having upfield shifted matrix peaks at −4.09 and −4.34 ppm showed the series of photoluminescence peaks corresponding to the 260 nm e-beam.

Overall, the Raman results such as the observation of the 0.241 eV (1940 cm⁻¹) Raman inverse Raman effect peak and the 0.2414 eV-spaced Raman photoluminescence band that matched the 260 nm e-beam spectrum is strong confirmation of molecular hydrino having an internuclear distance that is ¼ that of H₂. The evidence in the latter case is further substantiated by being in a region having no known first order peaks or possible assignment of matrix peaks at four significant figure agreement with theoretical predictions.

A Raman spectrum was performed on a 1 g KOH—KCl (1:1) getter sample that was held 2" away from the center of 15 consecutive initiations of 15 separate solid fuel pellets each comprising CuO (30 mg)+Cu (10 mg)+H₂O (14.5 mg) that was sealed in an aluminum DSC pan (Aluminum crucible 30 µl, D:6.7×3 (Setaram, S08/HBB37408) and Aluminum cover D: 6,7, stamped, tight (Setaram, S08/HBB37409)). Each sample of solid fuel was ignited with a Taylor-Winfield model ND-24-75 spot welder that supplied a short burst of low-voltage, high-current electrical energy. The applied 60 Hz voltage was about 8 V peak, and the peak current was about 20,000 A. The getter sample was contained in an alumina crucible that was covered with a polymer mesh wire tied around the crucible. The mesh prevented any solid reaction products from entering the sample while allowing gas to pass through. The fifteen separate solid fuel samples were rapidly successively ignited, and the getter sample that accumulated the 15 exposures was transferred to Ar glove box where it was homogenously mixed using a mortar and pestle. Using the Horiba Jobin Yvon LabRAM Aramis Raman spectrometer with a HeCd 325 nm laser in microscope mode with a magnification of 40×, the series of 1000 cm⁻¹ equal-energy spaced Raman peaks that matched the second order rotational emission of $H_2(1/4)$ within the $v=1 \rightarrow v=0$ transition was observed. Specifically, the Q, R, and P branch peaks Q(0), R(0), R(1), R(2), P(1), P(2), P(3), P(4), and P(5), were observed at 12,194, 11,239, 10,147, 13,268, 14,189, 15,127, 16,065, 17,020, and 17,907 $cm^{-1}$, respectively, that confirmed molecular hydrino $H2(1/4)$ as the source of the energetic blast of the ignited solid fuel.

EUV spectroscopy was performed on a solid fuel sample comprising a 0.08 $cm^2$ nickel screen conductor coated with a thin (<1 mm thick) tape cast coating of NiOOH, 11 wt % carbon, and 27 wt % Ni powder contained in a vacuum chamber evacuated to $5 \times 10^{-4}$ Torr. The material was confined between the two copper electrodes of an Acme Electric Welder Company model 3-42-75, 75 KVA spot welder such that the horizontal plane of the sample was aligned with the optics of a EUV spectrometer as confirmed by an alignment laser. The sample was subjected to a short burst of low-voltage, high-current electrical energy. The applied 60 Hz voltage was about 8 V peak, and the peak current was about 20,000 A. The EUV spectrum was recorded using a McPherson grazing incidence EUV spectrometer (Model 248/310G) equipped with a platinum-coated 600 g/mm grating and an Aluminum (Al) (800 nm thickness, Luxel Corporation) filter to block visible light. The angle of incidence was 87°. The wavelength resolution with an entrance slit width of 100 μm was about 0.15 nm at the CCD center and 0.5 nm at the limits of the CCD wavelength range window of 50 nm. The distance from the plasma source being the ignited solid fuel to the spectrometer entrance was 70 cm. The EUV light was detected by a CCD detector (Andor iDus) cooled to −60° C. The CCD detector was centered at 35 nm. Continuum radiation in the region of 10 to 40 nm was observed. The Al window was confirmed to be intact following the recording of the blast spectrum. A blast outside of a quartz window that cuts any EUV light by passes visible light showed a flat spectrum confirming that the short wavelength continuum spectrum was not due to scattered visible light that passed the Al filter. A high voltage helium pinch discharge spectrum showed only He atomic and ion lines which were used to wavelength calibrate the spectrum. Thus, the high-energy light was confirmed to be a real signal. The radiation of energy of about 125 eV is not possible due to field acceleration since the maximum applied voltage was less than 8 V; moreover, no know chemical reaction can release more than a few eV's. The nascent $H_2O$ molecule may serve as a catalyst by accepting 81.6 eV (m=3) to form an intermediate that decays with the emission of a continuum band having an energy cutoff of $9^2 \cdot 13.6$ eV=122.4 eV and a short wavelength cutoff of $$\lambda_{(H \rightarrow H[\frac{a_H}{p=m+1}])} = \frac{91.2}{3^2} \text{ nm} = 10.1 \text{ nm.} \qquad \text{(Eqs. (32–33))}$$

The continuum radiation band in the 10 nm region and going to longer wavelengths matched the theoretically predicted transition of H to the hydrino state $H(1/4)$ according to Eqs. (43-47).

E. Plasmadynamic Power Conversion 0.05 ml (50 mg) of $H_2O$ was added to 20 mg or either $Co_3O_4$ or CuO that was sealed in an aluminum DSC pan (Aluminum crucible 30 μl, D:6.7×3 (Setaram, S08/HBB37408) and Aluminum cover D: 6,7, stamped, tight (Setaram, S08/HBB37409)). Using a Taylor-Winfield model ND-24-75 spot welder, each sample was ignited with a current of between 15,000 to 25,000 A at about 8 V RMS applied to the ignition electrodes that comprised 5/8" outer diameter (OD) by 3" length copper cylinders wherein the flat ends confined the sample. A large power burst was observed that vaporized each sample as an energetic, highly-ionized, expanding plasma. PDC electrodes comprised two 1/16" OD copper wires. The magnetized PDC electrode was shaped as an open loop with a diameter of 1" that was placed circumferentially around the ignition electrodes, in the plane of the fuel sample. Since the current was axial, the magnetic field from the high current was radial, parallel to the contour of the loop PDC electrode. The counter unmagnetized PDC electrode was parallel to the ignition electrodes and the direction of the high current; thus, the radial magnetic field lines were perpendicular to this PDC electrode. The counter PDC electrode extended 2.5" above and below the plane of the sample. The PDC voltage was measured across a standard 0.1 ohm resistor. A power of 6250 W was recorded on one set of PDC electrodes following ignition corresponding to a voltage of 25 V and a current of 250 A. The PDC power scaled linearly with the number of PDC electrode pairs.

F. $H_2O$ Arc Plasma Cell

Figure 11:
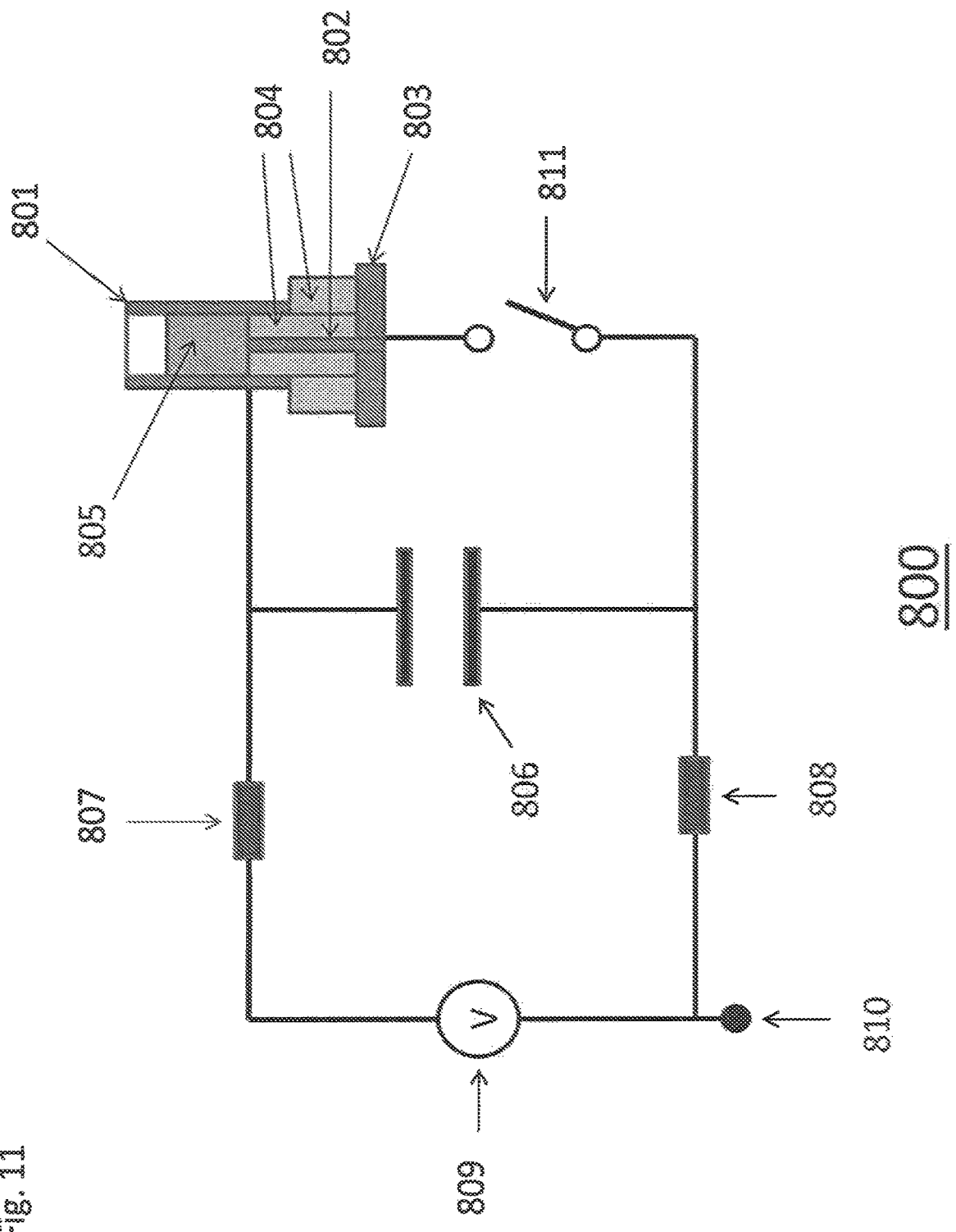
FIG. 11 is a schematic drawing of an experimental $H_2O$ arc plasma cell power generator in accordance with an embodiment of the present disclosure.

The high power from the formation of hydrinos by causing an arc plasma in a standing $H_2O$ column was experimentally tested. A schematic drawing of an experimental $H_2O$ arc plasma cell power generator 800 is shown in FIG. 11. The $H_2O$ arc plasma system comprised an energy storage capacitor 806 connected between a copper baseplate-and-rod electrode 803 and 802 and a concentric outer copper cylindrical electrode 801 that contained water 805 wherein the rod 802 of the baseplate-and-rod electrode 803 and 802 was below the water column. The rod 802 was embedded in a Nylon insulator sleeve 804 in the cylindrical electrode section and a Nylon block 804 between the baseplate 803 and the cylinder 801. A column of tap water or tap water added to deionized water 805 stood between the center rod electrode 802 and the outer cylindrical and circumferential electrode 801. No discharge was achieved at the voltages applied with deionized water. A capacitor bank 806 comprising four capacitors (Sprague, 16 uF 4500V DC, model A-109440, 30P12) connected in parallel with terminal bolts to two, 1 inch wide by 1/8 inch thick, copper bars was connected across the electrodes with one lead connected to ground 410 by a 0.6 Mohm resistor 808. The capacitor bank was charged by a high voltage power supply 809 (Universal Voltronics, 20 kV DC, Model 1650R2) through a connection having a 1 Mohm resistor 807 and discharged by a atmospheric-air spark gap switch 411 that comprised stainless steel electrodes. The high voltage was the in range of about 3 to 4.5 kV. No discharge was achieved below 3 kV. The discharge current was in the range of 10 to 13 kA (measured by a Rogowski coil, Model CWT600LF with 700 mm cable). Exemplary parameters for 4 ml of $H_2O$ in the open cell that was tested were a capacitance of about 64 pF, an intrinsic inductance of about 6 pH, an intrinsic resistance of about 0.32, a cylindrical electrode 801 inner diameter (ID) and depth of 1/2 inches and 2.5 inches, respectively, a rod 802 outer diameter (OD) of 1/4 inches, a distance between cylindrical electrode 801 and center rod 802 of 1/8", a charging voltage of about 4.5 kV, and the circuit time constant of about 20 μs. $H_2O$ ignition to form hydrinos at a high rate was achieved by the triggered water arc discharge wherein the arc caused the formation of atomic hydrogen and HOH catalyst that reacted to form hydrinos with the liberation of high power. The high power was evident by the production of a supersonic ejection of the entire $H_2O$ content 10 feet high into the laboratory wherein the ejected plume impacted the ceiling.

Calorimetry was performed using a Parr 1341 plain-jacketed calorimeter with a Parr 6774 calorimeter thermometer option. The calorimeter water bath was loaded with 2,000 g DI water (as per Parr manual), and the $H_2O$ arc plasma cell power generator was placed inside submerged under the water. The only modification to the arc plasma cell was that a cap with pressure relief channels was secured to the top of the cylindrical electrode. The power source for calibration and ignition of was the bank of capacitors having a total capacitance C of 64 μF. The positive connection of the capacitor bank was connected to the cell with 8AWG 40kVDC wire and the negative lead was connected with 10AWG Type 90 wire. The input energy $E_{input}$ to determine the water bath heat capacity during calibration and the input energy of the ignition of the $H_2O$ arc plasma was given by the formulae $$E_{input} = 1/2C(V_i^2 - V_f^2)$$

wherein $V_i$ and $V_f$ are the initial and final voltages, before and after discharge of the capacitors, respectively. The voltage was measured using a NIST traceable calibrated Fluke 45 digital voltmeter after attenuating the signal by voltage divider to within the instrument's range.

The heat capacity was determined by heating the bath with a discharge cell of the same heat capacity and displacement that did not produce an arc plasma. The calibrated heat capacity of the calorimeter and arc plasma apparatus was determined to be 10,678 J/° K. The initial and final voltages of the capacitors with discharge to cause $H_2O$ arc plasma were 3.051 kV and 0.600 kV, respectively, corresponding to an input energy of 286.4 J. The total output energy calculated for the calorimetry thermal response to the input energy and the energy released from the ignited $H_2O$ arc plasma using the calibrated heat capacity was 533.9 J. By subtracting the input energy, the net energy was 247.5 J, released in the formation of hydrinos.

What is claimed is:

1. A power system that generates at least one of direct electrical energy and thermal energy comprising:

at least one vessel;

reactants comprising:

a) at least one source of nascent $H_2O$;

b) at least one source of atomic hydrogen;

c) at least one of a conductor and a conductive matrix; and at least one set of electrodes to confine the reactants, a source of electrical power to deliver electrical energy to the reactants between the electrodes to produce reaction products and a plasma;

at least one regeneration system to regenerate the initial reactants from the reaction products, and at least one photoelectric converter and at least one thermal to electric power converter.

2. The power system of claim 1 wherein at least one of the source of nascent $H_2O$ and the source of atomic hydrogen comprises at least one of:

a) at least one source of $H_2O$;

b) at least one source of oxygen, and c) at least one source of hydrogen.

3. The power system of claim 1 wherein the reactants comprise at least one of $H_2O$ and the source of $H_2O$;

$O_2$, $H_2O$, HOOH, OOH, peroxide ion, superoxide ion, hydride, $H_2$, a halide, an oxide, an oxyhydroxide, a hydroxide, a compound that comprises oxygen, a hydrated compound, a hydrated compound selected from the group of at least one of a halide, an oxide, an oxyhydroxide, a hydroxide, a compound that comprises oxygen, and a conductive matrix.

4. A power system of claim 3 wherein the oxyhydroxide comprises at least one from the group of TiOOH, GdOOH, CoOOH, InOOH, FeOOH, GaOOH, NiOOH, AlOOH, CrOOH, MoOOH, CuOOH, MnOOH, ZnOOH, and SmOOH;

the oxide comprises at least one from the group of CuO, $Cu_2O$, CoO, $Co_2O_3$, $Co_3O_4$, FeO, $Fe_2O_3$, NiO, and $Ni_2O_3$;

the hydroxide comprises at least one from the group of $Cu(OH)_2$, $Co(OH)_2$, $Co(OH)_3$, $Fe(OH)_2$, $Fe(OH)_3$, and $Ni(OH)_2$;

the compound that comprises oxygen comprises at least one from the group of a sulfate, phosphate, nitrate, carbonate, hydrogen carbonate, chromate, pyrophosphate, persulfate, perchlorate, perbromate, and periodate, $MXO_3$, $MXO_4$ (M=metal such as alkali metal such as Li, Na, K, Rb, Cs; X=F, Br, Cl, I), cobalt magnesium oxide, nickel magnesium oxide, copper magnesium oxide, $Li_2O$, alkali metal oxide, alkaline earth metal oxide, CuO, $CrO_4$, ZnO, MgO, CaO, $MoO_2$, $TiO_2$, $ZrO_2$, $SiO_2$, $Al_2O_3$, NiO, FeO, $Fe_2O_3$, $TaO_2$, $Ta_2O_5$, VO, $VO_2$, $V_2O_3$, $V_2O_5$, $P_2O_3$, $P_2O_5$, $B_2O_3$, NbO, $NbO_2$, $Nb_2O_5$, $SeO_2$, $SeO_3$, $TeO_2$, $TeO_3$, $WO_2$, $WO_3$, $Cr_3O_4$, $Cr_2O_3$, $CrO_2$, $CrO_3$, CoO, $Co_2O_3$, $Co_3O_4$, FeO, $Fe_2O_3$, NiO, $Ni_2O_3$, rare earth oxide, $CeO_2$, $La_2O_3$, an oxyhydroxide, TiOOH, GdOOH, CoOOH, InOOH, FeOOH, GaOOH, NiOOH, AlOOH, CrOOH, MoOOH, CuOOH, MnOOH, ZnOOH, and SmOOH, and the conductive matrix comprises at least one from the group of a metal powder, carbon, carbide, boride, nitride, carbonitrile such as TiCN, or nitrile.

5. The power system of claim 1 wherein the reactants comprise a mixture of a metal, its metal oxide, and $H_2O$ wherein the reaction of the metal with $H_2O$ is not thermodynamically favorable.

6. The power system of claim 1 wherein the reactants comprise a mixture of a metal, a metal halide, and $H_2O$ wherein the reaction of the metal with $H_2O$ is not thermodynamically favorable.

7. The power system of claim 1 wherein the reactants comprise a mixture of a transition metal, an alkaline earth metal halide, and $H_2O$ wherein the reaction of the metal with $H_2O$ is not thermodynamically favorable.

8. The power system of claim 5, 6, or 7, wherein the metal having a thermodynamically unfavorable reaction with $H_2O$ is at least one of the group of Cu, Ni, Pb, Sb, Bi, Co, Cd, Ge, Au, Ir, Fe, Hg, Mo, Os, Pd, Re, Rh, Ru, Se, Ag, Tc, Te, Tl, Sn, W, Al, V, Zr, Ti, Mn, Zn, Cr, and In.

9. The power system of claim 8 wherein reactants are regenerated by addition of $H_2O$.

10. The power system of claim 1 wherein the reactants comprise a mixture of a metal, its metal oxide, and $H_2O$ wherein the metal oxide is capable of $H_2$ reduction at a temperature less than 1000° C.

11. The power system of claim 1 wherein the reactants comprise a mixture of an oxide that is not easily reduced with $H_2$ and mild heat;

a metal having an oxide capable of being reduced to the metal with $H_2$ at a temperature less than 1000° C., and $H_2O$.

12. The power system of claim 10 or 11 wherein the metal having an oxide capable of being reduced to the metal with $H_2$ at a temperature less than 1000° C. is at least one of the group of Cu, Ni, Pb, Sb, Bi, Co, Cd, Ge, Au, Ir, Fe, Hg, Mo, Os, Pd, Re, Rh, Ru, Se, Ag, Tc, Te, Tl, Sn, W, Al, V, Zr, Ti, Mn, Zn, Cr, and In.

13. The power system of claim 11 wherein the metal oxide that is not easily reduced with $H_2$, and mild heat comprises at least one of alumina, an alkaline earth oxide, and a rare earth oxide.

14. The power system of claim 1 wherein the source of electrical power comprises at least one of the following:

a voltage selected to cause a high AC, DC, or an AC-DC mixture of current that is in the range of at least one of 100 A to 1,000,000 A, 1 kA to 100,000 A, 10 kA to 50 kA;

a DC or peak AC current density in the range of at least one of 100 A/cm² to 1,000,000 A/cm², 1000 A/cm² to 100,000 A/cm², and 2000 A/cm² to 50,000 A/cm²;

the voltage is determined by the conductivity of the solid fuel or energetic material wherein the voltage is given by the desired current times the resistance of the solid fuel or energetic material sample;

the DC or peak AC voltage may be in at least one range chosen from about 0.1 V to 500 kV, 0.1 V to 100 kV, and 1 V to 50 kV, and the AC frequency may be in the range of about 0.1 Hz to 10 GHz, 1 Hz to 1 MHz, 10 Hz to 100 kHz, and 100 Hz to 10 kHz.

15. The power system of claim 1 wherein the resistance of the solid fuel or energetic material sample is in at least one range chosen from about 0.001 milliohm to 100 Mohm, 0.1 ohm to 1 Mohm, and 10 ohm to 1 kohm, and the conductivity of a suitable load per electrode area active is in at least one range chosen from about $10^{-10}$ ohm$^{-1}$ cm$^{-2}$ to $10^6$ ohm$^{-1}$ cm$^{-2}$, 10–5 ohm$^{-1}$ cm$^{-2}$ to $10^6$ ohm$^{-1}$ cm$^{-2}$, $10^{-4}$ ohm$^{-1}$ cm$^{-2}$ to $10^5$ ohm$^{-1}$ cm$^{-2}$, $10^{-3}$ ohm$^{-1}$ cm$^{-2}$ to $10^4$ ohm$^{-1}$ cm$^{-2}$, $10^{-2}$ ohm$^{-1}$ cm$^{-2}$ to $10^3$ ohm$^{-1}$ cm$^{-2}$, $10^{-1}$ ohm$^{-1}$ cm 2 to $10^2$ ohm$^{-1}$ cm$^{-2}$, and 1 ohm$^{-1}$ cm$^{-2}$ to 10 ohm$^{-1}$ cm$^{-2}$.

16. The power system of claim 1 wherein the regeneration system comprises at least one of a hydration, thermal, chemical, and electrochemical system.

17. The power system of claim 1 wherein the at least one thermal to electricity converter comprises at least one of the group of a heat engine, a steam engine, a steam turbine and generator, a gas turbine and generator, a Rankine-cycle engine, a Brayton-cycle engine, a Stirling engine, a thermionic power converter, and a thermoelectric power converter.

18. A power generation system, comprising:

a plurality of electrodes;

a fuel loading region surrounded by the plurality of electrodes and configured to receive a fuel, wherein the plurality of electrodes is configured to ignite the fuel located in the fuel loading region;

a delivery mechanism for moving the fuel into the fuel loading region;

a plasma power converter configured to convert plasma generated from the ignition of the fuel into a non-plasma form of power;

a removal system for removing a byproduct of the ignited fuel; and a regeneration system operably coupled to the removal system for recycling the removed byproduct of the ignited fuel into recycled fuel.

19. The power generation system of claim 18 further comprising a re-loading system operably coupled to the regeneration system for re-introducing the recycled fuel to the delivery mechanism for moving the recycled fuel into the fuel loading region.

* * * * *